US012672289B2

(12) United States Patent
Kraman et al.

(10) Patent No.: US 12,672,289 B2
(45) Date of Patent: Jun. 30, 2026

(54) MEMORY DEVICE INCLUDING WORD LINE CONTACT STRIPS AND METHODS OF FORMING THE SAME

(71) Applicant: Sandisk Technologies, Inc., Milpitas, CA (US)

(72) Inventors: Mark D. Kraman, San Jose, CA (US); Ruogu Matthew Zhu, San Jose, CA (US); Li-Wei Lo, San Jose, CA (US); Koichi Matsuno, Fremont, CA (US); Jixin Yu, Milpitas, CA (US); Kazuhiro Shiraishi, Yokkaichi (JP); Takayuki Maekura, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 314 days.

(21) Appl. No.: 18/462,955

(22) Filed: Sep. 7, 2023

(65) Prior Publication Data

US 2024/0414917 A1 Dec. 12, 2024

Related U.S. Application Data

(63) Continuation-in-part of application No. 18/450,115, filed on Aug. 15, 2023.

(Continued)

(51) Int. Cl.
H10B 43/27 (2023.01)
H10B 41/27 (2023.01)
(Continued)

(52) U.S. Cl.
CPC ............. H10B 43/27 (2023.02); H10B 41/27 (2023.02); H10B 41/35 (2023.02); H10B 43/35 (2023.02)

(58) Field of Classification Search
CPC ........ H10B 43/27; H10B 41/27; H10B 41/35; H10B 43/35; H10B 43/10; H10B 43/50; H10B 41/10; H10B 41/50
See application file for complete search history.

(56) References Cited

U.S. PATENT DOCUMENTS 9,875,929 B1 * 1/2018 Shukla .................. H10B 43/27
9,905,573 B1 2/2018 Mada et al.
(Continued)

FOREIGN PATENT DOCUMENTS

| KR | 20170139390 A | 12/2017 |
| KR | 1020170139390 A | 12/2017 |
| WO | WO2023027786 A1 | 3/2023 |

OTHER PUBLICATIONS

Cadarso, V.J. et al., "High-aspect-ratio nanoimprint process chains," *Microsystems & Nanoengineering*, vol. 3, Article No. 17017, pp. 1-8, (2017); https://doi.org/10.1038/micronano.2017.17.
(Continued)

*Primary Examiner* — Caleb E Henry
(74) *Attorney, Agent, or Firm* — THE MARBURY LAW GROUP PLLC

(57) ABSTRACT

A memory device includes a first alternating stack including first insulating layers and first electrically conductive layers that are interlaced along a vertical direction, where a first stepped cavity located inside the first alternating stack includes a first stepped bottom surface containing horizontally-extending surface segments of the first electrically conductive layers, a memory opening vertically extending through each layer within the first alternating stack, a memory opening fill structure located in the memory opening and including a vertical stack of memory elements, a first insulating spacer contacting sidewalls of the first stepped cavity, and a first electrically conductive strip including a first horizontally-extending bottom strip segment contacting (Continued)

one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment.

17 Claims, 202 Drawing Sheets

Related U.S. Application Data

(60) Provisional application No. 63/506,902, filed on Jun. 8, 2023.

(51) Int. Cl.
    H10B 41/35      (2023.01)
    H10B 43/35      (2023.01)

(56) References Cited

U.S. PATENT DOCUMENTS

| | | | |
|---|---|---|---|
| 10,081,443 B2 | 9/2018 | Engel et al. | |
| 10,141,221 B1* | 11/2018 | Lai | H01L 21/76831 |
| 10,181,442 B1 | 1/2019 | Watanabe et al. | |
| 10,192,784 B1 | 1/2019 | Cui et al. | |
| 10,192,877 B2 | 1/2019 | Norizuki et al. | |
| 10,211,215 B1 | 2/2019 | Ishii et al. | |
| 10,217,746 B1* | 2/2019 | Kim | H10B 63/845 |
| 10,290,648 B1* | 5/2019 | Zhou | H10B 41/27 |
| 10,290,803 B2 | 5/2019 | Sano et al. | |
| 10,347,654 B1* | 7/2019 | Iwai | H10B 43/10 |
| 10,355,009 B1* | 7/2019 | Kai | H10B 41/10 |
| 10,453,854 B2 | 10/2019 | Kanno et al. | |
| 10,461,163 B2 | 10/2019 | Kanakamedala et al. | |
| 10,608,010 B2 | 3/2020 | Terasawa et al. | |
| 10,629,606 B2 | 4/2020 | Sugawara et al. | |
| 10,700,089 B1* | 6/2020 | Hojo | H01L 21/31116 |
| 10,854,513 B2* | 12/2020 | Kawasaki | H10B 43/27 |
| 10,903,237 B1* | 1/2021 | Hosoda | H01L 23/5283 |
| 11,081,443 B1* | 8/2021 | Mizutani | H10B 41/27 |
| 11,189,637 B2* | 11/2021 | Tobioka | H10B 43/27 |
| 11,342,245 B2 | 5/2022 | Cui et al. | |
| 11,355,506 B2 | 6/2022 | Tokita et al. | |
| 11,355,515 B2 | 6/2022 | Hojo et al. | |
| 11,367,736 B2 | 6/2022 | Tokita et al. | |
| 12,279,425 B2* | 4/2025 | Shimomura | H10B 41/10 |
| 2016/0365352 A1* | 12/2016 | Nishikawa | H10B 43/10 |
| 2017/0053906 A1* | 2/2017 | Or-Bach | H10B 43/20 |
| 2017/0162597 A1* | 6/2017 | Sharangpani | H01L 21/02178 |
| 2018/0061850 A1 | 3/2018 | Mada et al. | |
| 2018/0261611 A1 | 9/2018 | Norizuki et al. | |
| 2018/0315758 A1 | 11/2018 | Yoo et al. | |
| 2018/0342557 A1* | 11/2018 | Mori | H10N 70/823 |
| 2019/0139974 A1 | 5/2019 | Sugawara et al. | |
| 2019/0148392 A1 | 5/2019 | Kanno et al. | |
| 2019/0148506 A1 | 5/2019 | Kanakamedala et al. | |
| 2019/0252403 A1* | 8/2019 | Kaminaga | H01L 23/5226 |
| 2019/0280001 A1 | 9/2019 | Terasawa et al. | |
| 2019/0348435 A1* | 11/2019 | Nagata | H10B 43/27 |
| 2020/0035694 A1* | 1/2020 | Kaminaga | H10B 41/30 |
| 2020/0051904 A1* | 2/2020 | Tang | H10B 43/50 |
| 2020/0127005 A1* | 4/2020 | Otsu | H10D 64/037 |
| 2020/0251485 A1* | 8/2020 | Kakazu | H10B 43/27 |
| 2020/0350203 A1* | 11/2020 | Fratin | G11C 5/025 |
| 2020/0388650 A1* | 12/2020 | Nardi | G11C 13/0026 |
| 2020/0395407 A1* | 12/2020 | Takahashi | H10N 70/066 |
| 2020/0395408 A1* | 12/2020 | Takahashi | H10B 63/845 |
| 2020/0402988 A1* | 12/2020 | Howder | H10B 43/27 |
| 2020/0403033 A1* | 12/2020 | Lilak | H10B 43/50 |
| 2021/0210503 A1* | 7/2021 | Matsuno | H01L 21/76877 |
| 2021/0313240 A1* | 10/2021 | Tanamachi | H10W 42/00 |
| 2021/0358936 A1* | 11/2021 | Takuma | H10B 43/27 |
| 2021/0366808 A1* | 11/2021 | Cui | H10B 43/27 |
| 2021/0366920 A1* | 11/2021 | Tokita | H10D 84/038 |
| 2021/0366924 A1* | 11/2021 | Tokita | H10B 41/27 |
| 2021/0407569 A1 | 12/2021 | Young et al. | |
| 2022/0028879 A1 | 1/2022 | Mochizuki et al. | |
| 2022/0302146 A1* | 9/2022 | Shimomura | H10B 43/35 |
| 2022/0328403 A1* | 10/2022 | Tobioka | H01L 23/5226 |
| 2022/0328512 A1* | 10/2022 | Tanaka | H10B 43/27 |
| 2022/0344362 A1* | 10/2022 | Cui | H10B 41/27 |
| 2022/0352201 A1* | 11/2022 | Hinoue | H10D 64/037 |
| 2022/0406379 A1 | 12/2022 | Takeguchi et al. | |
| 2022/0406720 A1 | 12/2022 | Hinou et al. | |
| 2022/0406793 A1 | 12/2022 | Takeguchi et al. | |
| 2023/0013984 A1* | 1/2023 | Otsu | H10B 41/27 |
| 2023/0023523 A1 | 1/2023 | Minamitani et al. | |
| 2023/0064713 A1* | 3/2023 | Shimomura | H10B 43/27 |
| 2023/0069307 A1* | 3/2023 | Shimomura | H01L 23/5283 |
| 2023/0328984 A1* | 10/2023 | Fujimura | H10B 41/27 |
| | | | 257/314 |
| 2024/0074200 A1* | 2/2024 | Zhou | H10B 43/10 |
| 2024/0138149 A1* | 4/2024 | Zhou | H10B 43/50 |
| 2024/0179916 A1* | 5/2024 | Matsuno | H01L 23/5283 |
| 2024/0215243 A1* | 6/2024 | Tsutsumi | H10B 43/10 |
| 2024/0237354 A1* | 7/2024 | Sondhi | H01L 23/5226 |
| 2024/0237355 A9* | 7/2024 | Zhou | H10B 43/35 |
| 2024/0290714 A1* | 8/2024 | Kraman | H10B 43/27 |
| 2024/0414916 A1* | 12/2024 | Iwai | H10B 43/50 |

OTHER PUBLICATIONS

Endoh et al., "Novel Ultra High-Density Memory with a Stacked-Surrounding Gate Transistor (S-SGT) Structured Cell," IEDM Proc. (2001) 33-36; https://doi.org/10.1109/iedm.2001.979396.

Nault, M. et. al., "Single layer chemical vapor deposition photoresist for 193 nm deep ultraviolet photolithography," *Journal of Vacuum Science & Technology B: Microelectronics and Nanometer Structures Processing, Measurement, and Phenomena*, vol. 16, No. 6 pp. 3730-3733 (1998); https://doi.org/10.1116/1.590398.

U.S. Appl. No. 17/678,499, filed Feb. 23, 2022, SanDisk Technologies LLC.

U.S. Appl. No. 18/360,541, filed Jul. 27, 2023, SanDisk Technologies LLC.

U.S. Appl. No. 18/360,641, filed Jul. 27, 2023, SanDisk Technologies LLC.

U.S. Appl. No. 18/450,115, filed Aug. 15, 2023, Western Digital Technologies, INC.

IPRP-WO—Notification Concerning Transmittal of International Preliminary Report on Patentability and Written Opinion of the International Searching Authority for International Patent Application No. PCT/US2024/011257, mailed Dec. 18, 2025, 6 pages.

* cited by examiner

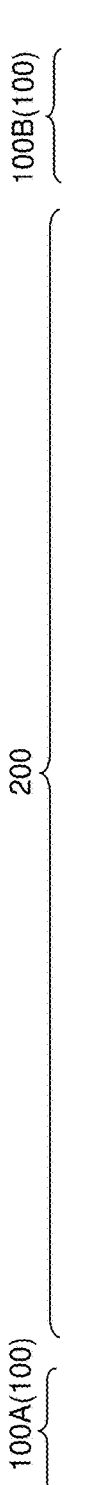
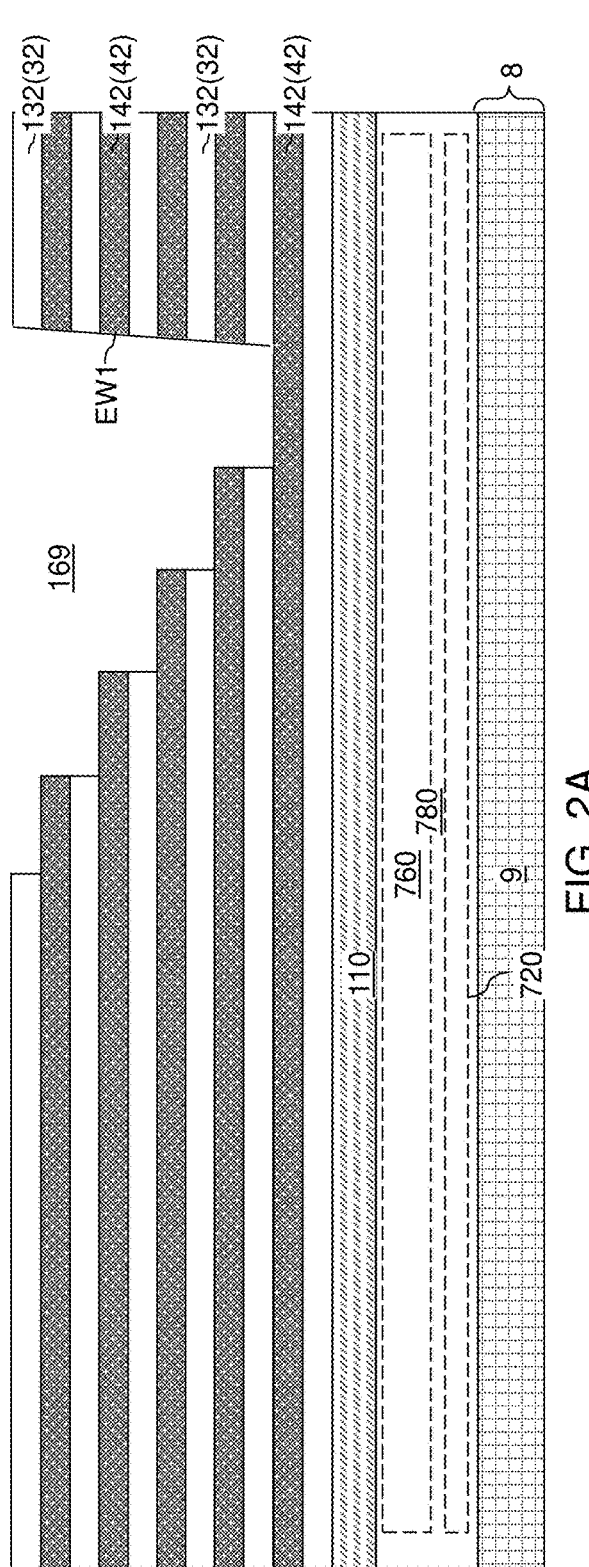
FIG. 2A

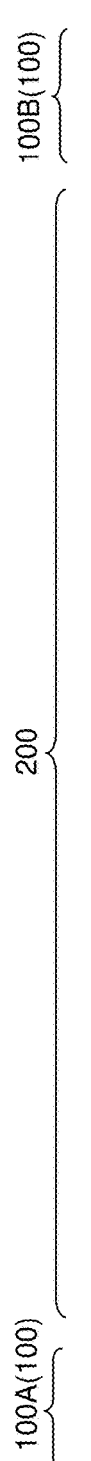
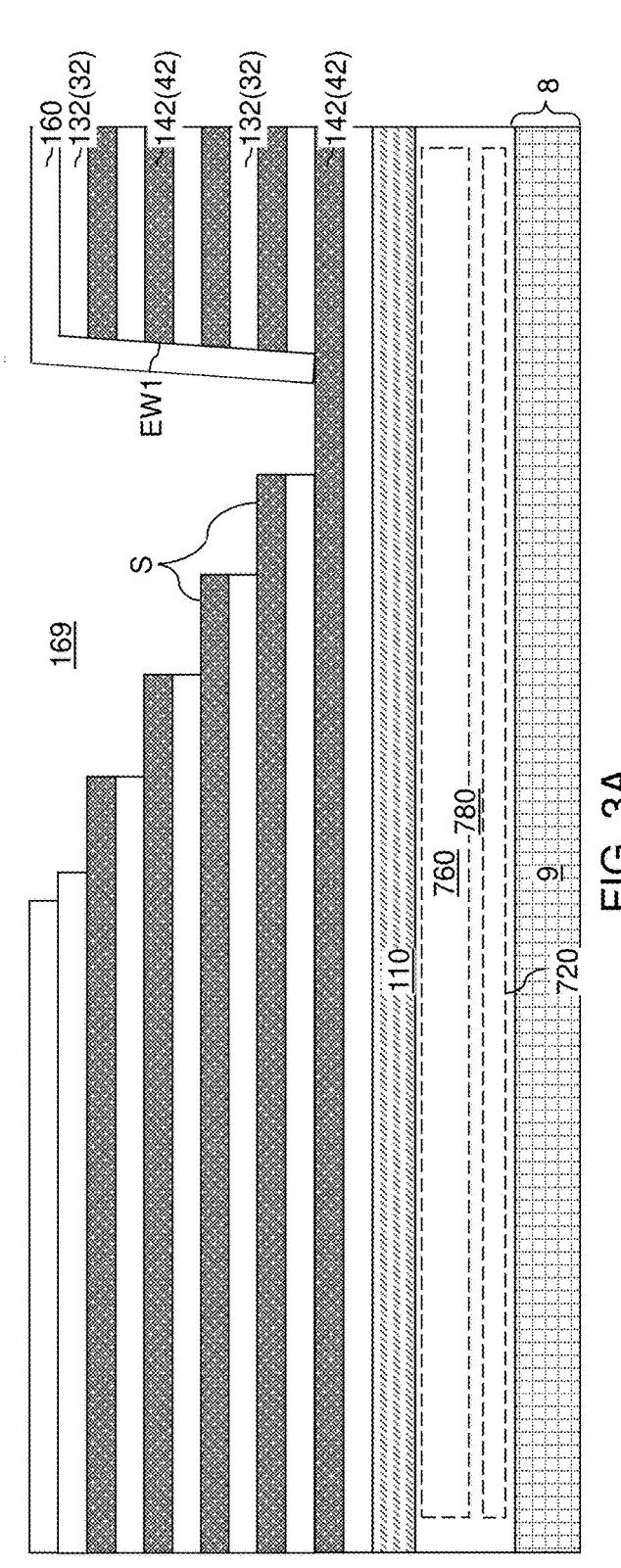
FIG. 3A

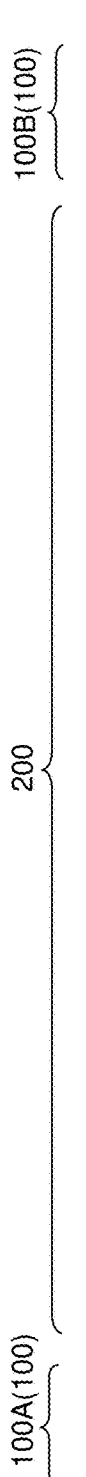
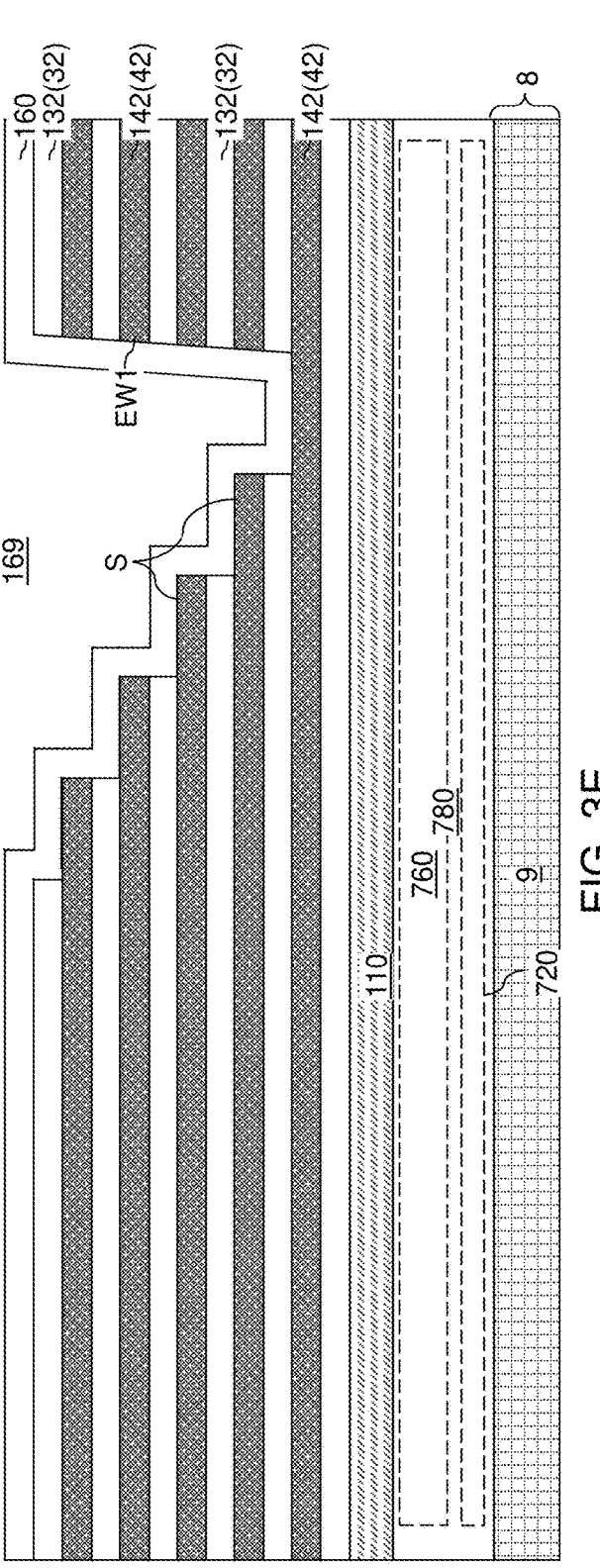
FIG. 3E

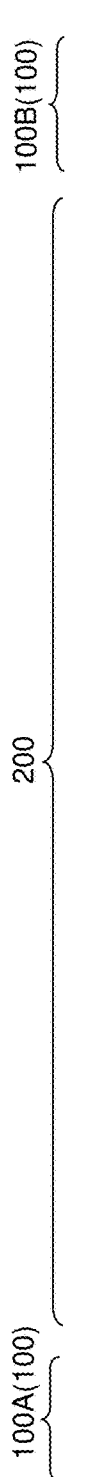
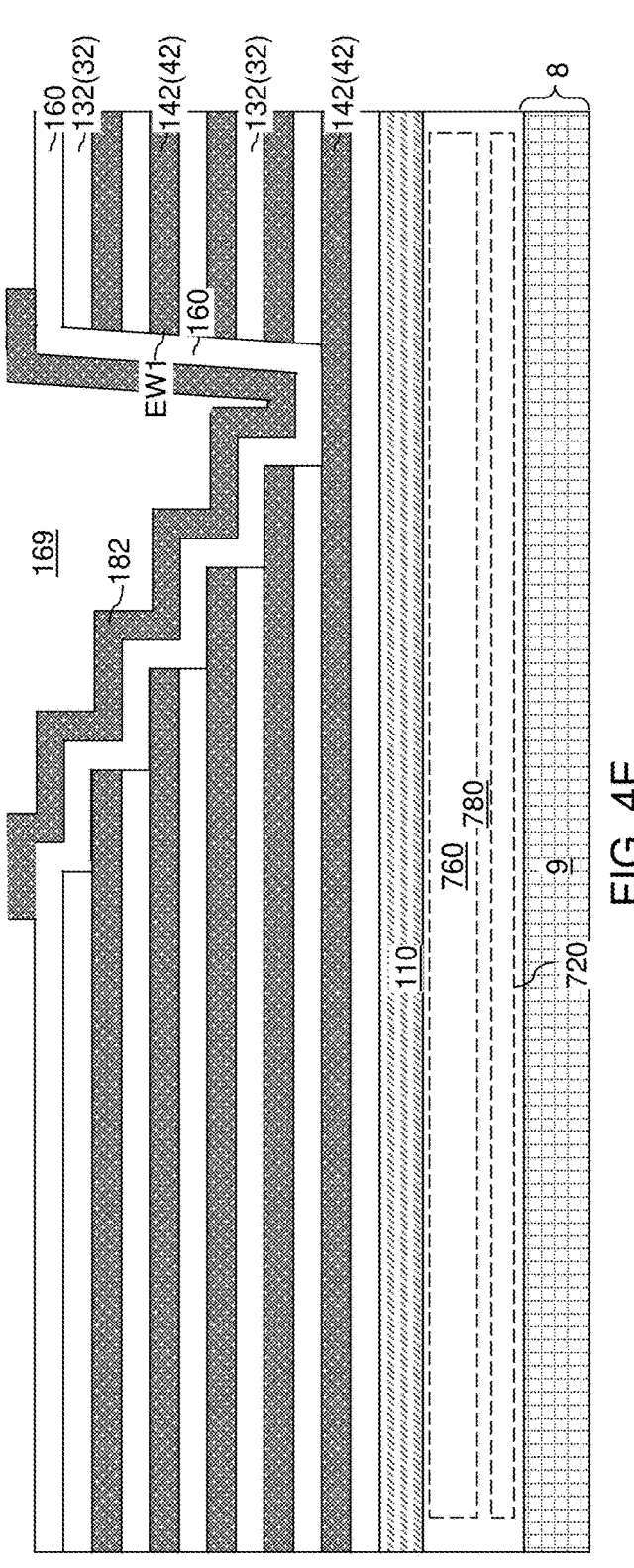
FIG. 4E

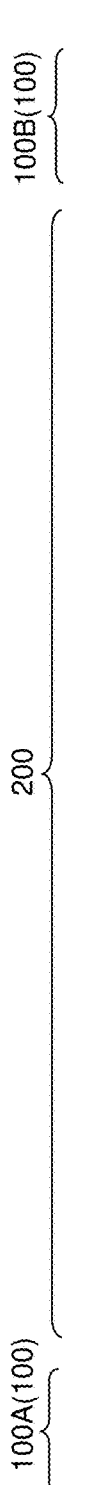
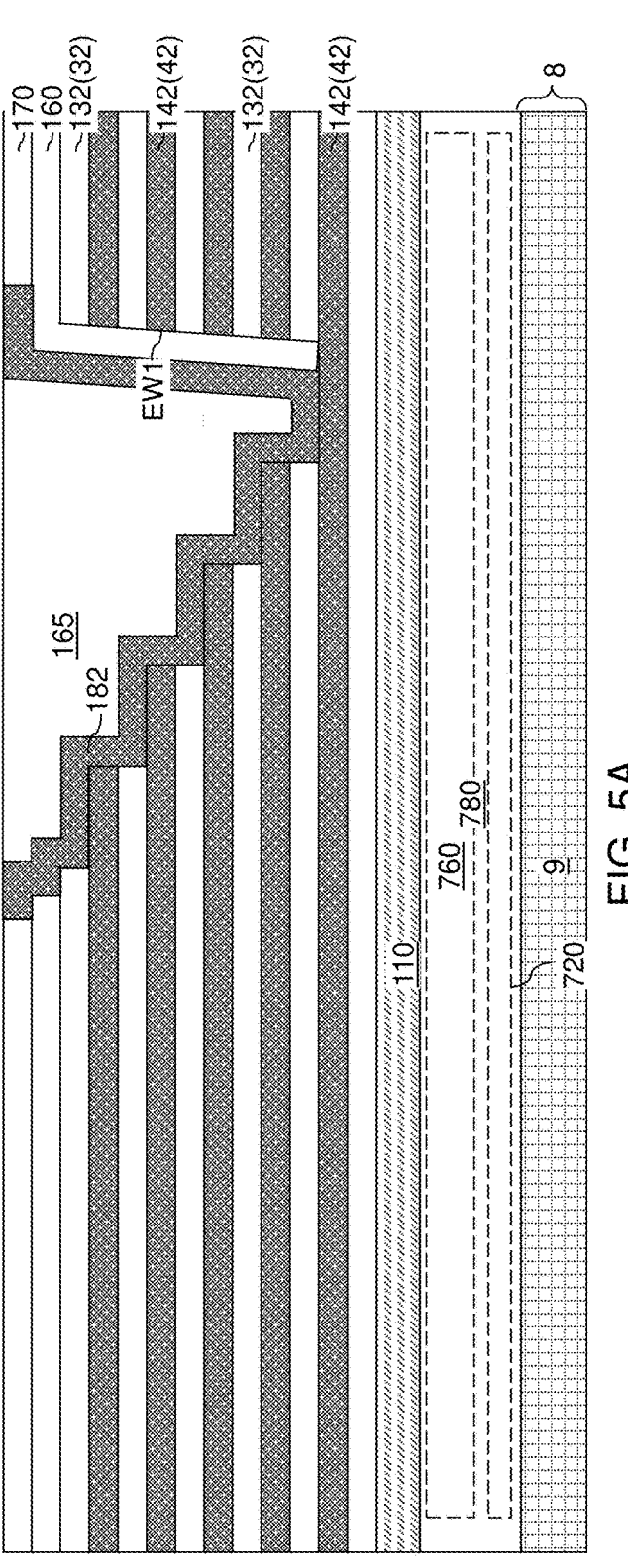
FIG. 5A

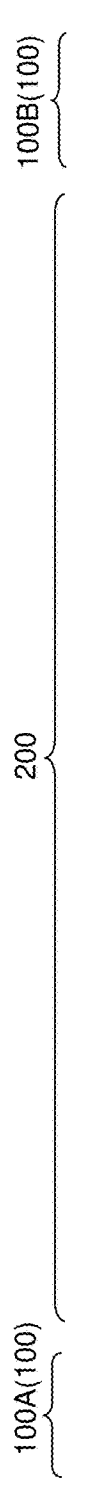
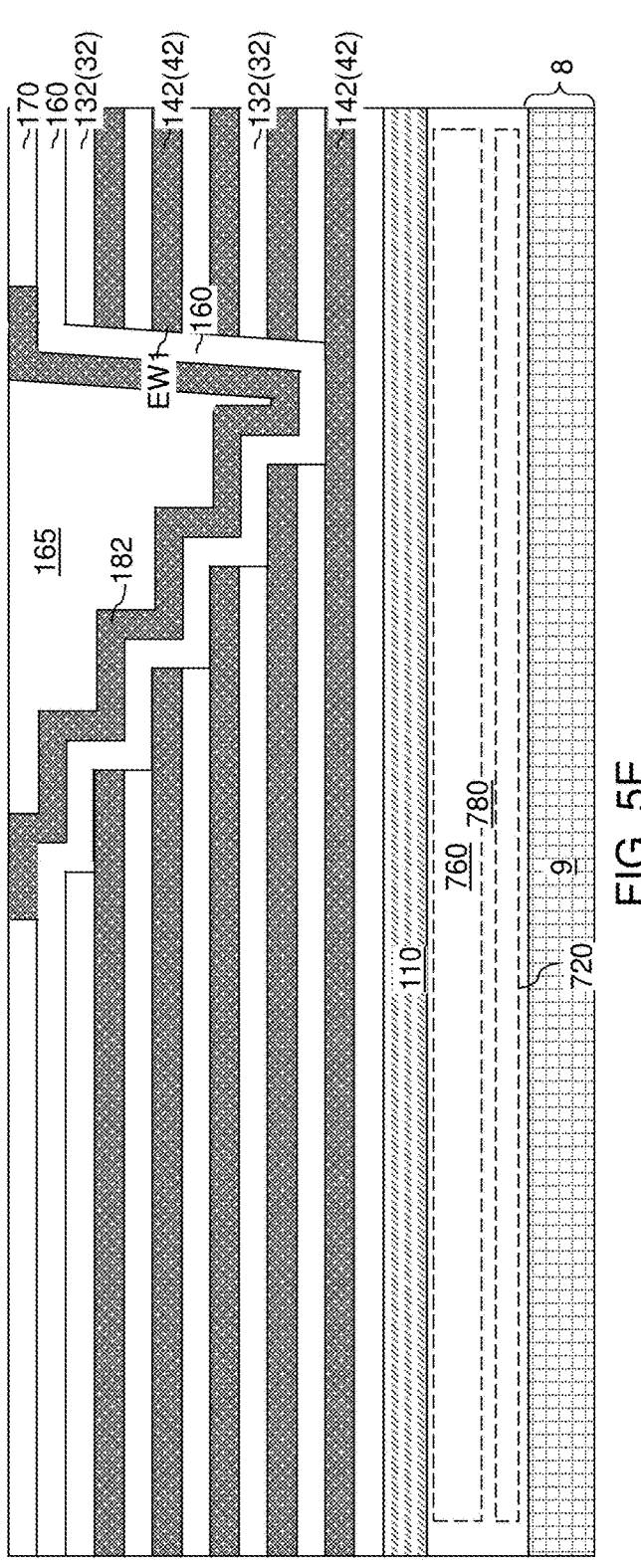
FIG. 5E

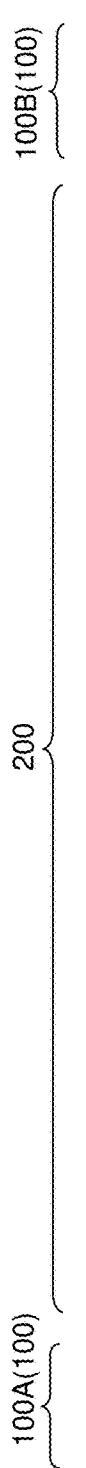
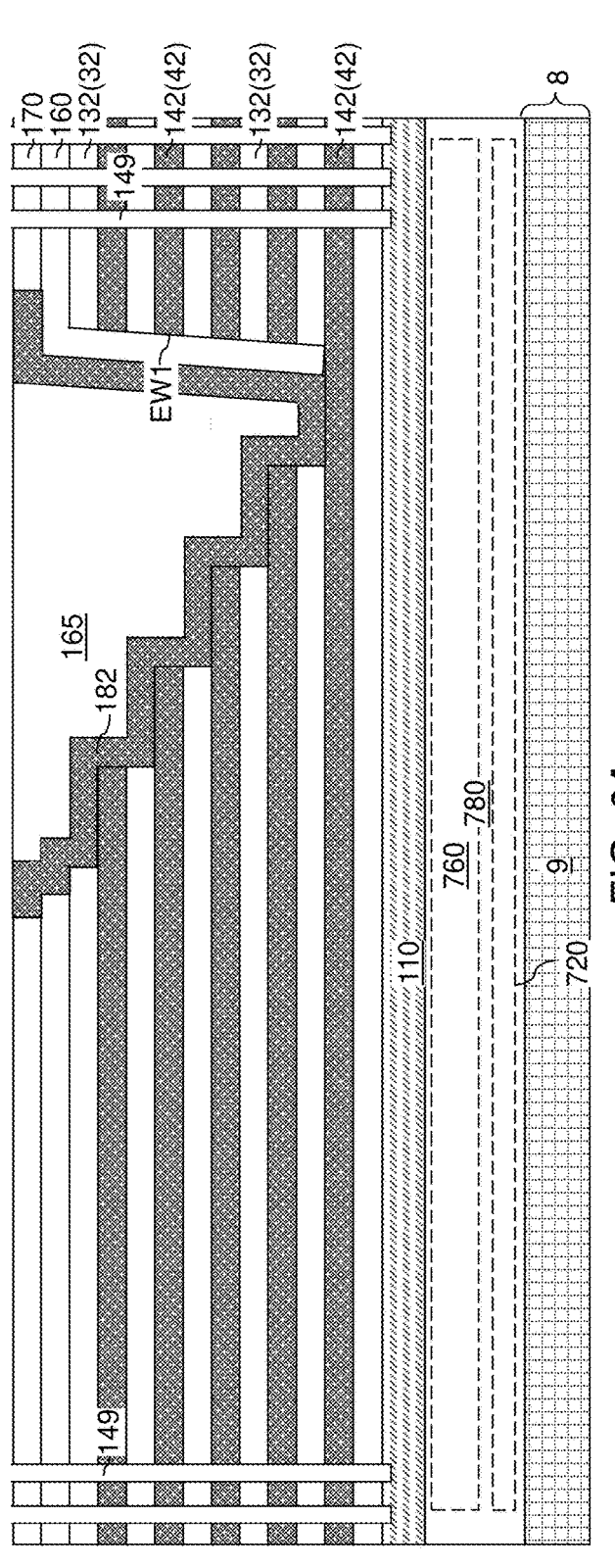
FIG. 6A

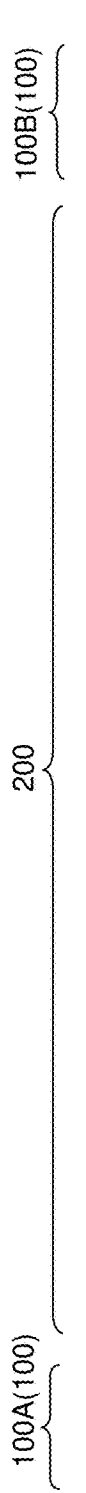
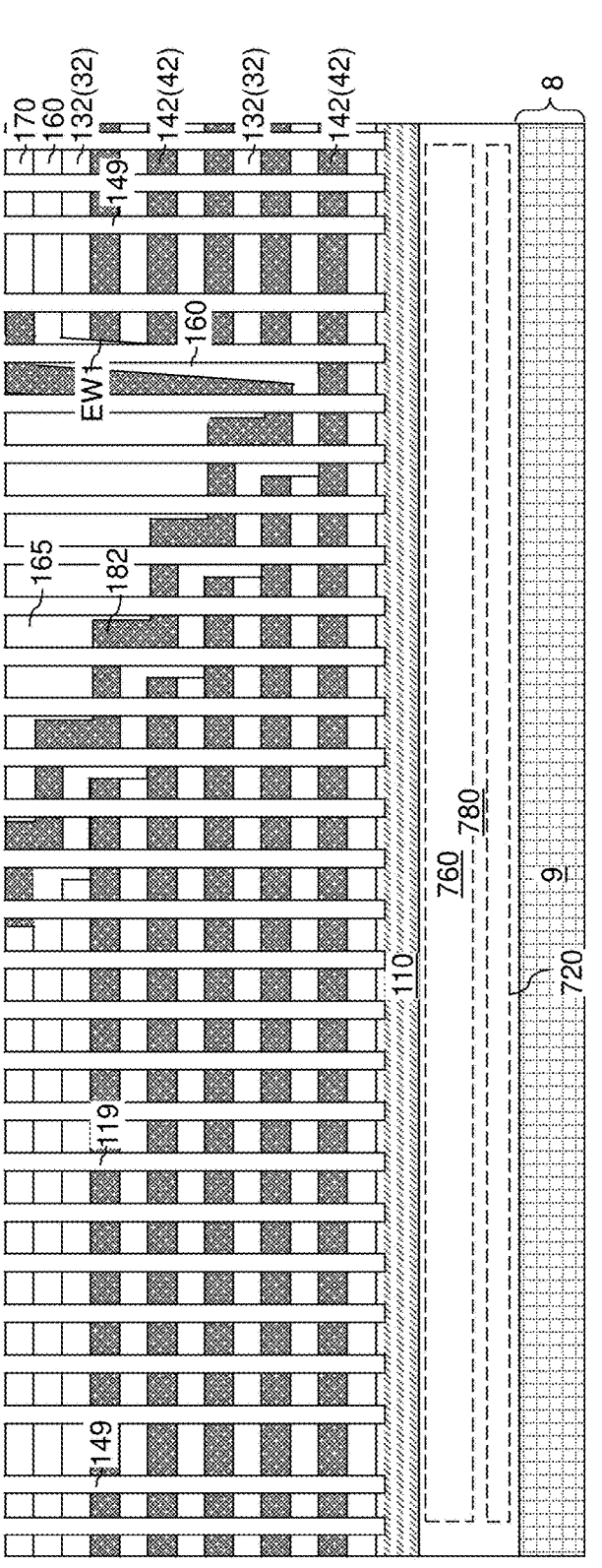
FIG. 6E

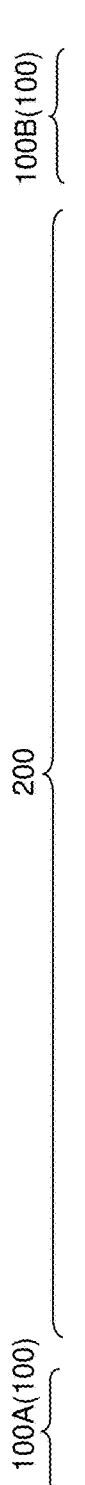
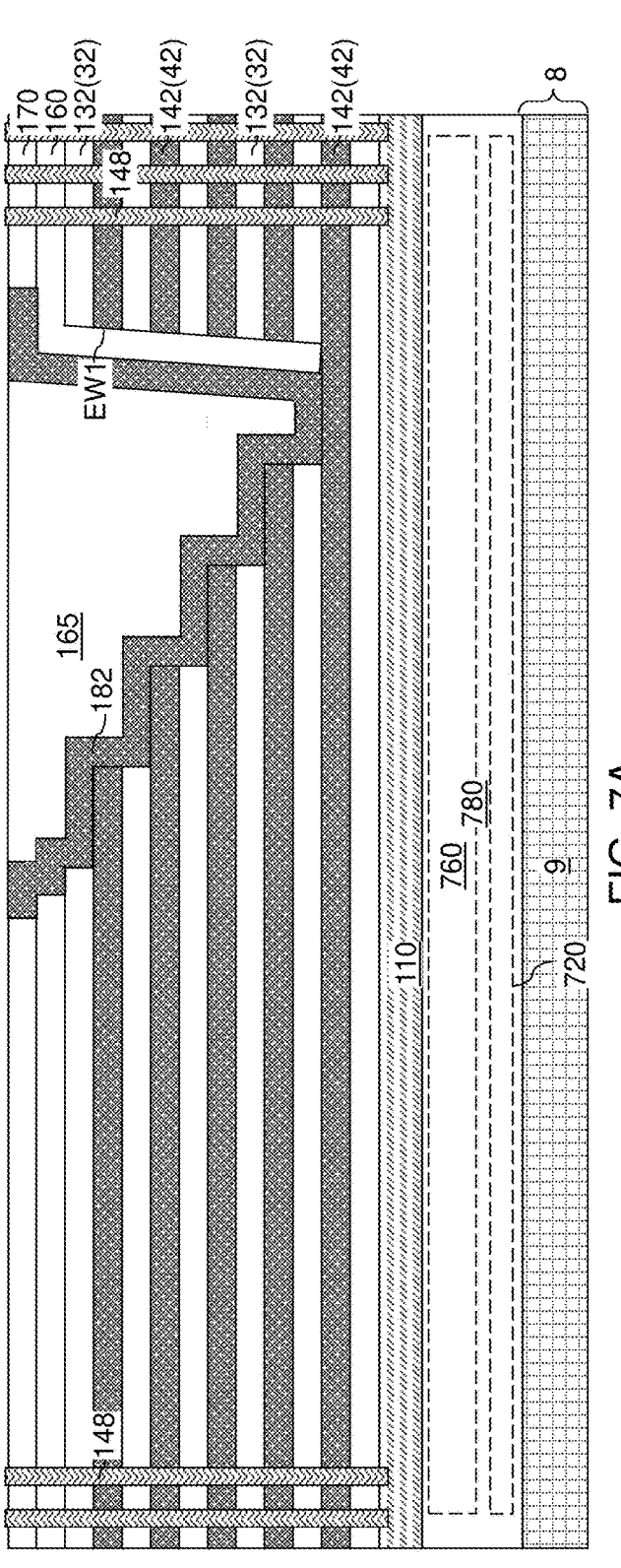
FIG. 7A

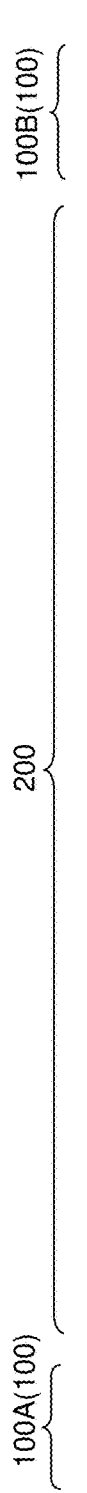
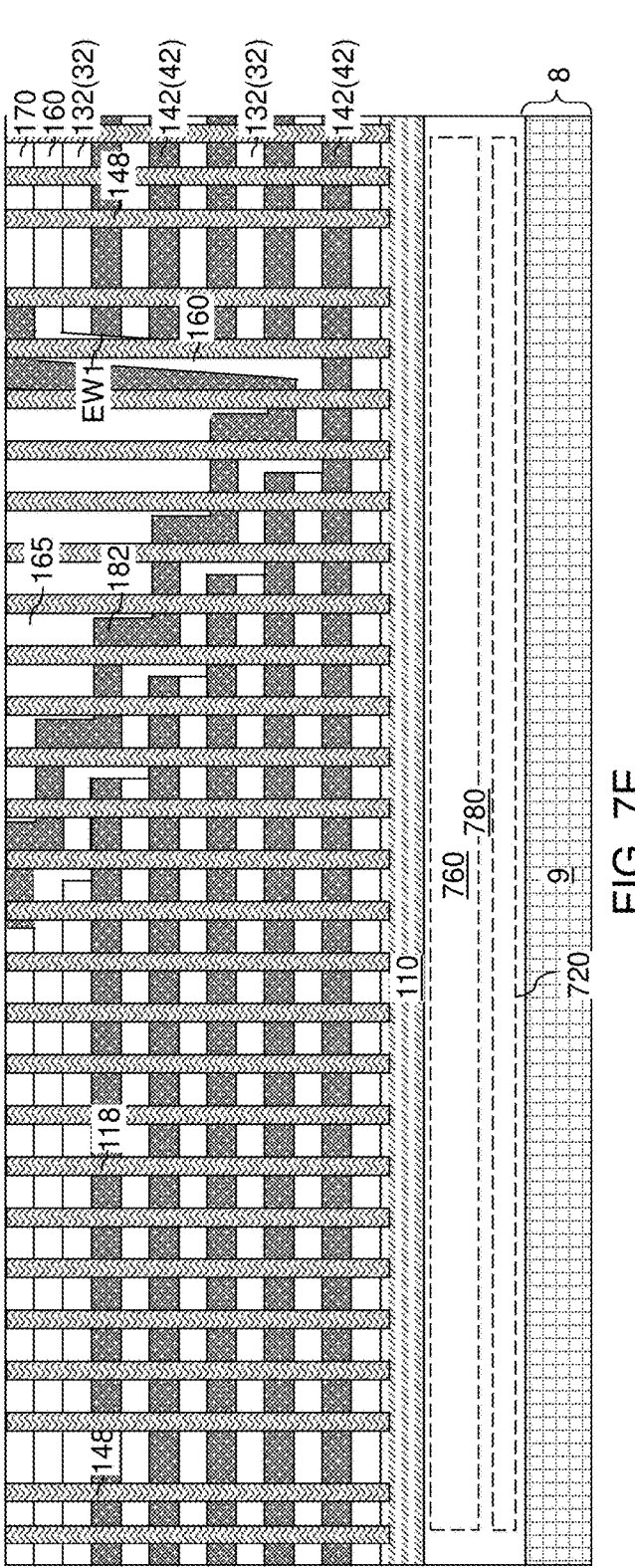
FIG. 7E

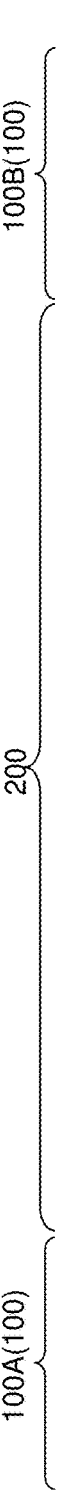
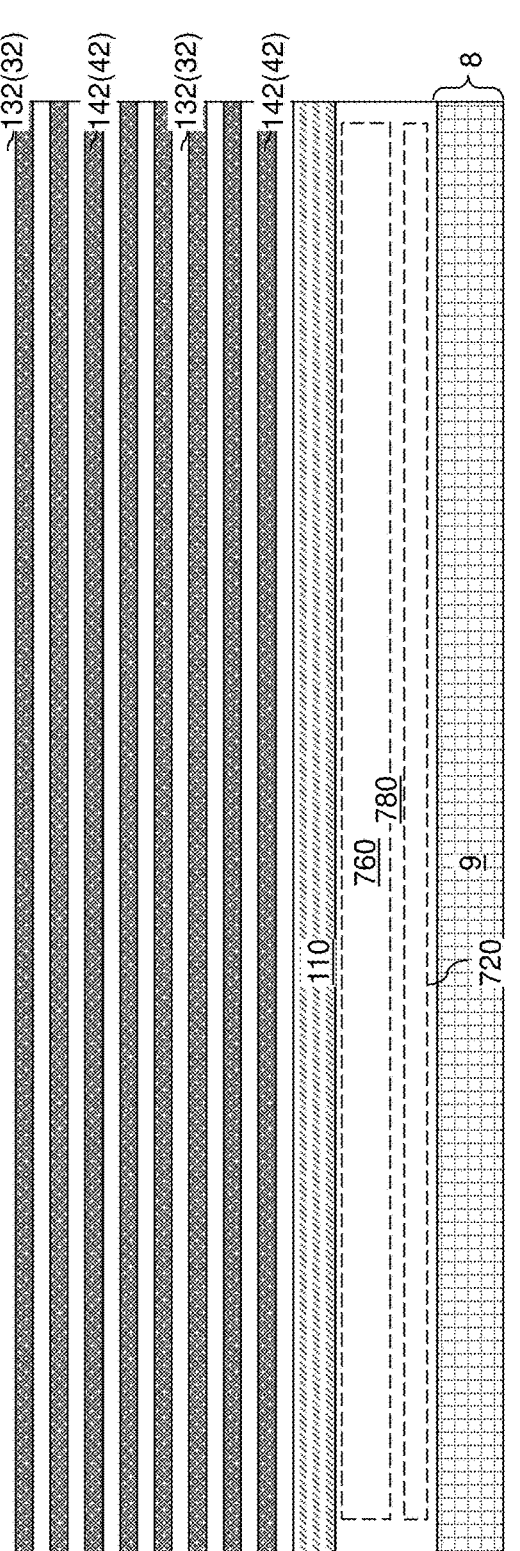
FIG. 29

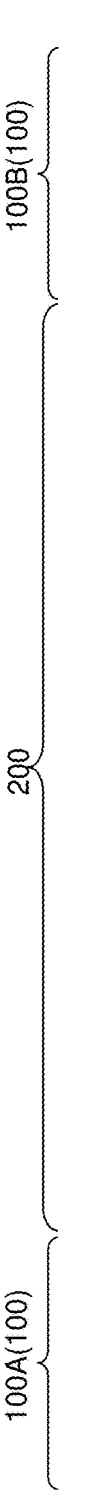
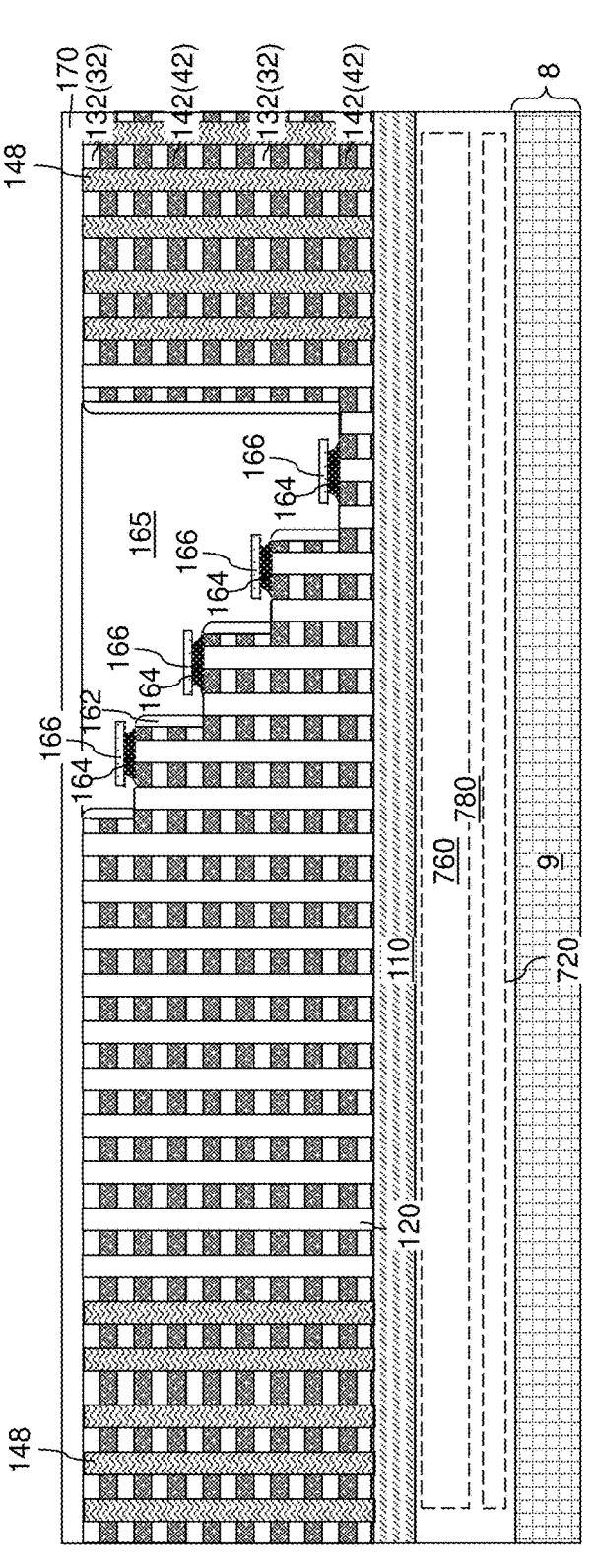
FIG. 39A

MEMORY DEVICE INCLUDING WORD LINE CONTACT STRIPS AND METHODS OF FORMING THE SAME

FIELD

The present disclosure relates generally to the field of semiconductor devices, and particularly to a three-dimensional memory device including word line contact strips and methods of forming the same.

BACKGROUND

A three-dimensional memory device including three-dimensional vertical NAND strings having one bit per cell are disclosed in an article by T. Endoh et al, titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: a first alternating stack including first insulating layers and first electrically conductive layers that are interlaced along a vertical direction, wherein a first stepped cavity located inside the first alternating stack comprises a first stepped bottom surface containing horizontally-extending surface segments of the first electrically conductive layers; a memory opening vertically extending through each layer within the first alternating stack; a memory opening fill structure located in the memory opening and including a vertical stack of memory elements and a vertical semiconductor channel; a first insulating spacer contacting sidewalls of the first stepped cavity; and a first electrically conductive strip comprising a first horizontally-extending bottom strip segment contacting one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment.

According to another aspect of the present disclosure, a method comprises: forming a first alternating stack of first insulating layers and first sacrificial material layers that are interlaced along a vertical direction; forming a first stepped cavity in the first alternating stack, wherein the first stepped cavity comprises a first stepped bottom surface containing horizontally-extending surface segments of the first sacrificial material layers; forming a first insulating spacer contacting vertically-extending surfaces of the first stepped cavity; forming a first continuous electrically conductive material layer over the first insulating spacer and the first stepped bottom surface; patterning the first continuous electrically conductive material layer into first electrically conductive strips; forming a first retro-stepped dielectric material portion in the first stepped cavity; and replacing the first sacrificial material layers with first electrically conductive layers, wherein each of the first electrically conductive strips contacts a surface segment of a respective one of the first electrically conductive layers.

According to an embodiment of the present disclosure, a memory device comprises an alternating stack including insulating layers and electrically conductive layers that are interlaced along a vertical direction, wherein the alternating stack comprises a tapered sidewall that laterally extends along a first horizontal direction and which is inclined along a second horizontal direction perpendicular to the first horizontal direction; memory openings vertically extending through each layer within the alternating stack; memory opening fill structures located in the memory opening and including a respective vertical stack of memory elements and a respective vertical semiconductor channel; a cavity in the alternating stack bounded laterally along a first side by the tapered sidewall, and having a bottom surface comprising stepped surfaces of at least some of the electrically conductive layers; an insulating liner located over the tapered sidewall in the cavity; and electrically conductive strips which are adjoined to a respective one of the stepped surfaces at the bottom surface of the cavity, which extend over the insulating liner and the tapered sidewall in the cavity, and which include a respective topmost portion that is located above the topmost surface of the alternating stack.

According to another aspect of the present disclosure, a method of forming a memory device comprises forming an alternating stack of insulating layers and sacrificial material layers that are interlaced along a vertical direction; forming a cavity in the alternating stack such that stepped surfaces of the sacrificial material layers of the alternating stack are exposed at a bottom surface of the cavity; forming an insulating liner over the stepped surfaces, over a tapered sidewall of the alternating stack, and over a topmost layer of the alternating stack; forming an elongated opening through the insulating liner, wherein a strip segment of the stepped surfaces is exposed through the elongated opening through the insulating liner; forming a sacrificial liner on the strip segment of the stepped surfaces and over the elongated openings such that the sacrificial liner comprises a top portion that overlies the alternating stack; forming a dielectric fill structure over the sacrificial liner; forming memory openings vertically extending at least through the alternating stack; forming memory opening fill structures in the memory openings, wherein each of the memory opening fill structures comprises a respective vertical stack of memory elements and a respective vertical semiconductor channel; forming lateral isolation trenches and an array of isolation cavities through the alternating stack, wherein the lateral isolation trenches and the array of isolation cavities divide the sacrificial liner into sacrificial liner strips that are laterally spaced apart from each other; and replacing remaining portions of the sacrificial material layers and the sacrificial liner strips with electrically conductive material portions, wherein electrically conductive layers are formed in volumes from which the remaining portions of the sacrificial material layers are removed, and electrically conductive strips are formed in volumes from which the sacrificial liner strips are removed, respectively.

BRIEF DESCRIPTION OF THE DRAWINGS

FIGS. 2A-2D are various views of a first exemplary structure after formation of optional semiconductor devices, optional lower level dielectric layers, optional lower metal interconnect structures, a semiconductor material layer, a first alternating layer stack of first insulating layers and first sacrificial material layers, and a first cavity according to an embodiment of the present disclosure. FIG. 2B is a top-down view. FIG. 2A is a vertical cross-sectional view along the vertical plane A-A' of FIG. 2B. FIG. 2C is a vertical cross-sectional view along the vertical plane C-C' of FIG.

2B. FIG. 2D is a vertical cross-sectional view along the vertical plane D-D' of FIG. 2B. The illustrated region of FIGS. 2A-2D correspond to area M1 in FIG. 1.

FIGS. 3A-3E are various views of the first exemplary structure after deposition and patterning of a first insulating liner according to an embodiment of the present disclosure. FIG. 3B is a top-down view. FIG. 3A is a vertical cross-sectional view along the vertical plane A-A' of FIG. 3B. FIG. 3C is a vertical cross-sectional view along the vertical plane C-C' of FIG. 3B. FIG. 3D is a vertical cross-sectional view along the vertical plane D-D' of FIG. 3B. FIG. 3E is a vertical cross-sectional view along the vertical plane E-E' of FIG. 3B.

FIGS. 4A-4E are various views of the first exemplary structure after deposition and patterning of a first sacrificial liner according to an embodiment of the present disclosure. FIG. 4B is a top-down view. FIG. 4A is a vertical cross-sectional view along the vertical plane A-A' of FIG. 4B. FIG. 4C is a vertical cross-sectional view along the vertical plane C-C' of FIG. 4B. FIG. 4D is a vertical cross-sectional view along the vertical plane D-D' of FIG. 4B. FIG. 4E is a vertical cross-sectional view along the vertical plane E-E' of FIG. 4B.

FIGS. 5A-5E are various views of the first exemplary structure after formation of a first insulating cap layer and a first dielectric fill structure according to an embodiment of the present disclosure. FIG. 5B is a top-down view. FIG. 5A is a vertical cross-sectional view along the vertical plane A-A' of FIG. 5B. FIG. 5C is a vertical cross-sectional view along the vertical plane C-C' of FIG. 5B. FIG. 5D is a vertical cross-sectional view along the vertical plane D-D' of FIG. 5B. FIG. 5E is a vertical cross-sectional view along the vertical plane E-E' of FIG. 5B.

FIGS. 6A-6E are various views of the first exemplary structure after formation of first-tier memory openings and first-tier support openings according to an embodiment of the present disclosure. FIG. 6B is a top-down view. FIG. 6A is a vertical cross-sectional view along the vertical plane A-A' of FIG. 6B. FIG. 6C is a vertical cross-sectional view along the vertical plane C-C' of FIG. 6B. FIG. 6D is a vertical cross-sectional view along the vertical plane D-D' of FIG. 6B. FIG. 6E is a vertical cross-sectional view along the vertical plane E-E' of FIG. 6B.

FIGS. 7A-7E are various views of the first exemplary structure after formation of first-tier sacrificial opening fill structures according to an embodiment of the present disclosure. FIG. 7B is a top-down view. FIG. 7A is a vertical cross-sectional view along the vertical plane A-A' of FIG. 7B. FIG. 7C is a vertical cross-sectional view along the vertical plane C-C' of FIG. 7B. FIG. 7D is a vertical cross-sectional view along the vertical plane D-D' of FIG. 7B. FIG. 7E is a vertical cross-sectional view along the vertical plane E-E' of FIG. 7B.

FIG. 8B is a top-down view. FIG. 8A is a vertical cross-sectional view along the vertical plane A-A' of FIG. 8B. FIG. 8C is a vertical cross-sectional view along the vertical plane C-C' of FIG. 8B. FIG. 8D is a vertical cross-sectional view along the vertical plane D-D' of FIG. 8B. FIG. 8E is a vertical cross-sectional view along the vertical plane E-E' of FIG. 8B.

FIG. 9B is a top-down view. FIG. 9A is a vertical cross-sectional view along the vertical plane A-A' of FIG. 9B. FIG. 9C is a vertical cross-sectional view along the vertical plane C-C' of FIG. 9B. FIG. 9D is a vertical cross-sectional view along the vertical plane D-D' of FIG. 9B. FIG. 9E is a vertical cross-sectional view along the vertical plane E-E' of FIG. 9B.

FIG. 10B is a top-down view. FIG. 10A is a vertical cross-sectional view along the vertical plane A-A' of FIG. 10B. FIG. 10C is a vertical cross-sectional view along the vertical plane C-C' of FIG. 10B. FIG. 10D is a vertical cross-sectional view along the vertical plane D-D' of FIG. 10B. FIG. 10E is a vertical cross-sectional view along the vertical plane E-E' of FIG. 10B.

FIG. 11B is a top-down view. FIG. 11A is a vertical cross-sectional view along the vertical plane A-A' of FIG. 11B. FIG. 11C is a vertical cross-sectional view along the vertical plane C-C' of FIG. 11B. FIG. 11D is a vertical cross-sectional view along the vertical plane D-D' of FIG. 11B. FIG. 11E is a vertical cross-sectional view along the vertical plane E-E' of FIG. 11B.

FIG. 12B is a top-down view. FIG. 12A is a vertical cross-sectional view along the vertical plane A-A' of FIG. 12B. FIG. 12C is a vertical cross-sectional view along the vertical plane C-C' of FIG. 12B. FIG. 12D is a vertical cross-sectional view along the vertical plane D-D' of FIG. 12B. FIG. 12E is a vertical cross-sectional view along the vertical plane E-E' of FIG. 12B.

FIG. 13B is a top-down view. FIG. 13A is a vertical cross-sectional view along the vertical plane A-A' of FIG. 13B. FIG. 13C is a vertical cross-sectional view along the vertical plane C-C' of FIG. 13B. FIG. 13D is a vertical cross-sectional view along the vertical plane D-D' of FIG. 13B. FIG. 13E is a vertical cross-sectional view along the vertical plane E-E' of FIG. 13B.

FIG. 14B is a top-down view. FIG. 14A is a vertical cross-sectional view along the vertical plane A-A' of FIG. 14B. FIG. 14C is a vertical cross-sectional view along the vertical plane C-C' of FIG. 14B. FIG. 14D is a vertical cross-sectional view along the vertical plane D-D' of FIG. 14B. FIG. 14E is a vertical cross-sectional view along the vertical plane E-E' of FIG. 14B.

FIG. 15B is a top-down view. FIG. 15A is a vertical cross-sectional view along the vertical plane A-A' of FIG. 15B. FIG. 15C is a vertical cross-sectional view along the vertical plane C-C' of FIG. 15B. FIG. 15D is a vertical cross-sectional view along the vertical plane D-D' of FIG.

15B. FIG. 15E is a vertical cross-sectional view along the vertical plane E-E' of FIG. 15B.

FIG. 17B is a top-down view. FIG. 17A is a vertical cross-sectional view along the vertical plane A-A' of FIG. 17B. FIG. 17C is a vertical cross-sectional view along the vertical plane C-C' of FIG. 17B. FIG. 17D is a vertical cross-sectional view along the vertical plane D-D' of FIG. 17B. FIG. 17E is a vertical cross-sectional view along the vertical plane E-E' of FIG. 17B. FIG. 17F is a vertical cross-sectional view along the vertical plane F-F' of FIG. 17B. FIG. 17G is a vertical cross-sectional view along the vertical plane G-G' of FIG. 17B.

FIG. 18B is a top-down view. FIG. 18A is a vertical cross-sectional view along the vertical plane A-A' of FIG. 18B. FIG. 18C is a vertical cross-sectional view along the vertical plane C-C' of FIG. 18B. FIG. 18D is a vertical cross-sectional view along the vertical plane D-D' of FIG. 18B. FIG. 18E is a vertical cross-sectional view along the vertical plane E-E' of FIG. 18B. FIG. 18F is a vertical cross-sectional view along the vertical plane F-F' of FIG. 18B. FIG. 18G is a vertical cross-sectional view along the vertical plane G-G' of FIG. 18B. FIG. 18H is a vertical cross-sectional view along the vertical plane H-H' of FIG. 18B. FIG. 18I is a vertical cross-sectional view along the vertical plane I-I' of FIG. 18B.

FIG. 19B is a top-down view. FIG. 19A is a vertical cross-sectional view along the vertical plane A-A' of FIG. 19B. FIG. 19C is a vertical cross-sectional view along the vertical plane C-C' of FIG. 19B. FIG. 19D is a vertical cross-sectional view along the vertical plane D-D' of FIG. 19B. FIG. 19E is a vertical cross-sectional view along the vertical plane E-E' of FIG. 19B. FIG. 19F is a vertical cross-sectional view along the vertical plane F-F' of FIG. 19B. FIG. 19G is a vertical cross-sectional view along the vertical plane G-G' of FIG. 19B. FIG. 19H is a vertical cross-sectional view along the vertical plane H-H' of FIG. 19B. FIG. 19I is a vertical cross-sectional view along the vertical plane I-I' of FIG. 19B.

FIGS. 20A-20I are various views of the first exemplary structure after formation of electrically conductive layers and electrically conductive strips and isolation cavities according to an embodiment of the present disclosure. FIG. 20B is a top-down view. FIG. 20A is a vertical cross-sectional view along the vertical plane A-A' of FIG. 20B. FIG. 20C is a vertical cross-sectional view along the vertical plane C-C' of FIG. 20B. FIG. 20D is a vertical cross-sectional view along the vertical plane D-D' of FIG. 20B. FIG. 20E is a vertical cross-sectional view along the vertical plane E-E' of FIG. 20B. FIG. 20F is a vertical cross-sectional view along the vertical plane F-F' of FIG. 20B. FIG. 20G is a vertical cross-sectional view along the vertical plane G-G' of FIG. 20B. FIG. 20H is a vertical cross-sectional view along the vertical plane H-H' of FIG. 20B. FIG. 20I is a vertical cross-sectional view along the vertical plane I-I' of FIG. 20B.

FIG. 21B is a top-down view. FIG. 21A is a vertical cross-sectional view along the vertical plane A-A' of FIG. 21B. FIG. 21C is a vertical cross-sectional view along the vertical plane C-C' of FIG. 21B. FIG. 21D is a vertical cross-sectional view along the vertical plane D-D' of FIG. 21B. FIG. 21E is a vertical cross-sectional view along the vertical plane E-E' of FIG. 21B. FIG. 21F is a vertical cross-sectional view along the vertical plane F-F' of FIG. 21B. FIG. 21G is a vertical cross-sectional view along the vertical plane G-G' of FIG. 21B. FIG. 21H is a vertical cross-sectional view along the vertical plane H-H' of FIG. 21B. FIG. 21I is a vertical cross-sectional view along the vertical plane I-I' of FIG. 21B.

FIG. 27B is a top-down view. FIG. 27A is a vertical cross-sectional view along the vertical plane A-A' of FIG. 27B. FIG. 27C is a vertical cross-sectional view along the vertical plane C-C' of FIG. 27B. FIG. 27D is a vertical cross-sectional view along the vertical plane D-D' of FIG.

27B. FIG. 27E is a vertical cross-sectional view along the vertical plane E-E' of FIG. 27B.

FIG. 28B is a top-down view. FIG. 28A is a vertical cross-sectional view along the vertical plane A-A' of FIG. 28B. FIG. 28C is a vertical cross-sectional view along the vertical plane C-C' of FIG. 28B. FIG. 28D is a vertical cross-sectional view along the vertical plane D-D' of FIG. 28B. FIG. 28E is a vertical cross-sectional view along the vertical plane E-E' of FIG. 28B. FIG. 28F is a cut-away perspective view of a portion of the first exemplary structure. FIG. 28G is a vertical cross-sectional view of FIG. 28B in area M2 of FIG. 1.

FIG. 29 is a vertical cross-sectional view of a second exemplary structure after formation of optional semiconductor devices, optional lower level dielectric layers, optional lower metal interconnect structures, a semiconductor material layer, a first alternating layer stack of first insulating layers and first sacrificial material layers according to an embodiment of the present disclosure.

FIG. 33B is a top-down view. FIG. 33A is a vertical cross-sectional view along the vertical plane A-A' of FIG. 33B. FIG. 33C is a vertical cross-sectional view along the vertical plane C-C' of FIG. 33B.

FIG. 34B is a top-down view. FIG. 34A is a vertical cross-sectional view along the vertical plane A-A' of FIG. 34B. FIG. 34C is a vertical cross-sectional view along the vertical plane C-C' of FIG. 34B.

FIG. 35B is a top-down view. FIG. 35A is a vertical cross-sectional view along the vertical plane A-A' of FIG. 35B. FIG. 35C is a vertical cross-sectional view along the vertical plane C-C' of FIG. 35B.

FIG. 36B is a top-down view. FIG. 36A is a vertical cross-sectional view along the vertical plane A-A' of FIG. 36B. FIG. 36C is a vertical cross-sectional view along the vertical plane C-C' of FIG. 36B.

FIG. 37B is a top-down view.

FIG. 37A is a vertical cross-sectional view along the vertical plane A-A' of FIG. 37B. FIG. 37C is a vertical cross-sectional view along the vertical plane C-C' of FIG. 37B.

FIG. 38B is a top-down view. FIG. 38A is a vertical cross-sectional view along the vertical plane A-A' of FIG. 38B. FIG. 38C is a vertical cross-sectional view along the vertical plane C-C' of FIG. 38B.

FIGS. 39A-39C are various views of the second exemplary structure after formation of a first retro-stepped dielectric material portion and a first insulating cap layer according to an embodiment of the present disclosure. FIG. 39B is a top-down view. FIG. 39A is a vertical cross-sectional view along the vertical plane A-A' of FIG. 39B. FIG. 39C is a vertical cross-sectional view along the vertical plane C-C' of FIG. 39B.

FIG. 42B is a top-down view. FIG. 42A is a vertical cross-sectional view along the vertical plane A-A' of FIG. 42B. FIG. 42C is a vertical cross-sectional view along the vertical plane C-C' of FIG. 42B. FIG. 42D is a vertical cross-sectional view along the vertical plane D-D' of FIG. 42B. FIG. 42E is a vertical cross-sectional view along the vertical plane E-E' of FIG. 42B. FIG. 42F is a vertical cross-sectional view along the vertical plane F-F' of FIG. 42B.

FIG. 43B is a top-down view. FIG. 43A is a vertical cross-sectional view along the vertical plane A-A' of FIG. 43B. FIG. 43C is a vertical cross-sectional view along the vertical plane C-C' of FIG. 43B. FIG. 43D is a vertical cross-sectional view along the vertical plane D-D' of FIG. 43B. FIG. 43E is a vertical cross-sectional view along the vertical plane E-E' of FIG. 43B. FIG. 43F is a vertical cross-sectional view along the vertical plane F-F' of FIG. 43B.

FIG. 44B is a top-down view. FIG. 44A is a vertical cross-sectional view along the vertical plane A-A' of FIG. 44B. FIG. 44C is a vertical cross-sectional view along the vertical plane C-C' of FIG. 44B. FIG. 44D is a vertical cross-sectional view along the vertical plane D-D' of FIG. 44B. FIG. 44E is a vertical cross-sectional view along the vertical plane E-E' of FIG. 44B. FIG. 44F is a vertical cross-sectional view along the vertical plane F-F' of FIG. 44B.

FIG. 46B is a top-down view. FIG. 46A is a vertical cross-sectional view along the vertical plane A-A' of FIG. 46B. FIG. 46C is a vertical cross-sectional view along the vertical plane C-C' of FIG. 46B.

FIG. 47B is a top-down view. FIG. 47A is a vertical cross-sectional view along the vertical plane A-A' of FIG. 47B. FIG. 47C is a vertical cross-sectional view along the vertical plane C-C' of FIG. 47B.

FIG. 48B is a top-down view. FIG. 48A is a vertical cross-sectional view along the vertical plane A-A' of FIG. 48B. FIG. 48C is a vertical cross-sectional view along the vertical plane C-C' of FIG. 48B.

FIG. 49B is a top-down view. FIG. 49A is a vertical cross-sectional view along the vertical plane A-A' of FIG. 49B. FIG. 49C is a vertical cross-sectional view along the vertical plane C-C' of FIG. 49B.

FIG. 50B is a top-down view. FIG. 50A is a vertical cross-sectional view along the vertical plane A-A' of FIG. 50B. FIG. 50C is a vertical cross-sectional view along the vertical plane C-C' of FIG. 50B.

FIG. 51B is a top-down view. FIG. 51A is a vertical cross-sectional view along the vertical plane A-A' of FIG. 51B. FIG. 51C is a vertical cross-sectional view along the vertical plane C-C' of FIG. 51B.

DETAILED DESCRIPTION

Figure 1:
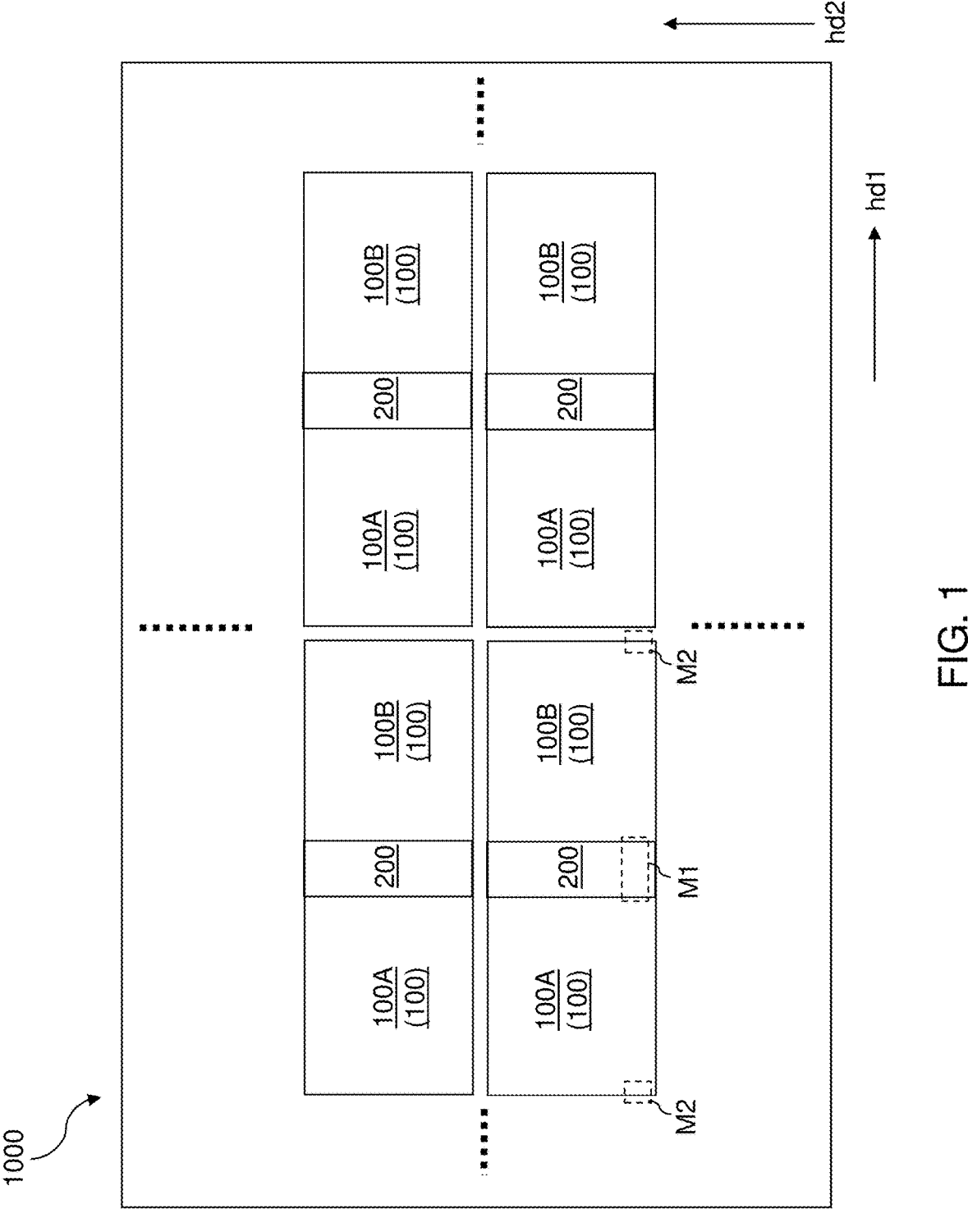
FIG. 1 is a plan view of an exemplary semiconductor die including multiple three-dimensional memory array regions according to an embodiment of the present disclosure.
Figure 2B:
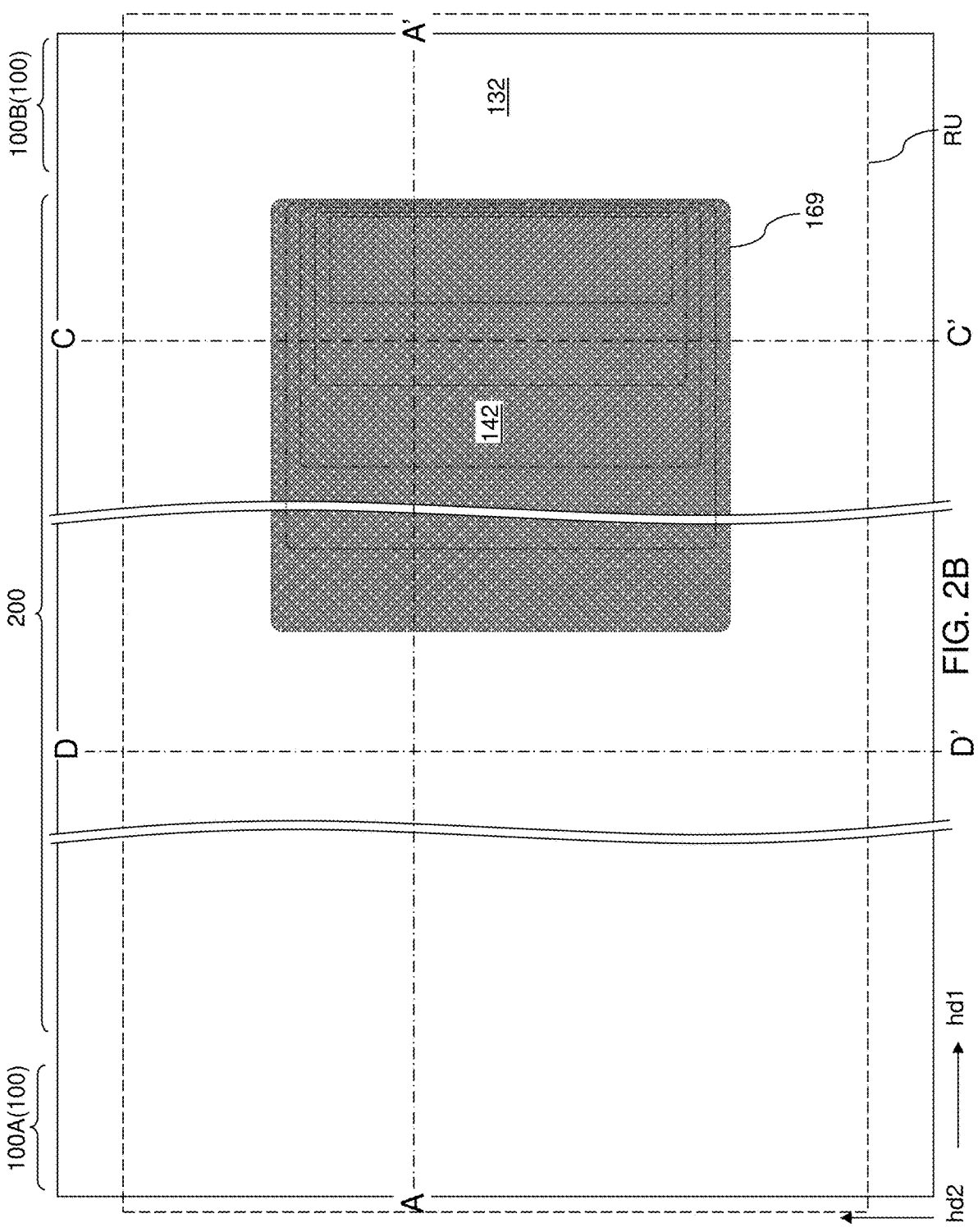
Figure 2C:
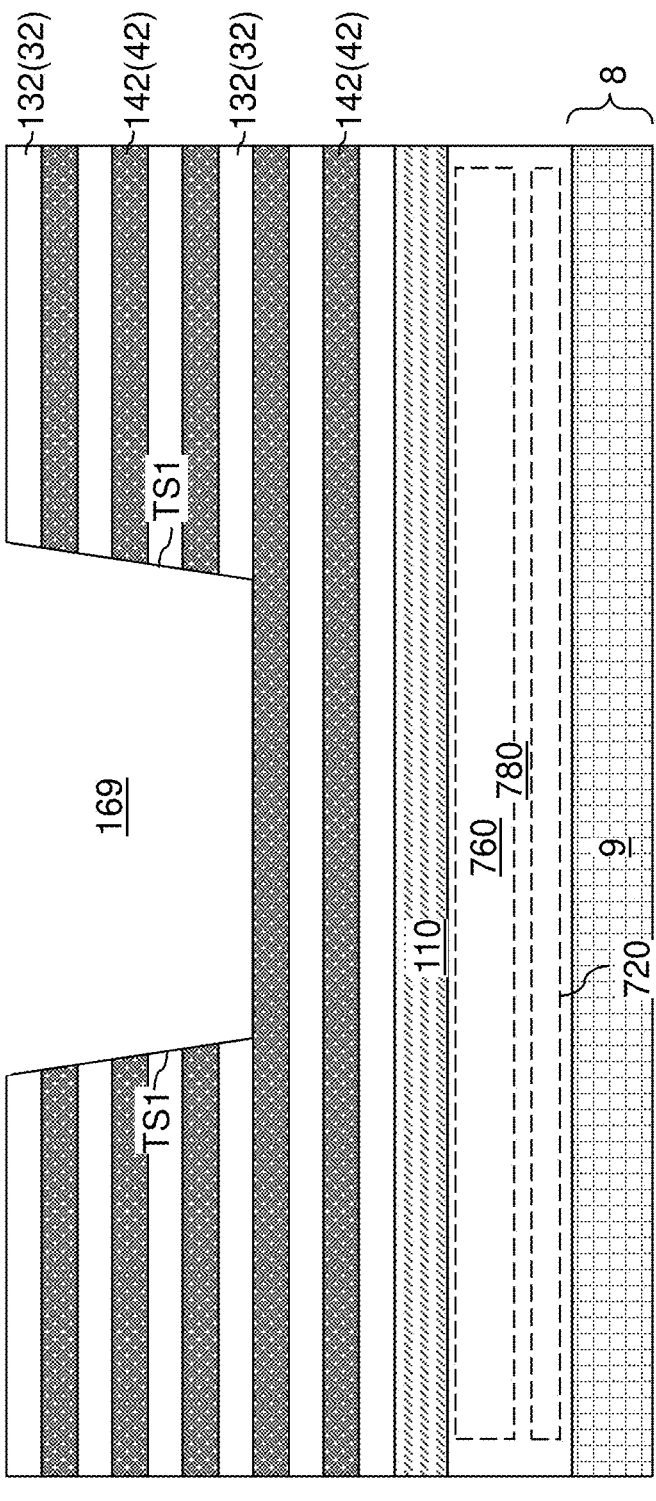
Figure 2D:
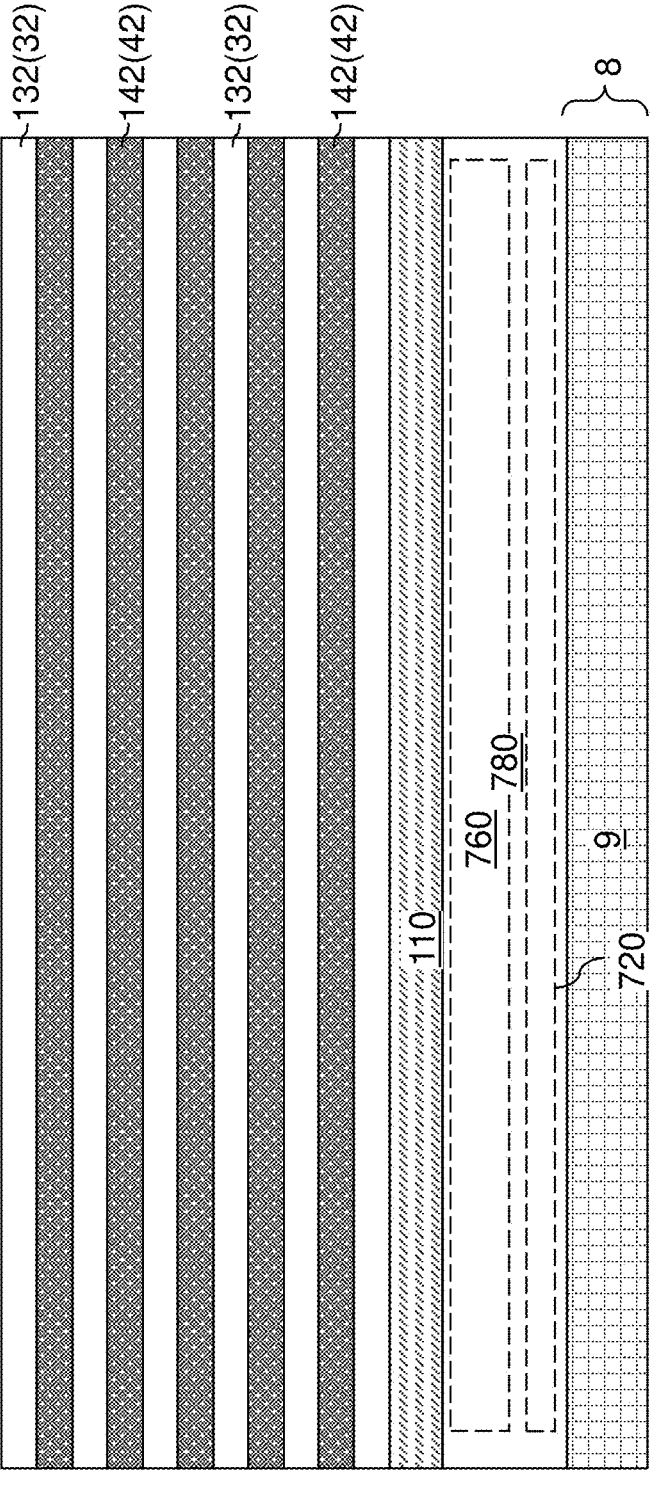
Figure 3B:
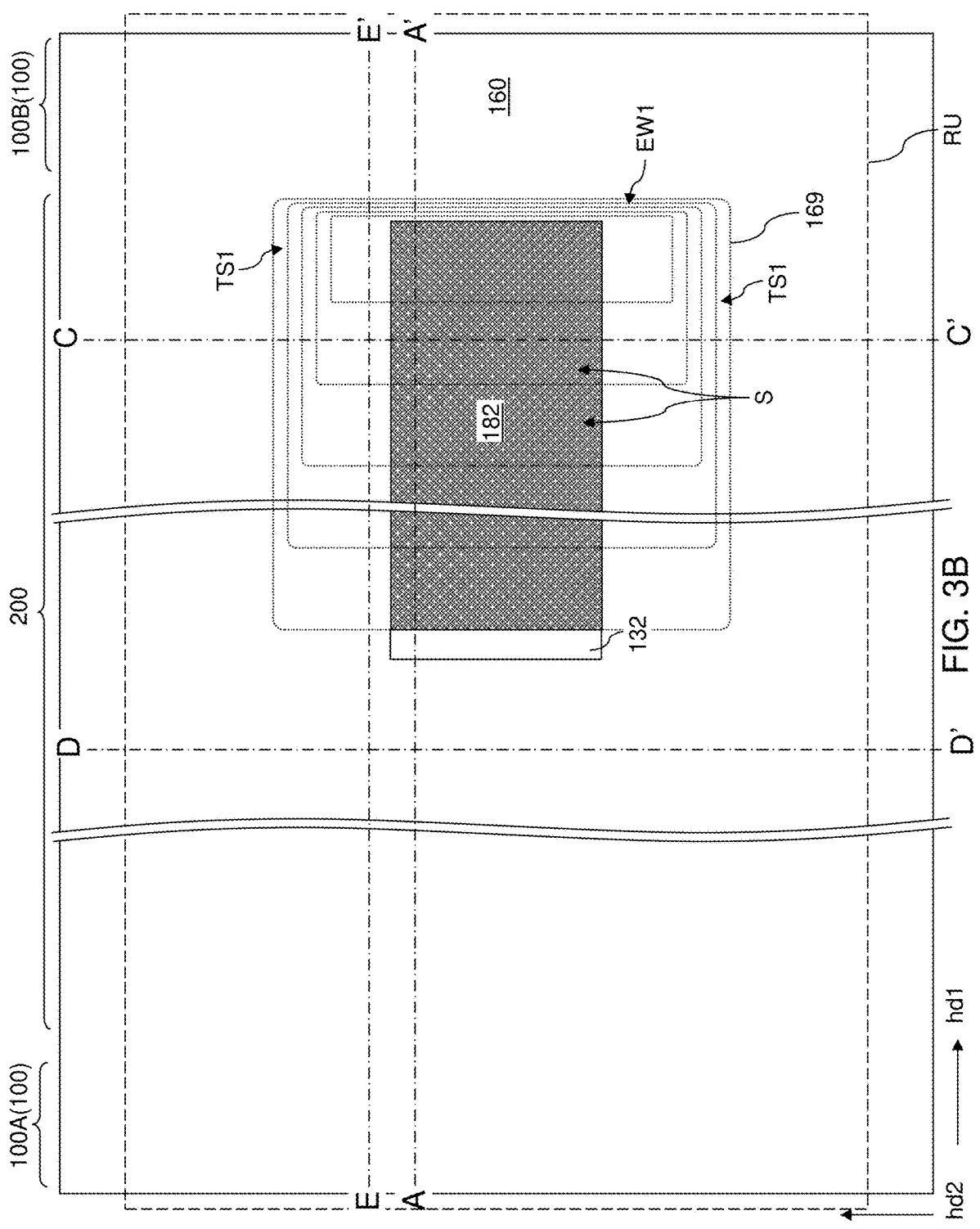
Figure 3C:
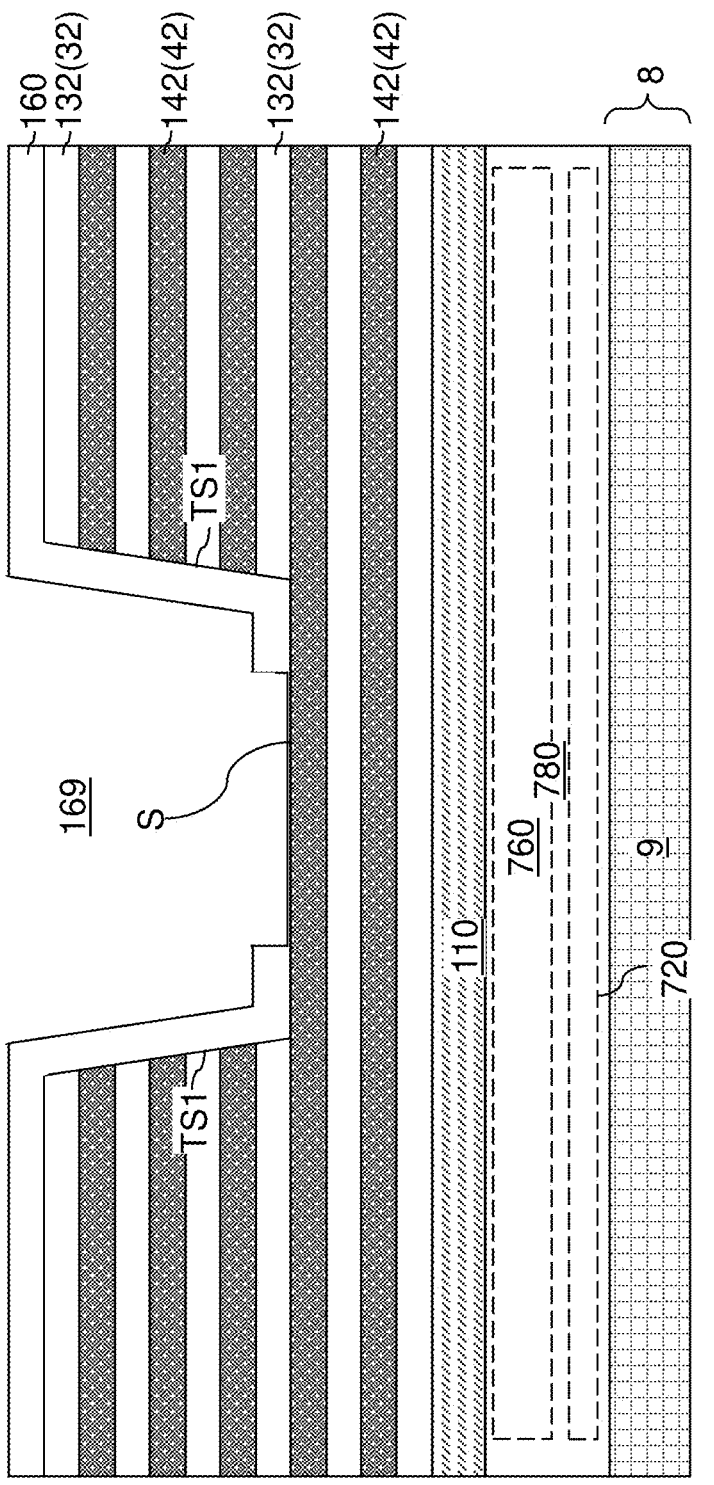
Figure 3D:
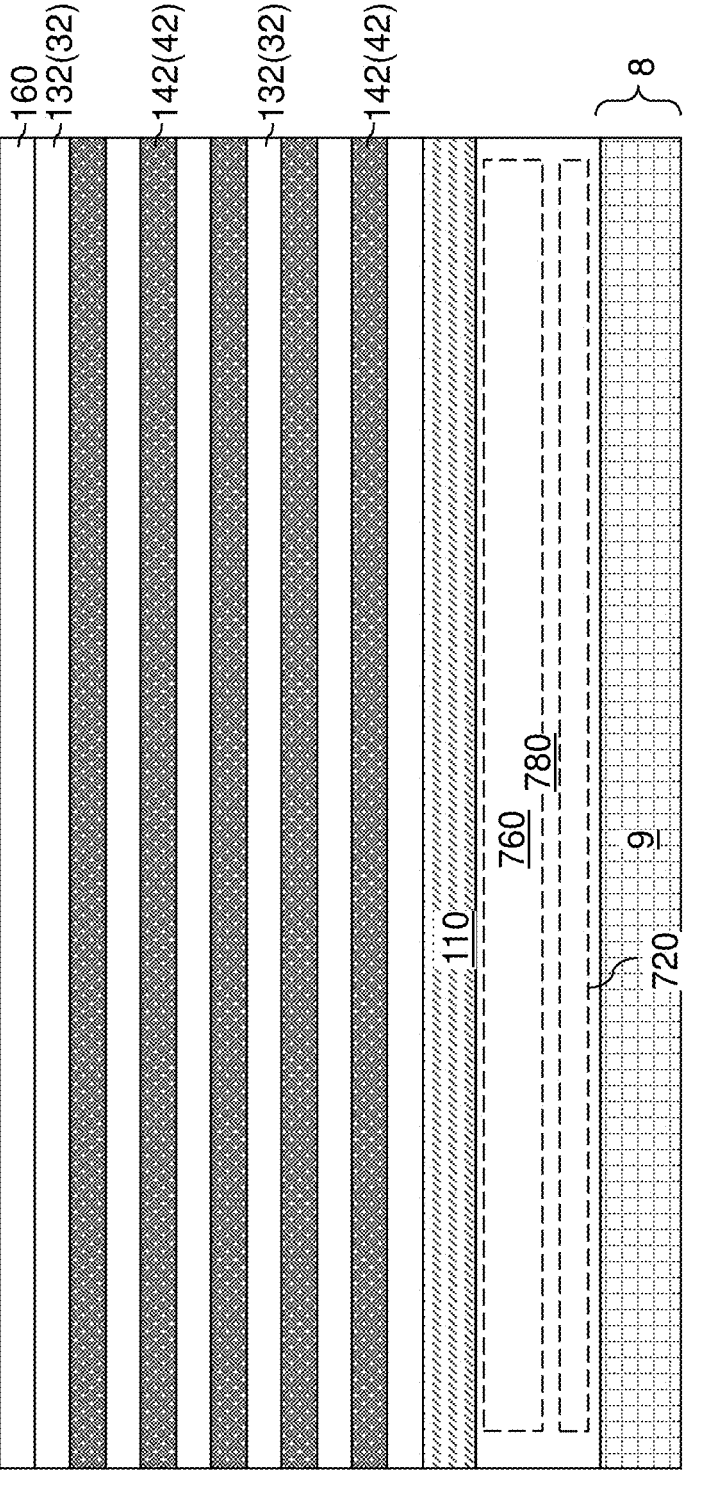

As discussed above, the embodiments of the present disclosure are directed to a three-dimensional memory device including inclined word line contact strips which overlie tapered sidewalls of wells exposing word line steps and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary semiconductor die 1000 according to an embodiment of the present disclosure is illustrated. The exemplary semiconductor die 1000 includes multiple three-dimensional memory array regions and multiple contact regions. The first exemplary semiconductor die 1000 can include multiple planes, each of which includes two memory array regions 100, such as a first memory array region 100A and a second memory array region 100B that are laterally spaced apart by a respective contact region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). For example, each pair of memory array regions 100 in a plane may include first memory array region 100A and a second memory array region 100B that are laterally spaced apart along the first horizontal direction hd1 by an contact region 200. A second horizontal direction hd2 (which may be the bit line direction) can be perpendicular to the first horizontal direction hd1. The exemplary semiconductor die 1000 of FIG. 1 can be manufactured employing various embodiments of the present disclosure to be described below.

Referring to FIGS. 2A-2D, a first exemplary structure according to an embodiment of the present disclosure is illustrated. The first exemplary structure comprises a substrate 8 including a substrate semiconductor layer 9. The substrate 8 may be a single crystalline silicon wafer, a silicon on insulator (SOI) substrate, or an insulating (e.g., glass or quartz) substrate. The substrate semiconductor layer 9 may be a single crystalline semiconductor material layer such as a single crystalline silicon layer that is epitaxially grown on a silicon wafer or SOI substrate, or a doped well in an upper portion of a silicon wafer or SOI substrate. Semiconductor devices 720 can be formed on the top surface of the substrate semiconductor layer 9. For example, the semiconductor devices 720 may include field effect transistors, resistors, capacitors, diodes, and/or various other semiconductor devices known in the art. In one embodiment, the semiconductor devices 720 may include a peripheral (i.e., driver) circuit for controlling the operation of three-dimensional memory arrays to be subsequently formed thereabove. Metal interconnect structures embedded in dielectric material layers can be formed above the semiconductor devices. The metal interconnect structures are herein referred to as lower-level metal interconnect structures 780, and the dielectric material layers are herein referred to as lower-level dielectric material layers 760. The lower-level metal interconnect structures 780 are electrically connected to various nodes of the semiconductor devices 720, and can include metal line structures and metal via structures located at various levels of the lower-level dielectric material layers 760.

A semiconductor material layer 110 can be formed on the top surface of the lower-level dielectric material layers 760. The semiconductor material layer 110 may be single crystalline or polycrystalline, and may be formed by a layer transfer from a source substrate (such as a single crystalline silicon layer including a buried hydrogen implantation layer), or may be formed by deposition of a semiconductor material (which may be a polycrystalline semiconductor material, such as polysilicon).

A first alternating stack of first insulating layers 132 and first sacrificial material layers 142 can be formed over the semiconductor material layer 110. As used herein, an alternating stack refers to a sequence of multiple instances of a first element and multiple instances of a second element that is arranged such that an instance of the second element is located between each vertically neighboring pair of instances of the first element, and an instance of the first element is located between each vertically neighboring pair of instances of the second element. As such, instances of the first material layer and the instances of the second material layer are interlaced within an alternating stack.

The first insulating layers 132 may comprise, and/or may consist essentially of, the first material. The first sacrificial material layers 142 may comprise, and/or may consist essentially of, the second material, which is different from the first material. Each of the first insulating layers 132 continuously extends over the entire area of the substrate 8, and may have a uniform thickness throughout. Each of the first sacrificial material layers 142 continuously extends over the entire area of the substrate 8, and may have a uniform thickness throughout. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a first-tier sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

Each first insulating layer 132 may have a first thickness, which may be in a range from 15 nm to 60 nm, although lesser and greater thicknesses may also be employed. Each first sacrificial material layer 142 may have a second thickness, which may be in a range from 15 nm to 60 nm, although lesser and greater thicknesses may also be employed. The total number of repetitions of a pair of a first insulating layer 132 and a first sacrificial material layer 142 in the first alternating stack (132, 142) may be in a range from 16 to 1,024, such as from 64 to 512, although lesser and greater numbers may also be employed.

In an alternative embodiment, the semiconductor devices 720, the lower-level metal interconnect structures 780, and the lower-level dielectric material layers 760 may be located next to the first alternating stack (132, 142) over the substrate 8 rather than underneath the first alternating stack (132, 142). In yet another alternative embodiment, the semiconductor devices 720, the lower-level metal interconnect structures 780, and the lower-level dielectric material layers 760 may be omitted and not formed over the substrate 8. Instead, the semiconductor devices 720 of the peripheral (i.e., driver) circuit may be formed over a separate substrate and then bonded over the three-dimensional memory device. Optionally, the semiconductor material layer 110 may also be omitted in case the substrate 8 is later removed and a top source contact layer is formed on an exposed surface of the memory device, or it may be modified to function as part of a lateral source contact (e.g., direct strap contact) which is subsequently formed under the alternating stack.

In case multiple tier structures are formed over the substrate 8, the first insulating layers 132 may be a first subset of insulating layers 32 that are formed over the substrate 8, and the first sacrificial material layers 142 may be a first subset of sacrificial material layers 42 that are formed over the substrate 8.

Multiple stepped surfaces S can be formed within the contact regions 200 simultaneously by patterning the first alternating stack (132, 142). In one embodiment, the pattern of the stepped surfaces S may be repeated along the second horizontal direction hd2 with a periodicity. In this case, a unit pattern can be formed within a unit area, and the unit pattern may be repeated along the second horizontal direction hd2 such that the lateral dimension of the unit pattern along the second horizontal direction hd2 is the same as periodicity of repetition of the unit pattern along the second horizontal direction hd2. The area of each unit pattern is herein referred to as a repetition unit RU.

In one embodiment, a hard mask layer (not shown) such as a metallic or dielectric mask material layer can be formed over the first alternating stack (132, 142), and can be patterned to form multiple rectangular openings. The areas of openings within the hard mask layer correspond to areas in which cavities 169 including stepped bottom surfaces are to be subsequently formed. Each opening through the hard mask layer may be rectangular, and may have a pair of sides that are parallel to the first horizontal direction (e.g., word line direction) hd1 and a pair of sides that are parallel to the second horizontal direction (e.g., bit line direction) hd2. The rectangular openings through the hard mask layer may be arranged along the second horizontal direction hd2, and may, or may not, be alternately staggered along the first horizontal direction hd1.

A trimmable mask layer (not shown) can be applied over the alternating stack. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step of respective stepped surfaces S that is most proximal to one of the memory array regions 100.

The stepped surfaces S can be formed within the areas of the rectangular openings in the hard mask layer by iteratively performing a set of layer patterning processing steps. The set of layer patterning processing steps comprises an anisotropic etch process that etches unmasked portions of a pair of a first insulating layer 132 and a first sacrificial material layer 142, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the first alternating stack (132, 142), for example, by an isotropic etch process (such as a wet etch process). Alternatively, any other suitable process may be used to form the stepped surfaces.

A first cavity 169 having a respective stepped bottom surface can be formed within each area of the rectangular opening in the hard mask layer. Each first cavity 169 can include a cliff region in which a first end wall EW1 of the first alternating stack (32, 42) extends from the bottommost first sacrificial material layer 142 of the first alternating stack (132, 142) to the topmost layer of the first alternating stack (132, 142). The first end wall EW1 may be tapered (i.e., inclined) at an angle of 1 to 30 degrees along the first horizontal direction hd1 with respect to a vertical direction which is normal to the top surface of the substrate. Each first cavity 169 has stepped bottom surfaces. The stepped bottom surface of each cavity 169 laterally extend along the first horizontal direction hd1, and underlies the volume of the void of the first cavity 169. Generally, the stepped surfaces S can be formed by patterning the first alternating stack (132, 142) in each contact region 200, which is located between a respective first memory array region 100A and a second memory array region 100B.

Generally, each first cavity 169 may have stepped surfaces S including vertically-extending surface segments that are interlaced with horizontally-extending surface segments which form the bottom surface of the first cavity 169. Further, each first cavity 169 may comprise a pair of first tapered (e.g., inclined) sidewalls TS1 that are parallel to the first horizontal direction hd1, laterally spaced from each other along the second horizontal direction hd2, and having a respected stepped bottom end adjoined to a respective stepped periphery of the stepped bottom surface. The first tapered sidewalls TS1 may be tapered (i.e., inclined) at an angle of 5 to 45 degrees with respect to the vertical direction. The lateral distance between the pair of first tapered sidewalls TS1 along the second horizontal direction hd2 is the width of a respective first cavity 169, which increases with a vertical distance from the substrate 8.

Referring to FIGS. 3A-3E, a first insulating liner 160 can be conformally deposited over the underlying structure. The first insulating liner 160 comprises an insulating material, such as silicon oxide. The material of the first insulating liner 160 is different from the material of the first sacrificial material layers 142. The first insulating liner 160 is deposited over the stepped surfaces S of the first alternating stack (132, 142), over each first tapered sidewall TS1 of the first alternating stack (132, 142), and over the topmost layer of the first alternating stack (132, 142). The thickness of the first insulating liner 160 may be in a range from 50 nm to 200 nm, such as from 100 nm to 150 nm, although lesser and greater thicknesses may also be employed.

A photoresist layer (not illustrated) can be formed over the first insulating liner 160, and can be lithographically patterned to form an elongated opening, such as a rectangular opening, the straddles a middle portion of a stepped bottom surface of a respective first cavity 169. In one embodiment, the width of rectangular opening along the second horizontal direction hd2 is less than the width of the bottommost horizontal surface of the stepped bottom surface. In one embodiment, each horizontal surface segment of the stepped bottom surface may have two horizontal surface segments that are not covered by the patterned photoresist layer and are laterally spaced apart along the second horizontal direction hd2. An etch process can be performed to etch unmasked portions of the first insulating liner 160. The etch process may process may comprise an isotropic etch process or an anisotropic etch process. An elongated opening is formed through the first insulating liner 160 within the area of each first cavity 169. A strip segment of the stepped surfaces S is exposed through the elongated opening through the first insulating liner 160 underneath a first cavity 169 that is present within the volume of a respective first cavity 169.

In one embodiment, the elongated opening through the first insulating liner 160 laterally extends along a first horizontal direction hd1, and may have a uniform width along the second horizontal direction hd2. In one embodiment, each first insulating liner 160 includes a first horizontally-extending portion overlying the first alternating stack (132, 142), and a plurality of tapered vertically-extending portions that overlie a respective first tapered sidewall TS1. In one embodiment, each first insulating liner 160 includes a plurality of second horizontally-extending portions overlying a bottom surface of a respective first cavity 169 within an array of first cavities 169. A pair of second horizontally-extending portions of a first insulating liner 160 may contact segments of a respective top surface of a first sacrificial material layer 142, and may be laterally spaced apart from each other by a rectangular region of an opening through the first insulating liner 160.

Referring to FIGS. 4A-4E, a first sacrificial liner material can be conformally deposited over the first insulating liner 160, and can be subsequently patterned to form a first sacrificial liner 182. The first sacrificial liner material comprises a material that can be subsequently removed selective to materials of the first insulating layers 132 and the first insulating liner 160. In one embodiment, the first sacrificial liner material may be the same as the first-tier sacrificial material of the first sacrificial material layers 142. In one embodiment, the first sacrificial liner 182 may comprise or may consist essentially of silicon nitride. The thickness of each first sacrificial liner 182 may be in a range from 10 nm to 50 nm, such as from 15 nm to 30 nm, although lesser and greater thicknesses may also be employed.

Figure 4A:
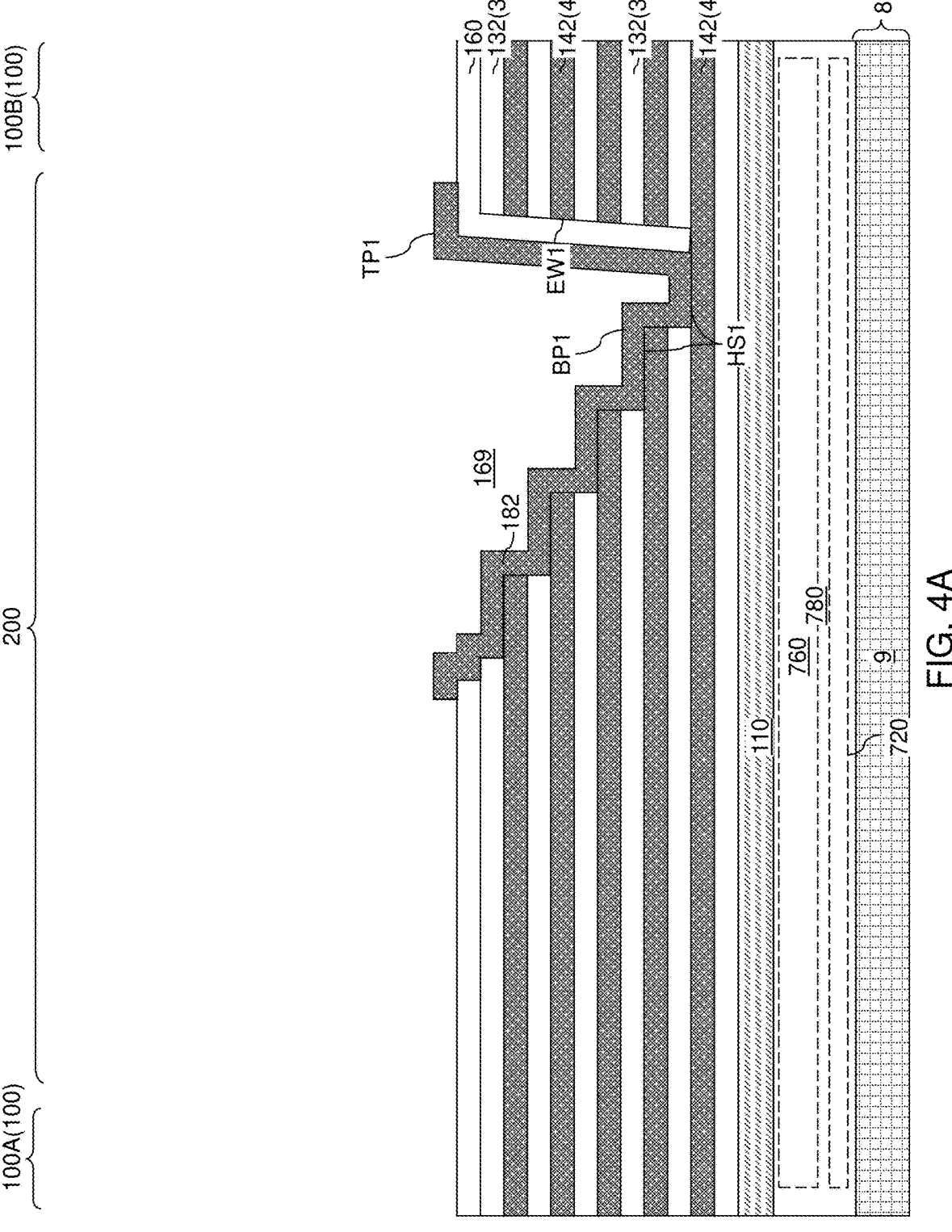
Figure 4B:
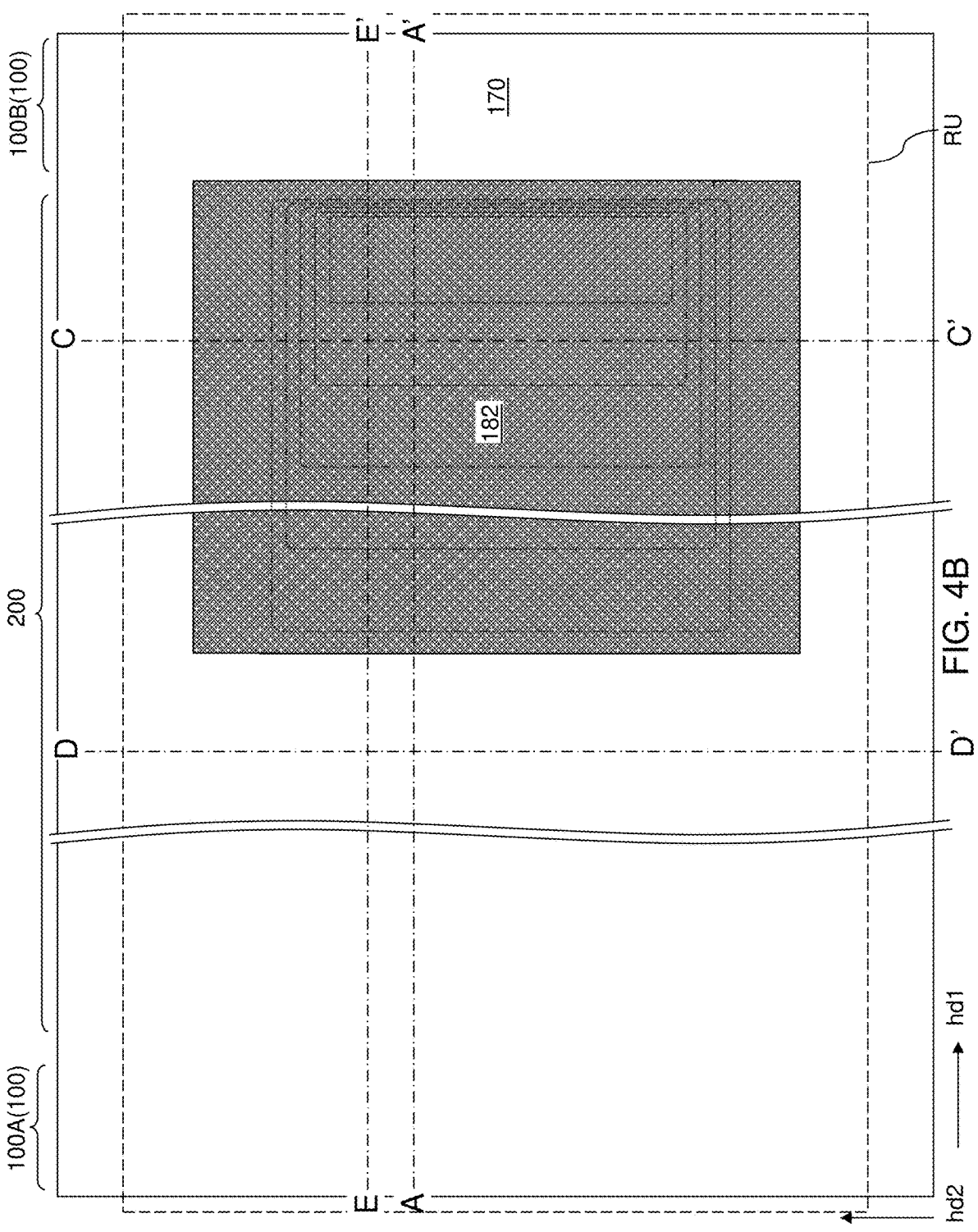
Figure 4C:
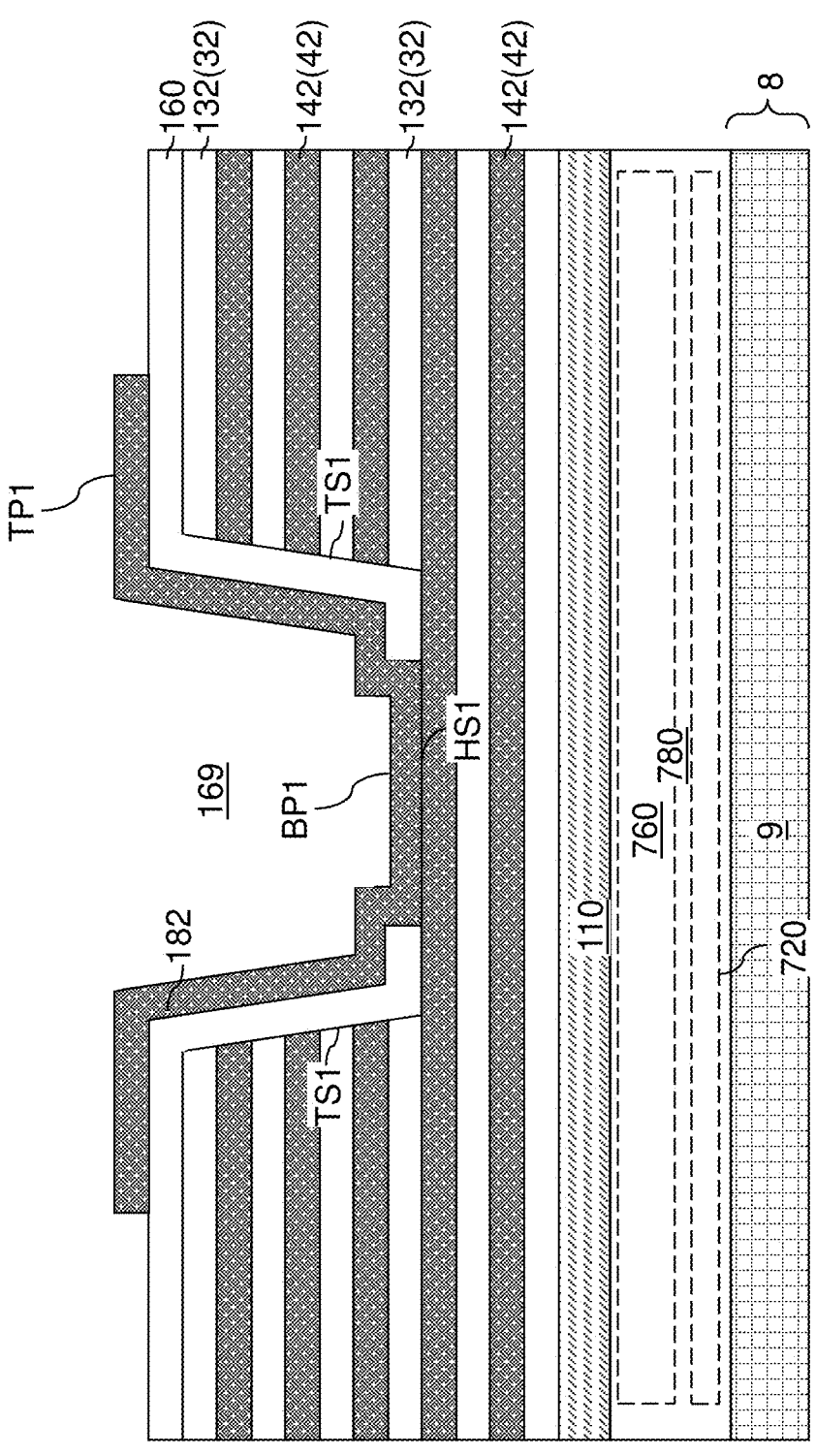
Figure 4D:
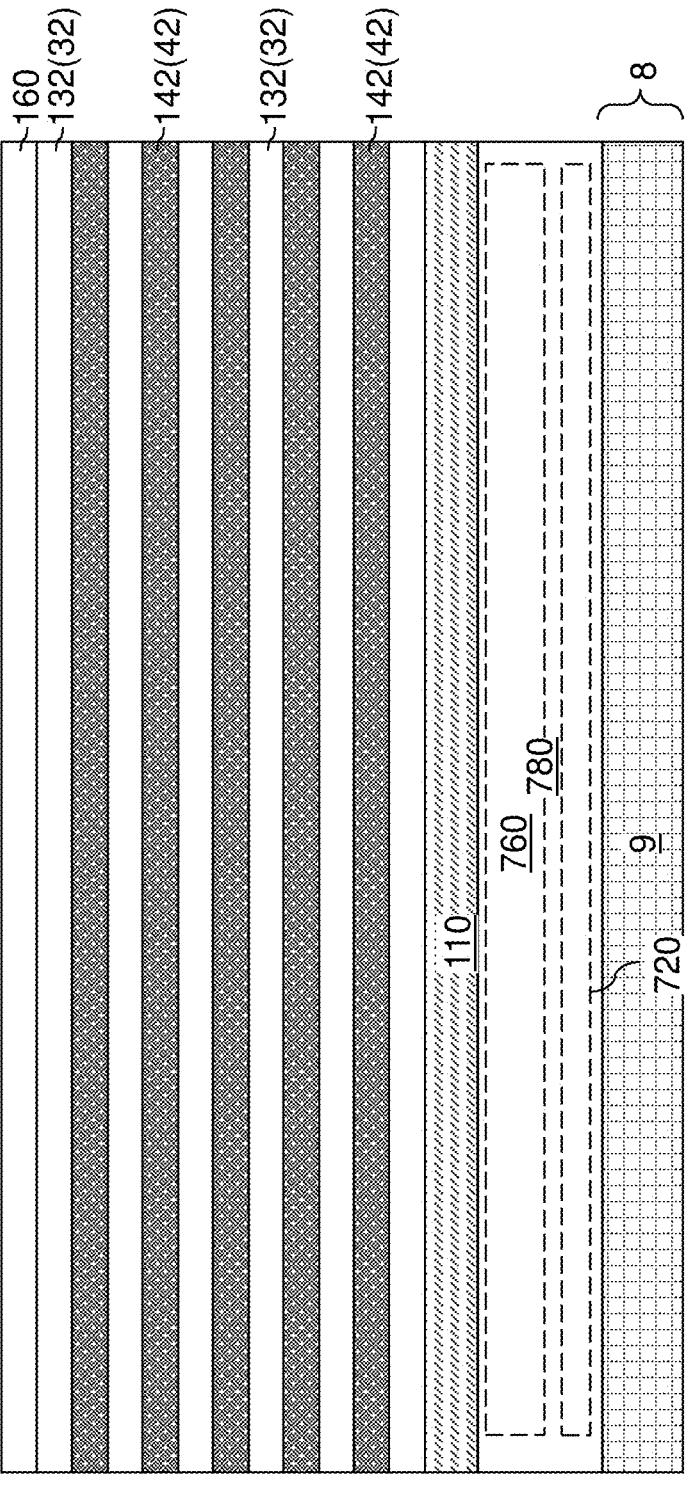
Figure 5B:
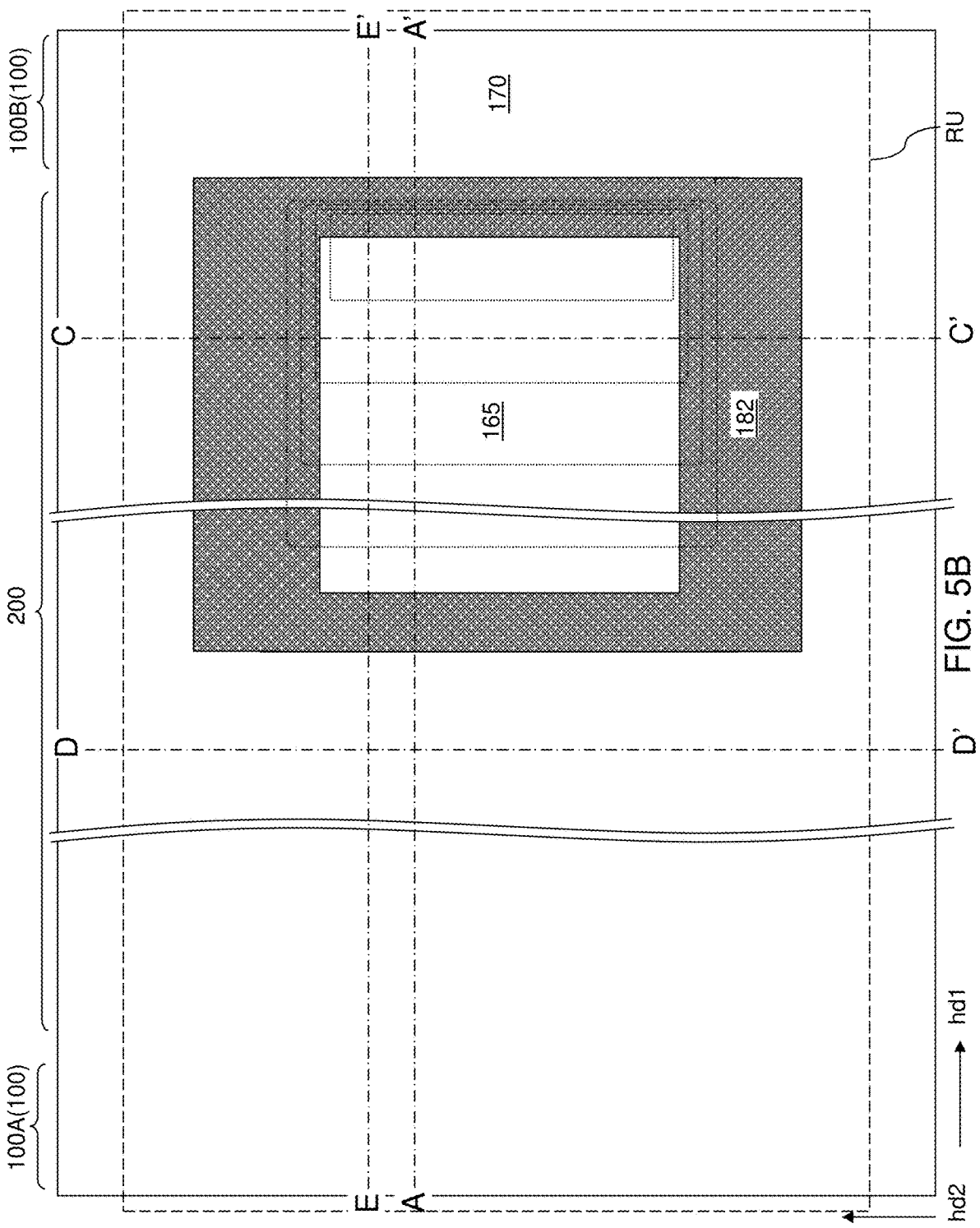
Figure 5C:
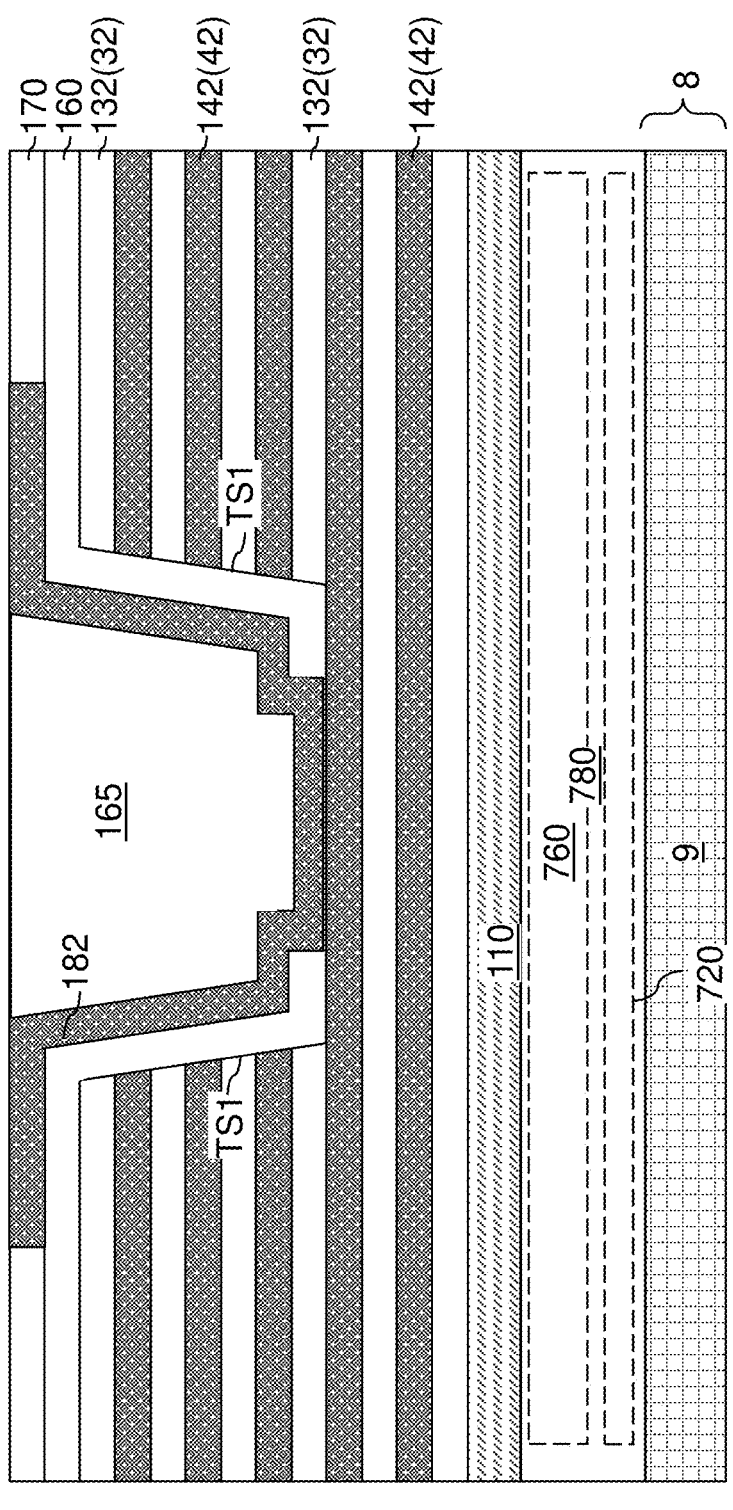
Figure 5D:
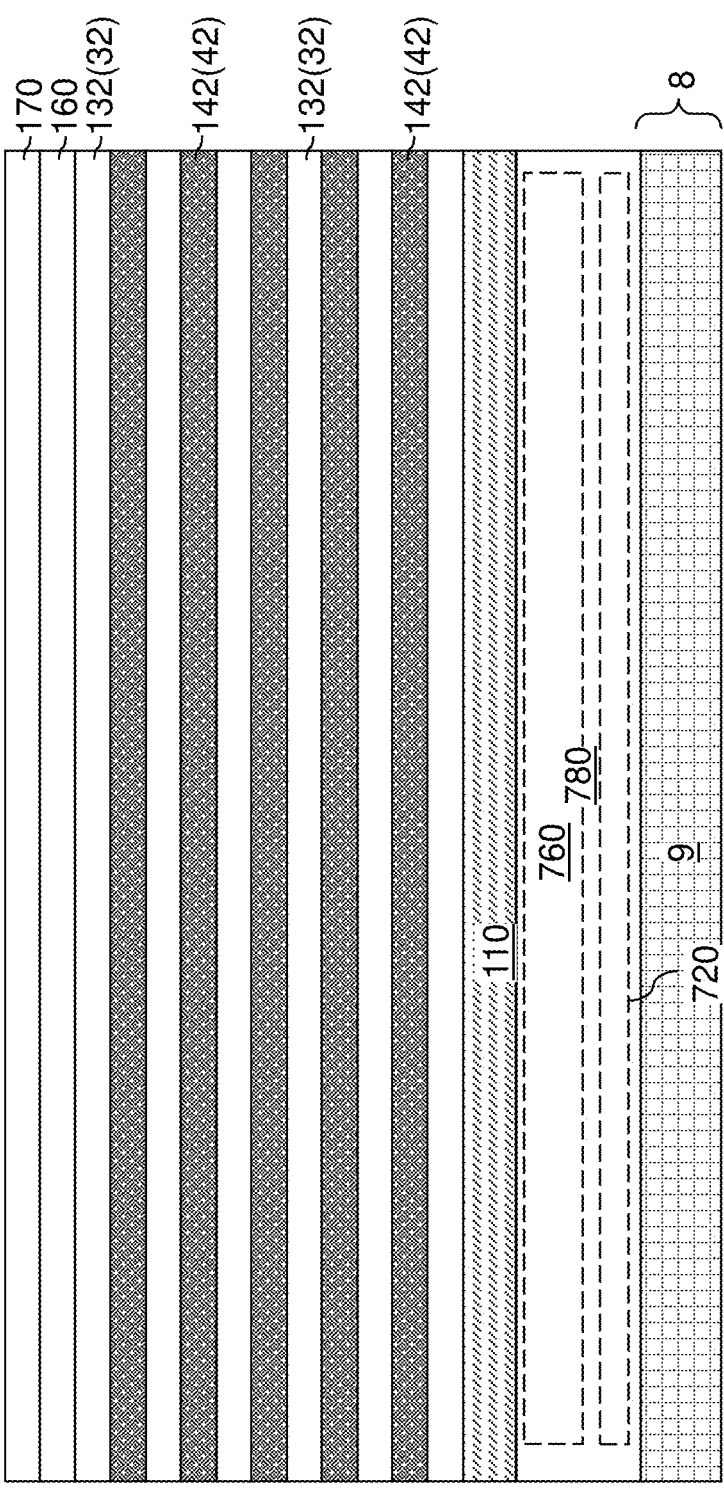
Figure 6B:
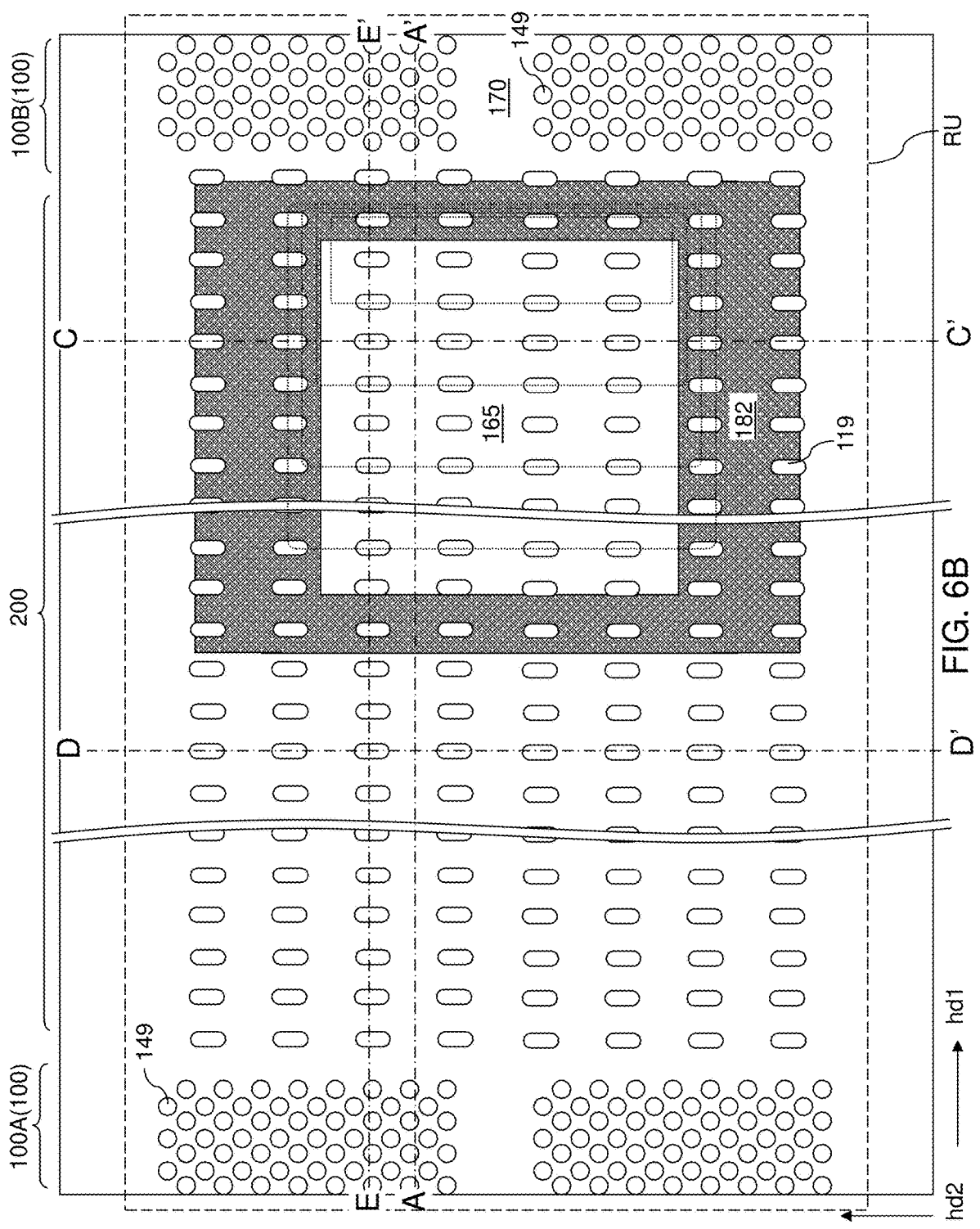
Figure 6C:
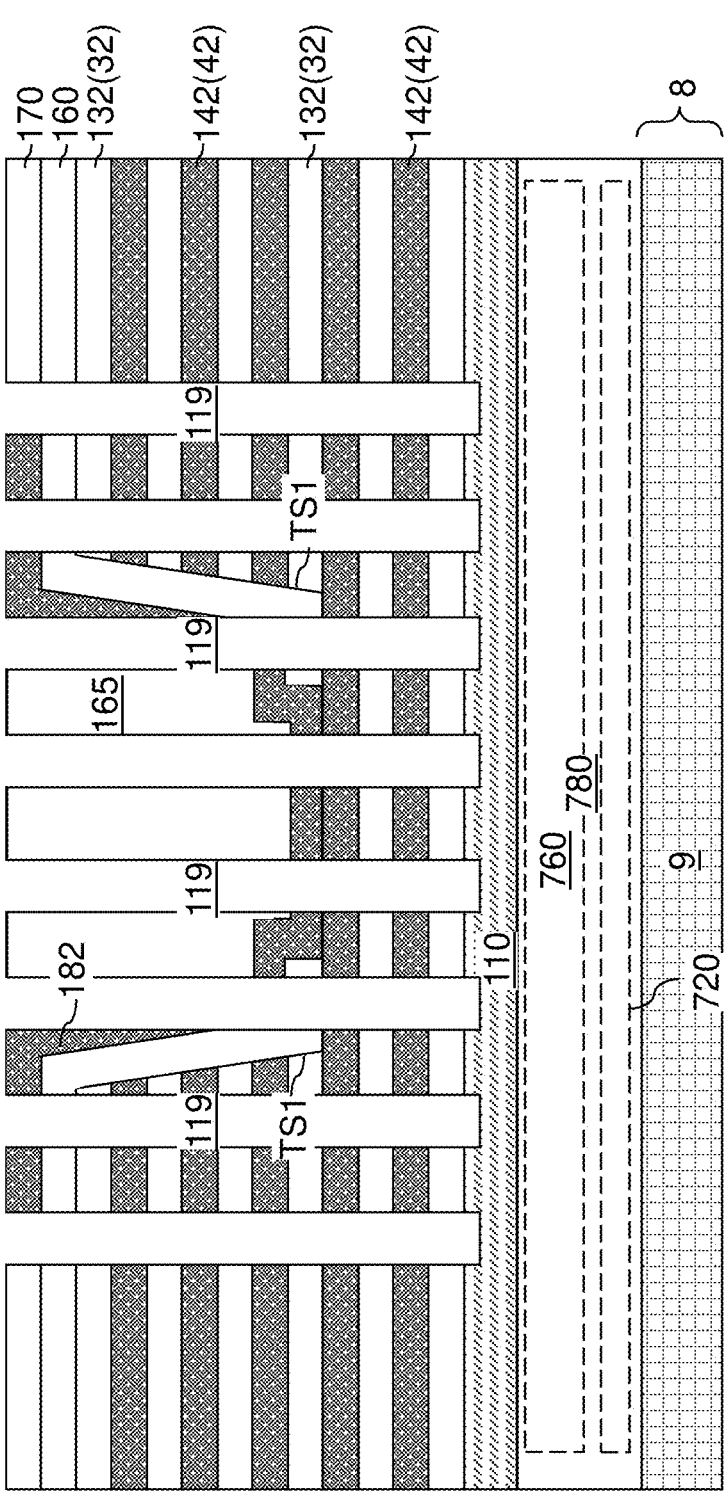
Figure 6D:
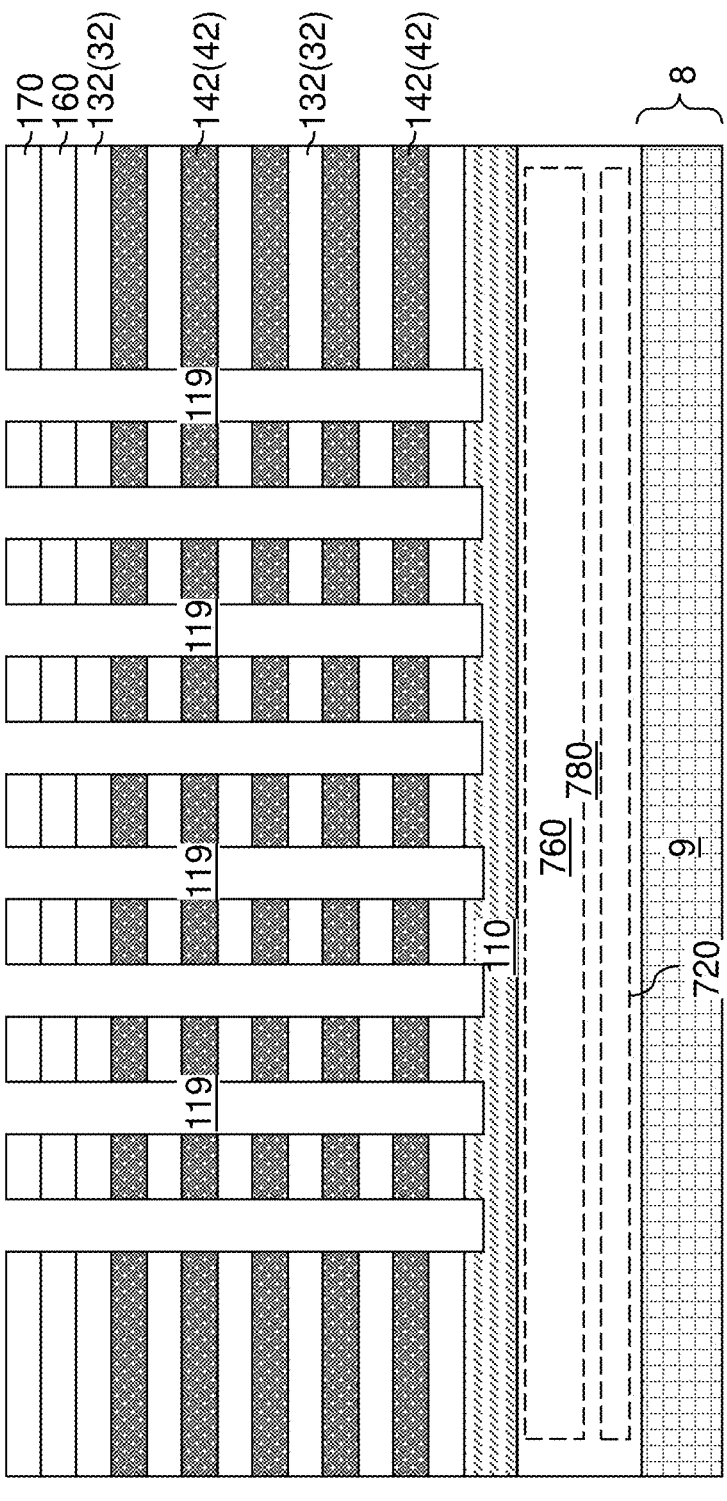
Figure 7B:
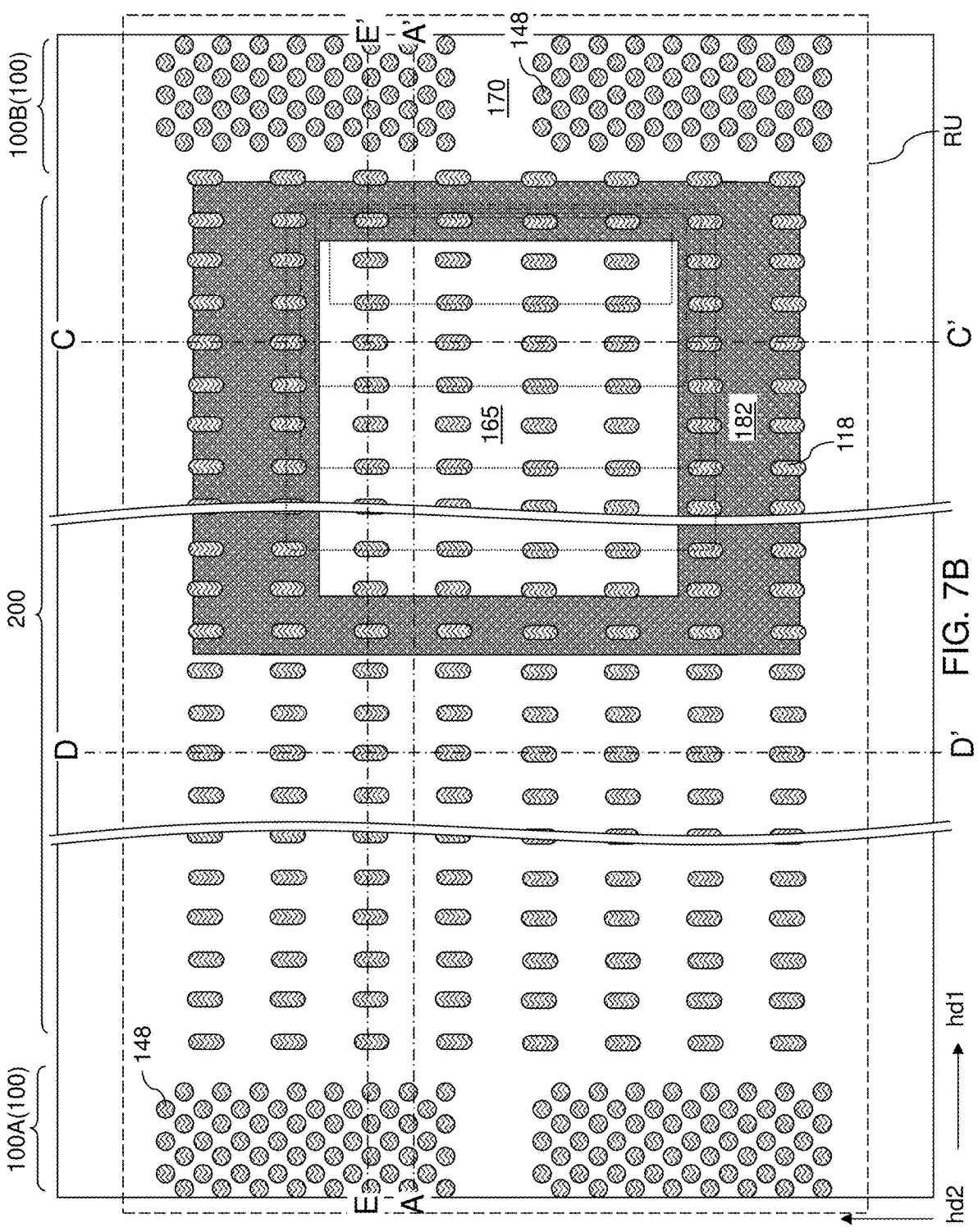
Figure 7C:
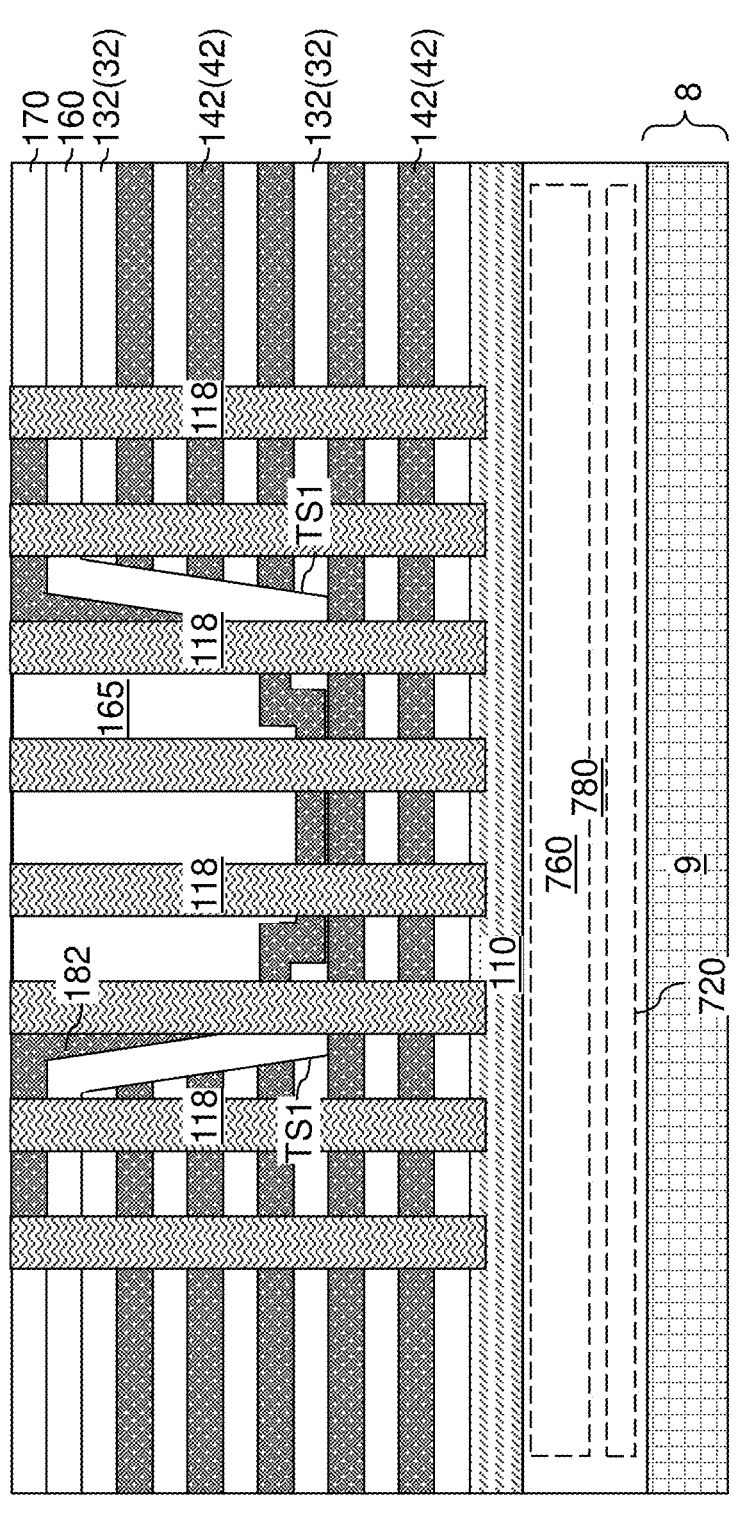
Figure 7D:
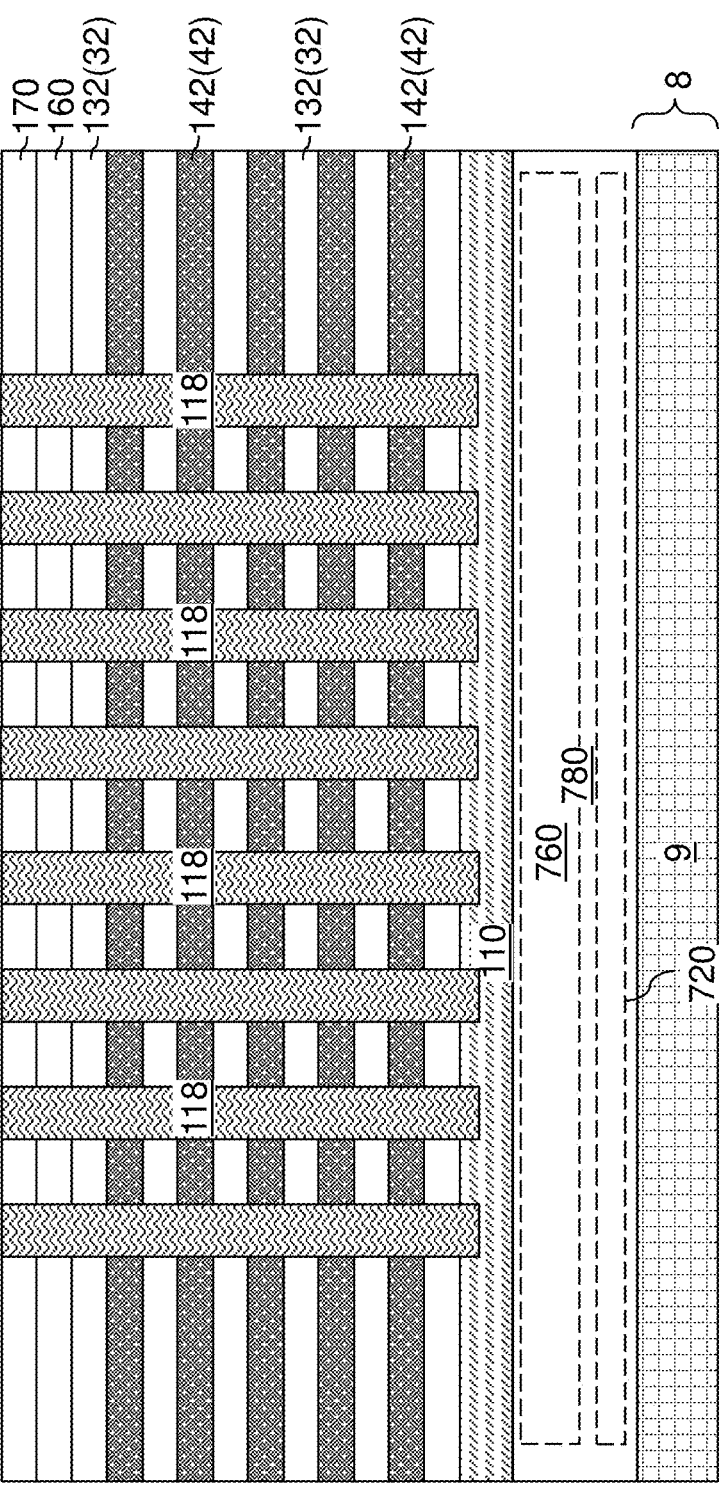
Figure 8A:
FIGS. 8A-8E are various views of the first exemplary structure after formation of a second alternating layer stack of second insulating layers and second sacrificial material layers, and a second cavity according to an embodiment of the present disclosure.
Figure 8B:
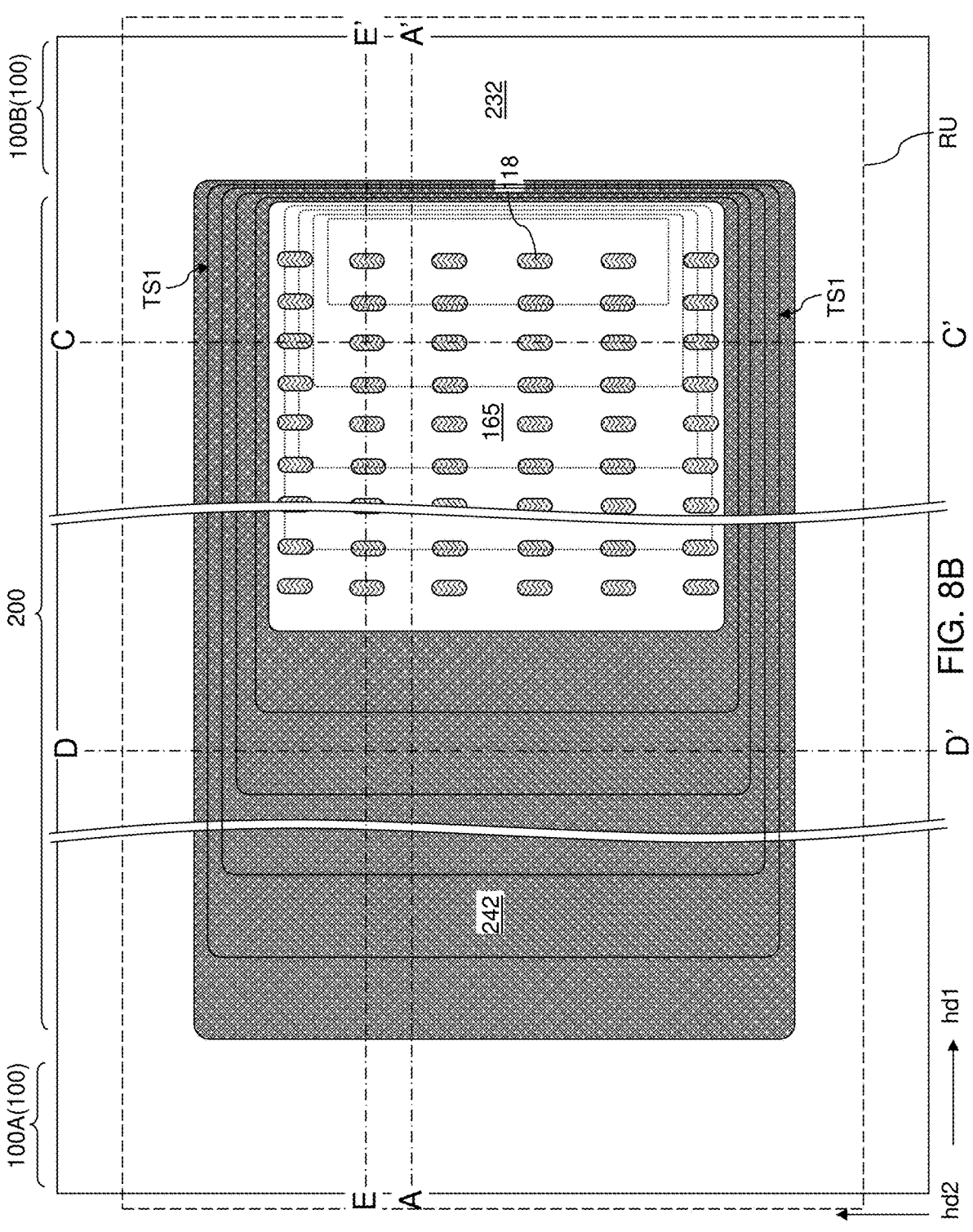
Figure 8C:
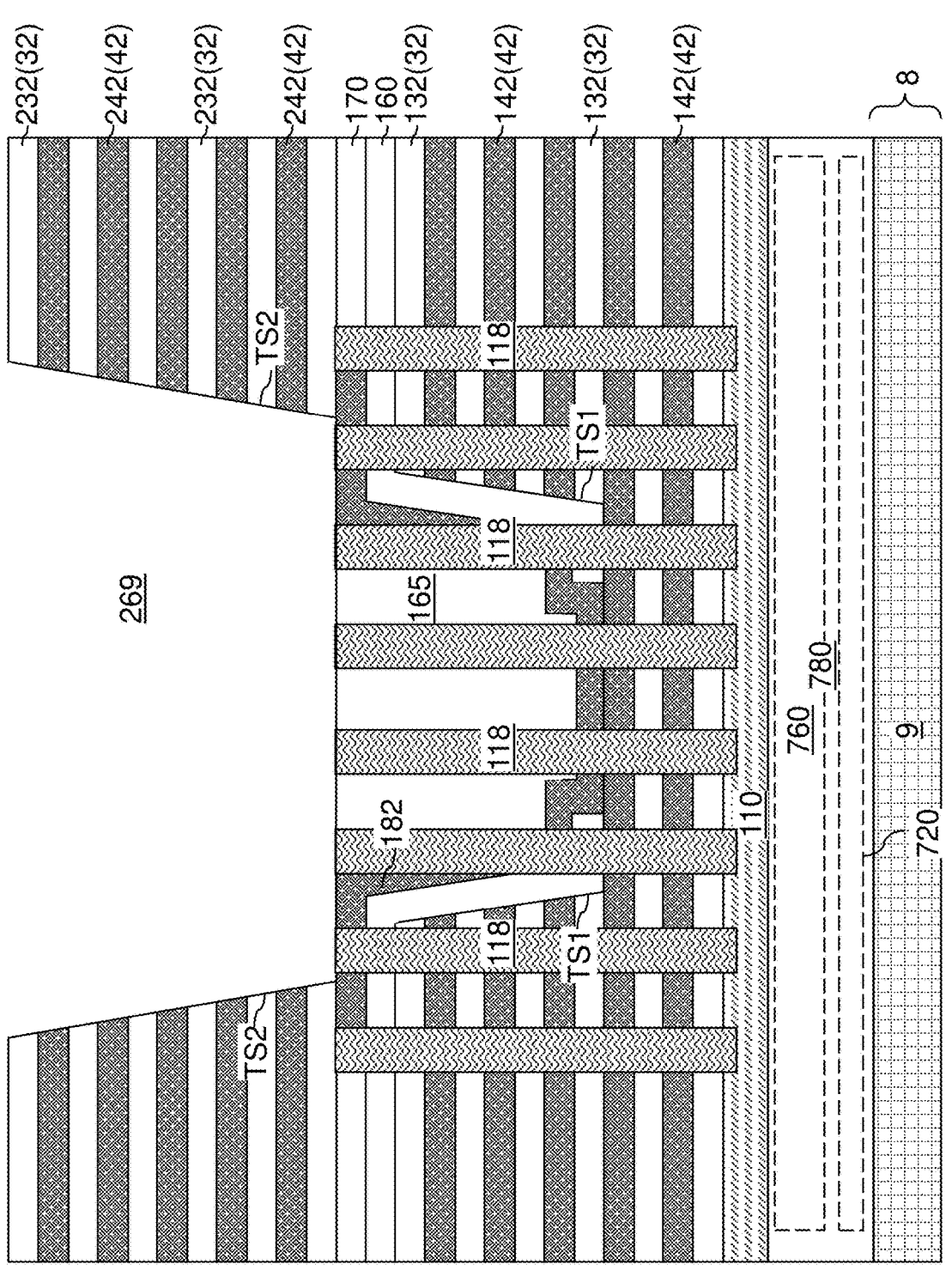
Figure 8D:
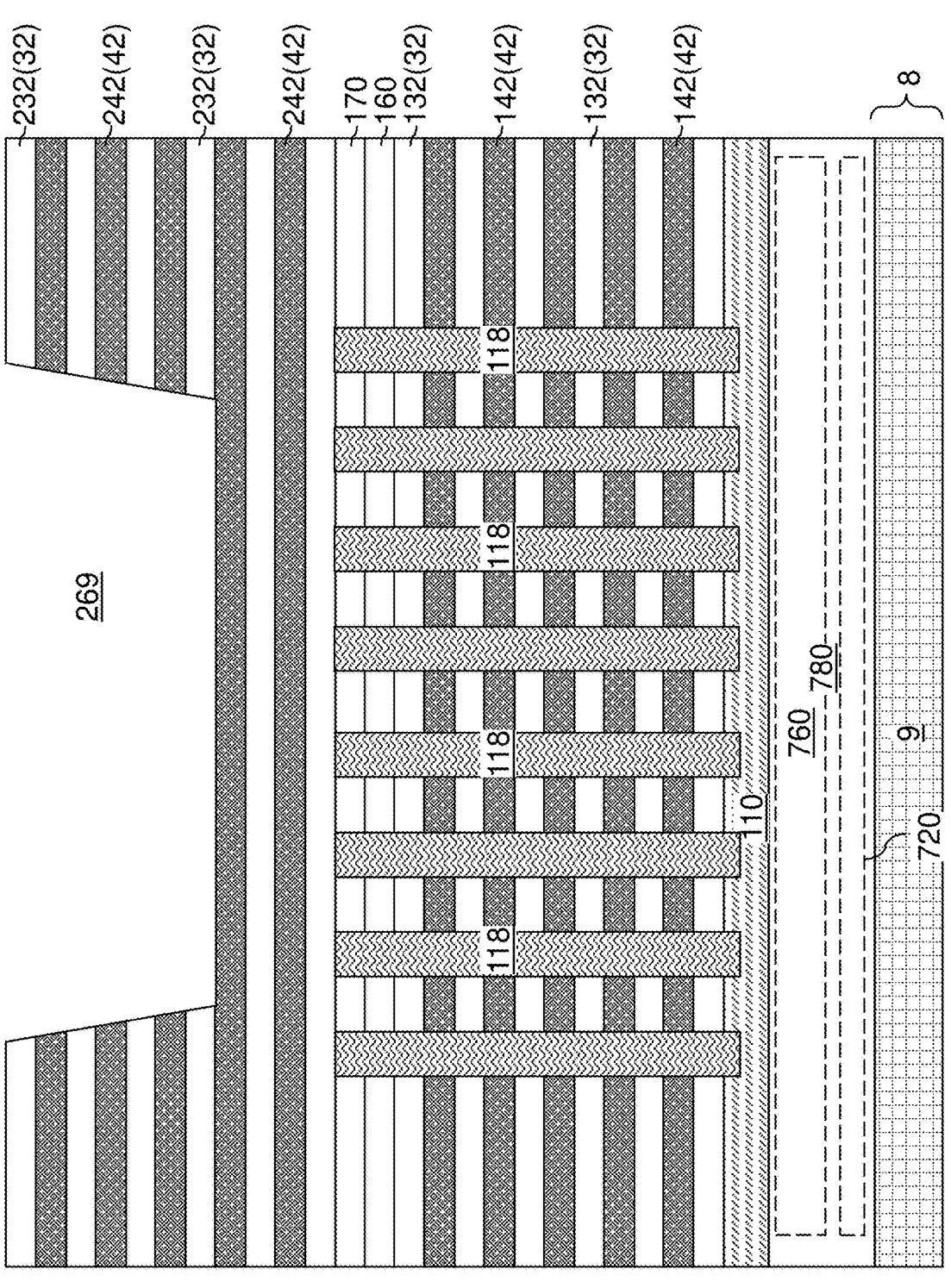
Figure 8E:
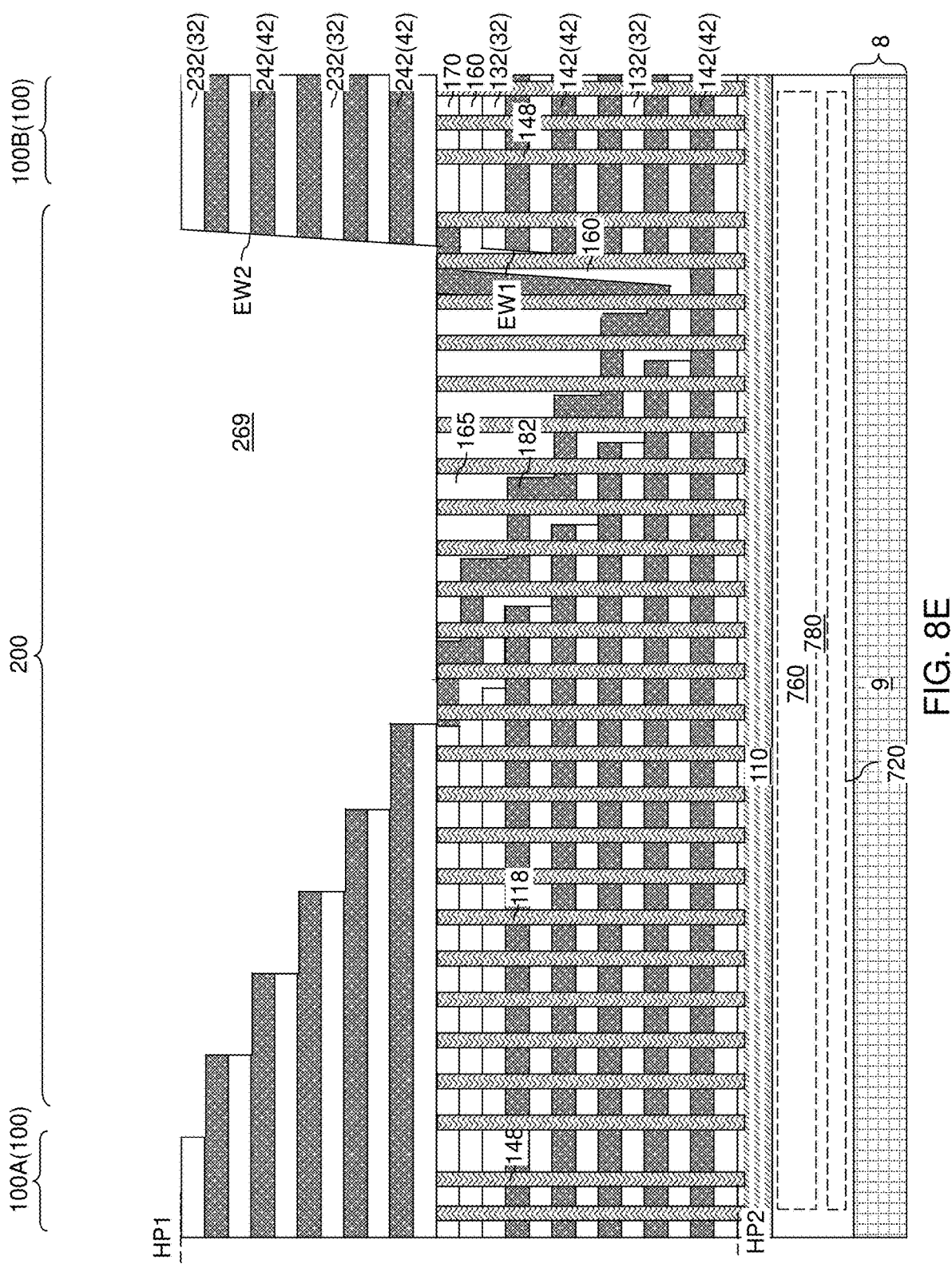
Figure 9A:
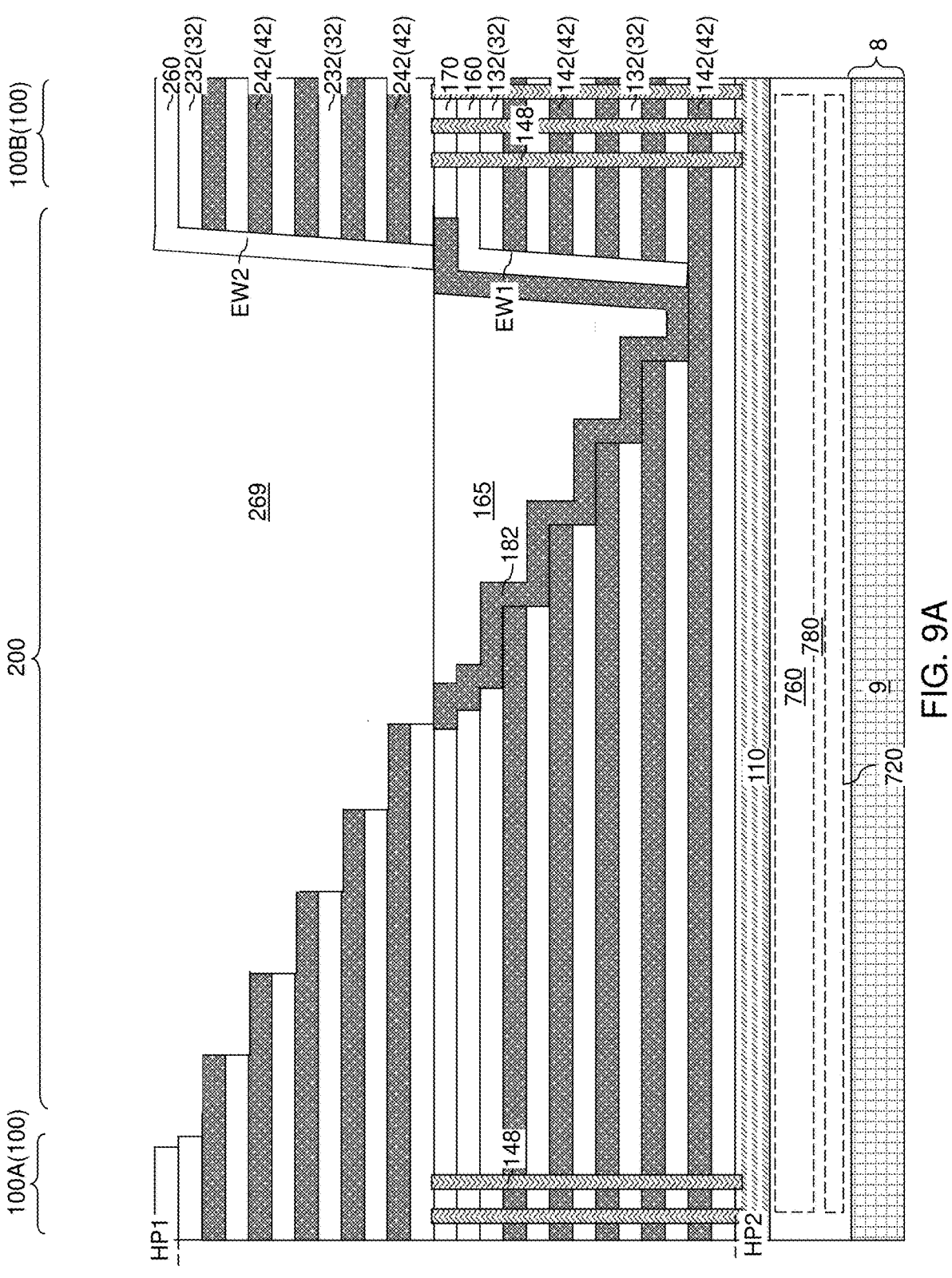
FIGS. 9A-9E are various views of the first exemplary structure after deposition and patterning of a second insulating liner according to an embodiment of the present disclosure.
Figure 9B:
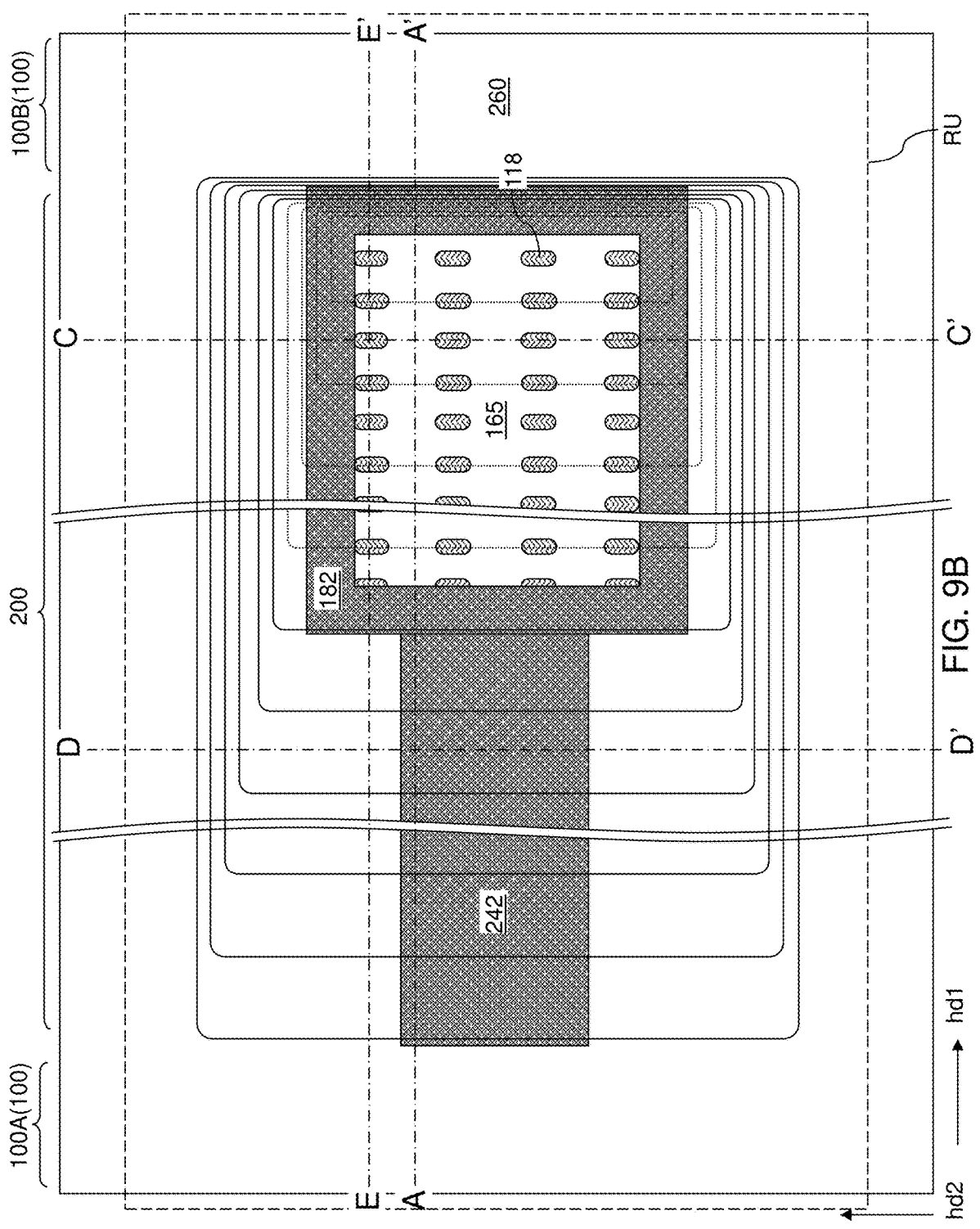
Figure 9C:
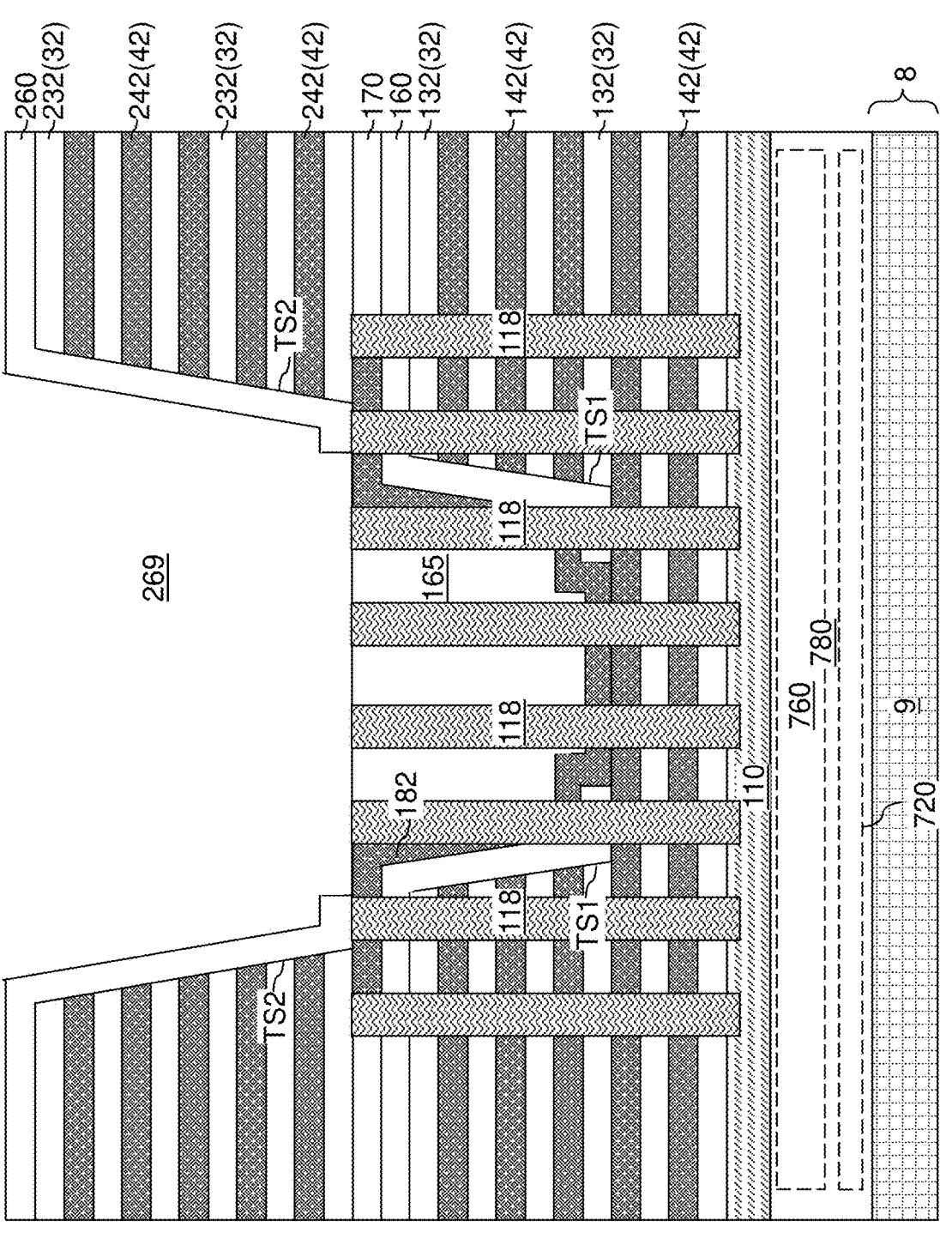
Figure 9D:
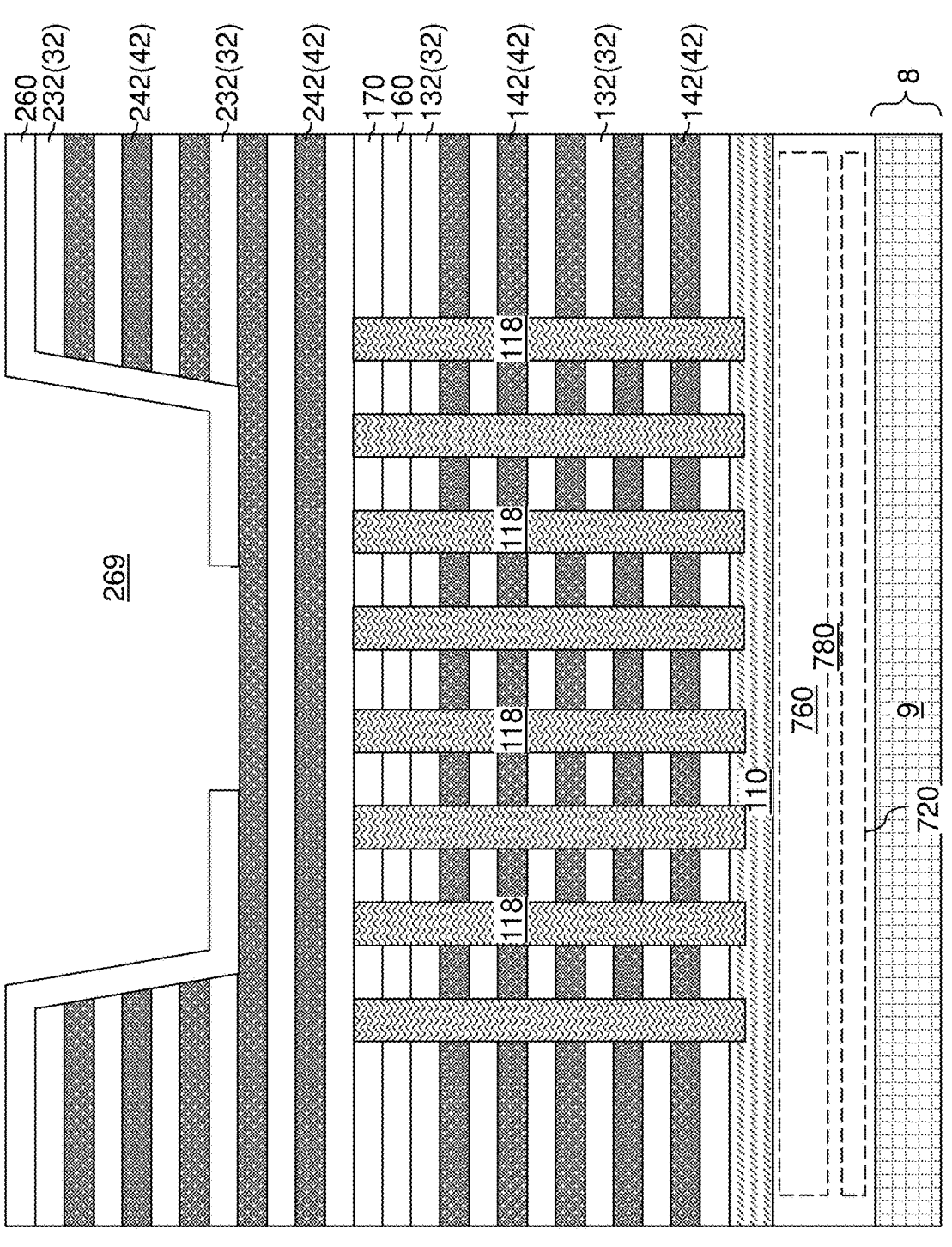
Figure 9E:
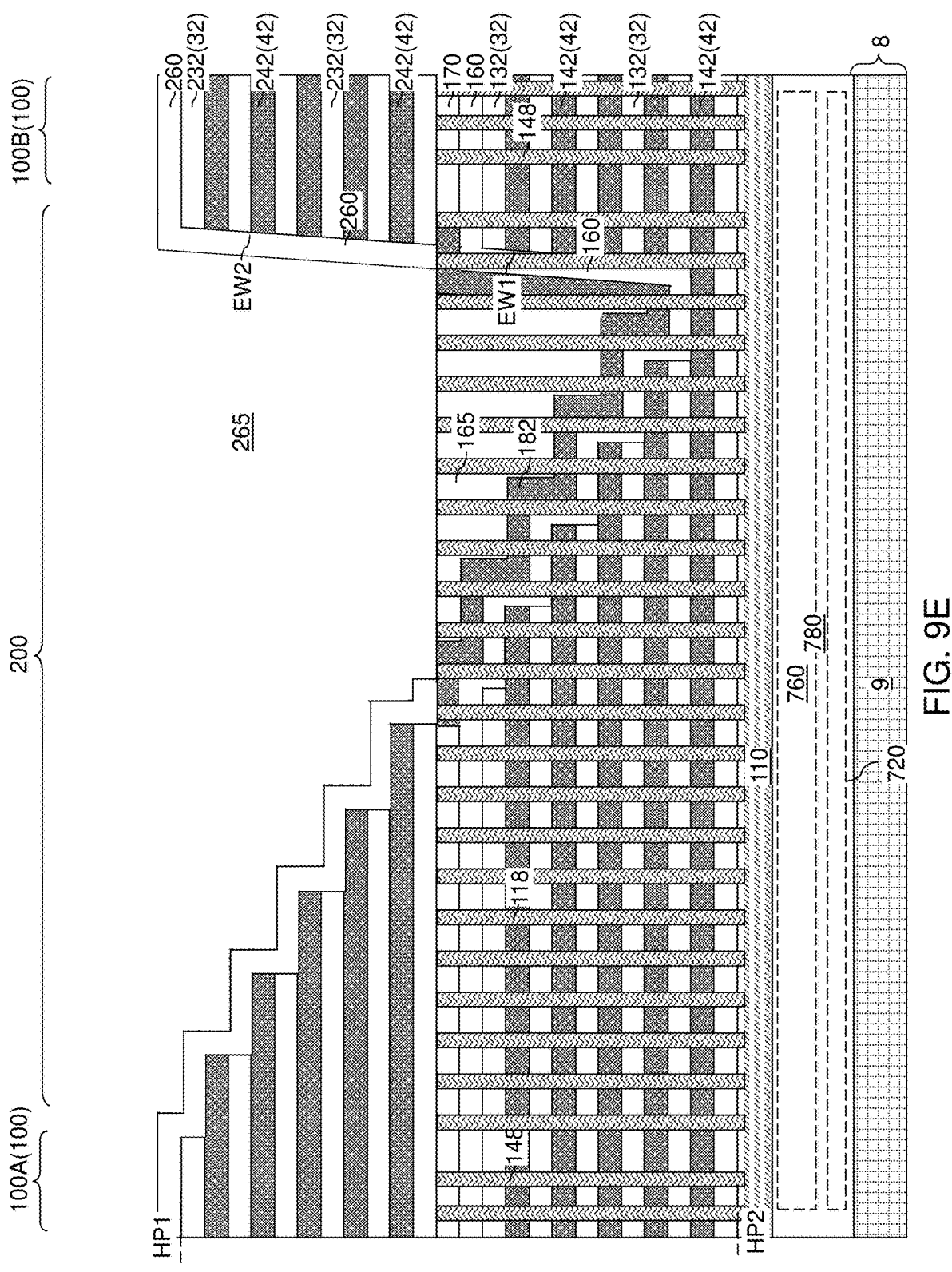

Within an area of each repetition unit RU, a first sacrificial liner 182 may be formed such that the entirety of the physically exposed sidewalls of the first sacrificial liner 182 is formed above the horizontal plane including the topmost surface of the first alternating stack (132, 142). In other words, the end portions of the first sacrificial liner 182 extend over the tapered sidewalls TS1 and over the top of the first alternating stack (132, 142) along the second horizontal direction hd2. Thus, the first sacrificial liner 182 may have a longer length along the second horizontal direction hd2 than the length of the underlying first cavity 169 along the second horizontal direction hd2. The first sacrificial liner 182 may have the same, shorter or longer length along the first horizontal direction hd1 compared to the length of the underlying first cavity 169 along the first horizontal direction hd1. The first cavity 169 is present within the volume that is laterally enclosed by the first sacrificial liner 182. The first sacrificial liner 182 can be formed directly on the physically exposed portion of the stepped surfaces S of the first alternating stack (132, 142) such that each first sacrificial layer 142 comprises a respective horizontal top surface segment HS1 that contacts a respective bottom surface segment BP1 of the first sacrificial liner 182. As shown in FIG. 4C, the first sacrificial liner 182 comprises a horizontally-extending top portion TP1 that overlies the first alternating stack (132, 142) and overlies a horizontally-extending top portion of the first insulating liner 160. In one embodiment, the first insulating liner 160 contacts the entirety of a pair of first tapered sidewalls TS1 and a first end wall EW1, and the first sacrificial liner 182 is spaced from the pair of first tapered sidewalls TS1 and the first end wall EW1 by the first insulating liner 160.

Referring to FIGS. 5A-5E, a first dielectric fill material, such as undoped silicate glass (i.e., silicon oxide) or a doped silicate glass, can be deposited over the first sacrificial liner 182 and the first alternating stack (132, 142) to fill the first cavity 169. A planarization process, such as a chemical mechanical polishing process, can be performed to remove portions of the first dielectric fill material from above the horizontal plane including the topmost surface of the first sacrificial liner 182. The first sacrificial liner 182 may be employed as an endpoint detection structure and/or as a planarization stopping structure. Each remaining portion of the first dielectric fill material that fills a respective first cavity 169 constitutes a first dielectric fill structure 165. A continuous remaining portion the first dielectric fill material that overlies the top surface of the horizontally-extending portion of the first insulating liner 160 above the first alternating stack (132, 142) constitutes a first insulating cap layer 170. A first-tier structure is thus formed over the semiconductor material layer 110. The first-tier structure comprises all material portions that are located above the semiconductor material layer 110 at this processing step.

Referring to FIGS. 6A-6E, a first etch mask layer (not shown) can be formed over the first insulating cap layer 170 and the first dielectric fill structures 165, and can be lithographically patterned to form various discrete openings therein. A first anisotropic etch process can be performed to transfer the pattern of the discrete openings in the first etch mask layer through the first insulating cap layer 170, the first alternating stack (132, 142), and the first dielectric fill structures 165. Various openings can be formed through the first insulating cap layer 170, the first alternating stack (132, 142), and the first dielectric fill structures 165. The various openings may comprise first-tier memory openings 149 that are formed in the memory array regions 100 and first-tier support openings 119 that are formed in the contact region 200. Each of the first-tier memory openings 149 and the first-tier support openings 119 can vertically extend through the first alternating stack (132, 142) and into the semiconductor material layer 110.

In one embodiment, the memory array regions 100 may be laterally spaced apart from the contact region 300 along a first horizontal direction hd1. The first-tier memory openings 149 may comprise rows of first-tier memory openings 149 that are arranged along the first horizontal direction hd1 and laterally spaced apart along a second horizontal direction hd2 that is perpendicular to the first horizontal direction hd2. Each area of a memory array region 100 located within a repetition unit RU includes a respective two-dimensional array of first-tier memory openings 149 that are arranged as a cluster. Neighboring clusters of first-tier memory openings 149 may be laterally spaced apart along the second horizontal direction hd2.

In one embodiment, the first-tier support openings 119 in the contact region 200 may be arranged as two-dimensional periodic arrays of first-tier support openings 119 located within a respective one of the repetition units RU. In one embodiment, each two-dimensional periodic array of first-tier support openings 119 may be a respective rectangular periodic array of first-tier support openings 119.

In one embodiment, the first-tier support openings 119 in the contact region 200 may be elongated along the second horizontal direction hd2. In another embodiment, the first-tier support openings 119 in the contact region 200 may have a circular horizontal cross-section. In one embodiment, columns of first-tier support openings 119 arranged along the second horizontal direction hd2 may cut through a respective vertically-extending straight surface segment of a stepped bottom surface of the first alternating stack (132, 142). The vertically-extending straight surface segment can be perpendicular to the first horizontal direction hd1.

Referring to FIGS. 7A-7E, an optional etch stop liner (not shown) and a first sacrificial fill material can be deposited in the first-tier memory openings 149 and the first-tier support openings 129. The optional etch stop liner (if present)

comprises a thin silicon oxide layer having a thickness in a range from 1 nm to 6 nm. The first sacrificial fill material may comprise a carbon-based material, such as amorphous carbon or diamond-like carbon, or a semiconductor material, such as amorphous silicon. Excess portions of the first sacrificial fill material that overlies the horizontal plane including the top surface of the first insulating cap layer 170 may be removed by a planarization process, which may employ a recess etch process or a chemical mechanical polishing process. Each remaining portion of the first sacrificial fill material that fills a first-tier memory openings 149 constitute a first-tier sacrificial memory opening fill material portion 148. Each remaining portion of the first sacrificial fill material that fills a first-tier support opening 119 constitutes a first-tier sacrificial support opening fill material portion 118.

Referring to FIGS. 8A-8E, a second alternating stack of second insulating layers 232 and second sacrificial material layers 242 can be formed over the first-tier structure. The second insulating layers 232 may comprise and/or may consist essentially of the same material as the first insulating layers 132. The second sacrificial material layers 242 may comprise and/or may consist essentially of the same material as the first sacrificial material layers 142. Each of the second insulating layers 232 continuously extends over the entire area of the substrate 8, and may have a uniform thickness throughout. Each of the second sacrificial material layers 242 continuously extends over the entire area of the substrate 8, and may have a uniform thickness throughout.

The thickness range for the second insulating layers 232 may be the same as the thickness range for the first insulating layers 132. The thickness range for the second sacrificial material layers 242 may be the same as the thickness range for the first sacrificial material layers 142. The total number of repetitions of a pair of an second insulating layer 232 and a second sacrificial material layer 242 in the second alternating stack (232, 242) may be in a range from 26 to 1.024, such as from 64 to 512, although lesser and greater numbers may also be employed. The second insulating layers 232 are a second subset of the insulating layers 32 that are formed over the substrate 8, and the second sacrificial material layers 242 are a second subset of the sacrificial material layers 42 that are formed over the substrate 8.

Multiple stepped surfaces S can be formed within the contact regions 200 simultaneously by patterning the second alternating stack (232, 242). In one embodiment, a hard mask layer (not shown) such as a metallic or dielectric mask material layer can be formed over the second alternating stack (232, 242), and can be patterned to form multiple rectangular openings. The areas of openings within the hard mask layer correspond to areas in which cavities 269 including stepped bottom surfaces are to be subsequently formed. Each opening through the hard mask layer may be rectangular, and may have a pair of sides that are parallel to the second horizontal direction hd2 and a pair of sides that are parallel to the second horizontal direction hd2. The rectangular openings through the hard mask layer may be arranged along the second horizontal direction hd2, and may, or may not, be alternately staggered along the second horizontal direction hd2.

A trimmable mask layer (not shown) can be applied over the second alternating stack. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to a memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step of respective stepped surfaces that is most proximal to one of the memory array regions 200.

The stepped surfaces S can be formed within the areas of the rectangular openings in the hard mask layer by iteratively performing a set of layer patterning processing steps. The set of layer patterning processing steps comprises an anisotropic etch process that etches unmasked portions of a pair of a second insulating layer 232 and a second sacrificial material layer 242, and a mask trimming process in which the trimmable mask layer is isotropically trimmed to provide shifted sidewalls that are shifted away from the most proximal memory array region 200. A final anisotropic etch process can be performed after the last mask trimming process, and the trimmable mask layer can be removed, for example, by ashing. The hard mask layer can be removed selective to the materials of the second alternating stack (32, 42), for example, by an isotropic etch process (such as a wet etch process). Alternatively, any other suitable process may be used to form the stepped surfaces.

A second cavity 269 having a respective stepped bottom surface can be formed within each area of the rectangular opening in the hard mask layer. Each second cavity 269 can include a cliff region in which a second end wall EW2 of the second alternating stack (32, 42) extends from the bottommost layer of the second alternating stack (232, 242) to the topmost layer of the second alternating stack (232, 242). The second end wall EW1 may be tapered (i.e., inclined) at an angle of 1 to 30 degrees with respect to the vertical direction. Each second cavity 269 has stepped bottom surfaces. The stepped bottom surface of each cavity 269 laterally extend along the second horizontal direction hd2, and underlies the volume of the void of the second cavity 269. Generally, the stepped surfaces S can be formed by patterning the second alternating stack (232, 242) in each contact region 200, which is located between a respective first memory array region 100A and a second memory array region 100B. All layers of the second alternating stack (232, 242) may be removed within the area that overlies the underlying first dielectric fill structure 165. In one embodiment, the entirety of the top surface of a first dielectric fill structure may be physically exposed upon formation of the second cavities 269.

Generally, each second cavity 269 may have stepped surfaces S including vertically-extending surface segments that are interlaced with horizontally-extending surface segments which form the bottom surface of the second cavity 269. Further, each second cavity 269 may comprise a pair of second tapered (e.g., inclined) sidewalls TS2 that are parallel to the first horizontal direction hd1, laterally spaced from each other along the second horizontal direction hd2, and having a respected stepped bottom end adjoined to a respective stepped periphery of the stepped bottom surface. The second tapered sidewalls TS2 may be tapered (i.e., inclined) at an angle of 5 to 45 degrees with respect to the vertical direction. The lateral distance between the pair of second tapered sidewalls TS2 along the second horizontal direction hd2 is the width of a respective second cavity 269, which increases with a vertical distance from the substrate 8.

In summary, at least one alternating stack of insulating layers 32 and first-tier sacrificial material layers 42 can be formed, and at least one cavity (169, 269) can be formed through the at least one alternating stack (32, 42). The combination of the first alternating stack (132, 142) and the second alternating stack (232, 242) constitutes another alternating stack of a greater height, which may be referred to as an alternating stack (32, 42) of insulating layers 32 and first-tier sacrificial material layers 42. The horizontal plane including the topmost surface of the alternating stack (32, 42) is herein referred to as a first horizontal plane HP1, and the horizontal plane including the bottommost surface of the alternating stack (32, 42) is herein referred to as a second horizontal plane HP2.

A cavity (169, 269) can be formed in the alternating stack (32, 42) such that stepped surfaces S of the alternating stack (32, 42) are exposed underneath the cavity (169, 269). The alternating stack (32, 42) comprises tapered sidewalls (TS1, TS2) that laterally extend along a first horizontal direction hd1 in the contact region 200.

Referring to FIGS. 9A-9E, a second insulating liner 260 can be conformally deposited over the underlying structure. The second insulating liner 260 comprises an insulating material such as silicon oxide. The material of the second insulating liner 260 is different from the material of the second sacrificial material layers 242. The second insulating liner 260 is deposited over the stepped surfaces of the second alternating stack (232, 242), over each second tapered sidewall TS2 of the second alternating stack (232, 242), and over the topmost layer of the second alternating stack (232, 242). The thickness of the second insulating liner 260 may be in a range from 50 nm to 200 nm, such as from 100 nm to 150 nm, although lesser and greater thicknesses may also be employed.

A photoresist layer (not illustrated) can be formed over the second insulating liner 260, and can be lithographically patterned to form an opening that laterally extends through the entire lateral extent of the stepped surfaces of the second alternating stack (232, 242) and an underlying first dielectric fill structure 165. An etch process can be performed to etch unmasked portions of the second insulating liner 260. The etch process may process may comprise an isotropic etch process or an anisotropic etch process. An opening is formed through the second insulating liner 260 within the area of each second cavity 269. The opening may comprise a first rectangular area overlying the stepped surfaces of the second alternating stack (232, 242) and a second rectangular area under which a horizontally-extending portion of the first sacrificial liner 182 that overlies the first alternating stack (132, 142) and an entirety of the top surface of an underlying first dielectric fill structure 165 is exposed. A strip segment of the stepped surfaces of the second alternating stack (232, 242) is exposed through the elongated opening through the second insulating liner 260 underneath a second cavity 269 that is present within the volume of a respective second cavity 269. The physically exposed surface of the first sacrificial liner 182 may have a general shape of a rectangular frame, i.e., the shape of a first rectangle from which an area of a smaller second rectangle is subtracted such that an outer rectangular periphery of the shape is spaced from an inner rectangular periphery of the shape.

In one embodiment, the portion of the opening through the second insulating liner 260 that overlies the stepped surfaces of the second alternating stack (232, 242) laterally extends along the second horizontal direction hd2, and may have a uniform width along the second horizontal direction hd2. In one embodiment, each second insulating liner 260 includes a first horizontally-extending portion overlying the second alternating stack (232, 242), and a plurality of tapered vertically-extending portions that overlie a respective second tapered sidewall TS2. In one embodiment, each second insulating liner 260 includes a plurality of second horizontally-extending portions overlying a bottom surface of a respective second cavity 269 within an array of second cavities 269. A pair of second horizontally-extending portions of a second insulating liner 260 may contact segments of a respective top surface of a second sacrificial material layer 242, and may be laterally spaced apart from each other by a rectangular region of an opening through the second insulating liner 260.

Referring to FIGS. 10A-10E, a second sacrificial liner material can be conformally deposited over the second insulating liner 160, and can be subsequently patterned to form a second sacrificial liner 282. The second sacrificial liner material comprises a material that can be subsequently removed selective to materials of the second insulating layers 232 and the second insulating liner 260. In one embodiment, the second sacrificial liner material may be the same as the first-tier sacrificial material of the second sacrificial material layers 242. In one embodiment, the second sacrificial liner 282 may comprise or may consist essentially of silicon nitride. The thickness of each second sacrificial liner 282 may be in a range from 10 nm to 50 nm, such as from 15 nm to 30 nm, although lesser and greater thicknesses may also be employed.

Figure 10A:
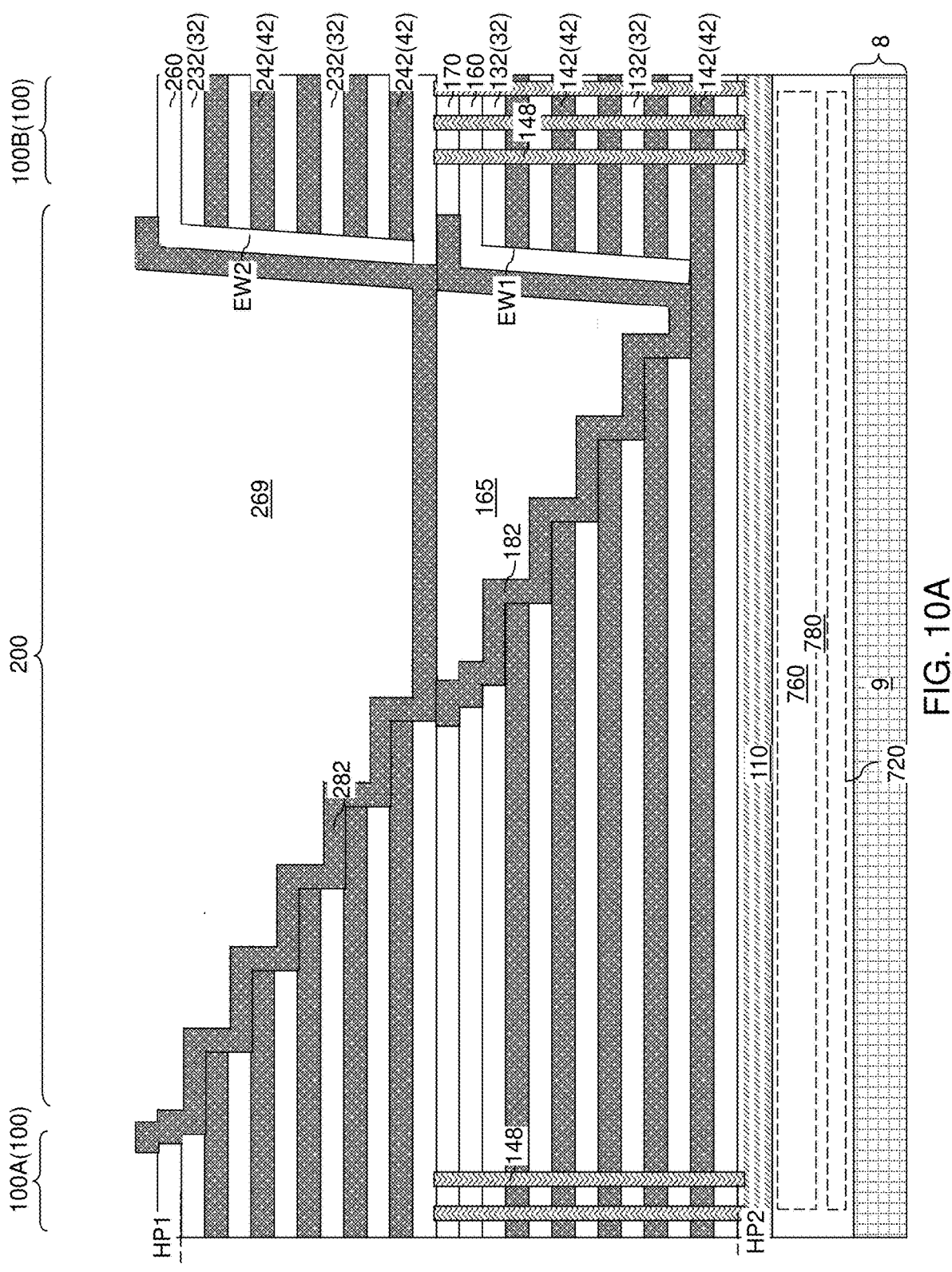
FIGS. 10A-10E are various views of the first exemplary structure after deposition and patterning of a second sacrificial liner according to an embodiment of the present disclosure.
Figure 10B:
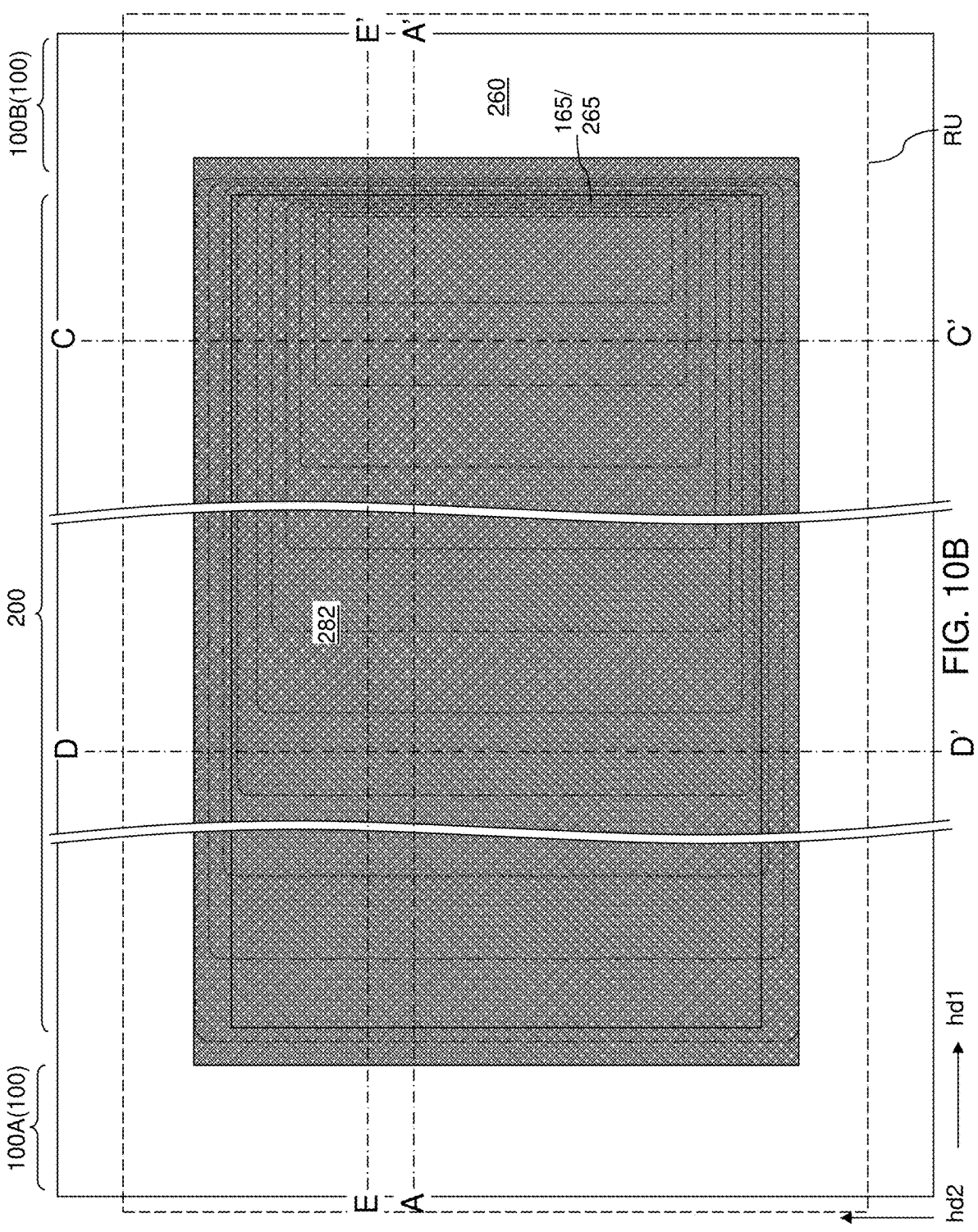
Figure 10C:
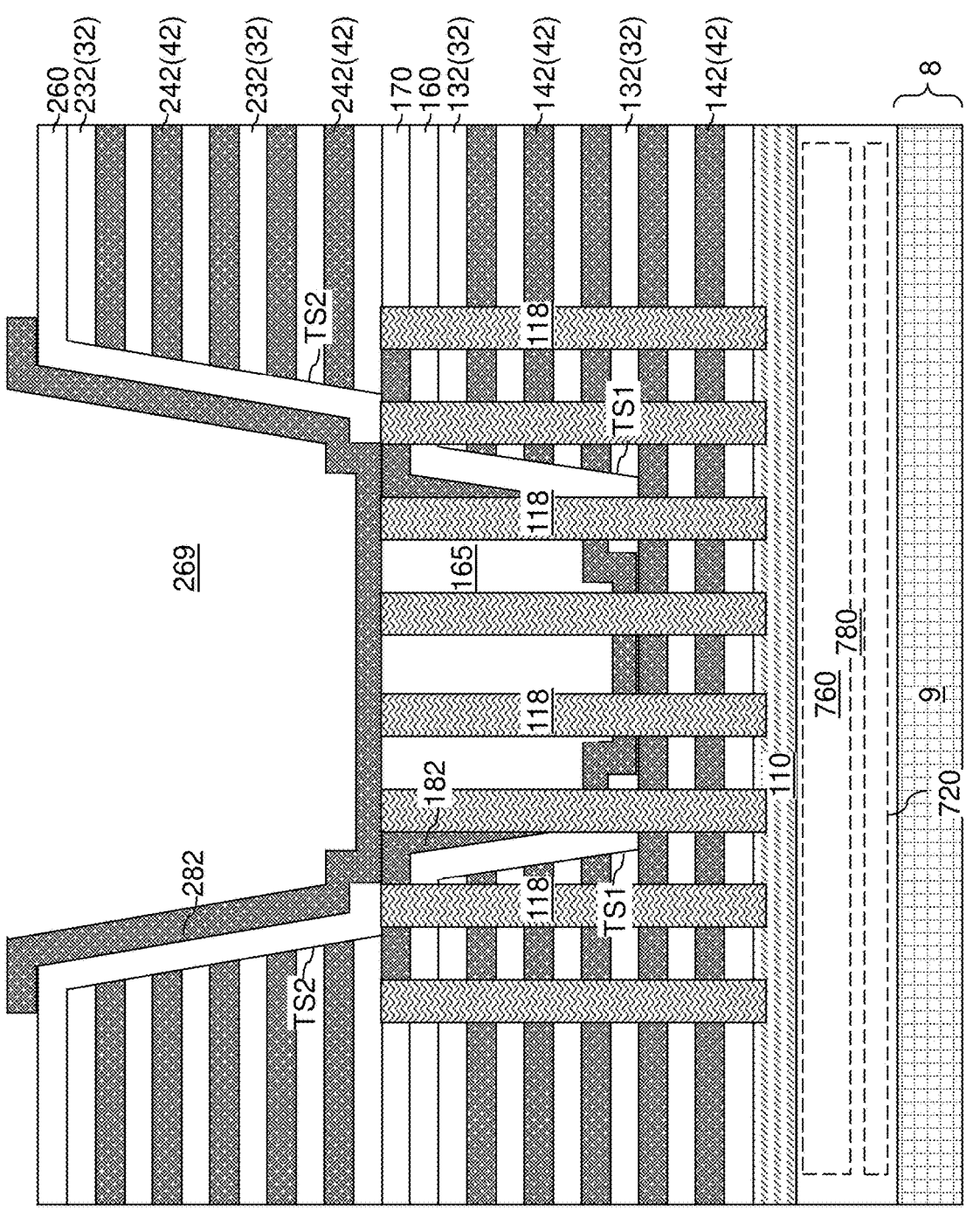
Figure 10D:
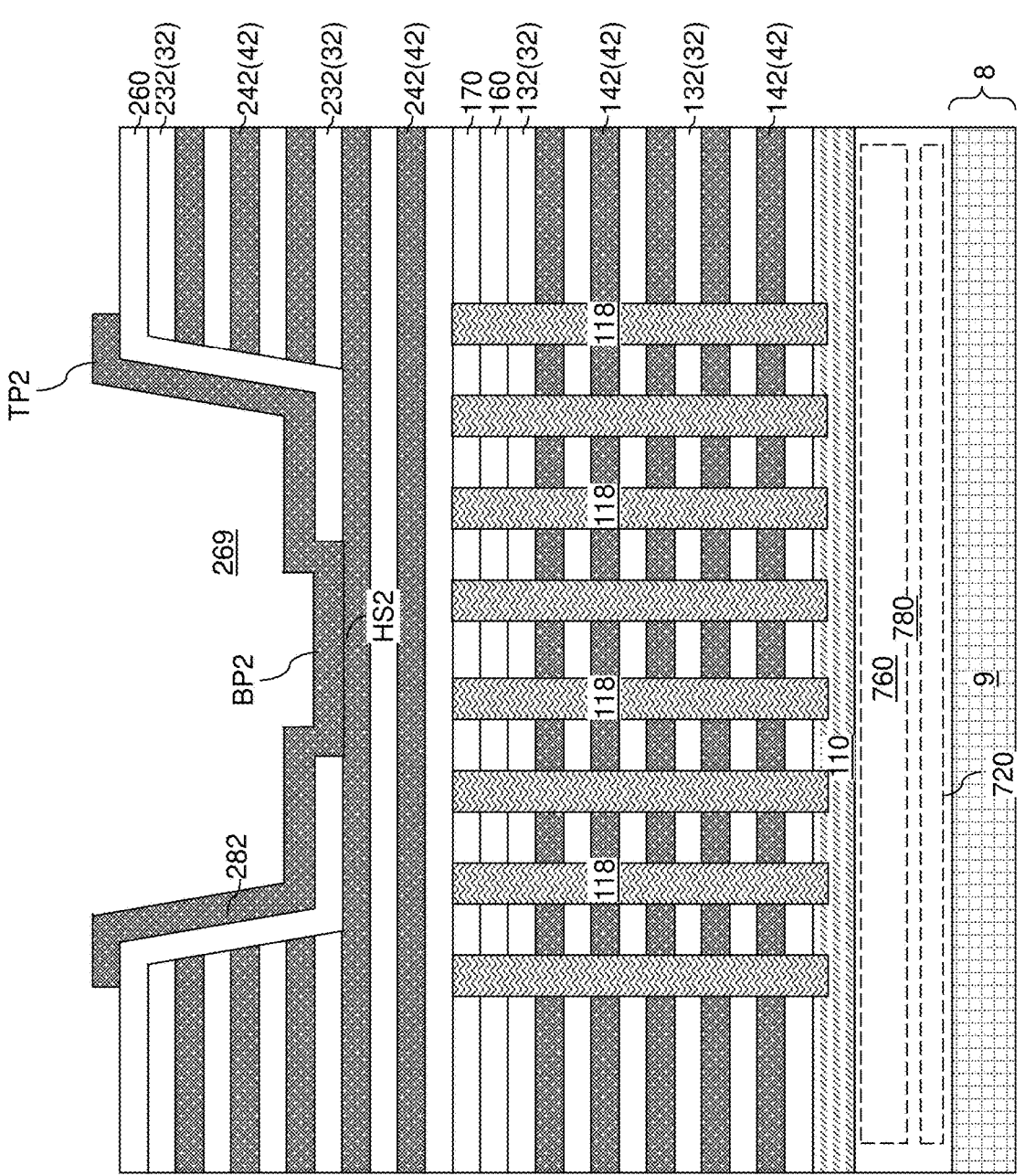
Figure 10E:
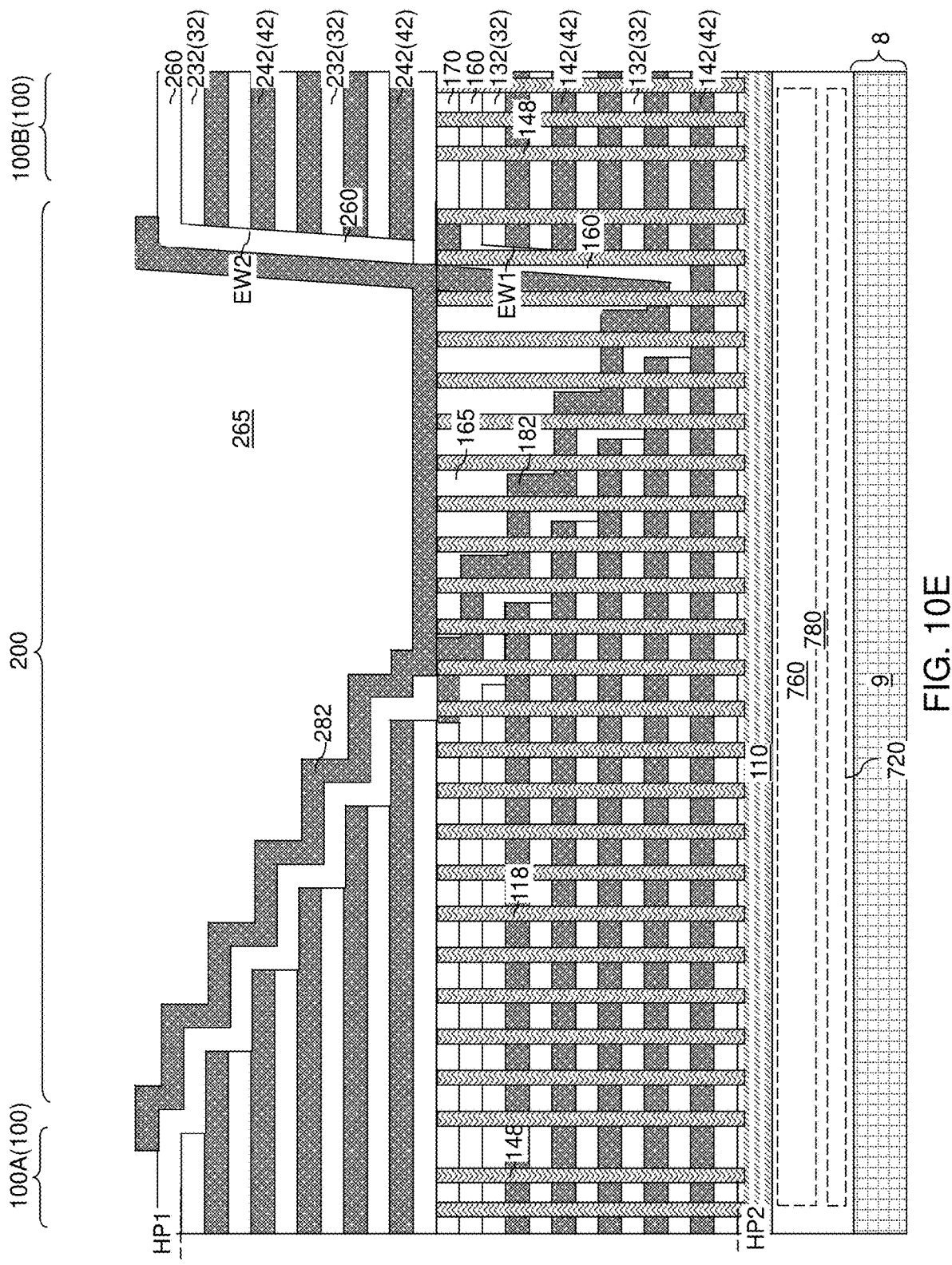
Figure 11A:
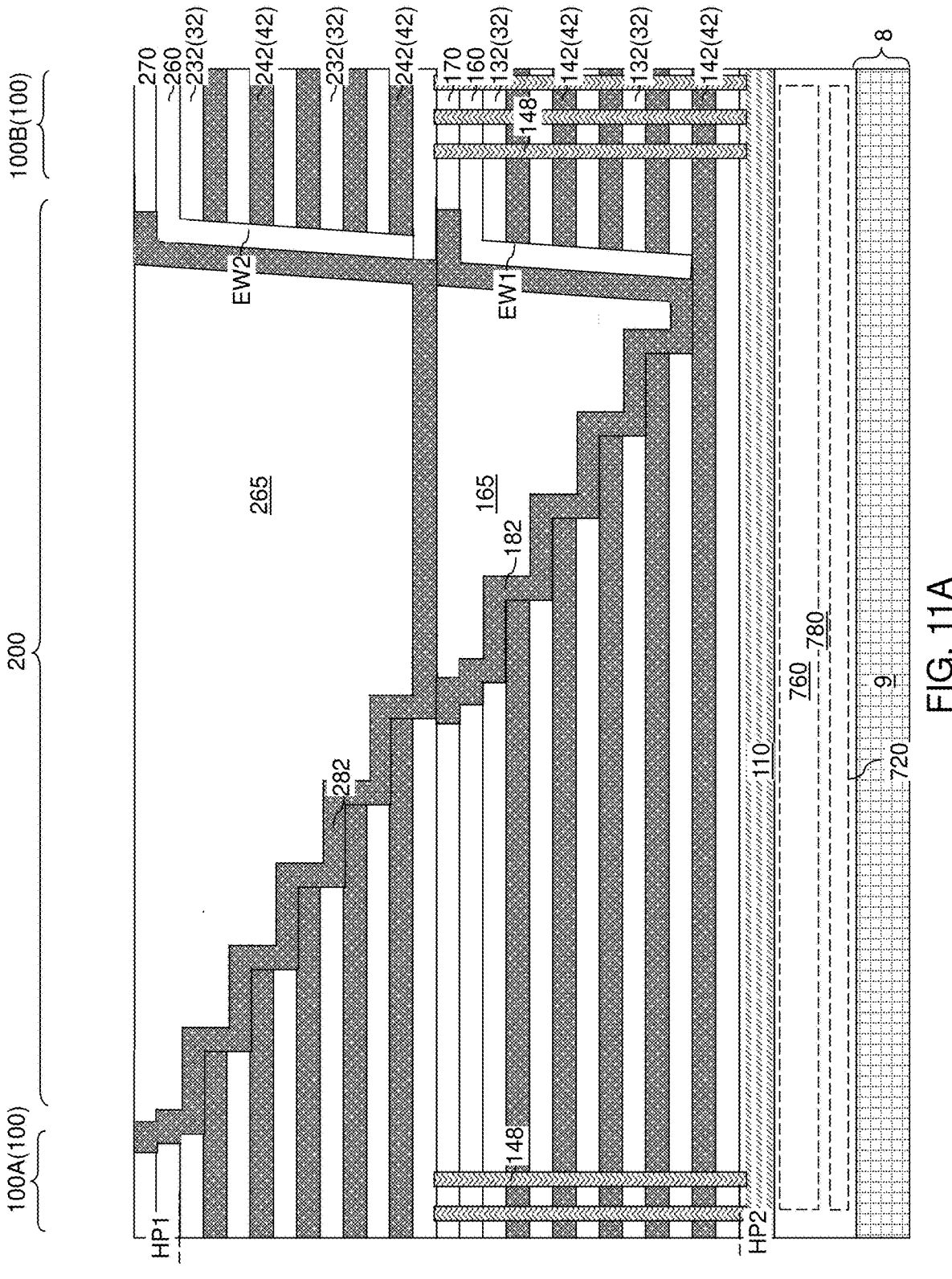
FIGS. 11A-11E are various views of the first exemplary structure after formation of a second insulating cap layer and a second dielectric fill structure according to an embodiment of the present disclosure.
Figure 11B:
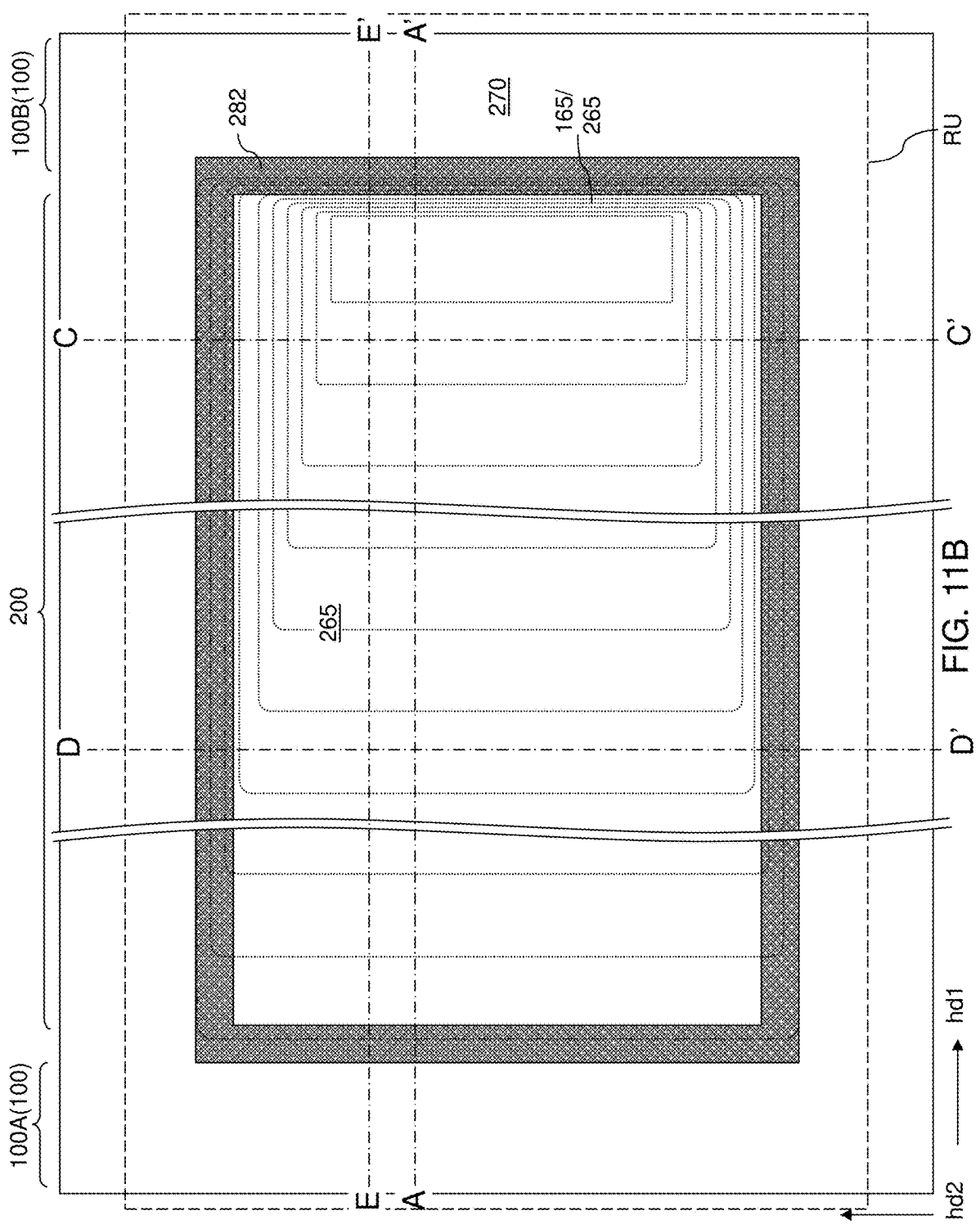
Figure 11C:
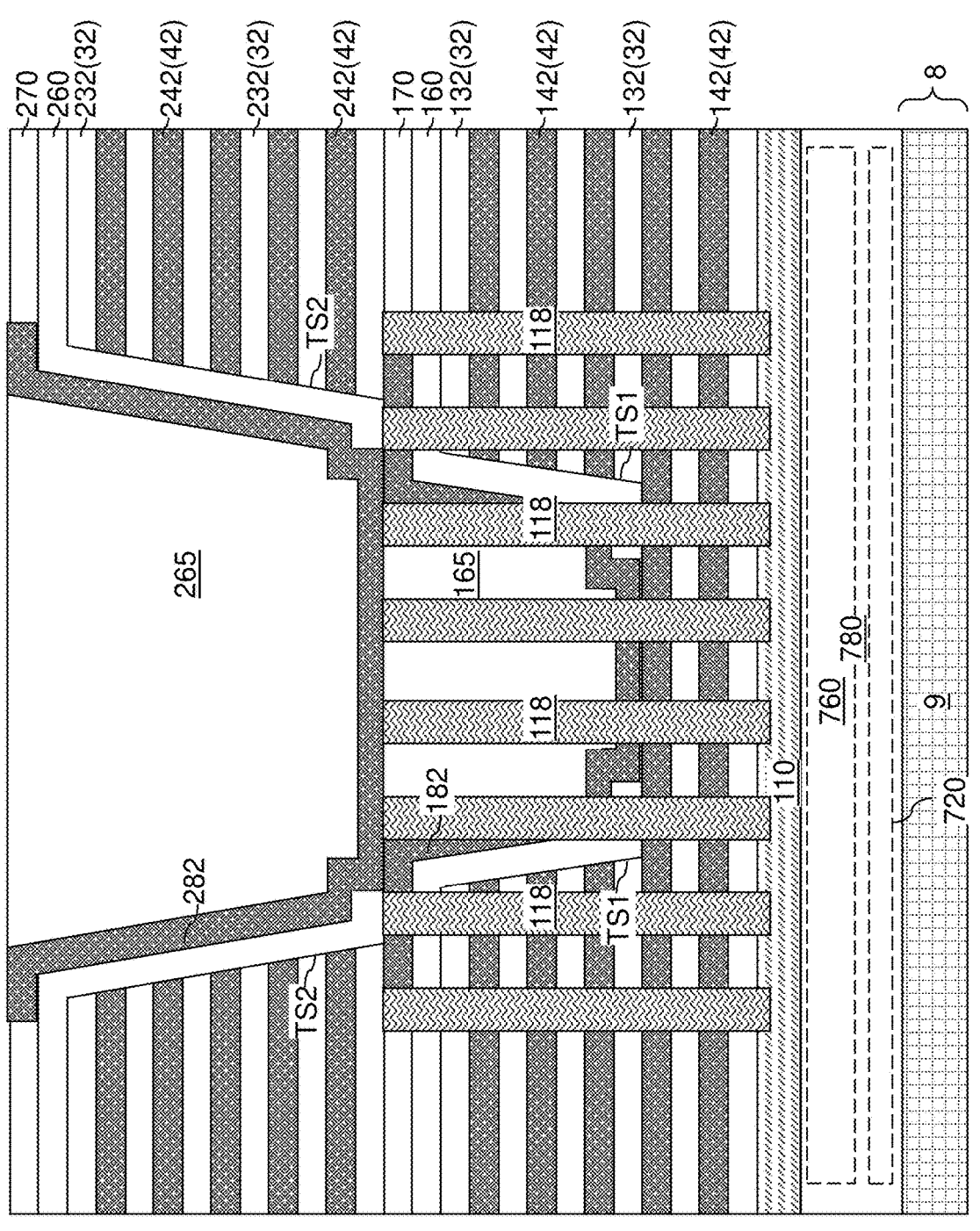
Figure 11D:
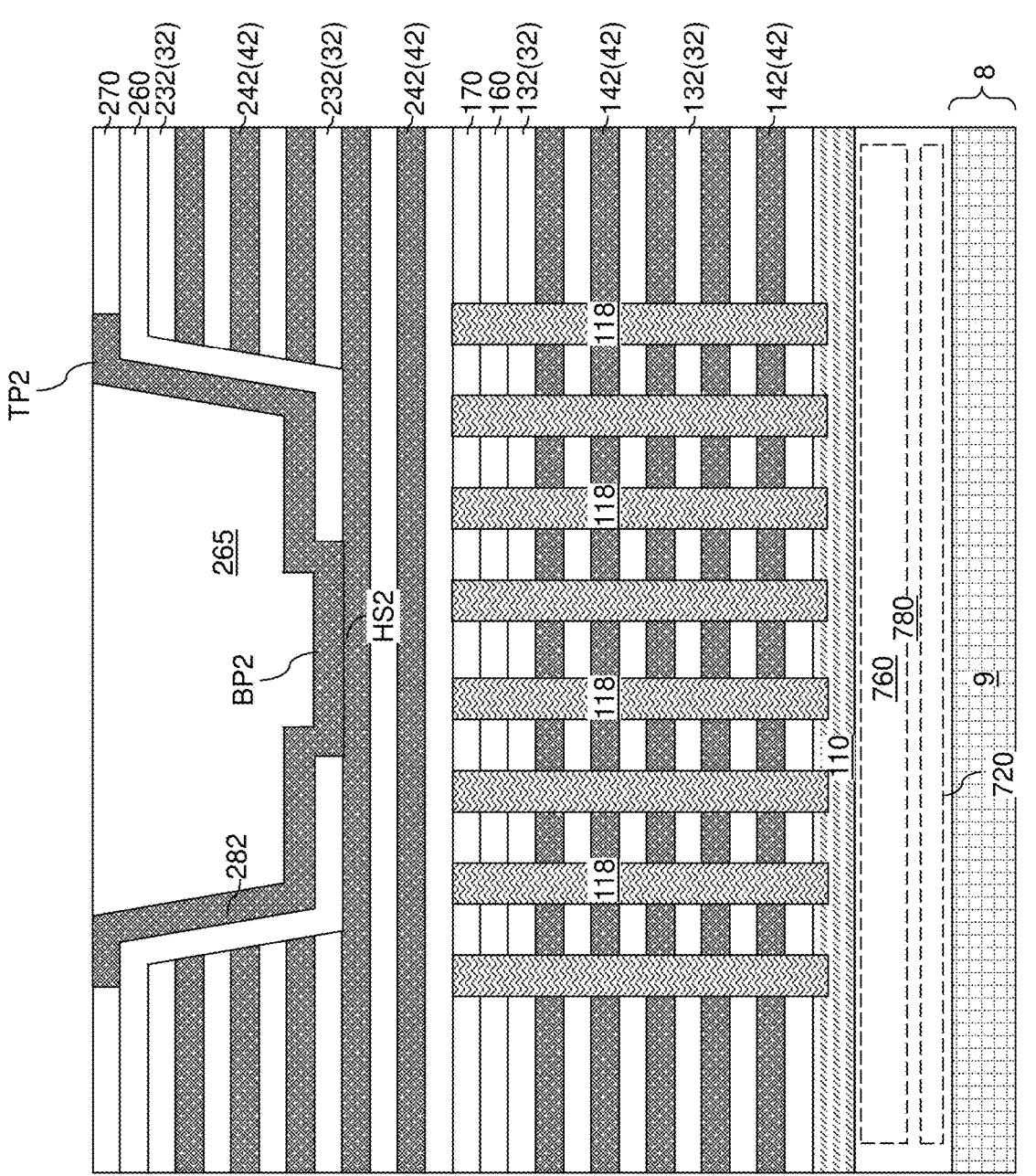
Figure 11E:
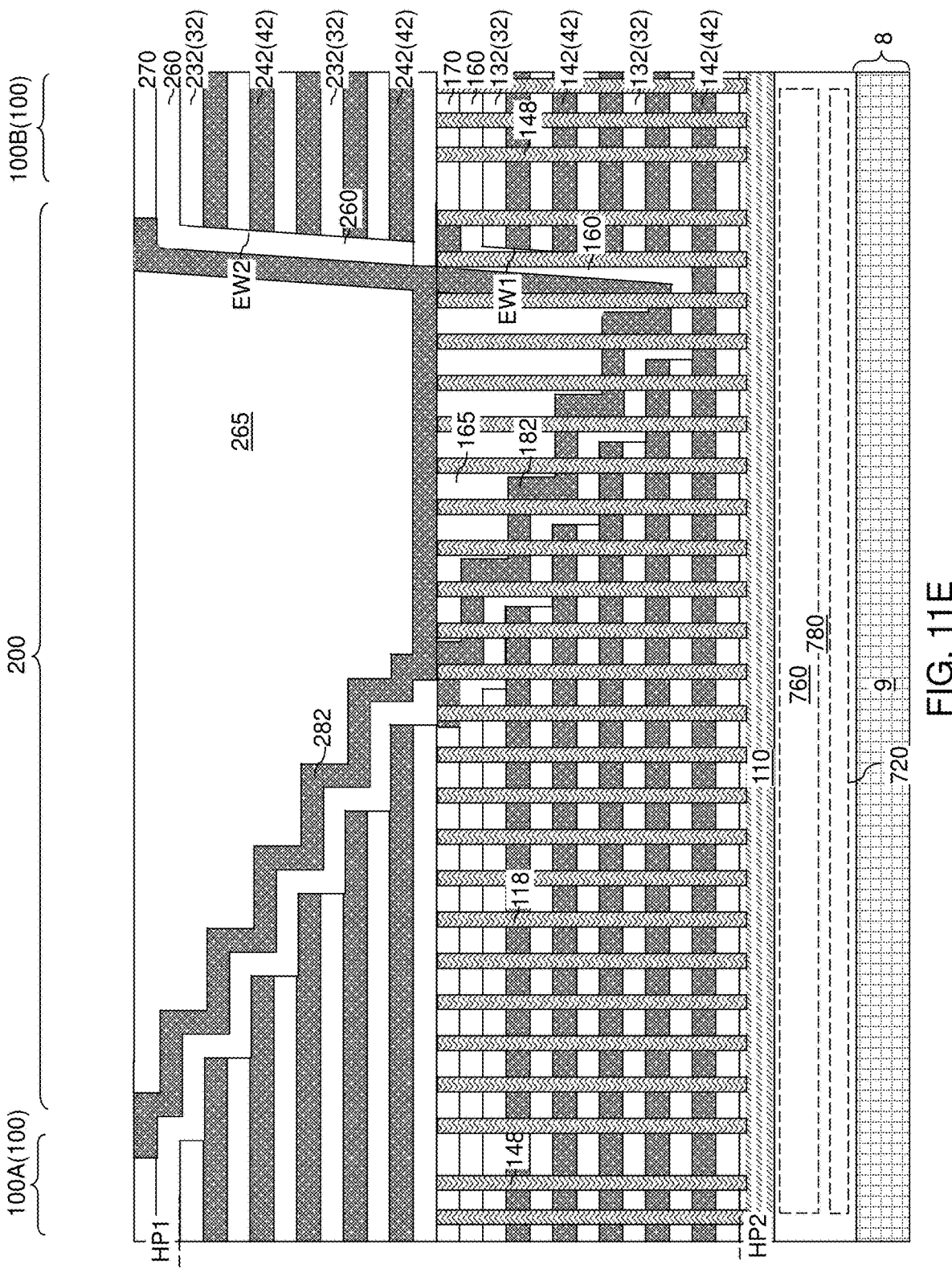
Figure 12A:
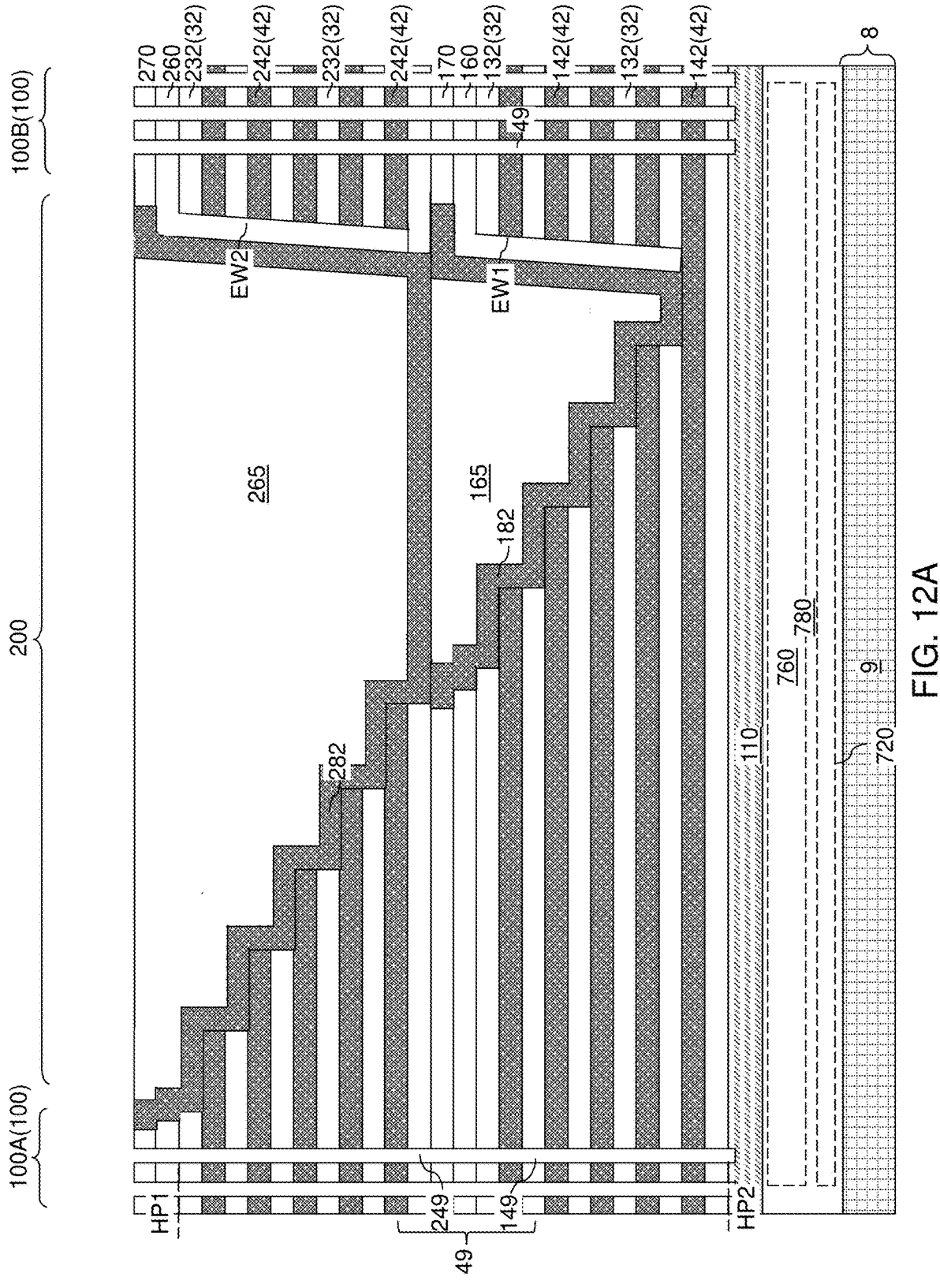
FIGS. 12A-12E are various views of the first exemplary structure after formation of multi-tier memory openings and multi-tier support openings according to an embodiment of the present disclosure.
Figure 12B:
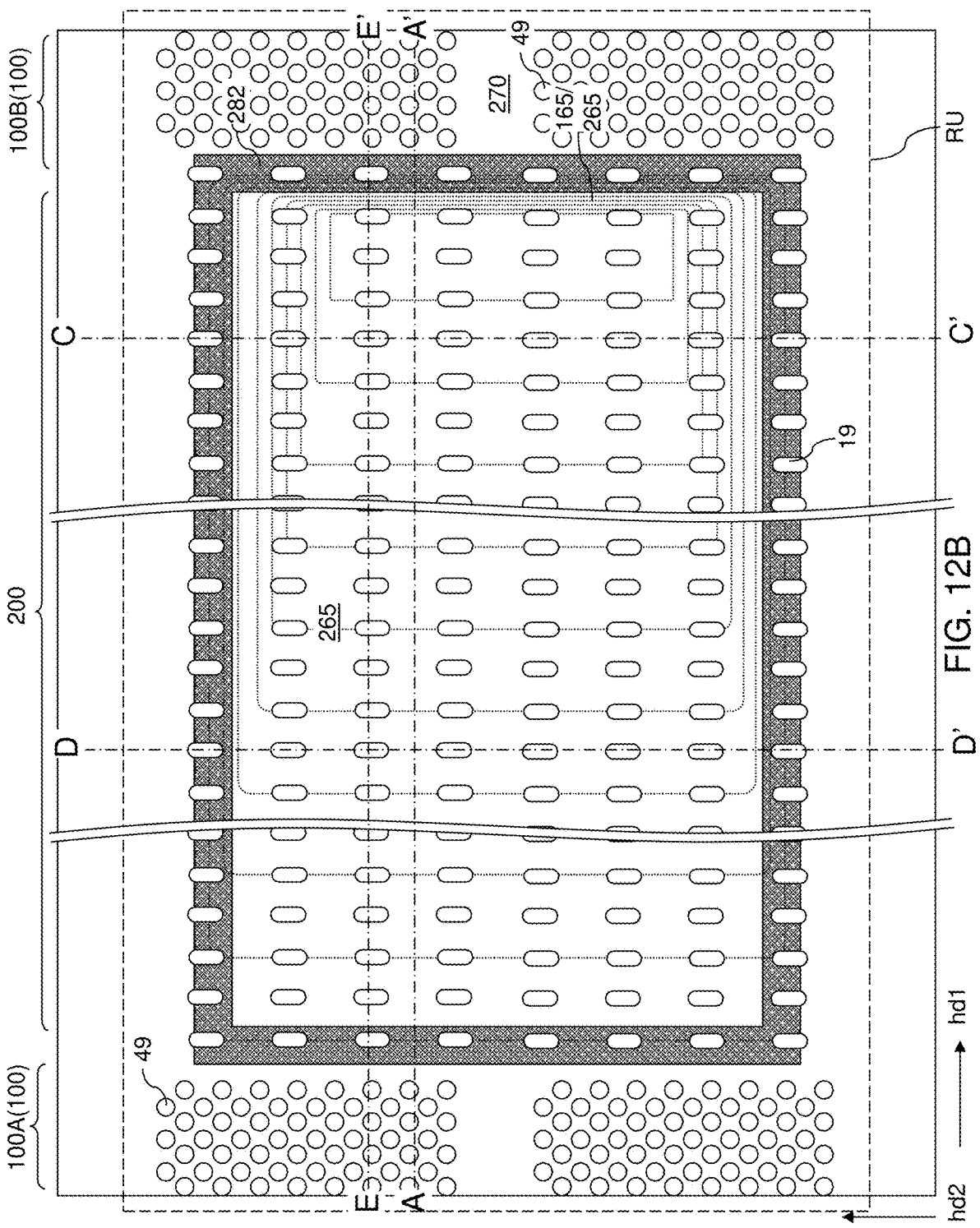
Figure 12C:
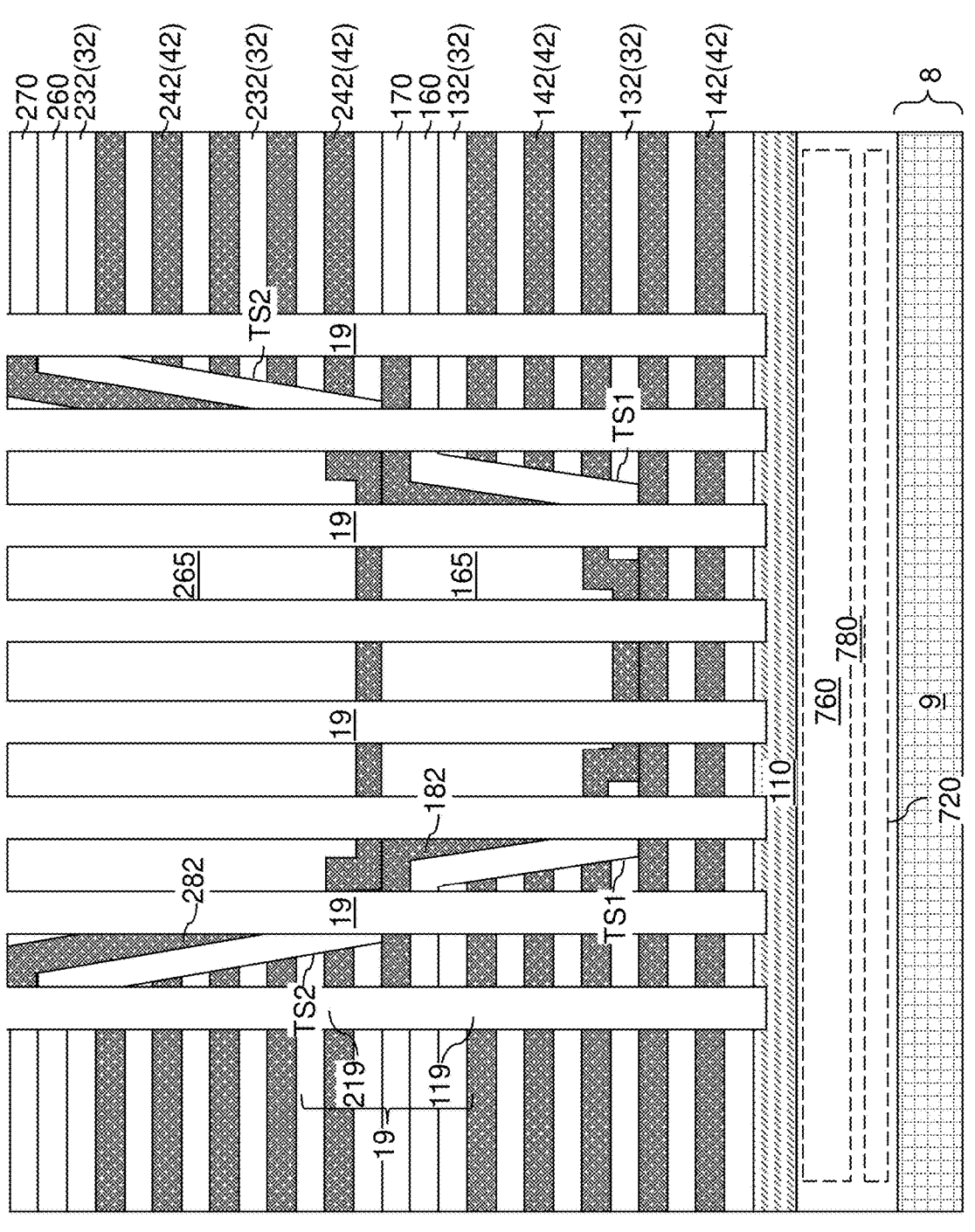
Figure 12D:
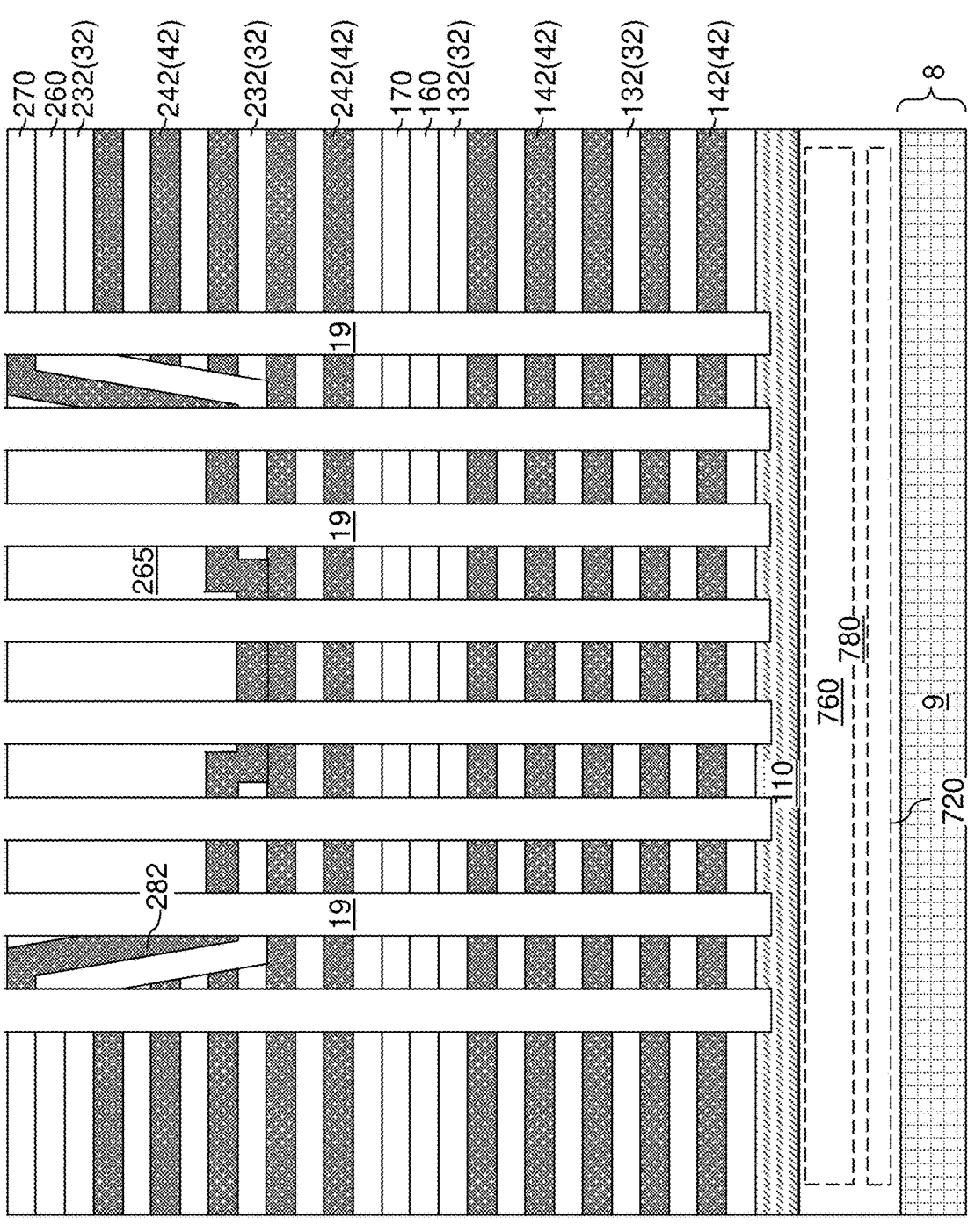
Figure 12E:
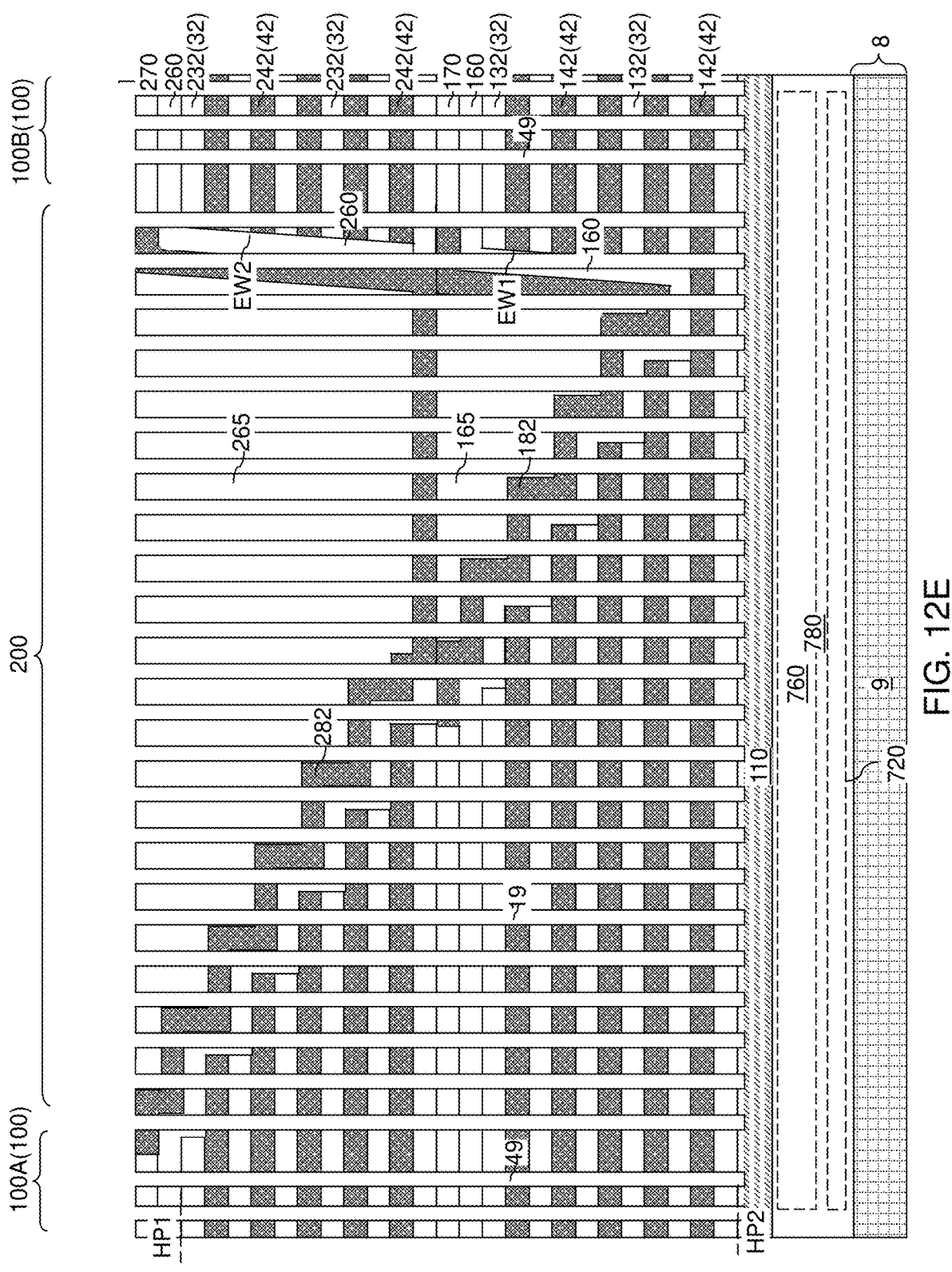
Figure 13A:
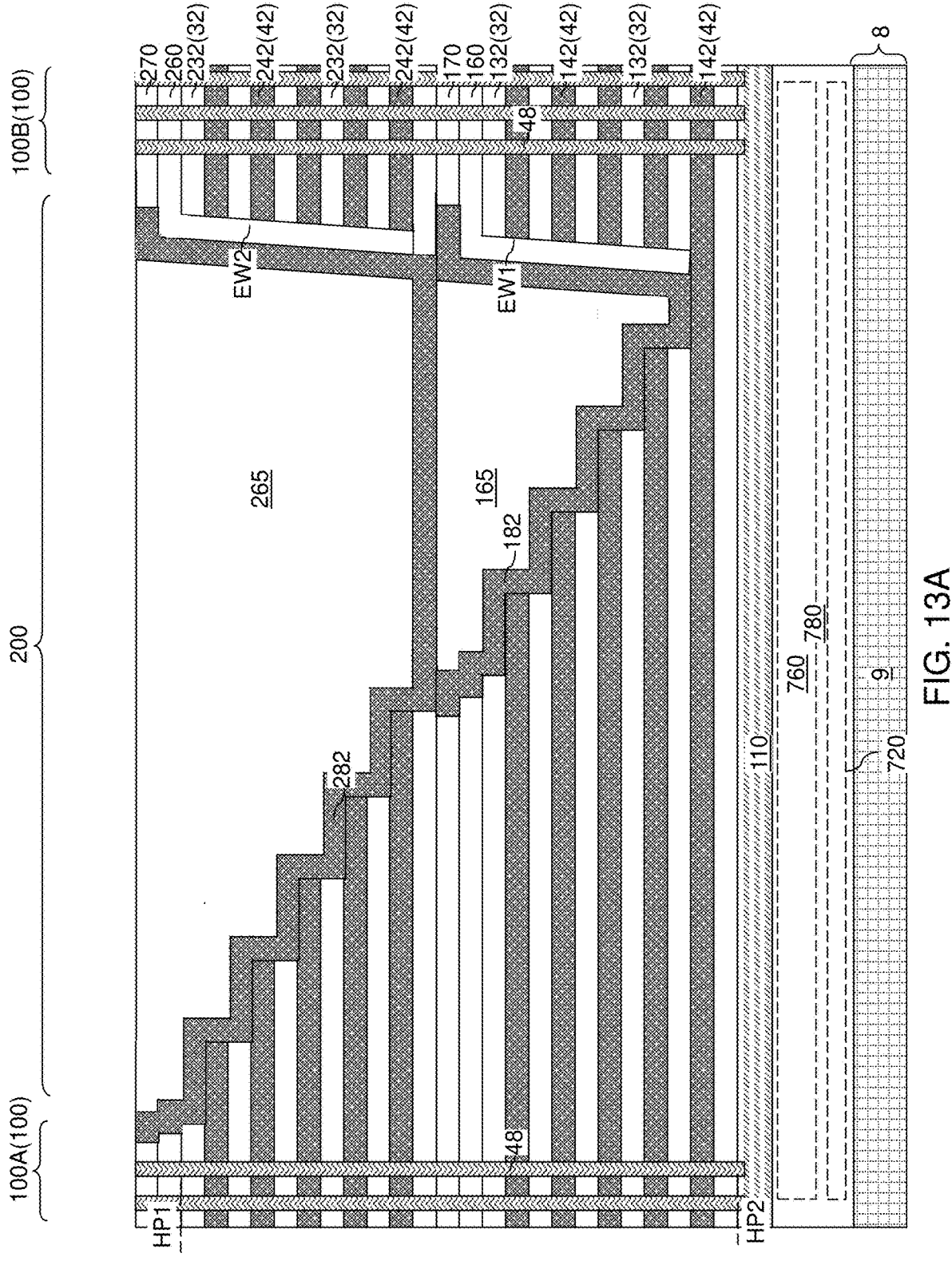
FIGS. 13A-13E are various views of the first exemplary structure after formation of sacrificial opening fill structures according to an embodiment of the present disclosure.
Figure 13B:
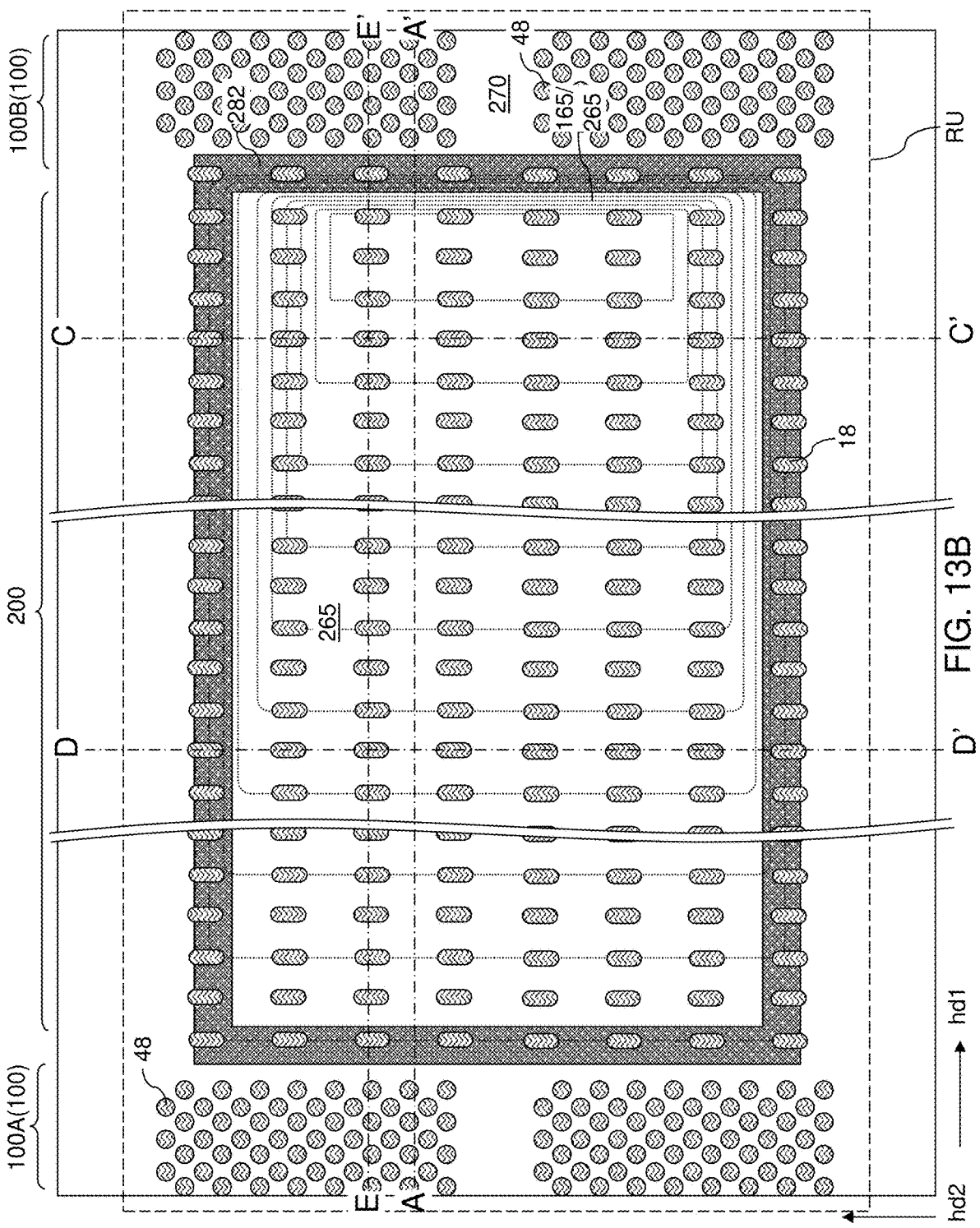
Figure 13C:
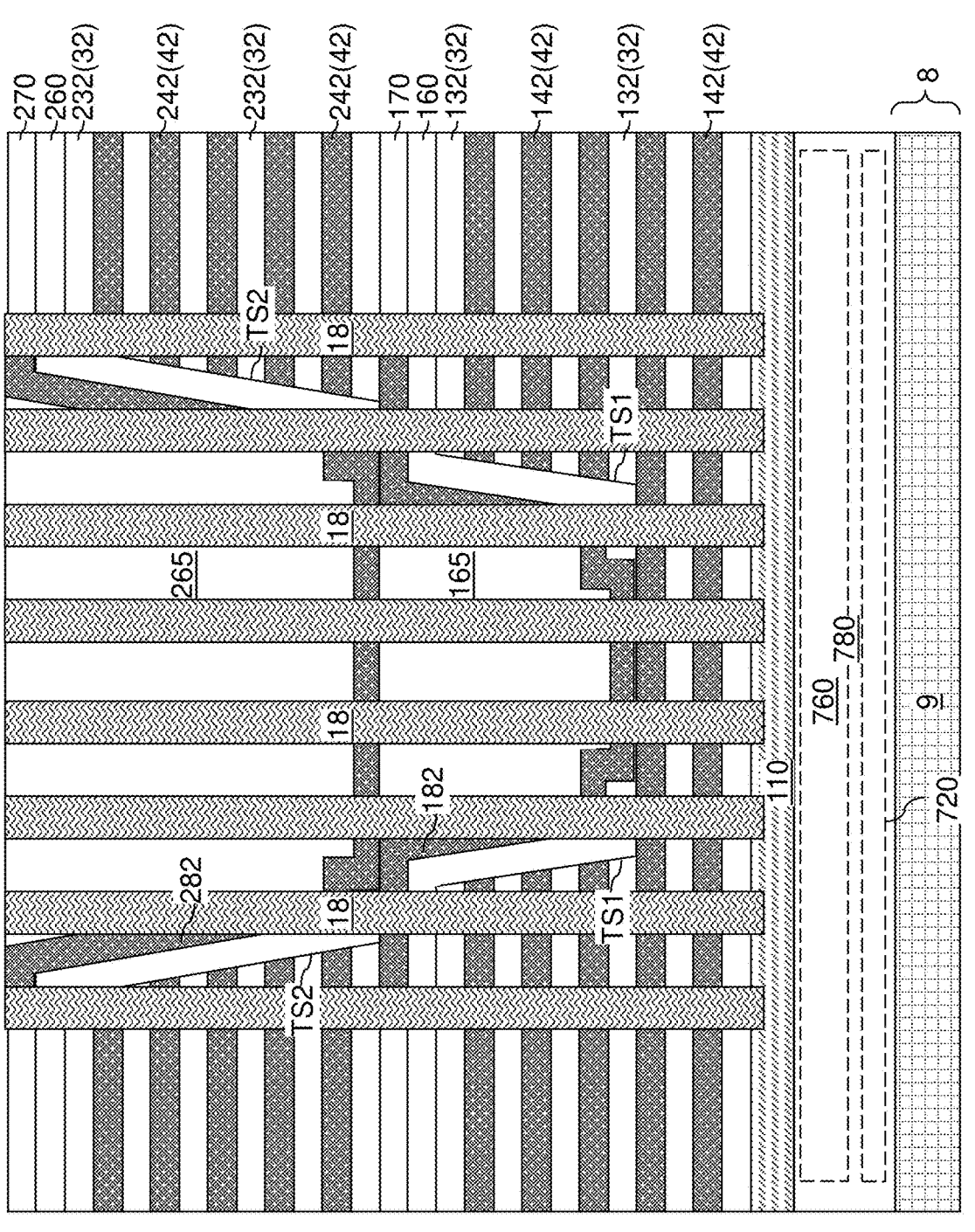
Figure 13D:
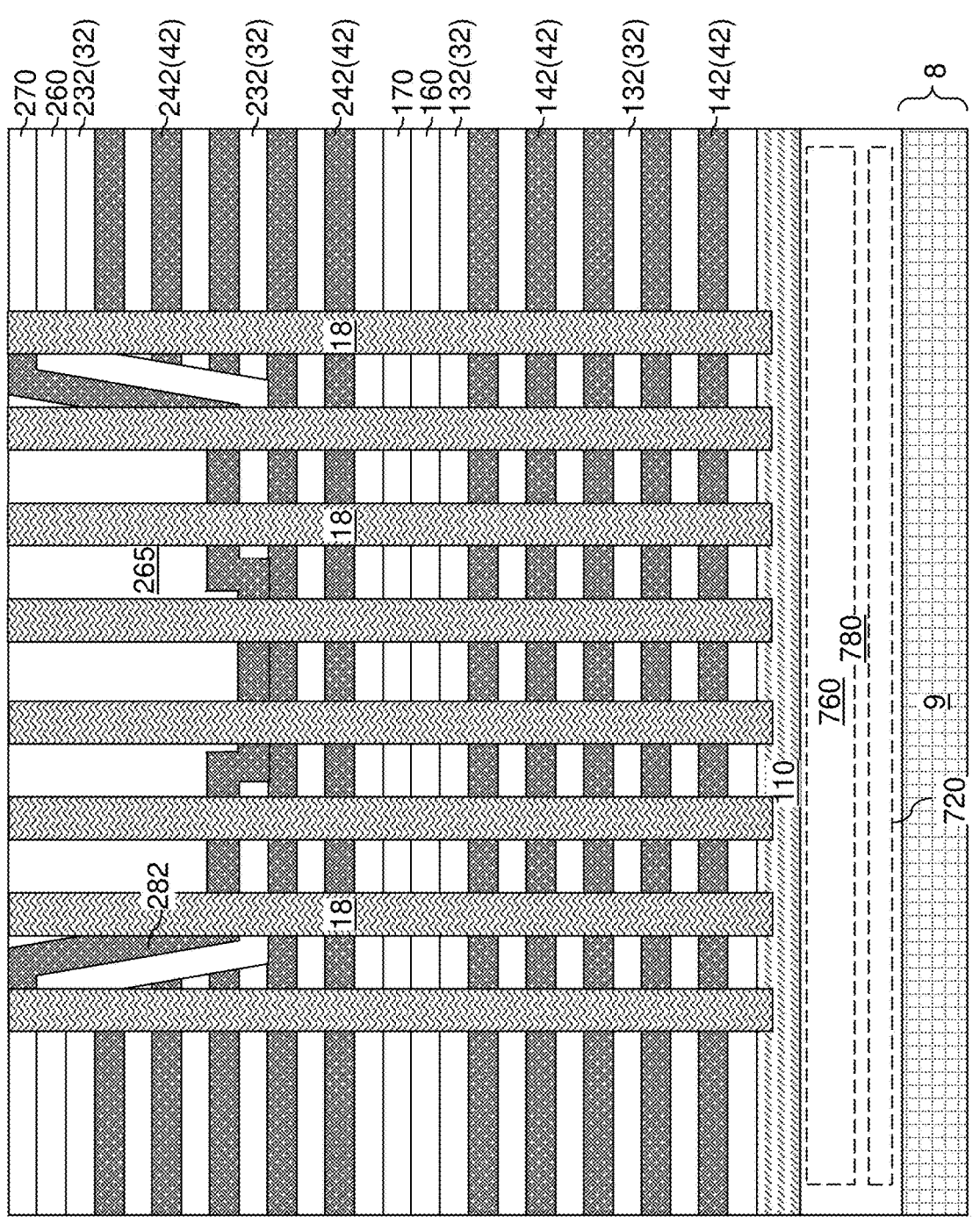
Figure 13E:
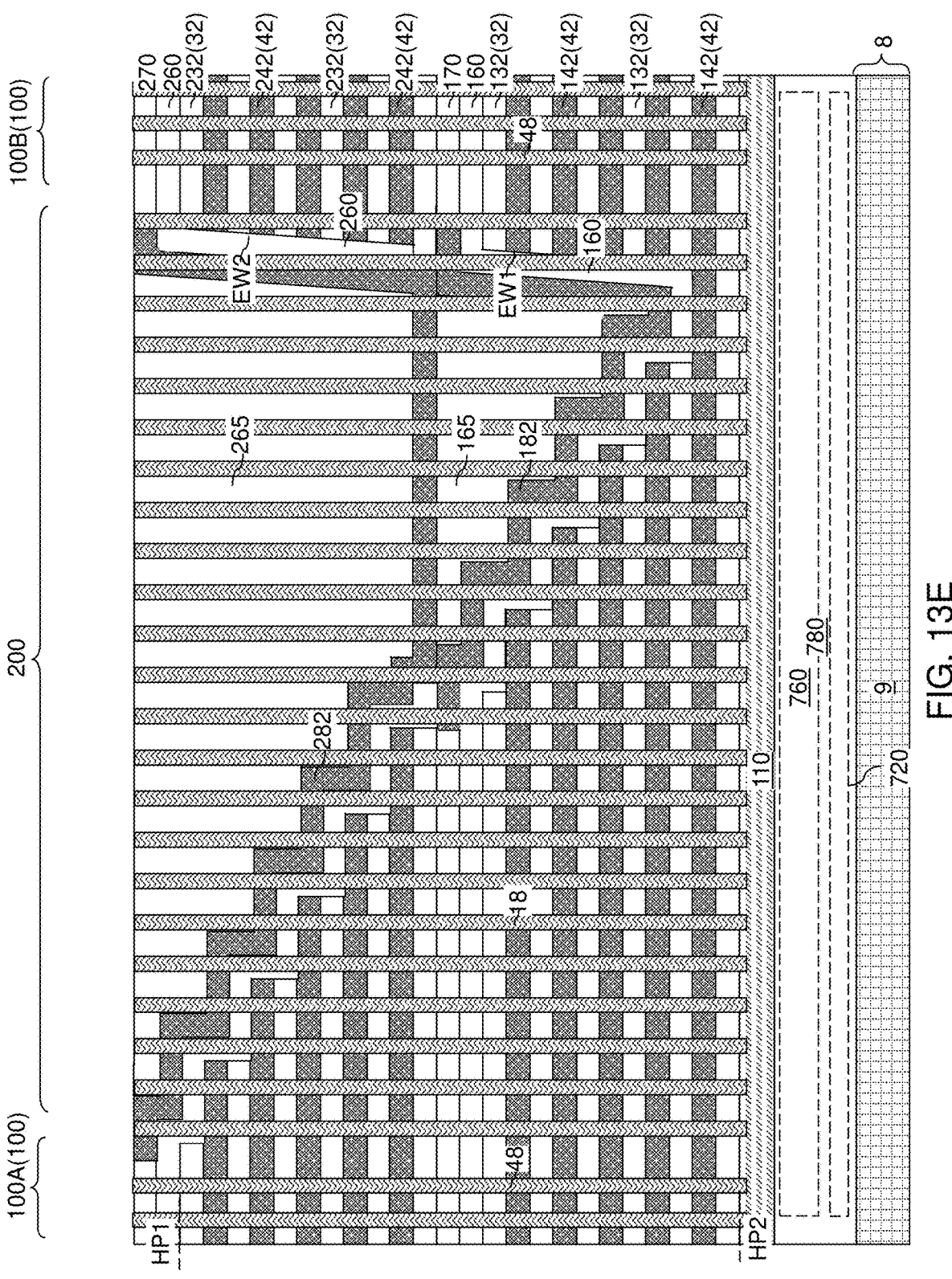
Figure 14A:
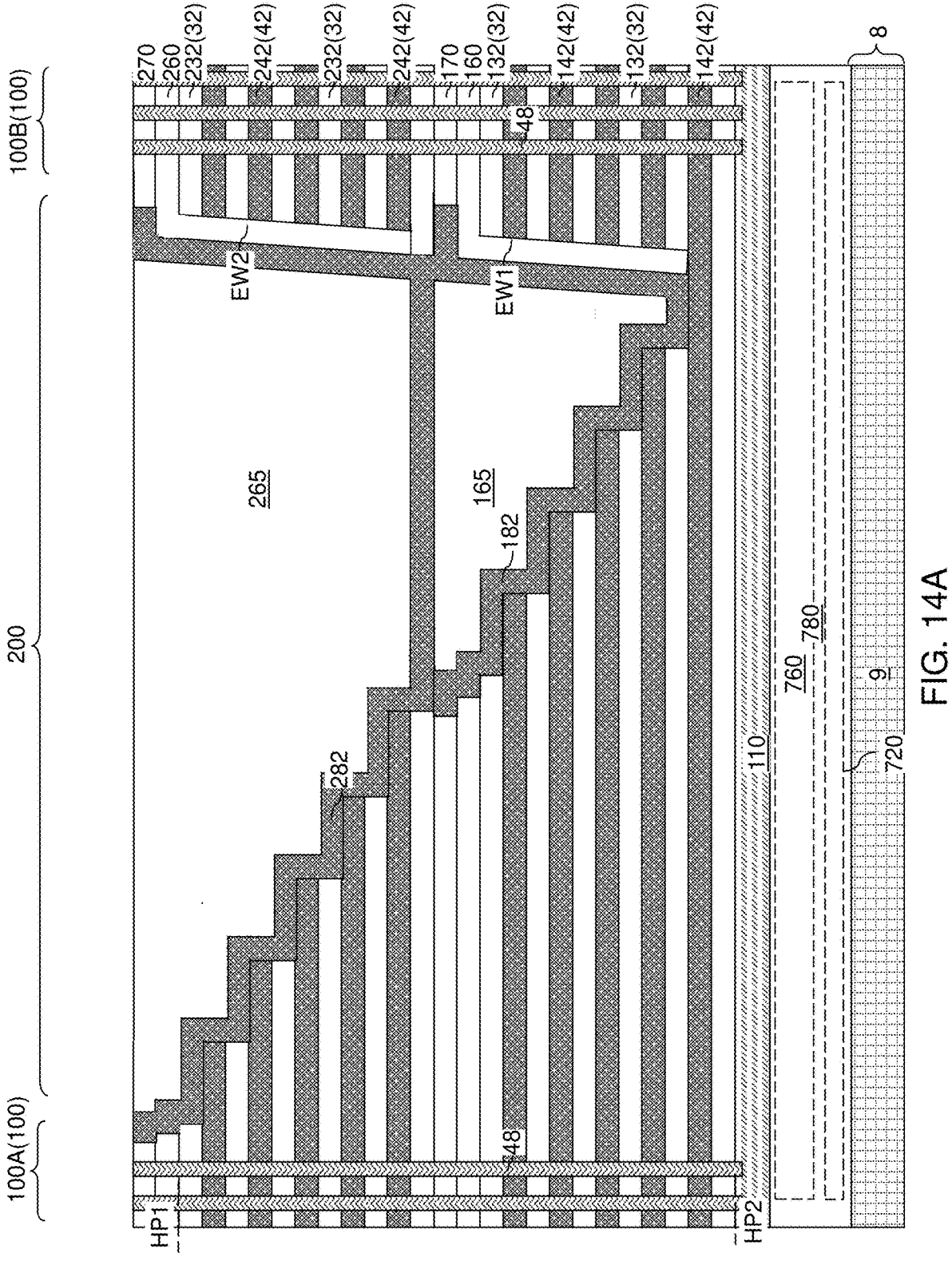
FIGS. 14A-14E are various views of the first exemplary structure after replacement of sacrificial support opening fill structures with support pillar structures according to an embodiment of the present disclosure.
Figure 14B:
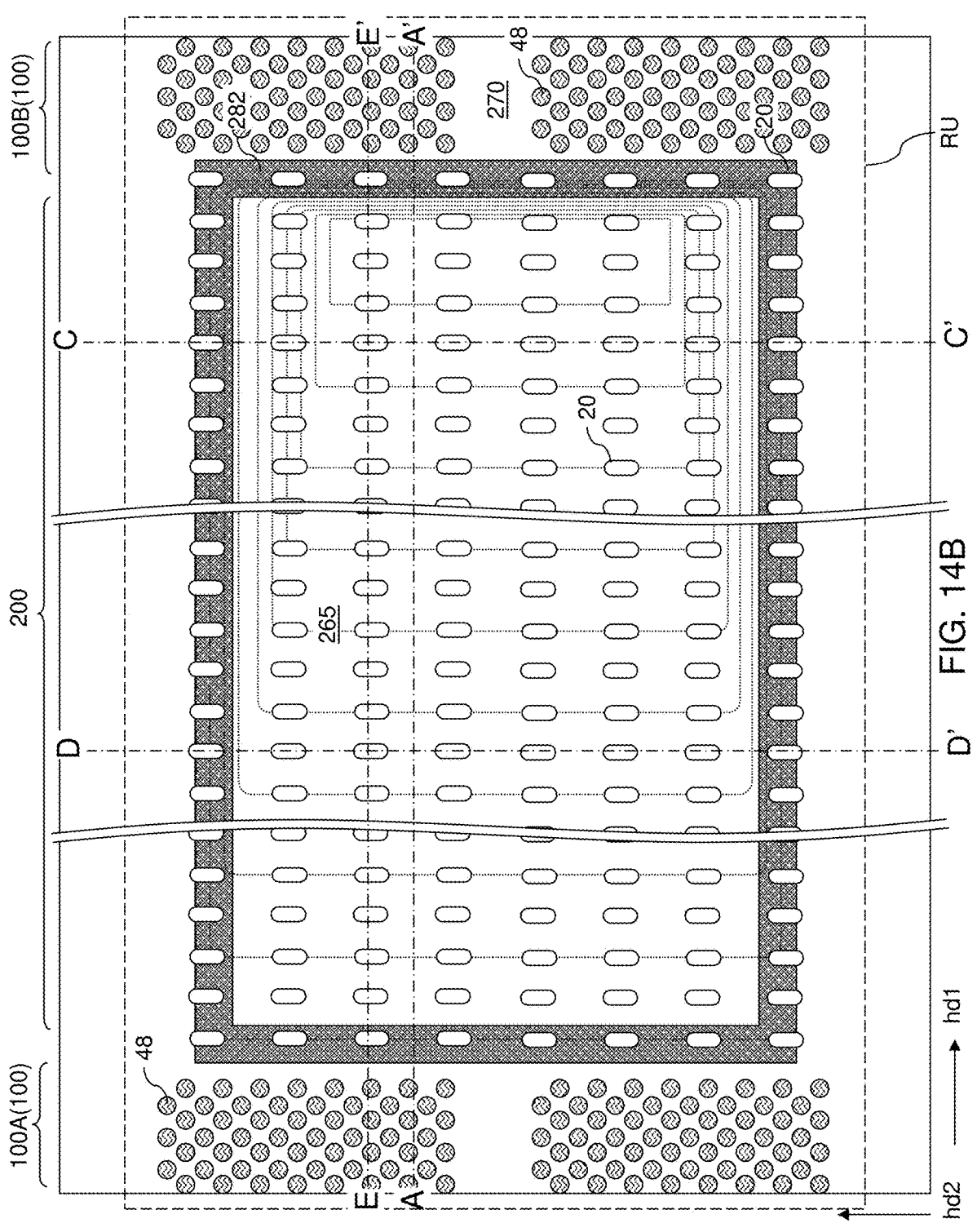
Figure 14C:
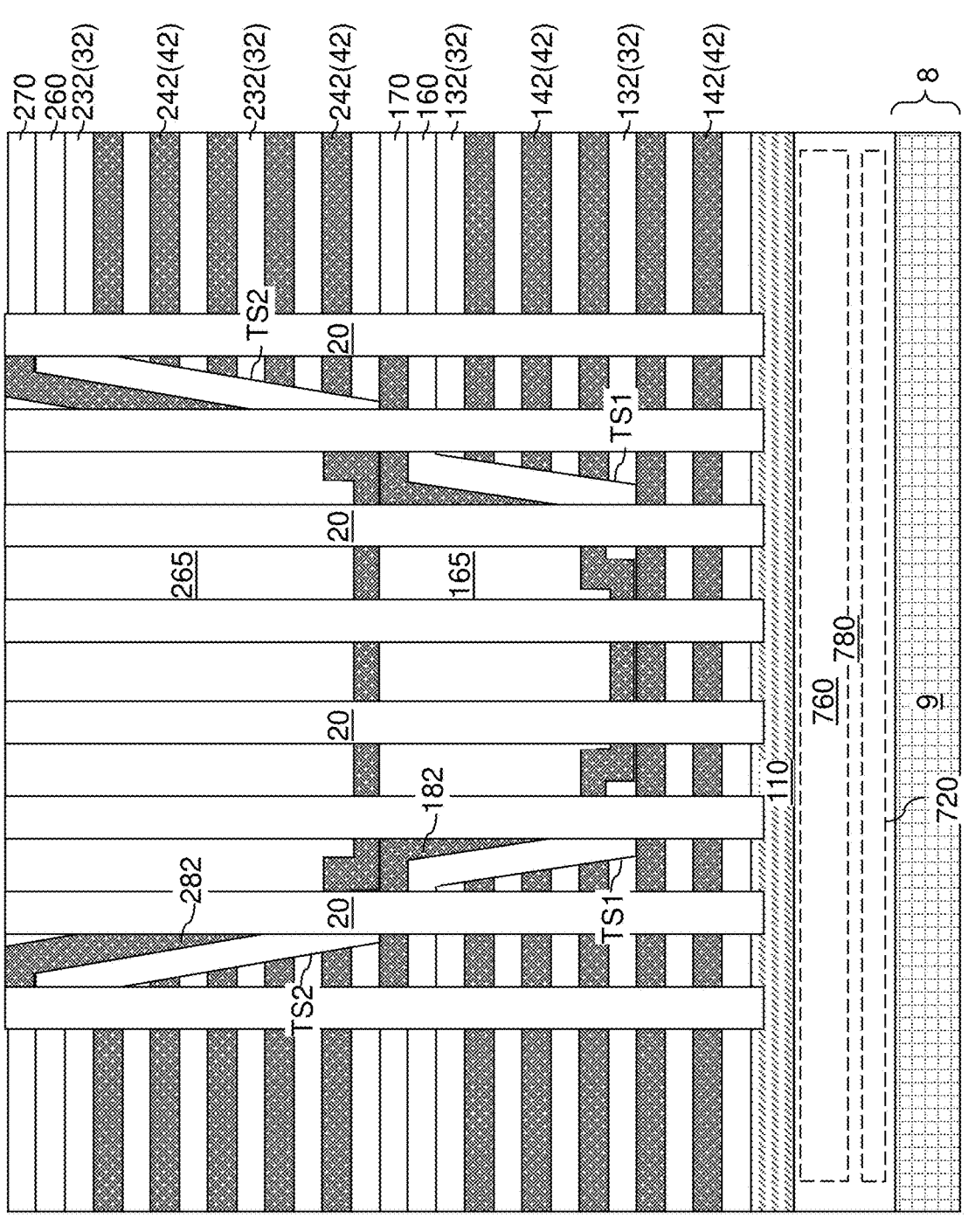
Figure 14D:
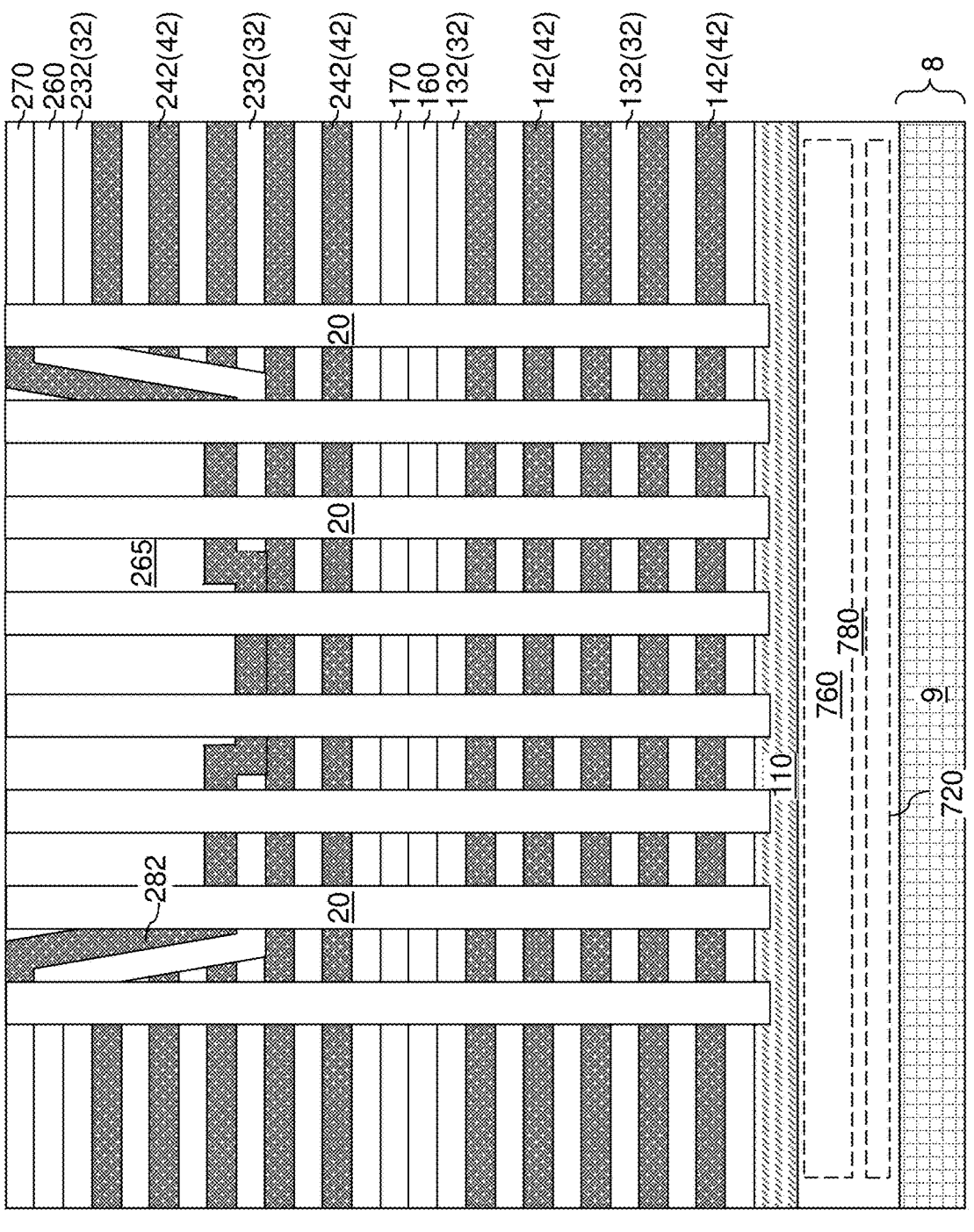
Figure 14E:
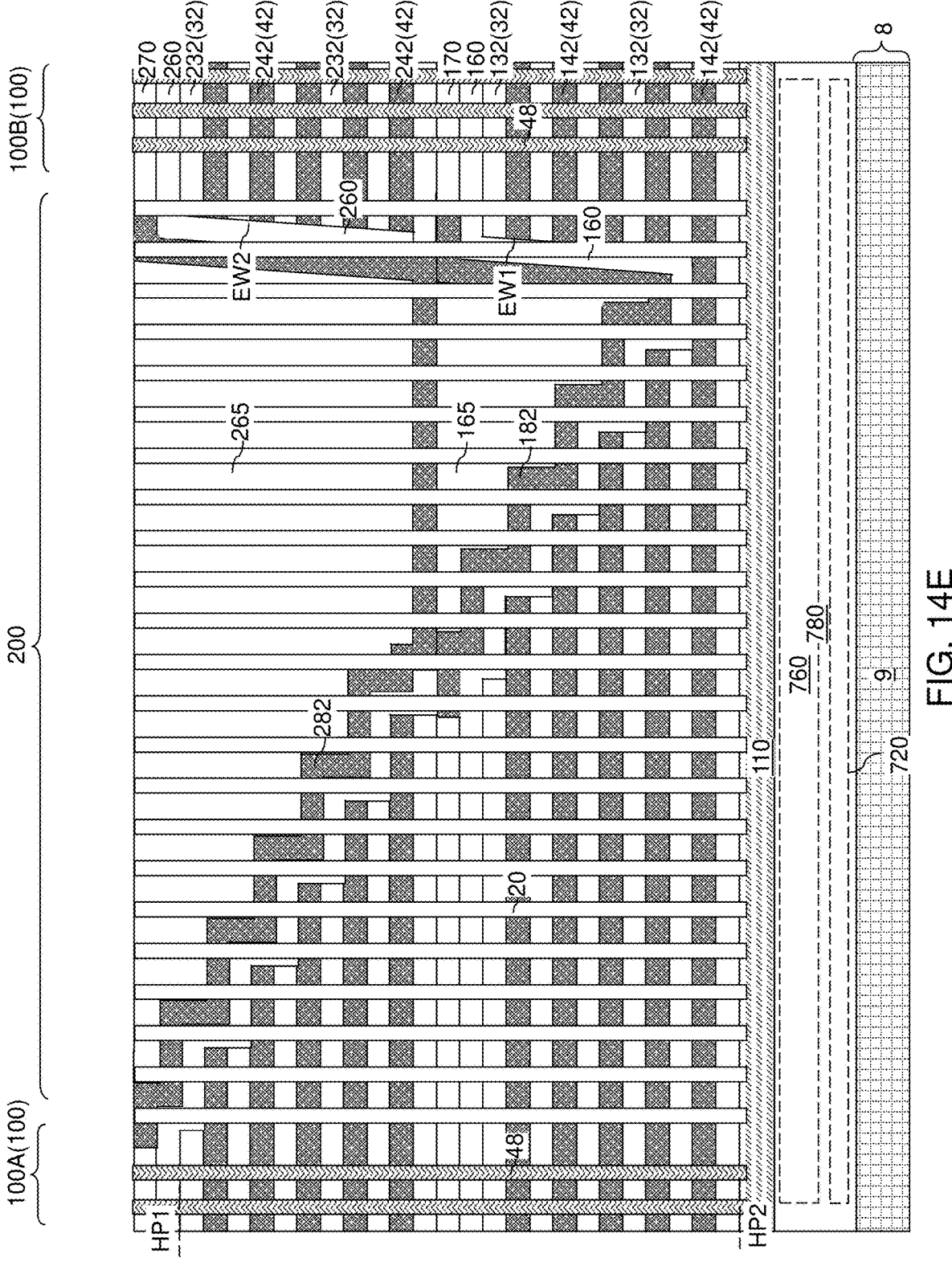
Figure 15A:
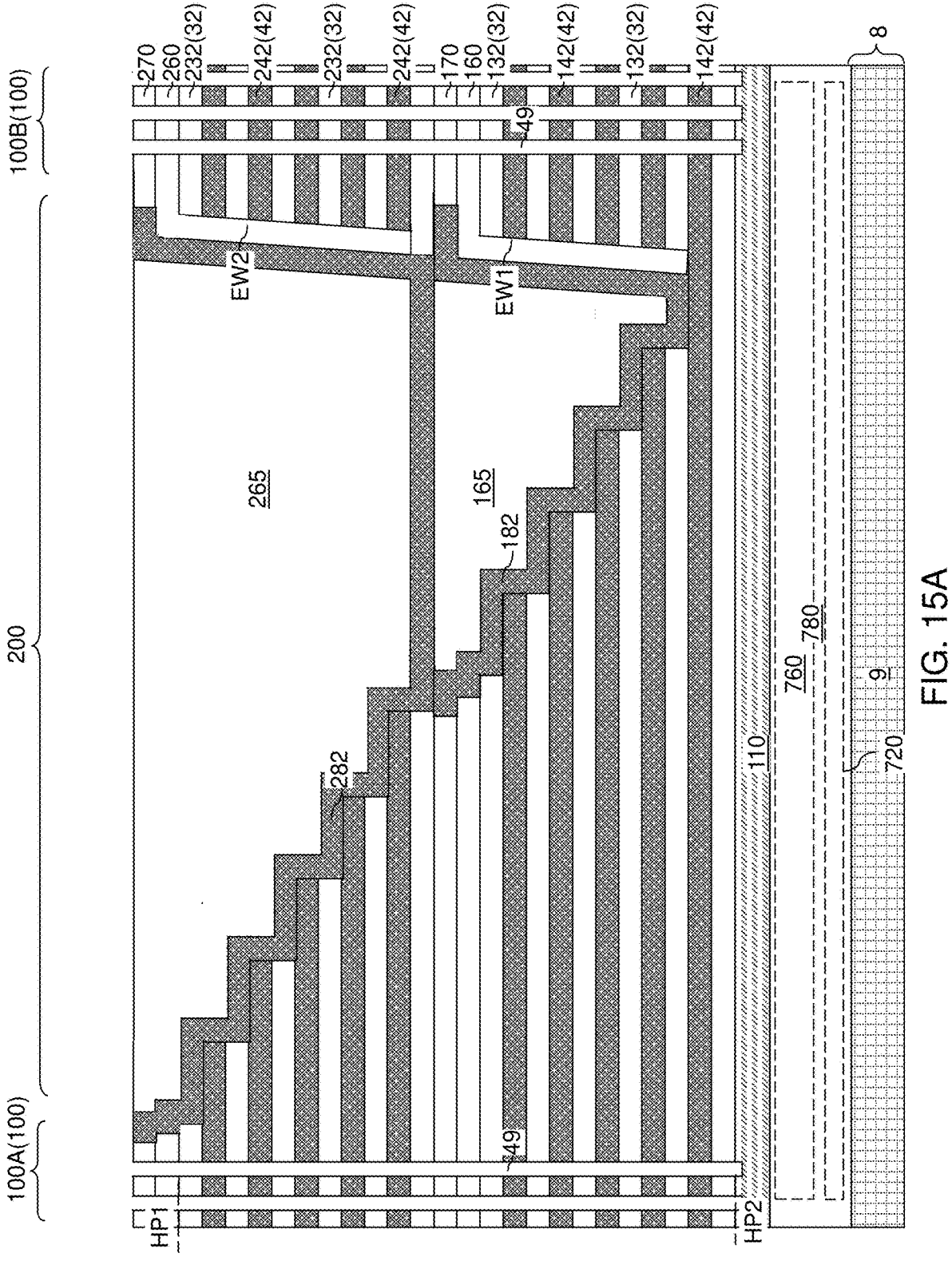
FIGS. 15A-15E are various views of the first exemplary structure after removal of the sacrificial memory opening fill structures according to an embodiment of the present disclosure.
Figure 15B:
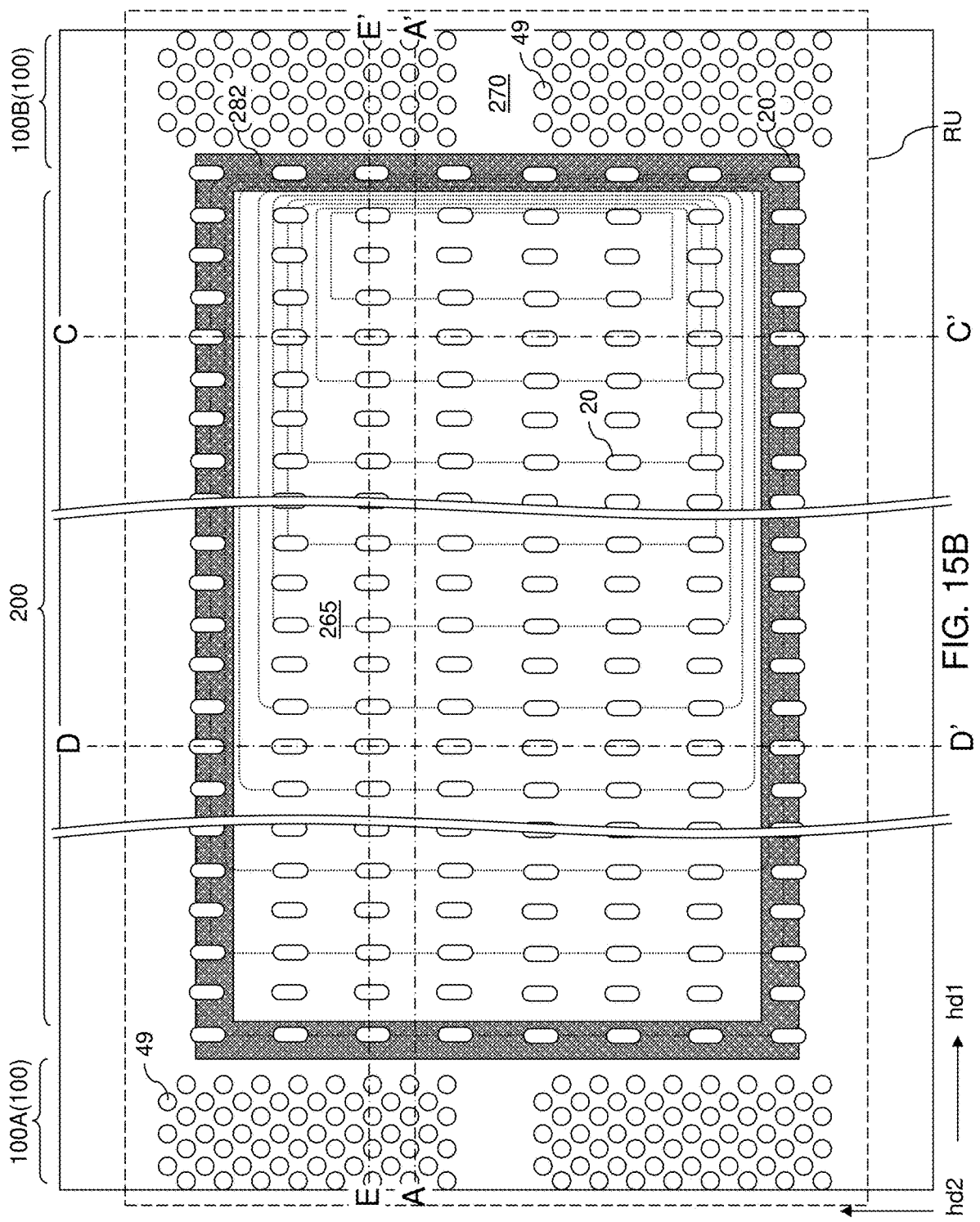
Figure 15C:
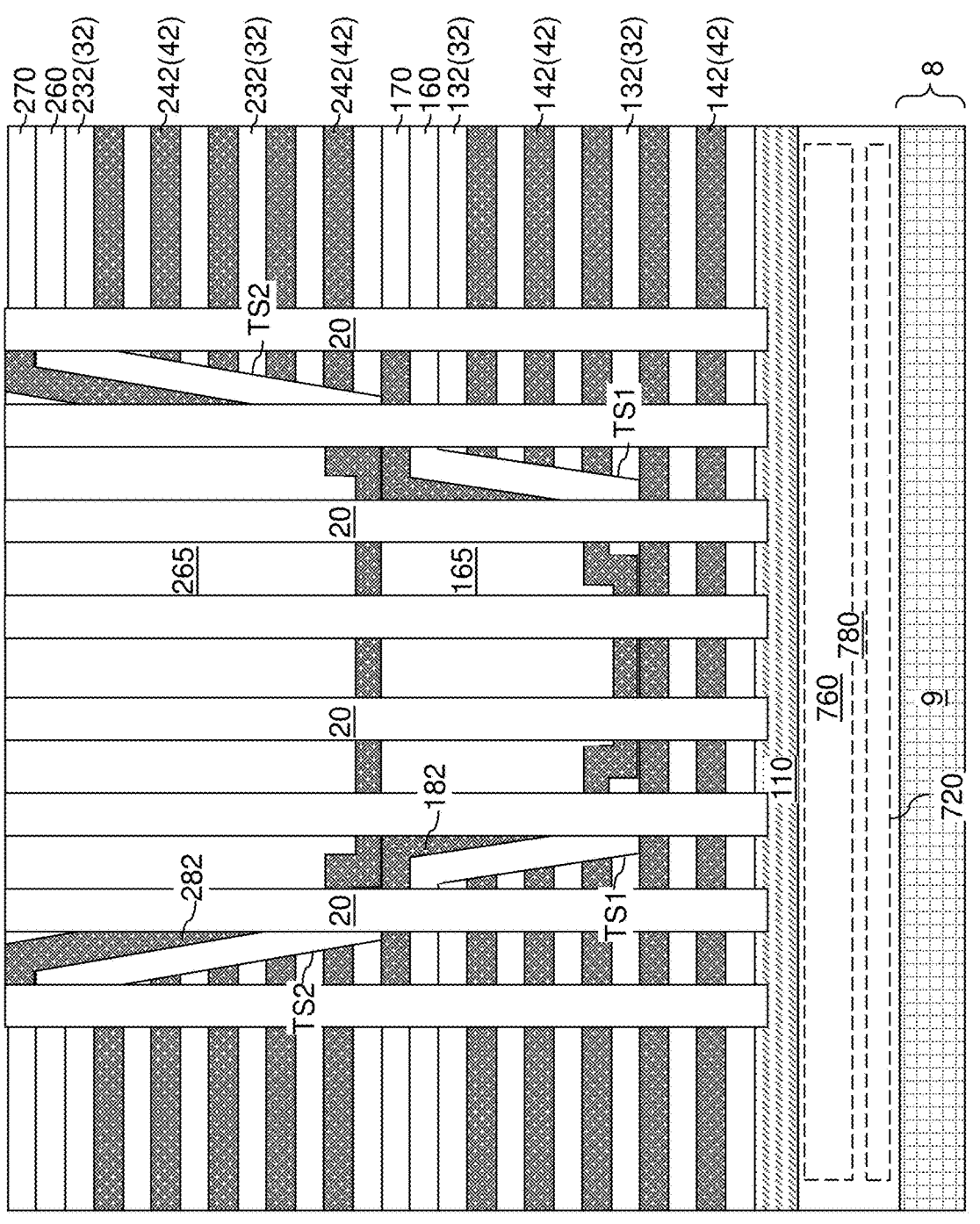
Figure 15D:
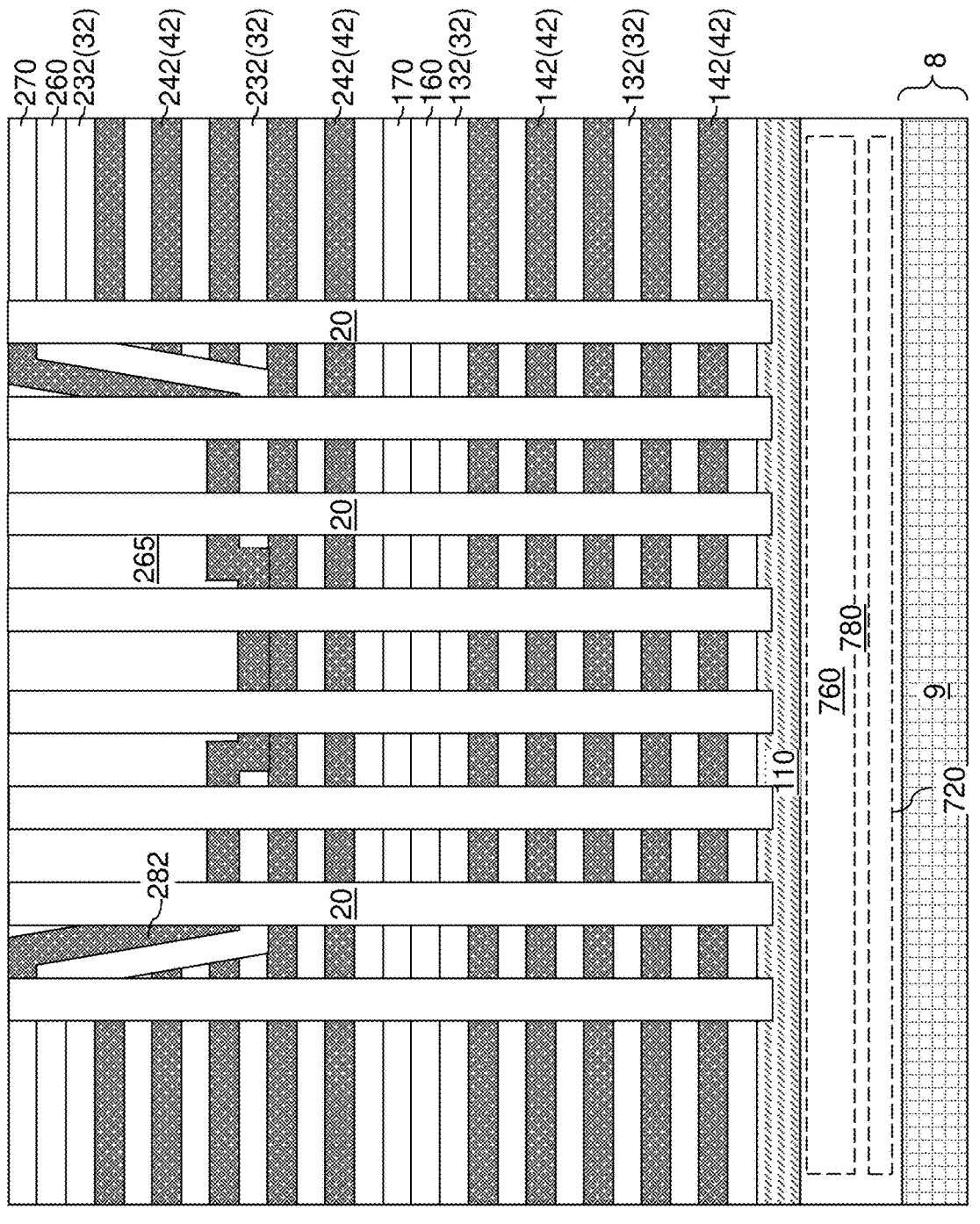
Figure 15E:
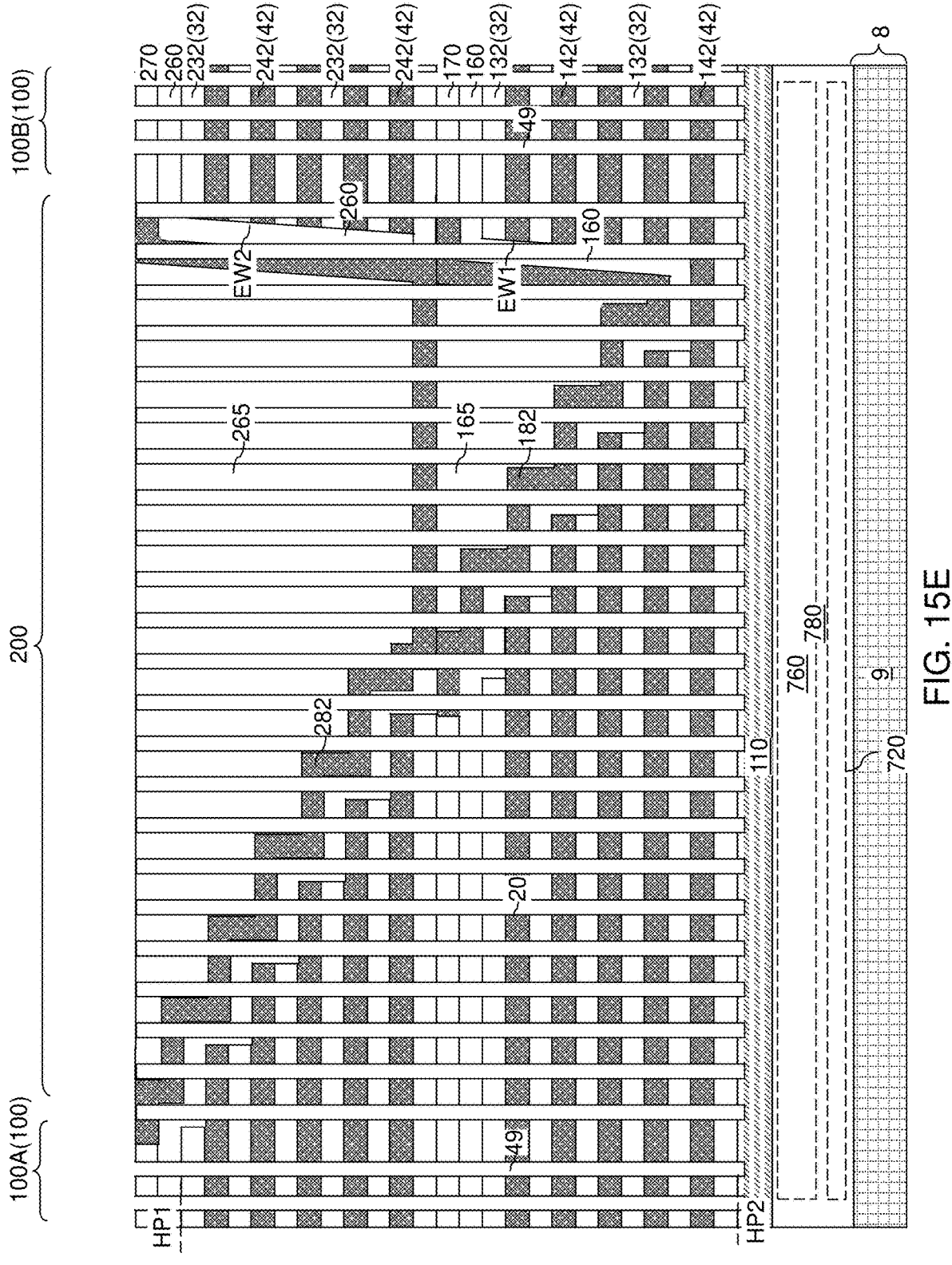

Within an area of each repetition unit RU, a second sacrificial liner 282 may be formed such that the entirety of the physically exposed sidewalls of the second sacrificial liner 282 is formed above the horizontal plane including the topmost surface of the second alternating stack (232, 242). In other words, the end portions of the second sacrificial liner 282 extend over the tapered sidewalls TS2 and over the top of the second alternating stack (232, 242) along the second horizontal direction hd2. Thus, the second sacrificial liner 282 may have a longer length along the second horizontal direction hd2 than the length of the underlying second cavity 269 along the second horizontal direction hd2. The second sacrificial liner 282 may have the same, shorter or longer length along the first horizontal direction hd1 compared to the length of the underlying second cavity 269 along the first horizontal direction hd1. The second cavity 269 is present within the volume that is laterally enclosed by the second sacrificial liner 282. The second sacrificial liner 282 can be formed directly on the physically exposed portion of the stepped surfaces S of the second alternating stack (232, 242) such that each second sacrificial layer 242 comprises a respective horizontal top surface segment HS2 that contacts a respective bottom surface segment BP1 of the second sacrificial liner 282, as shown in FIG. 10D. The second sacrificial liner 282 comprises a horizontally-extending top portion TP2 that overlies the second alternating stack (232, 242) and overlies a horizontally-extending top portion of the second insulating liner 260. In one embodiment, the second insulating liner 260 contacts the entirety of a pair of second tapered sidewalls TS2 and a second end wall EW2, and the second sacrificial liner 282 is spaced from the pair of second tapered sidewalls TS2 and the second end wall EW2 by the second insulating liner 260.

Referring to FIGS. 11A-11E, a second dielectric fill material, such as undoped silicate glass or a doped silicate glass, can be deposited over the second sacrificial liner 282 and the second alternating stack (232, 242) to fill the second cavity 269. A planarization process such as a chemical mechanical polishing process can be performed to remove portions of the second dielectric fill material from above the horizontal plane including the topmost surface of the second sacrificial liner 282. The second sacrificial liner 282 may be employed as an endpoint detection structure and/or as a planarization stopping structure. Each remaining portion of the second dielectric fill material that fills a respective second cavity 269 constitutes a second dielectric fill structure 265. A continuous remaining portion the second dielectric fill material that overlies the top surface of the horizontally-extending portion of the second insulating liner 260 above the second alternating stack (232, 242) constitutes a second insulating cap layer 270. A second-tier structure is thus formed over the first-tier structure. The second-tier structure comprises all material portions that are located above the first-tier structure at this processing step.

Referring to FIGS. 12A-12E, a second etch mask layer (not shown) can be formed over the second insulating cap layer 270 and the second dielectric fill structures 265, and can be lithographically patterned to form various discrete openings therein. The pattern of the openings in the second etch mask layer can be the same as the pattern of the first-tier memory openings 149 and the first-tier support openings 119. A second anisotropic etch process can be performed to transfer the pattern of the discrete openings in the second etch mask layer through the second insulating cap layer 270, the second alternating stack (232, 242), and the second dielectric fill structures 265. Various openings can be formed through the second insulating cap layer 270, the second alternating stack (232, 242), and the second dielectric fill structures 265. The various openings may comprise second-tier memory openings 249 that are formed in the memory array regions 100, and second-tier support openings 219 that are formed in the contact region 200. Each of the second-tier memory openings 249 can be formed directly on a top surface of a respective one of the first-tier sacrificial memory opening fill portions 148. Each of the second-tier support openings 219 can be formed directly on a top surface of a respective one of the first-tier sacrificial support opening fill portions 118.

The second-tier memory openings 249 may comprise rows of second-tier memory openings 249 that are arranged along the first horizontal direction hd1 and laterally spaced apart along the second horizontal direction hd2. Each area of a memory array region 100 located within a repetition unit RU includes a respective two-dimensional array of second-tier memory openings 249 that are arranged as a cluster. Neighboring clusters of second-tier memory openings 249 may be laterally spaced apart along the second horizontal direction hd2.

In one embodiment, the second-tier support openings 219 in the contact region 200 may be arranged as two-dimensional periodic arrays of second-tier support openings 219 located within a respective one of the repetition units RU. In one embodiment, each two-dimensional periodic array of second-tier support openings 219 may be a respective rectangular periodic array of second-tier support openings 219.

In one embodiment, the second-tier support openings 219 in the contact region 200 may be elongated along the second horizontal direction hd2. In another embodiment, the second-tier support openings 219 in the contact region 200 may have a circular horizontal cross-section. In one embodiment, columns of second-tier support openings 219 arranged along the second horizontal direction hd2 may cut through a respective vertically-extending straight surface segment of a stepped bottom surface of the second alternating stack (232, 242). The vertically-extending straight surface segment can be perpendicular to the first horizontal direction hd1.

The first-tier sacrificial memory opening fill structures 148 and the first-tier sacrificial support opening fill structures 118 can be subsequently removed by ashing or selective etching selective to the materials of the first alternating stack (132, 142), the second alternating stack (232, 242), the dielectric fill structures (165, 265), the insulating liners (160, 260), the sacrificial liners (182, 282), and the semiconductor material layer 110. A multi-tier memory opening 49, which is also referred to as a memory opening 49, are formed in each contiguous volume that includes a volume of a second-tier memory opening 249 and a volume of a first-tier memory opening 149. A multi-tier support opening 19, which is also referred to as a support opening 19, is formed in each continuous volume that includes a volume of a second-tier support opening 219 and a volume of a first-tier support opening 119.

Referring to FIGS. 13A-13E, a sacrificial fill material, such as amorphous carbon or amorphous silicon can be deposited in the memory openings 49 and in the support openings 19. Excess portions of the sacrificial fill material can be removed from above the horizontal plane including the top surface of the second insulating cap layer 270. Each remaining portion of the sacrificial fill material that fills a respective memory opening 49 constitutes a sacrificial memory opening fill structure 48. Each remaining portion of the sacrificial fill material that fills a respective support opening 19 constitutes a sacrificial support opening fill structure 18. The sacrificial support opening fill structures 18 may be arranged as columns of sacrificial support opening fill structures 18 that extend through a respective vertically-extending sidewall of the stepped surfaces of the alternating stack (32, 42) that is perpendicular to the first horizontal direction hd1. Alternatively, instead of removing the first-tier sacrificial memory opening fill structures 148 and the first-tier sacrificial support opening fill structures 118 at the step shown in FIGS. 12A-12E, additional sacrificial fill material may be deposited into the second-tier memory openings 249 and the second-tier support openings 219 over the respective first-tier sacrificial memory opening fill structures 148 and the first-tier sacrificial support opening fill structures 118 to form the above described sacrificial memory opening fill structures 48 and sacrificial support opening fill structures 18.

Referring to FIGS. 14A-14E, a sacrificial etch mask layer (not shown) can be applied over the first exemplary structure, and can be lithographically patterned to cover the memory array regions 100 without covering the contact region 200. The sacrificial etch mask layer may comprise a silicon oxide layer or a silicon nitride layer having a thickness in a range from 10 m to 50 nm, although lesser and greater thicknesses may also be employed. The sacrificial opening fill structures 18 can be removed from inside the volumes of the support openings 19, for example, by ashing or selective etching.

A dielectric fill material, such as silicon oxide, can be deposited in the voids within the support openings 19. Excess portions of the dielectric fill material can be removed from above the horizontal plane including the top surface of the second insulating cap layer 270 by performing a planarization process such as a chemical mechanical polishing process or a recess etch process. The sacrificial etch mask layer can be collaterally removed during removal of the dielectric fill material from above the horizontal plane including the top surface of the second insulating cap layer 270. Each remaining portion of the dielectric fill material that fills the support openings 19 constitutes a support pillar structure 20. In one embodiment, a two-dimensional array of support pillar structures 20 may be formed in the contact region 200. The two-dimensional array of support pillar structures 20 may comprise columns of support pillar structures 20 each arranged along the second horizontal direction hd2 and vertically extending through a respective vertically-extending planar surface of the stepped surfaces of the first alternating stack (132, 142) or the second alternating stack (232, 242) that is perpendicular to the first horizontal direction hd1. At this processing step, the first sacrificial liner 182 is a unitary structure (i.e., a single continuous structure in which each point can be continuously connected to any other point through a respective path contained entirely within the volume of the single continuous structure) through which columns of support pillar structures 20 vertically extend. Likewise, the second sacrificial liner 282 is a unitary structure through which columns of support pillar structures 20 vertically extend.

Referring to FIGS. 15A-15E, the sacrificial memory opening fill structures 48 can be removed from inside the memory openings 49, for example, by performing an ashing process or a selective etching process. Cavities are formed in the volumes of the memory openings 49.

FIGS. 16A-16F are sequential vertical cross-sectional views of a multi-tier memory opening 49 during formation of a memory opening fill structure 58 according to an embodiment of the present disclosure.

Figures 16A, 16B:
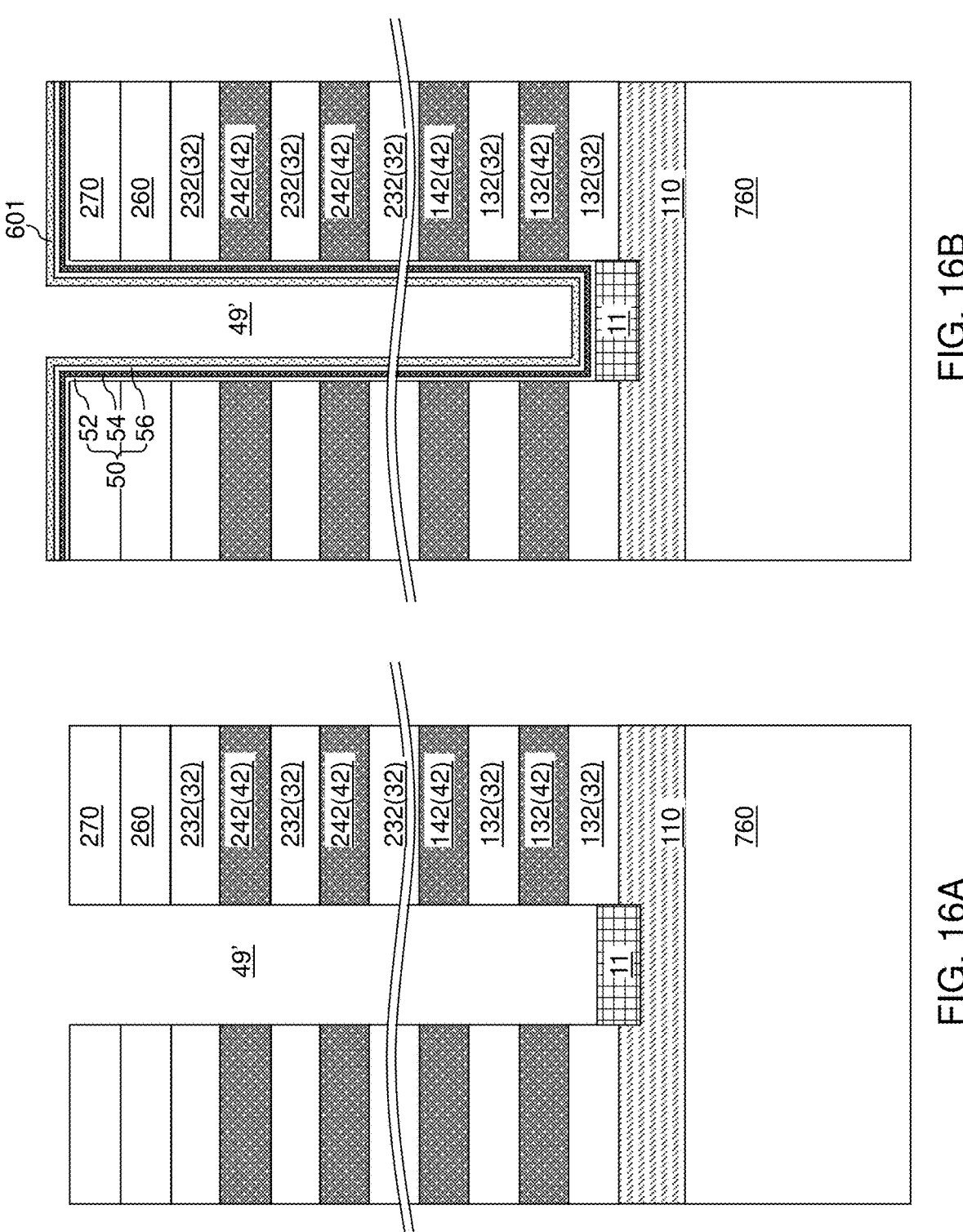
FIGS. 16A-16F are sequential vertical cross-sectional views of a multi-tier memory opening during formation of a memory opening fill structure according to an embodiment of the present disclosure.

Referring to FIG. 16A, a memory opening 49 is illustrated after removal of a sacrificial memory opening fill structure 48. The memory opening 49 extends through the alternating stack {(132, 142), (232, 242)} and optionally into an upper portion of the semiconductor material layer 110. The recess depth of the bottom surface of each memory opening 49 with respect to the top surface of the semiconductor material layer 110 can be in a range from 0 nm to 30 nm, although greater recess depths can also be employed. Optionally, the sacrificial material layers 42 can be laterally recessed partially to form laterally-extending cavities (not shown), for example, by an isotropic etch.

An optional pedestal channel portion 11 (which may be a silicon pedestal) can be formed at the bottom portion of each memory opening 49, for example, by a selective semiconductor deposition process. In one embodiment, the pedestal channel portion 11 can be doped with electrical dopants of the same conductivity type as the semiconductor material layer 110, which is a first conductivity type. In one embodiment, the top surface of each pedestal channel portion 11 can be formed below a horizontal plane including the top surface of the bottommost insulating layer 32. The pedestal channel portion 11 can be a portion of a transistor channel that extends between a source region to be subsequently formed in the semiconductor material layer 110 and a drain region to be subsequently formed in an upper portion of the memory opening 49. A memory cavity 49' is present in the unfilled portion of the memory opening 49 above the pedestal channel portion 11.

Referring to FIG. 16B, a stack of layers including a blocking dielectric layer 52, a memory material layer 54, and an optional dielectric liner 56 can be deposited in each memory opening 49. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within laterally-extending cavities into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise vertical stack of memory elements that are located at levels of the sacrificial material layers 42. For example, the vertical stack of memory elements may be embodied as annular portions of the memory material layer 54 located at levels of the sacrificial material layers 42.

The optional dielectric liner 56, if present, comprises a dielectric liner material. In one embodiment, the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed.

Figures 16C, 16D:
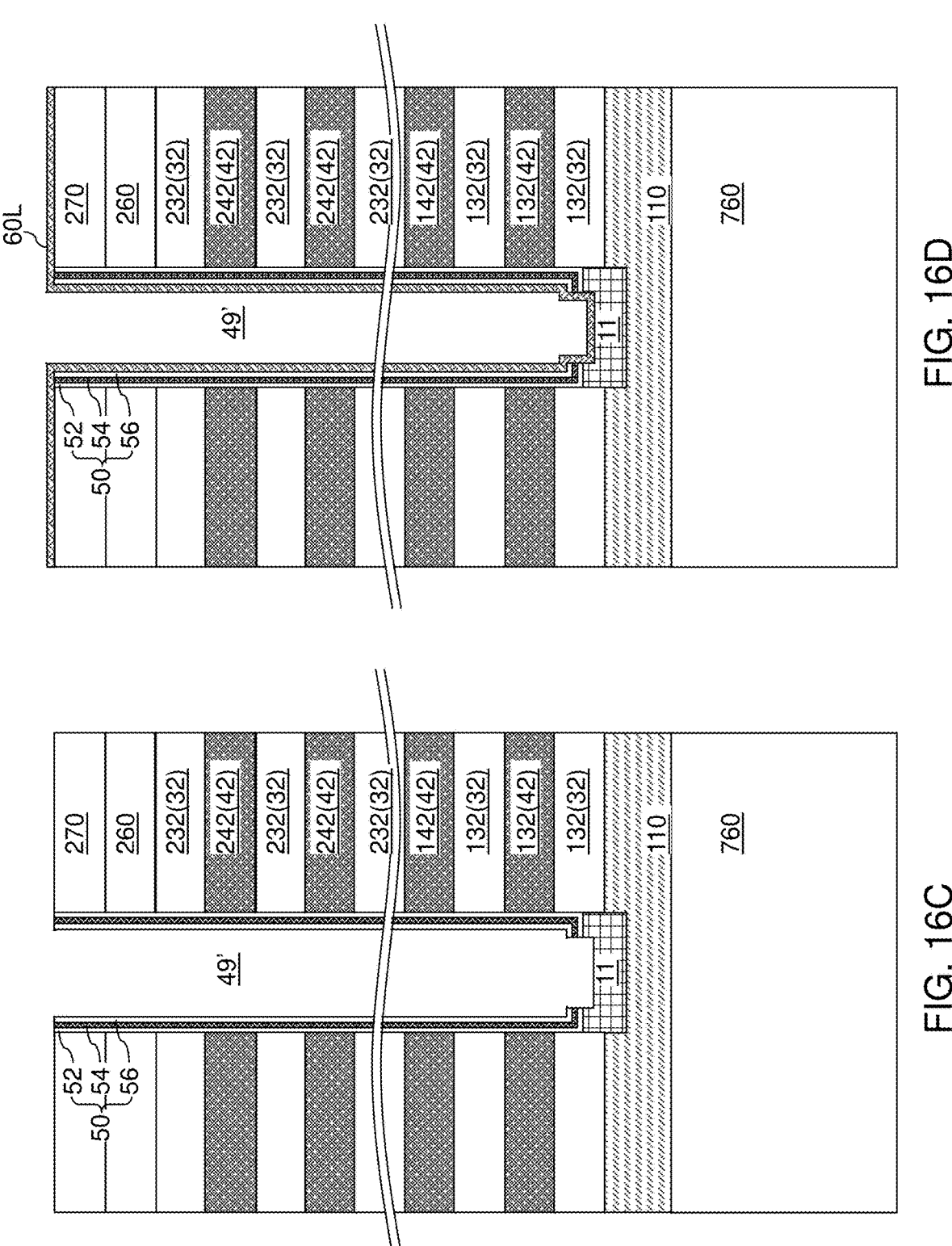

Optionally, a sacrificial cover material layer 601 may be formed over the memory film 50. Referring to FIG. 16C, the optional sacrificial cover material layer 601, the dielectric liner 56, the memory material layer 54, the blocking dielectric layer 52 are sequentially anisotropically etched employing at least one anisotropic etch process. The portions of the sacrificial cover material layer 601, the dielectric liner 56, the memory material layer 54, and the blocking dielectric layer 52 located above the top surface of the second insulating cap layer 270 can be removed by the at least one anisotropic etch process.

Further, the horizontal portions of the sacrificial cover material layer 601, the dielectric liner 56, the memory material layer 54, and the blocking dielectric layer 52 at a bottom of each memory cavity 49' can be removed to form openings in remaining portions thereof. Each of the sacrificial cover material layer, the dielectric liner 56, the memory material layer 54, and the blocking dielectric layer 52 can be etched by a respective anisotropic etch process employing a respective etch chemistry, which may or may not be the same for the various material layers.

Each remaining portion of the sacrificial cover material layer 601, if employed, can have a tubular configuration. A surface of the pedestal channel portion 11 (or a surface of the semiconductor material layer 110 in case a pedestal channel portions 11 is not employed) can be physically exposed underneath the opening through the sacrificial cover material layer, the dielectric liner 56, the memory material layer 54, and the dielectric metal oxide blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 110 in case pedestal channel portions 11 are not employed) by a recess distance.

In one embodiment, the sacrificial cover material layer 601, the dielectric liner 56, the memory material layer 54, and the blocking dielectric layer 52 can have vertically coincident sidewalls. The sacrificial cover material layer 601 can be subsequently removed selective to the material of the dielectric liner 56. In case the sacrificial cover material layer 601 includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer 601 may be retained in the final device if it comprises a silicon material.

Referring to FIG. 16D, a semiconductor channel layer 60L can be deposited directly on the semiconductor surface of the pedestal channel portion 11 or the semiconductor material layer 110 if the pedestal channel portion 11 is omitted, and directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 110 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figures 16E, 16F:
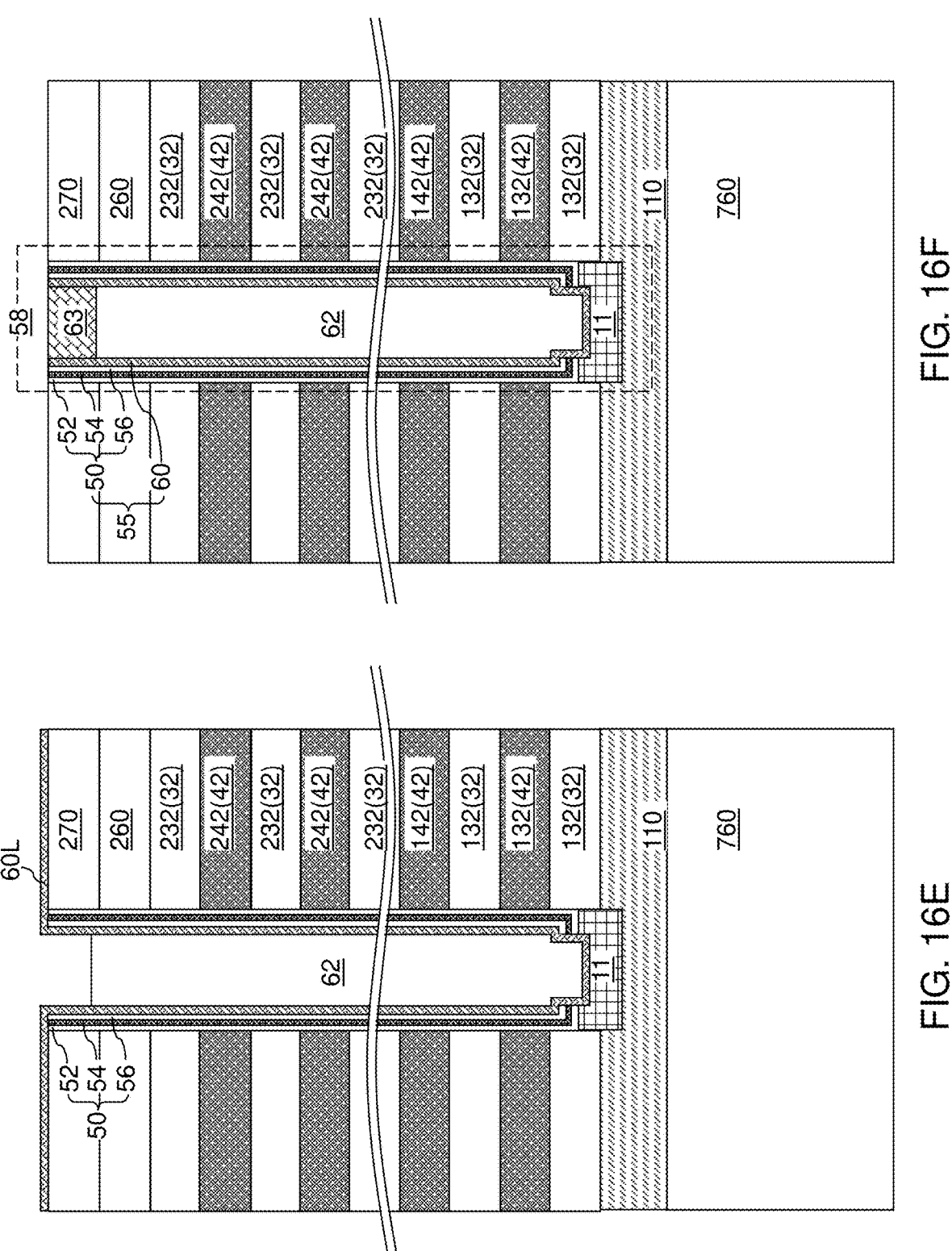
Figure 17A:
FIGS. 17A-17G are various views of the first exemplary structure after formation of memory opening fill structures according to an embodiment of the present disclosure.
Figure 17B:
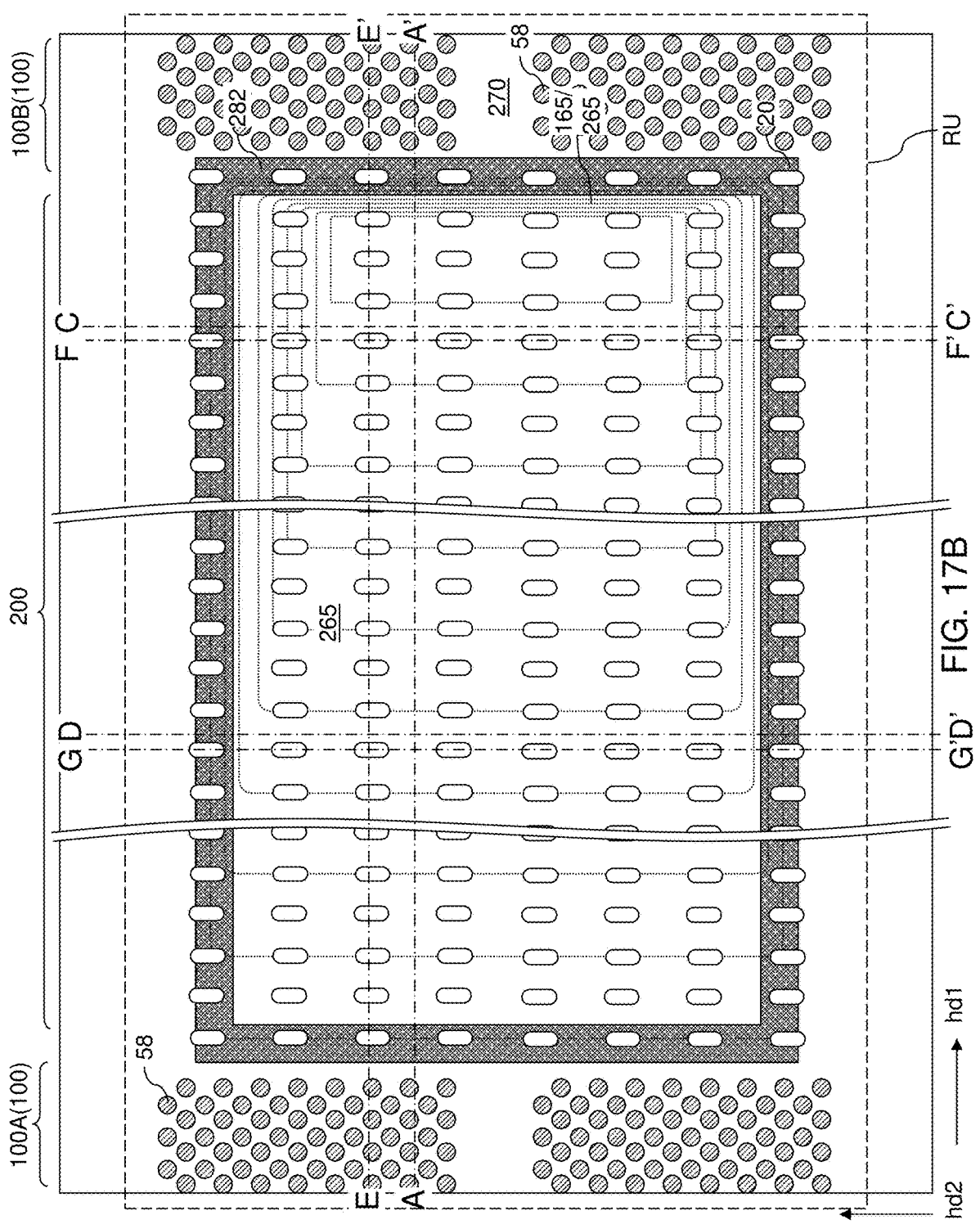
Figure 17C:
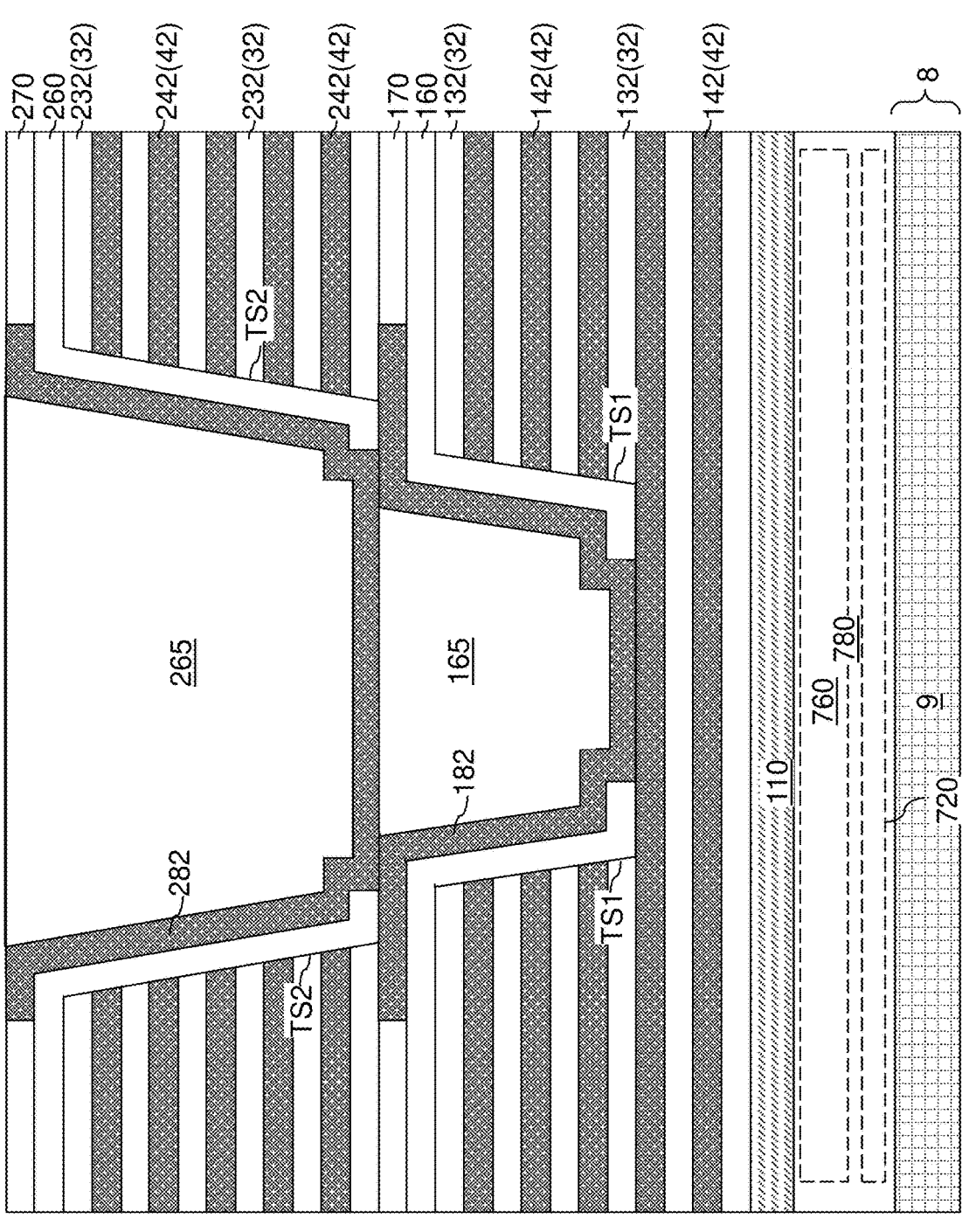
Figure 17D:
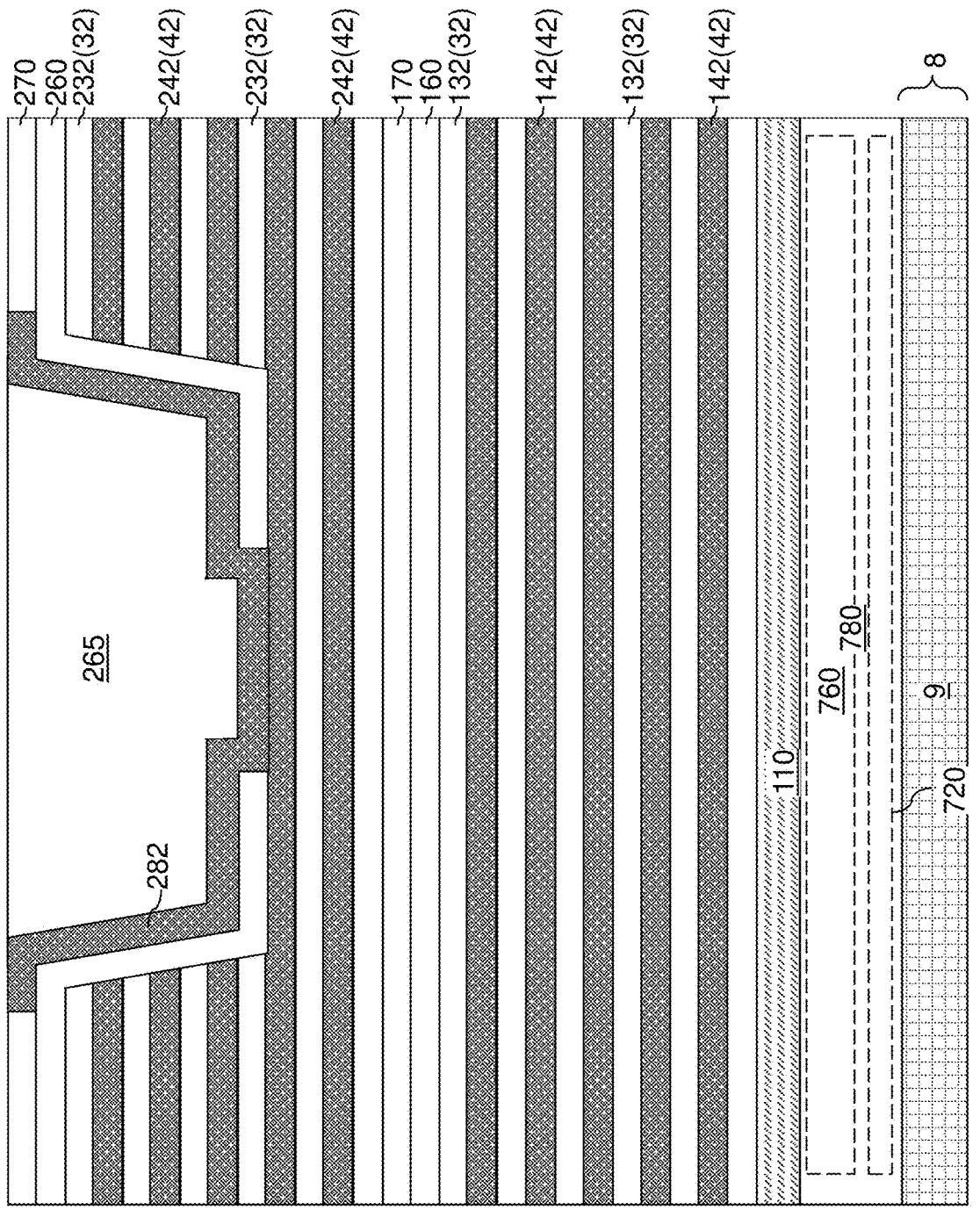
Figure 17E:
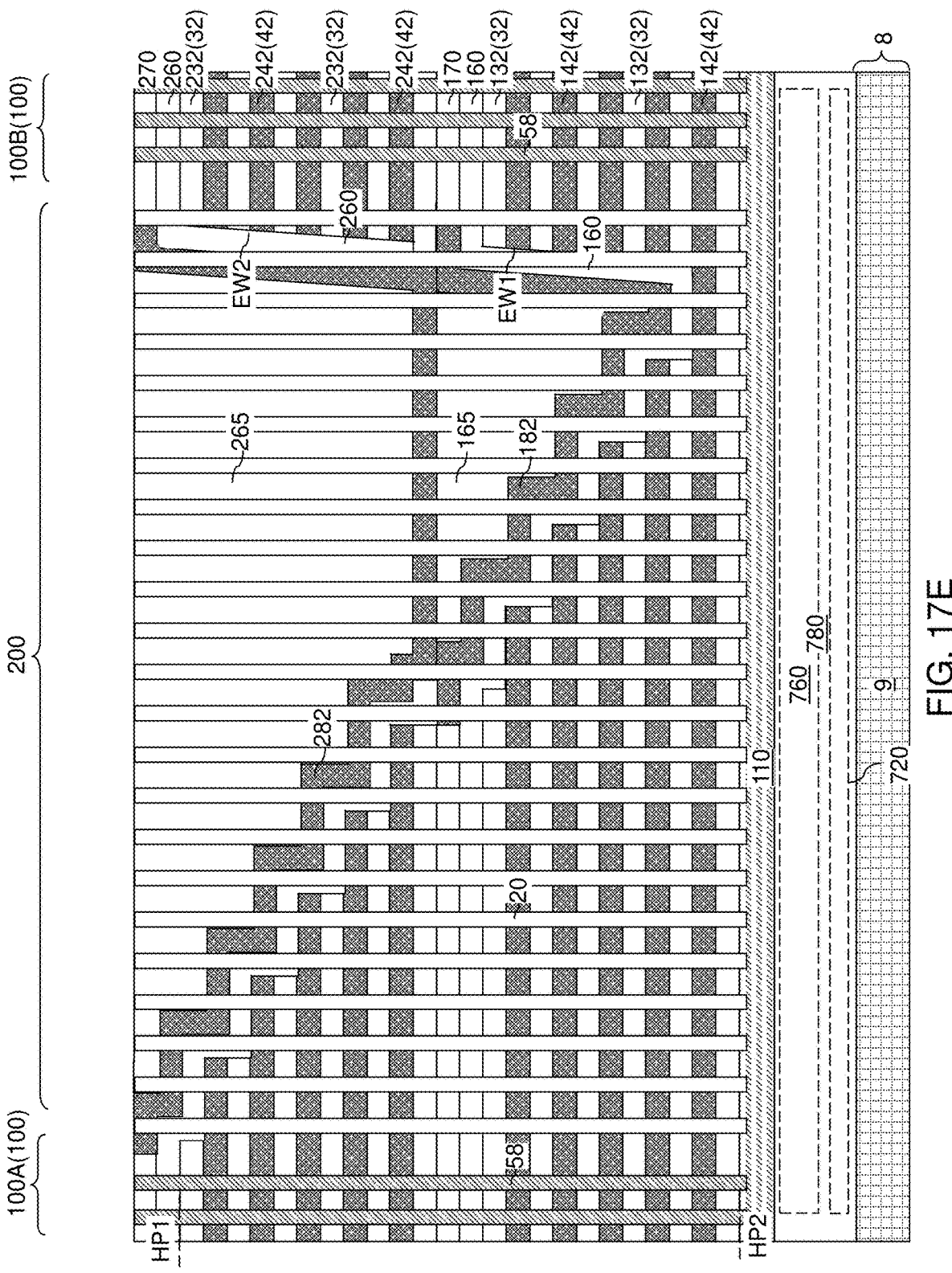
Figure 17F:
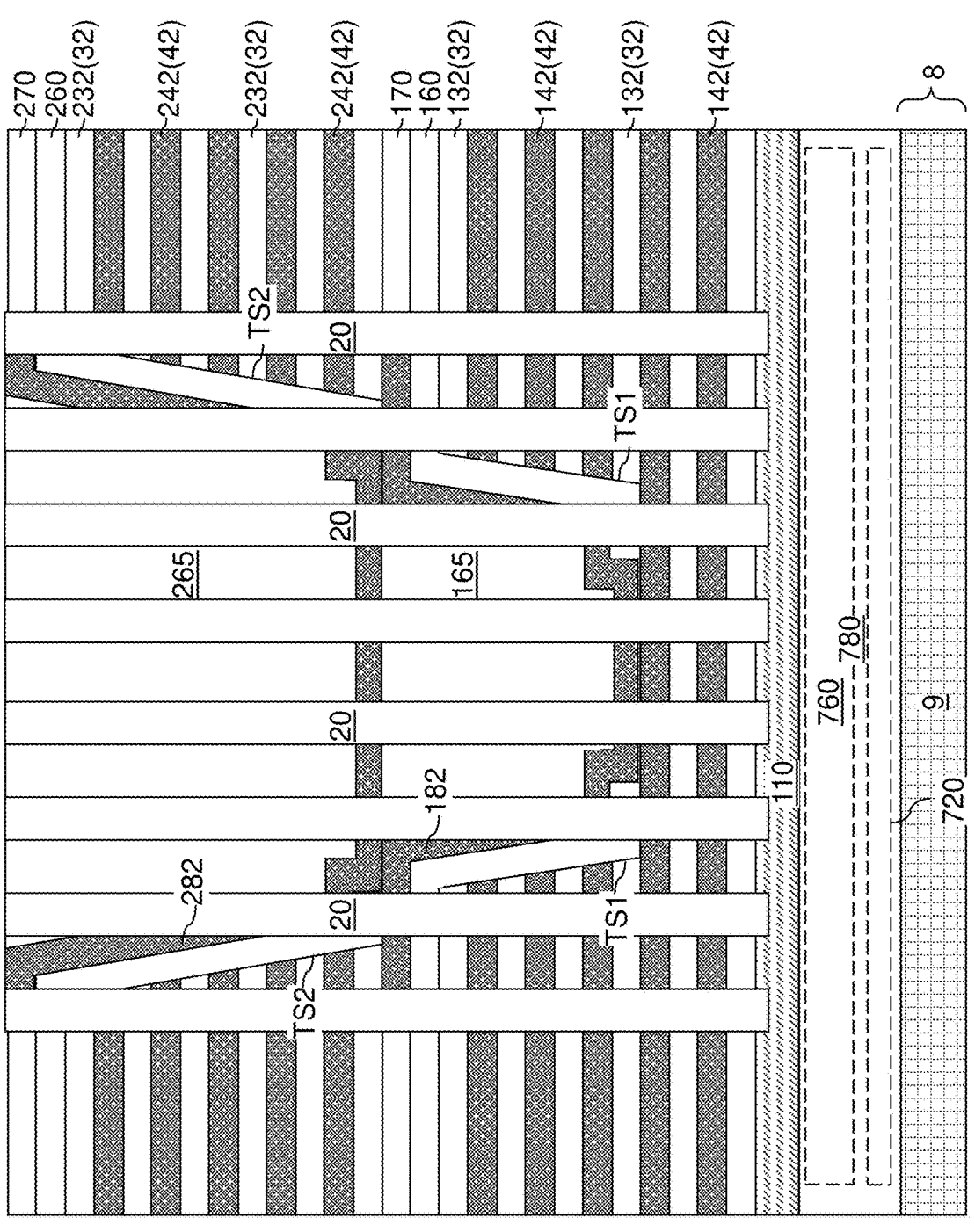
Figure 17G:
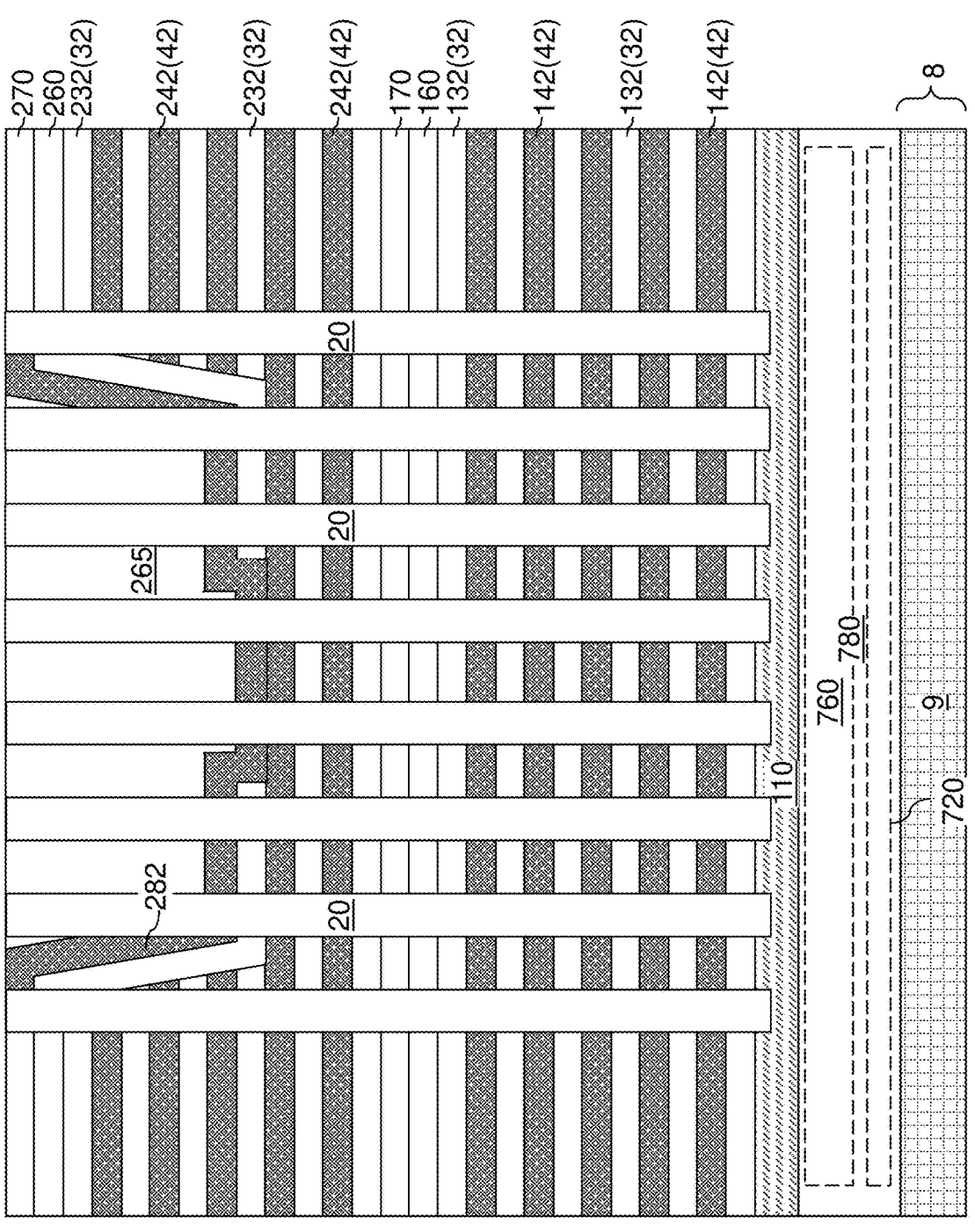
Figure 18A:
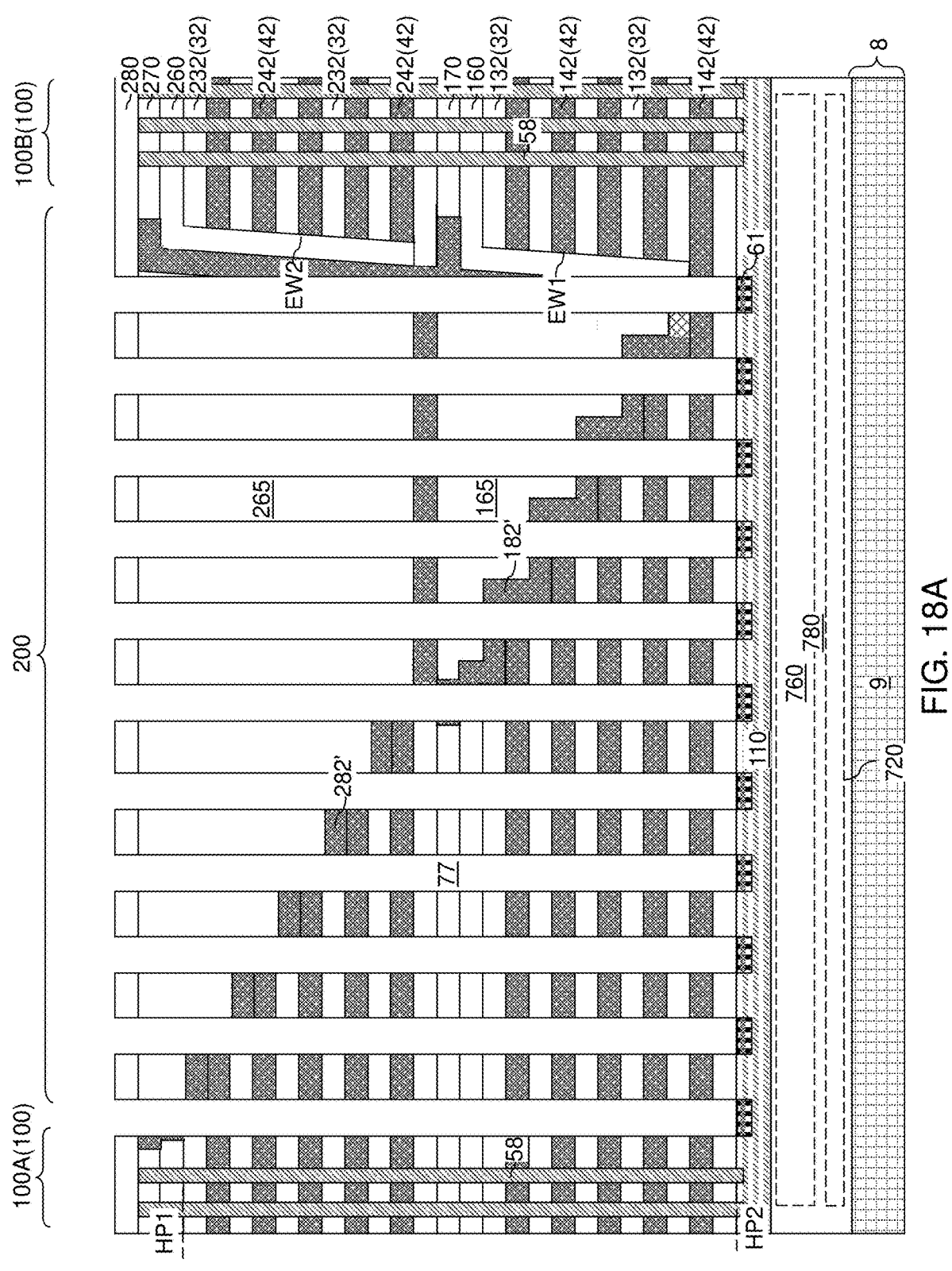
FIGS. 18A-18I are various views of the first exemplary structure after formation of lateral isolation trenches and isolation cavities according to an embodiment of the present disclosure.
Figure 18B:
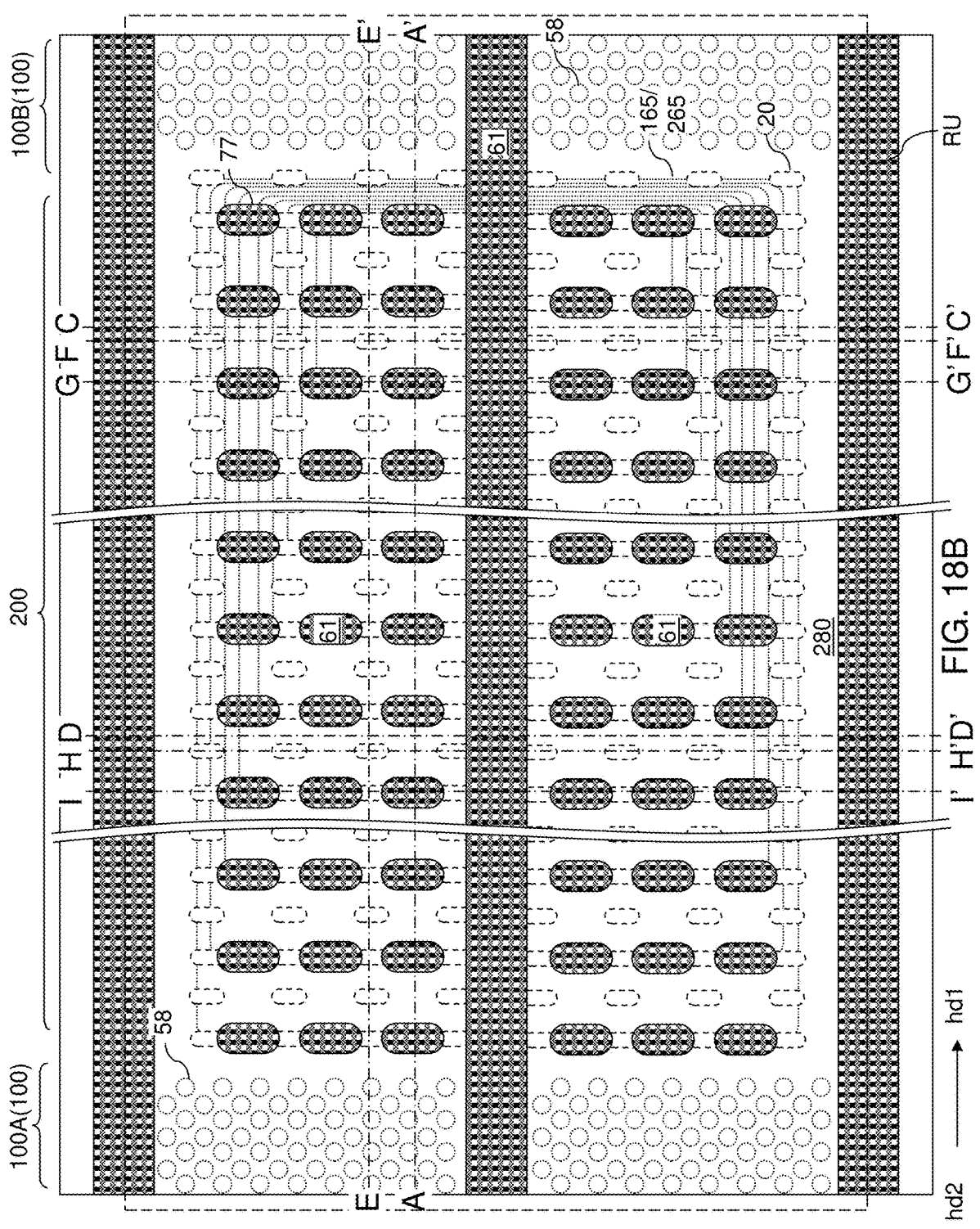
Figure 18C:
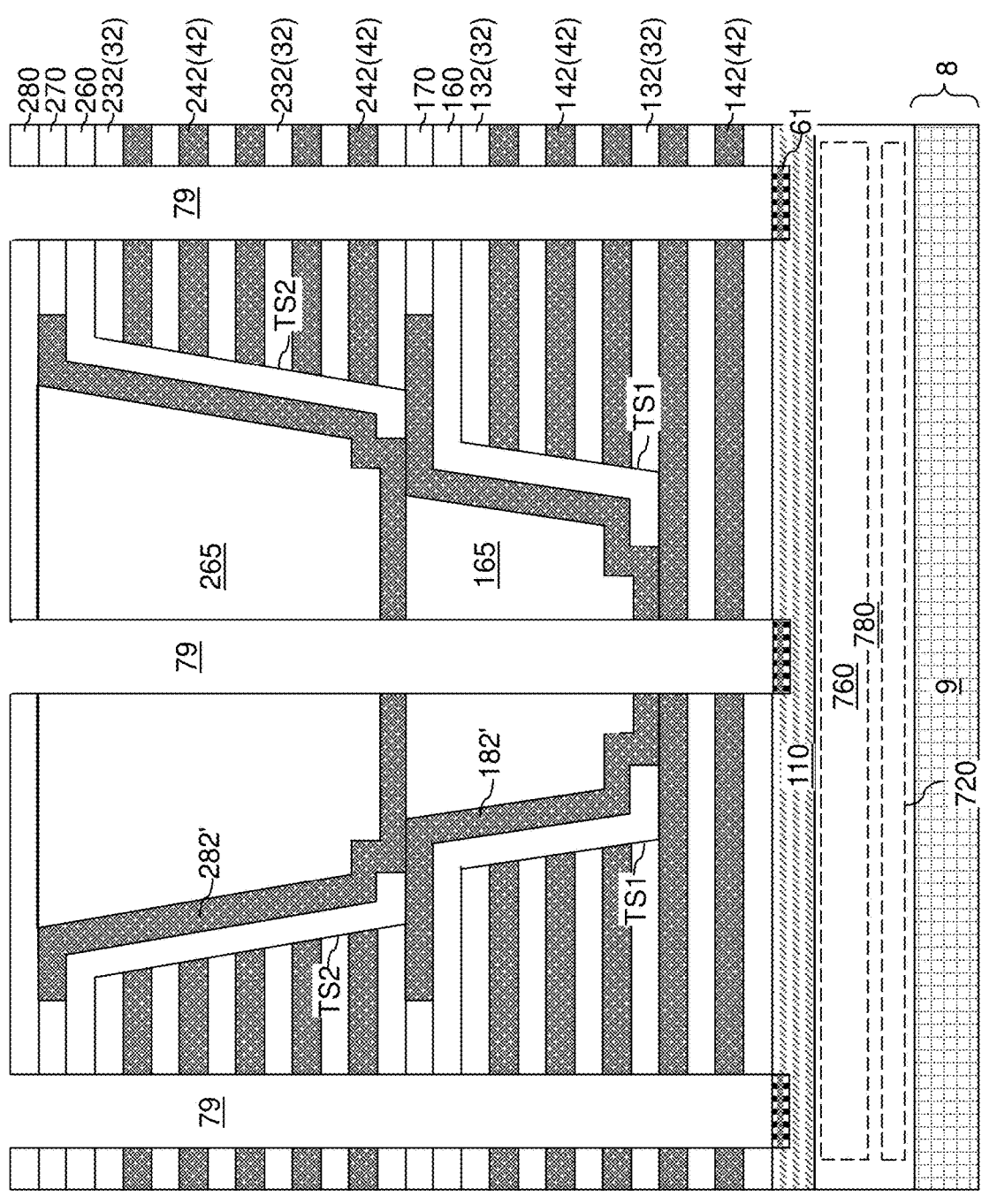
Figure 18D:
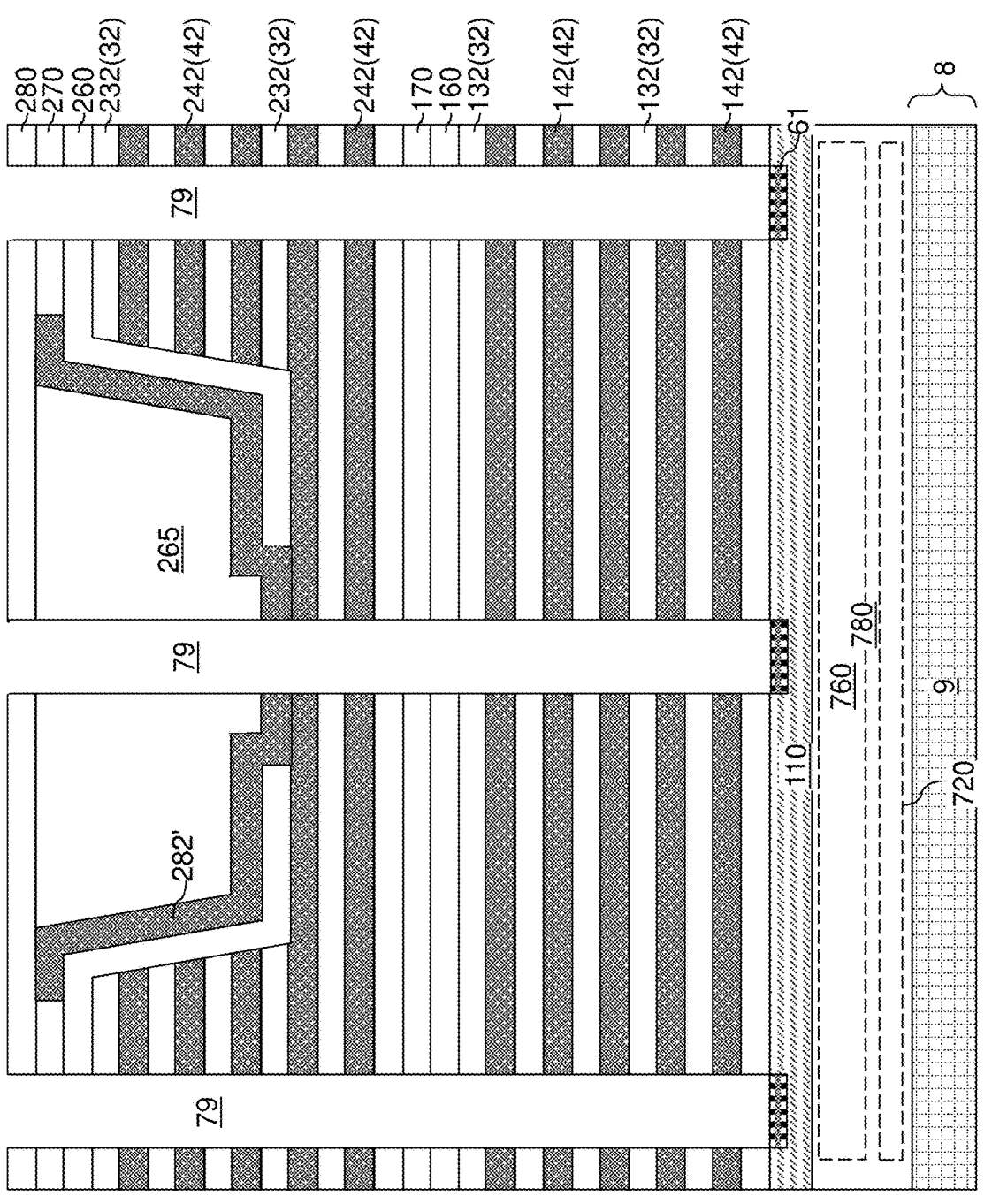
Figure 18E:
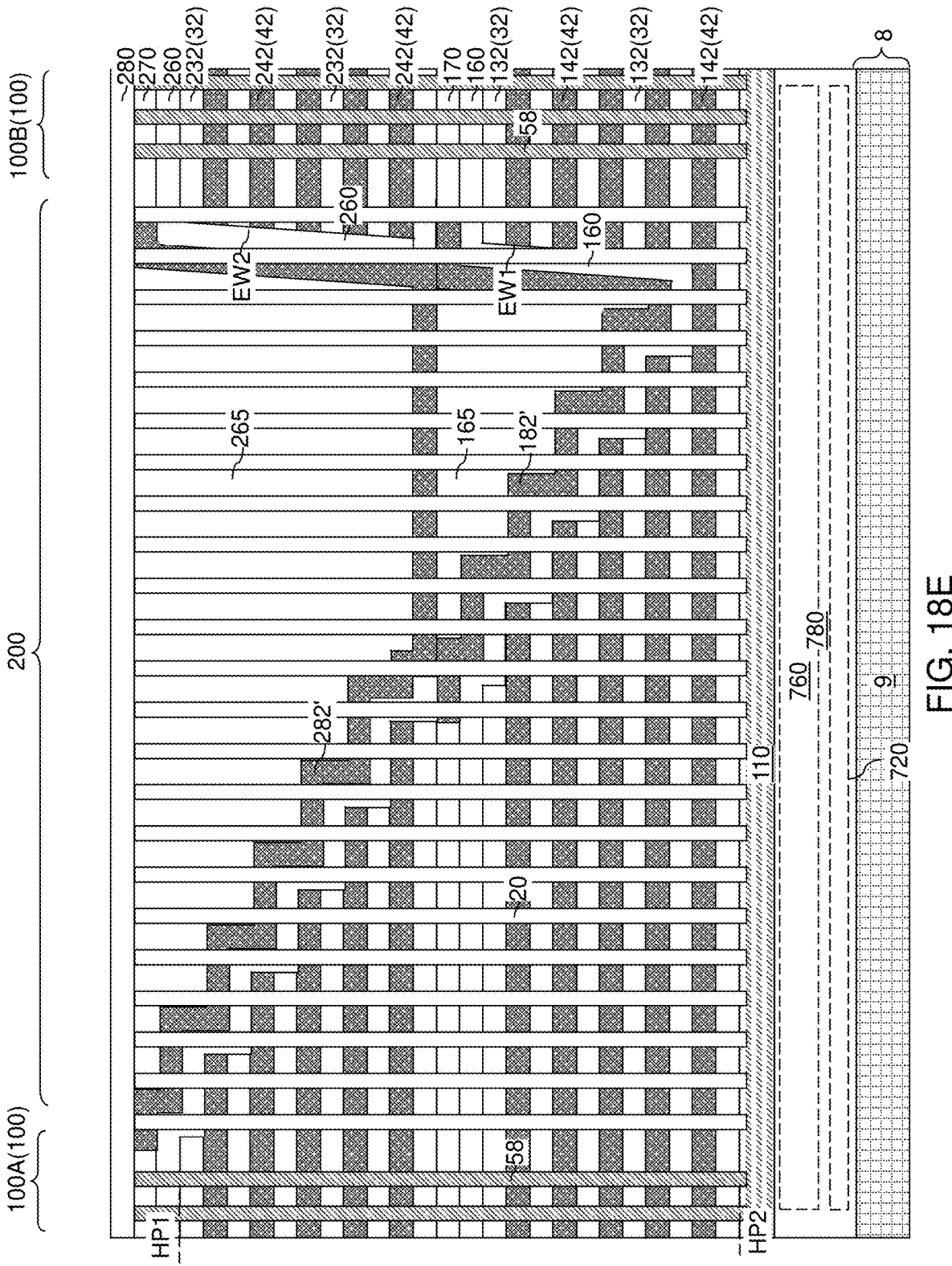
Figure 18F:
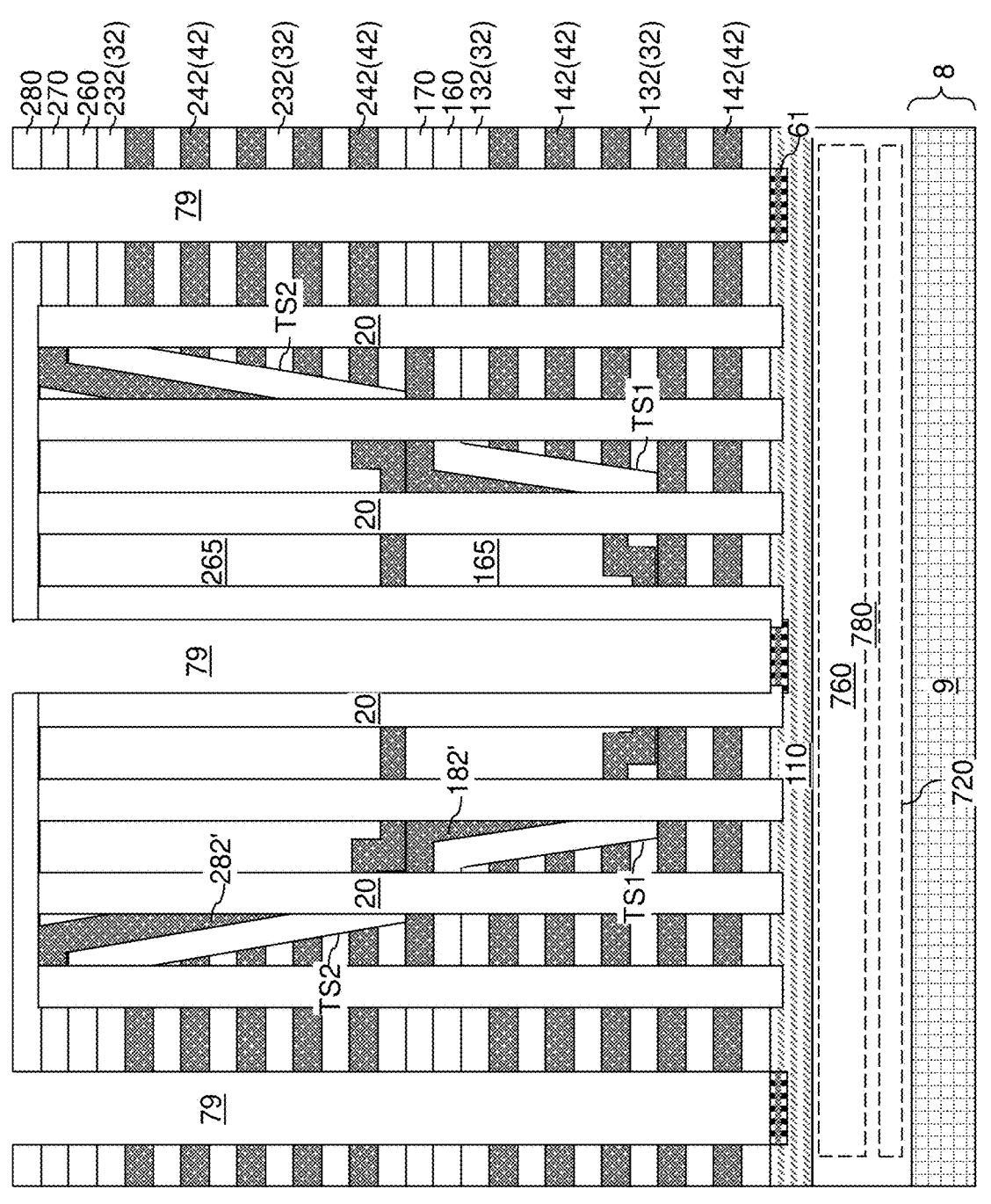
Figure 18G:
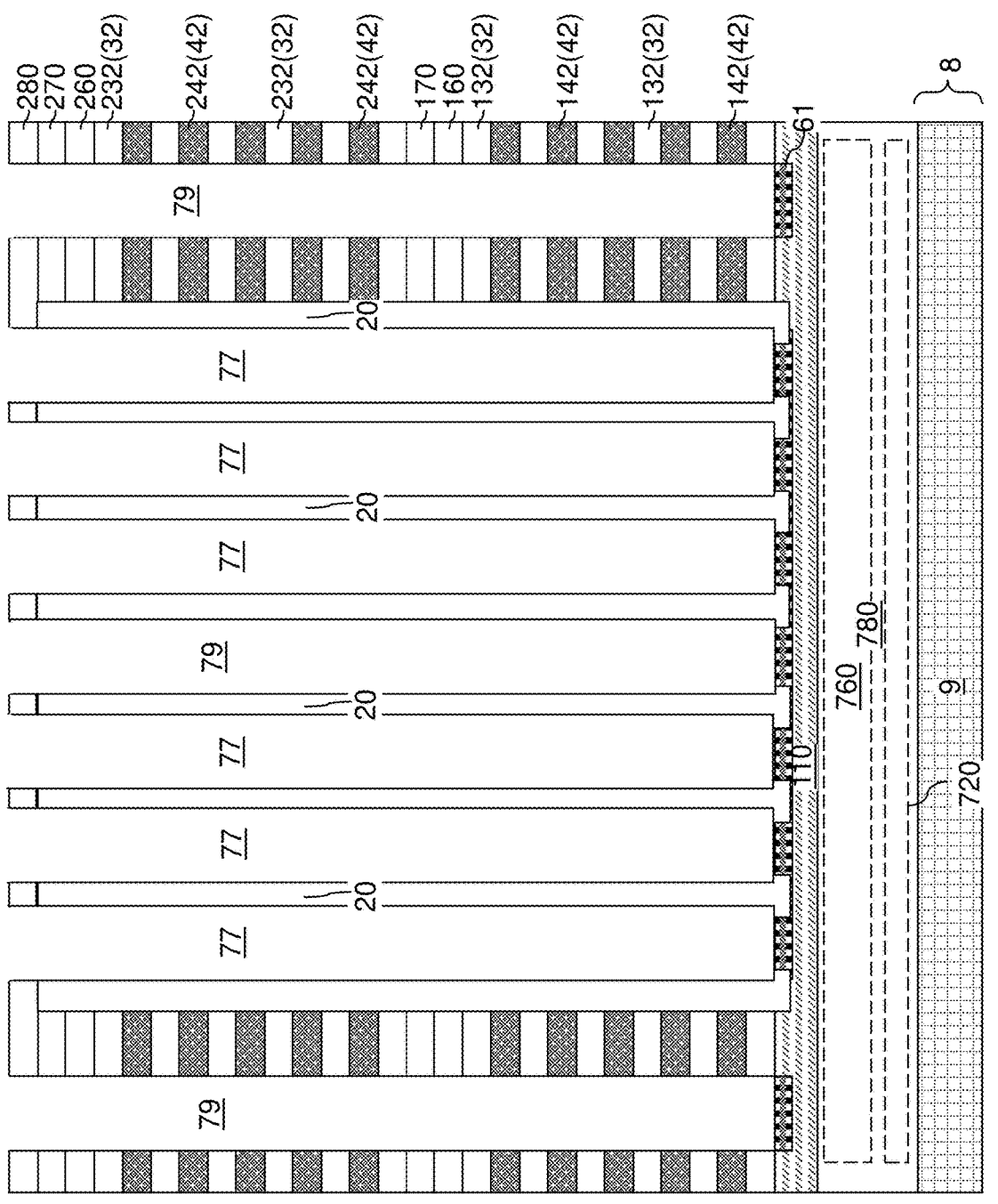
Figure 18H:
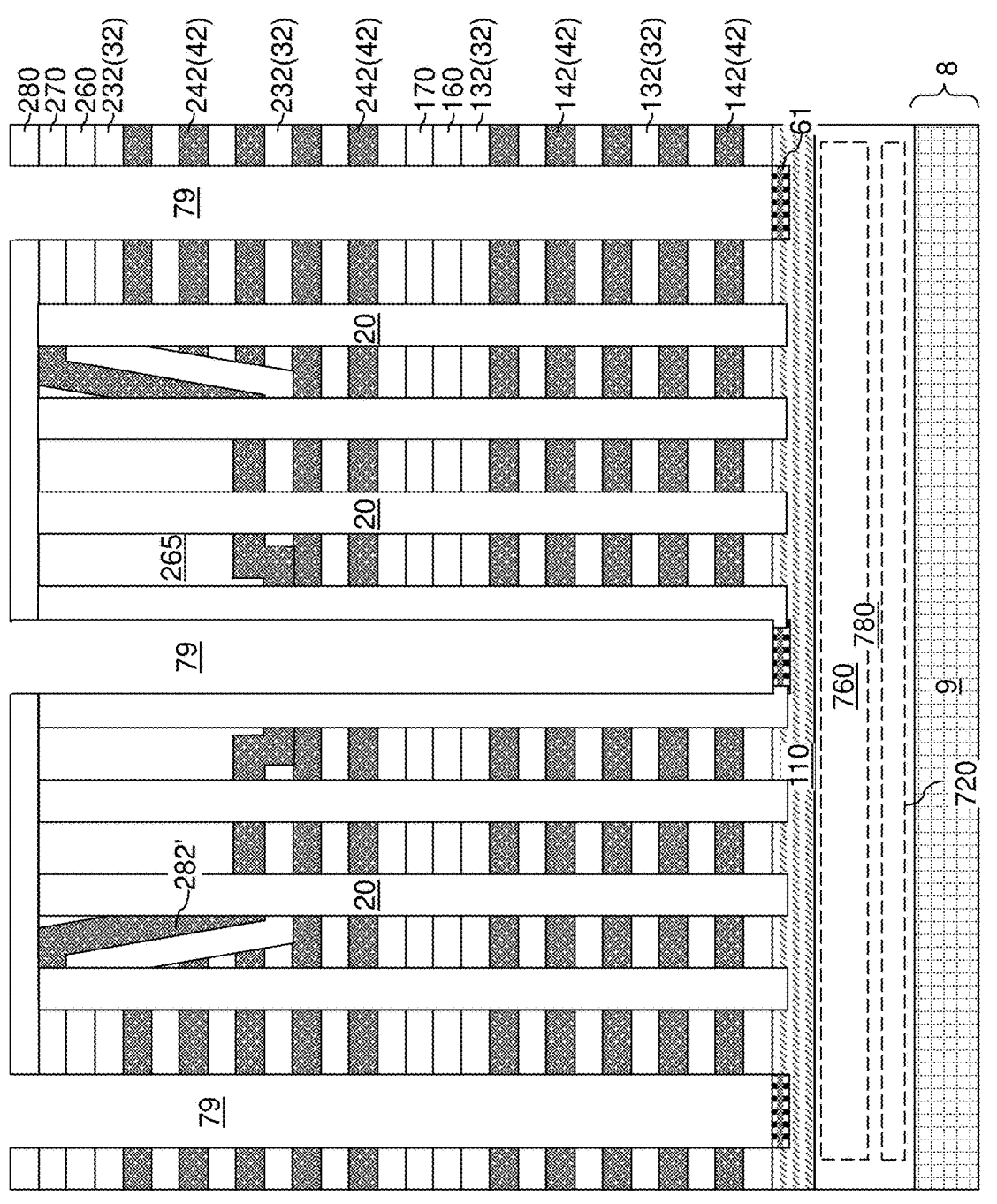
Figure 18I:
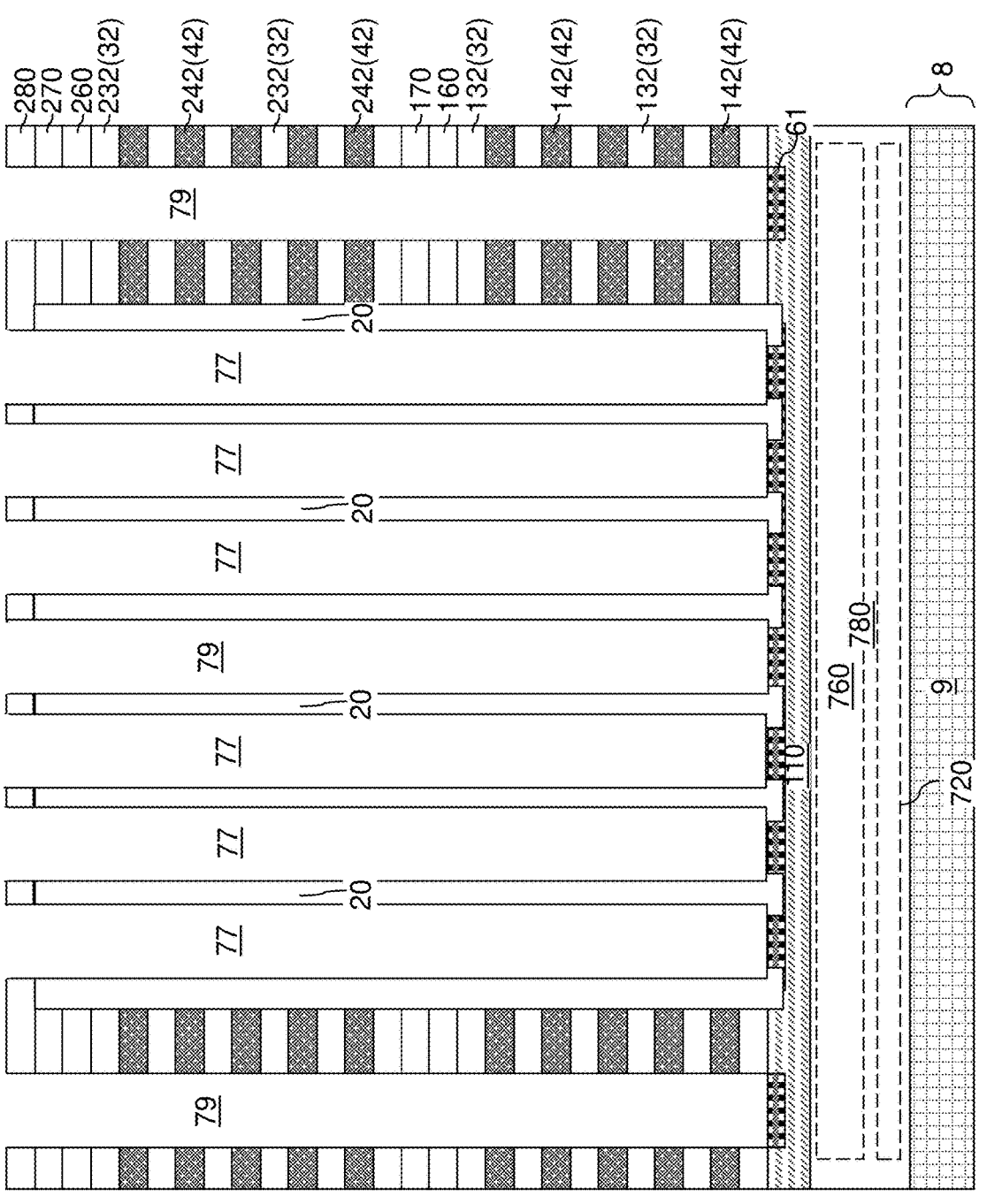
Figure 19A:
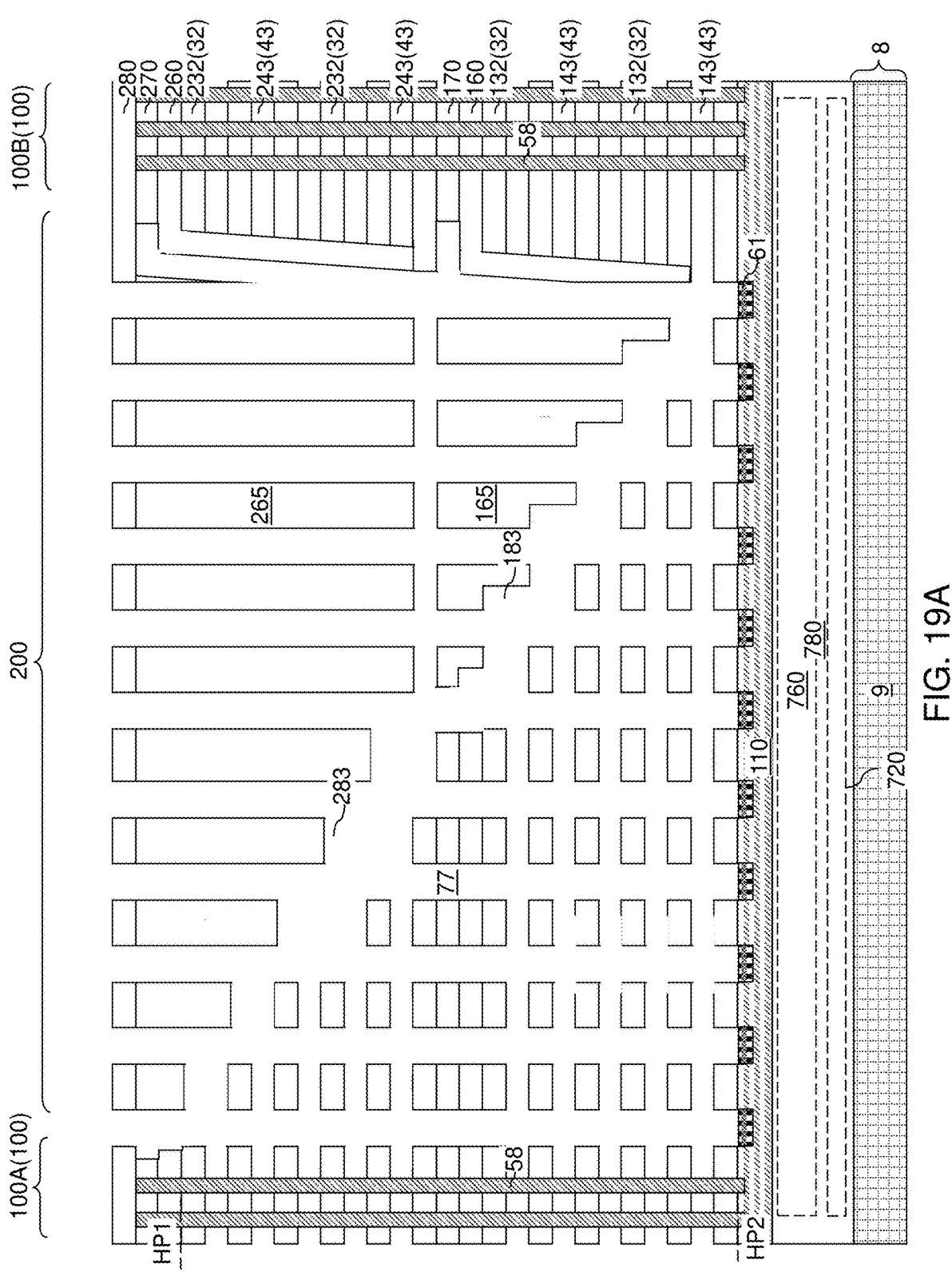
FIGS. 19A-19I are various views of the first exemplary structure after formation of laterally-extending cavities according to an embodiment of the present disclosure.
Figure 19B:
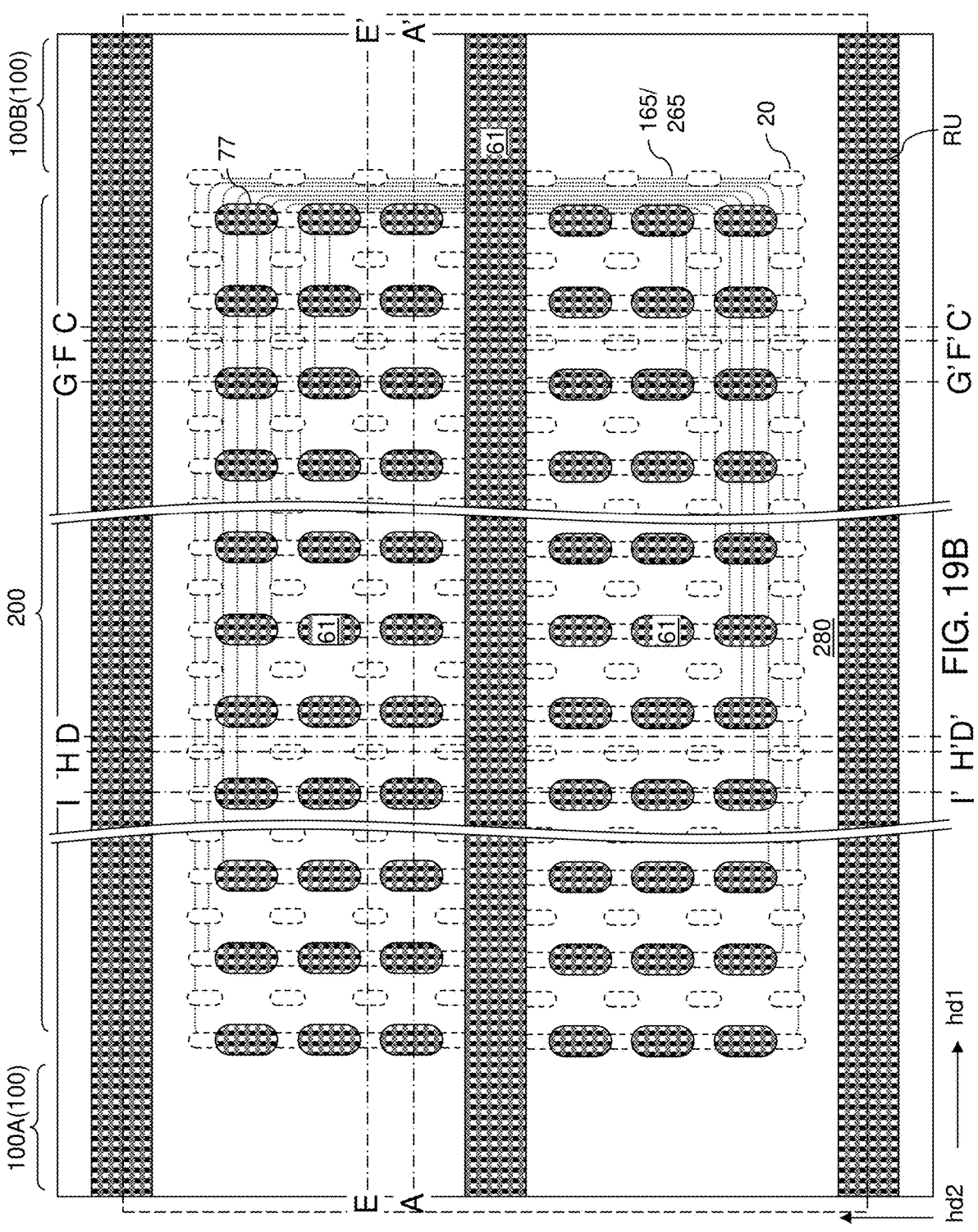
Figure 19C:
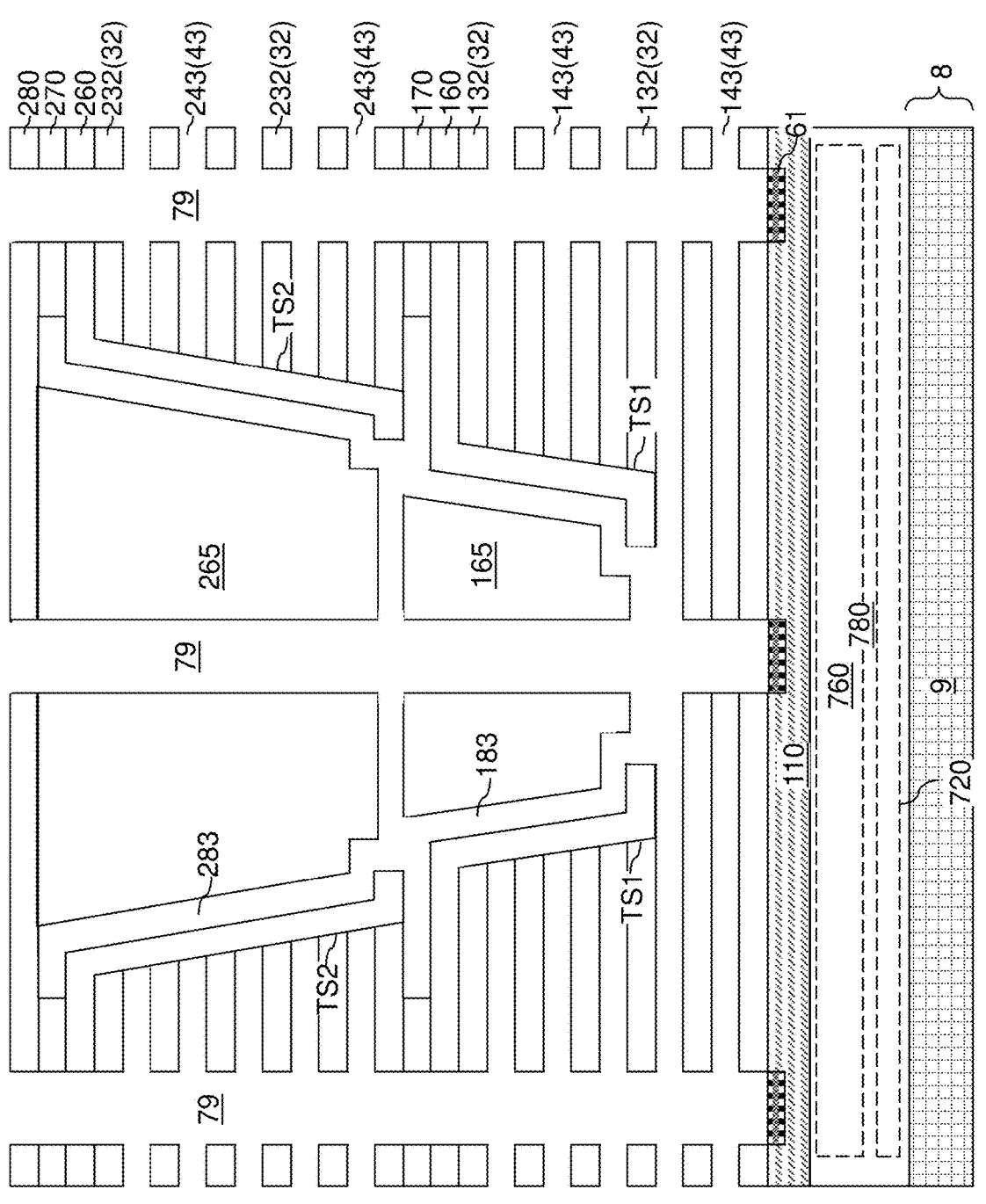
Figure 19D:
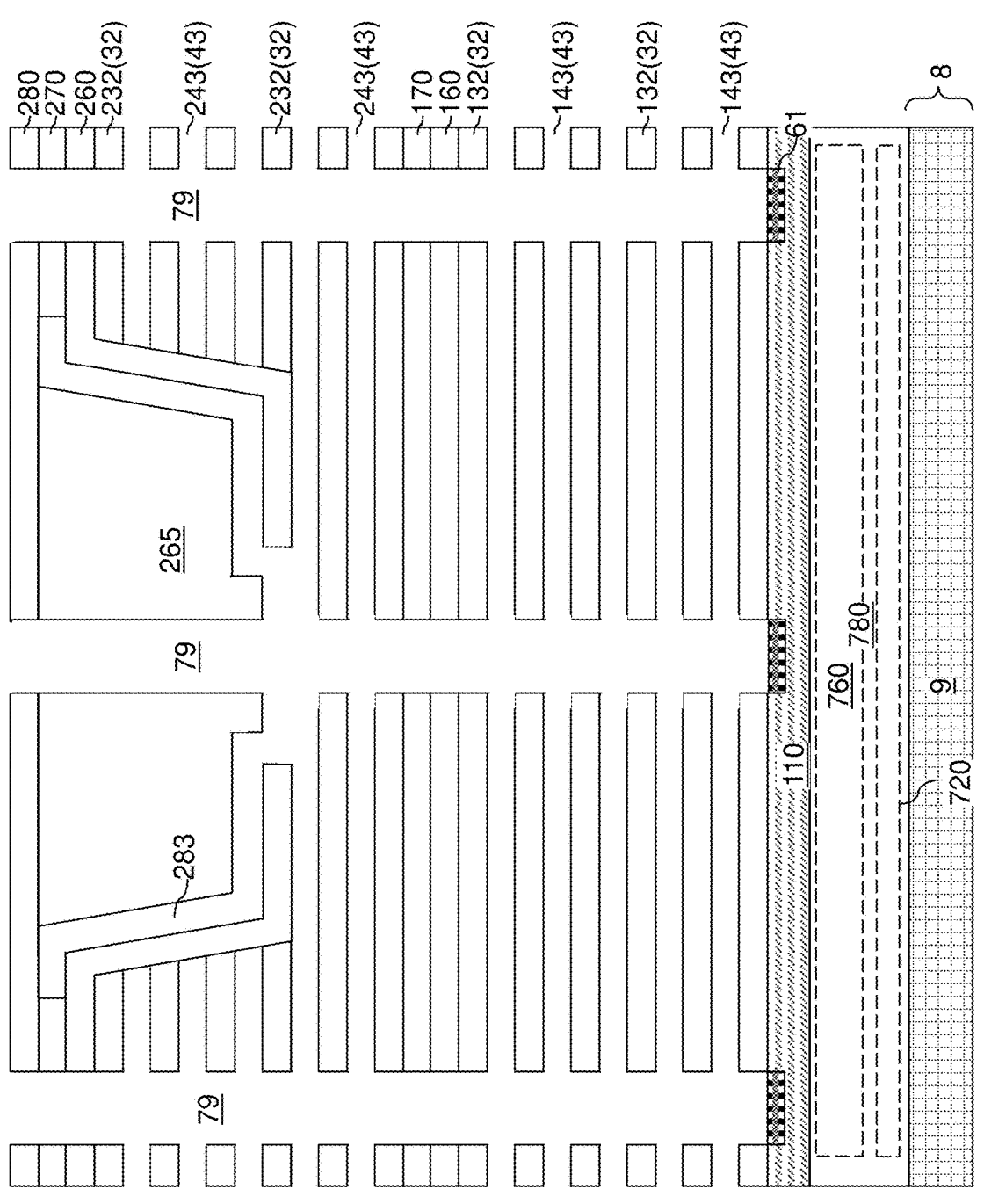
Figure 19E:
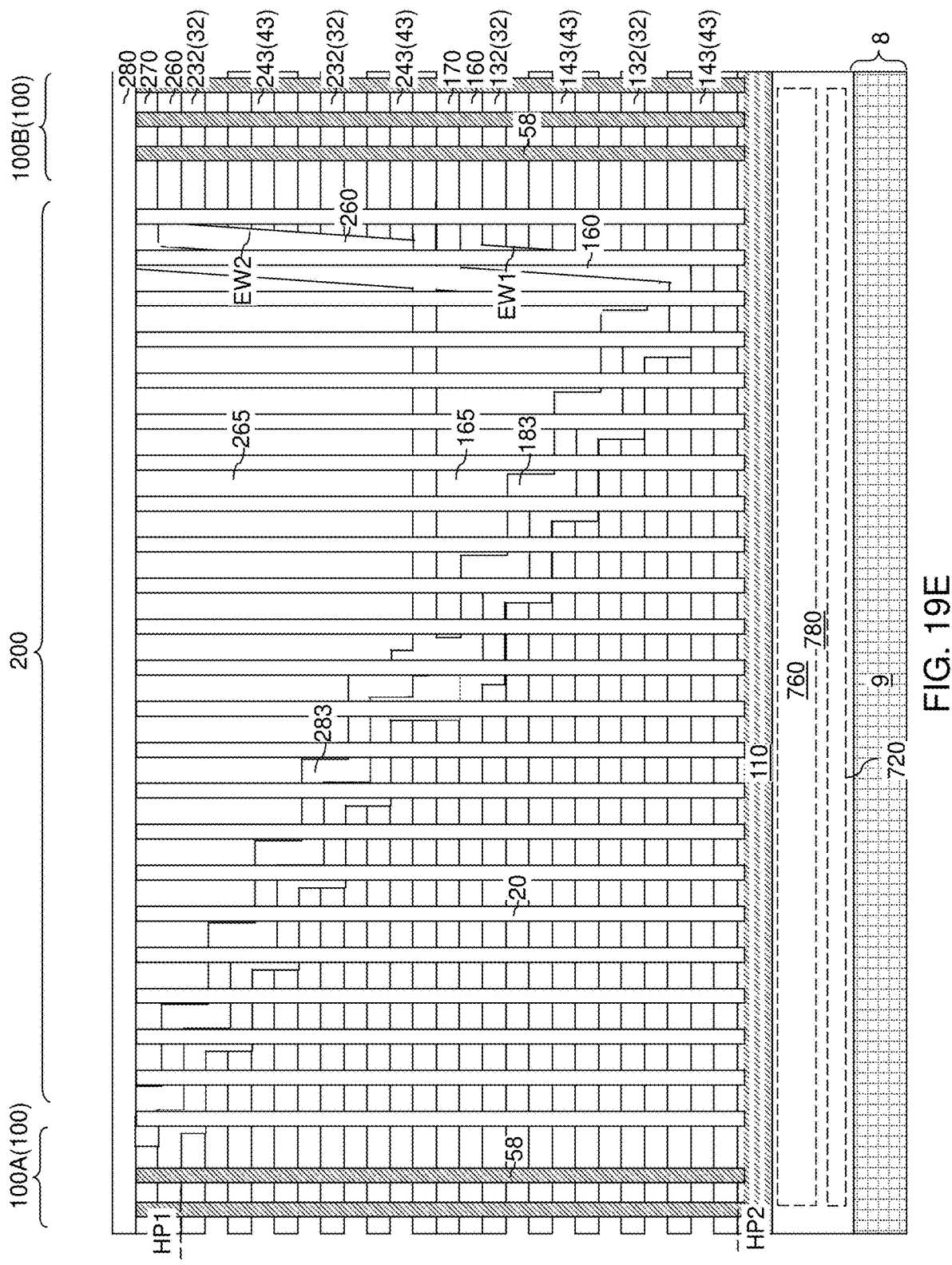
Figure 19F:
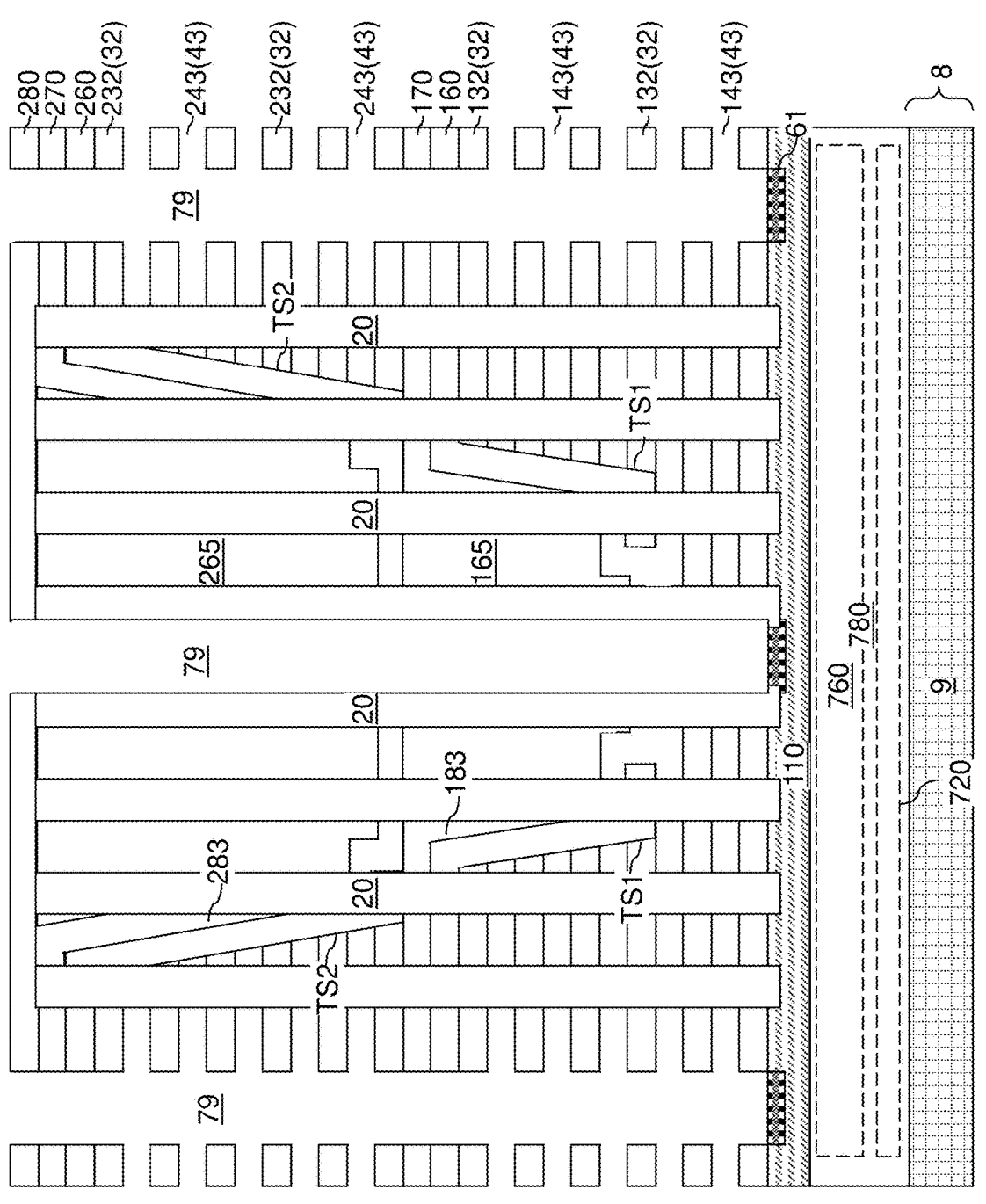
Figure 19G:
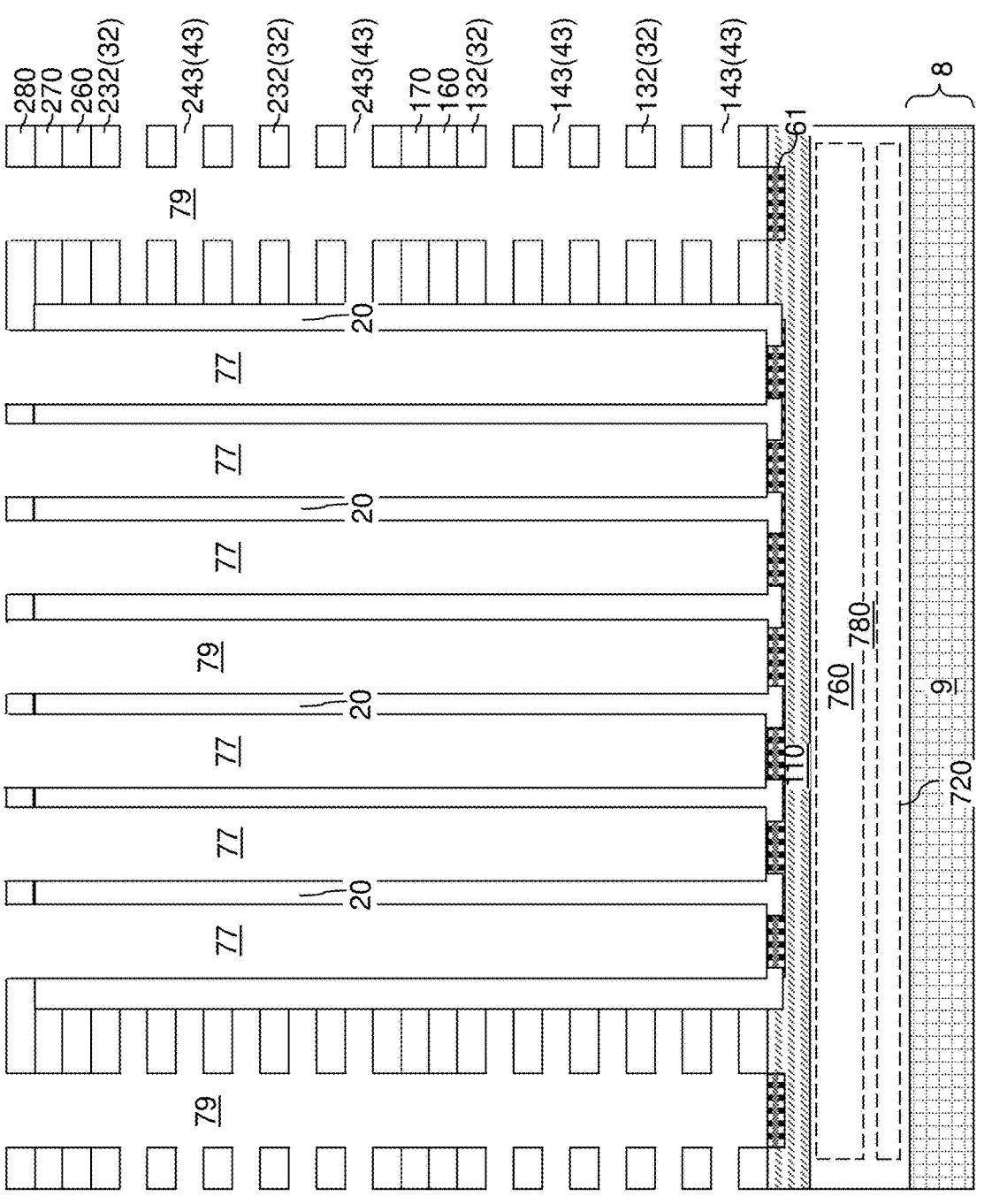
Figure 19H:
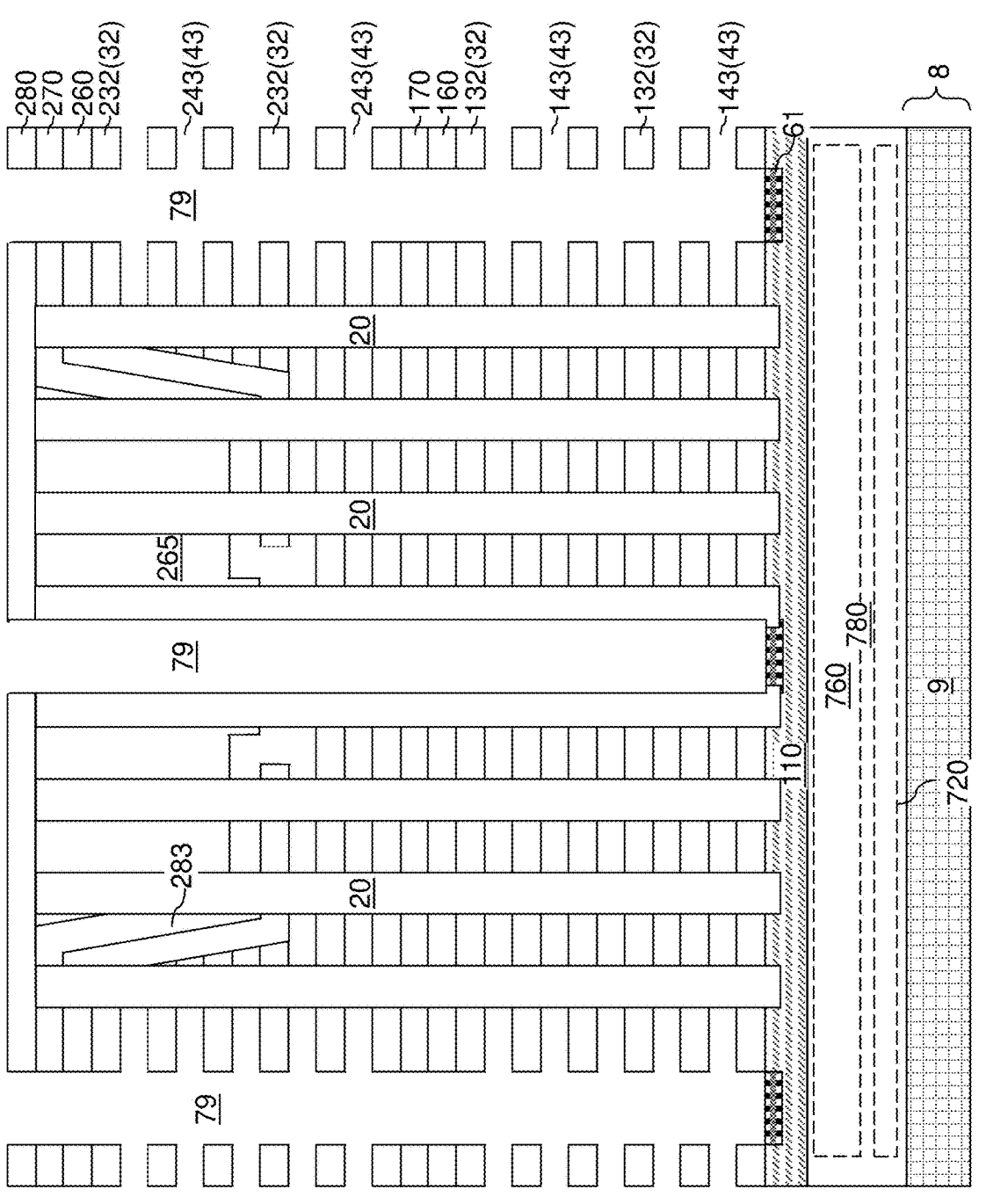
Figure 19I:
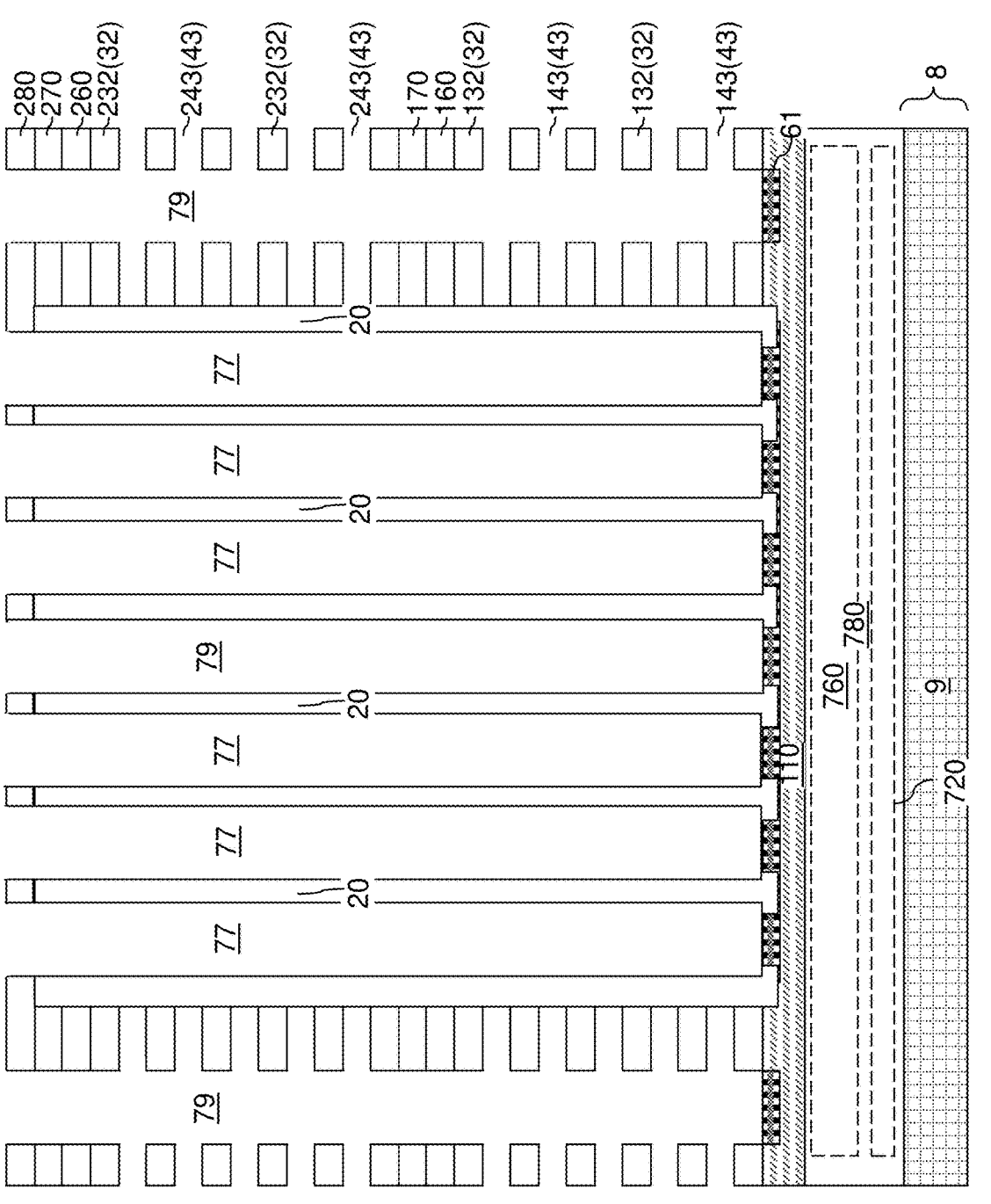

Referring to FIG. 16E, a dielectric core layer can be deposited to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch process such that each remaining portions of the dielectric core layer is located within a respective memory opening 49 and has a respective top surface below the horizontal plane including the top surface of the second insulating cap layer 270. Each remaining portion of the dielectric core layer constitutes a dielectric core 62.

Referring to FIG. 16F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the second insulating cap layer 270, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a vertical semiconductor channel 60, an optional dielectric liner 56, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

In the alternative embodiment in which the support openings are formed at the same time as the memory openings 49, the support pillar structures 20 may be formed in the support openings at the same time as the memory opening fill structures 58. In this alternative embodiment, the support pillar structures 20 have the same composition as the memory opening fill structures 58, but are not electrically connected to the subsequently formed bit lines.

Referring to FIGS. 17A-17G, the first exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening. Other memory stack structures including different layer stacks or structures for the memory film 50 and/or for the vertical semiconductor channel 60 may also be used.

Generally, each of the memory opening fill structures 58 comprises a respective vertical stack of memory elements and a respective vertical semiconductor channel 60. In one embodiment, the vertical stack of memory elements may comprise portions of the memory film 50 (such as portions of the memory material layer 54) located at levels of the sacrificial material layers (142, 242), which are subsequently replaced with electrically conductive layers.

Referring to FIGS. 18A-18I, a capping dielectric layer 280 can be formed over the second insulating cap layer 270, the memory opening fill structures 58, and the support pillar structures 20. The capping dielectric layer 280 comprises a dielectric material, such as undoped silicate glass or a doped silicate glass, and may have a thickness in a range from 30 nm to 300 nm, although lesser and greater thicknesses may also be employed. In one embodiment, top surfaces of the memory opening fill structures 58 are located within the first horizontal plane HP1, which includes the bottom surface of the capping dielectric layer 280.

A photoresist layer (not shown) may be applied over the capping dielectric layer 280, and can be lithographically patterned to form openings therein. The openings in the patterned photoresist layer may comprise elongated openings that laterally extend along the first horizontal direction hd1 through the memory array regions 100 and the contact region 200 between respective pairs of clusters of memory opening fill structures 58. Further, the openings in the patterned photoresist layer may comprise arrays of discrete openings arranged such that the combination of the areas of the support pillar structures 20 and the areas of the discrete openings cover all vertically-extending surfaces of the stepped surfaces of the alternating stack (32, 42) that are not covered by the elongated openings.

An anisotropic etch process can be performed to transfer the pattern of the openings through the capping dielectric layer 280, the second-tier structure, and the first-tier structure, and down to at least a top surface of the semiconductor material layer 110. Lateral isolation trenches 79 can be formed underneath the elongated openings in the photoresist layer. The lateral isolation trenches 79 laterally extend along the first horizontal direction hd1, and may have a uniform width along the second horizontal direction hd2 that is greater than the maximum thickness of the sacrificial material layers 42. In one embodiment, the uniform width of the lateral isolation trenches 79 may be in a range from twice the average thickness of the sacrificial material layers 42 to ten times the average thickness of the sacrificial material layers 42.

Arrays of isolation cavities 77 are formed underneath the arrays of discrete openings in the photoresist layer. The isolation cavities 77 may have a maximum lateral dimension (i.e., a length) in a range from about one half the average thickness of the sacrificial material layers 42 to about five times the average thickness of the sacrificial material layers 42, and may have a width (i.e., a maximum dimension along a horizontal direction that is perpendicular to the length) in a range from 1/4 of the average thickness of the sacrificial material layers 42 to about twice the average thickness of the sacrificial material layers 42. In one embodiment, the isolation cavities 77 may be elongated along the second horizontal direction hd2 such that the length each isolation cavity 77 along the second horizontal direction hd2 is greater than its width along the first horizontal direction hd1. Alternatively, the isolation cavities 77 may have a circular horizontal cross-sectional shape.

The lateral isolation trenches 79 laterally extend along the first horizontal direction hd1, and are laterally spaced apart from each other along a second horizontal direction hd2. The lateral isolation trenches 79 may comprise first lateral isolation trenches 79 located at edges of a respective repetition unit RU and not contacting any of the dielectric fill structures (165, 265), and second lateral isolation trenches 79 that divide a respective first dielectric fill structure 165 and a respective second dielectric fill structure 265 into a respective pair of first dielectric fill structures 165 and a respective pair of second dielectric fill structures 265. Thus, each first lateral isolation trench 79 is laterally offset from the cavities (169, 269) within the alternating stack (32, 42) along the second horizontal direction hd2. Each second lateral isolation trench 79 cuts through a respective stack of a first cavity 169 and a second cavity 269 (which is filled with a stack of a first dielectric fill structure 165 and a second dielectric fill structure 265 prior to formation of the lateral isolation trenches 79).

Generally, lateral isolation trenches 79 and arrays of isolation cavities 77 can be formed through the alternating stack (32, 42). The lateral isolation trenches 79 and the arrays of isolation cavities 77, in conjunction with the support pillar structures 20, divide each of the sacrificial liners (182, 282) into a respective array of sacrificial liner strips (182', 282') that are laterally spaced apart from each other along the first horizontal direction hd1. Specifically, each first sacrificial liner 182 is divided into an array of first sacrificial liner strips 182', and each second sacrificial liner 282 is divided into an array of second sacrificial liner strips 282'. The sacrificial liner strips (182', 282') are exposed to a respective second lateral isolation trench 79 upon formation of the lateral isolation trenches 79. Each of the sacrificial liner strips (182', 282') contacts one stepped surface S of a respective sacrificial material layer 42 in the respective cavity (169, 269).

Each tapered sidewall (TS1, TS2) of the cavities (169, 269) can be divided into a plurality of tapered sidewalls (TS1, TS2) (each having a lesser area than a respective original tapered sidewall prior to division) upon formation of the support pillar structures 20 or upon formation of the arrays of isolation cavities 77. Generally, the support pillar structures 20 and/or the arrays of isolation cavities 77 divide each of the tapered sidewalls (TS1, TS2) of the cavities (169, 269) in the alternating stack (32, 42) into a respective plurality of tapered sidewalls (TS1, TS2) that are laterally spaced apart along the first horizontal direction hd1.

In one embodiment, each of the sacrificial liner strips (182', 282') comprises a first horizontally-extending portion which is a topmost portion; a tapered vertically-extending portion that overlies the respective tapered sidewall (TS1, TS2) of the plurality of tapered sidewalls (TS1, TS2), and a second horizontally-extending portion which is a bottom-most portion and which is adjoined to the respective one of the sacrificial material layers 42.

The tapered vertically-extending portion extends between the topmost and bottommost portions generally at a non-zero angle relative to the vertical direction in a straight or stepped inclined (e.g., diagonal) plane. The second horizontally-extending portion may contact a top of the stepped surface of the respective one of the sacrificial material layers 42 in the respective cavity (169, 269).

In one embodiment, each of the sacrificial liner strips (182', 282') may comprise a stepped contoured portion that is proximal to an opening in a respective insulating liner (160, 260). In this case, each of the sacrificial liner strips (182', 282') further comprises a vertically-extending portion that is adjoined to the second horizontally-extending portion; and a third horizontally-extending portion that is adjoined to the vertically-extending portion and to a bottom end of the tapered vertically-extending portion. In case where the first alternating stack (132, 142) and the second alternating stack (232, 242) are both present within the alternating stack (32, 42), a top end of a first sacrificial liner strip 182' may contact a bottom surface of a respective second sacrificial liner strip 282'. Each second sacrificial material layer 242 may have a respective top surface segment that contacts a bottom surface of a respective second sacrificial liner strip 282'. Each first sacrificial material layer 142 may have a respective top surface segment that contacts a bottom surface of a respective first sacrificial liner strip 182', which has a respective top surface that contacts a bottom surface of a respective second sacrificial liner strip 282'.

Optionally, an ion implantation process may be performed to implant dopants of the second conductivity type into surface portions of the semiconductor material layer 110 that underlie the lateral isolation trenches 79 or the arrays of isolation cavities 77. Source regions 61 having a doping of the first conductivity type may be formed in the implanted portions of the semiconductor material layer 110.

Referring to FIGS. 19A-19I, an isotropic etch process can be performed to isotropically etch the materials of the sacrificial material layers 42 and the sacrificial liner strips (182', 282') selective to the materials of the insulating layers 32, the insulating liners (160, 260), the insulating cap layers (170, 270), the dielectric capping layer 280, and the semiconductor material layer 110. An isotropic etchant can be introduced into the lateral isolation trenches 79 and into the isolation cavities 77 during the isotropic etch process. For example, if the sacrificial material layers 42 and the sacrificial liner strips (182', 282') comprise silicon nitride, the isotropic etch process may comprise a wet etch process employing hot phosphoric acid.

Laterally-extending cavities 43 are formed in volumes from which portions of the sacrificial material layers 42 are removed by the isotropic etch process. The laterally-extending cavities 43 may comprise first laterally-extending cavities 143 that are formed in volumes from which first sacrificial material layers 142 are removed, and second laterally-extending cavities 243 that are formed in volumes from which the second sacrificial material layers 242 are removed. Strip-shaped cavities (183, 283) are formed in volumes from which the sacrificial liner strips (182', 282') are removed. The strip-shaped cavities (183, 283) comprise first strip-shaped cavities 183 that are formed in volumes from which first sacrificial liner strips 182' are removed, and second strip-shaped cavities 283 that are formed in volumes from which second sacrificial liner strips 282' are removed. The insulating layers 32, the dielectric fill structures (165, 265), the insulating cap layers (170, 270), and the dielectric capping layer 280 can be structurally supported by the memory opening fill structures 58 and the support pillar structures 20 during and after formation of the laterally-extending cavities 43 and the strip-shaped cavities (183, 283).

Referring to FIGS. 20A-20I, at least one conductive material can be deposited in unfilled volumes of the laterally-extending cavities 43 and the strip-shaped cavities (183, 283) by providing at least one reactant gas into the laterally-extending cavities 43 and into the strip-shaped cavities (183, 283) through the lateral isolation trenches 79 and through the isolation cavities 77. For example, the at least one conductive material may comprise a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, MoN or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, or tantalum. In one embodiment, the metallic fill material layer can consist essentially of a single elemental metal. In one embodiment, the metallic fill material layer can be deposited employing a fluorine-containing precursor gas, such as $WF_6$. In one embodiment, the metallic fill material layer can be a tungsten layer including a residual level of fluorine atoms as impurities. The metallic fill material layer is spaced from the insulating layers 32, the insulating liners (160, 260), the memory opening fill structures 58, and the support pillar structures 20 by the metallic barrier layer that blocks diffusion of fluorine atoms therethrough.

A plurality of electrically conductive layers 46 can be formed in the plurality of laterally-extending cavities 43. Electrically conductive strips 84 can be formed in a first subset of the strip-shaped cavities (183, 283) that adjoins a respective underlying electrically conductive layer 46. An additional electrically conductive strip 84' that is not electrically connected to any underlying electrically conductive layer 46 may be formed over a respective set of at least one end wall (EW1, EW2) of a respective set of at least one cavity (169, 269). A continuous metallic material layer (not shown) can be formed over the dielectric capping layer 280 and on the sidewalls and bottom surfaces of the lateral isolation trenches 79 and the isolation cavities 77. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the dielectric capping layer 280.

The deposited metallic material of the continuous electrically conductive material layer is etched back from above the dielectric capping layer 280 and from the sidewalls and the bottom surfaces of the lateral isolation trenches 79 and the isolation cavities 77 by performing an etch process that etches the at least one conductive material of the continuous electrically conductive material layer. The etch process may comprise an anisotropic etch process and/or an isotropic etch process. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46. The electrically conductive layer 46 comprise first electrically conductive layers 146 that replace first sacrificial material layers 142, and second electrically conductive layers 246 that replace second sacrificial material layers 242. The electrically conductive layers 46 may comprise source side select gate electrodes, word lines overlying the source side select gate electrodes, and drain side select gate electrodes overlying the word lines.

Electrically conductive strips 84 are formed in the volumes of the strip-shaped cavities (183, 283). Generally, remaining portions of the sacrificial material layers (142, 242) and the sacrificial liner strips (182', 282') are replaced with electrically conductive material portions that include the electrically conductive layers 46 and the electrically conductive strips 84, respectively. The electrically conductive layers 46 are formed in volumes from which the remaining portions of the sacrificial material layers 42 are removed, and electrically conductive strips 84 fill volumes from which the sacrificial liner strips (182', 282') are removed, respectively.

An alternating stack (32, 46) of insulating layers 32 and electrically conductive layers 46 is formed between each neighboring pair of lateral isolation trenches 79. The alternating stack (32, 46) may include a first alternating stack of first insulating layers 132 and first electrically conductive layers 146 and a second alternating stack of second insulating layers 232 and second electrically conductive layers 246.

In one embodiment, each of the electrically conductive strips 84 is adjoined to a respective one of the electrically conductive layers 46 at a bottom portion of a respective one of the cavities (169, 269), and overlies, but does not contact, a respective tapered sidewall (TS1, TS2) of a plurality of tapered sidewalls (TS1, TS2) that are arranged along the first horizontal direction hd1. Each of the electrically conductive strips 84 includes a respective topmost portion 84T that is located above a first horizontal plane HP1 including the topmost surface of the alternating stack (32, 46). In one embodiment, each of the electrically conductive strips is spaced from the respective tapered sidewall (TS1, TS2) by a respective tapered vertically-extending portion of a respective tapered insulating liner (160, 260).

In one embodiment, each of the electrically conductive strips 84 comprises: a first horizontally-extending portion which is a topmost portion 84T; a tapered vertically-extending portion 84V that overlies the respective tapered sidewall (TS1, TS2) of the tapered sidewalls (TS1, TS2); and a second horizontally-extending portion which is a bottommost portion 84V and is adjoined to the respective one of the electrically conductive layers 46. The tapered vertically-extending portion 84V extends between the topmost and bottommost portions (84T, 84B) at a generally non-zero angle relative to the vertical direction in a straight or stepped inclined (e.g., diagonal) plane.

In one embodiment, each of the electrically conductive strips 84 further comprises: a vertically-extending portion 84X that is adjoined to the second horizontally-extending portion; and a third horizontally-extending portion 84Y that is adjoined to the vertically-extending portion and to a bottom end of the tapered vertically-extending portion.

Figure 20A:
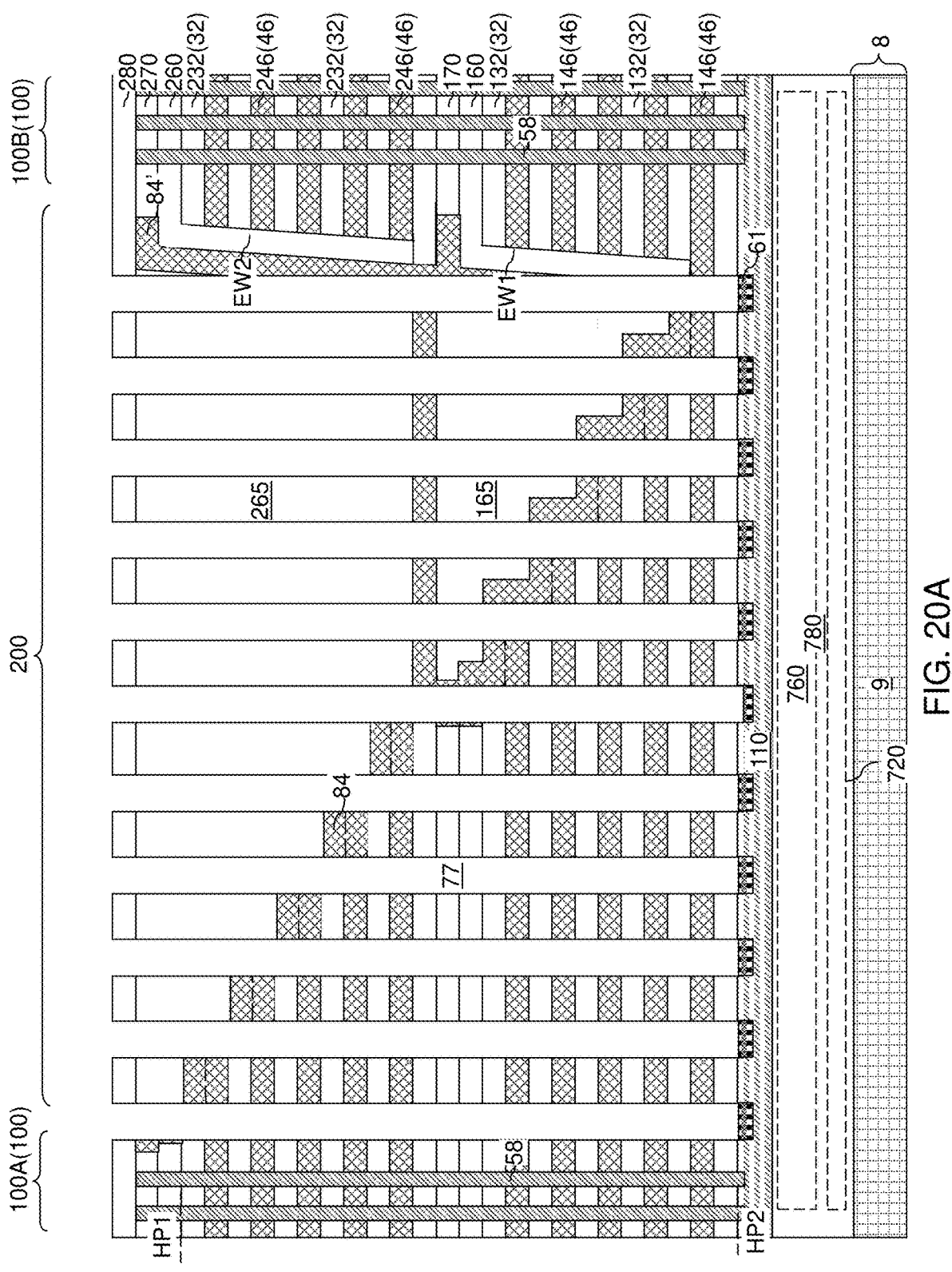
Figure 20B:
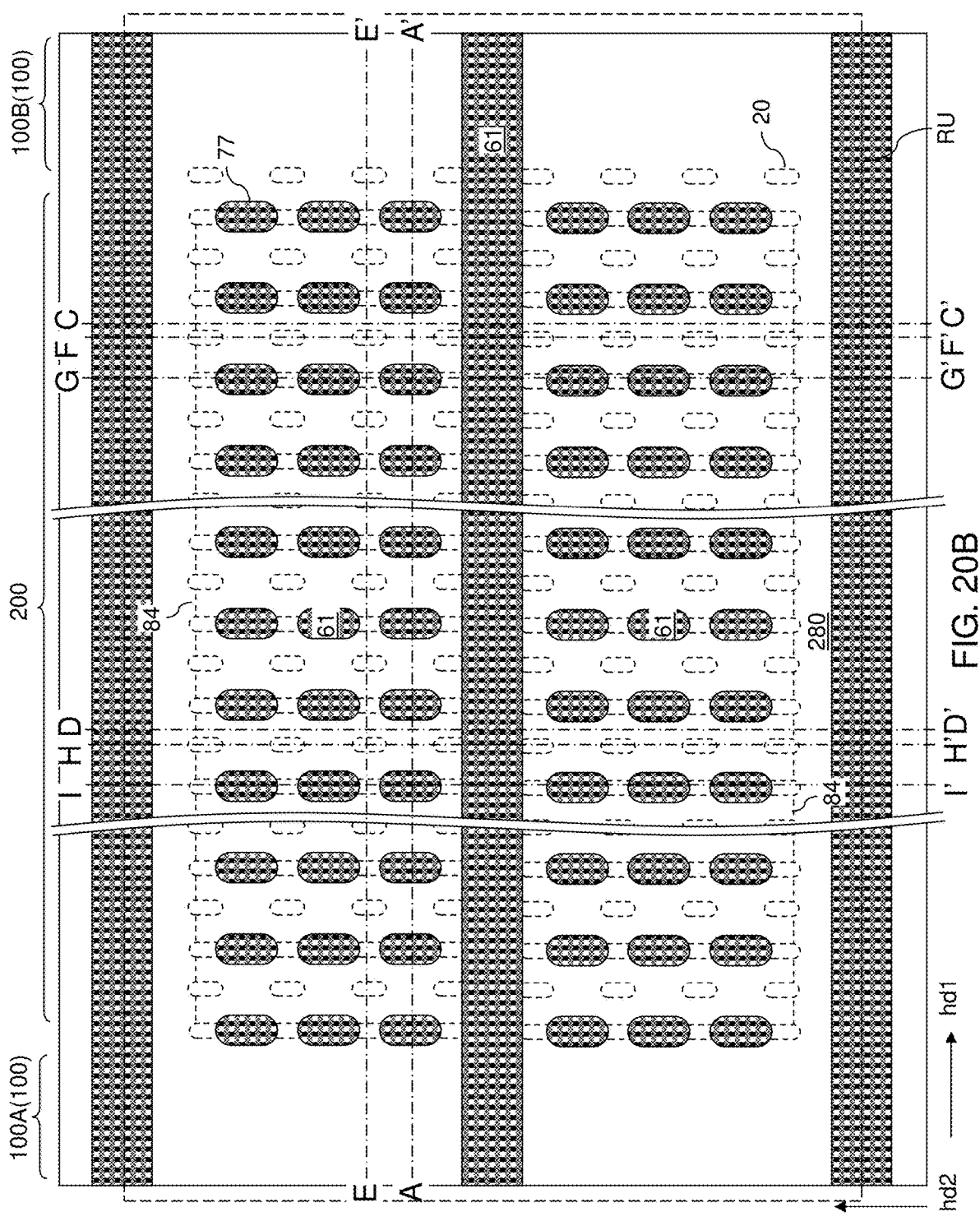
Figure 20C:
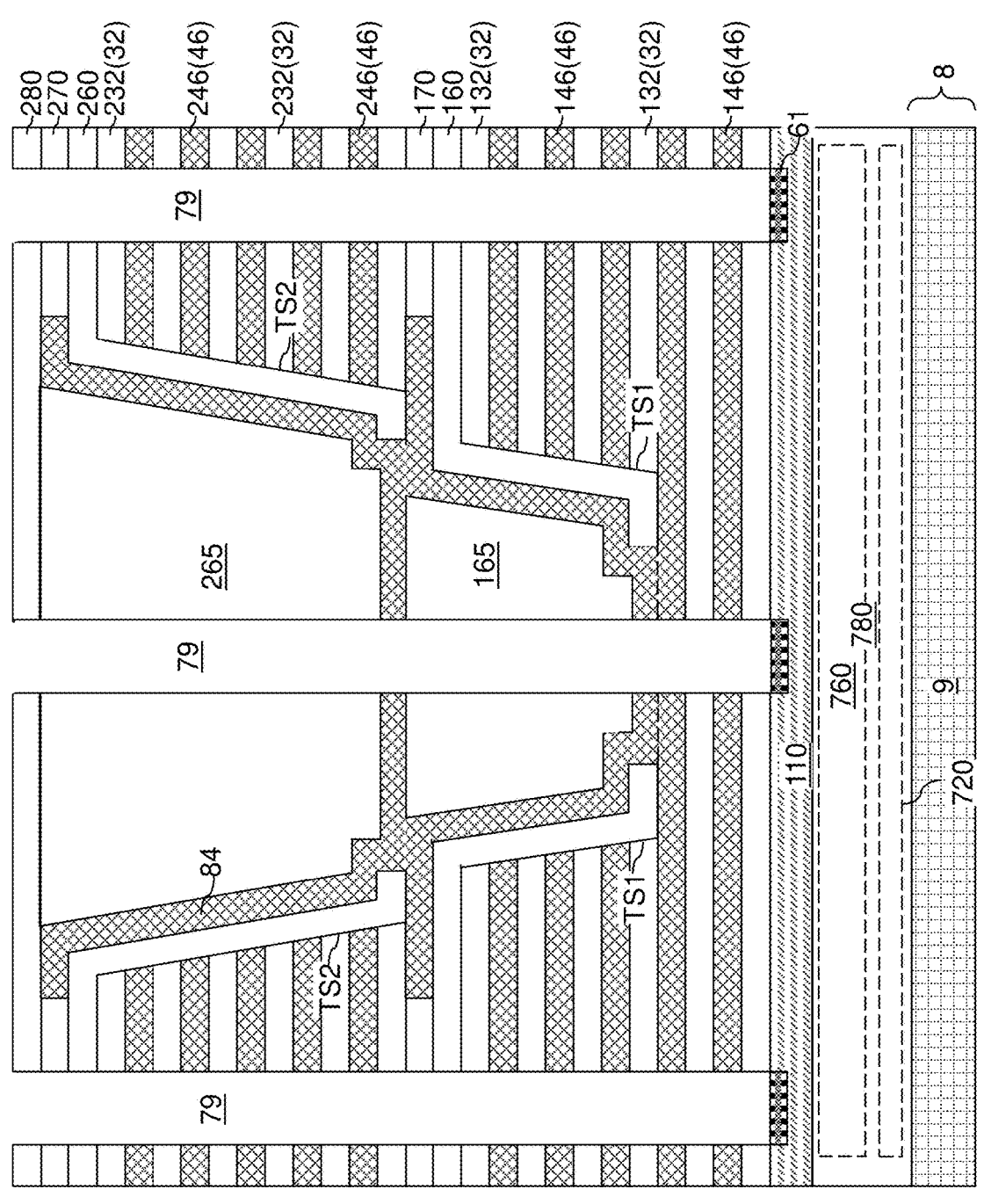
Figure 20D:
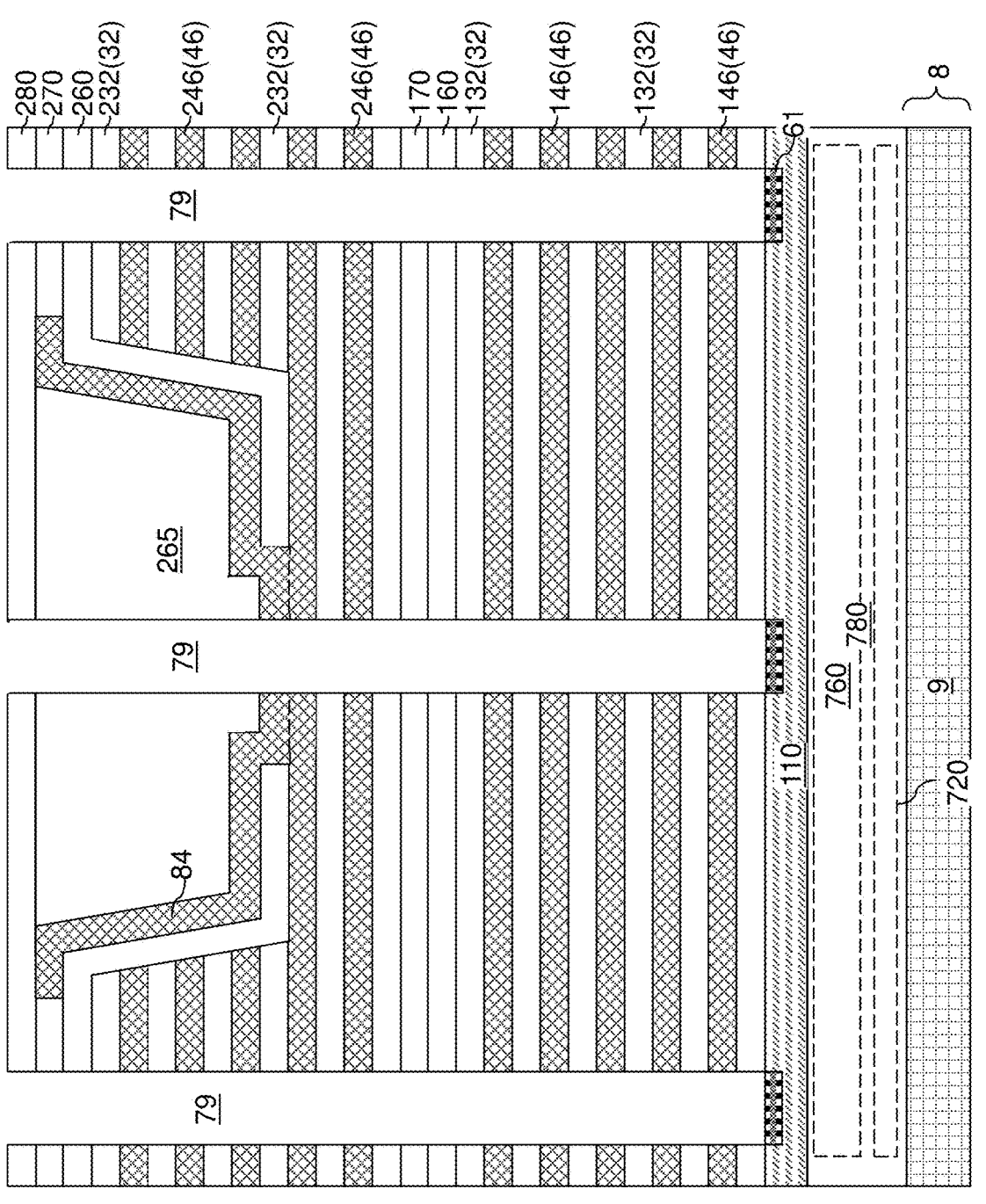
Figure 20E:
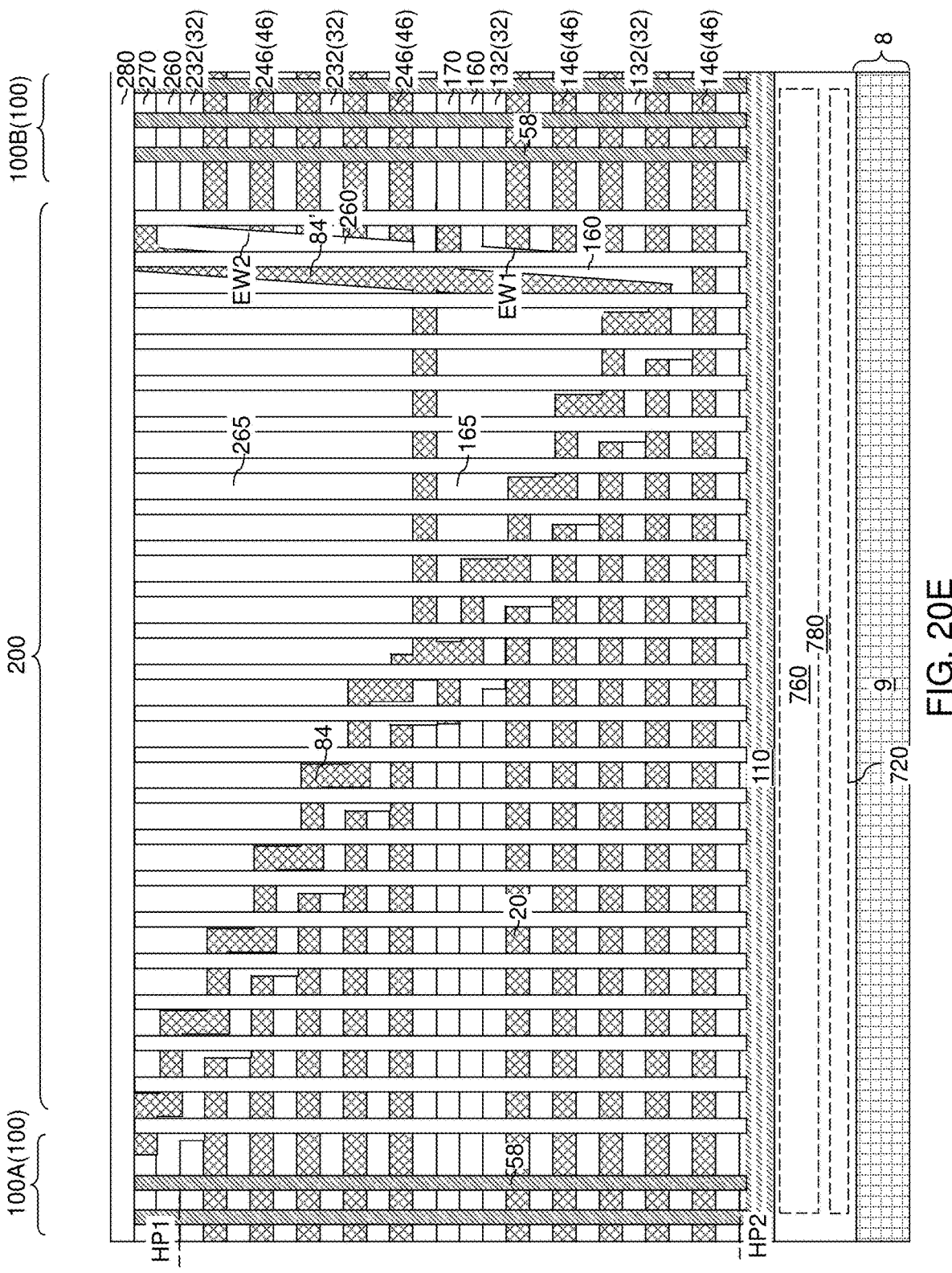
Figure 20F:
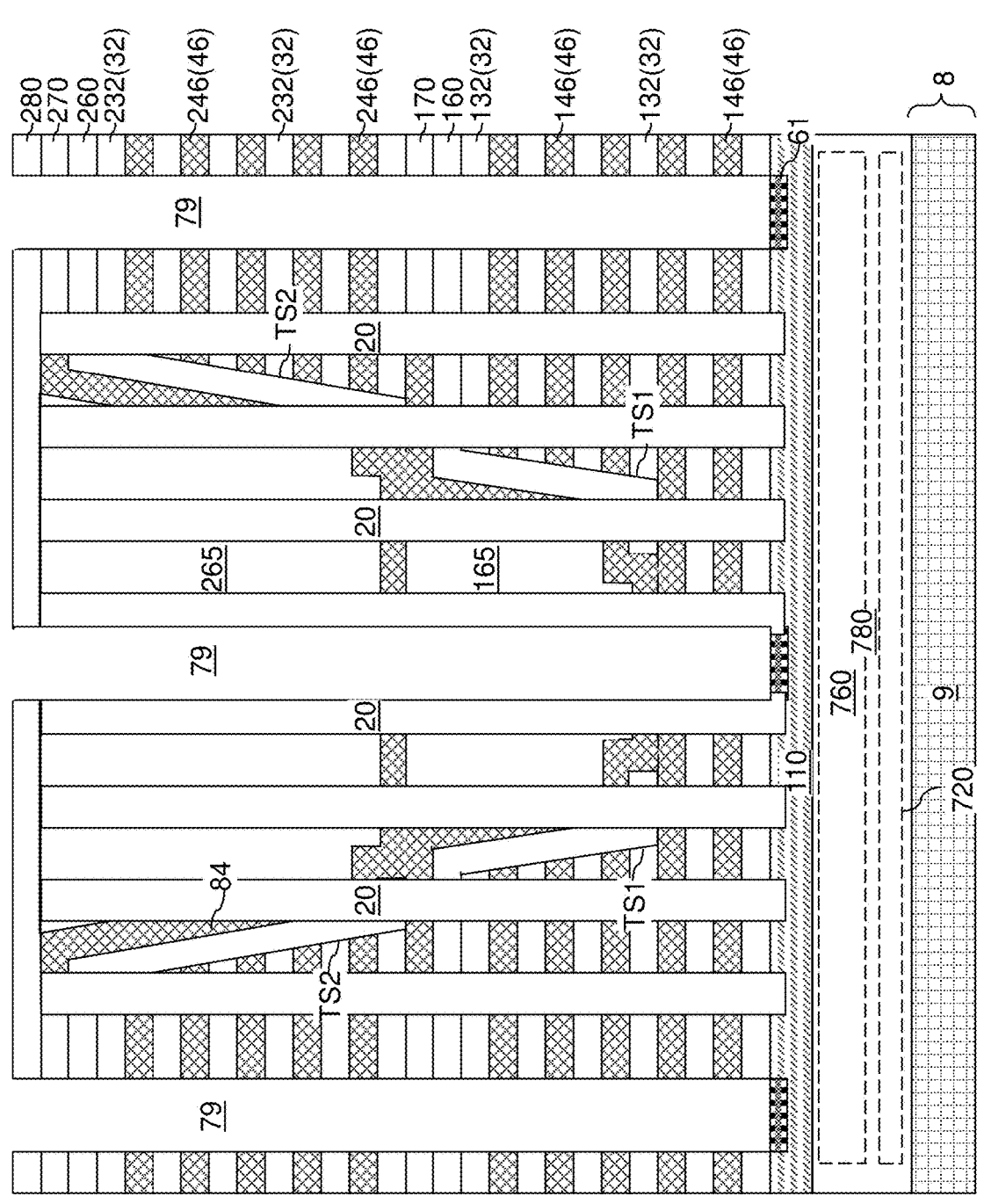
Figure 20G:
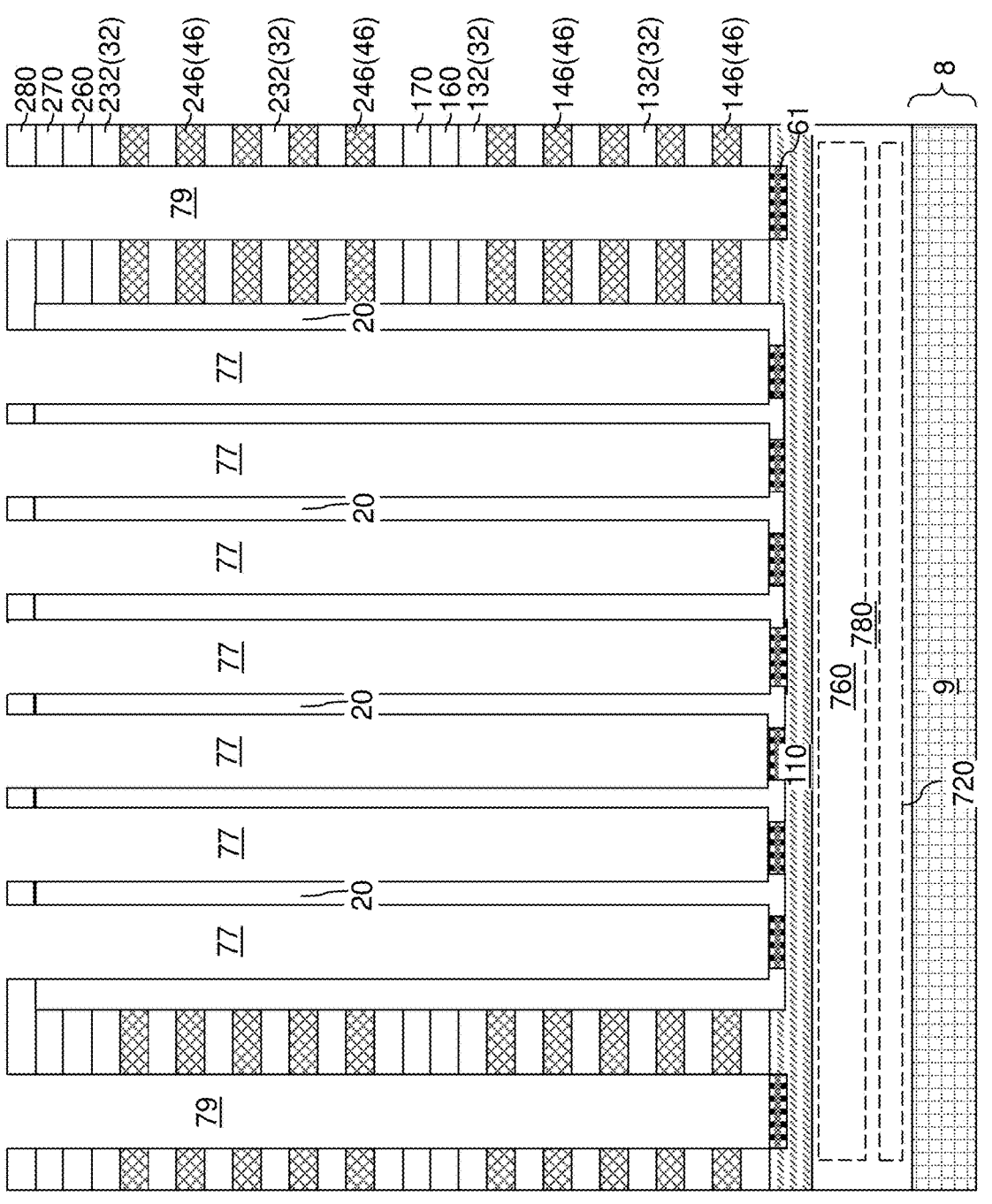
Figure 20H:
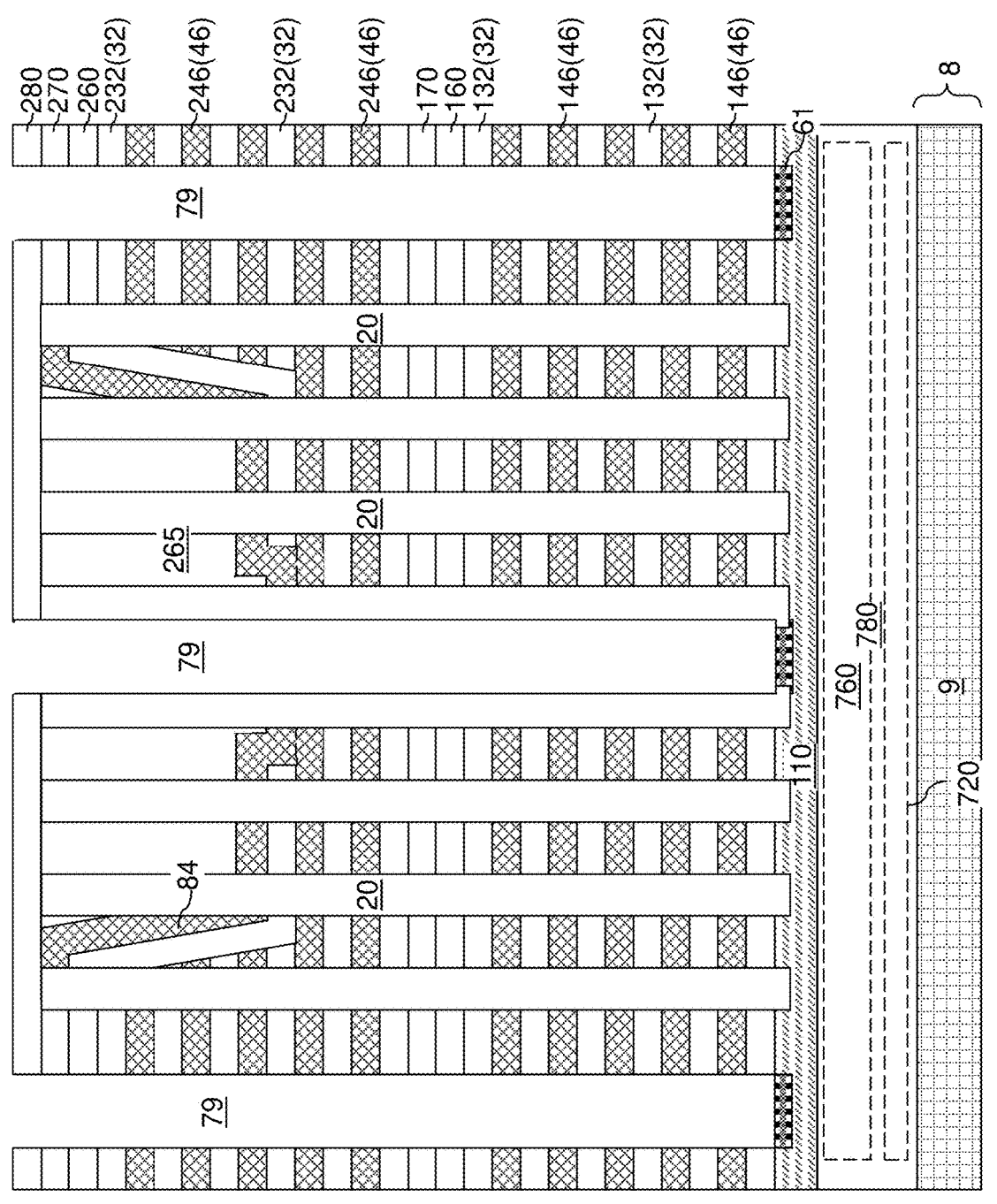
Figure 201:
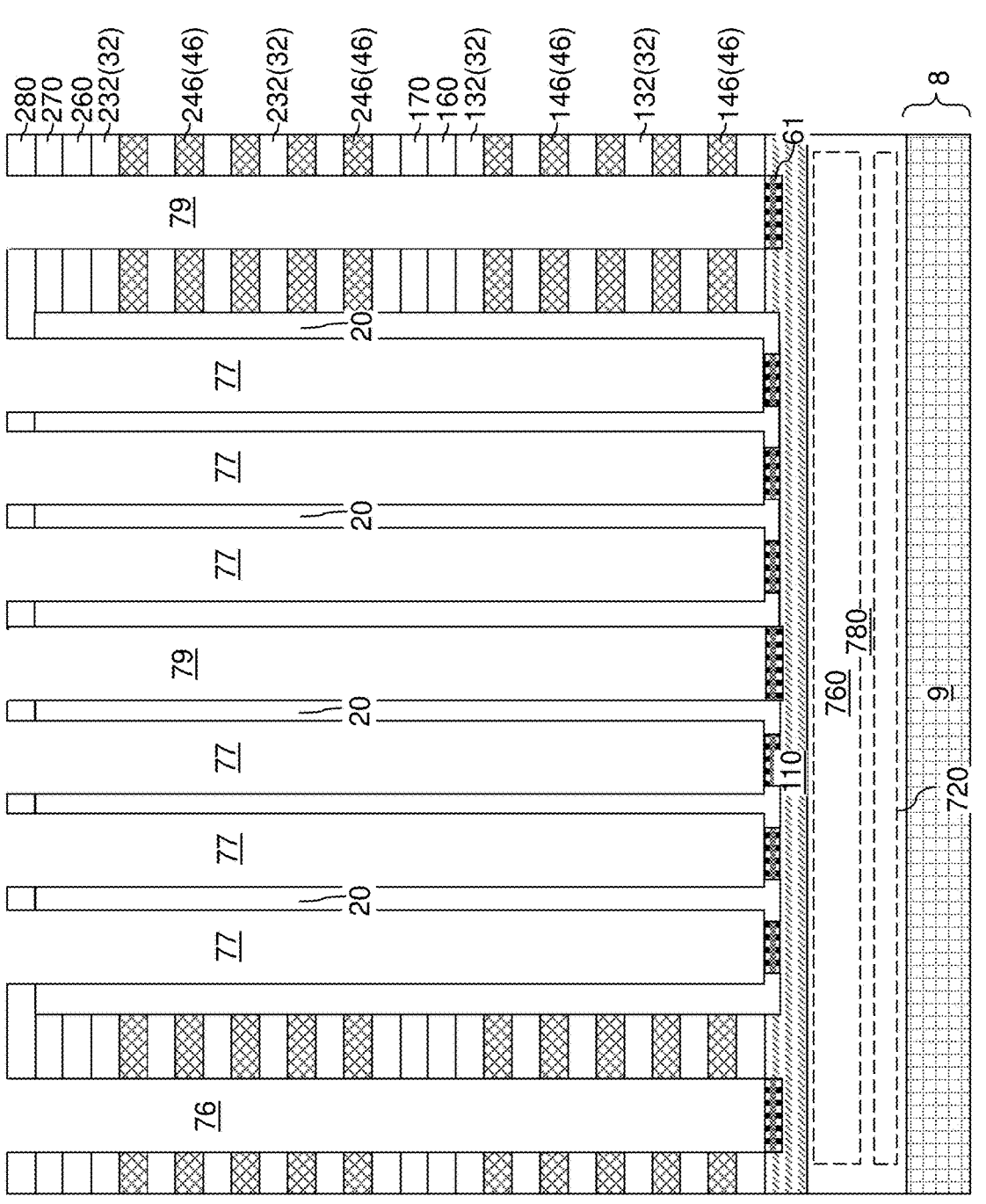
Figure 21A:
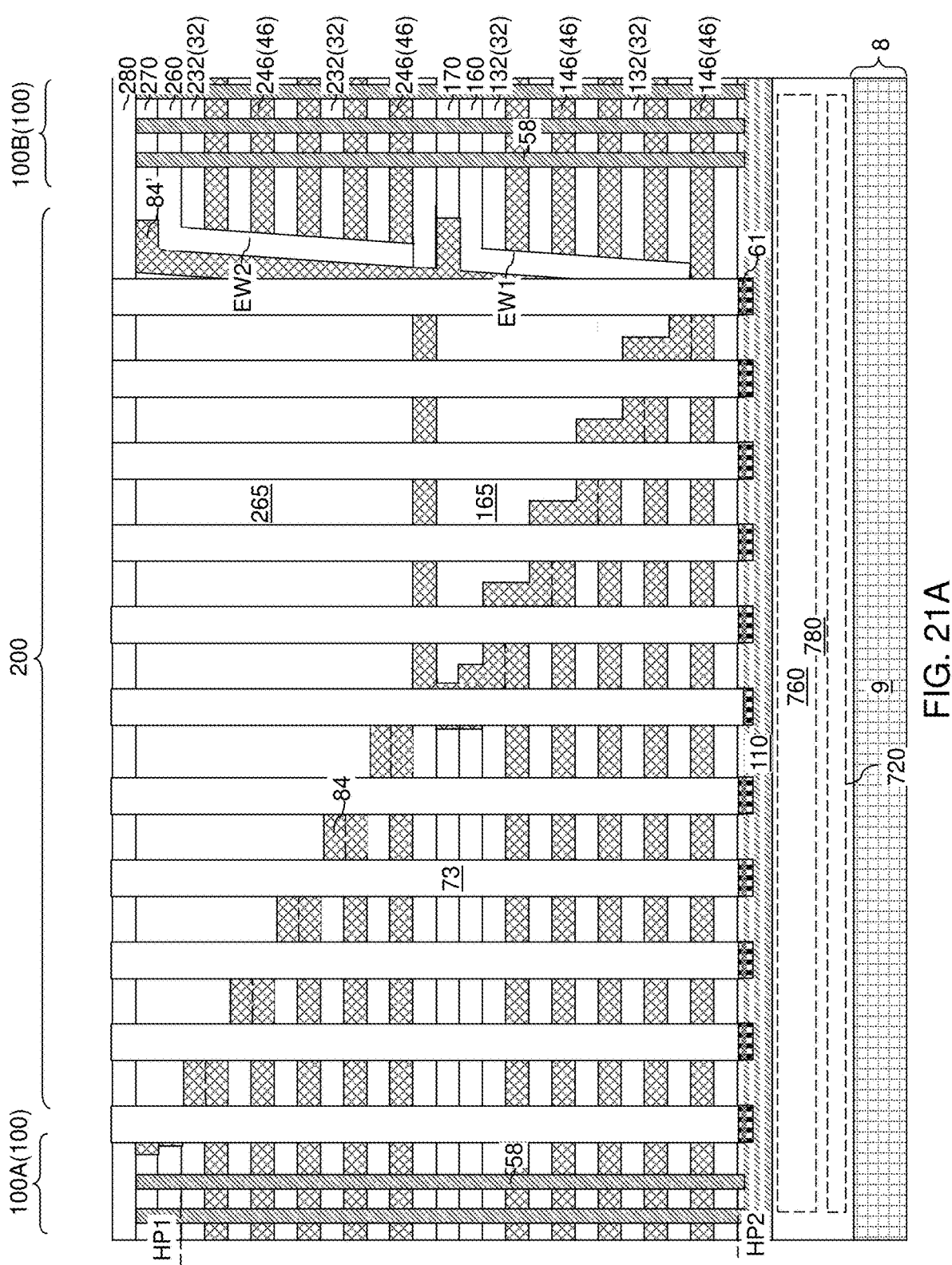
FIGS. 21A-21I are various views of the first exemplary structure after formation of lateral isolation trench fill structures and lateral isolation structures according to an embodiment of the present disclosure.
Figure 21B:
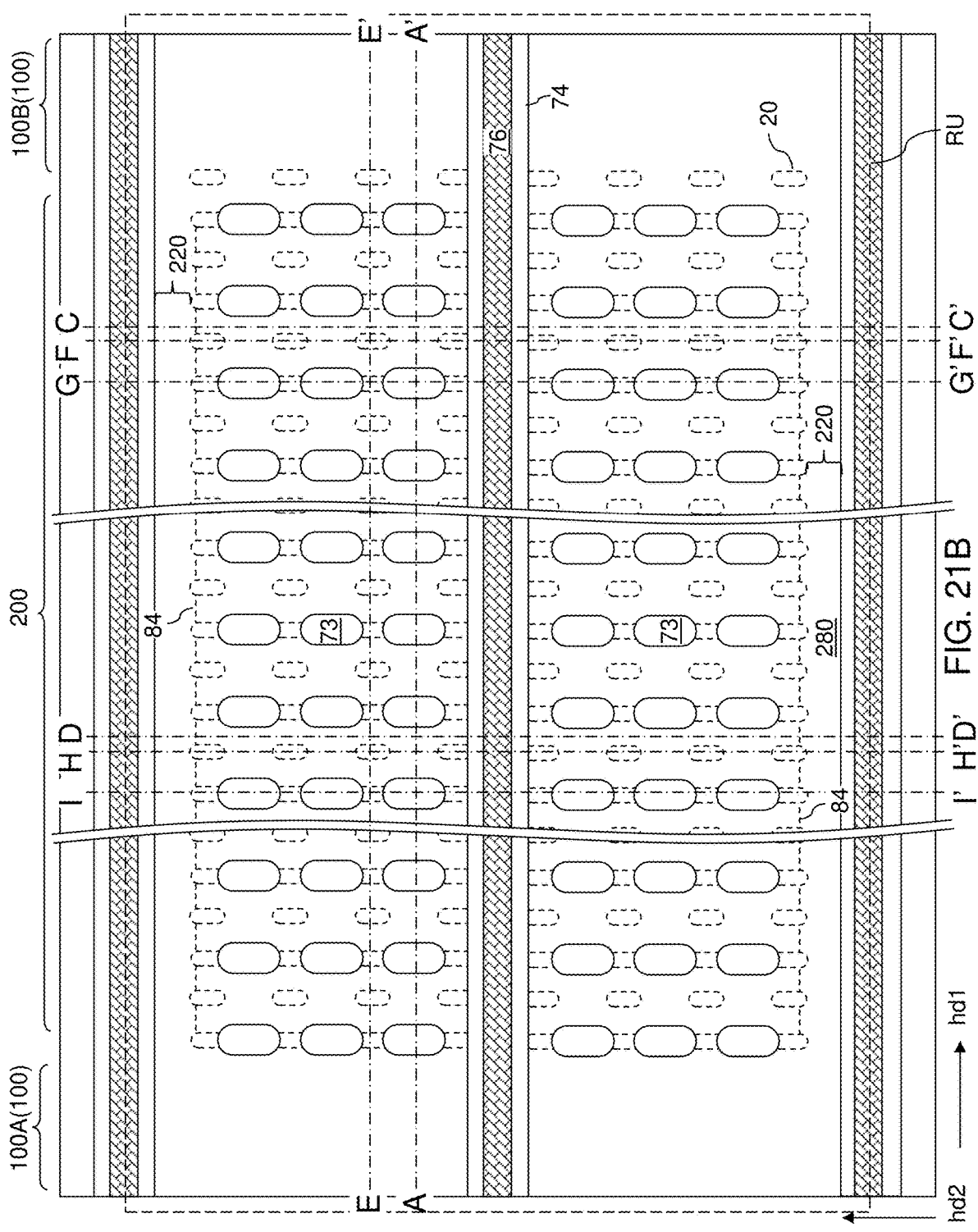
Figure 21C:
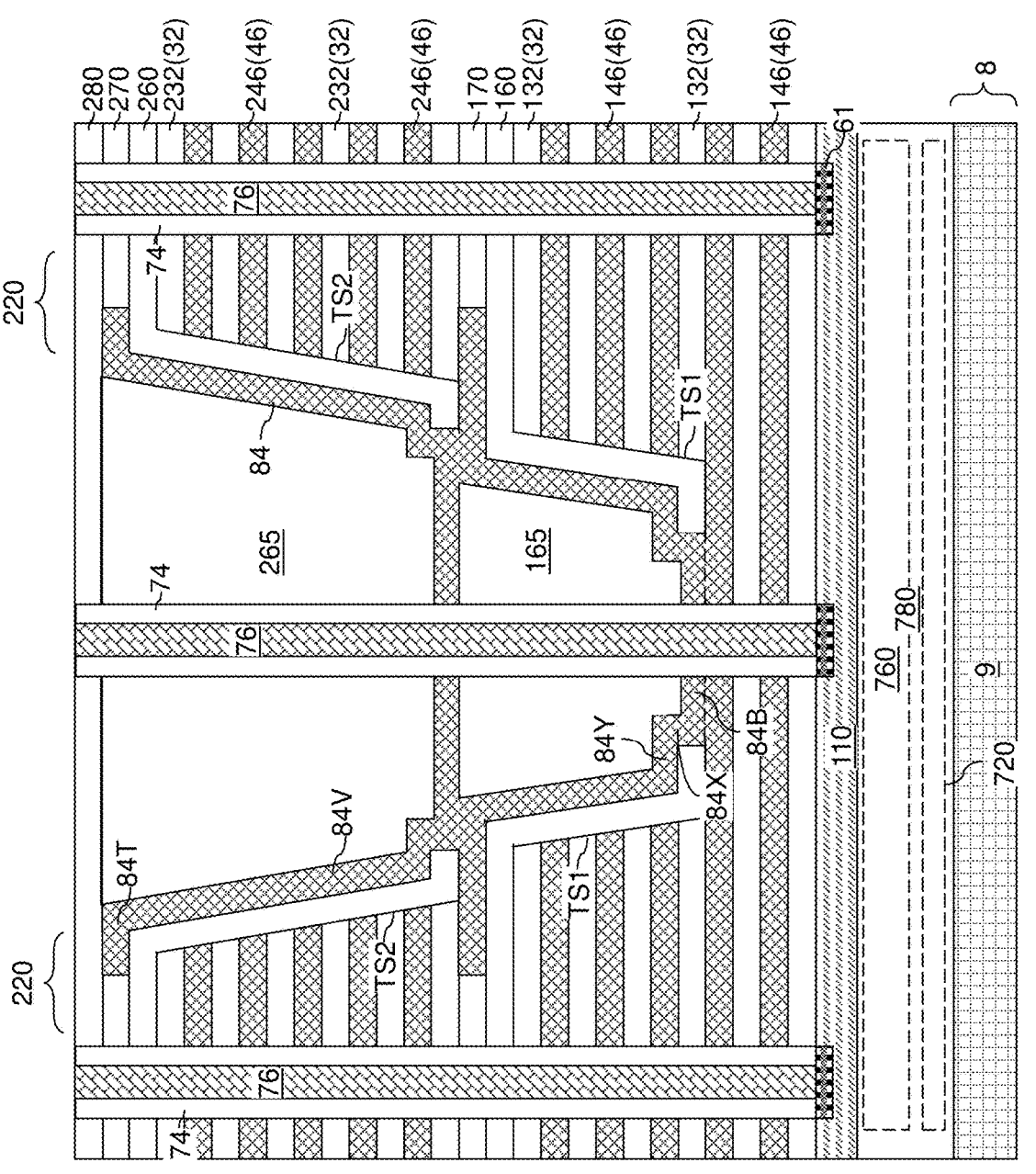
Figure 21D:
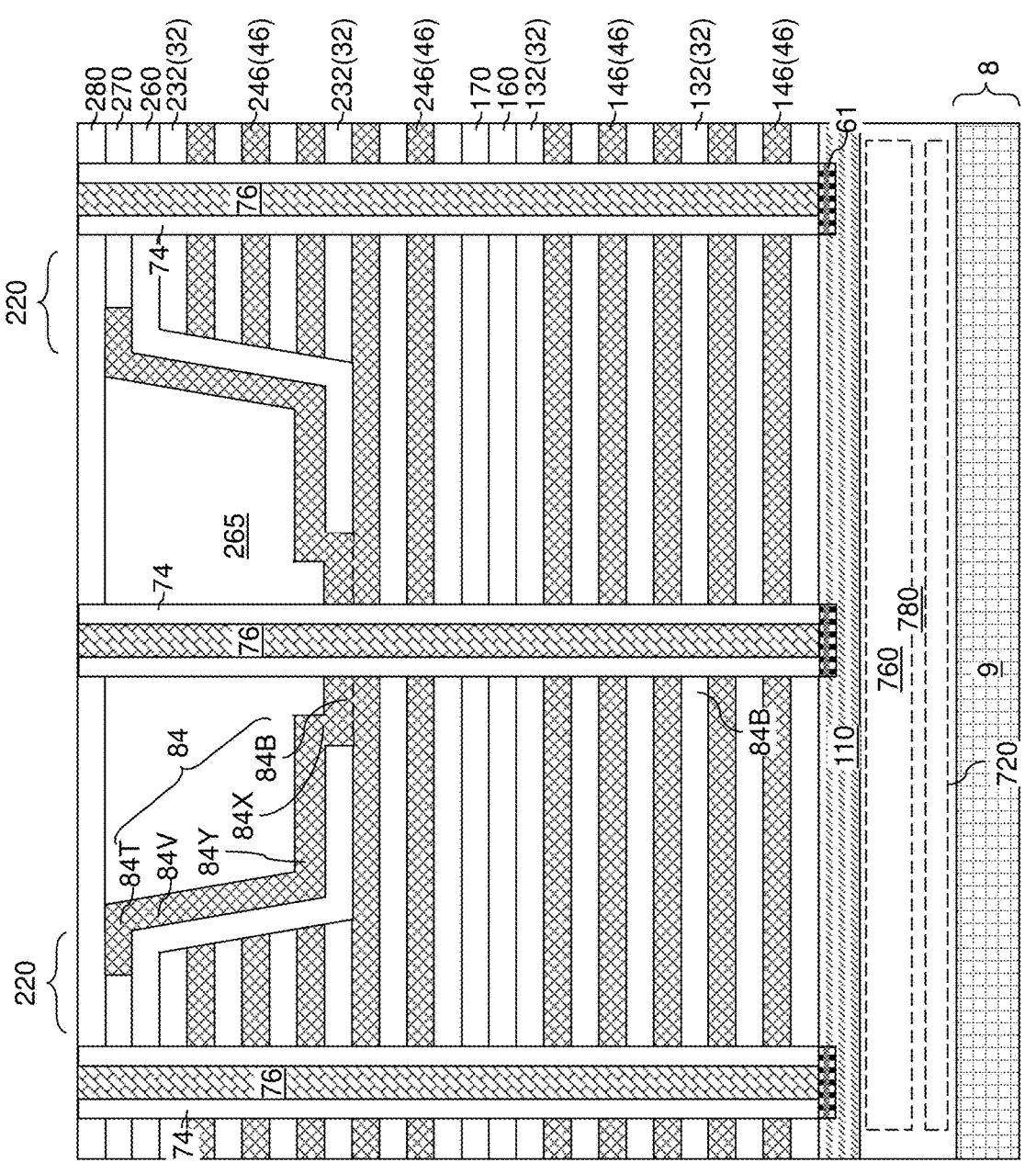
Figure 21E:
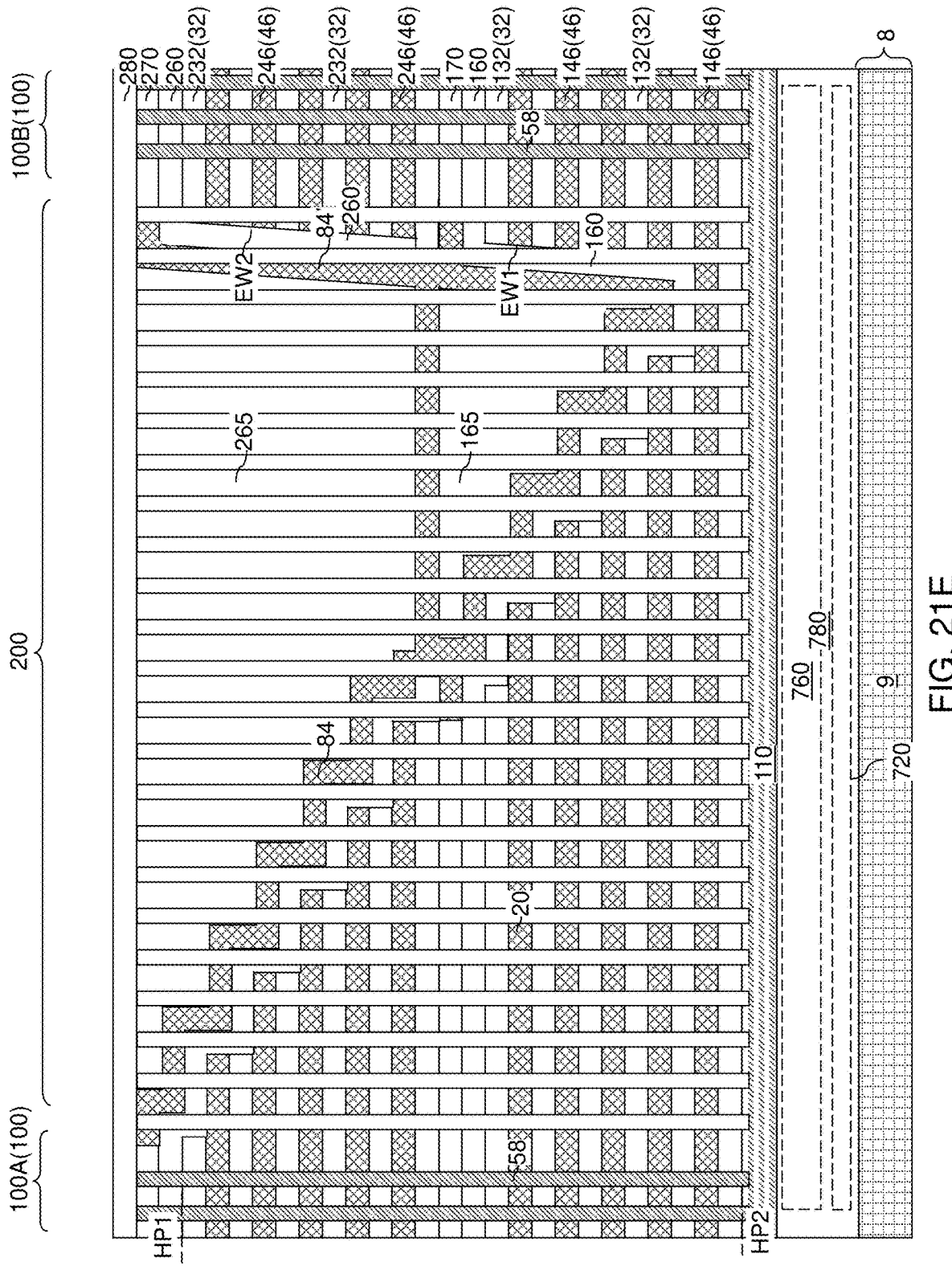
Figure 21F:
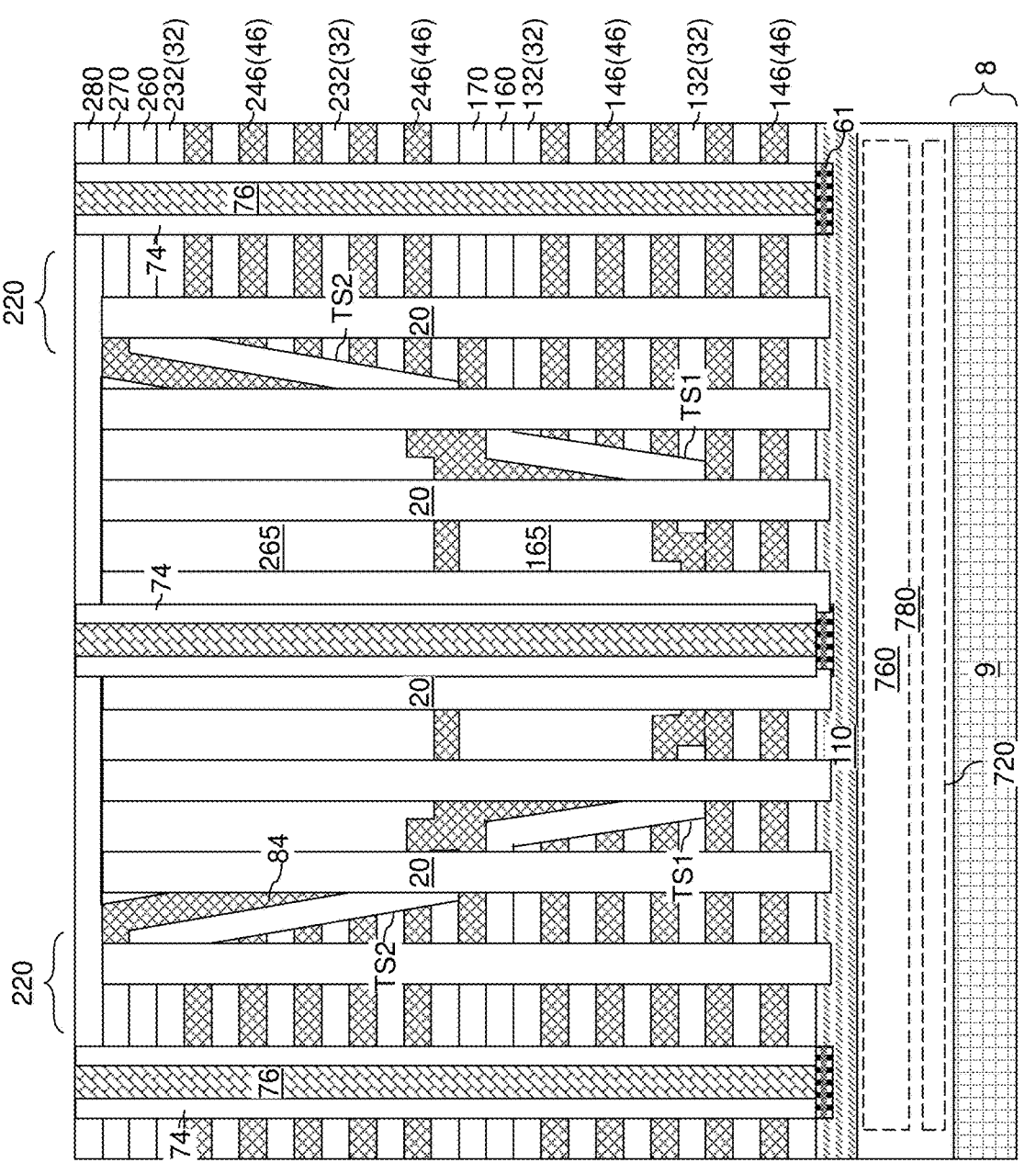
Figure 21G:
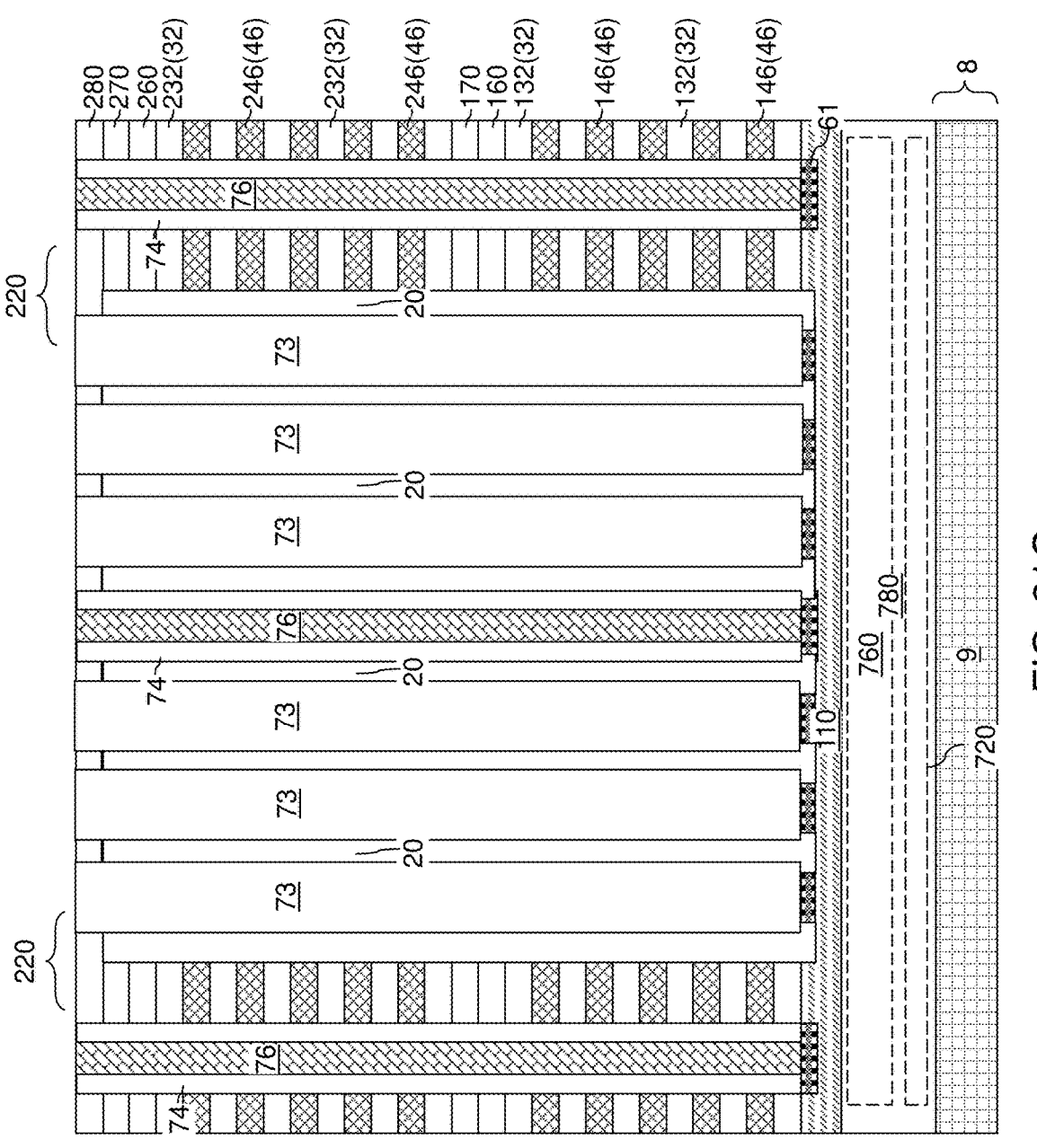
Figure 21H:
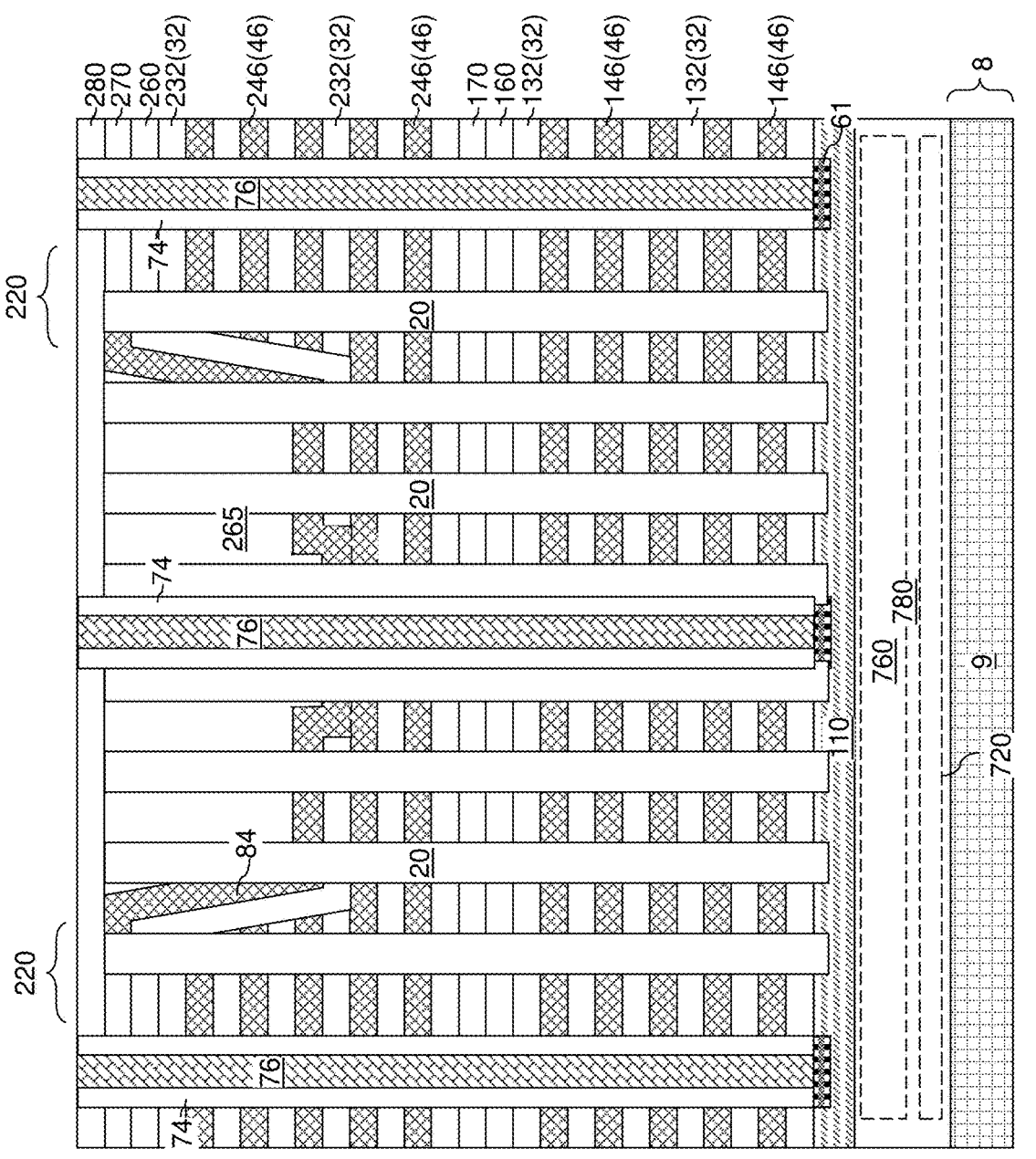
Figure 21I:
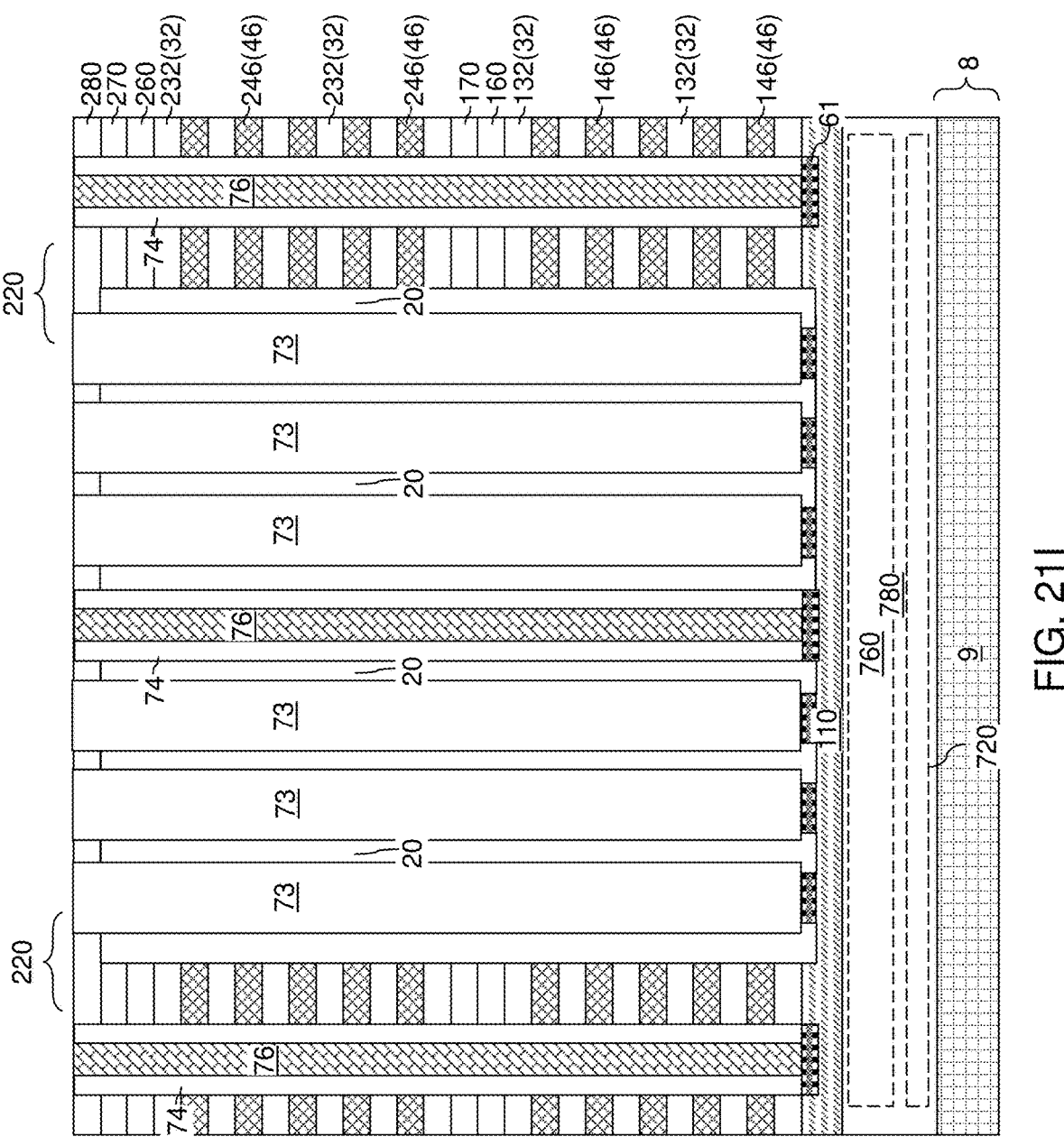

In one embodiment, each of the electrically conductive strips 84 and the respective one of the electrically conductive layers 46 are formed as a unitary structure (i.e., a single continuous structure) including a conductive material portion (such as a metallic barrier layer or a metallic fill material portion) that extends continuously between a volume of a respective electrically conductive strip 84 and the respective one of the electrically conductive layers 46. Thus, the second horizontally-extending portion of a strip 84 forms a step on the top surface of the respective electrically conductive layer 46 within the unitary structure, as shown in FIGS. 20A, 20C and 20D. Therefore, the strips 84 function as word line contact via structures.

In one embodiment, the drain side select gate electrodes (i.e., the uppermost second electrically conductive layers 246) may have separate contact via structures located in a separate staircase region located on opposite end of each memory array region 100 from the end which faces the contact region 200. In this embodiment, the strips 84 function as word line contact via structures and source side select gate electrode contact via structures, but not as drain side select gate electrode contact via structures.

In one embodiment, each insulating liner (160, 260) includes a first horizontally-extending portion overlying a plurality of electrically conductive layers 46, and a plurality of additional tapered vertically-extending portions that overlie a respective tapered sidewall (TS1, TS2) of the tapered sidewalls (TS1, TS2). In one embodiment, each insulating liner (160, 260) includes a plurality of second horizontally-extending portions overlying a bottom surface of a respective cavity (169, 269) and underlying the second horizontally-extending portion of a respective one of the electrically conductive strips 84.

Referring to FIGS. 21A-21I, an insulating material layer can be conformally deposited in the lateral isolation trenches 79, in the isolation cavities 77, and over the dielectric capping layer 280. In one embodiment, the insulating material layer may have a thickness that is greater than one half of the maximum width of the isolation cavities 77. In this case, the insulating material layer may fill the isolation cavities 77 in a manner that plugs a least a top portion of each isolation cavity 77.

An anisotropic etch process can be performed to remove horizontally-extending portions of the insulating material layer. Each remaining vertically-extending portion of the insulating material layer that is formed in a respective lateral isolation trench 79 constitutes an insulating isolation trench spacer 74. Each remaining portion of the insulating material layer that fills the isolation cavities 77 constitutes an isolation pillar structure 73.

At least one conducive material can be deposited in remaining unfilled volumes of the lateral isolation trenches 79 to form source contact via structures 76, which can be conductive wall structures laterally extending along the first horizontal direction hd1. Each contiguous combination of an insulating isolation trench spacer 74 and a source contact via structure 76 constitutes a lateral isolation trench fill structure (74, 76) that fills a respective lateral isolation trench 79. The lateral isolation trench fill structures (74, 76) comprise first lateral isolation trench fill structures (74, 76) that contact a respective pair of at least one dielectric fill structure (165, 265), and second lateral isolation trench fill structures (74, 76) that do not contact any dielectric fill structure (165, 265).

The isolation pillar structures 73 and the support pillar structures 20 are lateral isolation structures that provide electrical isolation between neighboring pairs of electrically conductive strips 84 that are laterally spaced apart along the first horizontal direction hd1 between a respective lateral isolation trench fill structure (74, 76) and a respective set of tapered sidewalls (TS1, TS2) of the alternating stack of insulating layers 32 and electrically conductive layers 46. Each lateral isolation structures (73, 20) can include a respective contiguous set of at least one support pillar structure 20 and at least one isolation pillar structure 73 that continuously extends along the second horizontal direction hd2 between a respective lateral isolation trench fill structure (74, 76) and a respective set of tapered sidewalls (TS1, TS2) of an alternating stack of insulating layers 32 and electrically conductive layers 46.

The lateral isolation structures separate (73, 20) adjacent strips 84 along first horizontal direction (i.e., the word line direction) hd1, such that each strip 84 contacts only one respective electrically conductive layer 46 in the stepped cavities (169, 269), since the electrically conductive layers 46 form the stepped bottom surfaces of the stepped cavities. This prevents the strips 84 from short circuiting vertically separated electrically conductive layers 46.

Generally, an array of lateral isolation structures (20, 73) vertically extends from a first horizontal plane HP1 including the topmost surface of the alternating stack (32, 46) to a second horizontal plane HP2 including a bottommost surface of the alternating stack (32, 46) and located between a respective neighboring pair of tapered sidewalls (TS1, TS2) among the tapered sidewalls (TS1, TS2) of the alternating stack (32, 46).

In one embodiment, a first lateral isolation trench fill structure (74, 76) may have a first lengthwise sidewall that contacts each layer of the alternating stack (32, 46) and laterally extends along the first horizontal direction hd1. A second lateral isolation trench fill structure (74, 76) may have a second lengthwise sidewall, which contacts each layer of the alternating stack (32, 46) and laterally extends along the first horizontal direction hd1 and is laterally spaced from the first lateral isolation trench fill structure (74, 76) along the second horizontal direction hd2. An array of lateral isolation structures (20, 73) contacts the first lateral isolation trench fill structure (74, 76) and does not contact the second lateral isolation trench fill structure (74, 76).

In one embodiment, a lateral isolation structure (20, 73) within the array of lateral isolation structures (20, 73) comprises: at least one support pillar structures 20 vertically extending from the horizontal plane including the bottom surface of the capping dielectric layer 280 and at least to a second horizontal plane HP2 including a bottommost surface of the alternating stack (32, 46); and at least one isolation pillar structure 73 vertically extending from a horizontal plane including a top surface of the capping dielectric layer 280 and at least to the second horizontal plane HP2 and in contact with the at least two support pillar structures 20.

Each volume that is laterally surrounded by a first lateral isolation trench fill structure (74, 76), a tapered sidewall (TS1, TS2) of an alternating stack of insulating layers 32 and electrically conductive layers 46, and a neighboring pair of lateral isolation structures (20, 73) constitutes a well. The well can be filled with a respective patterned set of a second dielectric fill structure 265, optionally within a respective portion of a first dielectric fill structure 165, at least one insulating liner (160, 260), and an electrically conductive strip 84.

Each layer of the alternating stack (32, 46) is present within the first and second memory array regions (100A, 100B). At least a portion of the first electrically conductive layers 146 and at least a portion of the second electrically conductive layers 246 continuously extend from the first memory array region 100A to the second memory array region 100B through an array interconnection region (e.g., "bridge" region) 220 located between the respective lateral isolation trench fill structure (74, 76) and the respective contact any dielectric fill structure (165, 265) in the respective cavity (169, 269) in the contact region 200. The first horizontally-extending portion of each of the electrically conductive strips 84 overlies the alternating stack (32, 46) in the interconnection region 220. The vertically-extending portion of each of the electrically conductive strips 84 overlies the respective tapered sidewall (TS1, TS2) of the interconnection region 220.

In one embodiment, the alternating stack (32, 46) laterally extends from the first lateral isolation trench fill structure (74, 76) to the second lateral isolation trench fill structure (74, 76) in the first memory array region 100A and in the second memory array region 100B, and has a lesser extent along the second horizontal direction hd2 within the interconnection region 220 of the contact region 200 than a lateral spacing between the first lateral isolation trench structure (74, 76) and the second lateral isolation trench structure (74, 76). The interconnection region 220 is located between the first lateral isolation trench fill structure (74, 76) and the tapered sidewalls (TS1, TS2) of the alternating stack (32, 46).

Figure 22A:
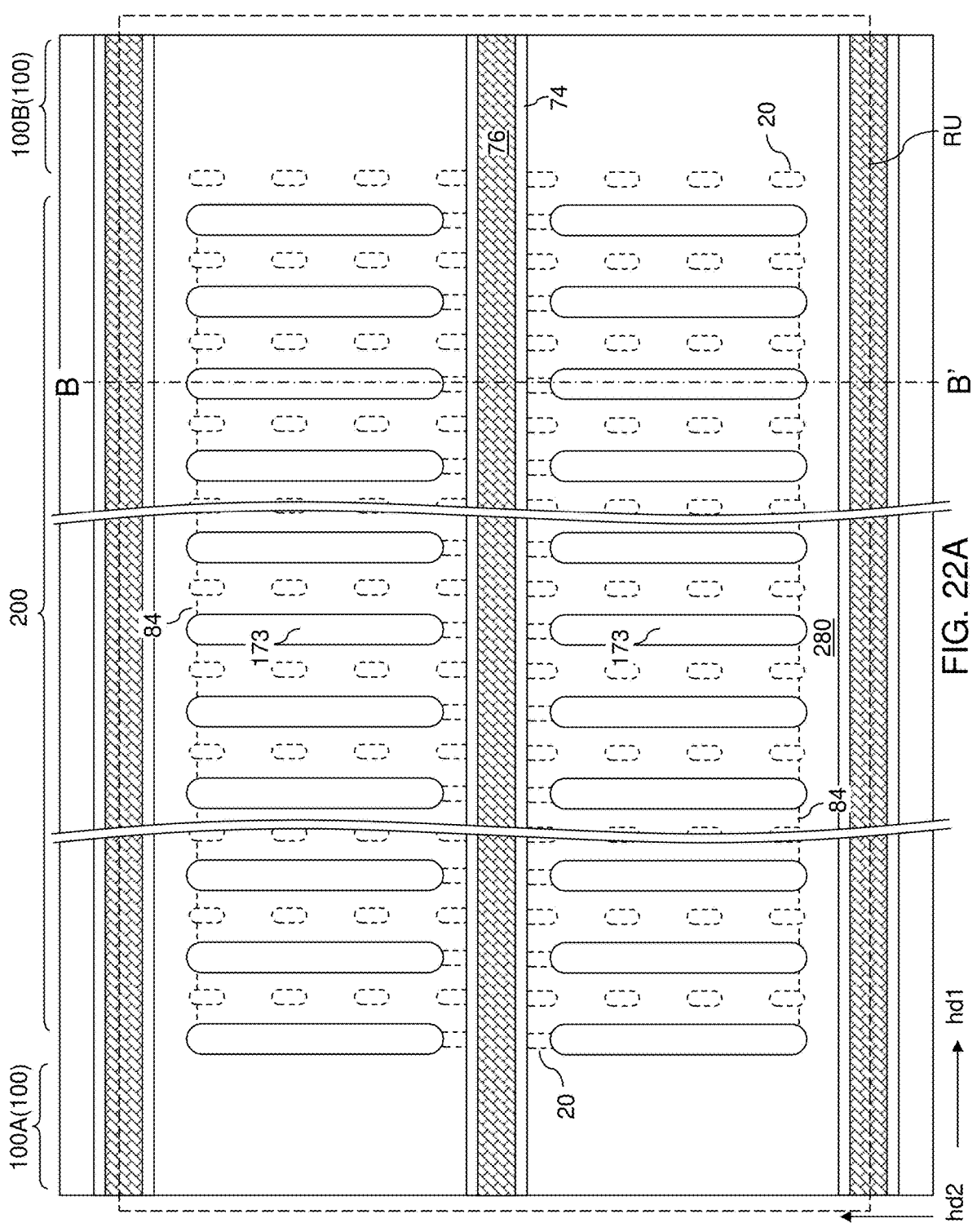
FIG. 22A is a vertical cross-sectional view of a first alternative configuration of the first exemplary structure after formation of lateral isolation trench fill structures and lateral isolation structures according to an embodiment of the present disclosure.
Figure 22B:
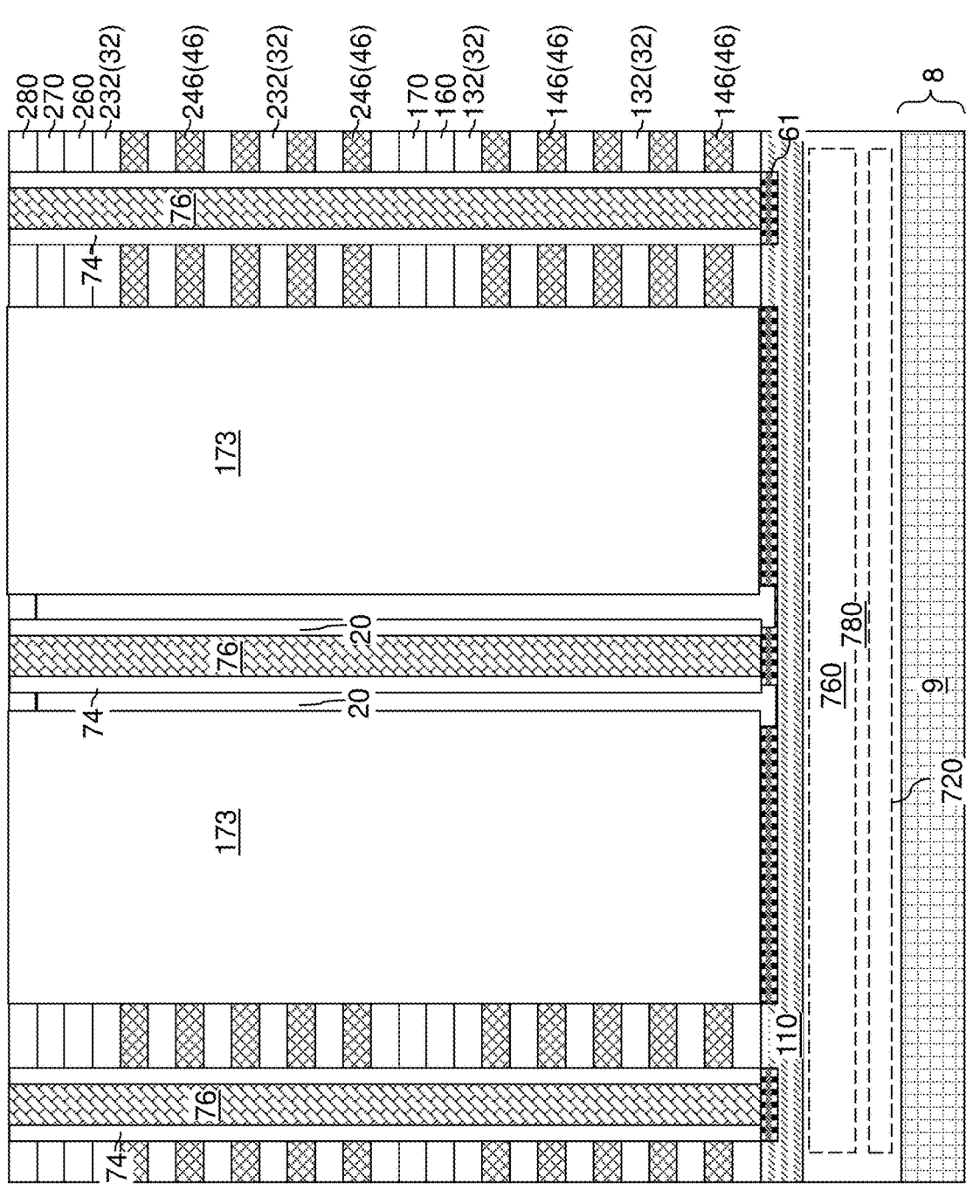
FIG. 22B is a top-down view of the first alternative configuration of the first exemplary structure of FIG. 22A. The vertical plane A-A' is the cut plane of FIG. 22A.

Referring to FIGS. 22A and 22B, a first alternative configuration of the first exemplary structure is illustrated, which can be derived from the first exemplary structure illustrated in FIGS. 18A-18I by forming elongated isolation cavities that are elongated along the second horizontal direction hd2 in lieu of the isolation cavities described with reference to FIGS. 18A-18I, and by forming isolation wall structures 173 in lieu of isolation pillar structures 72 at the processing steps described with reference to FIGS. 21A-21I. Each isolation wall structure 173 may laterally extend along the second horizontal direction hd2.

In this embodiment, a lateral isolation structure (20, 173) within the array of lateral isolation structures (20, 173) comprises: at least one support pillar structures 20 vertically extending from the horizontal plane including the bottom surface of the capping dielectric layer 280 and at least to a second horizontal plane HP2 including a bottommost surface of the alternating stack (32, 46); and an elongated isolation wall structure 173 vertically extending from a horizontal plane including a top surface of the capping dielectric layer 280 and at least to the second horizontal plane HP2 and in contact with the at least two support pillar structures 20.

Figure 23A:
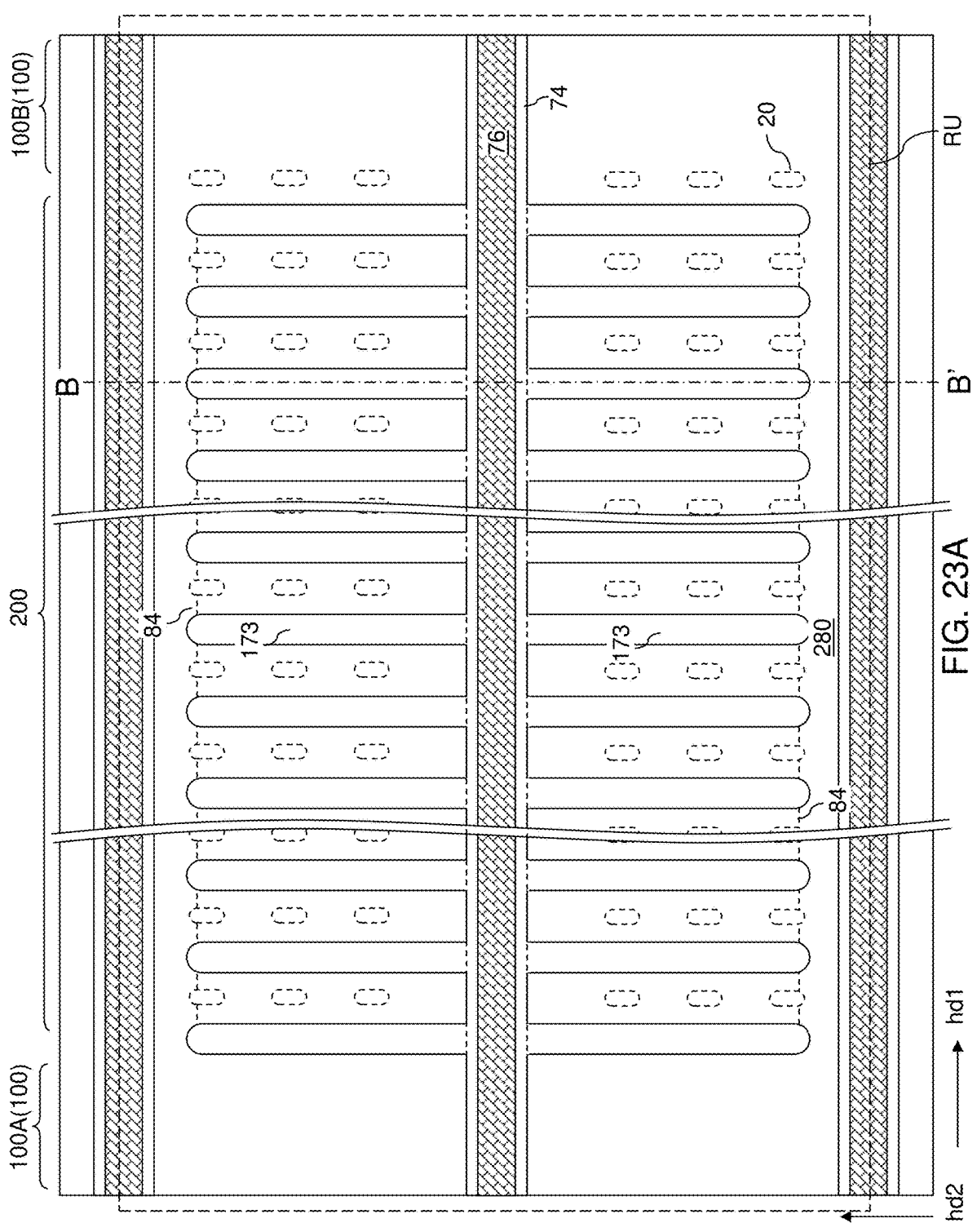
FIG. 23A is a vertical cross-sectional view of a second alternative configuration of the first exemplary structure after formation of lateral isolation trench fill structures and lateral isolation structures according to an embodiment of the present disclosure.
Figure 23B:
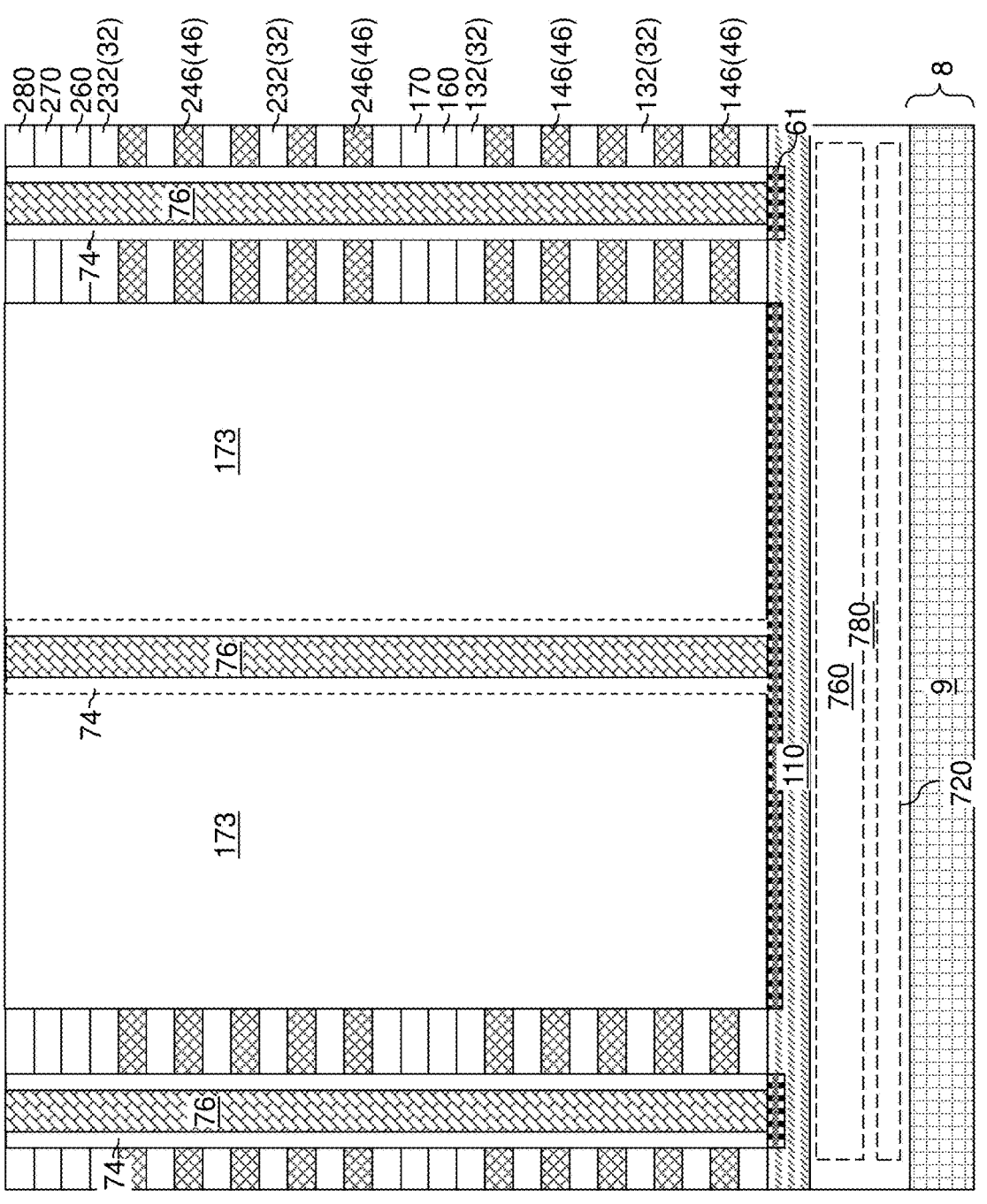
FIG. 23B is a top-down view of the second alternative configuration of the first exemplary structure of FIG. 23A. The vertical plane A-A' is the cut plane of FIG. 23A.

Referring to FIGS. 23A and 23B, a second alternative configuration of the first exemplary structure is illustrated, which can be derived from the first alternative configuration of the first exemplary structure by further elongating the isolation trenches along the second horizontal direction hd2 so that the elongated isolation trenches are adjoined to a respective one of the lateral isolation trenches 79 and intersects a respective tapered sidewall (TS1, TS2). In this case, isolation wall structures 173 may be adjoined to a respective insulating isolation trench spacer 74.

In this embodiment, a lateral isolation structure 173 within the array of lateral isolation structures 173 comprises an elongated isolation wall structure 173 vertically extending from a horizontal plane including a top surface of the capping dielectric layer 280 and at least to the second horizontal plane HP2 and in contact with the at least two support pillar structures 20. The first lateral isolation trench fill structure (74, 76) comprises first insulating wall segments that are laterally spaced apart along the first horizontal direction hd1 and in contact with a respective subset of layers within the alternating stack (32, 46) and located within a same vertical plane, and the lateral isolation structure comprising the isolation wall structure 173 comprises a second insulating wall segment (such as a contoured vertical sidewall of the isolation wall structure 173) that is adjoined to a neighboring pair of first insulating wall segments within the first lateral isolation trench fill structure (74, 76).

Figure 24A:
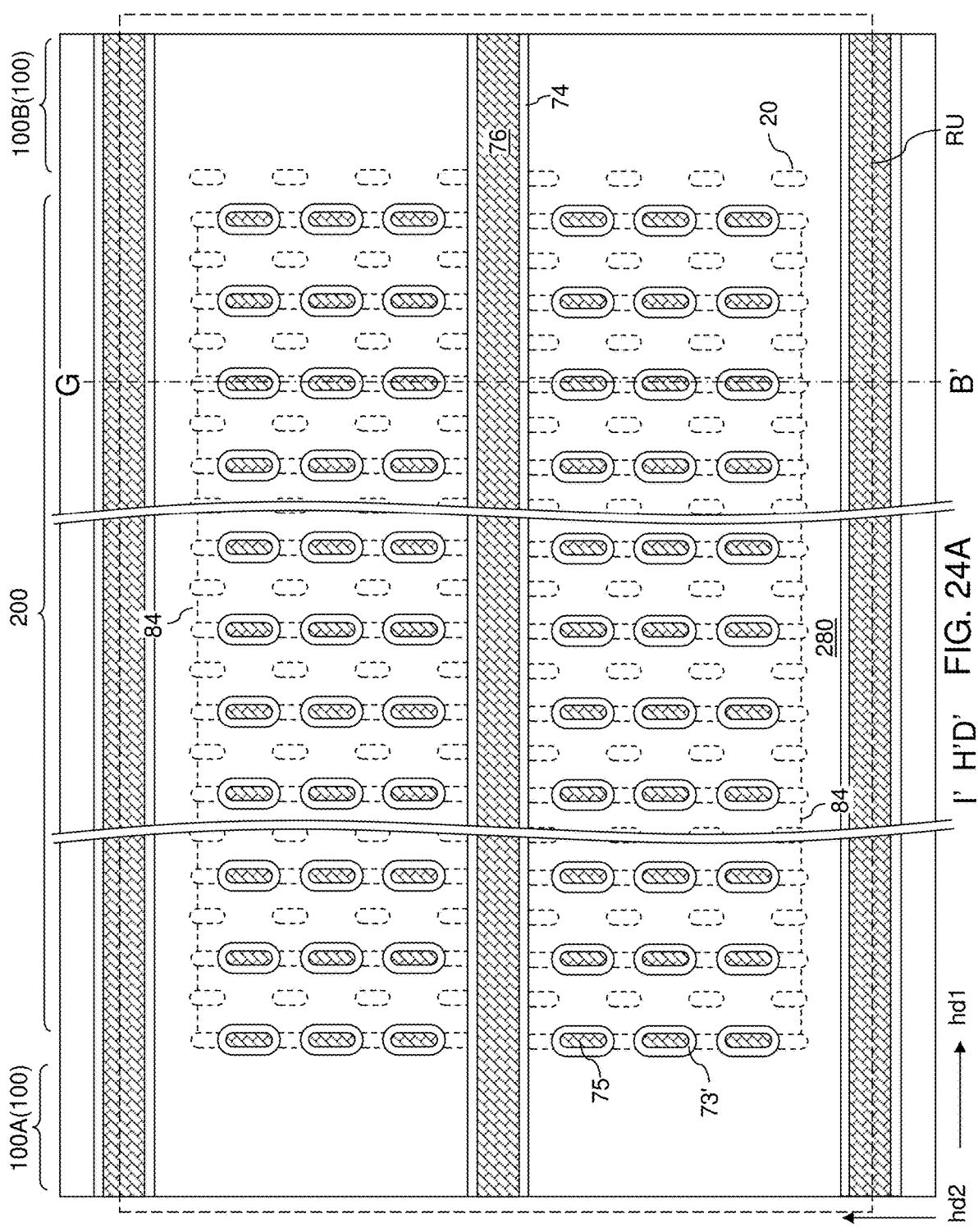
FIG. 24A is a vertical cross-sectional view of a third alternative configuration of the first exemplary structure after formation of lateral isolation trench fill structures and lateral isolation structures according to an embodiment of the present disclosure.
Figure 24B:
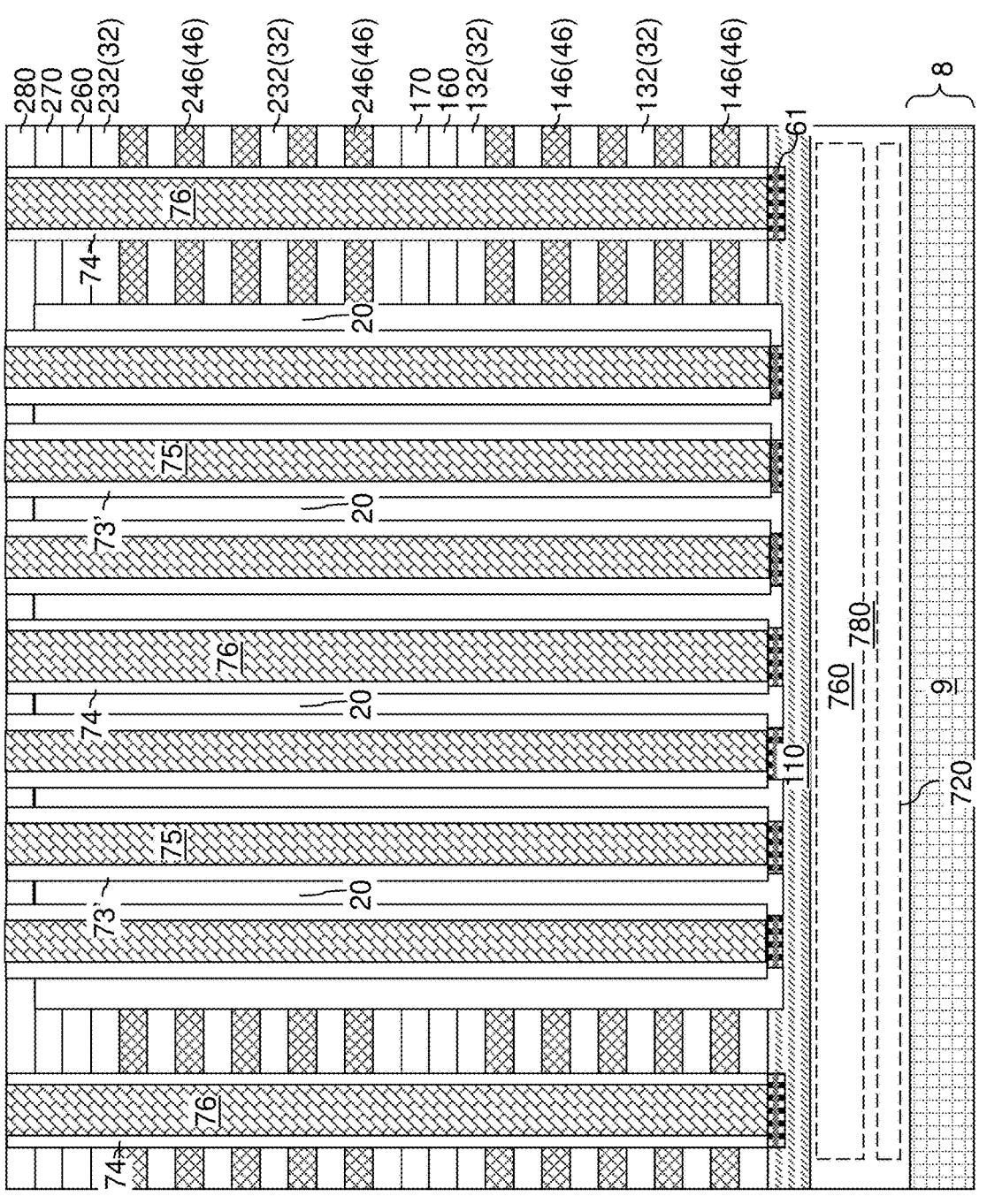
FIG. 24B is a top-down view of the third alternative configuration of the first exemplary structure of FIG. 24A. The vertical plane A-A' is the cut plane of FIG. 24A.

Referring to FIGS. 24A and 24B, a third alternative configuration of the first exemplary structure is illustrated, which can be derived from any of the first exemplary structures illustrated in FIGS. 21A-21I, 22A and 22B, or 23A and 23B by reducing thickness of the insulating material layer such that a void is present within the volumes of the isolation cavities 77 or within volumes of elongated isolation cavities after an anisotropic etch process that forms the insulating isolation trench spacers 74. In this case, each remaining portion of the insulating material layer that remains within the volumes of the isolation cavities 77 or within the volumes of the elongated isolation cavities constitutes an isolation liner 73' having the same lateral thickness as the insulating isolation trench spacers 74. In one embodiment, the isolation liners 73' may be formed in a tubular configuration. A conductive fill structure 75 may be formed within each remaining volume of the isolation cavities 77 or elongated isolation cavities 77. Each conductive fill structure 75 may be laterally surrounded by a respective isolation liner 73'. Each contiguous combination of an isolation liner 73' and a conductive fill structure 75 constitutes a component of a lateral isolation structure (20, 73', 75).

In this embodiment, a lateral isolation structure (20, 73', 75) within the array of lateral isolation structures (20, 73', 75) comprises: at least one support pillar structures 20 vertically extending from the horizontal plane including the bottom surface of the capping dielectric layer 280 and at least to a second horizontal plane HP2 including a bottommost surface of the alternating stack (32, 46); an isolation liner 73' which may optionally have a respective tubular configuration, and a conductive fill structure 75 which may be partially or completely surrounded by the isolation liner 73'. Thus, the lateral isolation structure (20, 73', 75) within the array of lateral isolation structures (20, 73', 75) comprises an isolation liner 73' and a conductive fill structure 75 that is laterally spaced from the alternating stack (32, 46) by the isolation liner 73'.

Figure 25A:
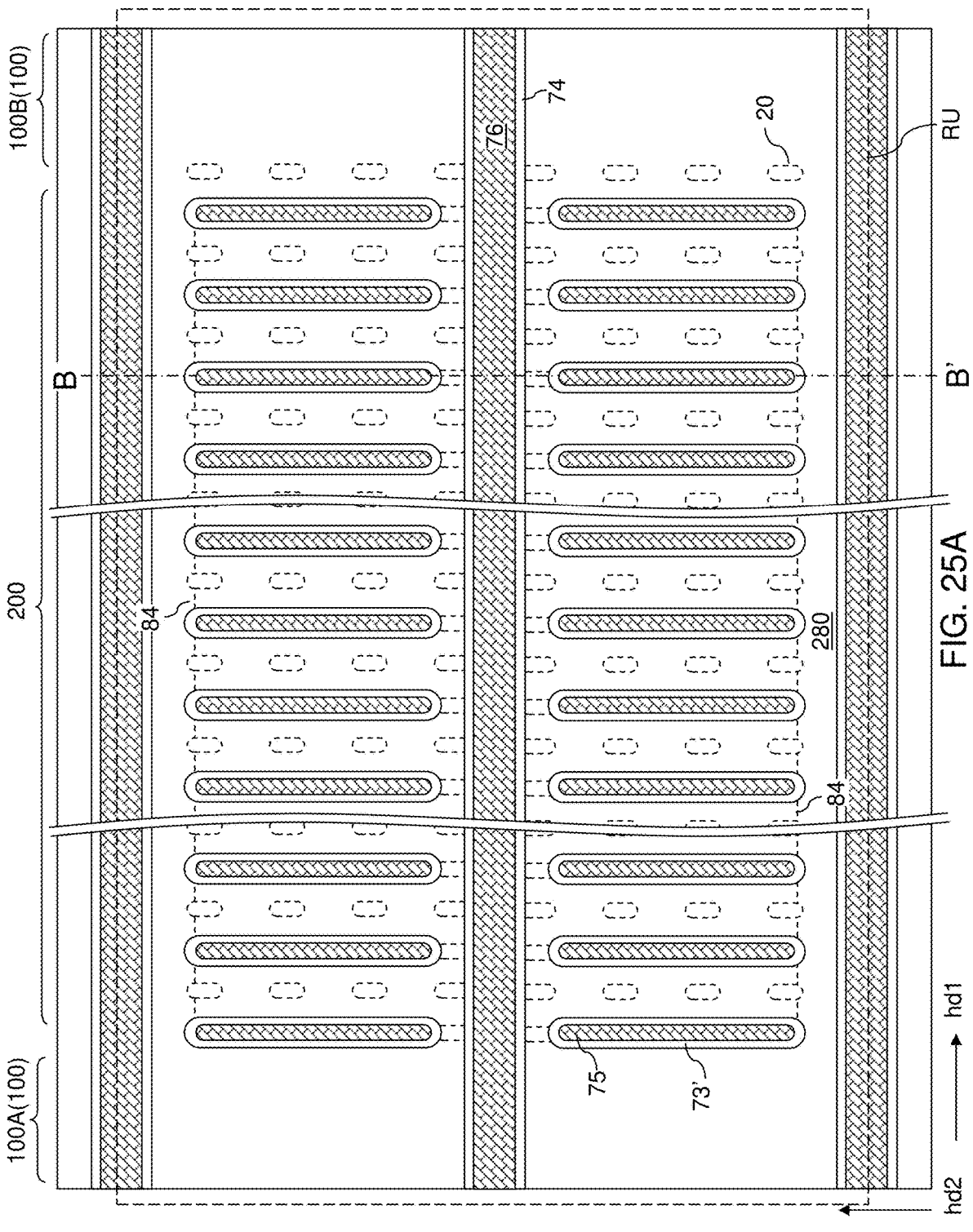
FIG. 25A is a vertical cross-sectional view of a fourth alternative configuration of the first exemplary structure after formation of lateral isolation trench fill structures and lateral isolation structures according to an embodiment of the present disclosure.
Figure 25B:
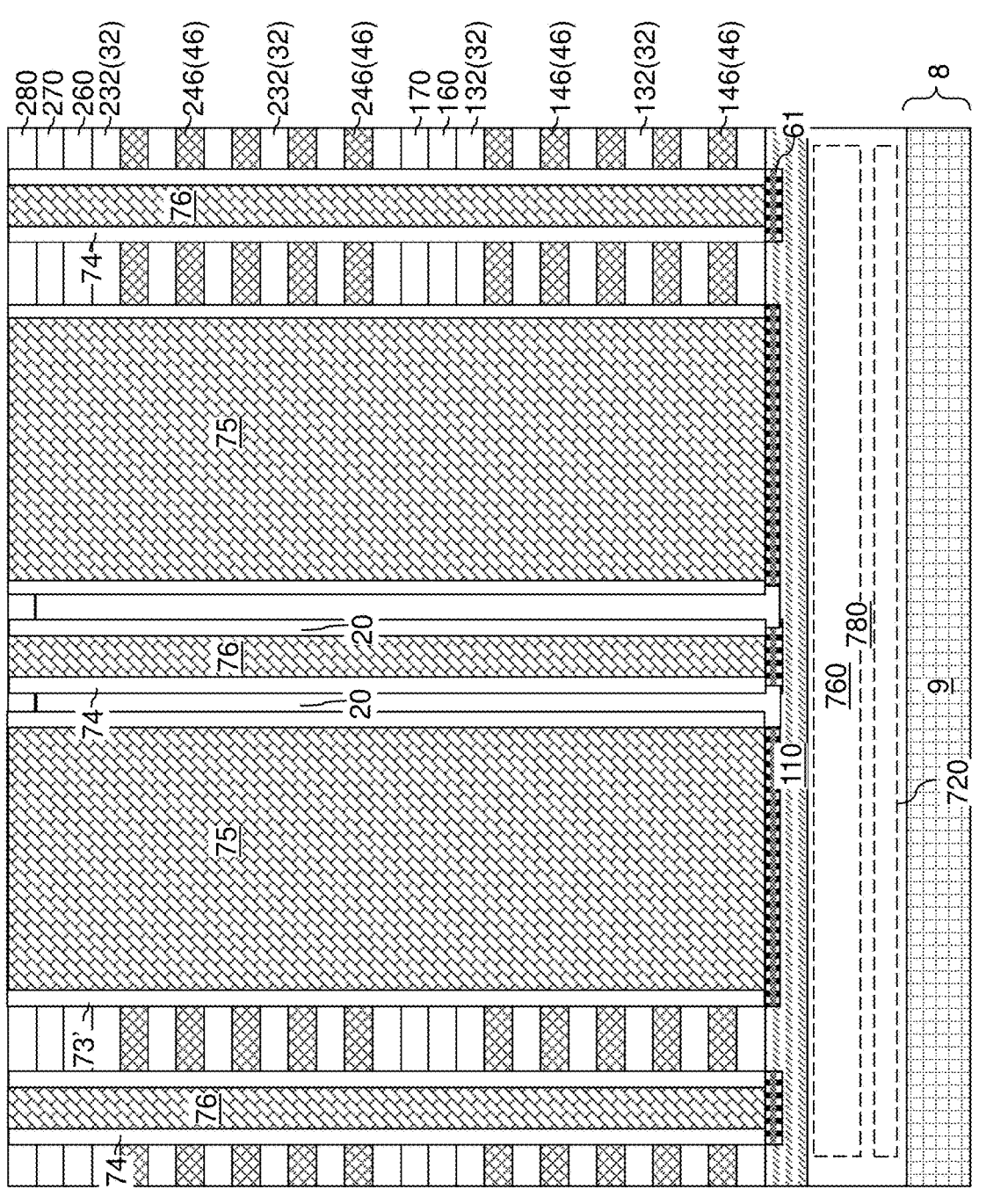
FIG. 25B is a top-down view of the fourth alternative configuration of the first exemplary structure of FIG. 25A. The vertical plane A-A' is the cut plane of FIG. 25A.

Referring to FIGS. 25A and 25B, a fourth alternative configuration of the first exemplary structure can be derived from the third configuration of the first exemplary structure by employing elongated isolation cavities in lieu of the isolation trenches employed in the third alternative configuration of the first exemplary structure. For example, elongated isolation cavities illustrated in the structure of FIGS. 22A and 22B may be employed. In one embodiment, the isolation liners 73' may be formed in a tubular configuration. A conductive fill structure 75 may be formed within each remaining volume of the isolation cavities 77 or elongated isolation cavities 77. Each conductive fill structure 75 may be laterally surrounded by a respective isolation liner 73'. Each contiguous combination of an isolation liner 73' and a conductive fill structure 75 constitutes a component of a lateral isolation structure (20, 73', 75).

In one embodiment, a lateral isolation structure (20, 73', 75) within the array of lateral isolation structures (20, 73', 75) comprises: at least one support pillar structures 20 vertically extending from the horizontal plane including the bottom surface of the capping dielectric layer 280 and at least to a second horizontal plane HP2 including a bottommost surface of the alternating stack (32, 46); an isolation liner 73' which may have a respective tubular configuration, and a conductive fill structure 75 which may be completely surrounded by, or may be partially surrounded by, the isolation liner 73'. In one embodiment, a lateral isolation structure (20, 73', 75) within the array of lateral isolation structures (20, 73', 75) comprises an isolation liner 73' and a conductive fill structure 75 that is laterally spaced from the alternating stack (32, 46) by the isolation liner 73'.

Figure 26A:
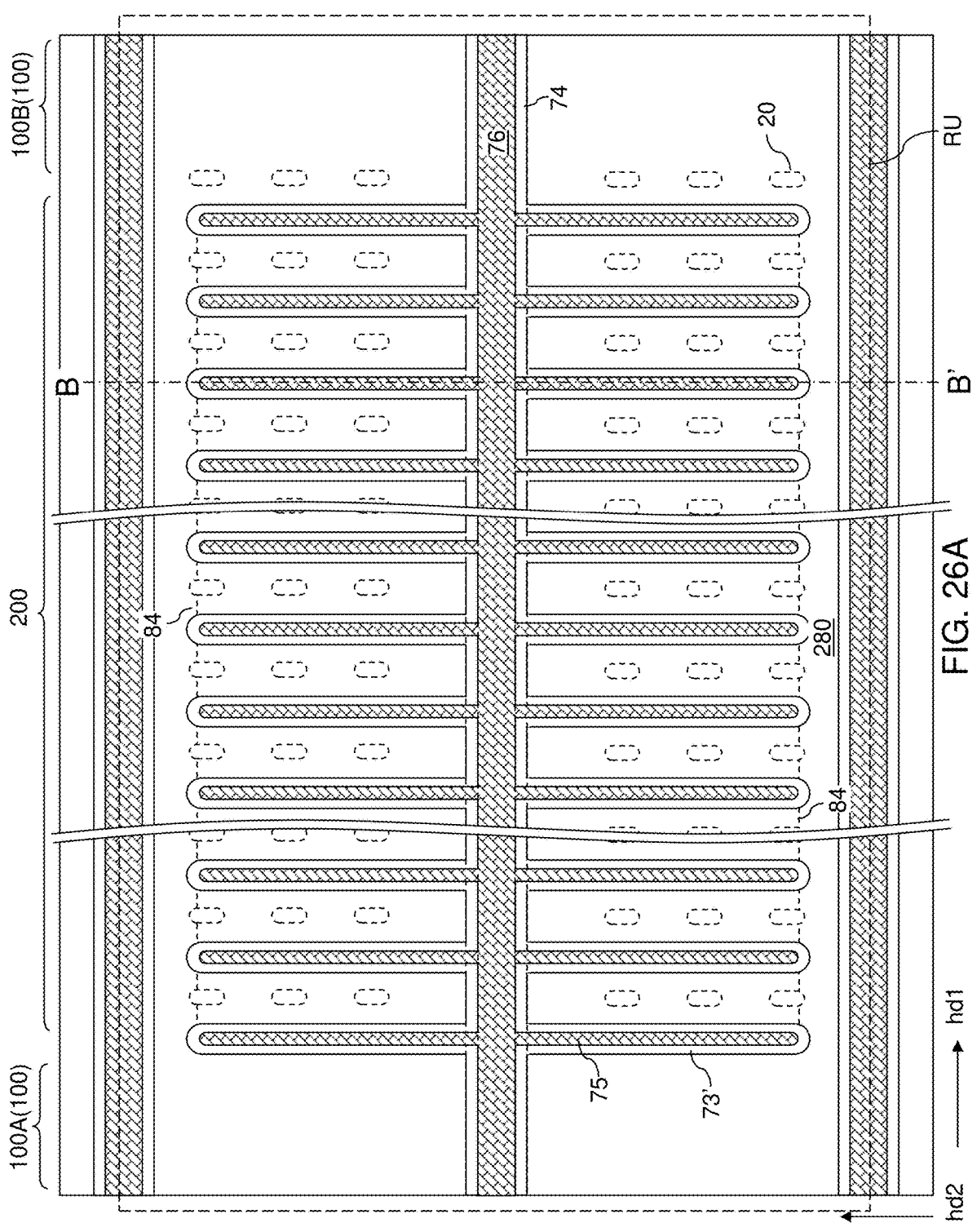
FIG. 26A is a vertical cross-sectional view of a fifth alternative configuration of the first exemplary structure after formation of lateral isolation trench fill structures and lateral isolation structures according to an embodiment of the present disclosure.
Figure 26B:
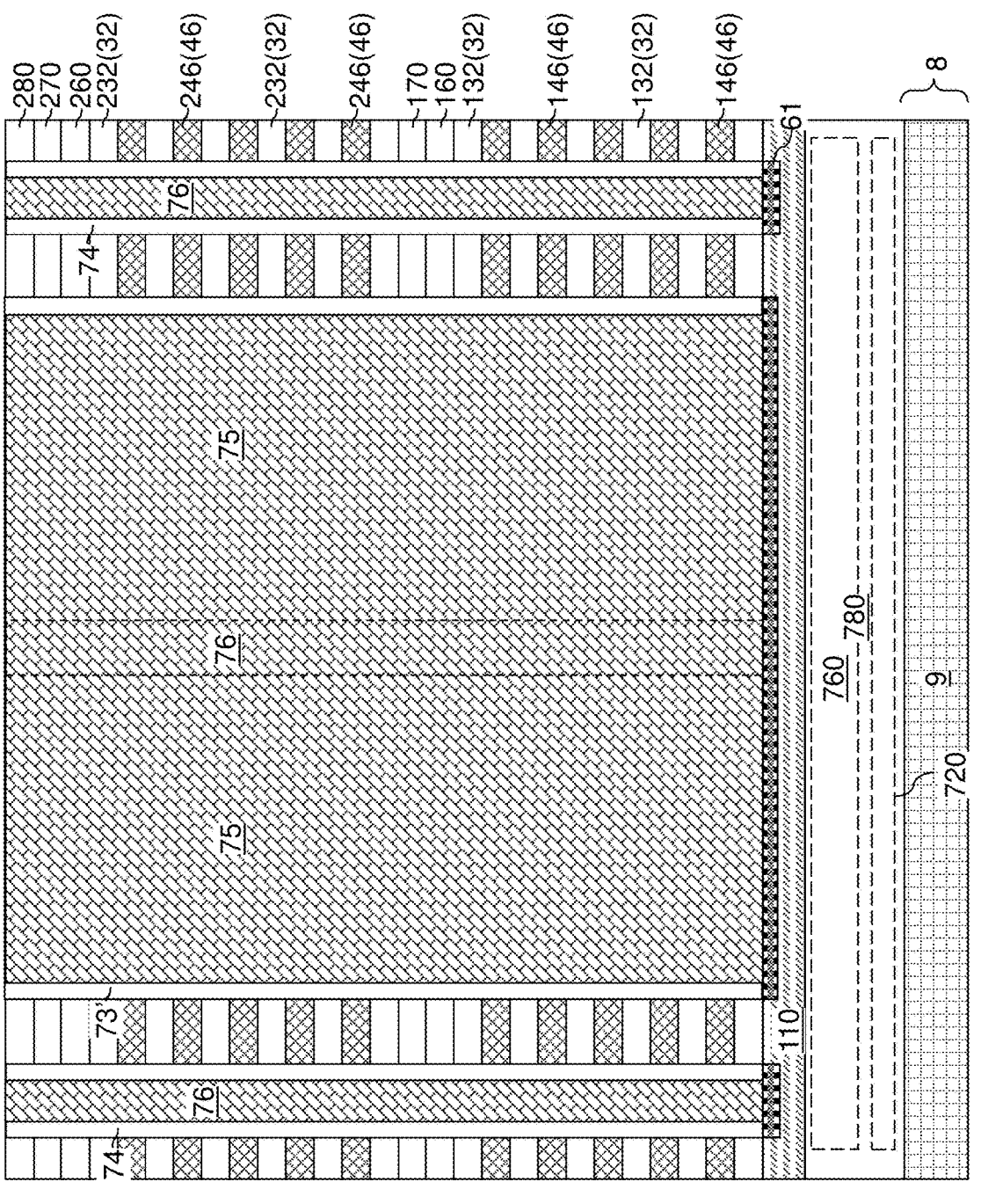
FIG. 26B is a top-down view of the fifth alternative configuration of the first exemplary structure of FIG. 26A. The vertical plane A-A' is the cut plane of FIG. 26A.
Figure 27A:
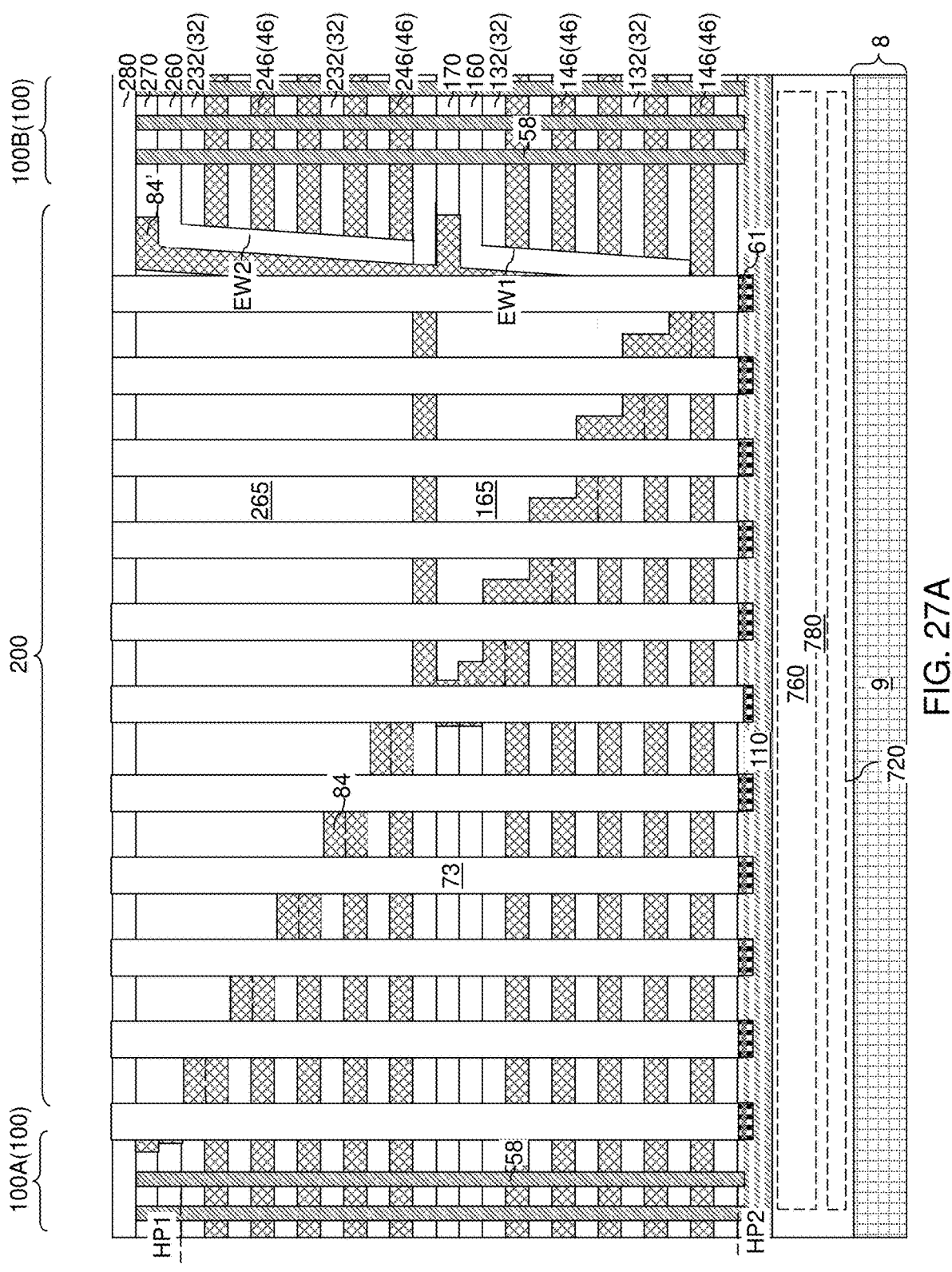
FIGS. 27A-27E are various views of the first exemplary structure after formation of drain-select-level isolation structures according to an embodiment of the present disclosure.
Figure 27B:
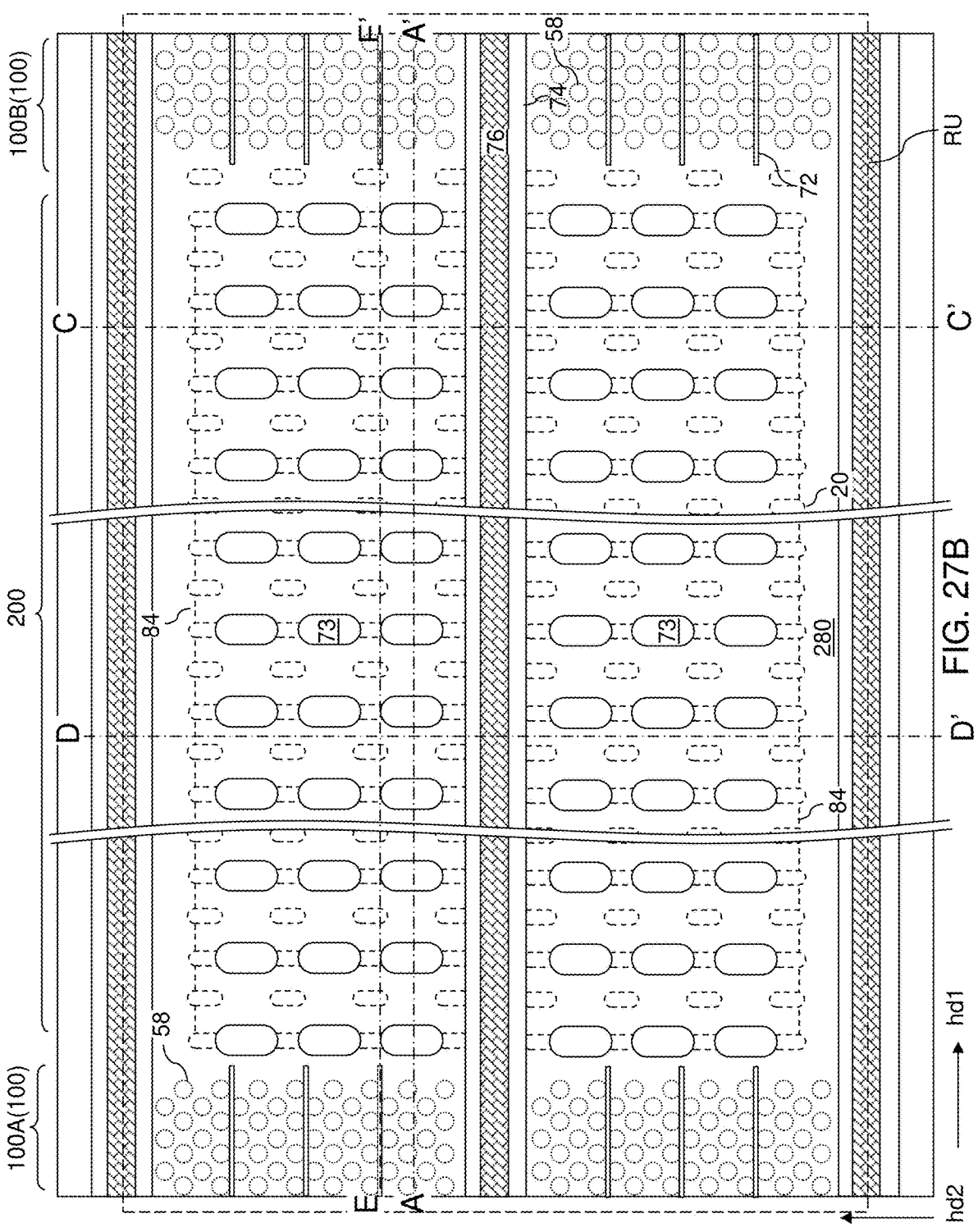
Figure 27C:
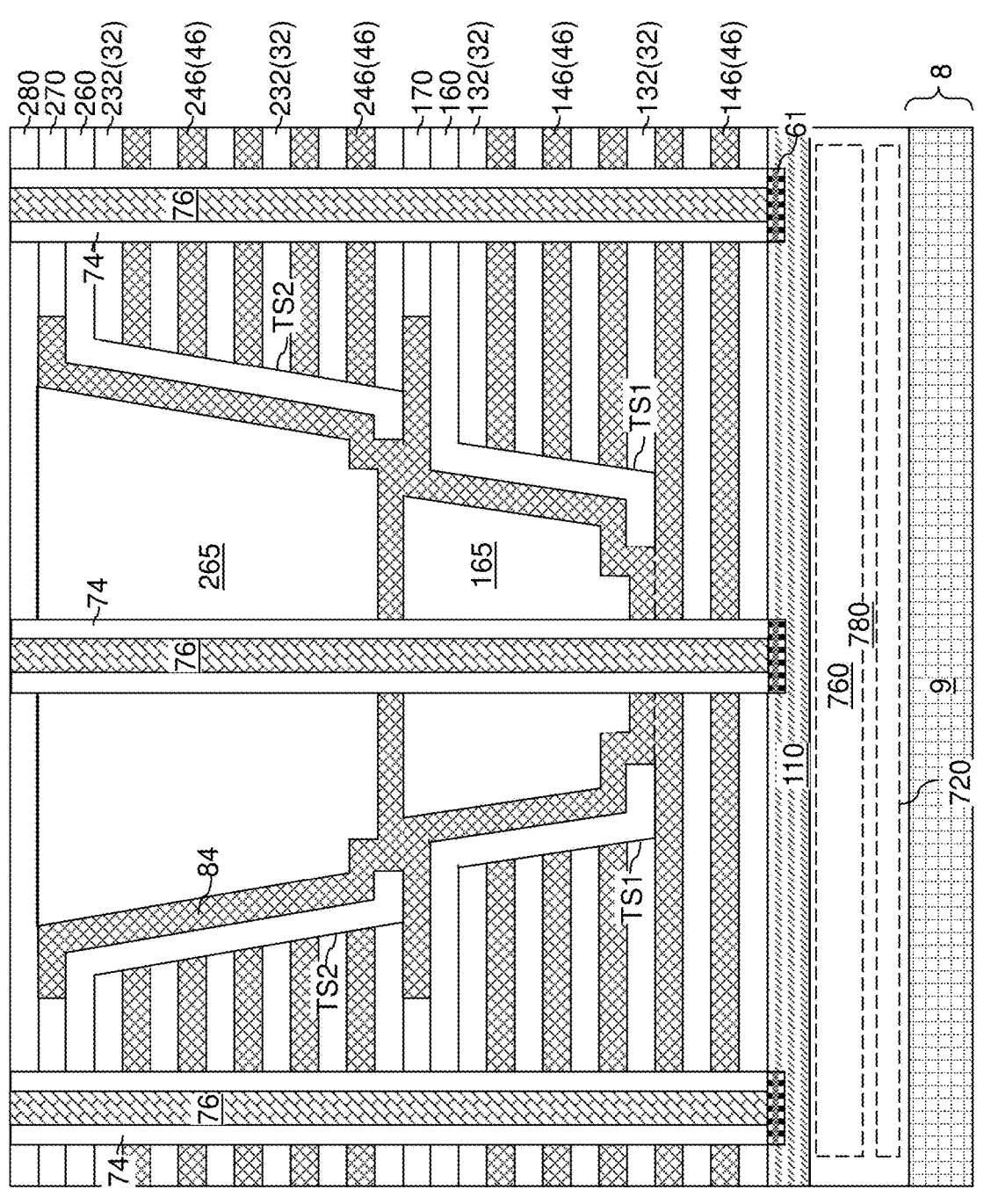
Figure 27D:
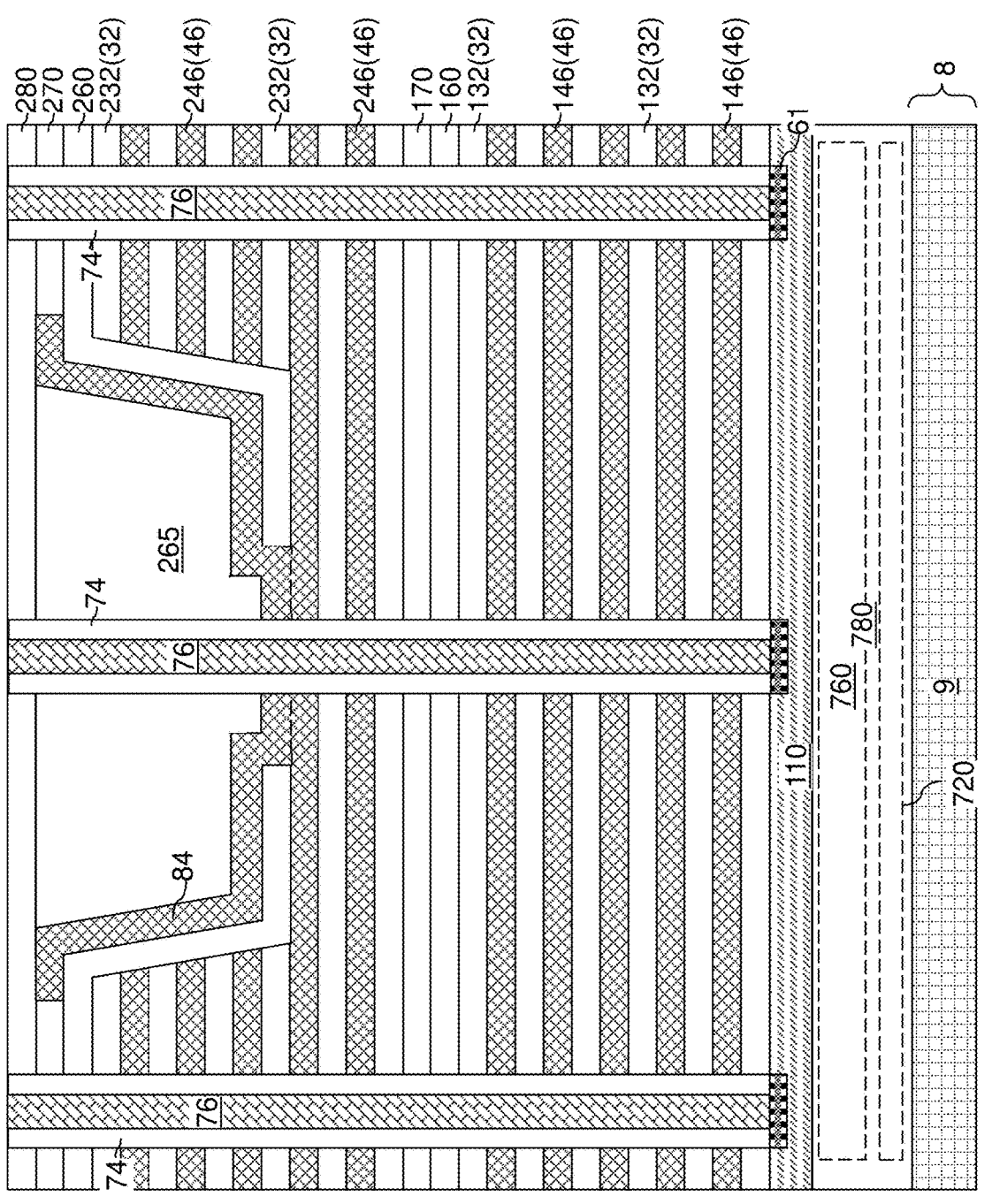
Figure 27E:
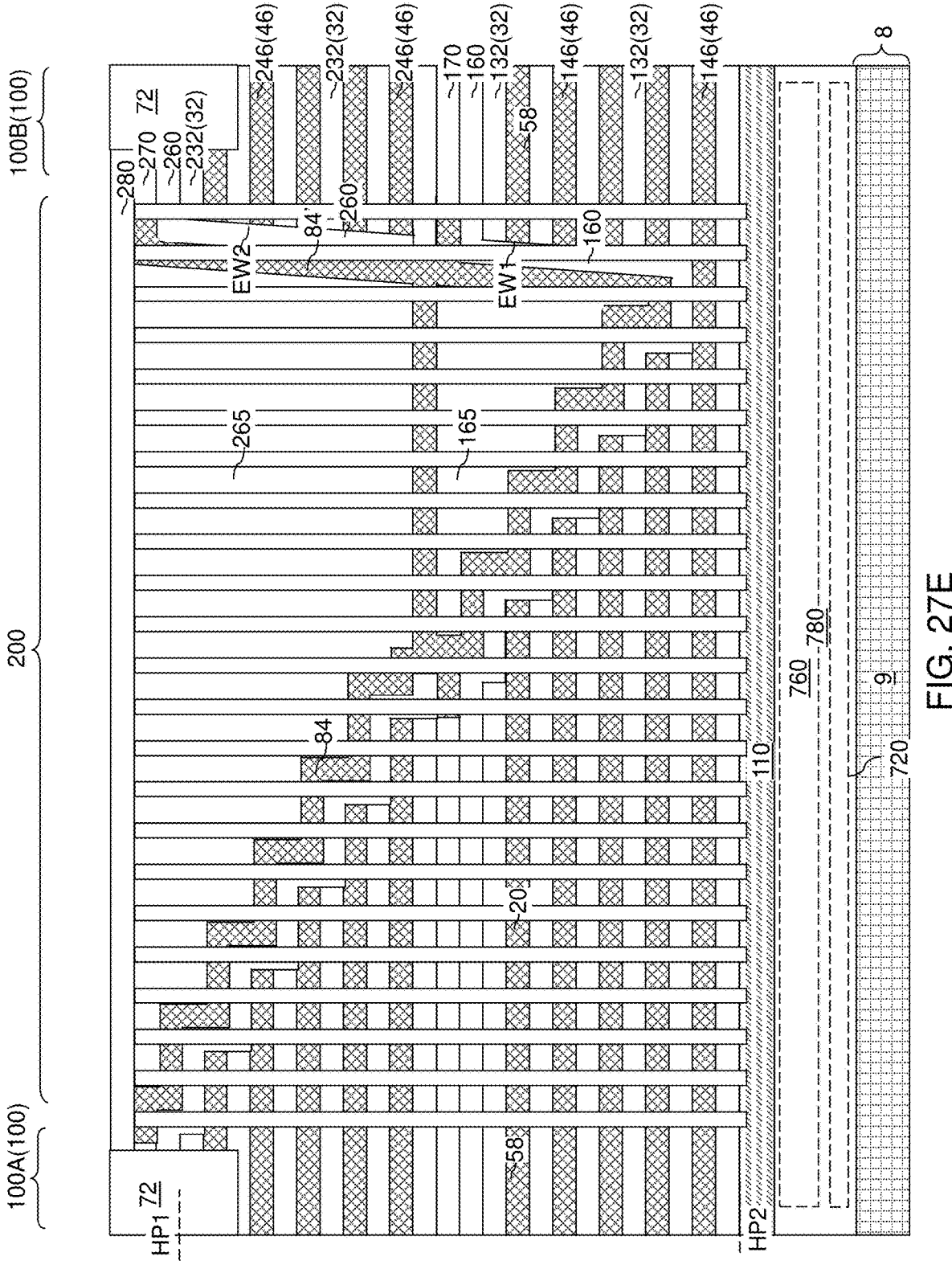

FIG. 26A is a vertical cross-sectional view of a fifth alternative configuration of the first exemplary structure after formation of lateral isolation trench fill structures (74, 76) and lateral isolation structures (73', 75). For example, elongated isolation cavities may merge with lateral isolation trenches 79, as illustrated in FIGS. 23A and 23B. In this embodiment, the isolation liners 73' may be adjoined to a respective insulating isolation trench spacer 74. Further, the conductive fill structures 75 may be adjoined to a respective source contact via structure 76. Each contiguous combination of an isolation liner 73' and a conductive fill structure 75 constitutes a component of a lateral isolation structure (73', 75).

In this embodiment, a lateral isolation structure (73', 75) within the array of lateral isolation structures (73', 75) comprises: an isolation liner 73' which is adjoined to an insulating isolation trench spacer 74, and a conductive fill structure 75 which is partially surrounded by the isolation liner 73' and adjoined to a source contact via structure 76. In one embodiment, a lateral isolation structure (73', 75) within the array of lateral isolation structures (73', 75) comprises an isolation liner 73' and a conductive fill structure 75 that is laterally spaced from the alternating stack (32, 46) by the isolation liner 73'.

Referring to FIGS. 27A-27I, drain-select-level isolation structures 72 can be formed through a subset of electrically conductive layers 46 including the topmost electrically conductive layer 46. For example, a photoresist layer (not shown) can be applied over the dielectric capping layer 280, and can be lithographically patterned to form elongated openings that laterally extend along the first horizontal direction hd1 within each of the memory array regions 100. An anisotropic etch process can be performed to transfer the pattern of the elongated openings through a subset of layers in the alternating stack (32, 46) that includes the topmost electrically conductive layer 46. Drain-select-level isolation trenches can be formed between neighboring rows of memory opening fill structures 58 that are arranged along the first horizontal direction hd1. The photoresist layer can be removed, and a dielectric fill material such as silicon oxide can be deposited in the drain-select-level isolation trenches. Excess portions of the dielectric fill material can be removed from above the horizontal plane including the top surface of the dielectric capping layer 280. Each remaining portion of the dielectric fill material that fills a respective drain-select-level isolation trench constitutes a drain-select-level isolation structure 72.

Referring to FIGS. 28A-28G, a contact-level dielectric layer 290 can be formed over the dielectric capping layer 280. The contact-level dielectric layer 290 comprises a dielectric material, such as undoped silicate glass or a doped silicate glass. The thickness of the contact-level dielectric layer 290 may be in a range from 50 nm to 500 nm, such as from 100 nm to 300 nm, although lesser and greater thicknesses may also be employed.

Figure 28A:
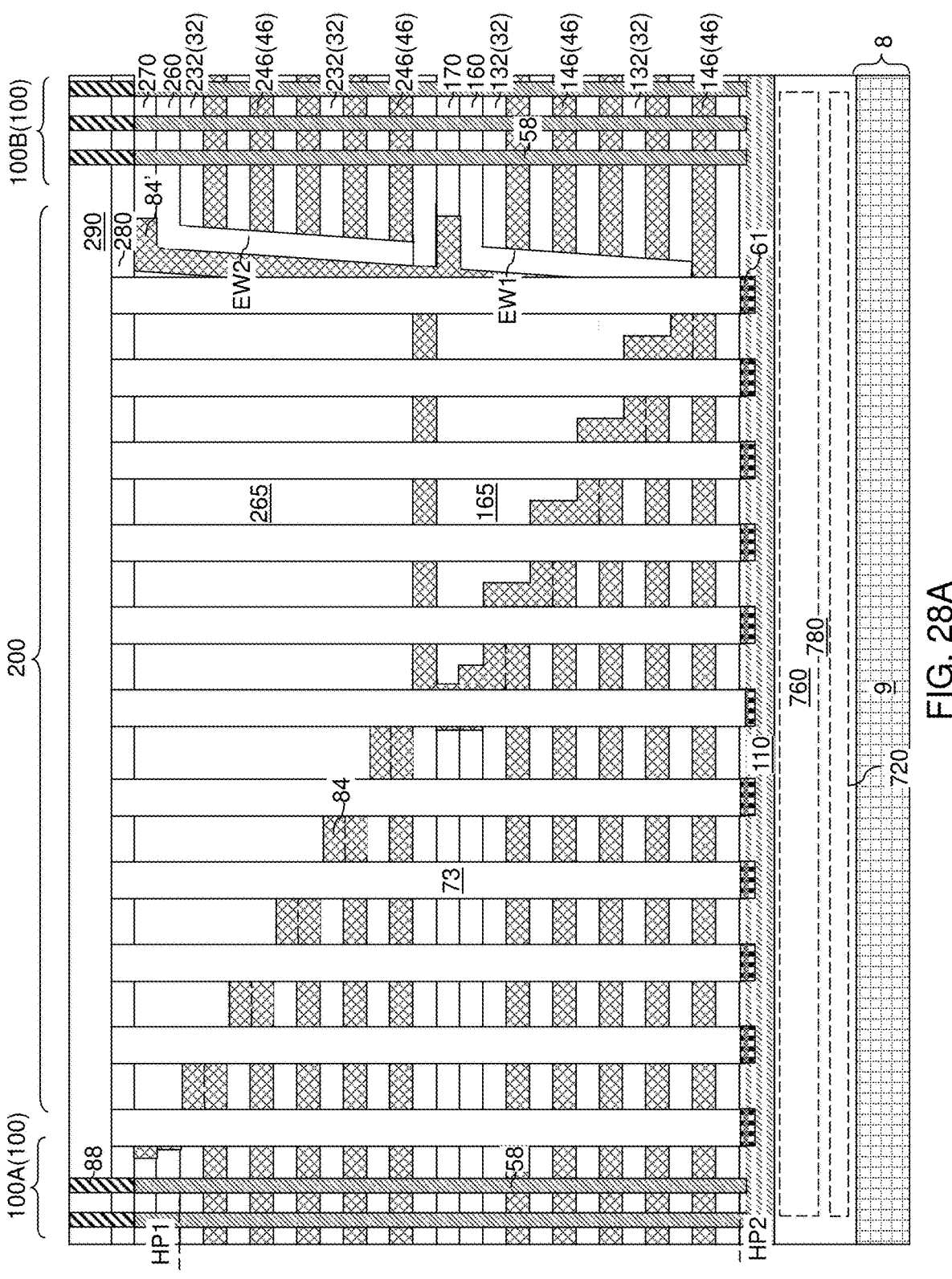
FIGS. 28A-28G are various views of the first exemplary structure after formation of a contact-level dielectric layer and various metallic via structures according to an embodiment of the present disclosure.
Figure 28B:
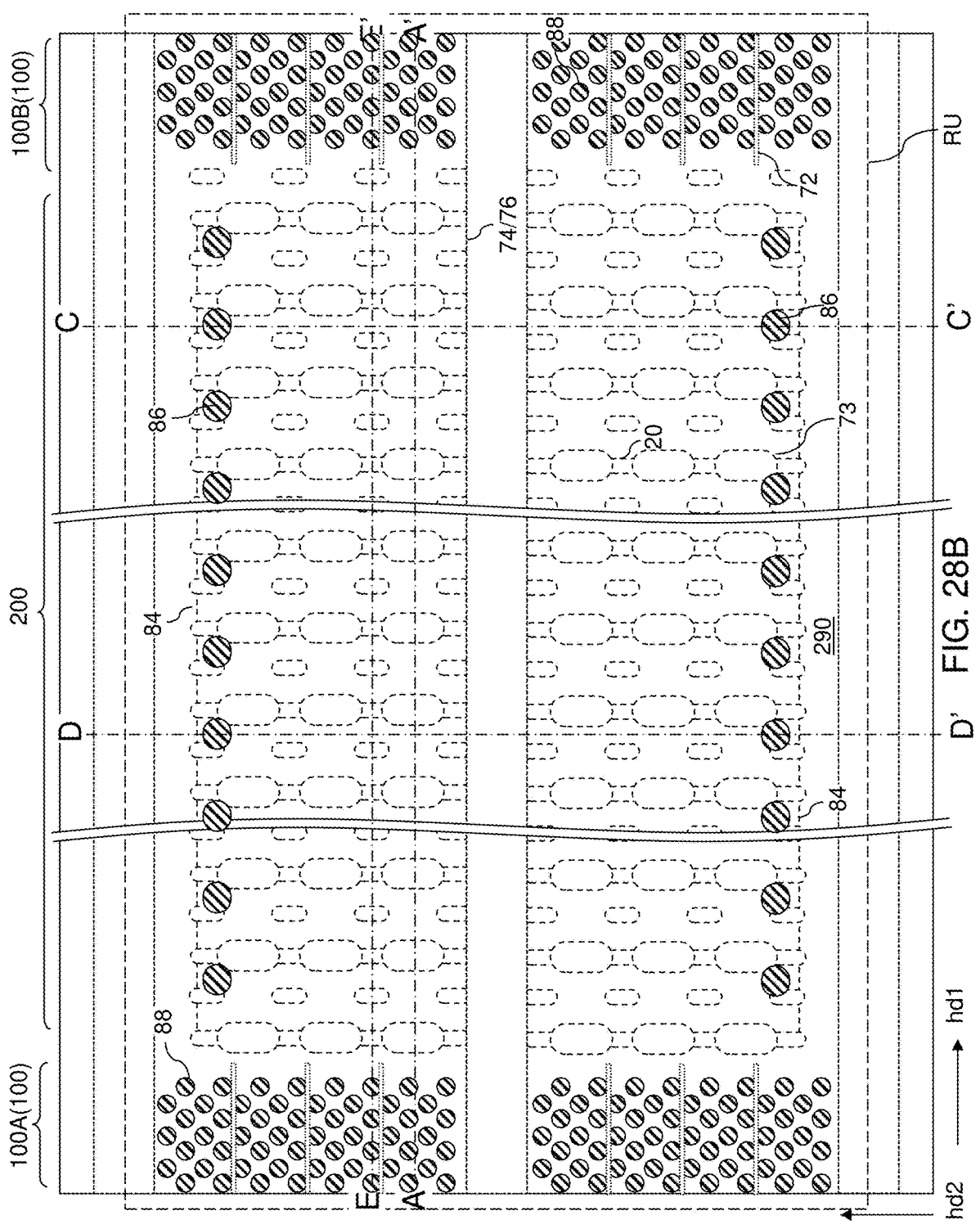
Figure 28C:
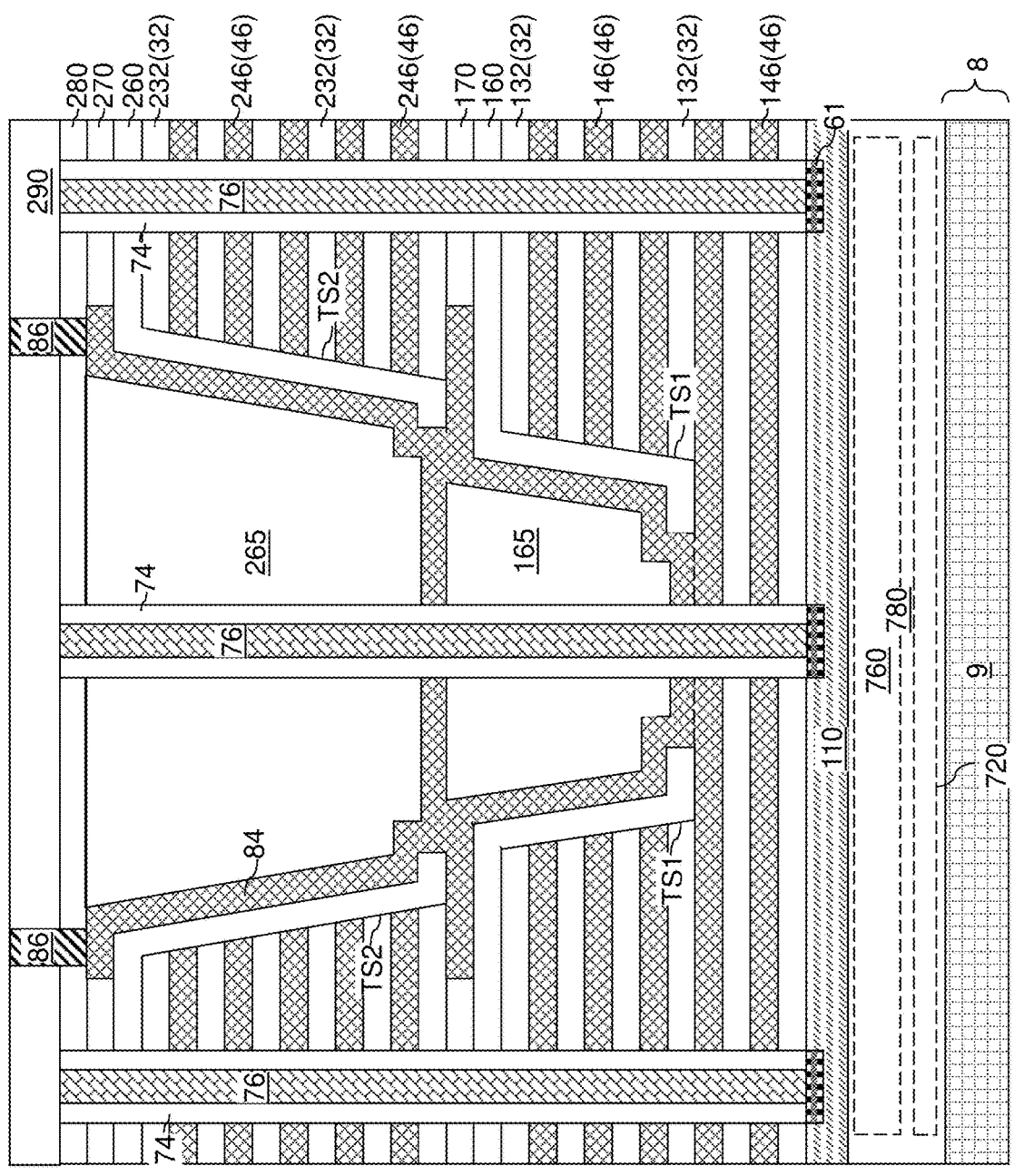
Figure 28D:
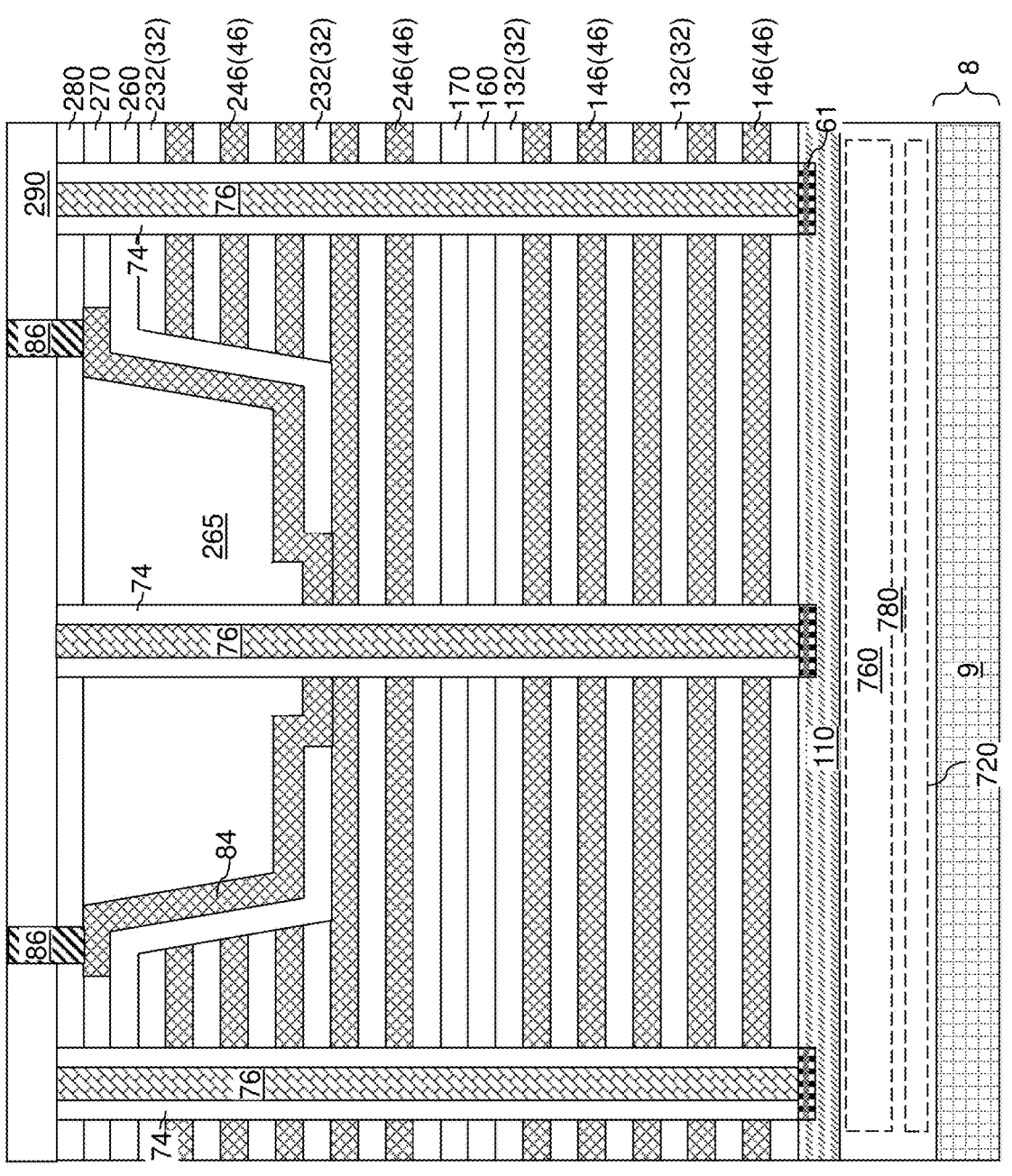
Figure 28E:
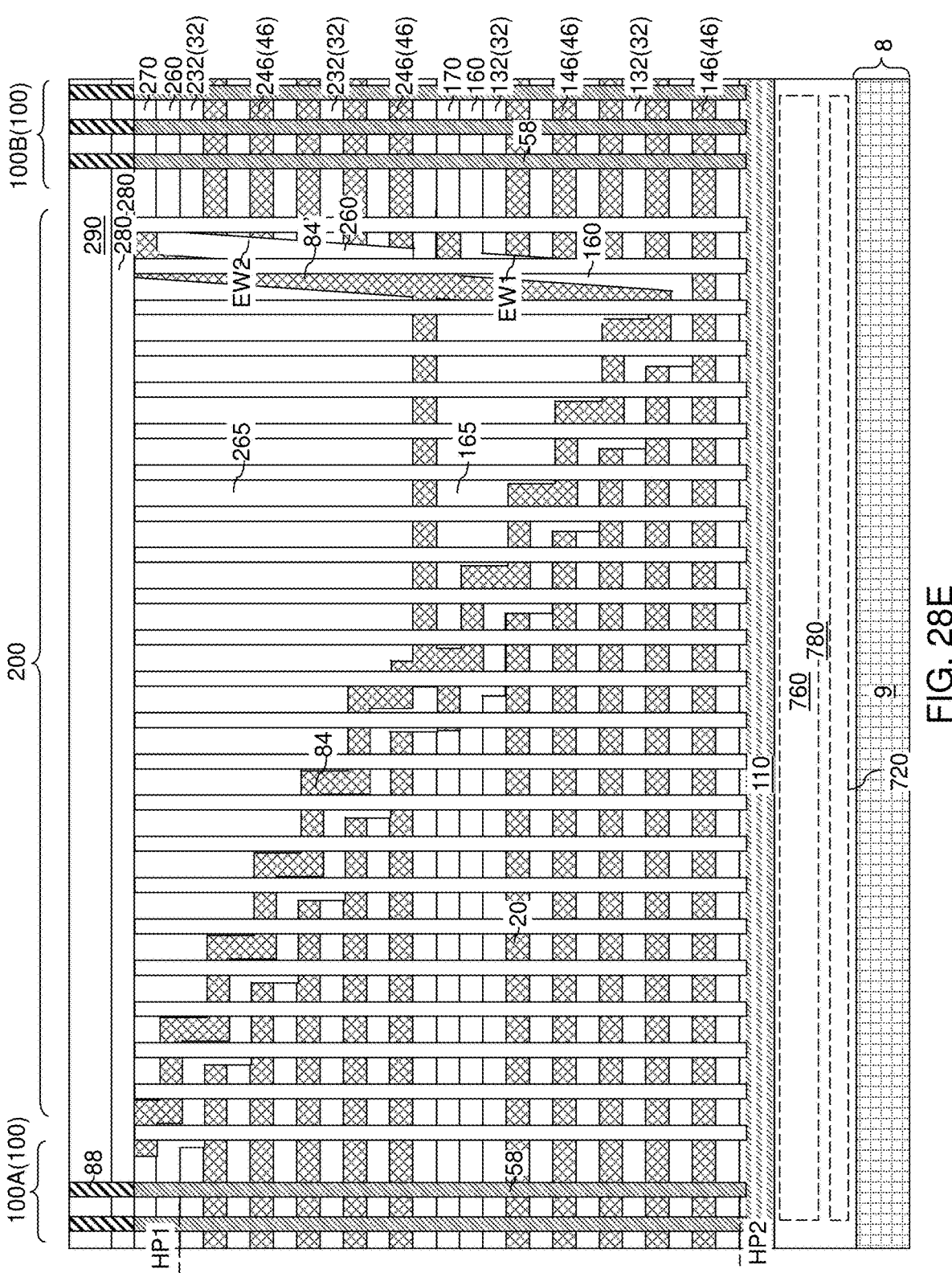
Figure 28F:
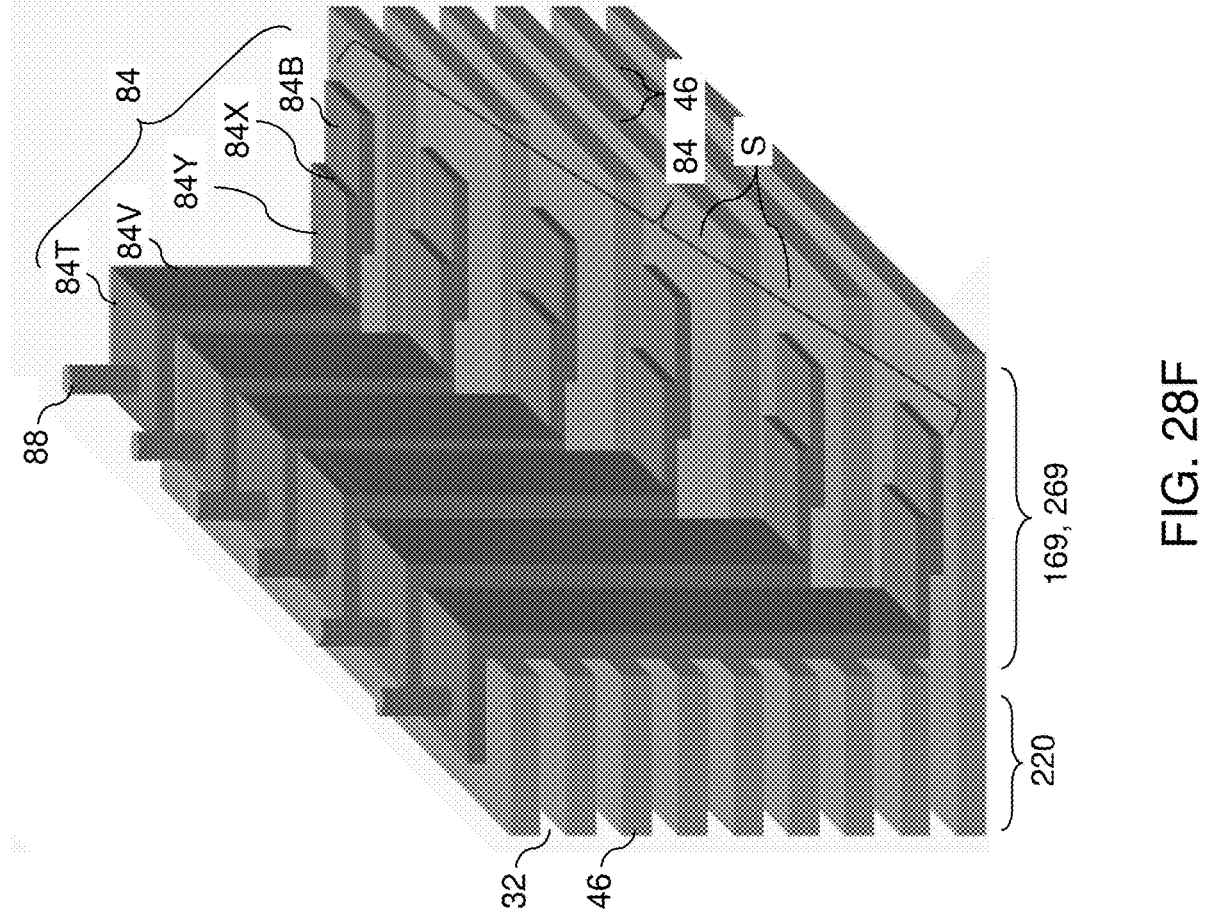
Figure 28G:
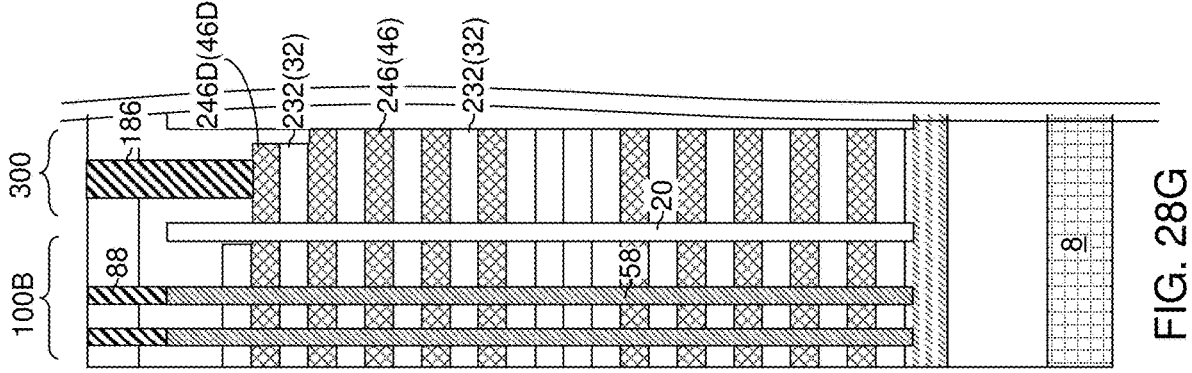

In one embodiment shown in FIG. 28G, additional staircase regions 300 are formed on the ends of each memory plane along the first (e.g., word line) horizontal direction, including in areas M2 shown in FIG. 1. FIG. 28G shows a part of area M2 at the end of the alternating stack (32, 46) of the second memory array region 100B. Specifically, stepped surfaces are only formed in the uppermost electrically conductive layers that function as drain side select gate electrodes 246D (e.g., 46D). In one embodiment, the electrically conductive layers 46 which function as word lines or source side select electrodes lack stepped surfaces in the additional staircase regions 300. The stepped surfaces of the additional staircase regions 300 are formed at the ends of the memory array regions 100 which are opposite to the ends of the memory array region 100 which abut the contact region 200.

A photoresist layer (not shown) can be applied over the contact-level dielectric layer 290, and can be lithographically patterned to form discrete openings overlying a respective one of the drain regions 63 in the memory opening fill structures 58, overlying a topmost planar portion of a respective electrically conductive strip 84 in the interconnection region 220 or overlying a stepped surface of the drain side select gate electrodes 46D in the additional staircase regions 300. An anisotropic etch process can be performed to form drain contact via cavities overlying the drain regions 63 and to from connection via cavities overlying the topmost planar portions of the electrically conductive strips 84 and the drain side select gate electrodes 46D. The photoresist layer can be subsequently removed.

At least one conductive material can be deposited in the drain contact via cavities and in the connection via cavities. Excess portions of the at least one conductive material can be removed from above the horizontal plane including the top surface of the contact-level dielectric layer 290 by a planarization process such as a chemical mechanical planarization (CMP) process or a recess etch process. Each remaining portion of the at least one conductive material filling a respective drain contact via cavity and contacting a top surface of a respective drain region 63 constitutes a drain contact via structure 88. Each remaining portion of the at least one conductive material filling a respective connection via cavity and contacting a top surface of a respective electrically conductive strip 84 constitutes a connection via structure 86. Each remaining portion of the at least one conductive material filling a respective connection via cavity and contacting a top surface of a respective drain side select electrode constitutes a select gate via structure 186. In this embodiment, the electrically conductive strips 84 do not electrically contact the drain side select gate electrodes 46D.

In an alternative embodiment, the additional staircase regions 300 and separate select gate via structures 186 are omitted. In this embodiment, a subset of the electrically conductive strips 84 contact the drain side select gate electrodes 46D in the interconnection region 220 instead of the select gate via structures 186.

Additional metal interconnect structures (not shown), additional dielectric material layers (not shown), metal bonding pads (not shown) may be subsequently formed to provide a memory die.

Referring to all drawings and according to various embodiments of the present disclosure, a memory device comprises an alternating stack (32,46) including insulating layers 32 and electrically conductive layers 46 that are interlaced along a vertical direction, wherein the alternating stack comprises a tapered sidewall (TS1, TS2) that laterally extends along a first horizontal direction hd1 and which is inclined along a second horizontal hd2 direction perpendicular to the first horizontal direction; memory openings 49 vertically extending through each layer within the alternating stack; memory opening fill structures 58 located in the memory openings and including a respective vertical stack of memory elements (e.g., portions of the memory film 50) and a respective vertical semiconductor channel 60; a cavity (169, 269) in the alternating stack bounded laterally along a first side by the tapered sidewall (TS1, TS2) and having a bottom surface comprising stepped surfaces S of at least some of the electrically conductive layers 46; an insulating liner (160, 260) located over the tapered sidewall in the cavity; and electrically conductive strips 84 which are adjoined to a respective one of the stepped surfaces at a bottom surface of the cavity (169, 269), which extend over the insulating liner and the tapered sidewall in the cavity, and which include a respective topmost portion 84T that is located above the topmost surface of the alternating stack (32, 46).

In one embodiment, each of the electrically conductive strips 84 is spaced from the tapered sidewall (TS1, TS2) by a tapered vertically-extending portion of the insulating liner (160, 260). The insulating liner (160, 260) further comprises a first horizontally-extending portion overlying stepped surfaces S and a second horizontally extending portion located between the topmost surface of the alternating stack (32, 46) (e.g., horizontal plane HP1) and the topmost portions 84T of the electrically conductive strips 84.

In one embodiment, each of the electrically conductive strips comprises: a first horizontally-extending portion 84T which is a topmost portion; a tapered vertically-extending portion 84V that overlies the tapered sidewall (TS1, TS2); and a second horizontally-extending portion 84B which is a bottommost portion and is adjoined to the respective one of the stepped surfaces S of the electrically conductive layers 46 in the cavity (169, 269). Optionally, each of the electrically conductive strips 84 further comprises a vertically-extending portion 84X that is adjoined to the second horizontally-extending portion; and a third horizontally-extending portion 84Y that is adjoined to the vertically-extending portion 84V and to a bottom end of the tapered vertically-extending portion 84X.

In one embodiment, a dielectric fill structure (165, 265) is located in the cavity (169, 269) over the electrically conductive strips 84 and over the stepped surfaces S. In one embodiment, each of the electrically conductive strips 84 and the respective one of the electrically conductive layers 46 are formed as a unitary structure including a conductive material portion that extends continuously between a volume of a respective electrically conductive strip and the respective one of the electrically conductive layers.

In one embodiment, lateral isolation structures (20, 73, 173) are located in the cavity (169, 269), vertically extending from the stepped surfaces S to at least the topmost surface HP1 of the alternating stack (32, 46), and each located between a respective neighboring pair the electrically conductive strips 84 along the first horizontal direction hd1. A first lateral isolation trench fill structure (74, 76) has a first lengthwise sidewall that contacts each layer of the alternating stack and laterally extends along the first horizontal direction; and a second lateral isolation trench fill structure (74, 76) has a second lengthwise sidewall that contacts each layer of the alternating stack (32, 46) and laterally extends along the first horizontal direction hd1 and laterally spaced from the first lateral isolation trench fill structure along the second horizontal direction hd2. The lateral isolation structures (20, 73, 173) contact the first lateral isolation trench fill structure and do not contact the second lateral isolation trench fill structure.

In one embodiment, a first set of the memory opening fill structures 58 is located in a first memory array region 100A and a second set of the memory opening fill structures 58 is located in a second memory array region 100B which is laterally spaced from the first memory array region 100A along the first horizontal direction hd1 by a contact region 200. The cavity (169, 269) and the electrically conductive strips 84 are located in the contact region 200. At least a portion of the electrically conductive layers 46 continuously extend from the first memory array region 100A to the second memory array region 100B through an interconnection region 220 located between the second lateral isolation trench fill structure (74, 76) and the cavity (169, 269) in the contact region 200. The alternating stack (32, 46) laterally extends from the first lateral isolation trench fill structure to the second lateral isolation trench fill structure in the first memory array region 100A and in the second memory array region 100B, and has a lesser extent along the second horizontal direction hd2 within the interconnection region 220 than a lateral spacing between the first lateral isolation trench structure and the second lateral isolation trench structure. The topmost portions 84T of the electrically conductive strips 84 are located above the topmost surface HP1 of the alternating stack (32, 46) in the interconnection region 220.

In one embodiment shown in FIG. 28G, the memory device also includes a staircase region 300 located in the alternating stack (32, 46) adjacent to a first end of the second memory array region 100B opposite to a second end of the second memory array region 100B which abuts the contact region 200. Stepped surfaces are located in the staircase region 300 in only in an uppermost set of the electrically conductive layers 46 that function as drain side select gate electrodes 46D. Connection via structures 86 contact topmost portions 84T of the respective electrically conductive strips 84, and select gate via structures 186 contact top surfaces of the respective drain side select gate electrodes 46D in the staircase region 300.

In one embodiment, the cavity (169, 269) is further laterally bounded along a second side opposite to the first side by the first lateral isolation trench fill structure (74, 76), along a third side by a first tapered end wall (EW1, EW2) which extends along the second horizontal direction hd2 and which is inclined along the first horizontal direction hd1, and along a fourth side by the stepped surfaces S.

In one embodiment, the first lateral isolation trench fill structure (74, 76) comprises first insulating wall segments that are laterally spaced apart along the first horizontal direction hd2 and in contact with a respective subset of layers within the alternating stack (32, 46), and second insulating wall segments that contact the lateral isolation structures.

In one embodiment, each of the lateral isolation structures comprises at least one support pillar structure 20 and at least one isolation pillar structure 73 in contact with the at one support pillar structure 20. In another embodiment, each of the lateral isolation structures comprises an isolation wall structure 173 which extends in the second horizontal direction hd2.

The various embodiments of the present disclosure can be employed to provide electrically conductive strips 84 that is formed integrally with and electrically connected to a respective one of the electrically conductive layer 46. Reliable electrical contact to the electrically conductive layers 46 can be made without employing an anisotropic etch process which can punch through the electrically conductive layers 46 by forming electrically conductive strips 84.

Referring to FIG. 29, a second exemplary structure according to an embodiment of the present disclosure is illustrated, which can be derived from the first exemplary structure illustrated in FIGS. 2A-2D by omitting the processing steps for formation of a first cavity 169, i.e., by omitting the processing steps for formation of stepped surfaces. The second exemplary structure comprises a first alternating stack (132, 142) of first insulating layers 132 and first sacrificial material layers 142 that are interlaced along a vertical direction. The first insulating layers 132 are a first subset of insulating layers 32 employed in the second exemplary structure, and the first sacrificial material layers 142 are a first subset of sacrificial material layers 42 employed in the second exemplary structure.

Figure 30:
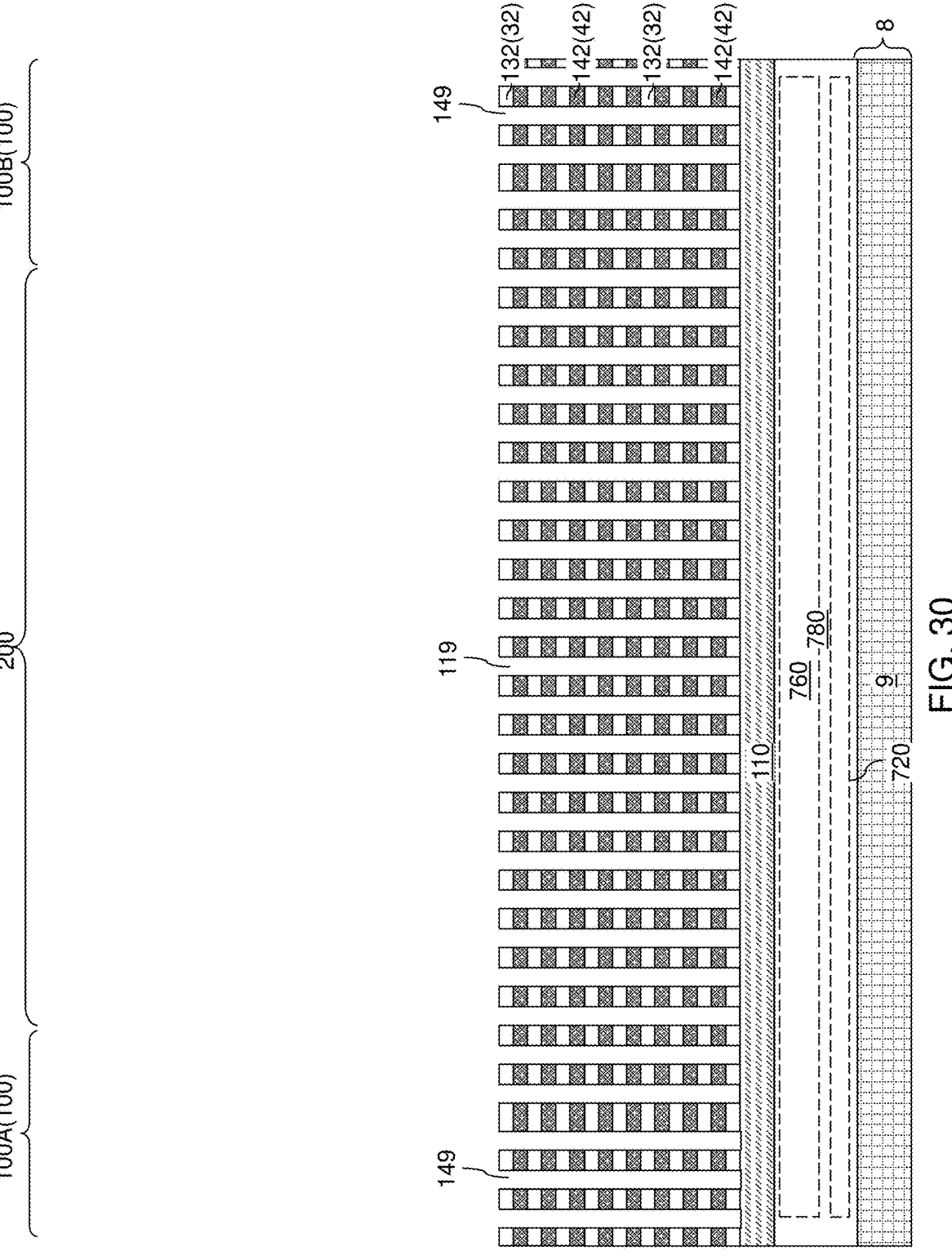
FIG. 30 is a vertical cross-sectional view of the second exemplary structure after formation of first-tier memory openings and first-tier support openings according to an embodiment of the present disclosure.

Referring to FIG. 30, the processing steps described with reference to FIGS. 6A-6E can be performed to form various first-tier memory openings 149 and first-tier support openings 119. The arrangement of the first-tier memory openings 149 and the first-tier support openings 119 in the second exemplary structure may be the same as, or may be similar to, the arrangement of the first-tier memory openings 149 and the first-tier support openings 119 in the first exemplary structure. Generally, the horizontal cross-sectional shapes of the first-tier support openings 119 may be selected in any suitable manner, and may be circular or may be elongated along a horizontal direction.

Figure 31:
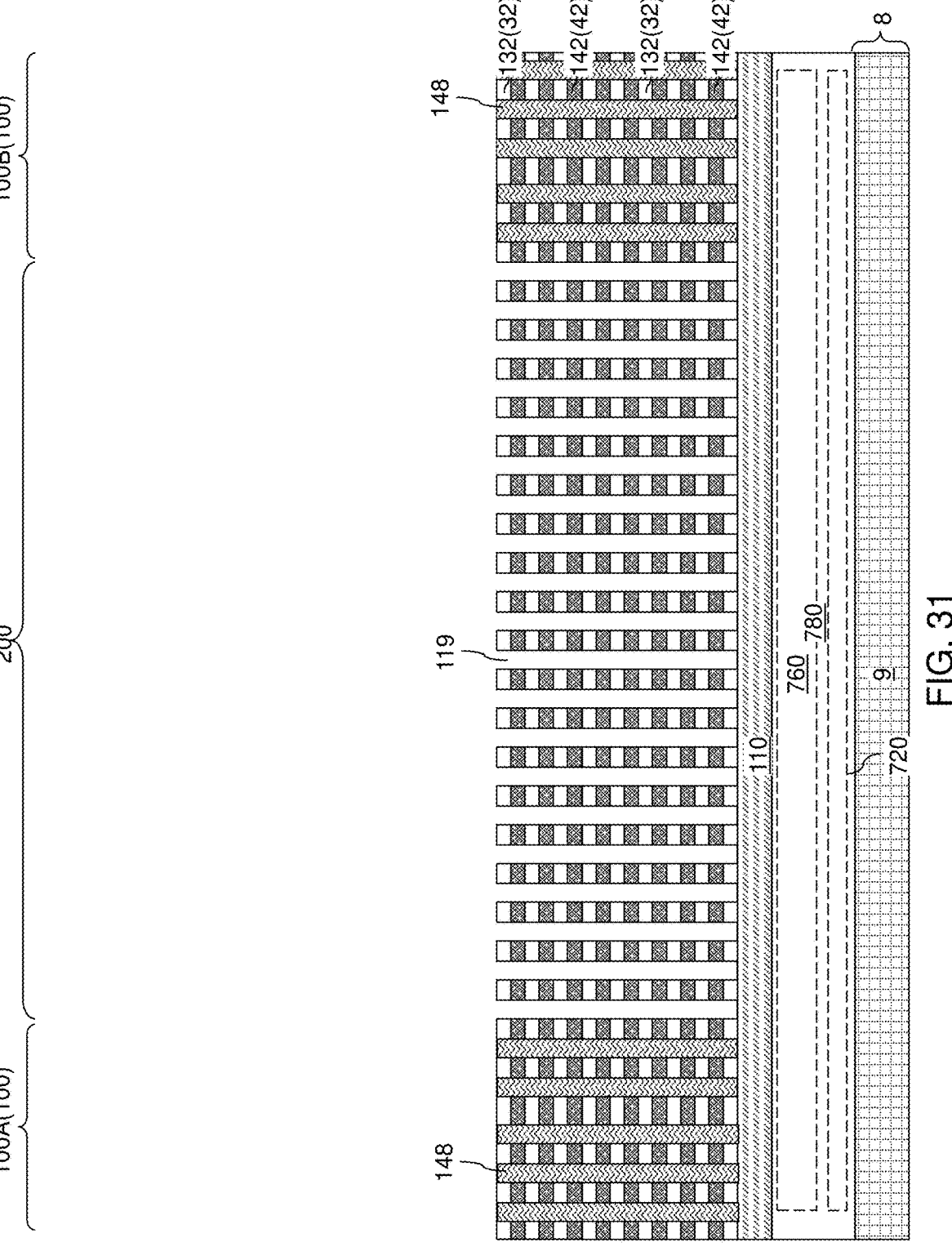
FIG. 31 is a vertical cross-sectional view of the second exemplary structure after formation of first-tier sacrificial memory opening fill material portions according to an embodiment of the present disclosure.

Referring to FIG. 31, the processing steps described with reference to FIGS. 7A-7D can be performed to form first-tier sacrificial memory opening fill structures 148 in the first-tier memory openings 149, and to form first-tier sacrificial support opening fill structures (not illustrated) in the first-tier support openings 119. Subsequently, a photoresist layer (not shown) can be applied over the second exemplary structure and can be lithographically patterned to cover the memory array regions 100 without covering the contact region 200. A selective removal process that removes the sacrificial fill material of the first-tier sacrificial support opening fill structures can be performed to remove the first-tier sacrificial support opening fill structures. Voids are formed in the first-tier support openings 119 from which the first-tier support opening fill structures are removed.

Figure 32:
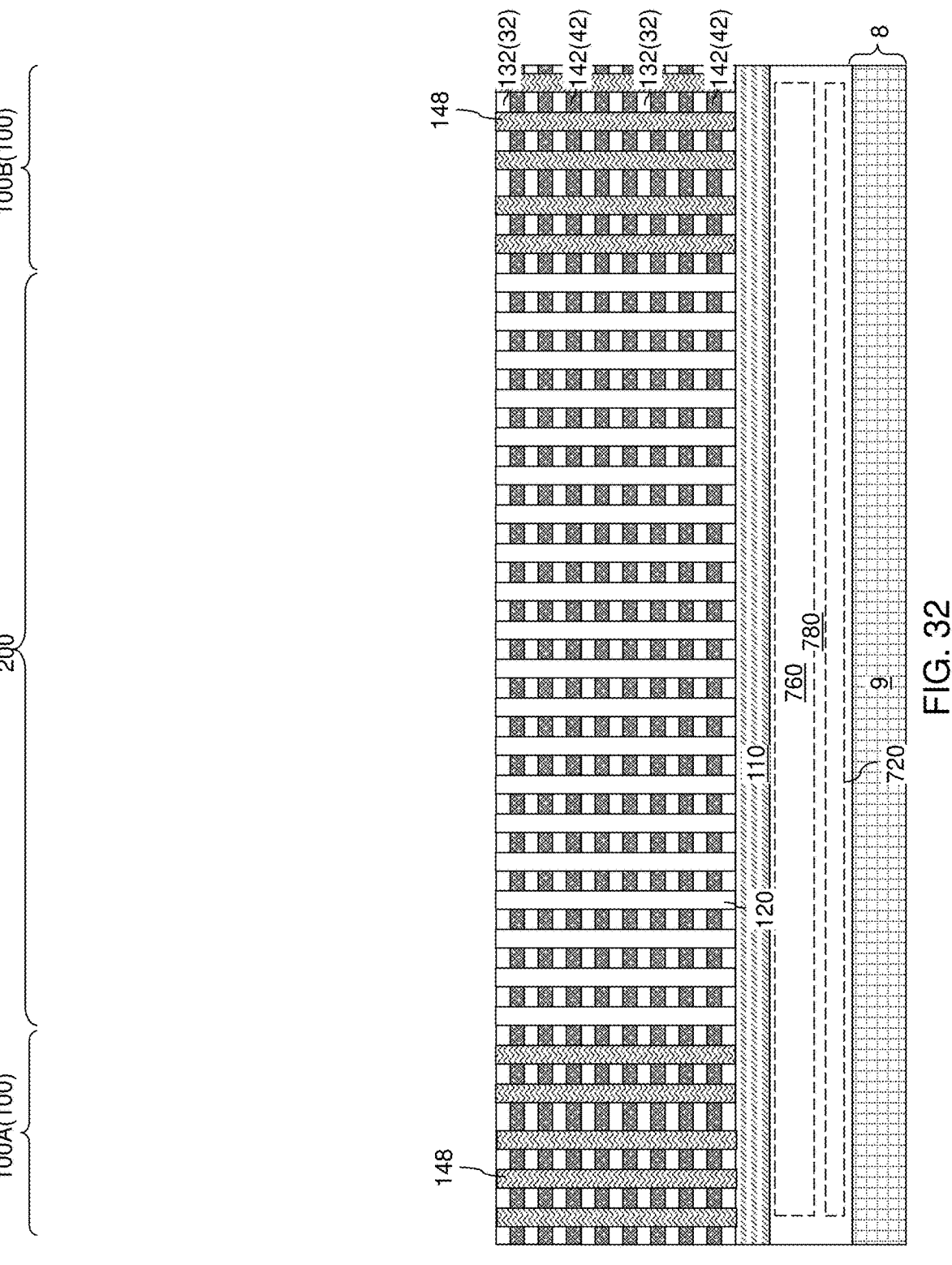
FIG. 32 is a vertical cross-sectional view of the second exemplary structure after formation of first-tier support pillar structures according to an embodiment of the present disclosure.

Referring to FIG. 32, a dielectric fill material, such as silicon oxide, can be deposited in the first-tier support openings 119. Excess portions of the dielectric fill material can be removed from above the horizontal plane including the topmost surface of the first alternating stack (132, 142) by performing a planarization process. The planarization process may comprise a chemical mechanical polishing process or a recess etch process. Each remaining portion of the dielectric fill material that fills the first-tier support openings 119 constitutes a first-tier support pillar structure 120. Top surfaces of the first-tier support pillar structures 120 may be coplanar with the top surface of the topmost layer within the first alternating stack (132, 142).

Figure 33A:
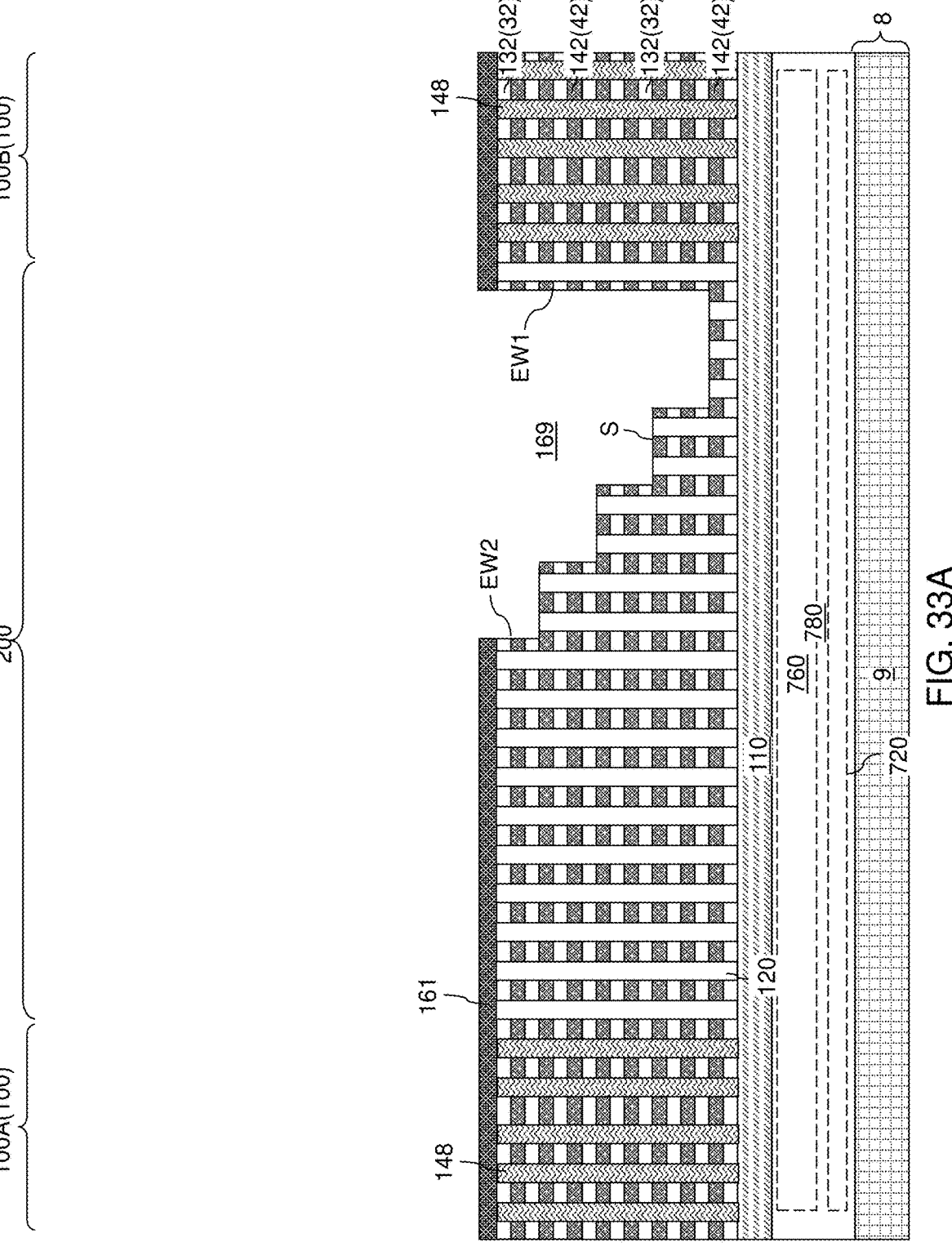
FIGS. 33A-33C are various views of the second exemplary structure after formation of a first stepped cavity according to an embodiment of the present disclosure.
Figure 33B:
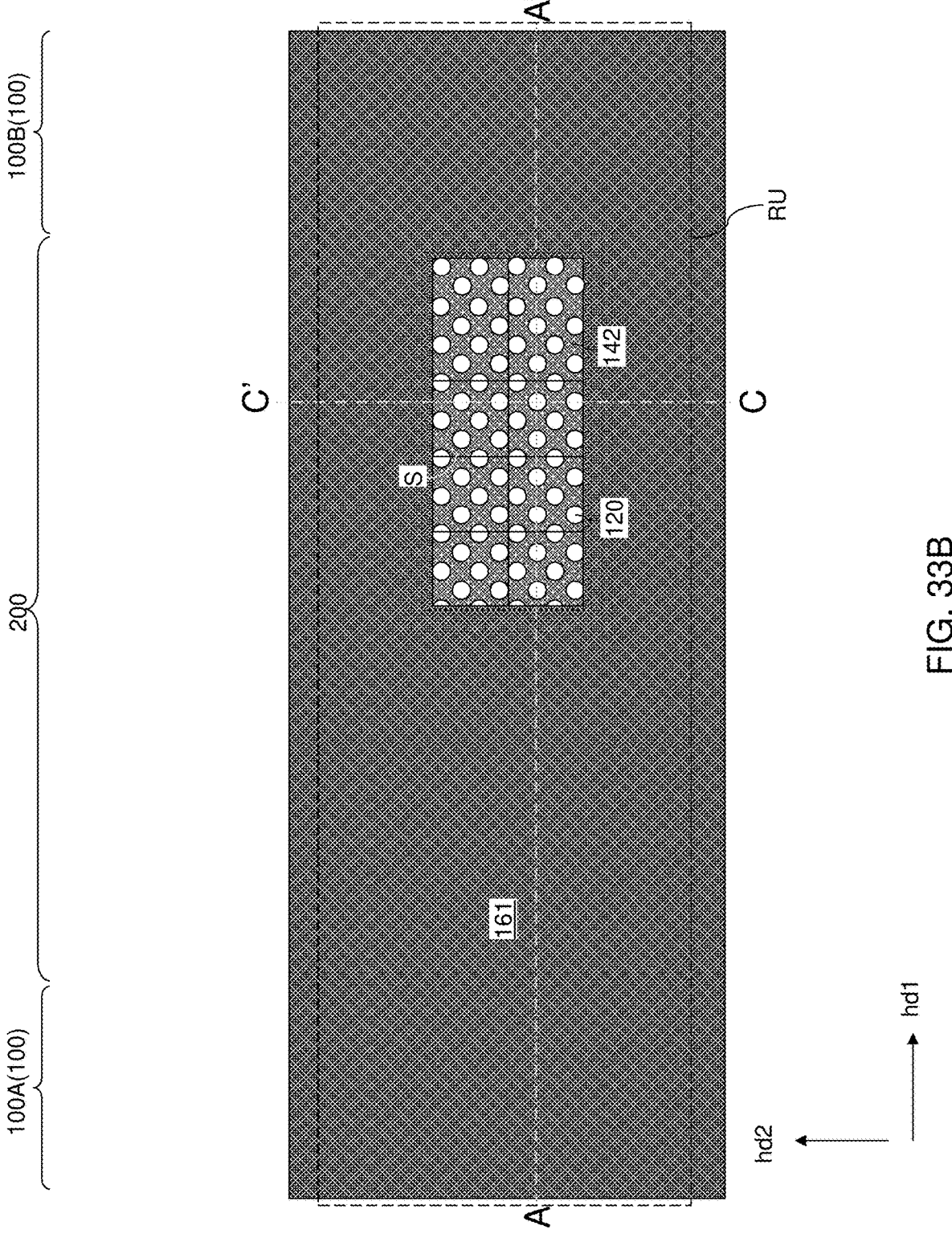
Figure 33C:
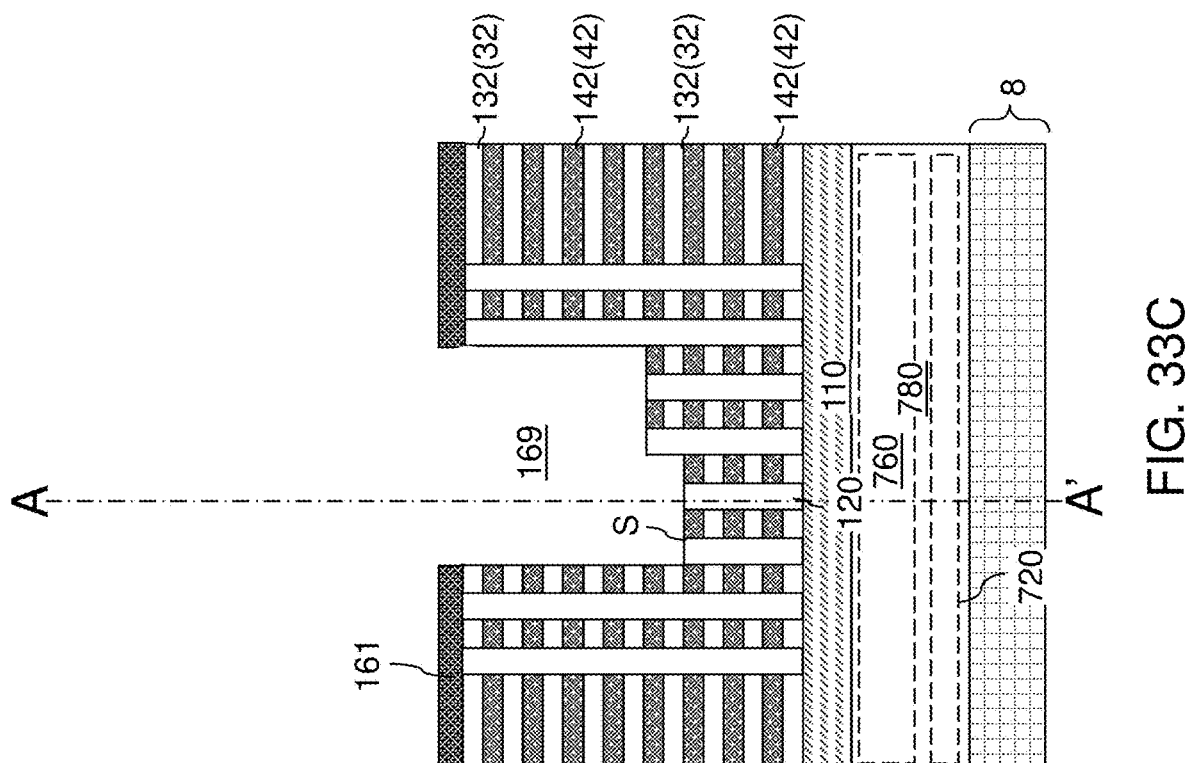

Referring to FIGS. 33A-33C, a hard mask layer 161 can be formed over the first alternating stack (132, 142), and can be patterned to form a rectangular or substantially rectangular opening within each area that corresponds to an area of a first cavity 169 in the first exemplary structure. The hard mask layer 161 may comprise a semiconductor hard mask material (e.g., amorphous silicon or polysilicon), a conductive hard mask material (e.g., a metal or metal nitride) or a carbon-based hard mask material.

If two or more rows of stepped surfaces S (i.e., steps) which extend in the first horizontal direction hd1 will be formed in the first cavity 169 then a photoresist layer (not shown) can be applied over the patterned hard mask layer 161, and can be lithographically patterned to form straight edges that overlie a respective one of the openings in the patterned hard mask layer 161 along the first horizontal direction hd1. A straight edge of the photoresist layer can be formed along the first horizontal direction hd1 such that the straight edge bisects the areas a respective rectangular opening in the patterned hard mask layer 161 into a covered area and an uncovered area of approximately equal size in a top-down view. An anisotropic etch process can be performed to vertically recess unmasked portions of the first alternating stack (132, 142) by at least one pair of a first insulating layer 132 and a first sacrificial material layer 142. The photoresist layer can be subsequently removed, for example, by ashing. Alternatively, if a single row of stepped surfaces S which extends in the first horizontal direction hd1 will be formed in the first cavity 169 then the above photoresist layer deposition and anisotropic etch steps are omitted.

A trimmable mask layer (not shown) can be applied over the first alternating stack (132, 142). The trimmable mask layer can include a trimmable photoresist layer that can be controllably trimmed by a timed ashing process. The trimmable mask layer can be patterned with an initial pattern such that a segment of each rectangular opening in the hard mask layer 161 that is most proximal to the second memory array regions 100B is not masked by the trimmable mask layer, while the rest of each rectangular opening is covered by the trimmable mask layer. For example, the trimmable mask layer can have a rectangular shape having straight edges that are parallel to the second horizontal direction hd2.

Stepped surfaces S can be formed within the areas of the rectangular openings in the hard mask layer 161 by iteratively performing a set of layer patterning processing steps. The set of layer patterning processing steps comprises an anisotropic etch process that etches unmasked portions of a pair of a first insulating layer 132 and a first sacrificial material layer 142, and a mask trimming process in which the trimmable mask layer is isotropically trimmed to provide shifted sidewalls that are shifted away from the second memory array region 100B. A final anisotropic etch process can be performed after the last mask trimming process, and the trimmable mask layer can be removed, for example, by ashing. A first stepped cavity 169 having a respective stepped bottom surface can be formed within each area of the rectangular opening in the hard mask layer 161. The hard mask layer 161 can be subsequently removed selective to the materials of the first alternating stack (132, 142), for example, by a selective etching process. Alternatively, any other suitable process may be used to form the stepped surfaces.

Each first stepped cavity 169 can include a cliff region in which a first end wall EW1 of the first alternating stack (32, 42) extends from the bottommost first sacrificial material layer 142 of the first alternating stack (132, 142) to the topmost layer of the first alternating stack (132, 142). The first end wall EW1 may be vertical, or may be tapered (i.e., inclined) at an angle of 1 to 30 degrees along the first horizontal direction hd1 with respect to a vertical direction which is normal to the top surface of the substrate 8. Each first stepped cavity 169 has stepped bottom surfaces. The stepped bottom surface of each stepped cavity 169 laterally extend along the first horizontal direction hd1, and underlies the volume of the void of the first stepped cavity 169. Thus, the stepped surfaces S are formed by patterning the first alternating stack (132, 142) in each contact region 200, which is located between a respective first memory array region 100A and a second memory array region 100B.

Each first stepped cavity 169 may have stepped surfaces S including vertically-extending surface segments that are interlaced with horizontally-extending surface segments which form the bottom surface of the first cavity 169. In one embodiment, each first stepped cavity 169 comprises a pair of stepped sidewalls that laterally extend along a first horizontal direction hd1 and having a respective stepped bottom edge and defining a lateral extent of the first stepped cavity along the second horizontal direction hd2; a first end wall EW1 that laterally extends along a second horizontal direction hd2 that is perpendicular to the first horizontal direction hd1 and connecting first ends of the pair of stepped sidewalls; and a second end wall EW2 that laterally extends along the second horizontal direction hd2 and connecting second ends of the pair of stepped sidewalls.

In one embodiment, each first stepped cavity 169 may comprise a respective first stepped bottom surface containing horizontally-extending surface segments of the first sacrificial material layers 142 and vertically-extending surface segments of each first sacrificial material layers 142 and the first insulating layers. While four stepped surfaces S are shown in FIGS. 33A and 33B for clarity, it should be understood that more than four stepped surfaces S may be formed in each first stepped cavity 169. In one embodiment, each first stepped bottom surface comprises a M×N array of horizontally-extending surface segments of the first sacrificial material layers 142; the horizontally-extending surface segments are vertically spaced apart from each other along the first horizontal direction hd1, and if M>1, the horizontally-extending surface segments may also be vertically spaced apart from each other along the second horizontal direction hd2; M may be an integer representing the number of rows of stepped surfaces S in the second horizontal direction hd2 and may range from 1 to 10; and N may be an integer representing the number of stepped surfaces S extending in the first horizontal direction hd1 and may range from 2 to $2^{10}$. In one embodiment shown in FIGS. 33B and 33C, each first stepped bottom surface may comprise two rows (i.e., M=2) of N horizontally-extending surface segments of the first sacrificial material layers 142 that are arranged along the first horizontal direction hd1.

FIG. 33B illustrates only one instance of a repetition unit RU. It is understood that multiple instances of the repetition unit RU may be repeated along the second horizontal direction hd2 with a periodicity. Thus, a plurality of first stepped cavities 169 can be formed with a periodicity along the second horizontal direction hd2.

Figure 34A:
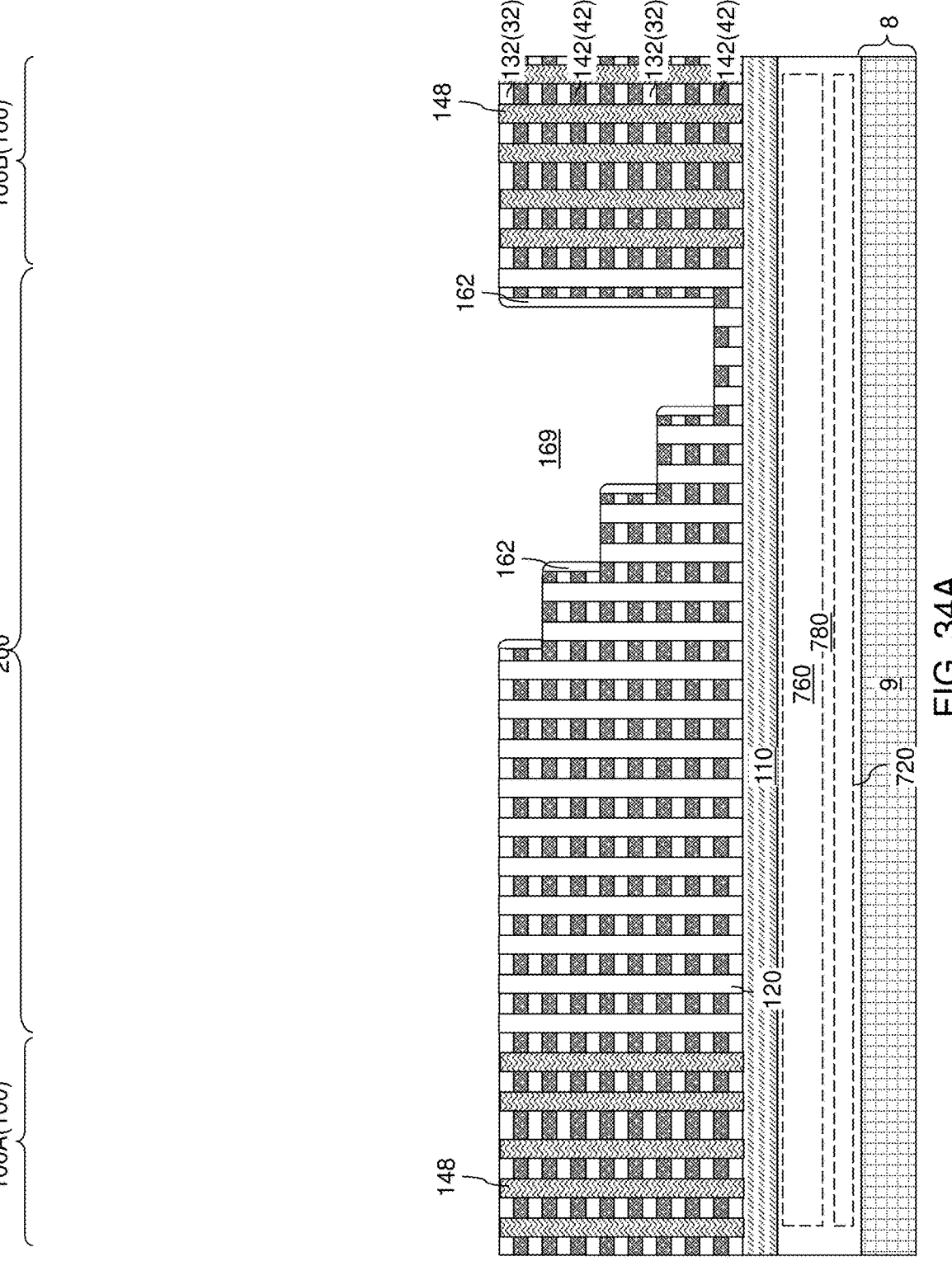
FIGS. 34A-34C are various views of the second exemplary structure after formation of a first insulating spacer according to an embodiment of the present disclosure.
Figure 34B:
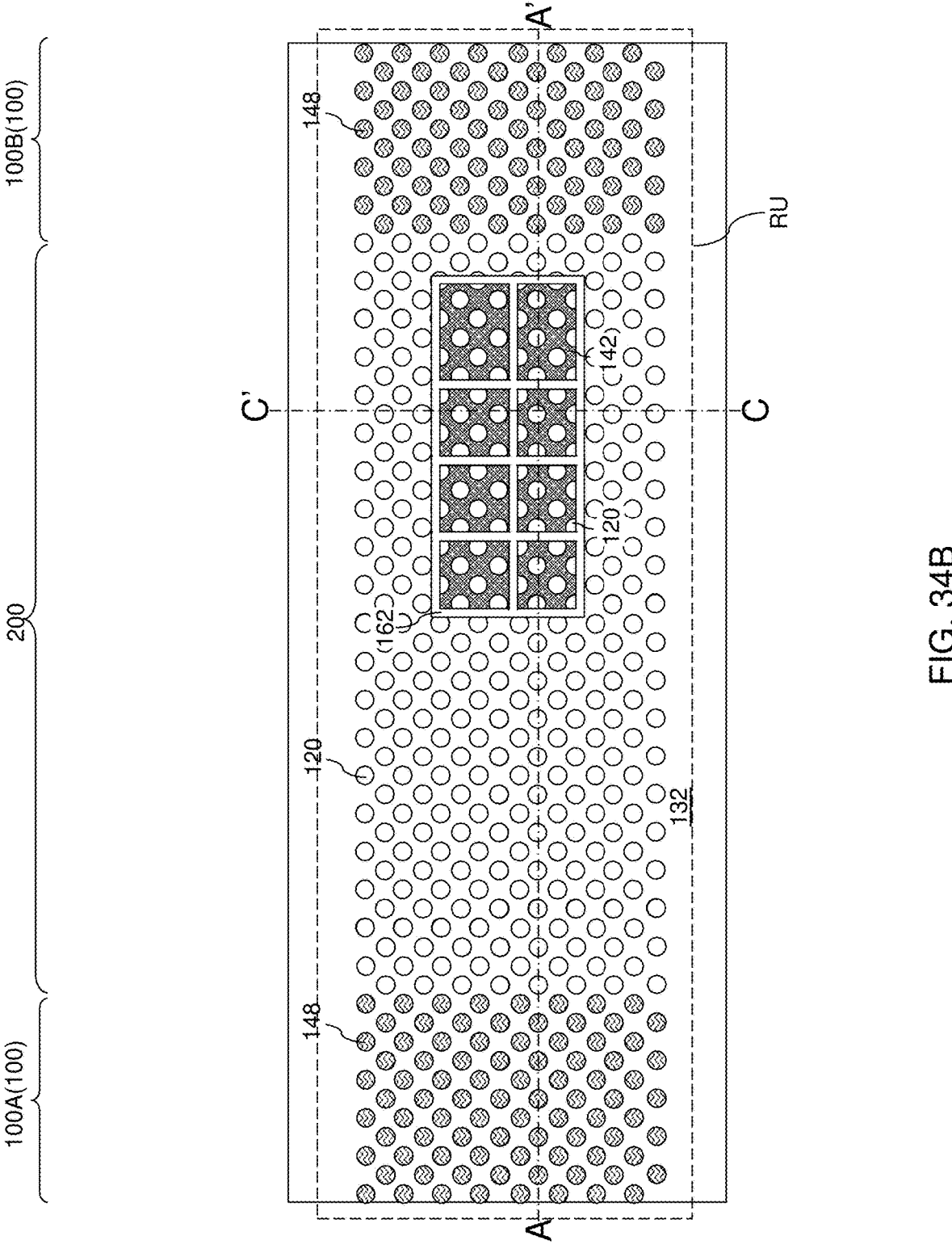
Figure 34C:
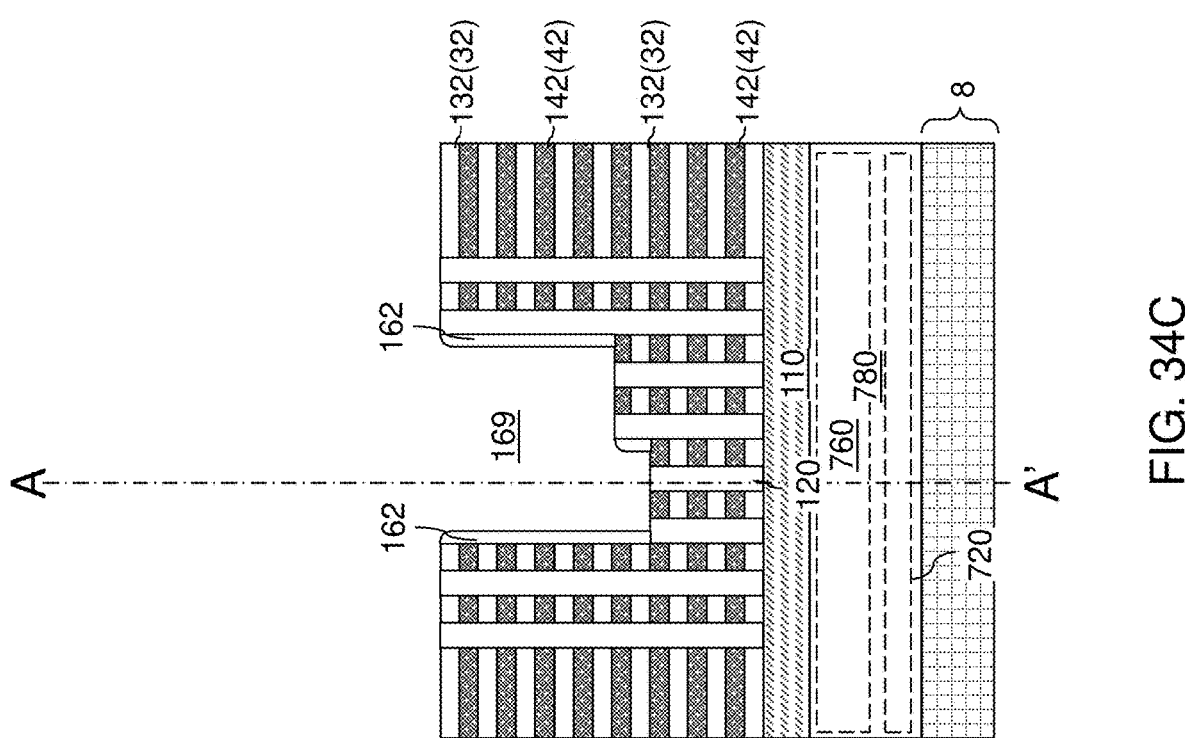

Referring to FIGS. 34A-34C, an insulating material can be conformally deposited on the physically exposed surfaces of the first stepped cavities 169 and over the topmost layer of the first alternating stack (132, 142) to form a first conformal insulating material layer. The insulating material comprises a material that is different from the material of the first sacrificial material layers 142. For example, the insulating material may comprise an undoped or doped silicon oxide material, such as undoped silicate glass or a doped silicate glass. The thickness of the first conformal insulating material layer may be in a range from 10 nm to 120 nm, such as from 20 nm to 60 nm, although lesser and greater thicknesses may also be employed.

An anisotropic sidewall spacer etch process can be performed to remove horizontally-extending portions of the first conformal insulating material layer. A first insulating spacer 162 comprising vertically-extending portions of the first conformal insulating material layer can be formed on vertically-extending surfaces of the each first stepped cavity 169. Each first insulating spacer 162 contacts vertically-extending surfaces of a respective first stepped cavity 169, i.e., the sidewalls of the respective first stepped cavity 169. Each first insulating spacer 162 may be formed as a respective single continuous structure comprising a respective array of rectangular openings therethrough, as shown in FIG. 34B. The number of rectangular openings in each first insulating spacer 162 may be the same as the number of horizontally-extending surface segments of the first sacrificial material layers 142 underlying a respective first stepped cavity 169. In one embodiment, each first insulating spacer 162 comprises a M×N array of vertically-extending openings therethrough.

Figure 35A:
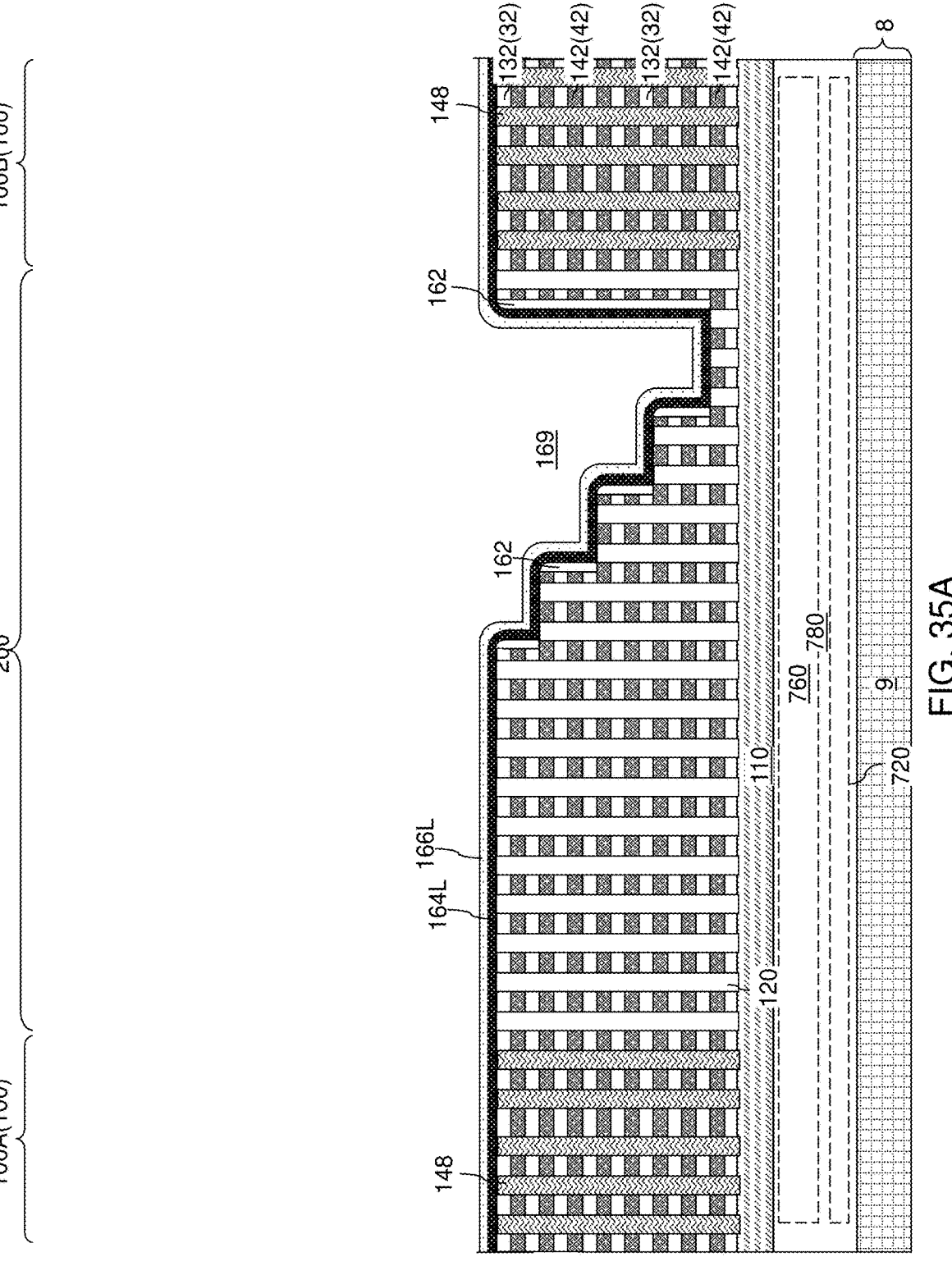
FIGS. 35A-35C are various views of the second exemplary structure after formation of a first continuous electrically conductive material layer and a first insulating mask layer according to an embodiment of the present disclosure.
Figure 35B:
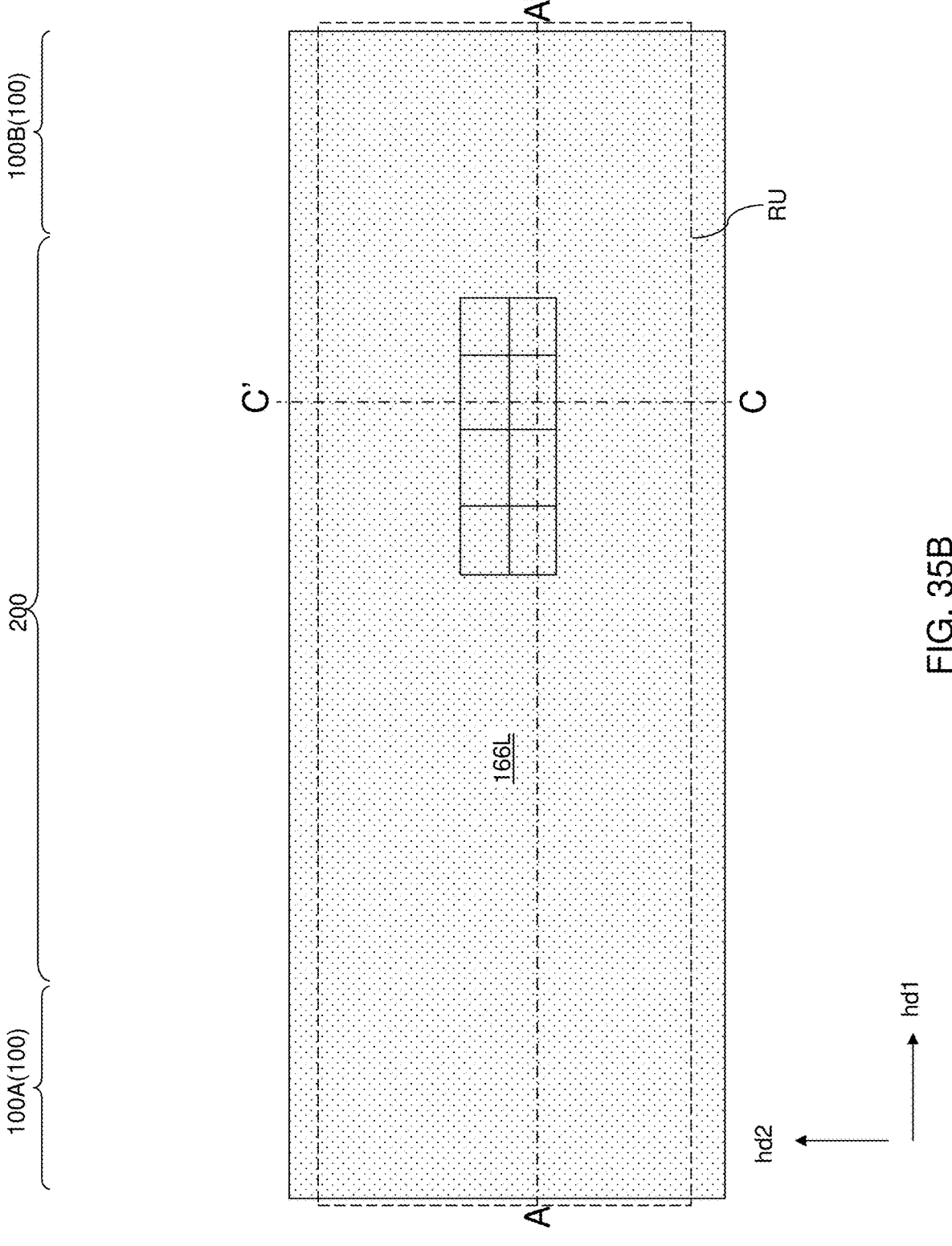
Figure 35C:
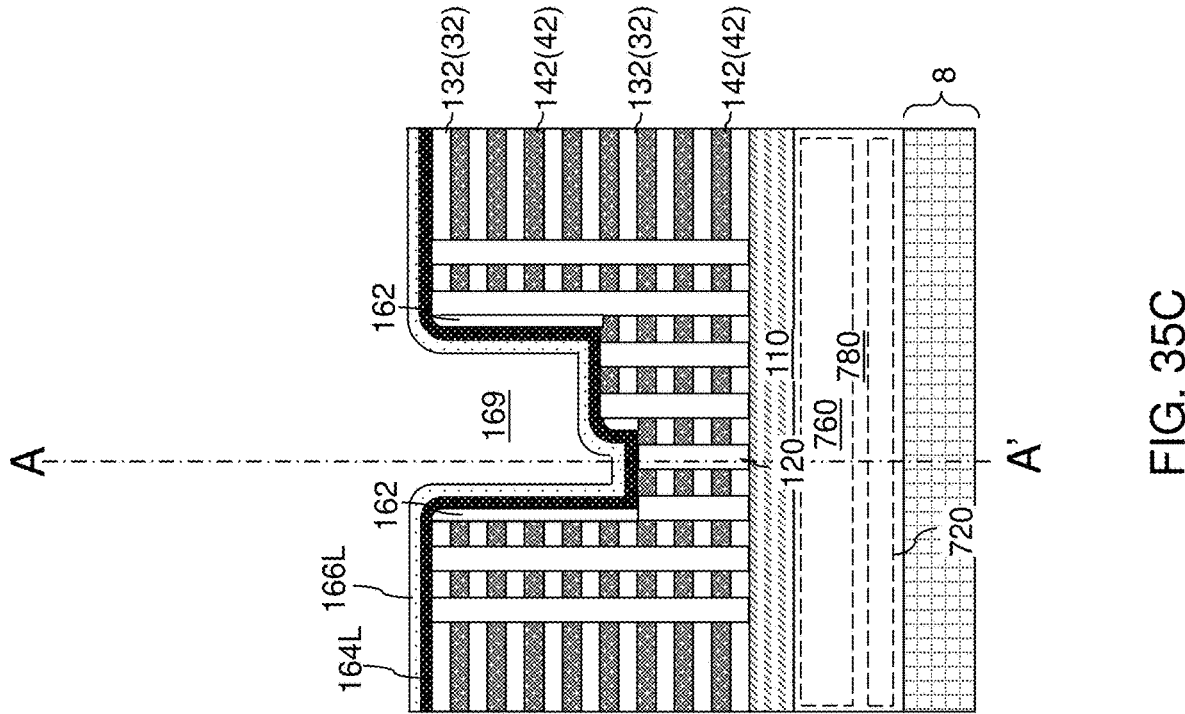

Referring to FIGS. 35A-35C, a first continuous electrically conductive material layer 164L and a first insulating mask layer 166L can be conformally deposited over the physically exposed horizontal surfaces of the first stepped cavities 169, the physically exposed surfaces of the first insulating spacers 162, and the top surface of the topmost layer of the first alternating stack (132, 142). The first continuous electrically conductive material layer 164L comprises at least one electrically conductive material In an illustrative embodiment, the at least one electrically conductive material of the first continuous electrically conductive material layer 164L may comprise an optional metallic barrier liner including a metallic barrier material, such as TiN, TaN, WN, MON, TIC, TaC, WC, etc., and a metal, such as W, Ti, Ta, Mo, Co, Ru, etc. The thickness of the first continuous electrically conductive material layer 164L may be in a range from 10 nm to 200 nm, such as from 20 nm to 100 nm, although lesser and greater thicknesses may also be employed. The first insulating mask layer 166L comprises an insulating material such as undoped silicate glass (i.e., silicon oxide) or a doped silicate glass. The thickness of the first insulating mask layer 166L may be in a range from 10 nm to 120 nm, such as from 20 nm to 60 nm, although lesser and greater thicknesses may also be employed.

Figure 36A:
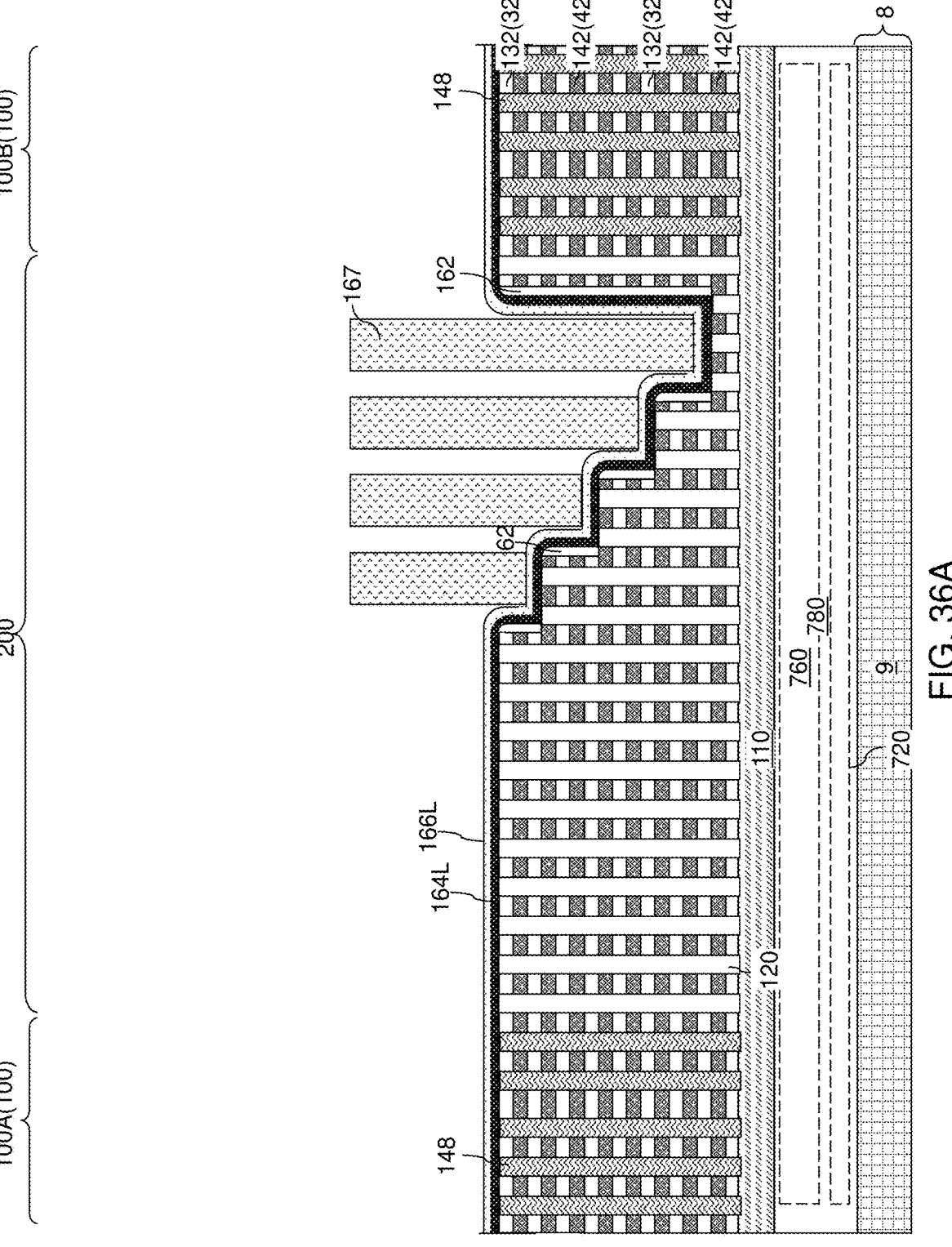
FIGS. 36A-36C are various views of the second exemplary structure after formation of a first patterned photoresist layer according to an embodiment of the present disclosure.
Figure 36B:
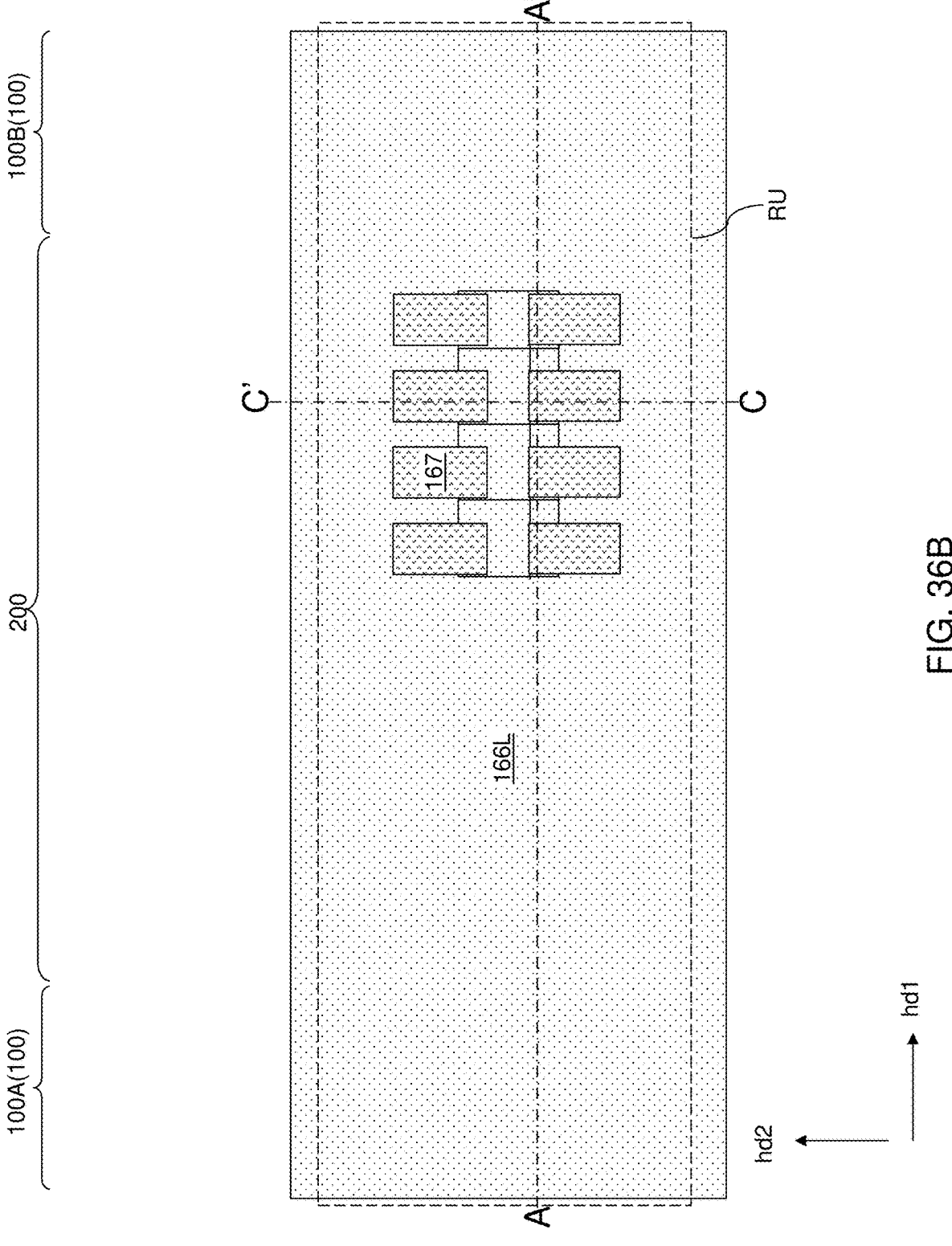
Figure 36C:
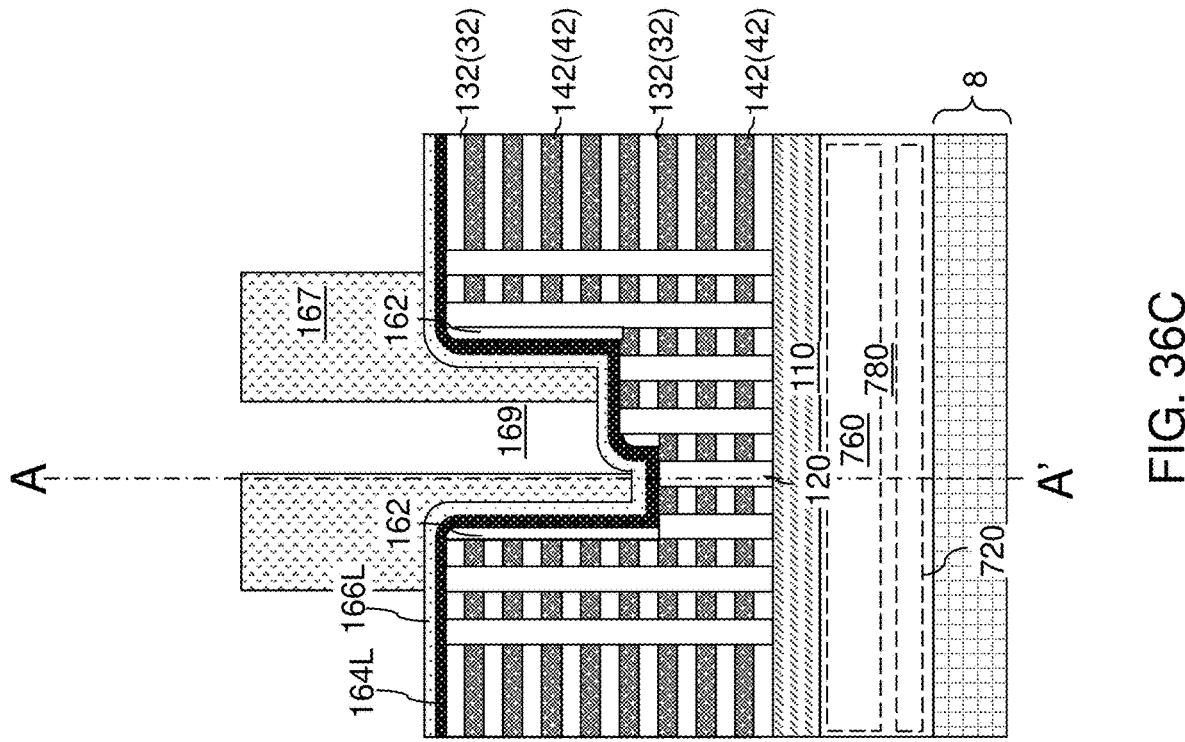

Referring to FIGS. 36A-36C, a first patterned photoresist layer 167 can be formed over the first insulating mask layer 166L. For example, a blanket photoresist layer having a planar top surface or a contoured top surface can be applied over the top surface of the first insulating mask layer 166L, and can be lithographically patterned to form a M×N array of discrete patterned photoresist material portions around each area of a first stepped cavity 169 to form the first patterned photoresist layer 167. In other words, the first patterned photoresist layer 167 comprises an array of M×N discrete patterned photoresist material portions around each area of a first stepped cavity 169. Each patterned photoresist material portion of the first patterned photoresist layer 167 may cover a respective rectangular area in a plan view (such as a top-down view). Each patterned photoresist material portion of the first patterned photoresist layer 167 may contact a respective horizontal surface segment (i.e., a stepped surface) of a horizontally-extending portion of the first insulating mask layer 166L overlying the topmost layer of the first alternating stack (132, 142); a segment of a respective horizontally-extending portion of the first insulating mask layer 166L having an areal overlap with and overlying a respective horizontally-extending surface of a first stepped bottom surface of a respective first stepped cavity 169 (which may be a segment of a top surface of a first sacrificial material layer 142); and a segment of a lengthwise outer sidewall of the first insulating mask layer 166L that laterally extends along the first horizontal direction hd1. In other words, each patterned photoresist material portion may be located over top and bottom horizontal portions of the first insulating mask layer 166L and over a substantially vertical sidewall of the first insulating mask layer 166L which connects the top and bottom horizontal portions, as shown in FIG. 36C.

Figure 37A:
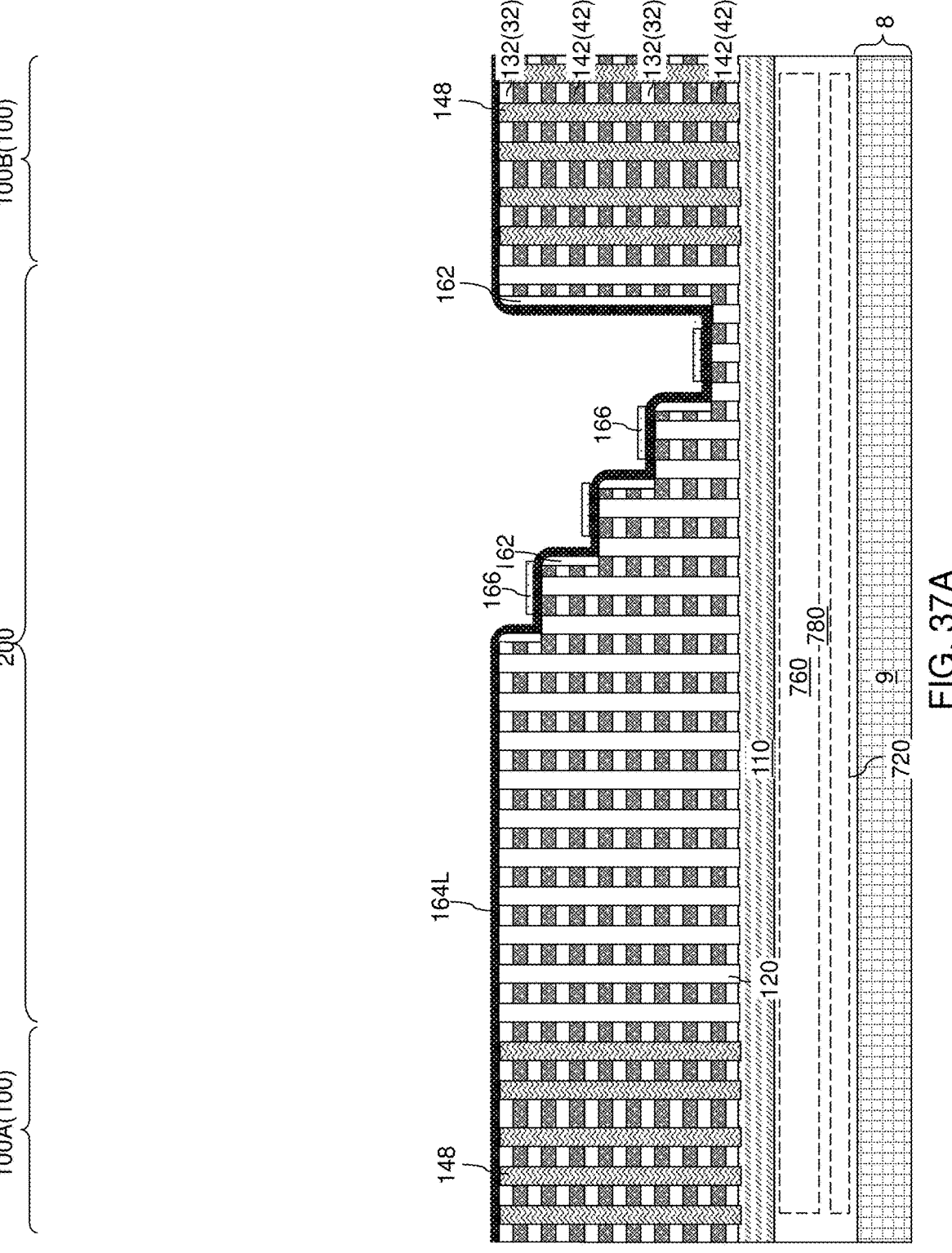
FIGS. 37A-37C are various views of the second exemplary structure after patterning the first insulating mask layer into first insulating material strips according to an embodiment of the present disclosure.
Figure 37B:
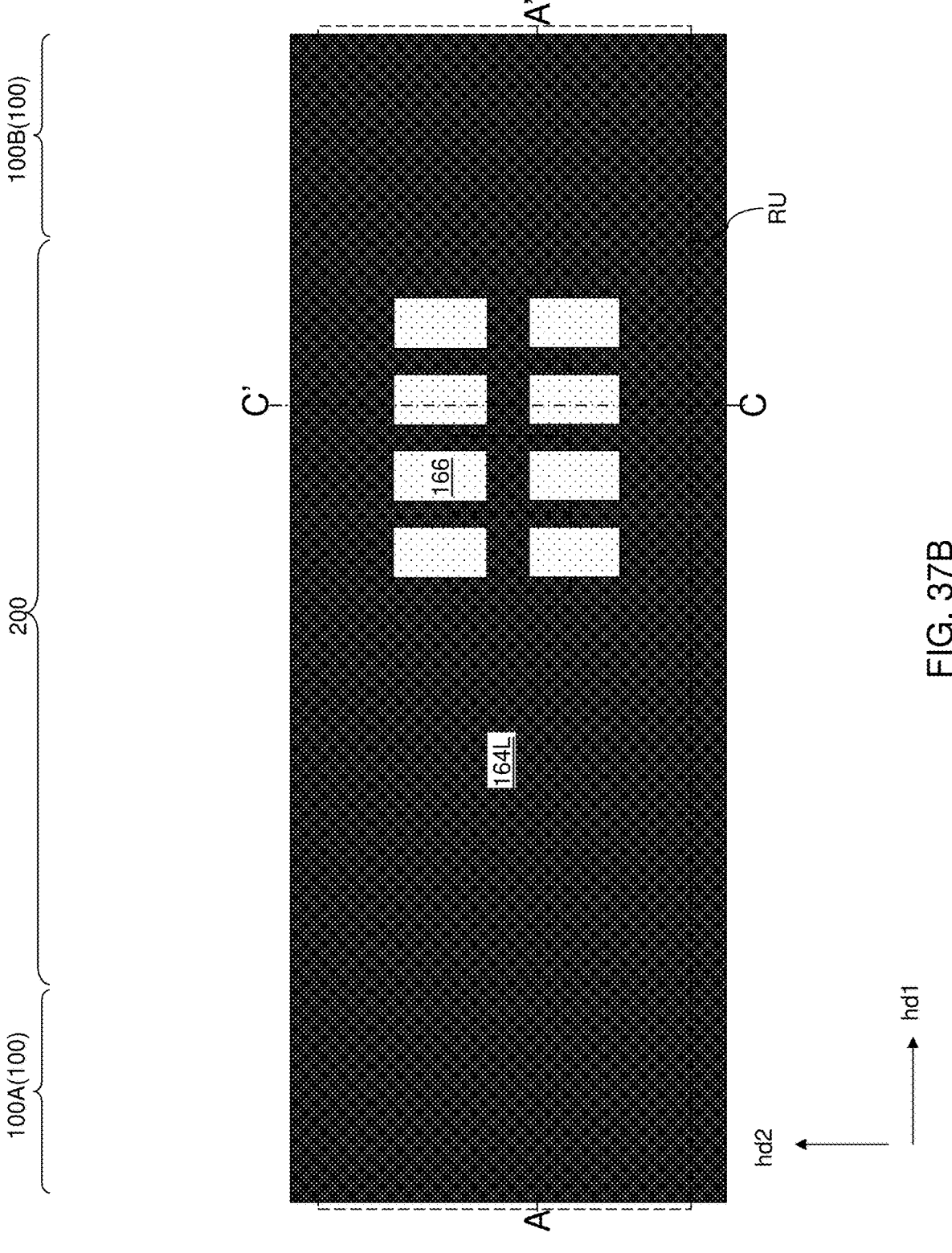
Figure 37C:
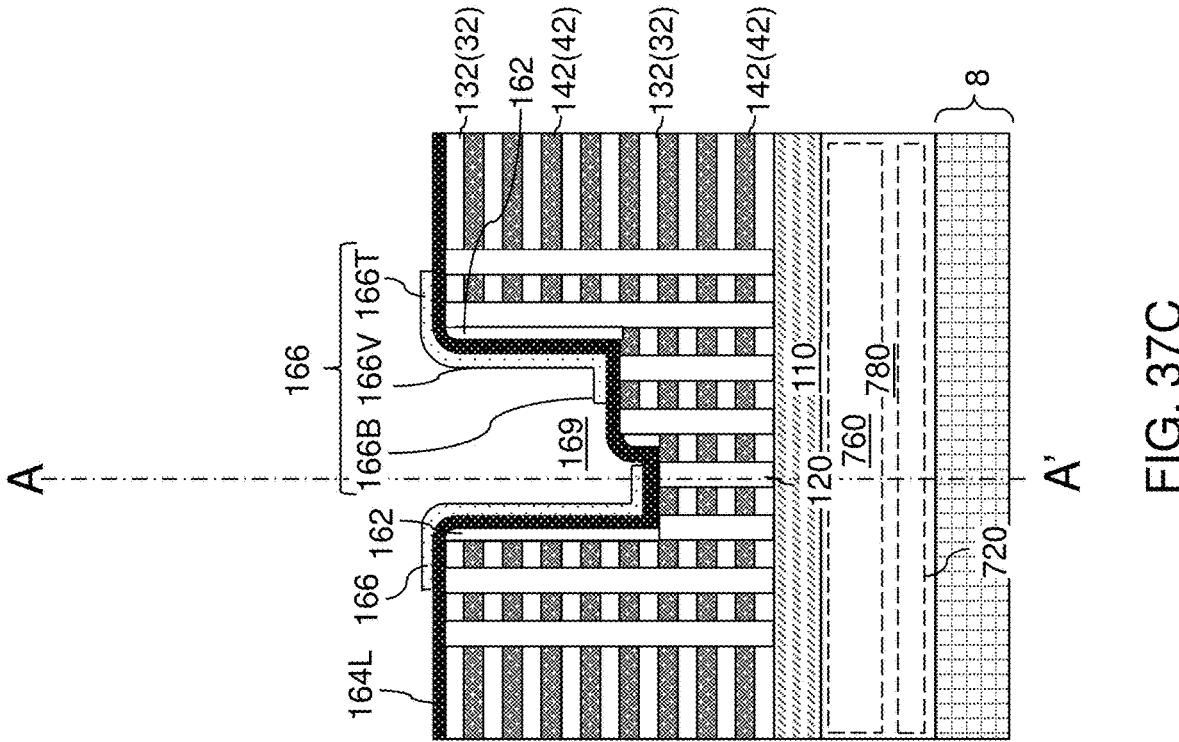

Referring to FIGS. 37A-37C, a first selective isotropic etch process can be performed to transfer the pattern of the first patterned photoresist layer 167 into the first insulating mask layer 166L. The first selective isotropic etch process etches the material of the first insulating mask layer 166L selective to the material of the first continuous electrically conductive material layer 164L. For example, if the first insulating mask layer 166L comprises a silicon oxide material, a wet etch process employing dilute hydrofluoric acid may be performed to isotropically etch unmasked portions of the first insulating mask layer 166L, i.e., to remove portions of the first insulating mask layer 166L that are not covered by the first patterned photoresist layer 167. Each remaining patterned portion of the first insulating mask layer 166L comprises a first insulating material strip 166. A M×N array of discrete first insulating material strips 166 can be formed around each first stepped cavity 169. The first patterned photoresist layer 167 may be subsequently removed, for example, by ashing.

The first insulating material strips 166 can be formed over and directly on the first continuous electrically conductive material layer 164L. In one embodiment shown in FIG. 37C, each of the first insulating material strips 166 comprises: a first horizontally-extending bottom strip segment 166B located in a respective first stepped cavity 169 and overlying a respective one of the first sacrificial material layers 142; a first horizontally-extending top strip segment 166T that overlies a topmost layer within the first alternating stack (132, 142); and a first vertically-extending strip segment 166V connecting the first horizontally-extending bottom strip segment 166B and the first horizontally-extending top strip segment 166T and vertically extending over an outer sidewall of the first continuous electrically conductive material layer 164L. In one embodiment shown in FIG. 37B, each first insulating material strip 166 may occupy a respective rectangular area in a plan view such as a top-down view, and may have a respective uniform width along the first horizontal direction hd1 in the plan view.

Figure 38A:
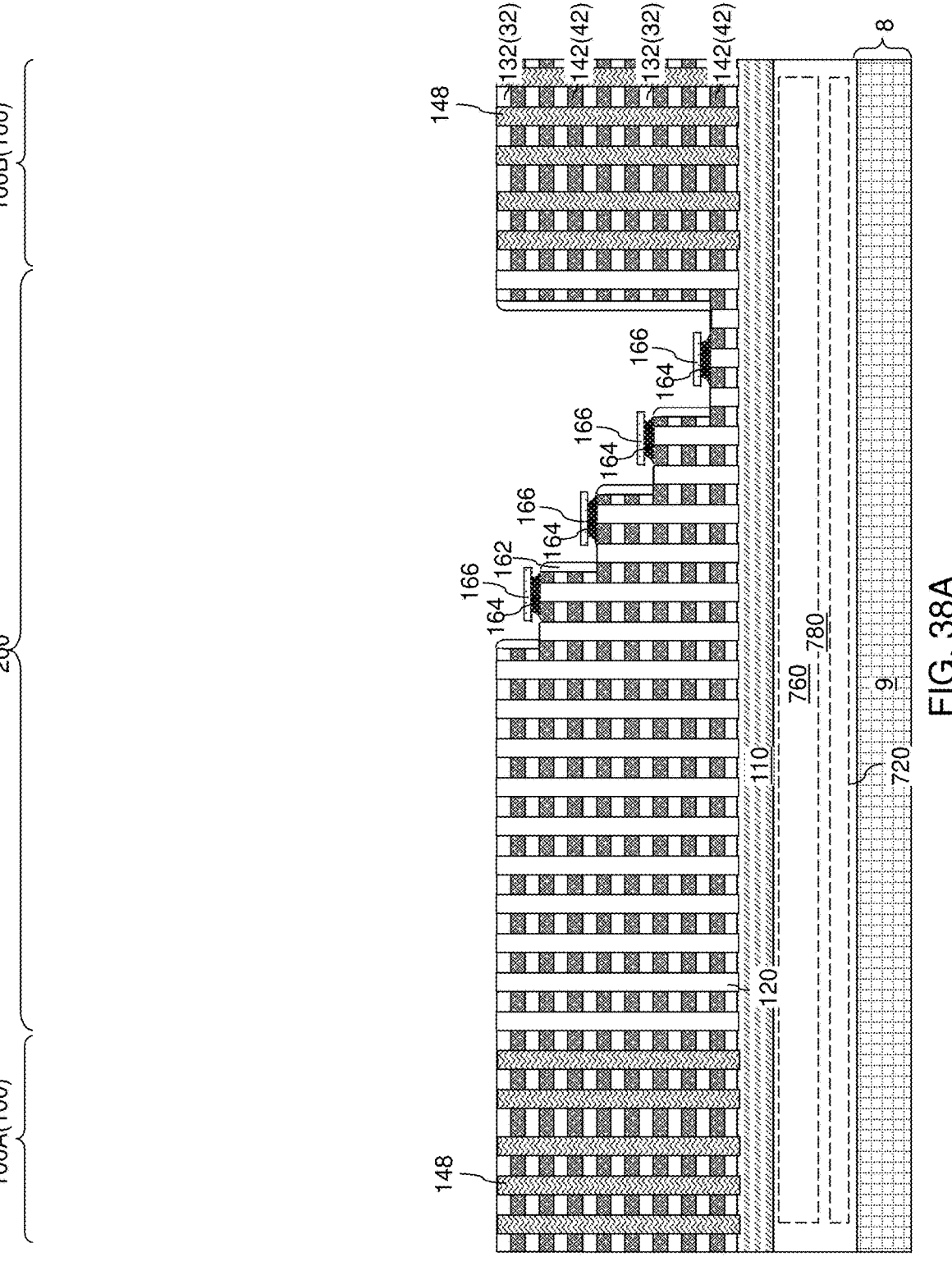
FIGS. 38A-38C are various views of the second exemplary structure after patterning the first continuous electrically conductive material layer into first electrically conductive strips according to an embodiment of the present disclosure.
Figure 38B:
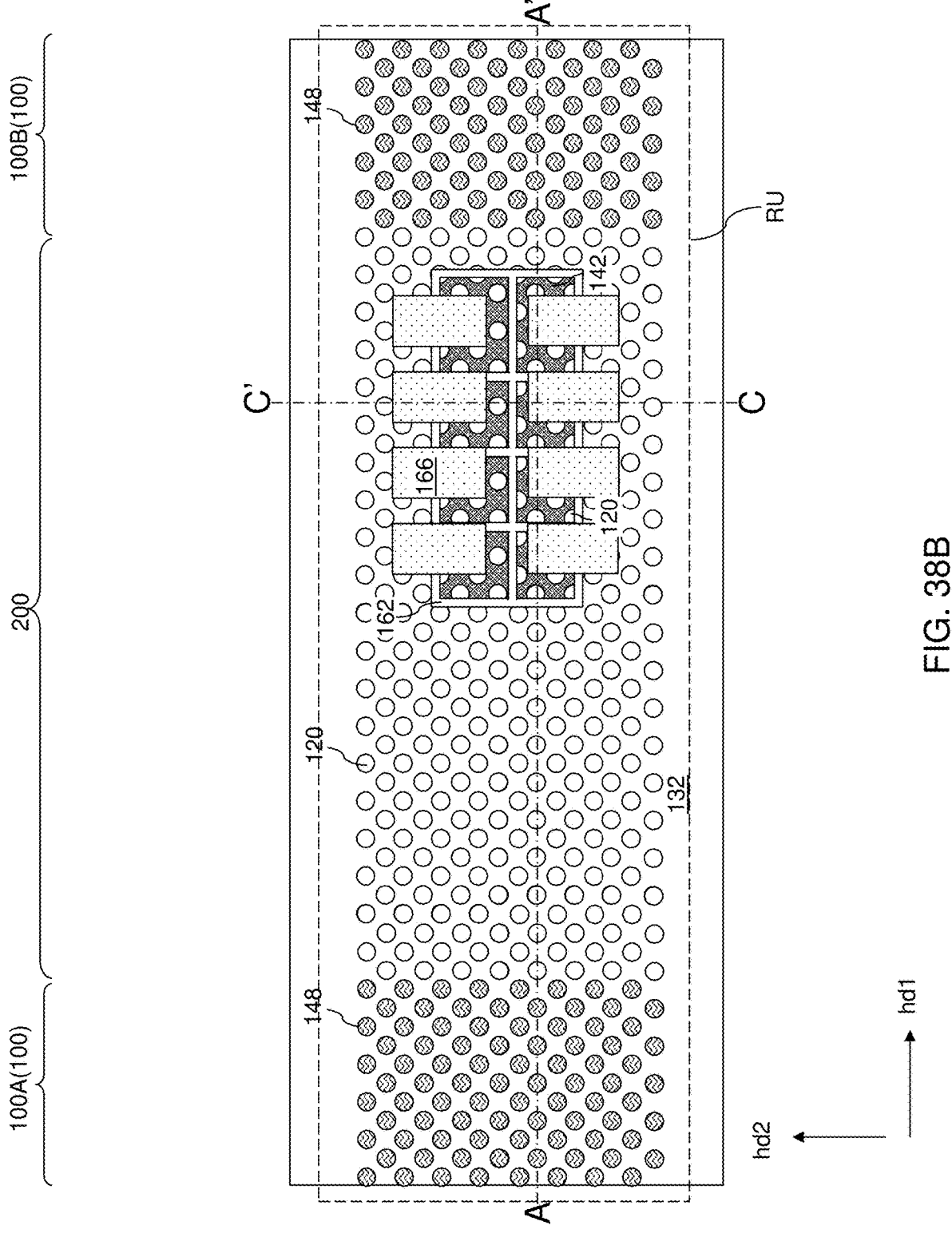
Figure 38C:
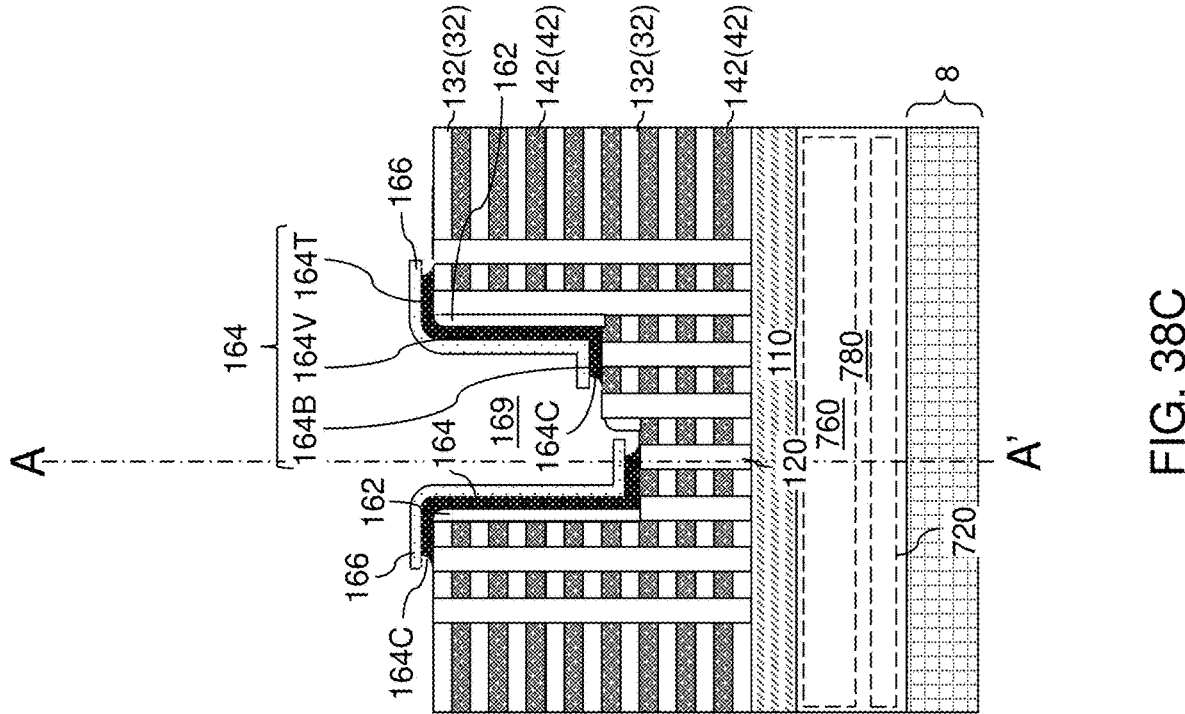

Referring to FIGS. 38A-38C, a second selective isotropic etch process can be performed to transfer the pattern of the first insulating material strips 166 into the first continuous electrically conductive material layer 164L. The second selective isotropic etch process etches the material of the first continuous electrically conductive material layer 164L selective to the material of the first alternating stack (132, 142), the first insulating spacers 162, the first insulating material strips 166, and the first-tier support pillar structures 120. For example, a wet etch process may be performed which selectively etches first continuous electrically conductive material layer 164L without etching the dielectric materials of the first alternating stack (132, 142), the first insulating spacers 162, the first insulating material strips 166 and the first-tier support pillar structures 120. Each remaining patterned portion of the first continuous electrically conductive material layer 164L comprises a first electrically conductive strip 164. A M×N array of discrete first electrically conductive strips 164 can be formed underneath each M×N array of first insulating material strips 166.

In summary, the first continuous electrically conductive material layer 164L may be patterned into first electrically conductive strips 164 by performing an isotropic etch process that isotropically etches portions of the first continuous electrically conductive material layer 164L that are not masked by the first insulating material strips 166. Remaining portions of the first continuous electrically conductive material layer 164L constitute the first electrically conductive strips 164. In one embodiment shown in FIG. 38C, at least one of the first electrically conductive strips 164 comprises a first horizontally-extending bottom strip segment 164B contacting one of the first electrically conductive layers 142, a first horizontally-extending top strip segment 164T that overlies a topmost layer within the first alternating stack (132, 142), and a first vertically-extending strip segment 164V connecting the first horizontally-extending bottom strip segment 164B and the first horizontally-extending top strip segment 164T. In one embodiment, each of the first electrically conductive strips 164 may laterally extend along the second horizontal direction hd2 over a portion of the first insulating spacer 162 that contacts one of the pair of stepped sidewalls of a respective first stepped cavity 169.

In one embodiment, the second selective isotropic etch process may form undercuts in each first electrically conductive strip 164 underneath peripheral regions of a respective overlying first insulating material strip 166. Further, isotropic etch fronts may be generated on portions of the first continuous electrically conductive material layer 164L that underlie edges of the first insulating material strips 166, and as a consequence, each first electrically conductive strip 164 may be formed with a respective set of concave surface segment 164C in the undercuts that underlies edges of a respective overlying first insulating material strip 166.

In this case, each first horizontally-extending bottom strip segment 164B of a first electrically conductive strip 164 may comprise: a planar horizontal bottom surface contacting a portion of a top surface of a respective one of the first sacrificial material layers 142; a planar horizontal top surface that is parallel to the planar top surface and has a lesser width than the planar horizontal bottom surface; and a pair of horizontally-extending tapered surfaces of the respective concave surface segments 164C having a respective concave vertical cross-sectional profile. In other words, each first horizontally-extending bottom strip segment 164B of a first electrically conductive strip 164 may have a vertical cross-sectional shape of a modified trapezoid in which a shape of a trapezoid is modified by replacing two slanted sides with a respective concave surface segment 164C having a same radius of curvature, which equals the etch distance of the second selective isotropic etch process.

In one embodiment, each first vertically-extending strip segment 164V of a first electrically conductive strip 164 may comprise: a first planar surface contacting an inner sidewall of the first insulating spacer 162; a second planar surface that is parallel to the first planar surface segment and has a lesser width than the first planar surface; and a pair of vertically-extending tapered surfaces having a respective concave horizontal cross-sectional profile. In other words, each first vertically-extending strip segment 164V of a first electrically conductive strip 164 may have a horizontal cross-sectional shape of a modified trapezoid in which a shape of a trapezoid is modified by replacing two slanted sides with a respective concave surface segment having a same radius of curvature, which equals the etch distance of the second selective isotropic etch process.

In one embodiment, each first horizontally-extending top strip segment 164T of a first electrically conductive strip 164 may comprise: a planar horizontal bottom surface contacting a portion of a top surface of a topmost first insulating layer 132; a planar horizontal top surface having a lesser width than the planar horizontal bottom surface; and a pair of horizontally-extending tapered surfaces of the respective concave surface segments 164C having a respective concave vertical cross-sectional profile. In other words, each first horizontally-extending top strip segment 164T of a first electrically conductive strip 164 may have a vertical cross-sectional shape of a modified trapezoid in which a shape of a trapezoid is modified by replacing two slanted sides with a respective concave surface segment 164C having a same radius of curvature, which equals the etch distance of the second selective isotropic etch process.

Figure 39B:
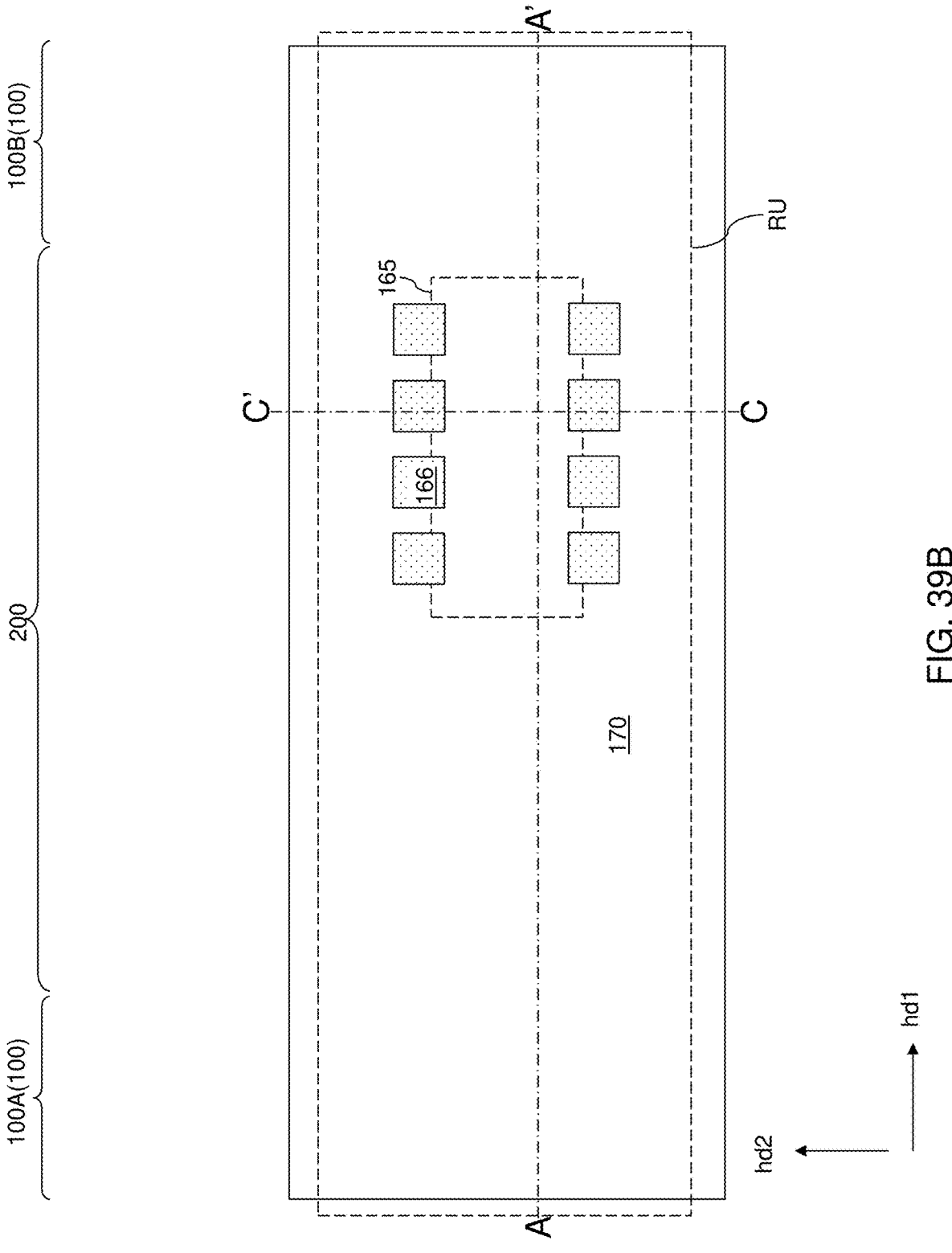
Figure 39C:
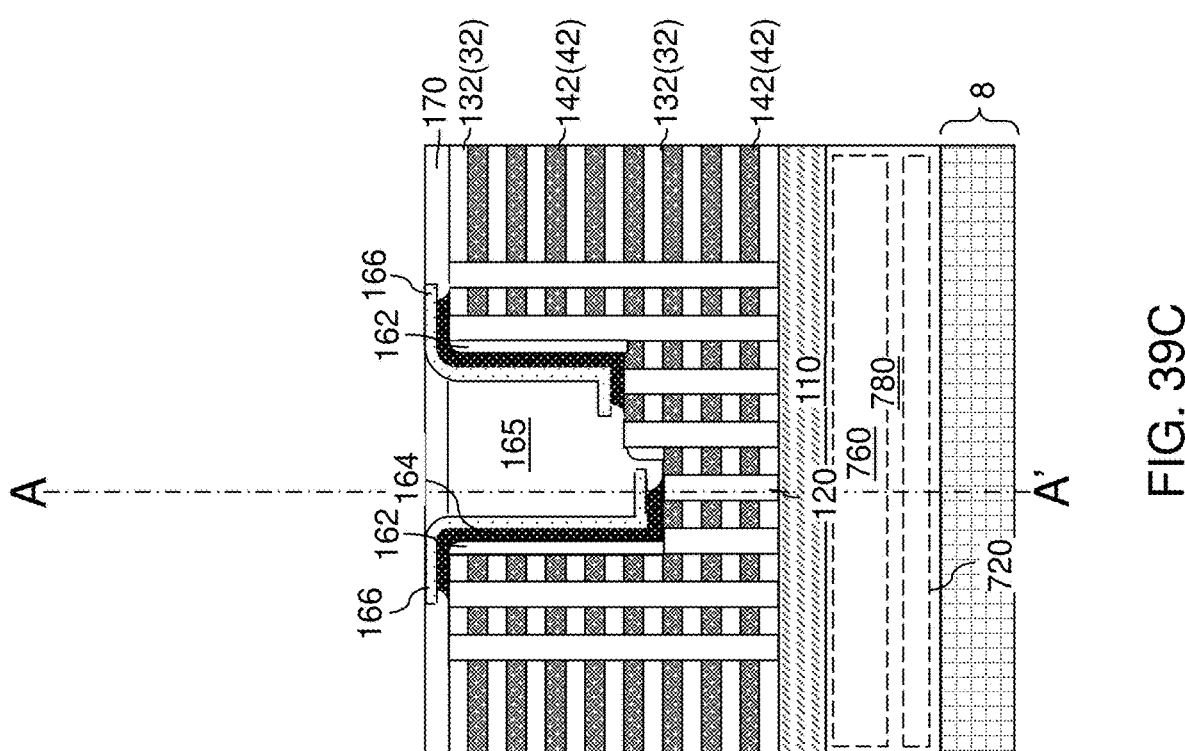

Referring to FIGS. 39A-39C, a first dielectric fill material such as undoped silicate glass or a doped silicate glass can be deposited in remaining unfilled volumes of the first stepped cavities 169 by a conformal deposition process. The first dielectric fill material can be deposited over the first insulating material strips 166 after formation of the first electrically conductive strips 164. Excess portions of the first dielectric fill material may be removed from above a horizontal plane located at or overlying topmost surfaces of the first electrically conductive strips 164 by performing a planarization process. The planarization process may comprise a chemical mechanical polishing process and/or a recess etch process. In an illustrative example, excess portions of the first dielectric fill material may be removed from above a horizontal plane including the topmost surfaces of the first insulating material strips 166.

Each portion of the first dielectric fill material that fills a respective first stepped cavity 169 constitutes a first retro-stepped dielectric material portion 165, which is a dielectric material portion having a stepped bottom surface. Thus, portions of the first dielectric fill material can be removed from outside the volumes of the first stepped cavities 169, and remaining portions of the first dielectric fill material in the volumes of the first stepped cavities 169 comprises the first retro-stepped dielectric material portions 165. The horizontally-extending portion of the first dielectric fill material that overlies the horizontal plane including the topmost surface of the first alternating stack (132, 142) constitutes a first insulating cap layer 170. Each first retro-stepped dielectric material portion 165 can be located within a respective first stepped cavity 169, and can contact concave surface segments 164C of a respective subset of the first electrically conductive strips 164. A first-tier structure is thus formed.

Figure 40:
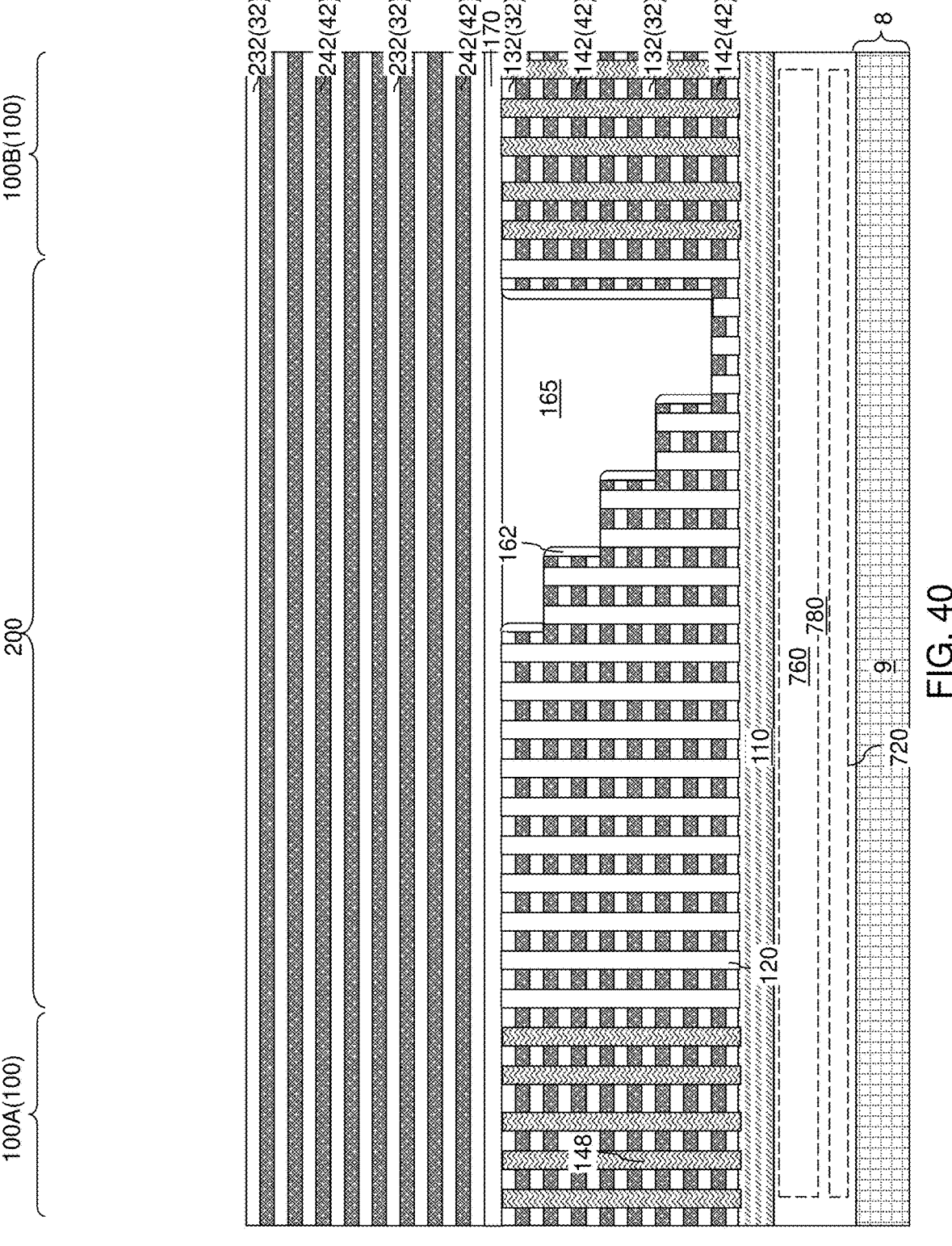
FIG. 40 is a vertical cross-sectional view of the second exemplary structure after formation of a second alternating layer stack of second insulating layers and second sacrificial material layers according to an embodiment of the present disclosure.

Referring to FIG. 40, a second alternating layer stack of second insulating layers 232 and second sacrificial material layers 242 can be formed over the first-tier structure. The second alternating stack (232, 242) includes second insulating layers 232 and second sacrificial material layers 242 that are interlaced along the vertical direction. A subset of the processing steps described with reference to FIGS. 8A-8E may be performed to form the second alternating stack (232, 242). The second insulating layers 232 are a second subset of the insulating layers 32 employed in the second exemplary structure, and the second sacrificial material layers 242 are a second subset of the sacrificial material layers 42 employed in the second exemplary structure. Thus, the insulating layers 32 comprise the first insulating layers 132 and the second insulating layers 232; and the sacrificial material layers 42 comprise the first sacrificial material layers 142 and the second sacrificial material layers 242.

Figure 41:
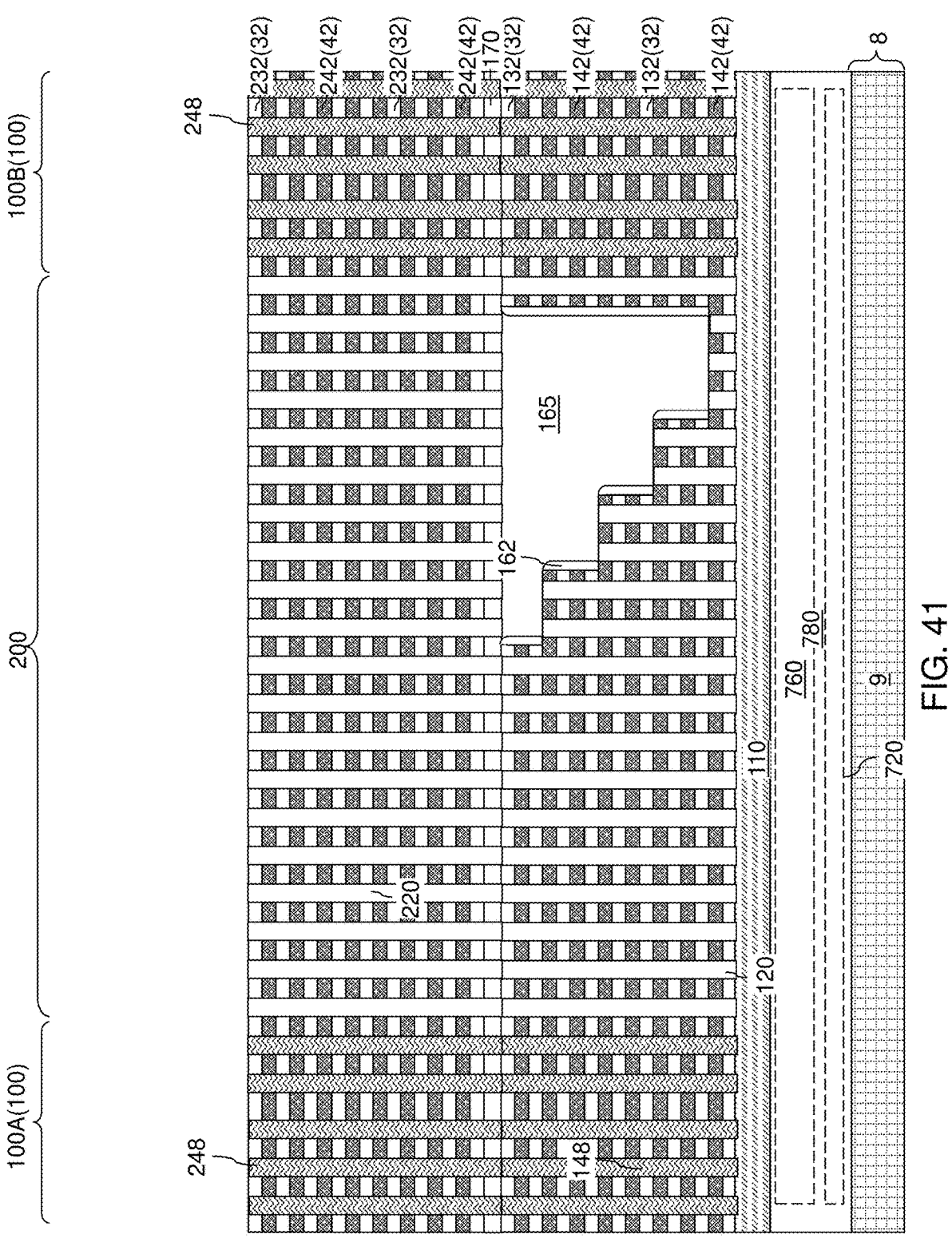
FIG. 41 is a vertical cross-sectional view of the second exemplary structure after formation of second-tier sacrificial memory opening fill material portions and second-tier support pillar structures according to an embodiment of the present disclosure.
Figure 42A:
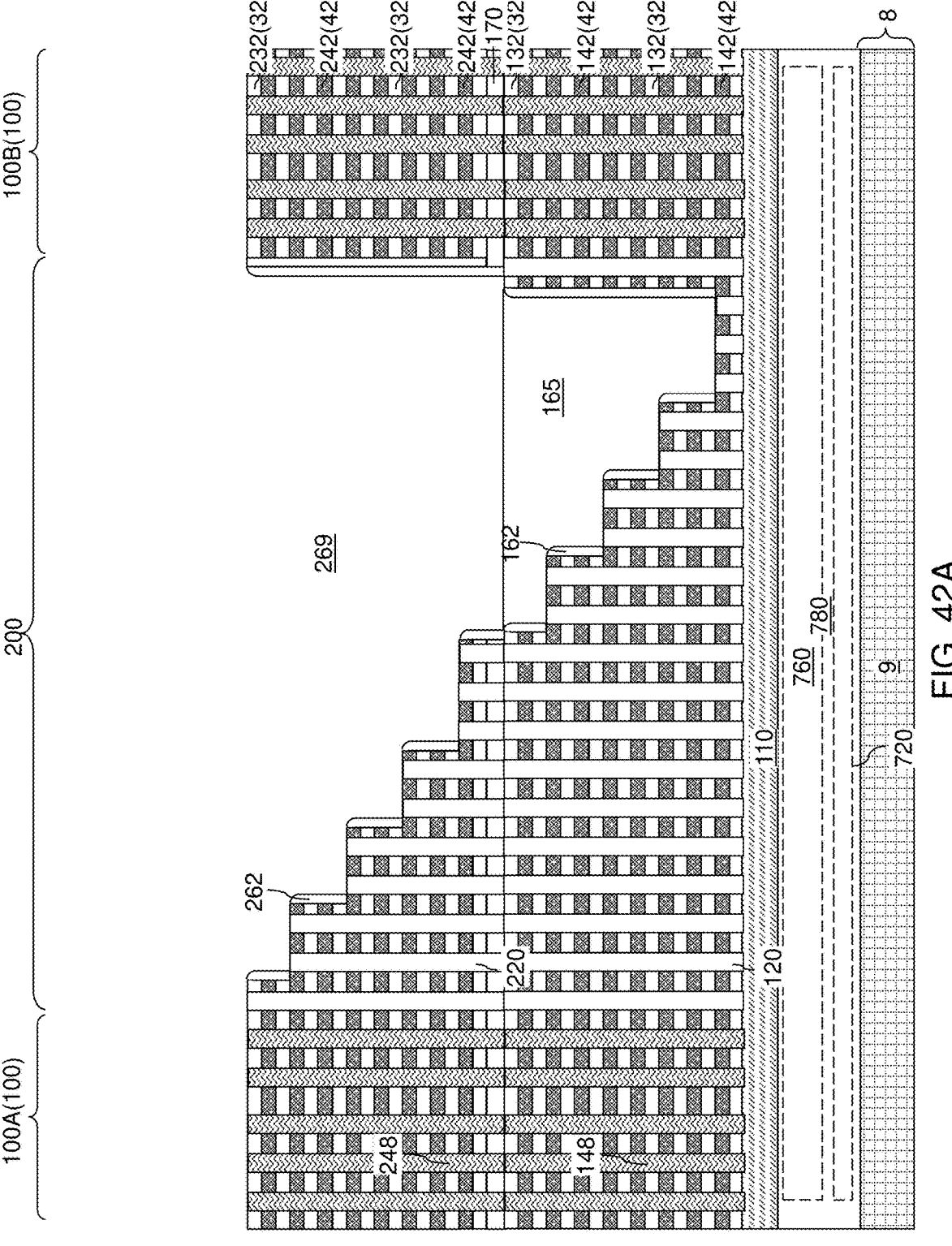
FIGS. 42A-42F are various views of the second exemplary structure after formation of a second stepped cavity and a second insulating spacer according to an embodiment of the present disclosure.
Figure 42B:
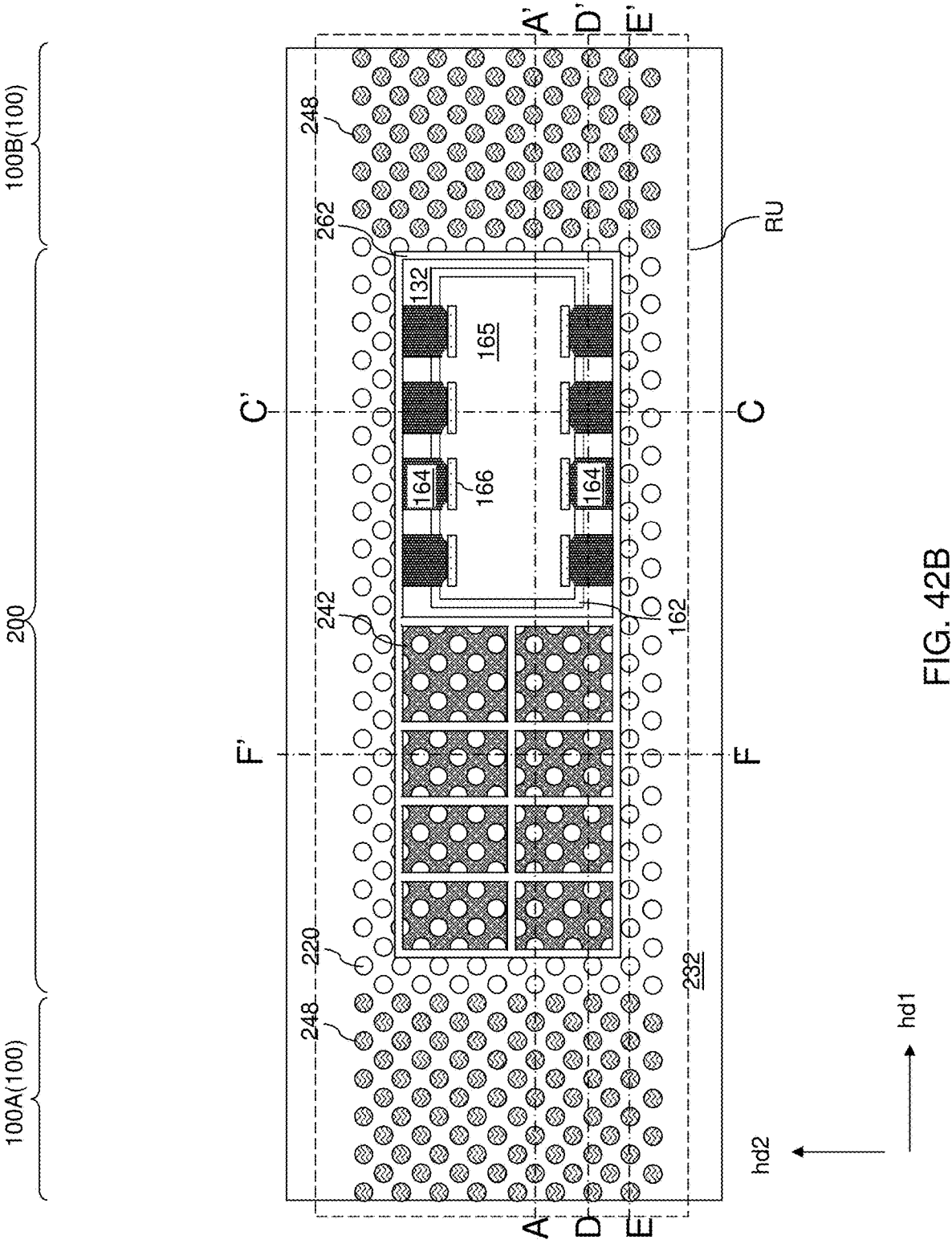
Figure 42C:
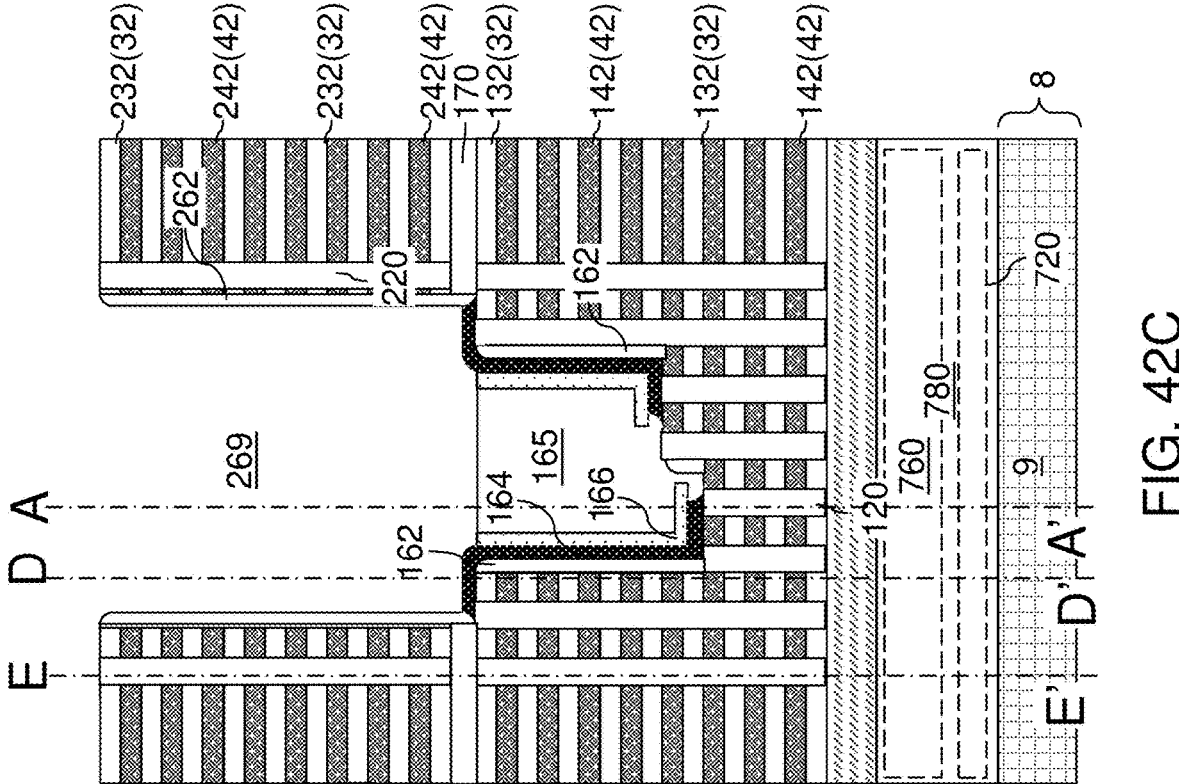
Figure 42D:
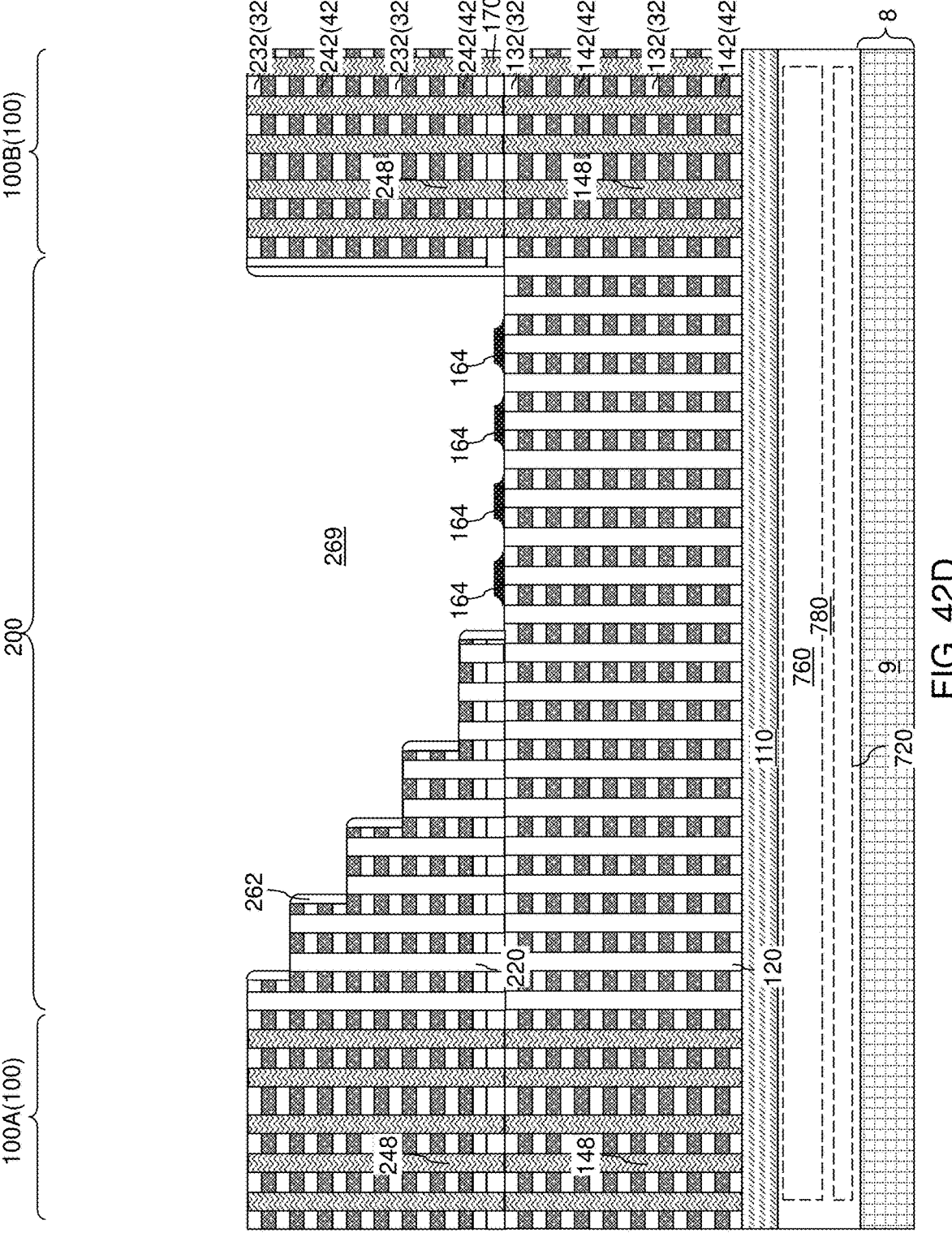
Figure 42E:
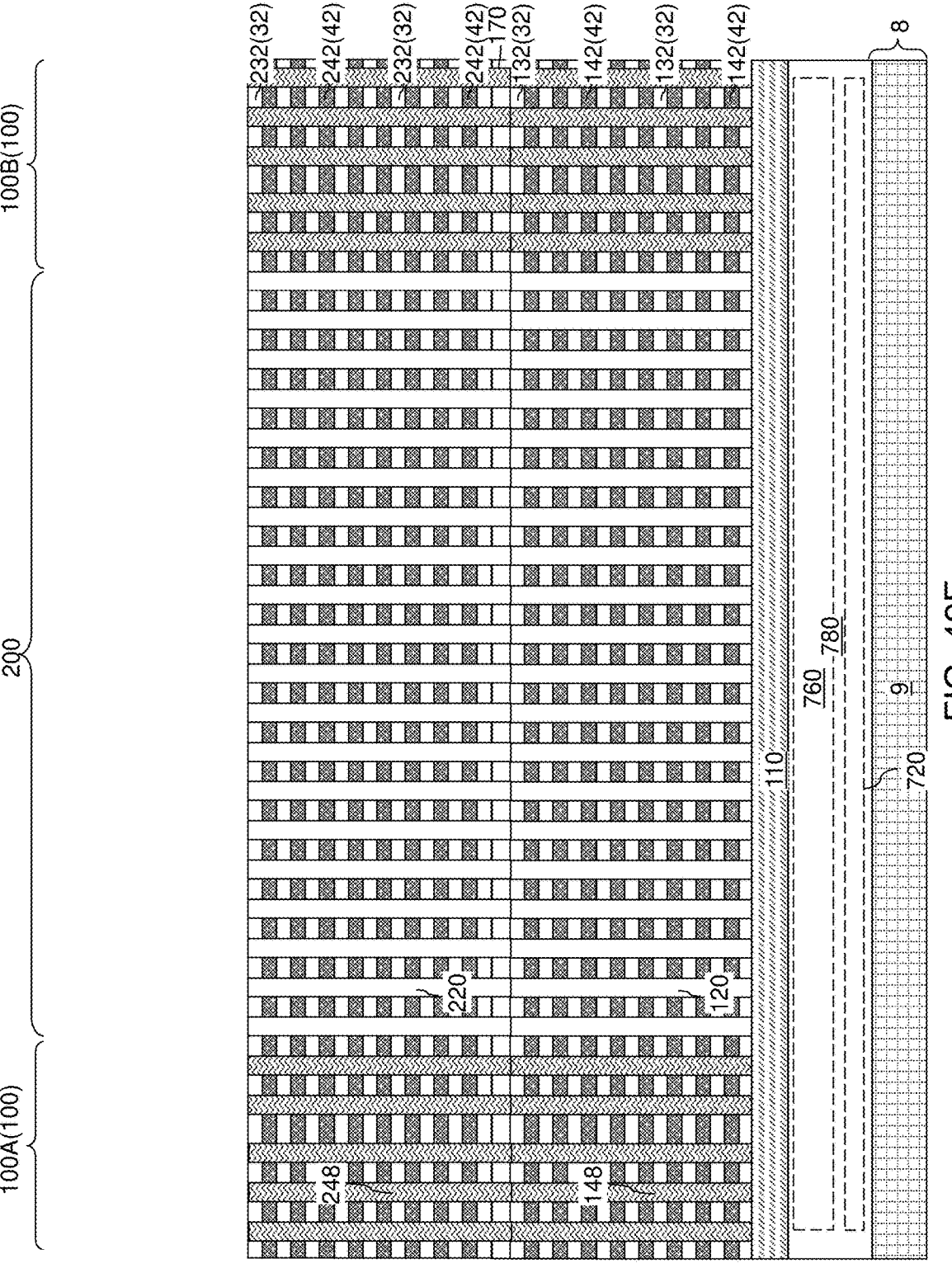
Figure 42F:
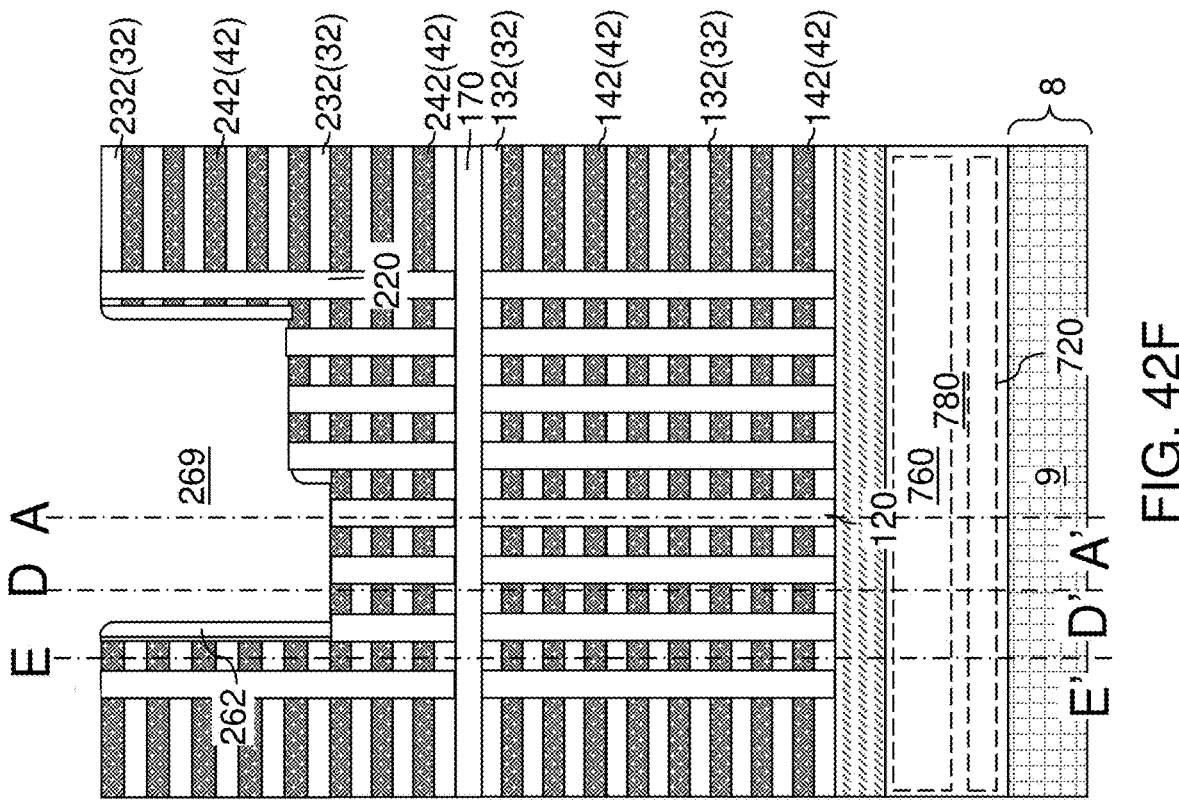

Referring to FIG. 41, the processing steps described with reference to FIG. 32 may be performed with any needed changes to form second-tier sacrificial memory opening fill material portions 248 and second-tier support pillar structures 220. The second-tier sacrificial memory opening fill material portions 248 and the second-tier support pillar structures 220 can be formed through the second alternating stack (232, 242) and through the first insulating cap layer 170. Each second-tier sacrificial memory opening fill material portion 248 may be formed on a top surface of a respective one of the first-tier sacrificial memory opening fill material portions 148. In one embodiment, each of the second-tier support pillar structures 220 may have an areal overlap with a respective one of the first-tier support pillar structures 120.

FIGS. 42A-42F are various views of the second exemplary structure after formation of second stepped cavities 269 and second insulating spacers 262. The processing steps described with reference to FIGS. 33A-33C may be performed with any needed changes to form second stepped cavities 269. Each second stepped cavity 269 has a greater area than a respective underlying first stepped cavity 169 (which is filled with a respective first retro-stepped dielectric material portion 165). Each layer within the second alternating stack (232, 242) and the first insulating cap layer 170 can be etched within each area of the first stepped cavities 169 during formation of the second stepped cavities 269. Further, segments of top surfaces of the second sacrificial material layers 242 can be physically exposed outside the area of a respective underlying first stepped cavity 169 to form second stepped surfaces underneath each second stepped cavity 269. Thus, a top surface of an underlying first retro-stepped dielectric material portion 165 and second stepped surfaces can be physically exposed underneath each second stepped cavity 269. The second stepped surfaces may comprise horizontally-extending surfaces that are segments of top surfaces of the second sacrificial material layers 242 and vertically-extending surfaces that are sidewalls of the second insulating layers 232 and second sacrificial material layers 242.

In summary, each second stepped cavity 269 overlies a respective underlying first stepped cavity 169, and comprises a void that vertically extends from a bottommost layer of the second alternating stack (232, 242) to a topmost layer of the second alternating stack (232, 242). Each second stepped cavity 269 comprises a second stepped bottom surface containing horizontally-extending surface segments of the second sacrificial material layers 242.

Portions of the first insulating material strips 166 that overlie a horizontal plane including a physically exposed top surface of a first retro-stepped dielectric material portion 165 can be collaterally removed during formation of a second stepped cavity 269. In this case, portions of the first insulating material strips 166 that overlie the horizontal plane including the topmost surface of the first alternating stack (132, 142) can be removed during formation of the second stepped cavity 269. The top surface of the first retro-stepped dielectric material portion 165 is located below the horizontal plane including topmost surfaces of the first electrically conductive strip 164. Portions of the first electrically conductive strips 164 that overlie the first alternating stack (132, 142) protrude above the horizontal plane including the top surface of the first retro-stepped dielectric material portion 165. Thus, portions of the first electrically conductive strips 164 that overlie the first alternating stack (132, 142) are physically exposed in the second stepped cavities 269 and are uncovered.

In one embodiment, each second stepped cavity 269 may comprise a respective second stepped bottom surface containing horizontally-extending surface segments of the second sacrificial material layers 242 and vertically-extending surface segments of each second sacrificial material layers 242 and the second insulating layers. In one embodiment, each second stepped bottom surface may comprise a P×Q array of horizontally-extending surface segments of the second sacrificial material layers 242; the horizontally-extending surface segments may be vertically spaced apart from each other along the second horizontal direction hd1 and also along the second horizontal direction hd2 if P>1; P may be an integer from 1 to 10; and Q may be an integer in a range from 2 to $2^{10}$. In one embodiment, each second stepped bottom surface may comprise two rows (i.e., P=2) of Q horizontally-extending surface segments of the second sacrificial material layers 242 that are arranged along the first horizontal direction hd1.

Subsequently, the processing steps described with reference to FIGS. 34A-34C can be performed with any needed changes to form a second insulating spacer 262 on sidewalls of each second stepped cavity 269. Each second insulating spacer 262 contacts vertically-extending surfaces of a respective second stepped cavity 269, i.e., the sidewalls of the respective second stepped cavity 269. Each second insulating spacer 262 may be formed as a respective single continuous structure comprising a respective array of rectangular openings therethrough. The number of rectangular openings in each second insulating spacer 262 may be the same as the number of horizontally-extending surface segments of the second sacrificial material layers 242 underlying a respective second stepped cavity 269. In one embodiment, each second insulating spacer 262 comprises a P×Q array of vertically-extending openings therethrough.

Referring to FIGS. 43A-43F, the processing steps described with reference to FIGS. 35A-35C, 36A-36C, and 37A-37C can be performed with a change in the patterns of material layers to form second insulating material strips 266 and second electrically conductive strips 264. The second electrically conductive strips 264 can be formed over the second insulating spacer 262 and the second stepped bottom surface of a respective second stepped cavity 269. A first subset of the second electrically conductive strips 264 (including the strip 264 shown in FIG. 43C) is formed in contact with a top surface of a respective one of the first electrically conductive strips 164, and specifically, on a first horizontally-extending top strip segment 164T of the respective one of the first electrically conductive strips 164. A second subset of the second electrically conductive strips 264 (including the strip 264 shown in FIG. 43F) is formed on a surface segment of a respective one of the horizontally-extending surface segments of the second sacrificial material layers 242. Each second electrically conductive strip 264 within the second subset of the second electrically conductive strips 264 is herein referred to as a third electrically conductive strip 364, as shown in FIGS. 43A, 43D, 43E and 43F.

Second insulating material strips 266 can be located over and directly on the second conductive material strips 264. In one embodiment, each of the second insulating material strips 266 comprises: a second horizontally-extending bottom strip segment located in a respective second stepped cavity 269 and overlying a respective one of the second sacrificial material layers 242; a second horizontally-extending top strip segment that overlies a topmost layer within the second alternating stack (132, 242); and a second vertically-extending strip segment connecting the second horizontally-extending bottom strip segment and the second horizontally-extending top strip segment and vertically extending over an outer sidewall of a vertically-extending portion of a respective second electrically conductive strip 264. In one embodiment, each second insulating material strip 266 may occupy a respective rectangular area in a plan view such as a top-down view, and may have a respective uniform width along the first horizontal direction hd1 in the plan view.

In one embodiment, a selective isotropic etch process employed to pattern the second electrically conductive strips 264 may form undercuts in each second electrically conductive strip 264 underneath peripheral regions of a respective overlying second insulating material strip 266. Further, each second electrically conductive strip 264 may be formed with a respective set of concave surface segment that underlie edges of a respective overlying second insulating material strip 266.

Figure 43A:
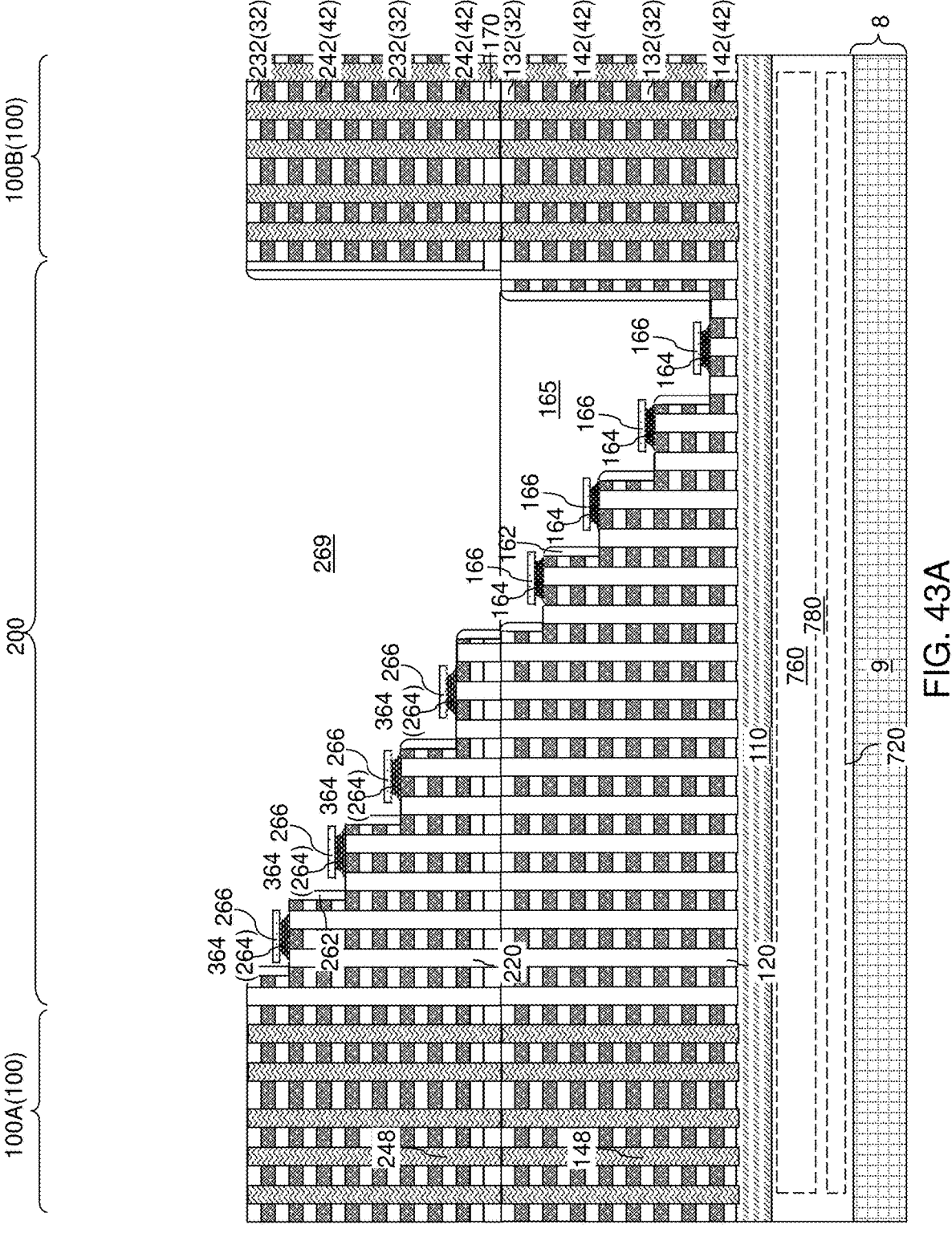
FIGS. 43A-43F are various views of the second exemplary structure after formation of second insulating material strips and second electrically conductive strips according to an embodiment of the present disclosure.
Figure 43B:
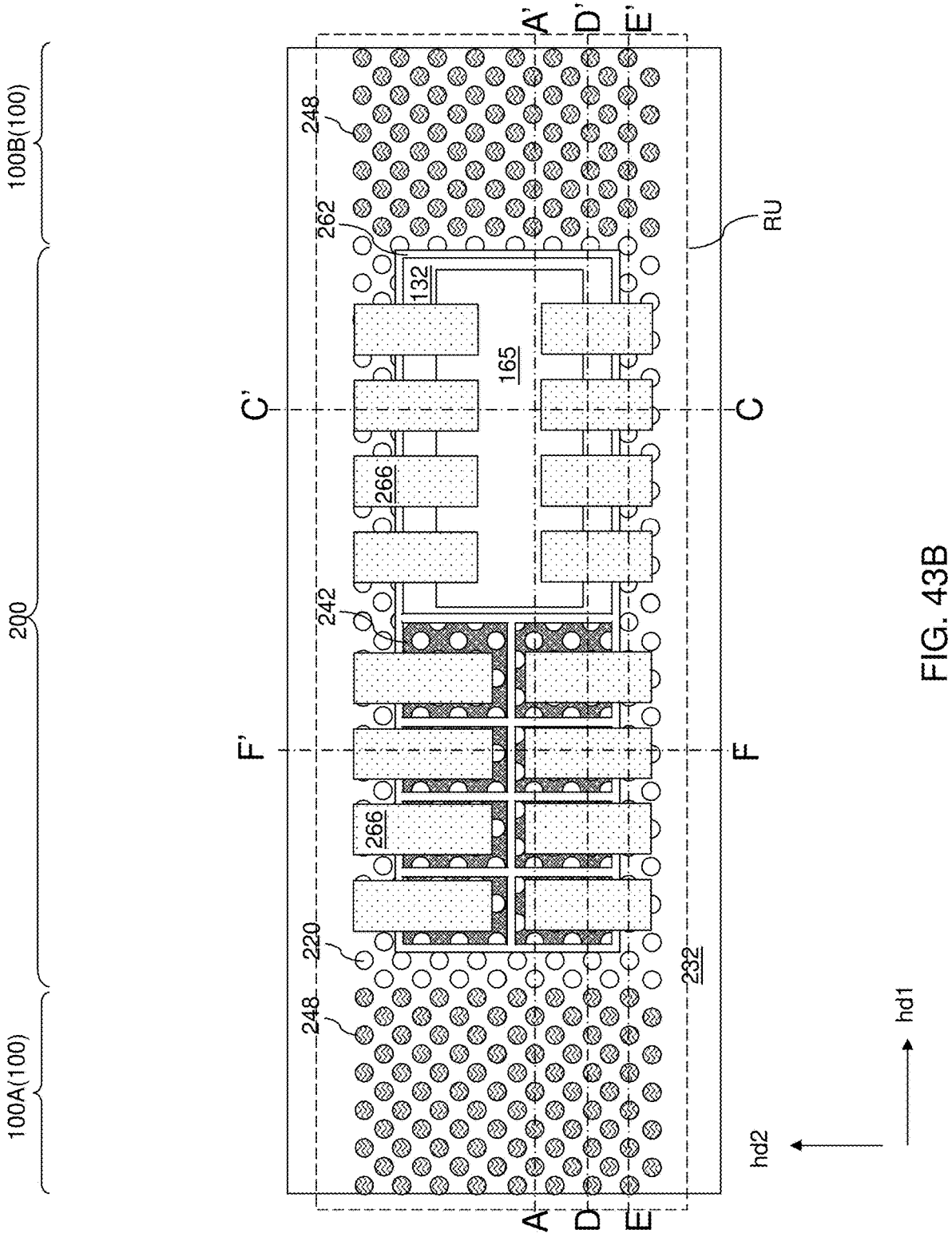
Figure 43C:
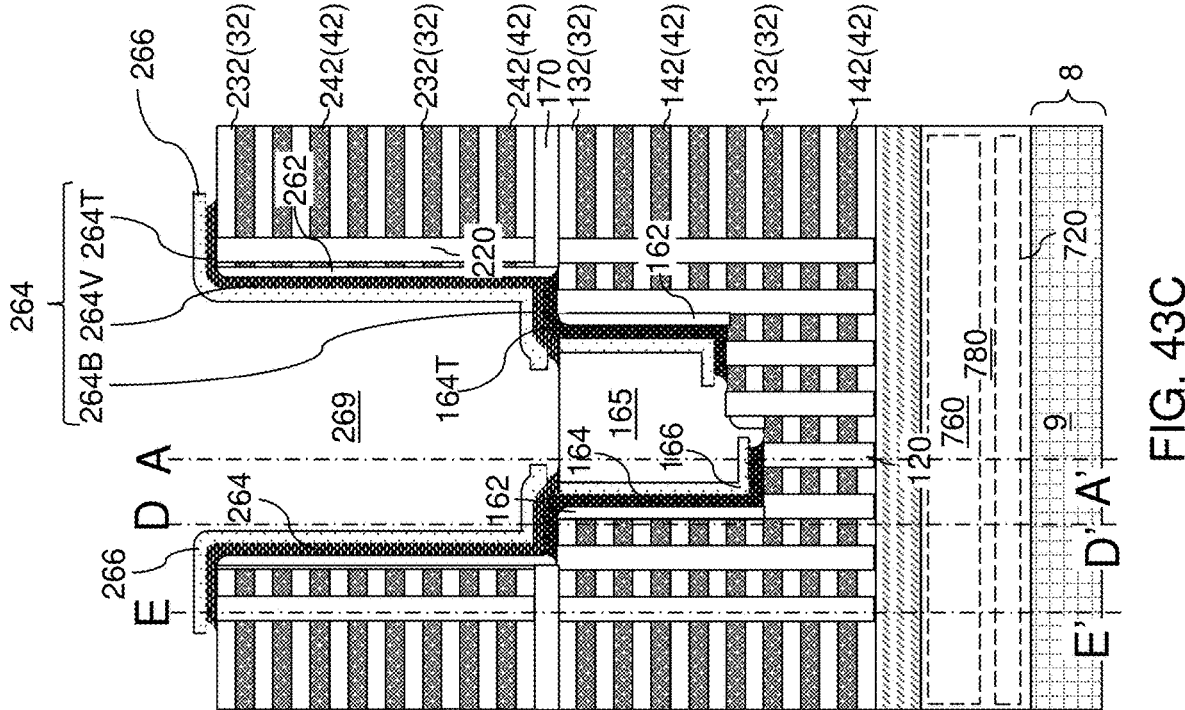
Figure 43D:
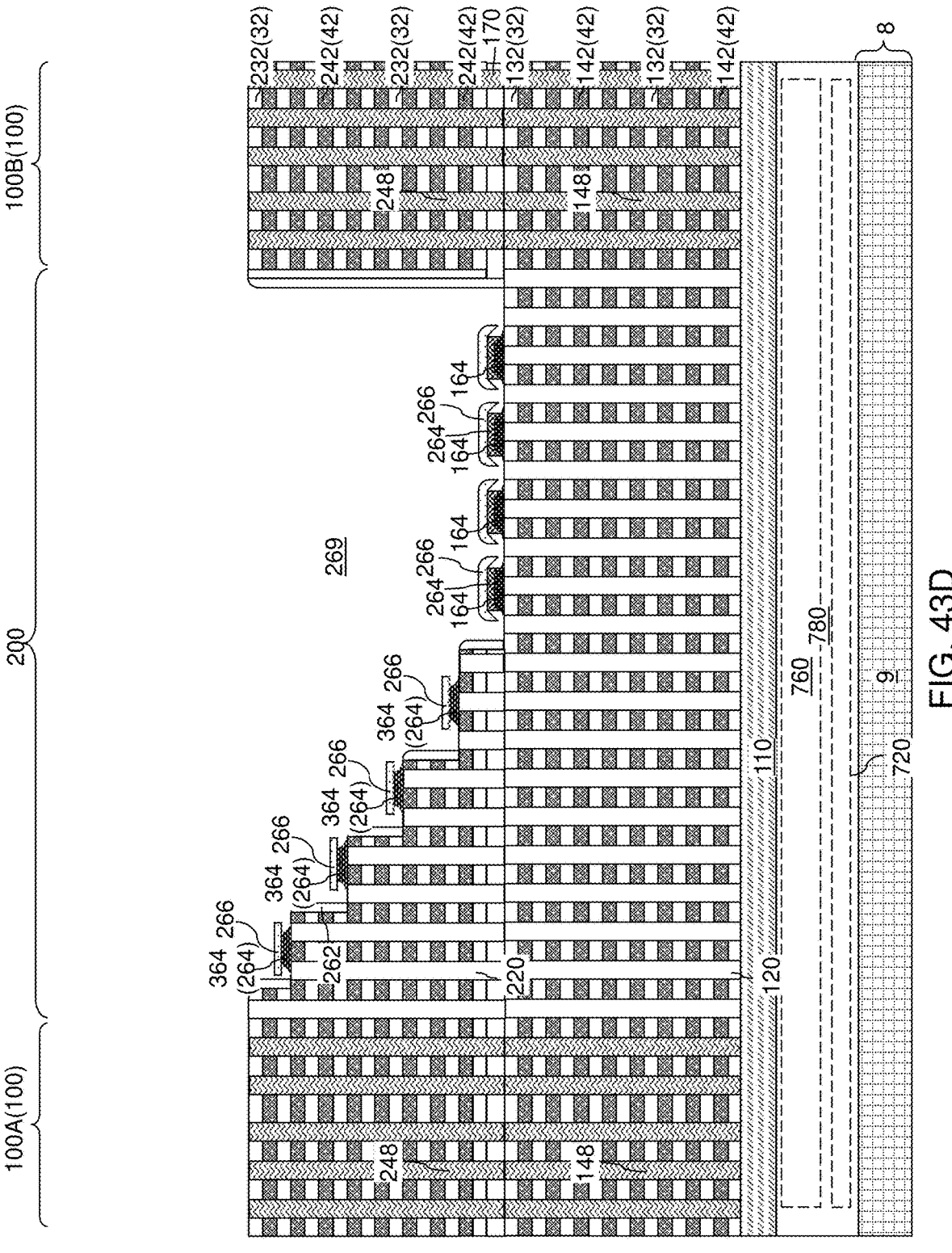
Figure 43E:
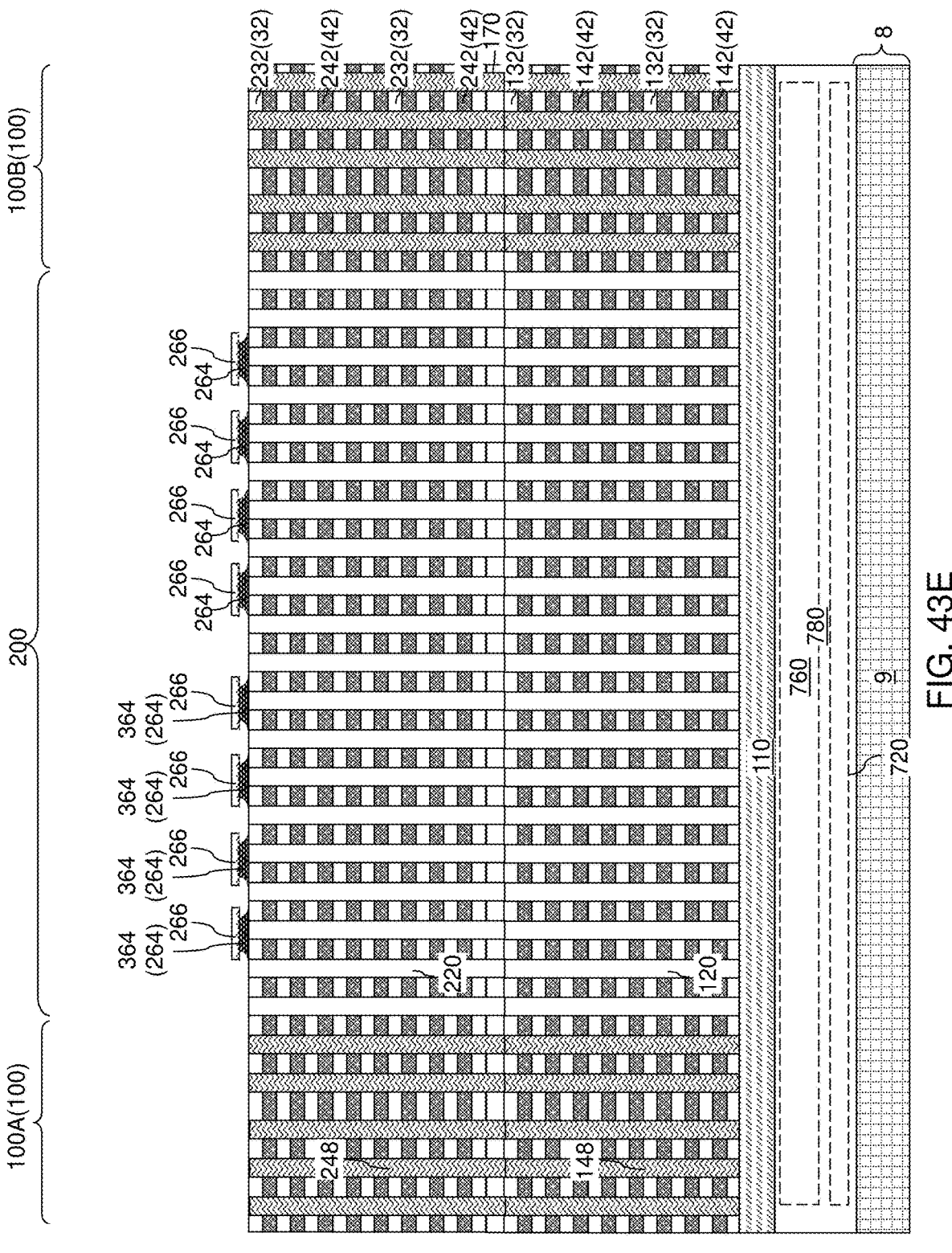

As shown in FIG. 43C, each second electrically conductive strip 264 within the first subset of the second electrically conductive strips 264 comprises a second horizontally-extending bottom strip segment 264B contacting a top surface of the first horizontally-extending top strip segment 164T of a first electrically conductive strip 164, a second horizontally-extending top strip segment 264T that overlies a topmost layer within the second alternating stack (232, 242), and a second vertically-extending strip segment 264V connecting the second horizontally-extending bottom strip segment 264B and the second horizontally-extending top strip segment 264T.

In one embodiment shown in FIG. 43C, the horizontally-extending bottom strip segment 264B of each second electrically conductive strip 264 within the first subset of the second electrically conductive strips 264 may comprise: a planar horizontal bottom surface contacting the top surface of the first horizontally-extending top strip segment 164T of a first electrically conductive strip 164; a planar horizontal top surface that is parallel to the planar top surface; and a pair of horizontally-extending sidewalls that are parallel to the second horizontal direction hd2.

In one embodiment, the second vertically-extending strip segment 264V of each second electrically conductive strip 264 within the first subset of the second electrically conductive strips 264 may comprise: a first planar surface contacting an inner sidewall of the second insulating spacer 262; a second planar surface that is parallel to the first planar surface segment and has a lesser width than the first planar surface; and a pair of vertically-extending tapered surfaces having a respective concave horizontal cross-sectional profile. In other words, each second vertically-extending strip segment 264V of each second electrically conductive strip 264 within the first subset of the second electrically conductive strips 264 may have a horizontal cross-sectional shape of a modified trapezoid in which a shape of a trapezoid is modified by replacing two slanted sides with a respective concave surface segment having a same radius of curvature, which equals the etch distance of the second selective isotropic etch process.

In one embodiment, each second horizontally-extending top strip segment 264T of each second electrically conductive strip 264 within the first subset of the second electrically conductive strips 264 may comprise: a planar horizontal bottom surface contacting a portion of a top surface of a topmost second insulating layer 232; a planar horizontal top surface having a lesser width than the planar horizontal bottom surface; and a pair of horizontally-extending tapered surfaces having a respective concave vertical cross-sectional profile. In other words, each second horizontally-extending top strip segment of each second electrically conductive strip 264 within the first subset of the second electrically conductive strips 264 may have a vertical cross-sectional shape of a modified trapezoid in which a shape of a trapezoid is modified by replacing two slanted sides with a respective concave surface segment having a same radius of curvature, which equals the etch distance of the second selective isotropic etch process.

Figure 43F:
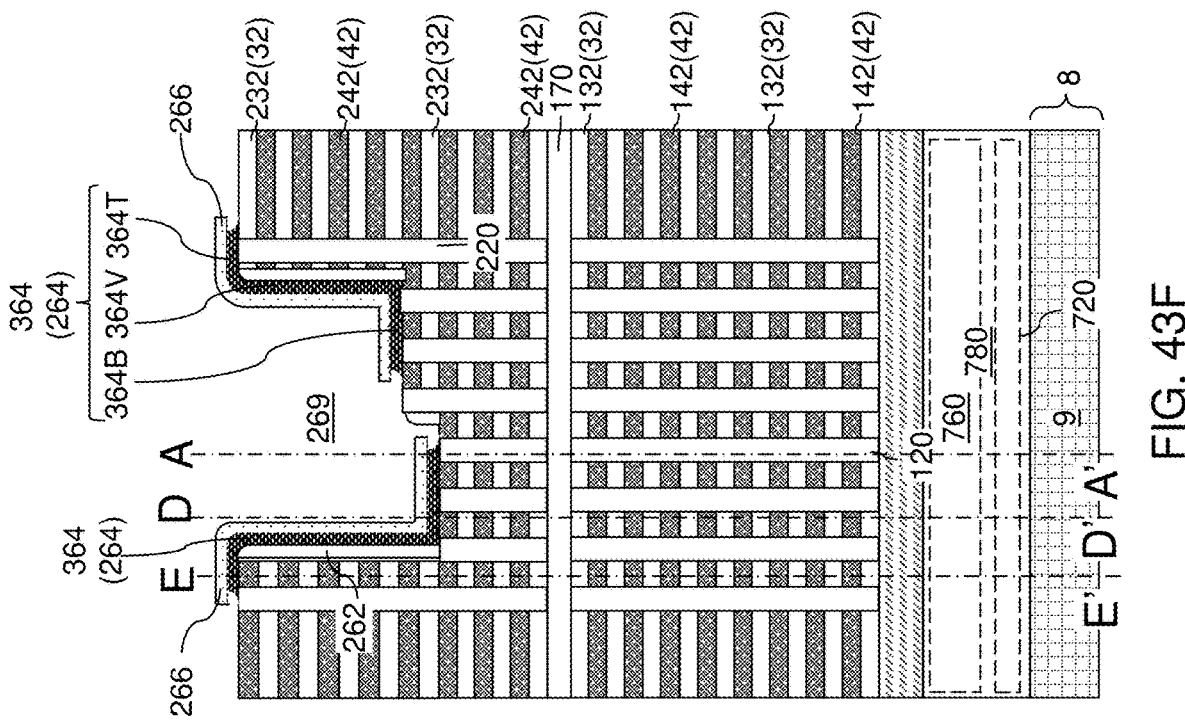
Figure 44A:
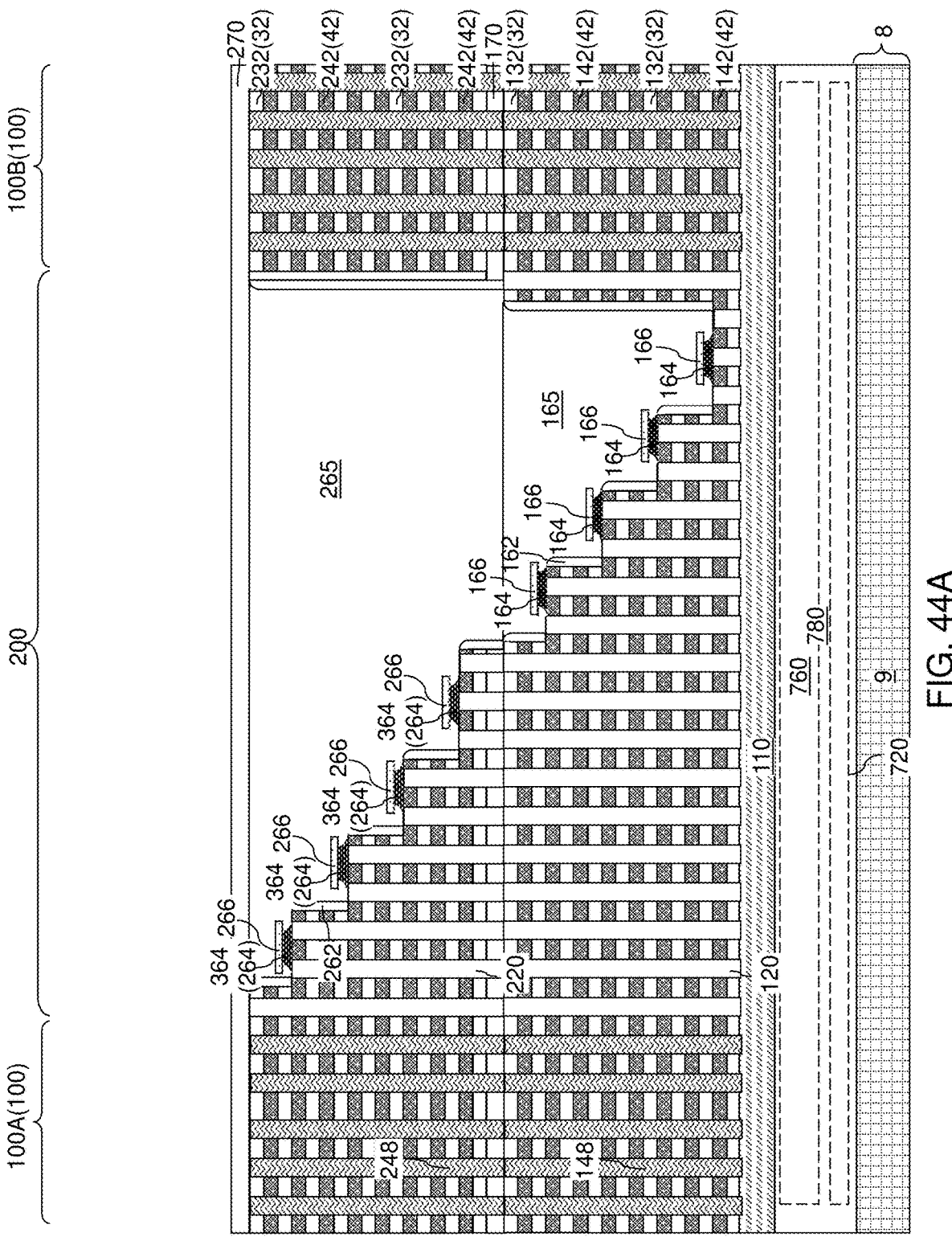
FIGS. 44A-44F are various views of the second exemplary structure after formation of a second retro-stepped dielectric material portion and a second insulating cap layer according to an embodiment of the present disclosure.
Figure 44B:
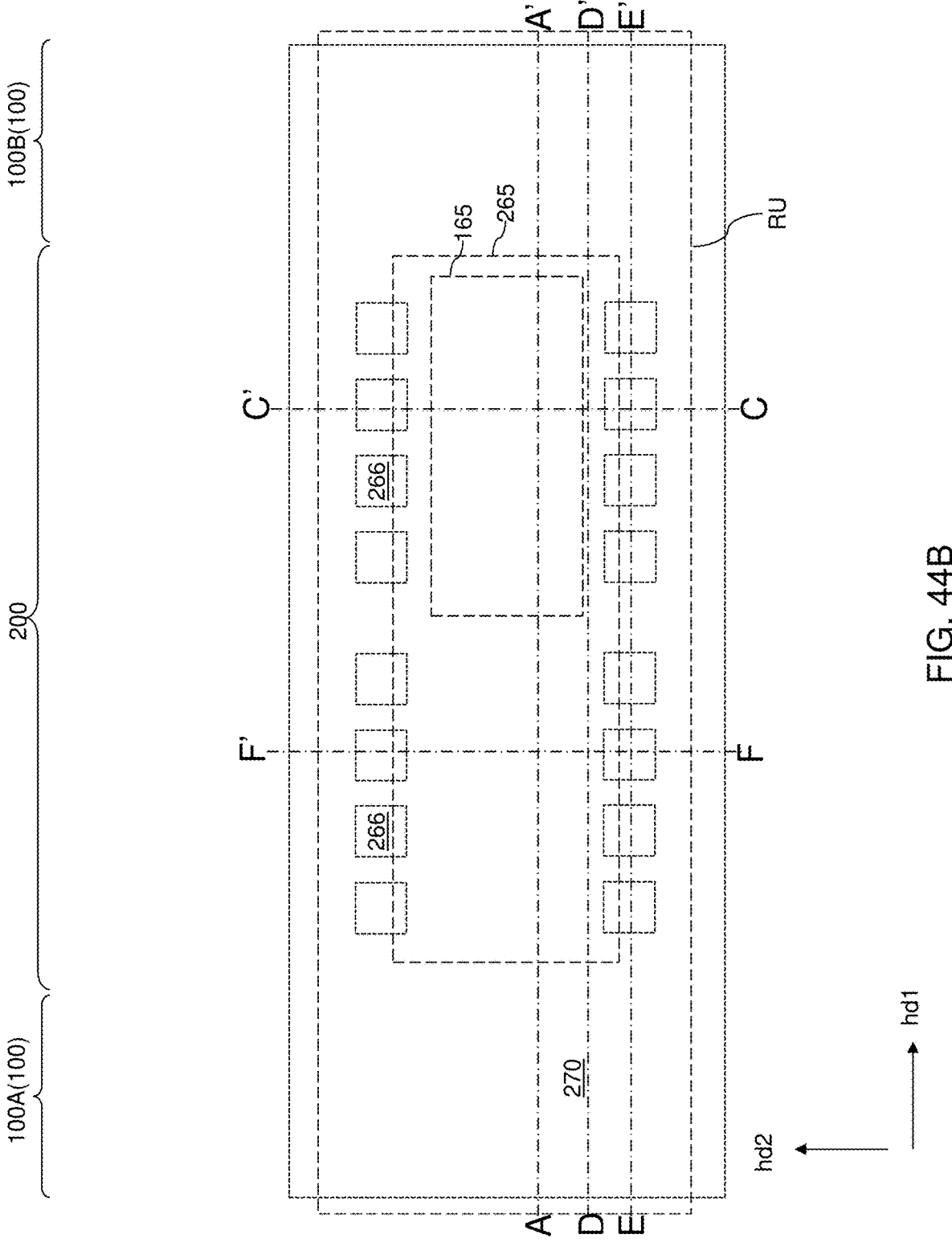
Figure 44C:
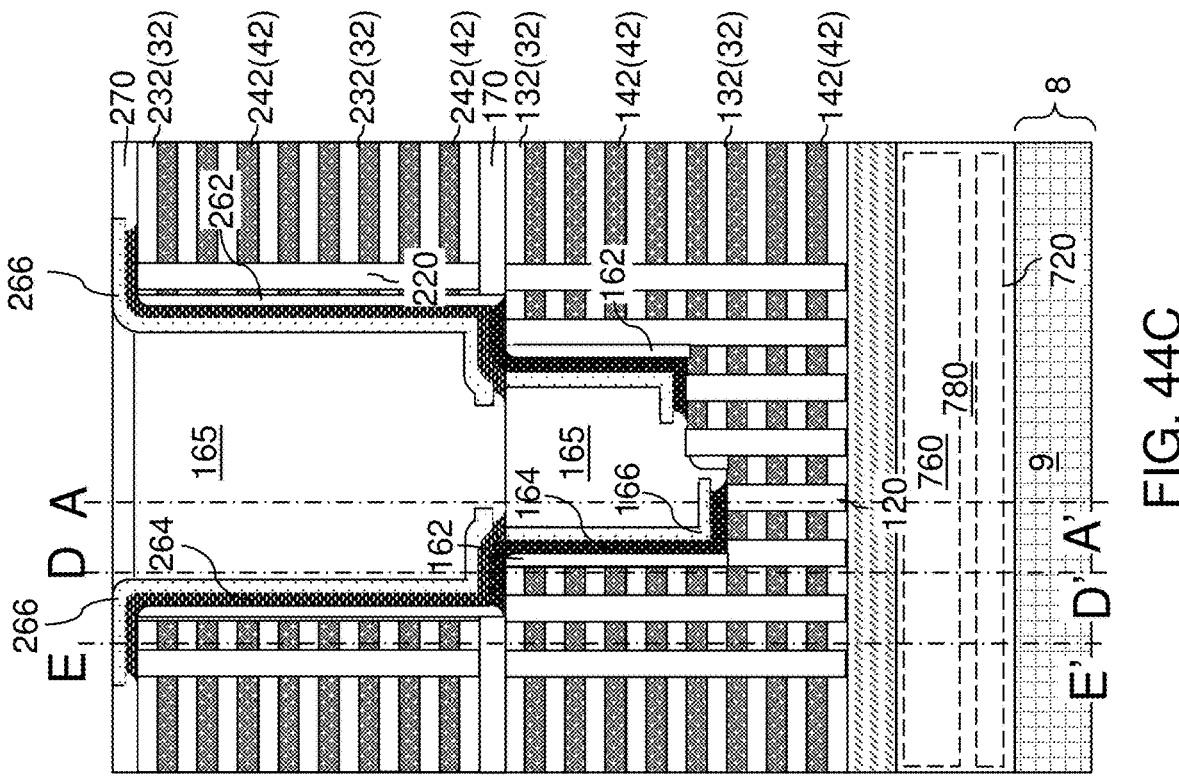
Figure 44D:
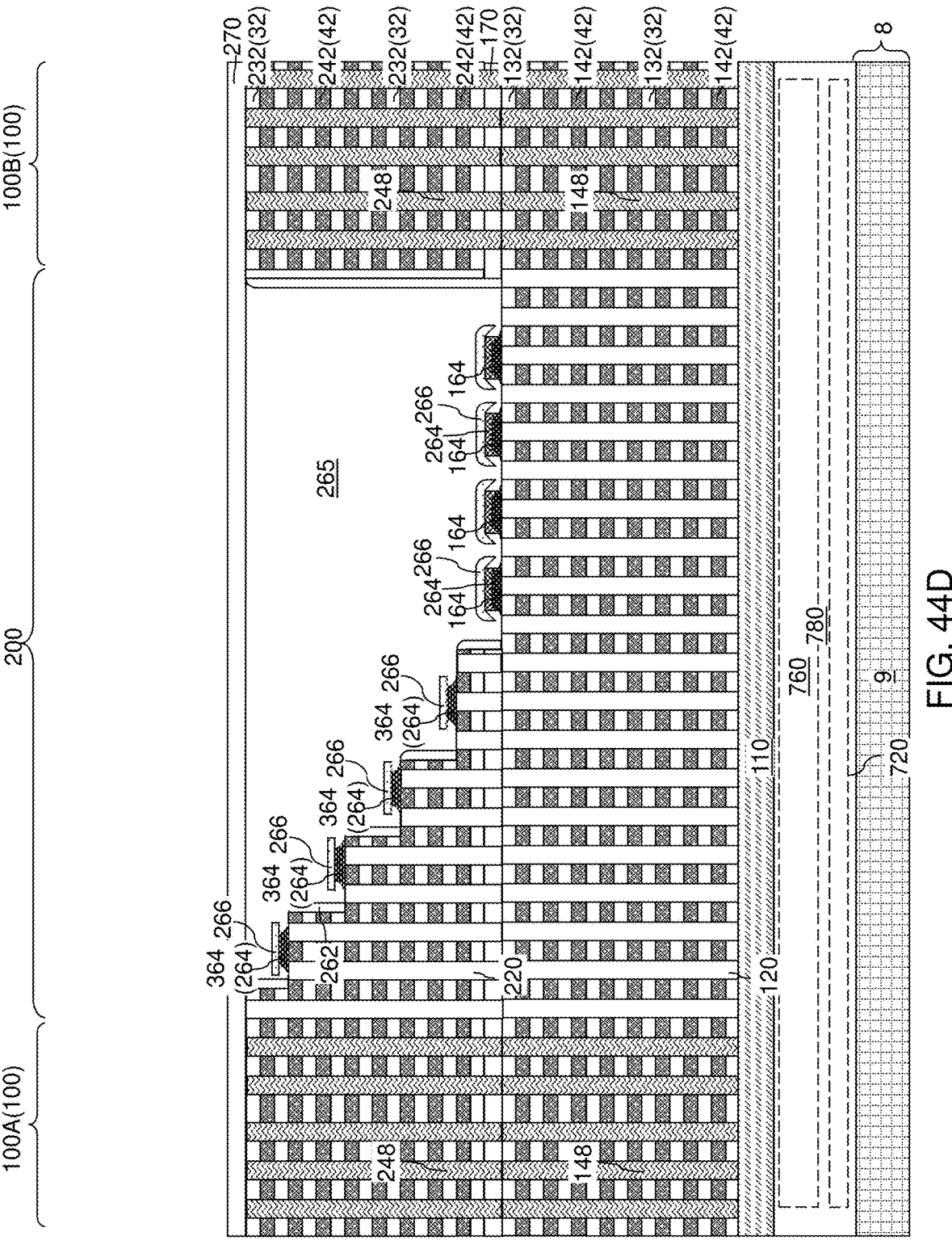
Figure 44E:
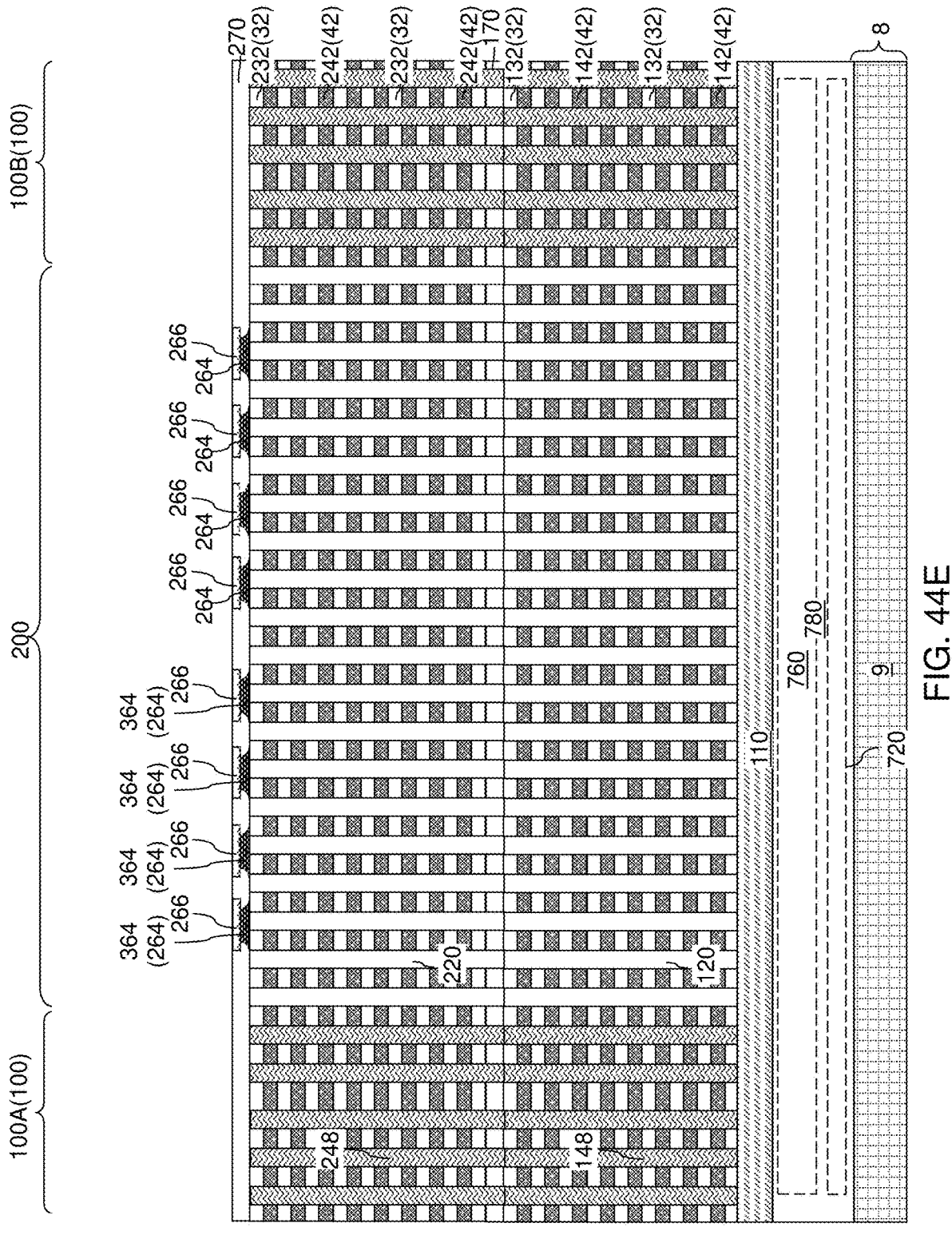
Figure 44F:
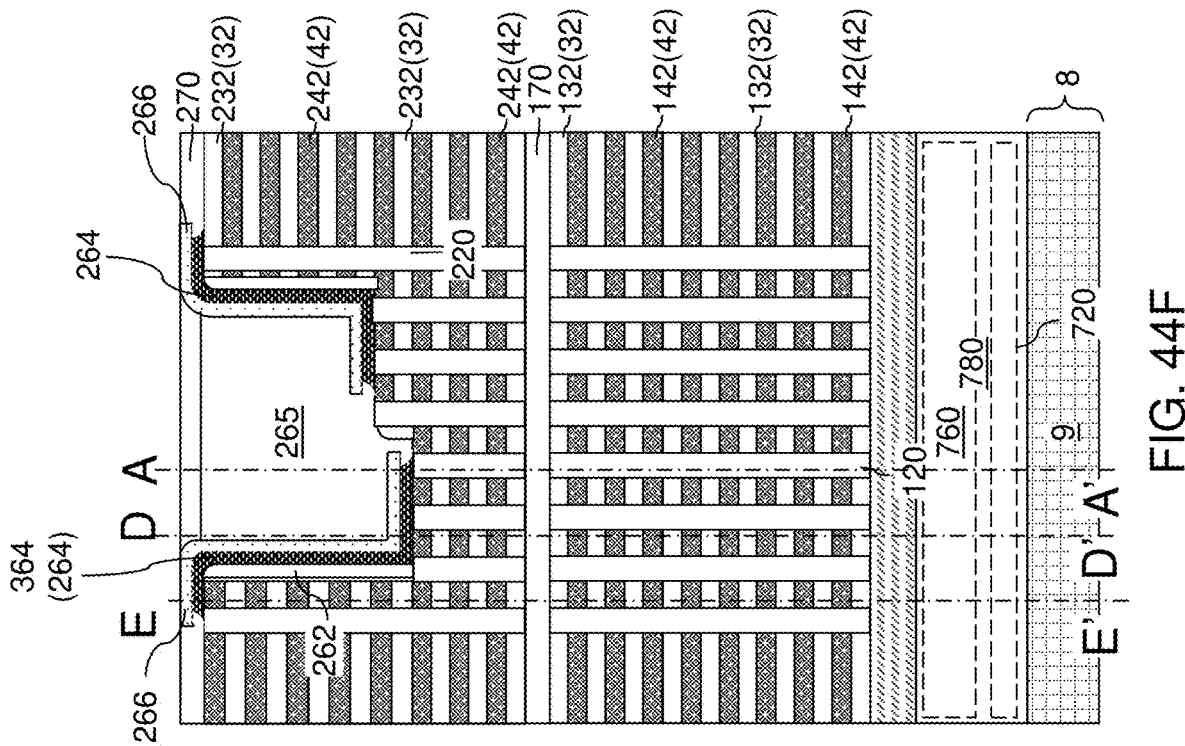

As shown in FIG. 43F, each third electrically conductive strip 364 comprises a third horizontally-extending bottom strip segment 364B contacting a top surface of one of the second electrically conductive layers 242, a third horizontally-extending top strip segment 364T that overlies the topmost layer within the second alternating stack (232, 242), and a third vertically-extending strip segment 364V connecting the third horizontally-extending bottom strip segment 364B and the third horizontally-extending top strip segment 364T.

In this case, each third horizontally-extending bottom strip segment 364B of a third electrically conductive strip 364 may comprise: a planar horizontal bottom surface contacting a portion of a top surface of a respective one of the second sacrificial material layers 242; a planar horizontal top surface that is parallel to the planar top surface and has a lesser width than the planar horizontal bottom surface; and a pair of horizontally-extending tapered surfaces having a respective concave vertical cross-sectional profile. In other words, each third horizontally-extending bottom strip segment 364B of a third electrically conductive strip 364 may have a vertical cross-sectional shape of a modified trapezoid in which a shape of a trapezoid is modified by replacing two slanted sides with a respective concave surface segment having a same radius of curvature, which equals the etch distance of the second selective isotropic etch process.

In one embodiment, each third vertically-extending strip segment 364V of a third electrically conductive strip 364 may comprise: a third planar surface contacting an inner sidewall of the second insulating spacer 262; a second planar surface that is parallel to the third planar surface segment and has a lesser width than the third planar surface; and a pair of vertically-extending tapered surfaces having a respective concave horizontal cross-sectional profile. In other words, each third vertically-extending strip segment of a third electrically conductive strip 364 may have a horizontal cross-sectional shape of a modified trapezoid in which a shape of a trapezoid is modified by replacing two slanted sides with a respective concave surface segment having a same radius of curvature, which equals the etch distance of the second selective isotropic etch process.

In one embodiment, each third horizontally-extending top strip segment 364T of a third electrically conductive strip 364 may comprise: a planar horizontal bottom surface contacting a portion of a top surface of a topmost second insulating layer 232; a planar horizontal top surface having a lesser width than the planar horizontal bottom surface; and a pair of horizontally-extending tapered surfaces having a respective concave vertical cross-sectional profile. In other words, each third horizontally-extending top strip segment 364T of a third electrically conductive strip 364 may have a vertical cross-sectional shape of a modified trapezoid in which a shape of a trapezoid is modified by replacing two slanted sides with a respective concave surface segment having a same radius of curvature, which equals the etch distance of the second selective isotropic etch process.

Referring to FIGS. 44A-44F, a second dielectric fill material such as undoped silicate glass or a doped silicate glass can be deposited in remaining unfilled volumes of the second stepped cavities 269 by a conformal deposition process. The second dielectric fill material can be deposited over the second insulating material strips 266 after formation of the second electrically conductive strips 264. Excess portions of the second dielectric fill material may be removed from above a horizontal plane located at, or overlying, topmost surfaces of the second electrically conductive strips 264 by performing a planarization process. The planarization process may comprise a chemical mechanical polishing process and/or a recess etch process. In an illustrative example, excess portions of the second dielectric fill material may be removed from above a horizontal plane including the topmost surfaces of the second insulating material strips 266.

Each portion of the second dielectric fill material that fills a respective second stepped cavity 269 constitutes a second retro-stepped dielectric material portion 265, which is a dielectric material portion having a stepped bottom surface. Generally, portions of the second dielectric fill material can be removed from outside the volumes of the second stepped cavities 269, and remaining portions of the second dielectric fill material in the volumes of the second stepped cavities 269 comprise the second retro-stepped dielectric material portions 265. The horizontally-extending portion of the second dielectric fill material that overlies the horizontal plane including the topmost surface of the second alternating stack (132, 242) constitutes a second insulating cap layer 270. Each second retro-stepped dielectric material portion 265 can be located within a respective second stepped cavity 269, and can contact concave surface segments of a respective subset of the second electrically conductive strips 264. A second-tier structure can be formed over the first-tier structure.

Figure 45:
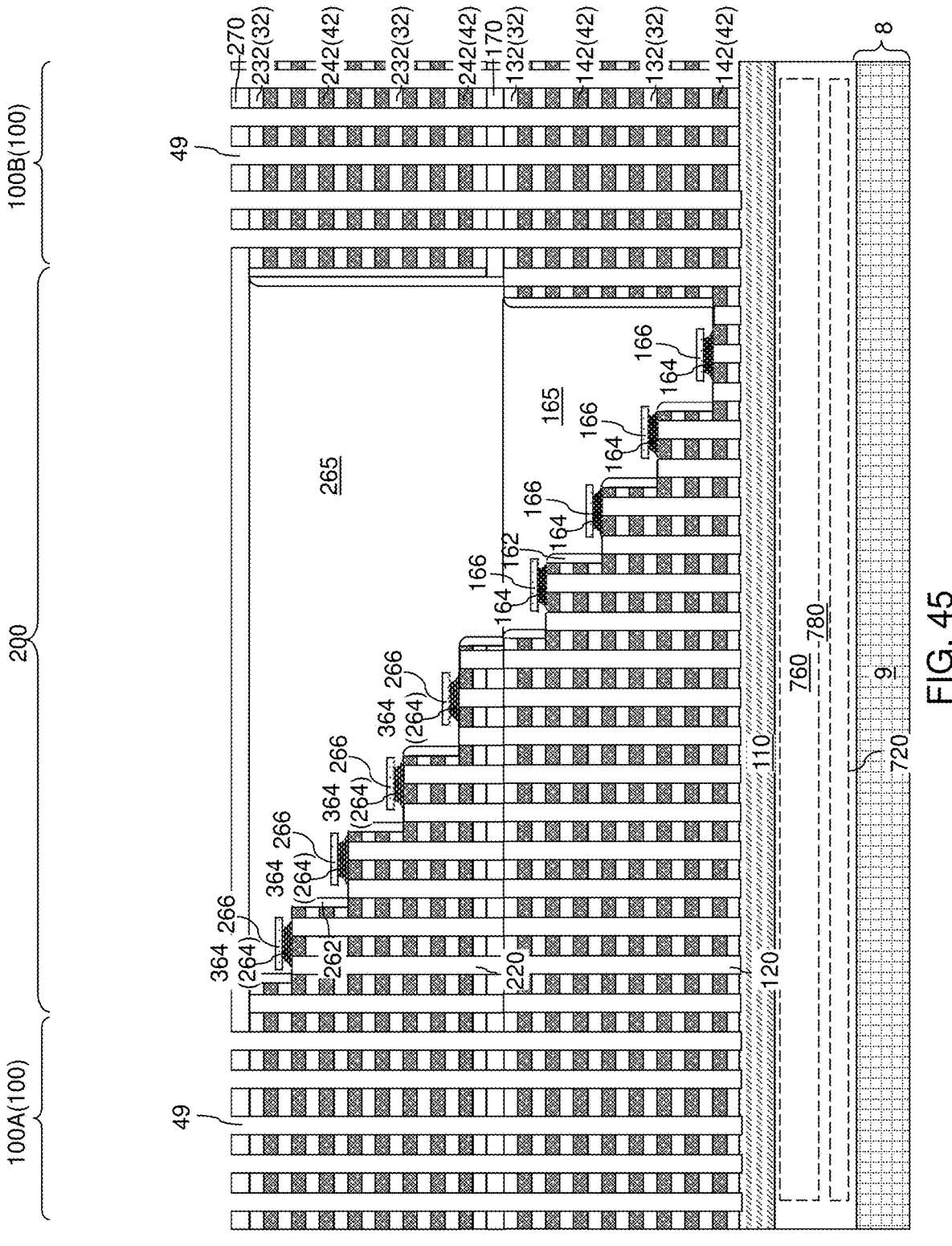
FIG. 45 is a vertical cross-sectional view of the second exemplary structure after formation of multi-tier memory openings according to an embodiment of the present disclosure.

Referring to FIG. 45, the second-tier sacrificial memory opening fill structures 248 and the first-tier sacrificial memory opening fill structures 148 can be removed from inside the second-tier memory openings 249 and the first-tier memory openings 149, for example, by performing an ashing process or a selective etching process. Cavities that are formed in each contiguous combination of a first-tier memory opening 149 and a second-tier memory opening 240 constitute memory openings 49.

Figure 46A:
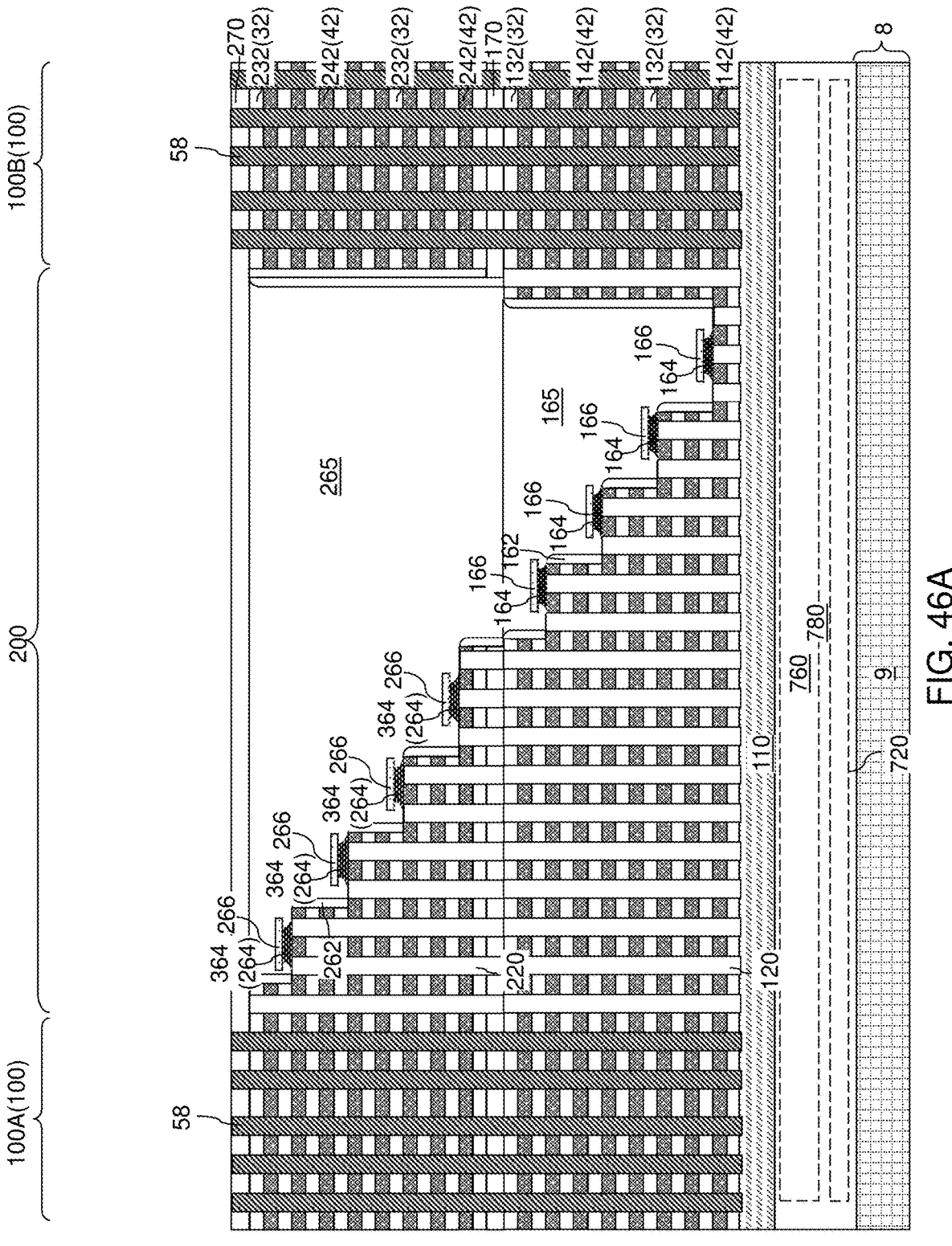
FIGS. 46A-46C are various views of the second exemplary structure after formation of memory opening fill structures according to an embodiment of the present disclosure.
Figure 46B:
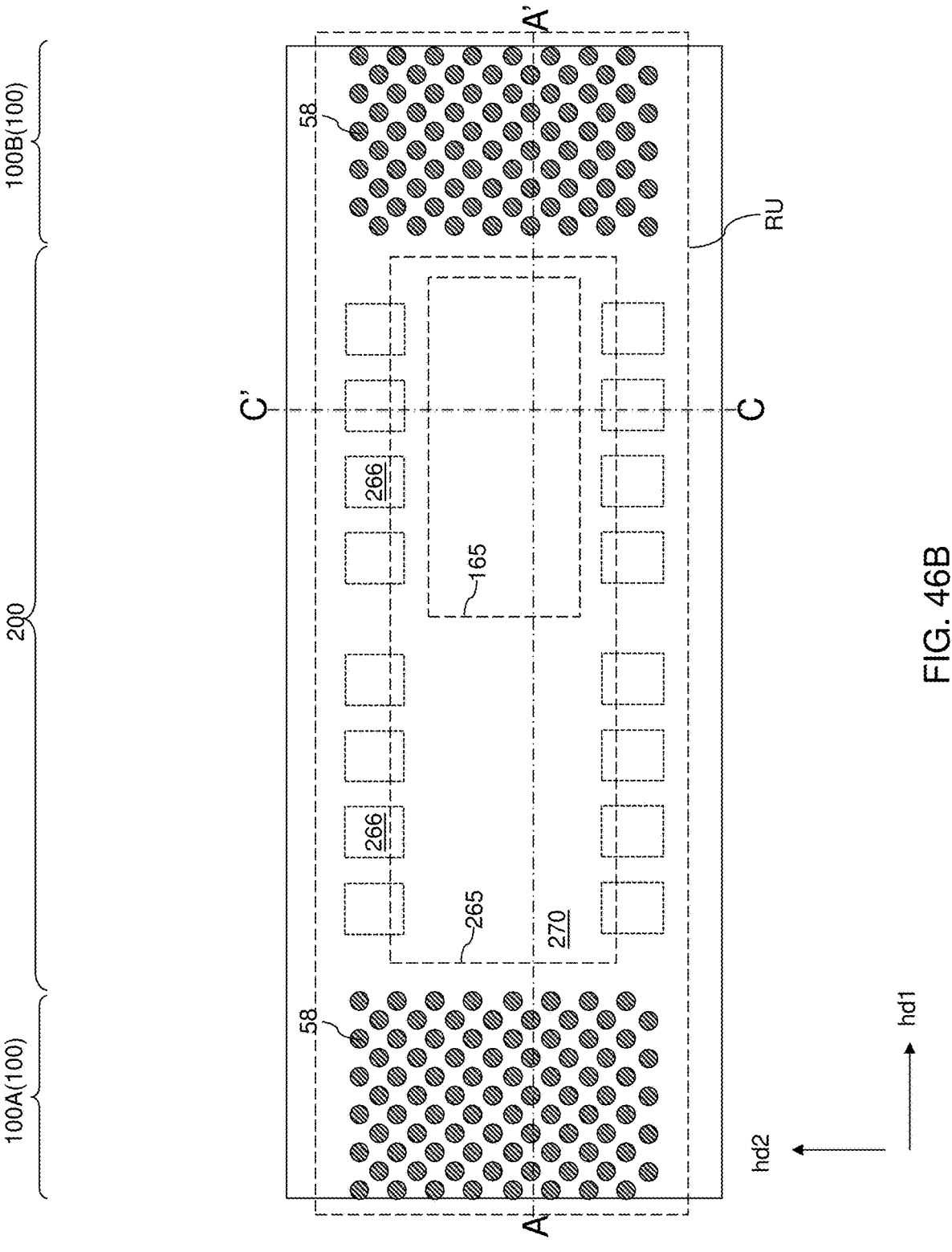
Figure 46C:
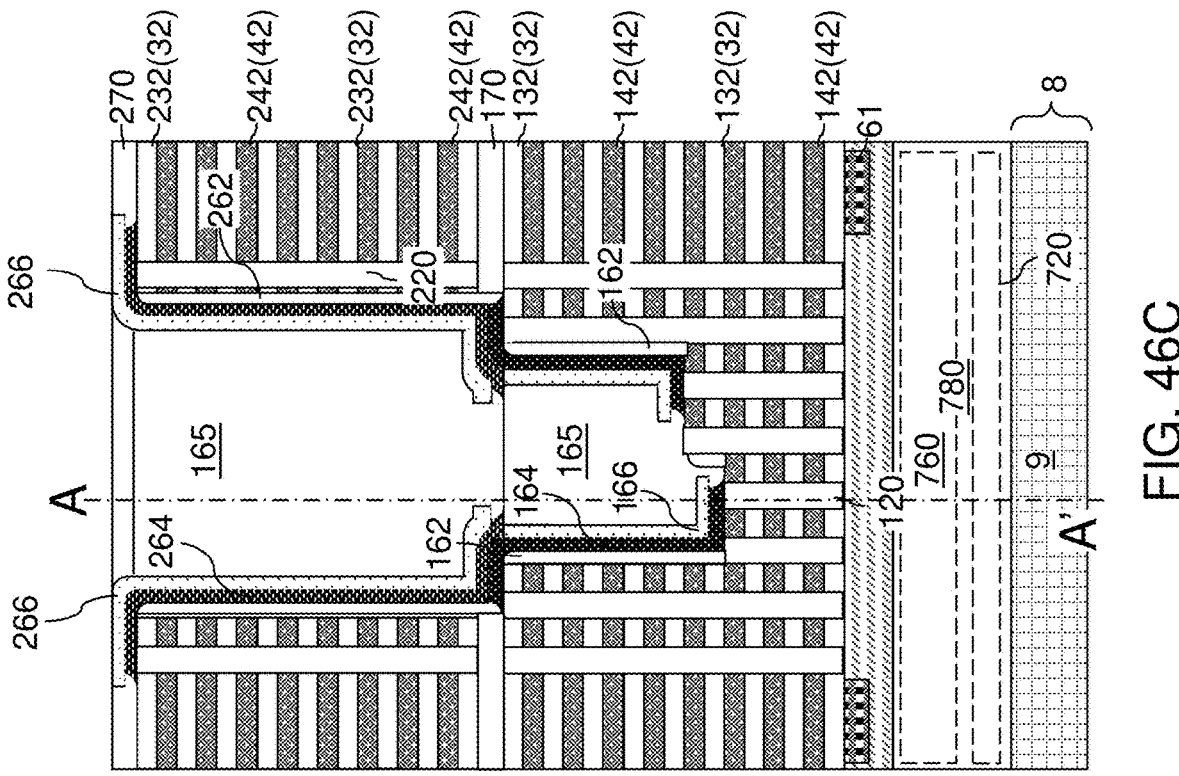

Referring to FIGS. 46A-46C, the processing steps described with reference to FIGS. 16A-16F can be performed to form a memory opening fill structure 58 in each memory opening 49. Each memory opening fill structure 58 in the second exemplary structure may have the same structure as a memory opening fill structure 58 in the first exemplary structure.

In an alternative embodiment, the processing steps described with reference to FIGS. 45 and 46A-46C can be performed at an earlier stage in the process, such as prior the processing steps described with reference to FIGS. 42A-42F.

Figure 47A:
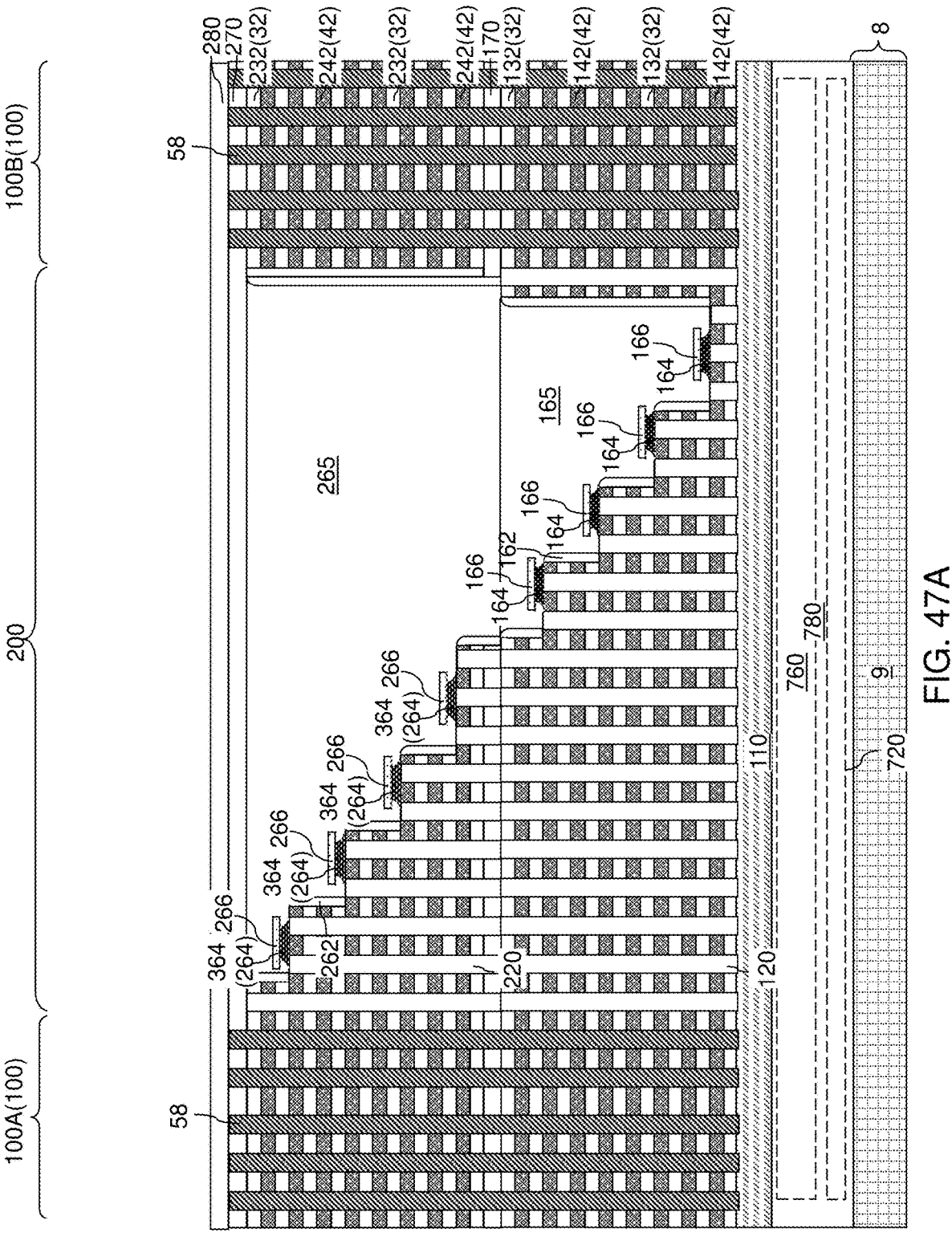
FIGS. 47A-47C are various views of the second exemplary structure after formation of lateral isolation trenches and source regions according to an embodiment of the present disclosure.
Figure 47B:
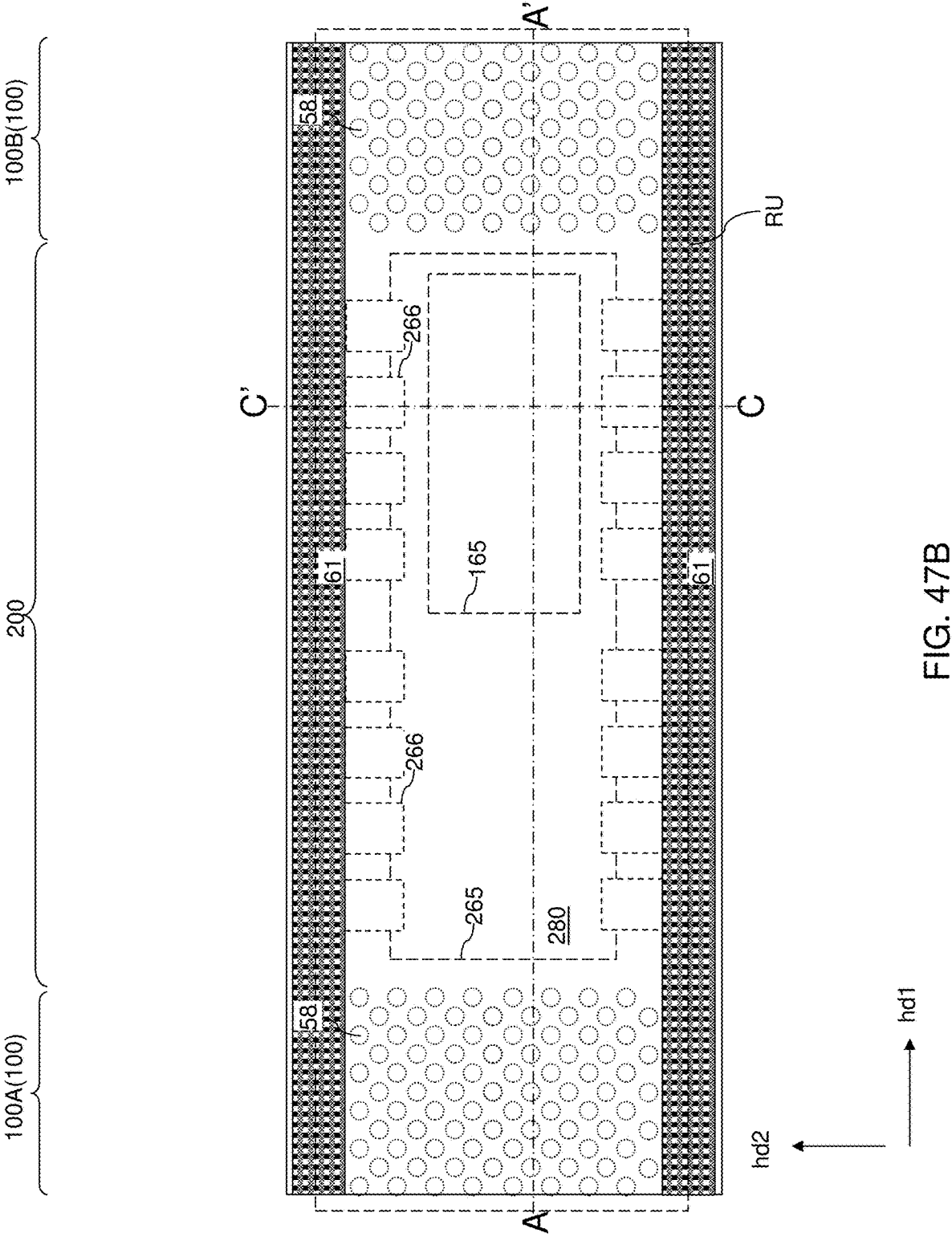
Figure 47C:
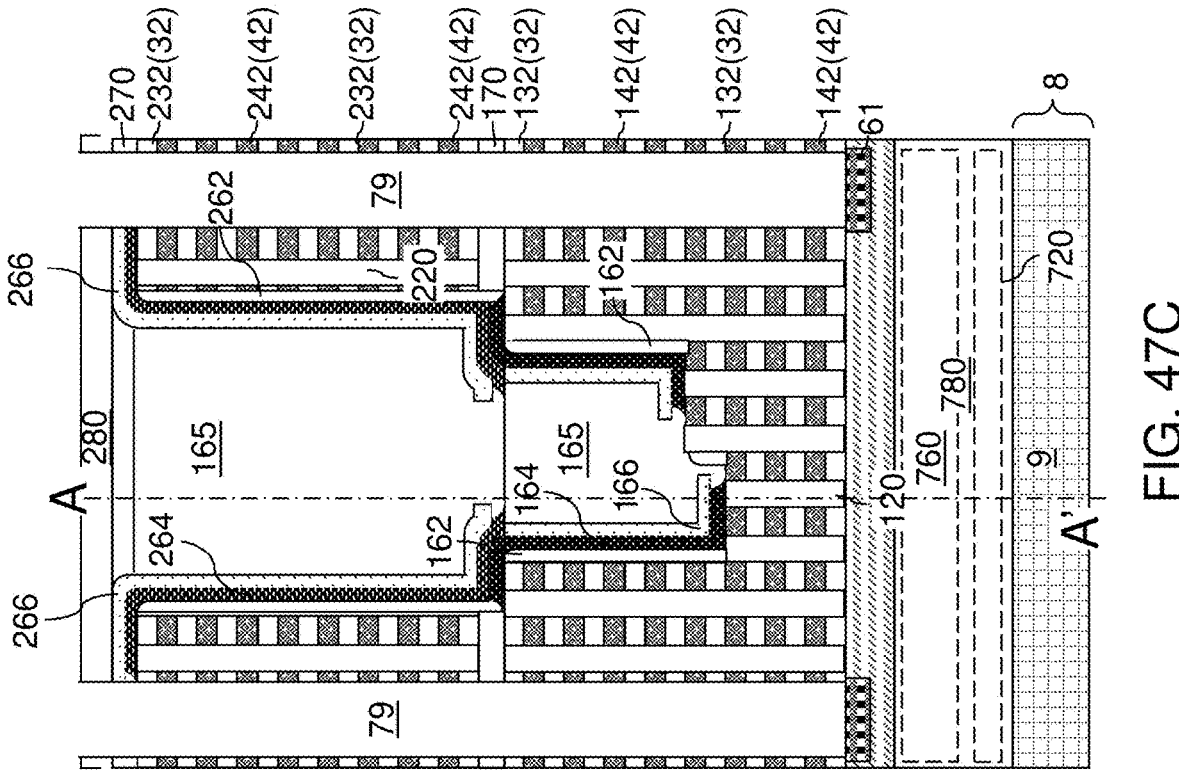

Referring to FIGS. 47A-47C, the processing steps described with reference to FIGS. 18A-18I can be performed with a modification of omission of the isolation cavities 77. Specifically, a capping dielectric layer 280 can be formed over the second insulating cap layer 270, the memory opening fill structures 58, and the support pillar structures (120, 220). The capping dielectric layer 280 comprises a dielectric material, such as undoped silicate glass or a doped silicate glass, and may have a thickness in a range from 30 nm to 300 nm, although lesser and greater thicknesses may also be employed. In one embodiment, top surfaces of the memory opening fill structures 58 are located within a horizontal plane that includes the bottom surface of the capping dielectric layer 280.

A photoresist layer (not shown) may be applied over the capping dielectric layer 280, and can be lithographically patterned to form elongated openings that laterally extend along the first horizontal direction hd1 through the memory array regions 100 and the contact region 200 between respective pairs of clusters of memory opening fill structures 58. An anisotropic etch process can be performed to transfer the pattern of the openings through the capping dielectric layer 280, the second-tier structure, and the first-tier structure, and down to at least a top surface of the semiconductor material layer 110. Lateral isolation trenches 79 can be formed underneath the elongated openings in the photoresist layer. The lateral isolation trenches 79 laterally extend along the first horizontal direction hd1, and may have a uniform width along the second horizontal direction hd2 that is greater than the maximum thickness of the sacrificial material layers 42. In one embodiment, the uniform width of the lateral isolation trenches 79 may be in a range from twice the average thickness of the sacrificial material layers 42 to ten times the average thickness of the sacrificial material layers 42. Each lateral isolation trench 79 may be laterally spaced from the retro-stepped dielectric material portions (165, 265).

Optionally, an ion implantation process may be performed to implant dopants of the second conductivity type into surface portions of the semiconductor material layer 110 that underlie the lateral isolation trenches 79. Source regions 61 having a doping of the first conductivity type may be formed in the implanted portions of the semiconductor material layer 110.

Figure 48A:
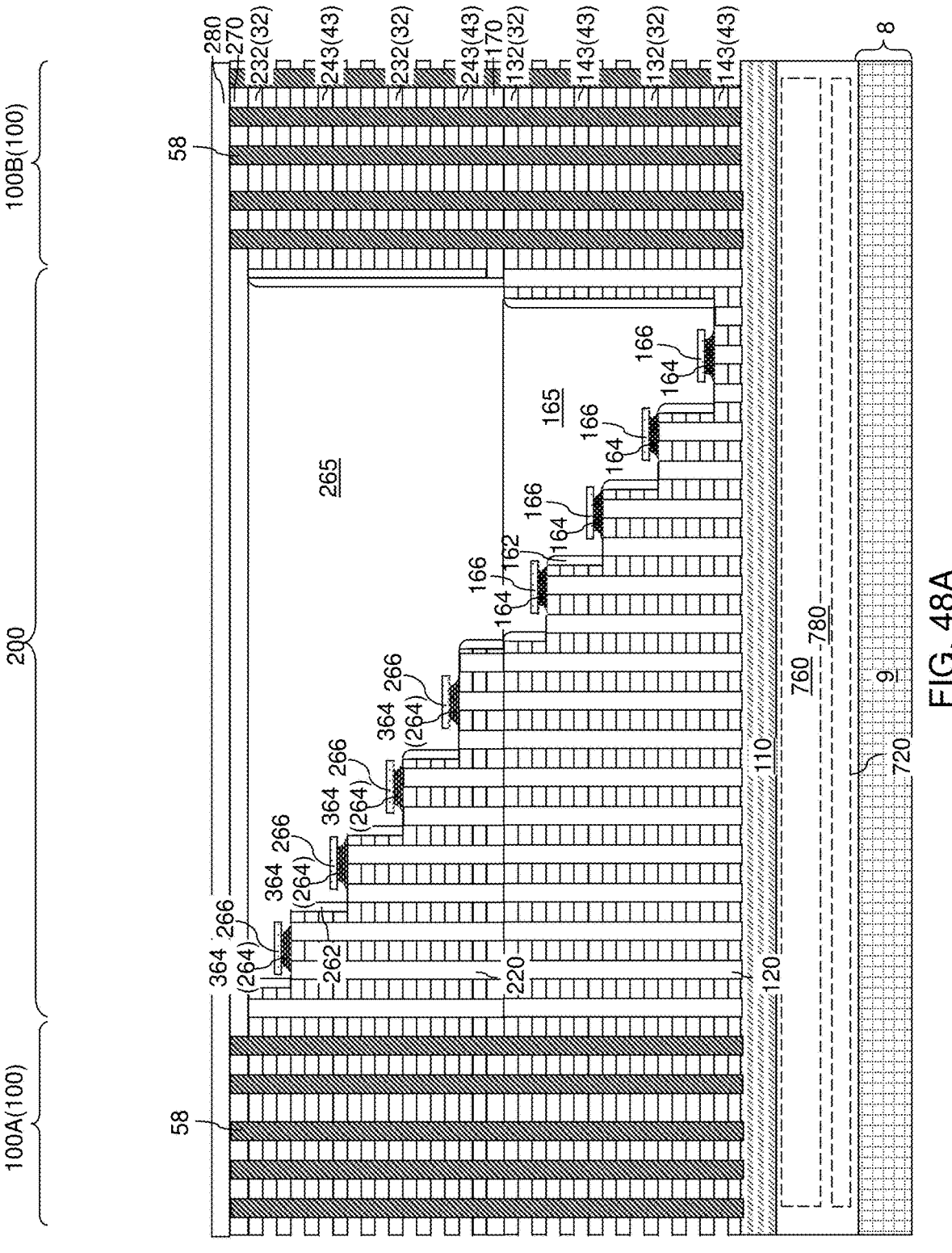
FIGS. 48A-48C are various views of the second exemplary structure after formation of lateral recesses according to an embodiment of the present disclosure.
Figure 48B:
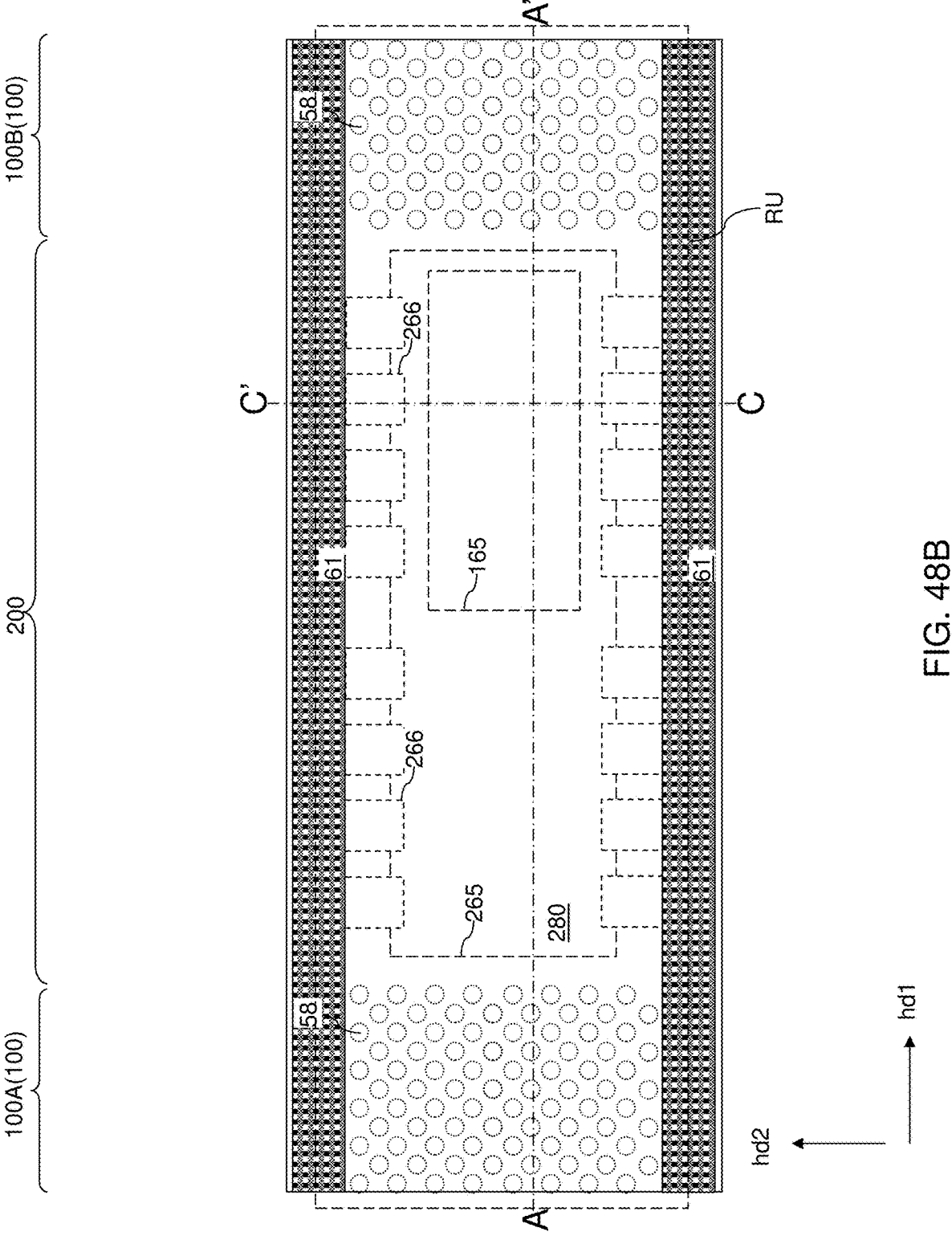
Figure 48C:
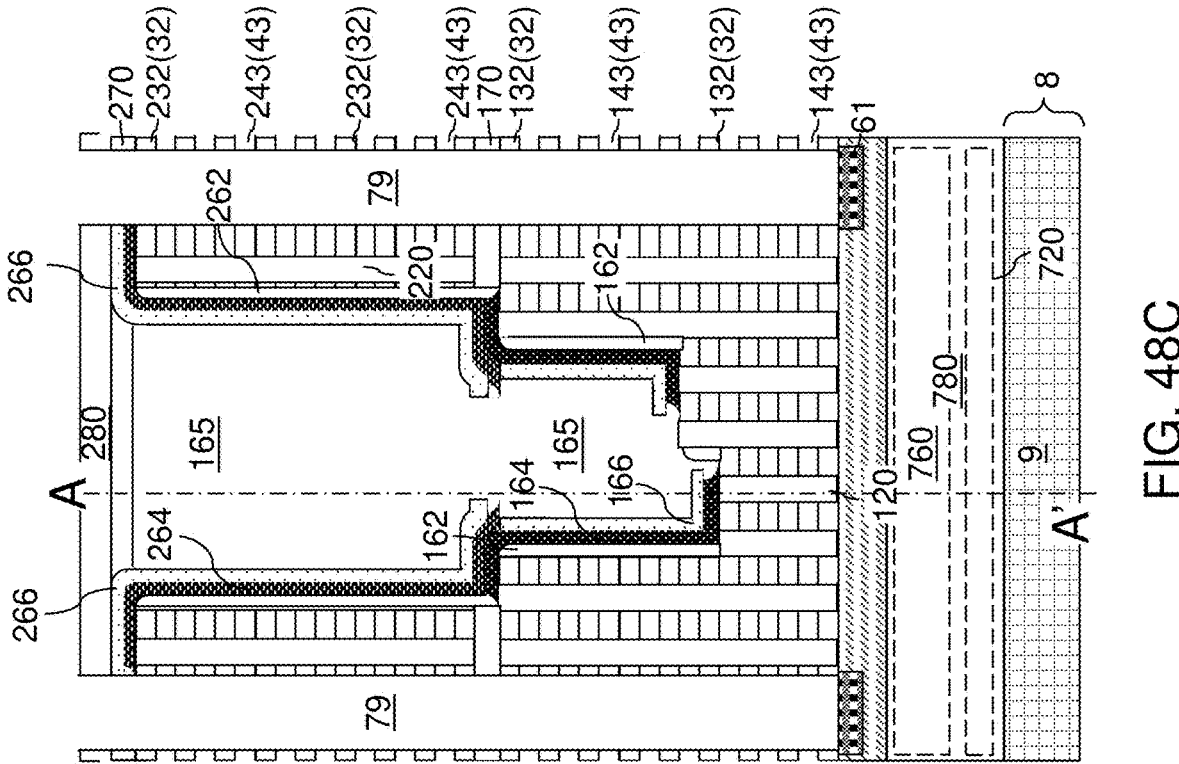

Referring to FIGS. 48A-48C, an isotropic etch process can be performed to isotropically etch the materials of the sacrificial material layers 42 selective to the materials of the insulating layers 32, the insulating cap layers (170, 270), the dielectric capping layer 280, the retro-stepped dielectric material portions (165, 265), and the semiconductor material layer 110. An isotropic etchant can be introduced into the lateral isolation trenches 79 during the isotropic etch process. For example, if the sacrificial material layers 42 comprise silicon nitride, the isotropic etch process may comprise a wet etch process employing hot phosphoric acid.

Laterally-extending cavities 43 are formed in volumes from which the sacrificial material layers 42 are removed by the isotropic etch process. The laterally-extending cavities 43 may comprise first laterally-extending cavities 143 that are formed in volumes from which first sacrificial material layers 142 are removed, and second laterally-extending cavities 243 that are formed in volumes from which the second sacrificial material layers 242 are removed. The insulating layers 32, the dielectric fill structures (165, 265), the insulating cap layers (170, 270), and the dielectric capping layer 280 can be structurally supported by the memory opening fill structures 58 and the support pillar structures 20 during and after formation of the laterally-extending cavities 43.

Figure 49A:
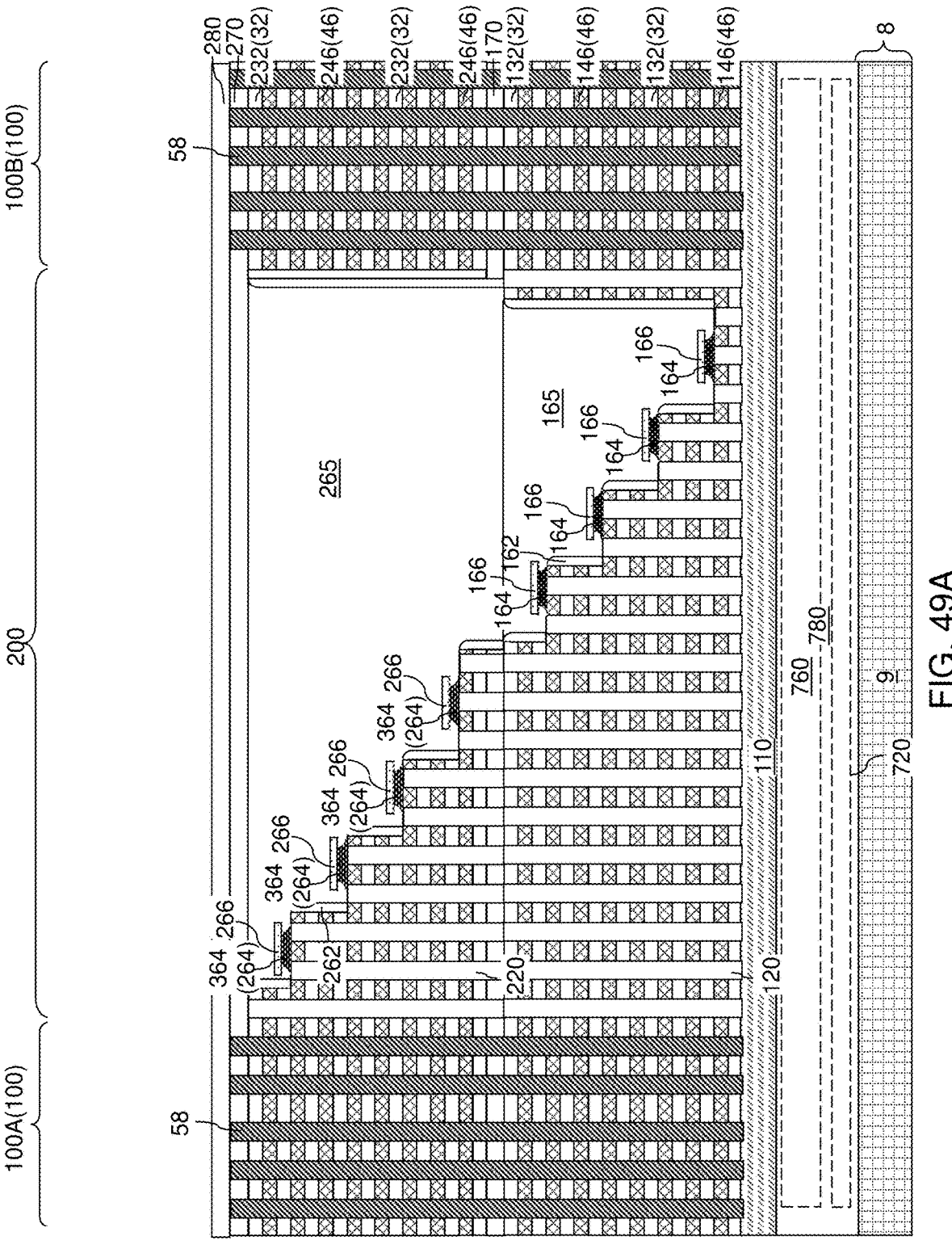
FIGS. 49A-49C are various views of the second exemplary structure after formation of electrically conductive layers according to an embodiment of the present disclosure.
Figure 49B:
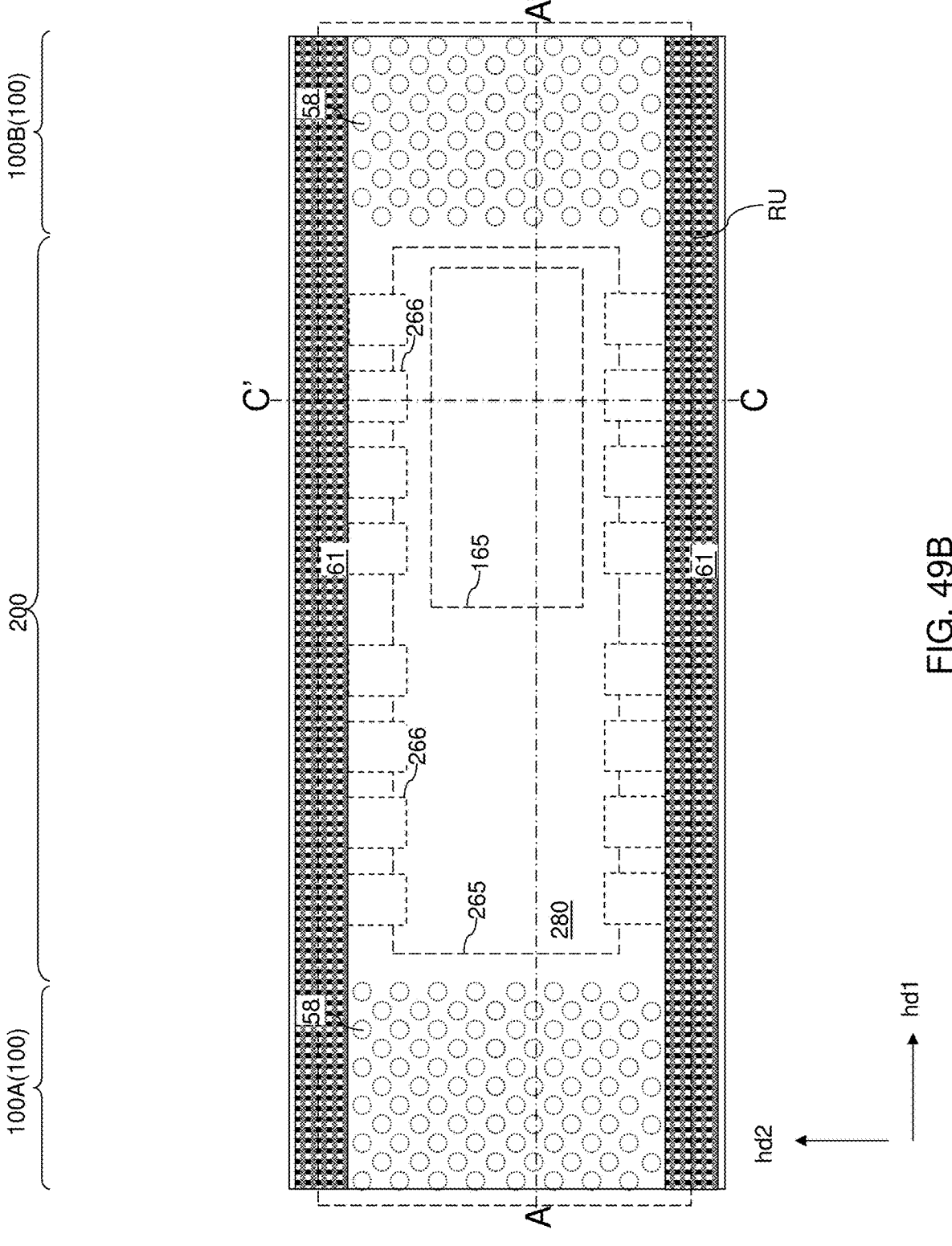
Figure 49C:
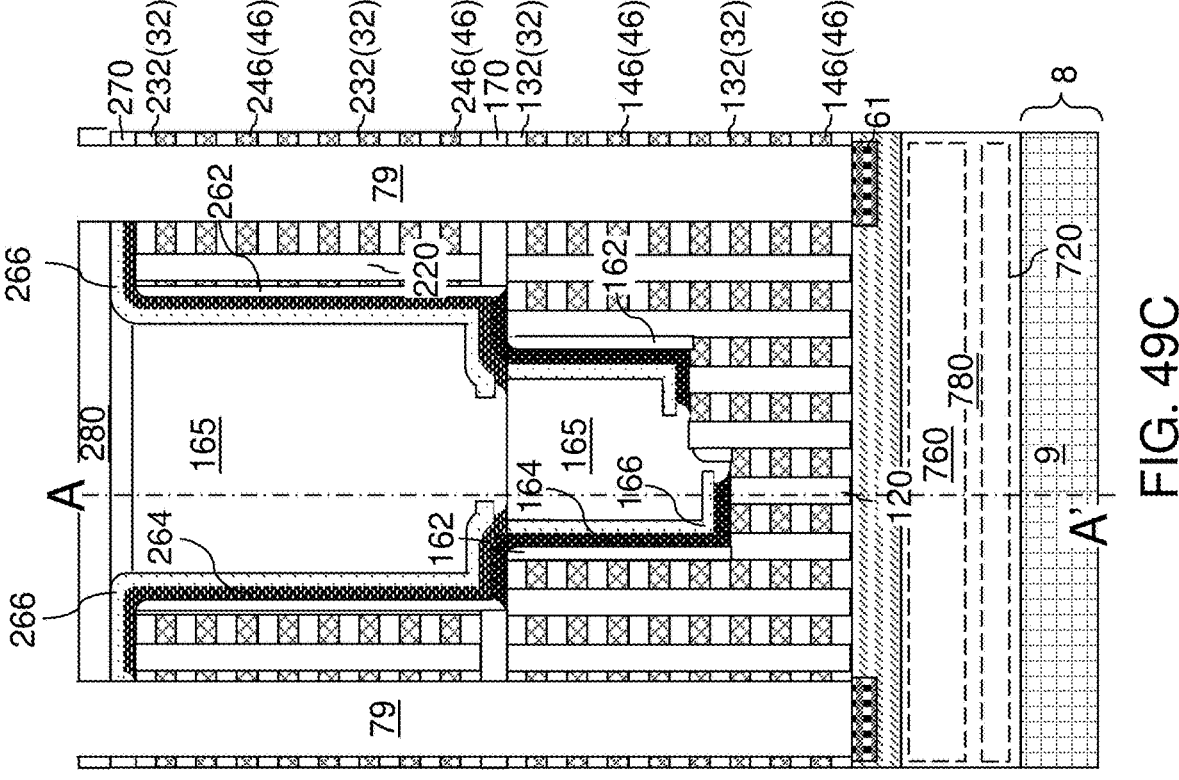

Referring to FIGS. 49A-49C, at least one conductive material can be deposited in the laterally-extending cavities 43 by providing at least one reactant gas into the laterally-extending cavities 43 through the lateral isolation trenches 79. For example, the at least one conductive material may comprise a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, MON or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, or tantalum. In one embodiment, the metallic fill material layer can consist essentially of a single elemental metal. In one embodiment, the metallic fill material layer can be deposited employing a fluorine-containing precursor gas, such as $WF_6$. In one embodiment, the metallic fill material layer can be a tungsten layer including a residual level of fluorine atoms as impurities. The metallic fill material layer is spaced from the insulating layers 32, the memory opening fill structures 58, and the support pillar structures (120, 220) by the metallic barrier layer that blocks diffusion of fluorine atoms therethrough.

A plurality of electrically conductive layers 46 can be formed in the plurality of laterally-extending cavities 43. A continuous metallic material layer (not shown) can be formed over the dielectric capping layer 280 and on the sidewalls and bottom surfaces of the lateral isolation trenches 79. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the dielectric capping layer 280.

The deposited metallic material of the continuous electrically conductive material layer is etched back from above the dielectric capping layer 280 and from the sidewalls and the bottom surfaces of the lateral isolation trenches 79 by performing an etch process that etches the at least one conductive material of the continuous electrically conductive material layer. The etch process may comprise an anisotropic etch process and/or an isotropic etch process. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46. The electrically conductive layer 46 comprise first electrically conductive layers 146 that replace first sacrificial material layers 142, and second electrically conductive layers 246 that replace second sacrificial material layers 242. The electrically conductive layers 46 may comprise source-side select gate electrodes, word lines overlying the source side select gate electrodes, and drain-side select gate electrodes overlying the word lines.

An alternating stack (32, 46) of insulating layers 32 and electrically conductive layers 46 is formed between each neighboring pair of lateral isolation trenches 79. The alternating stack (32, 46) may include a first alternating stack of first insulating layers 132 and first electrically conductive layers 146 and a second alternating stack of second insulating layers 232 and second electrically conductive layers 246.

Upon replacement of the first sacrificial material layers 142 with the first electrically conductive layers 146, each of the first electrically conductive strips 164 contacts a surface segment of a respective one of the first electrically conductive layers 146. Further, upon replacement of the second sacrificial material layers 242 with the second electrically conductive layers 246, each of the second subset of the second electrically conductive strips 264 (i.e., each of the third electrically conductive strips 364) contacts a surface segment of a respective one of the second electrically conductive layers 246.

A first alternating stack (132, 146) is located in a memory block area between each neighboring pair of lateral isolation trenches 79. The first alternating stack includes first insulating layers 132 and first electrically conductive layers 146 that are interlaced along a vertical direction. A first stepped cavity 169 located inside the first alternating stack (132, 146) comprises a first stepped bottom surface containing horizontally-extending surface segments of the first electrically conductive layers 146. A second alternating stack (232, 246) overlies the first alternating stack (132, 146) in the memory block area between each neighboring pair of lateral isolation trenches 79. The second alternating stack includes second insulating layers 232 and second electrically conductive layers 246 that are interlaced along the vertical direction. A second stepped cavity 269 located inside the second alternating stack (232, 246) comprises a second stepped bottom surface containing horizontally-extending surface segments of the second electrically conductive layers 246. Memory openings 49 and the memory opening fill structures 58 located in the respective memory openings vertically extend through the second alternating stack (232, 246) and the first alternating stack (132, 146) in each memory array region 100. Each memory opening 49 vertically extending through each layer within the first alternating stack (132, 146) and within the second alternating stack (232, 246). Each memory opening fill structure 58 can be located in a respective memory opening 49 and including a vertical stack of memory elements (e.g., portions of the memory material layer 54 of the memory film 50) and a vertical semiconductor channel 60.

Figure 50A:
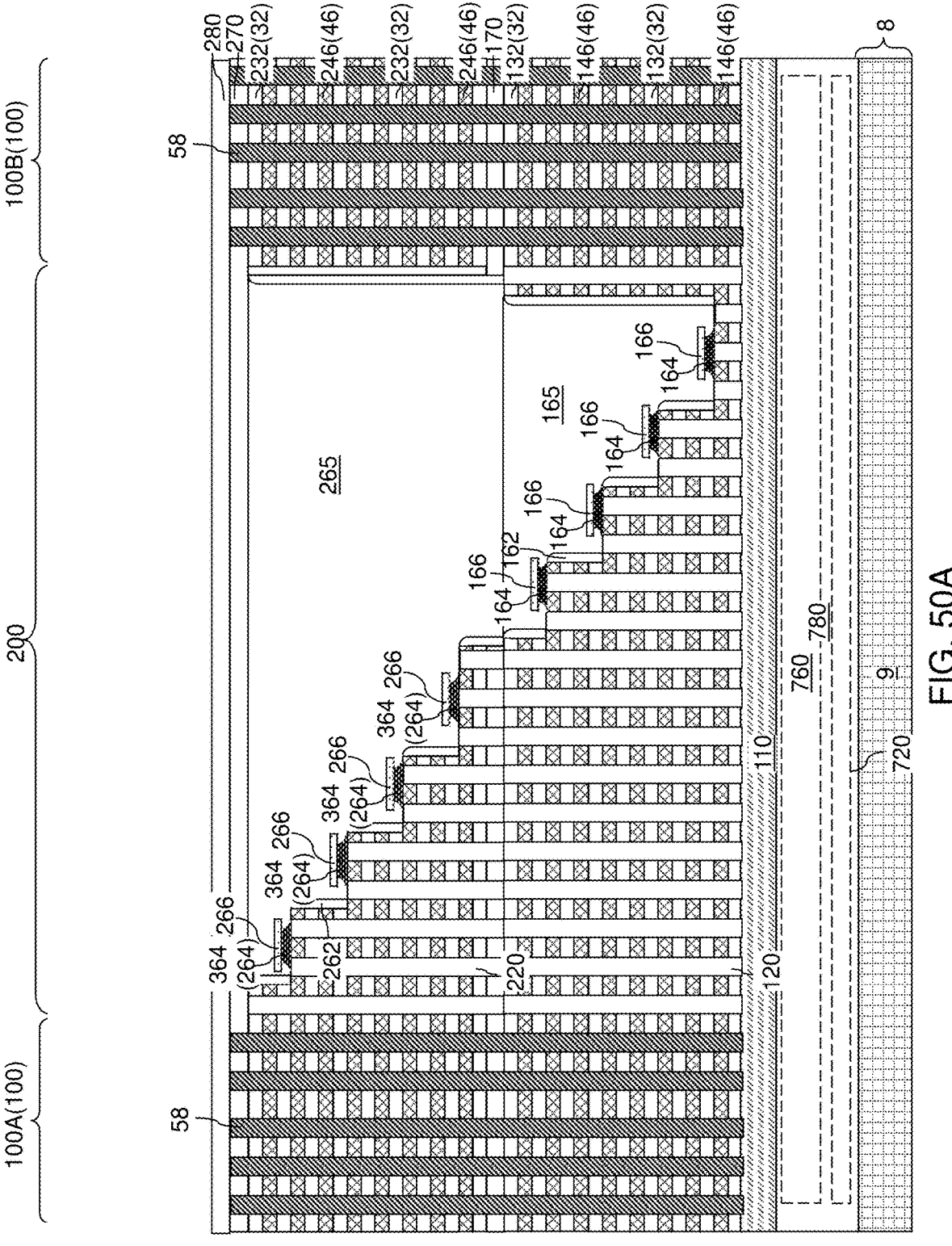
FIGS. 50A-50C are various views of the second exemplary structure after formation of isolation trench fill structures according to an embodiment of the present disclosure.
Figure 50B:
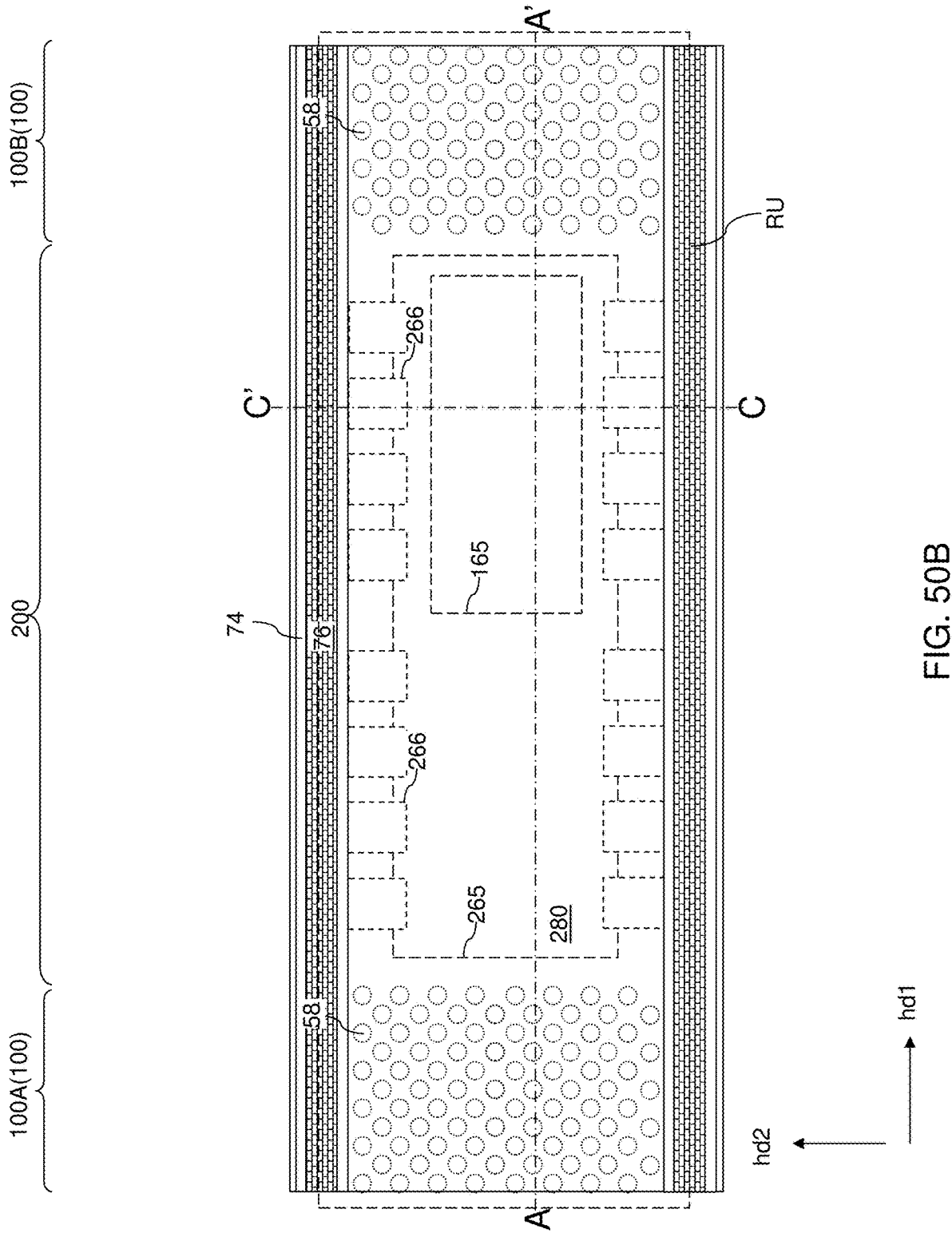
Figure 50C:
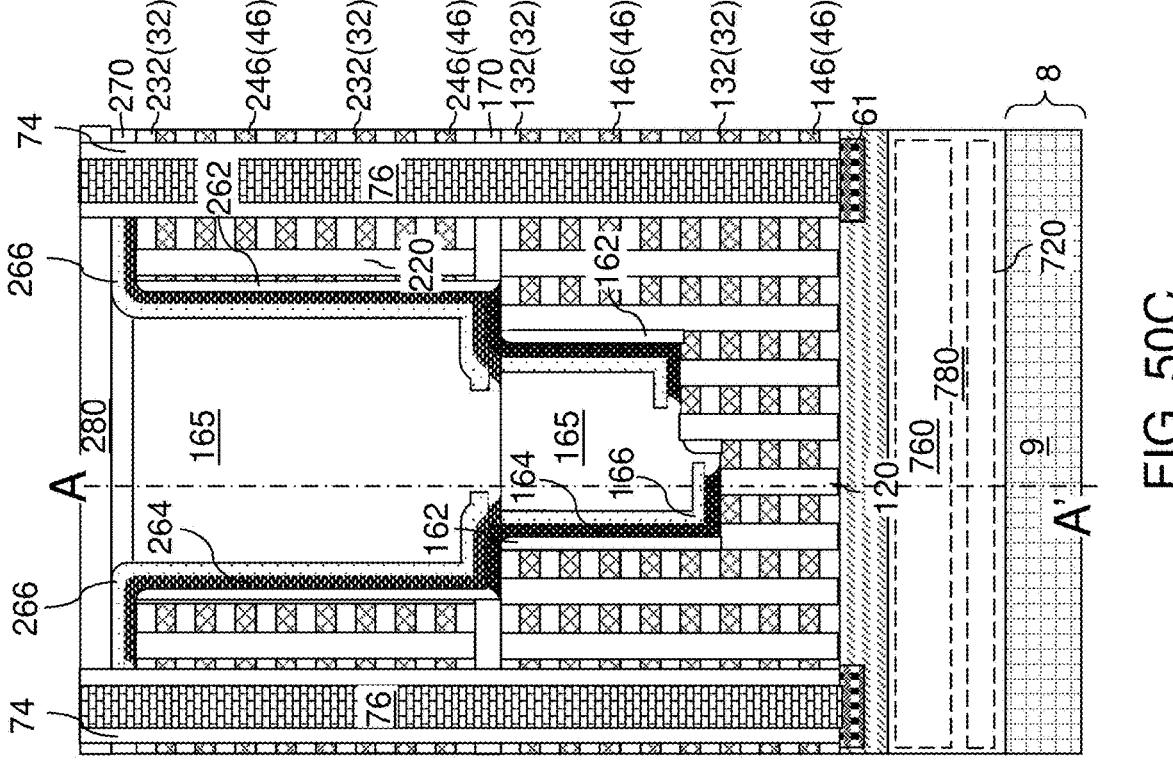

Referring to FIGS. 50A-50C, an insulating material layer can be conformally deposited in the lateral isolation trenches 79 and over the dielectric capping layer 280. An anisotropic etch process can be performed to remove horizontally-extending portions of the insulating material layer. Each remaining vertically-extending portion of the insulating material layer that is formed in a respective lateral isolation trench 79 constitutes an insulating isolation trench spacer 74.

At least one conducive material can be deposited in remaining unfilled volumes of the lateral isolation trenches 79 to form source contact via structures 76, which can be conductive wall structures laterally extending along the first horizontal direction hd1. Each contiguous combination of an insulating isolation trench spacer 74 and a source contact via structure 76 constitutes a lateral isolation trench fill structure (74, 76) that fills a respective lateral isolation trench 79.

Figure 51A:
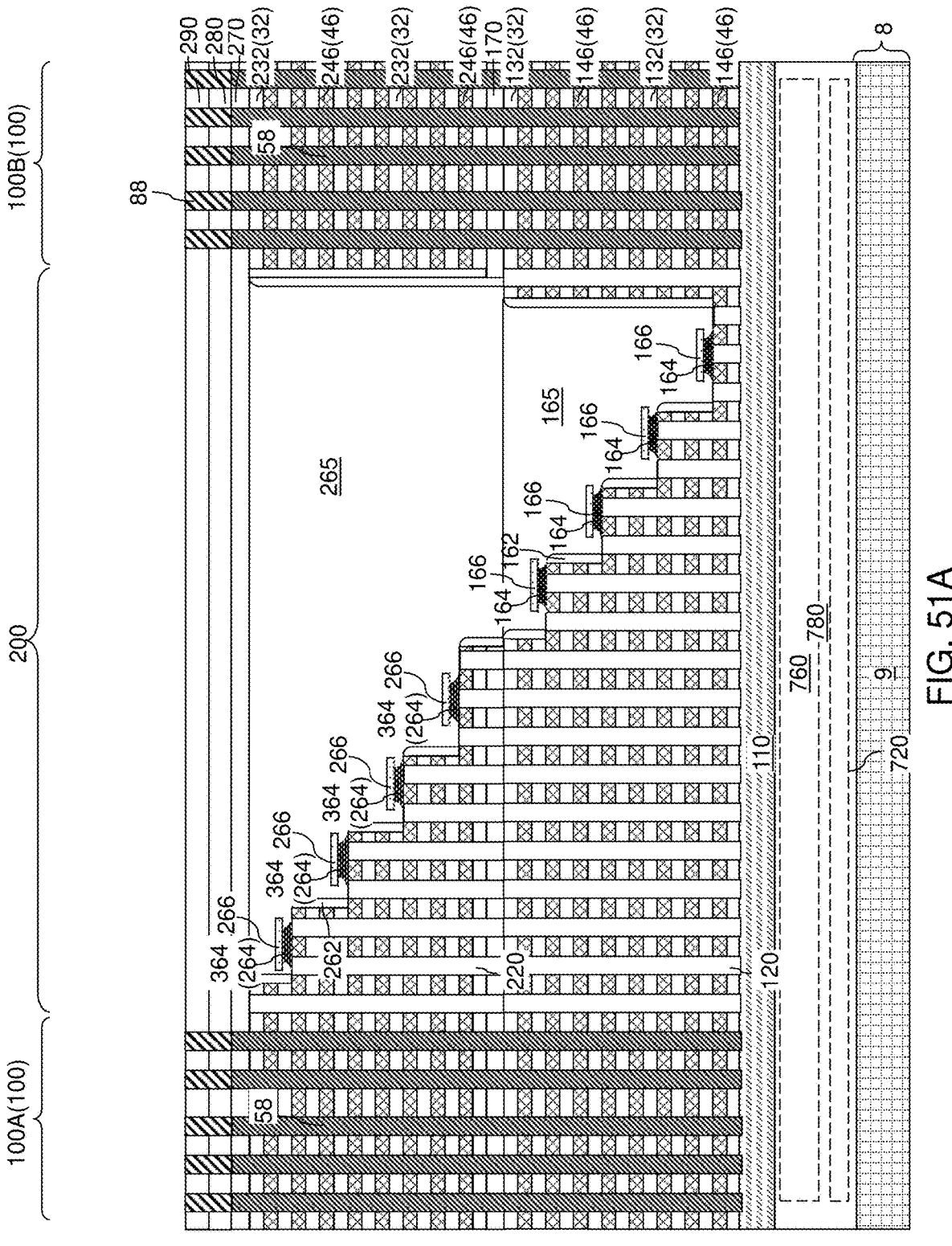
FIGS. 51A-51C are various views of the second exemplary structure after formation of a contact-level dielectric layer, drain contact via structures, and connection via structures according to an embodiment of the present disclosure.
Figure 51B:
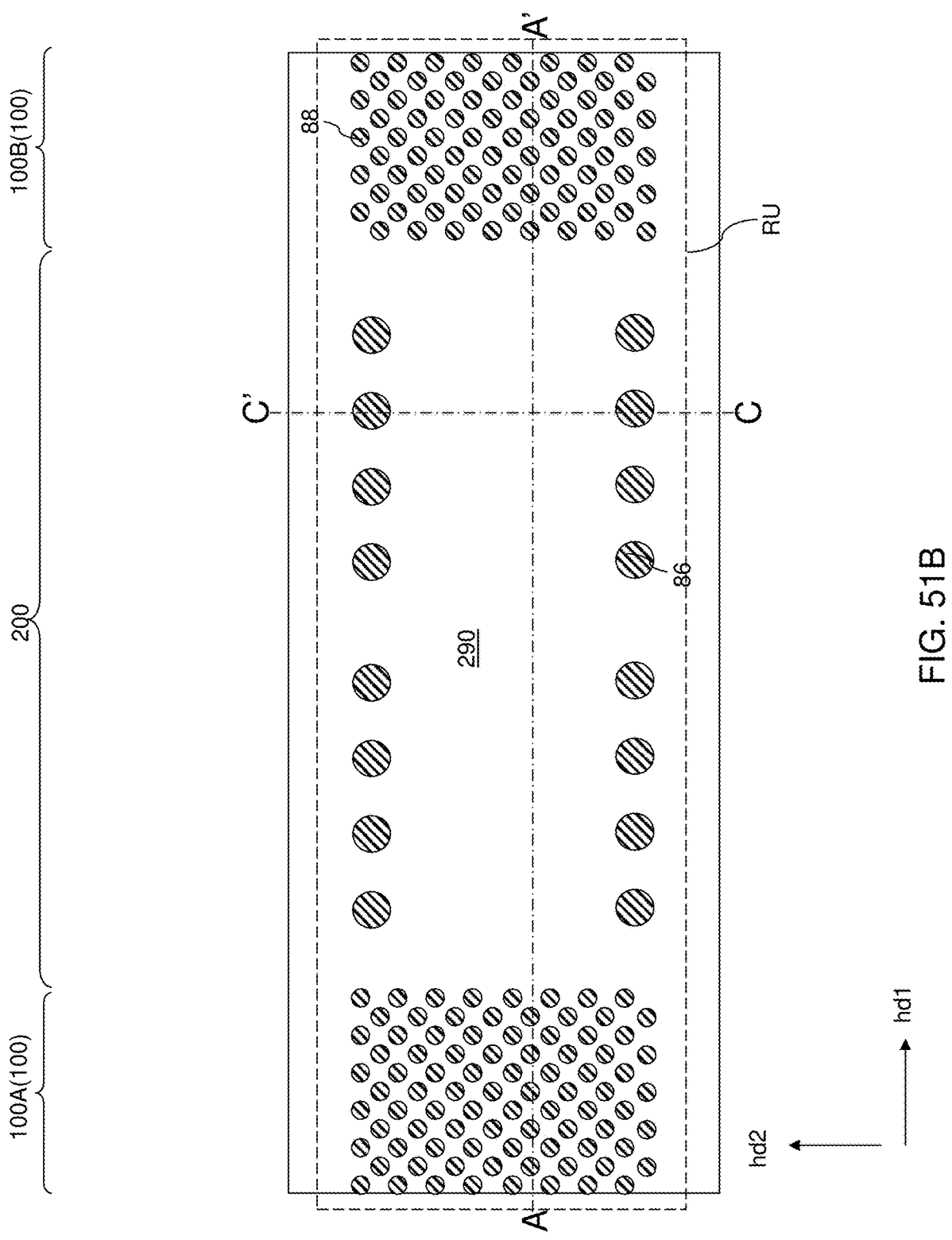
Figure 51C:
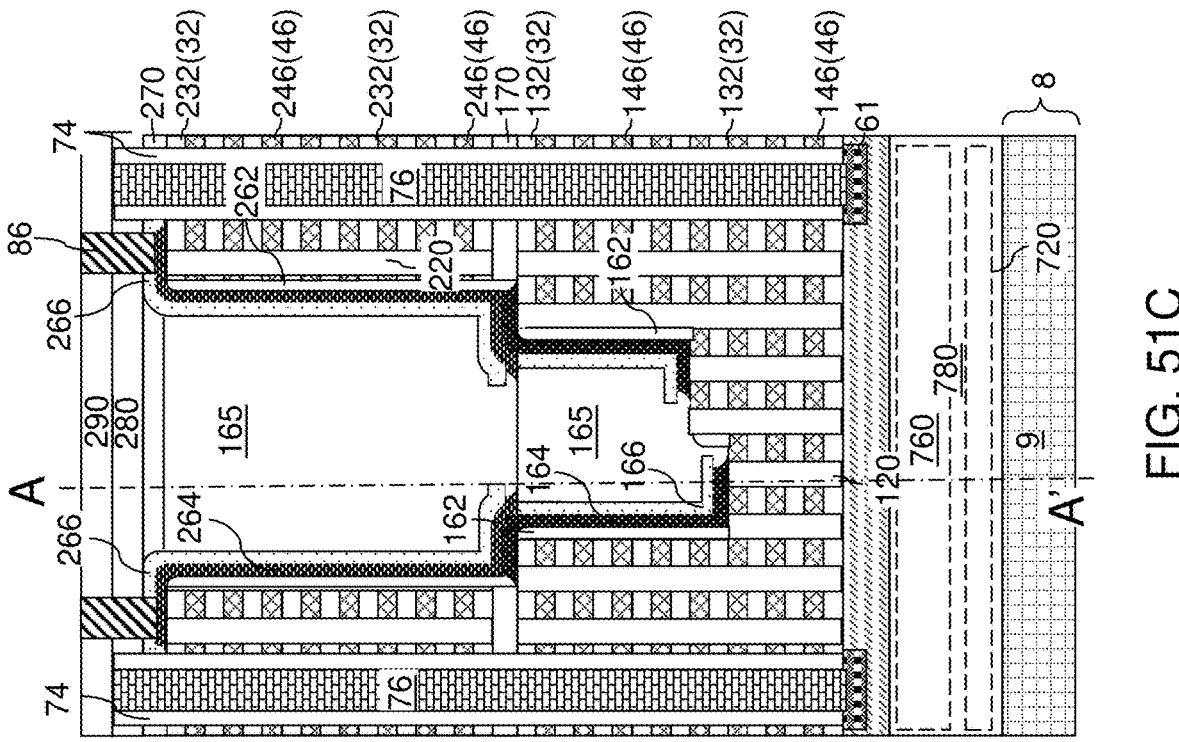

Referring to FIGS. 51A-51C, a contact-level dielectric layer 290 can be formed over the dielectric capping layer 280. The contact-level dielectric layer 290 comprises a dielectric material, such as undoped silicate glass or a doped silicate glass. The thickness of the contact-level dielectric layer 290 may be in a range from 50 nm to 500 nm, such as from 100 nm to 300 nm, although lesser and greater thicknesses may also be employed.

A photoresist layer (not shown) can be applied over the contact-level dielectric layer 290, and can be lithographically patterned to form discrete openings overlying a respective one of the drain regions 63 in the memory array regions 100 or overlying a respective one of the second horizontally-extending top strip segments of the second electrically conductive strips 264 (including the third electrically conductive strips 364). An anisotropic etch process can be performed to form drain contact via cavities overlying the drain regions 63 and to from connection via cavities overlying the second horizontally-extending top strip segments of the second electrically conductive strips 264. The photoresist layer can be subsequently removed.

At least one conductive material can be deposited in the drain contact via cavities and in the connection via cavities. Excess portions of the at least one conductive material can be removed from above the horizontal plane including the top surface of the contact-level dielectric layer 290 by a planarization process such as a chemical mechanical planarization (CMP) process or a recess etch process. Each remaining portion of the at least one conductive material filling a respective drain contact via cavity and contacting a top surface of a respective drain region 63 constitutes a drain contact via structure 88.

Each remaining portion of the at least one conductive material filling a respective connection via cavity and contacting a top surface of a respective second horizontally-extending top strip segment of the second electrically conductive strips 264 constitutes a connection via structure 86. Each of a first subset of the connection via structures 86 is electrically connected to the respective one of the first electrically conductive layers 146 through a respective pair of one of the first electrically conductive strips 164 and one of the second electrically conductive strips 264. Each of a first subset of the connection via structures 86 is electrically connected to the respective one of the first electrically conductive layers 146 through a respective one of the third electrically conductive strips 364.

Additional metal interconnect structures (not shown), additional dielectric material layers (not shown), metal bonding pads (not shown) may be subsequently formed to provide a memory die.

Referring to FIGS. 29-51C and related drawings and according to various embodiments of the present disclosure, a memory device is provided, which comprises: a first alternating stack (132, 146) including first insulating layers 132 and first electrically conductive layers 146 that are interlaced along a vertical direction, wherein a first stepped cavity 169 located inside the first alternating stack (132, 146) comprises a first stepped bottom surface containing horizontally-extending surface segments of the first electrically conductive layers 146; a memory opening vertically extending through each layer within the first alternating stack (132, 146); a memory opening fill structure 58 located in the memory opening 49 and including a vertical stack of memory elements (e.g., portions of the memory film 50) and a vertical semiconductor channel 60; a first insulating spacer 162 contacting sidewalls of the first stepped cavity 169; and a first electrically conductive strip 164 comprising a first horizontally-extending bottom strip segment 164B contacting one of the first electrically conductive layers 146, a first horizontally-extending top strip segment 164T that overlies a topmost layer within the first alternating stack (132, 146), and a first vertically-extending strip segment 164V connecting the first horizontally-extending bottom strip segment 164B and the first horizontally-extending top strip segment 164T.

In one embodiment, the first stepped cavity 169 comprises: a pair of stepped sidewalls that laterally extend along a first horizontal direction hd1 and having a respective stepped bottom edge; a first end wall EW1 that laterally extends along a second horizontal direction hd2 that is perpendicular to the first horizontal direction hd1 and connecting first ends of the pair of stepped sidewalls; and a second end wall EW2 that laterally extends along the second horizontal direction hd2 and connecting second ends of the pair of stepped sidewalls. In one embodiment, the first electrically conductive strip 164 laterally extends along the second horizontal direction hd2 over a portion of the first insulating spacer 162 that contacts one of the pair of stepped sidewalls.

In one embodiment, the first horizontally-extending bottom strip segment comprises: a planar horizontal bottom surface contacting a portion of a top surface of said one of the first electrically conductive layers 146; a planar horizontal top surface that is parallel to the planar top surface and has a lesser width than the planar horizontal bottom surface; and a pair of horizontally-extending tapered surfaces (e.g., segments 164C) having a respective concave vertical cross-sectional profile.

In one embodiment, the first vertically-extending strip segment comprises: a first planar surface contacting an inner sidewall of the first insulating spacer 162; a second planar surface that is parallel to the first planar surface segment and has a lesser width than the first planar surface; and a pair of vertically-extending tapered surfaces having a respective concave horizontal cross-sectional profile.

In one embodiment, the memory device comprises a first insulating material strip 166 contacting the first horizontally-extending bottom strip segment 164B and the first vertically-extending strip segment 164V and not contacting the first horizontally-extending top strip segment 164T. In one embodiment, the memory device comprises a first retro-stepped dielectric material portion 165 located within the first stepped cavity 169 and contacting concave surface segments of the first electrically conductive strip 164. In one embodiment, a top surface of the first retro-stepped dielectric material portion 165 is located below a horizontal plane including a topmost surface of the first electrically conductive strip 164.

In one embodiment, the memory device further comprises: a second alternating stack (232, 246) overlying the first alternating stack (132, 146) and including second insulating layers 232 and second electrically conductive layers 246 that are interlaced along the vertical direction, wherein a second stepped cavity 269 located inside the second alternating stack (232, 246) comprises a second stepped bottom surface containing horizontally-extending surface segments of the second electrically conductive layers 246, and wherein the memory opening 49 and the memory opening fill structure 58 vertically extend through the second alternating stack (232, 246); a second insulating spacer 262 contacting sidewalls of the second stepped cavity 269; and a second electrically conductive strip 264 comprising a second horizontally-extending bottom strip segment 264B contacting a top surface of the first horizontally-extending top strip segment 164T, a second horizontally-extending top strip segment 264T that overlies a topmost layer within the second alternating stack (232, 246), and a second vertically-extending strip segment 264V connecting the second horizontally-extending bottom strip segment 264B and the second horizontally-extending top strip segment 264T.

In one embodiment, the memory device comprises a third electrically conductive strip 364 comprising a third horizontally-extending bottom strip segment 364B contacting a top surface of one of the second electrically conductive layers 246, a third horizontally-extending top strip segment 364T that overlies the topmost layer within the second alternating stack (232, 246), and a third vertically-extending strip segment 364V connecting the third horizontally-extending bottom strip segment 364B and the third horizontally-extending top strip segment 364T.

In one embodiment, a first connection via structure 86 is in electrical contact with the second horizontally-extending top strip segment 264T of the second electrically conductive strip 264; and a second connection via structure 86 in electrical contact with the third horizontally-extending top strip segment 364T of the third electrically conductive strip 364.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A method, comprising:

forming a first alternating stack of first insulating layers and first sacrificial material layers that are interlaced along a vertical direction;

forming a first stepped cavity in the first alternating stack, wherein the first stepped cavity comprises a first stepped bottom surface containing horizontally-extending surface segments of the first sacrificial material layers;

forming a first insulating spacer contacting vertically-extending surfaces of the first stepped cavity;

forming a first continuous electrically conductive material layer over the first insulating spacer and the first stepped bottom surface;

patterning the first continuous electrically conductive material layer into first electrically conductive strips;

forming a first retro-stepped dielectric material portion in the first stepped cavity; and replacing the first sacrificial material layers with first electrically conductive layers, wherein each of the first electrically conductive strips contacts a surface segment of a respective one of the first electrically conductive layers.

2. The method of claim 1, wherein:

the first stepped bottom surface comprises a M×N array of horizontally-extending surface segments of the first sacrificial material layers;

the horizontally-extending surface segments are vertically spaced apart from each other;

M is an integer in a range from 1 to 10; and

N is an integer in a range from 2 to $2^{10}$; and the first insulating spacer comprises a M×N array of vertically-extending openings therethrough.

3. The method of claim 2, further comprising:

forming a memory opening vertically extending through each layer within the first alternating stack; and forming memory opening fill structure in the memory opening and including a vertical stack of memory elements and a vertical semiconductor channel.

4. The method of claim 1, further comprising:

forming first insulating material strips over the first continuous electrically conductive material layer; and performing an isotropic etch process that isotropically etches portions of the first continuous electrically conductive material layer that are not masked by the first insulating material strips, wherein remaining portions of the first continuous electrically conductive material layer comprise the first electrically conductive strips.

5. The method of claim 4, wherein each of the first insulating material strips comprises:

a first horizontally-extending bottom strip segment located in the first stepped cavity overlying a respective one of the first sacrificial material layers;

a first horizontally-extending top strip segment that overlies a topmost layer within the first alternating stack; and a first vertically-extending strip segment connecting the first horizontally-extending bottom strip segment and the first horizontally-extending top strip segment.

6. The method of claim 4, further comprising:

depositing a first dielectric fill material over the first insulating material strips after formation of the first electrically conductive strips; and removing portions of the first dielectric fill material from outside a volume of the first stepped cavity, wherein a remaining portion of the first dielectric fill material in the volume of the first stepped cavity comprises a first retro-stepped dielectric material portion.

7. The method of claim 6, wherein portions of the first electrically conductive strips that overlie the first alternating stack protrude above a horizontal plane including a top surface of the first retro-stepped dielectric material portion.

8. The method of claim 1, wherein each of the first electrically conductive strips comprises:

a first horizontally-extending bottom strip segment that is formed directly on a respective one of the first sacrificial material layers;

a first horizontally-extending top strip segment that overlies a topmost layer within the first alternating stack; and a first vertically-extending strip segment connecting the first horizontally-extending bottom strip segment and the first horizontally-extending top strip segment.

9. The method of claim 1, further comprising:

forming a second alternating stack including second insulating layers and second sacrificial material layers that are interlaced along the vertical direction over the first alternating stack;

forming a second stepped cavity in the second alternating stack, wherein the second stepped cavity comprises a second stepped bottom surface containing horizontally-extending surface segments of the second sacrificial material layers;

forming a second insulating spacer on sidewalls of the second stepped cavity;

forming second electrically conductive strips over the second insulating spacer and the second stepped bottom surface, wherein a first subset of the second electrically conductive strips is formed on a top surface of a respective one of the first electrically conductive strips;

replacing the second sacrificial material layers with second electrically conductive layers; and forming connection via structures in electrical contact with the second electrically conductive strips.

10. The method of claim 9, wherein:

each of the second electrically conductive strips comprises a second horizontally-extending bottom strip segment; a second horizontally-extending top strip segment that overlies a topmost layer within the second alternating stack; and a second vertically-extending strip segment connecting the second horizontally-extending bottom strip segment and the second horizontally-extending top strip segment;

a second subset of the second electrically conductive strips is formed on a surface segment of a respective one of the horizontally-extending surface segments of the second sacrificial material layers; and the second horizontally-extending bottom strip segment of each of the second subset of the second electrically conductive strips contacts a surface segment of a respective one of the second electrically conductive layers.

11. A memory device, comprising:

a first alternating stack including first insulating layers and first electrically conductive layers that are interlaced along a vertical direction, wherein a first stepped cavity located inside the first alternating stack comprises a first stepped bottom surface containing horizontally-extending surface segments of the first electrically conductive layers;

a memory opening vertically extending through each layer within the first alternating stack;

a memory opening fill structure located in the memory opening and including a vertical stack of memory elements and a vertical semiconductor channel;

a first insulating spacer contacting sidewalls of the first stepped cavity; and a first electrically conductive strip comprising a first horizontally-extending bottom strip segment contacting one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment;

wherein the first horizontally-extending bottom strip segment comprises:

a planar horizontal bottom surface contacting a portion of a top surface of said one of the first electrically conductive layers;

a planar horizontal top surface that is parallel to the planar top surface and has a lesser width than the planar horizontal bottom surface; and a pair of horizontally-extending tapered surfaces having a respective concave vertical cross-sectional profile.

12. A memory device, comprising:

a first alternating stack including first insulating layers and first electrically conductive layers that are interlaced along a vertical direction, wherein a first stepped cavity located inside the first alternating stack comprises a first stepped bottom surface containing horizontally-extending surface segments of the first electrically conductive layers;

a memory opening vertically extending through each layer within the first alternating stack;

a memory opening fill structure located in the memory opening and including a vertical stack of memory elements and a vertical semiconductor channel;

a first insulating spacer contacting sidewalls of the first stepped cavity; and a first electrically conductive strip comprising a first horizontally-extending bottom strip segment contacting one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment;

wherein the first vertically-extending strip segment comprises:

a first planar surface contacting an inner sidewall of the first insulating spacer;

a second planar surface that is parallel to the first planar surface segment and has a lesser width than the first planar surface; and a pair of vertically-extending tapered surfaces having a respective concave horizontal cross-sectional profile.

13. A memory device, comprising:

a first alternating stack including first insulating layers and first electrically conductive layers that are interlaced along a vertical direction, wherein a first stepped cavity located inside the first alternating stack comprises a first stepped bottom surface containing horizontally-extending surface segments of the first electrically conductive layers;

a memory opening vertically extending through each layer within the first alternating stack;

a memory opening fill structure located in the memory opening and including a vertical stack of memory elements and a vertical semiconductor channel;

a first insulating spacer contacting sidewalls of the first stepped cavity;

a first electrically conductive strip comprising a first horizontally-extending bottom strip segment contacting one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment; and a first insulating material strip contacting the first horizontally-extending bottom strip segment and the first vertically-extending strip segment and not contacting the first horizontally-extending top strip segment.

14. The memory device of claim 13, further comprising a first retro-stepped dielectric material portion located within the first stepped cavity and contacting concave surface segments of the first electrically conductive strip, wherein a top surface of the first retro-stepped dielectric material portion is located below a horizontal plane including a topmost surface of the first electrically conductive strip.

15. A memory device, comprising:

a first alternating stack including first insulating layers and first electrically conductive layers that are interlaced along a vertical direction, wherein a first stepped cavity located inside the first alternating stack comprises a first stepped bottom surface containing horizontally-extending surface segments of the first electrically conductive layers;

a memory opening vertically extending through each layer within the first alternating stack;

a memory opening fill structure located in the memory opening and including a vertical stack of memory elements and a vertical semiconductor channel;

a first insulating spacer contacting sidewalls of the first stepped cavity;

a first electrically conductive strip comprising a first horizontally-extending bottom strip segment contacting one of the first electrically conductive layers, a first horizontally-extending top strip segment that overlies a topmost layer within the first alternating stack, and a first vertically-extending strip segment connecting the first horizontally-extending bottom strip segment and the first horizontally-extending top strip segment;

a second alternating stack overlying the first alternating stack and including second insulating layers and second electrically conductive layers that are interlaced along the vertical direction, wherein a second stepped cavity located inside the second alternating stack comprises a second stepped bottom surface containing horizontally-extending surface segments of the second electrically conductive layers, and wherein the memory opening and the memory opening fill structure vertically extend through the second alternating stack;

a second insulating spacer contacting sidewalls of the second stepped cavity; and a second electrically conductive strip comprising a second horizontally-extending bottom strip segment contacting a top surface of the first horizontally-extending top strip segment, a second horizontally-extending top strip segment that overlies a topmost layer within the second alternating stack, and a second vertically-extending strip segment connecting the second horizontally-extending bottom strip segment and the second horizontally-extending top strip segment.

16. The memory device of claim 15, further comprising a third electrically conductive strip comprising a third horizontally-extending bottom strip segment contacting a top surface of one of the second electrically conductive layers, a third horizontally-extending top strip segment that overlies the topmost layer within the second alternating stack, and a third vertically-extending strip segment connecting the third horizontally-extending bottom strip segment and the third horizontally-extending top strip segment.

17. The memory device of claim 16, further comprising:

a first connection via structure in electrical contact with the second horizontally-extending top strip segment of the second electrically conductive strip; and a second connection via structure in electrical contact with the third horizontally-extending top strip segment of the third electrically conductive strip.

* * * * *